US012501825B2

(12) United States Patent
Sakuma

(10) Patent No.: US 12,501,825 B2
(45) Date of Patent: Dec. 16, 2025

(54) ORGANIC ELECTROLUMINESCENCE DEVICE AND AMINE COMPOUND FOR ORGANIC ELECTROLUMINESCENCE DEVICE

(71) Applicant: Samsung Display Co., Ltd., Yongin-si (KR)

(72) Inventor: Takao Sakuma, Yokohama (JP)

(73) Assignee: Samsung Display Co., Ltd., Yongin-si (KR)

( * ) Notice: Subject to any disclaimer, the term of this patent is extended or adjusted under 35 U.S.C. 154(b) by 757 days.

(21) Appl. No.: 17/447,256

(22) Filed: Sep. 9, 2021

(65) Prior Publication Data

US 2023/0103918 A1 Apr. 6, 2023

(30) Foreign Application Priority Data

Dec. 16, 2020 (KR) ........................ 10-2020-0176475

(51) Int. Cl.
*H10K 50/15* (2023.01)
*H10K 85/60* (2023.01)
*H10K 50/18* (2023.01)

(52) U.S. Cl.
CPC ......... *H10K 85/636* (2023.02); *H10K 85/626* (2023.02); *H10K 85/6572* (2023.02); *H10K 85/6574* (2023.02); *H10K 85/6576* (2023.02); *H10K 50/15* (2023.02); *H10K 50/18* (2023.02)

(58) Field of Classification Search
None
See application file for complete search history.

(56) References Cited

U.S. PATENT DOCUMENTS

| | | | | |
|---|---|---|---|---|
| 8,614,010 | B2 | 12/2013 | Yabunouchi et al. | |
| 9,054,322 | B2 | 6/2015 | Yabunouchi et al. | |
| 9,966,536 | B2 | 5/2018 | Itoi | |
| 9,972,786 | B2 | 5/2018 | Yabunouchi et al. | |
| 10,246,441 | B2 | 4/2019 | Kato | |
| 10,516,112 | B2 | 12/2019 | Kato et al. | |
| 11,685,751 | B2 | 6/2023 | Geum et al. | |
| 2016/0372666 | A1 | 12/2016 | Ryu et al. | |
| 2020/0091435 | A1 | 3/2020 | Masuda et al. | |
| 2020/0144506 | A1 | 5/2020 | Song et al. | |
| 2020/0317653 | A1* | 10/2020 | Ito | C07D 407/12 |
| 2020/0335705 | A1* | 10/2020 | Song | H10K 85/631 |
| 2021/0167298 | A1* | 6/2021 | Pang | H10K 85/611 |
| 2023/0303537 | A1* | 9/2023 | Li | H10K 85/6572 |

FOREIGN PATENT DOCUMENTS

| | | | | | |
|---|---|---|---|---|---|
| CN | 102224150 | B | | 8/2015 | |
| CN | 108658953 | A | | 10/2018 | |
| CN | 105061371 | B | | 2/2019 | |
| CN | 110431682 | A | | 11/2019 | |
| CN | 111732578 | A | * | 10/2020 | C07D 405/12 |
| CN | 111834535 | A | | 10/2020 | |
| CN | 113527271 | A | | 10/2021 | |
| CN | 113994497 | A | | 1/2022 | |
| CN | 114402453 | A | | 4/2022 | |
| EP | 2 364 980 | B1 | | 1/2017 | |
| EP | 3 156 403 | B1 | | 8/2019 | |
| JP | 5608095 | B2 | | 10/2014 | |
| KR | 10-1181261 | B1 | | 9/2012 | |
| KR | 10-1446401 | B1 | | 10/2014 | |
| KR | 10-1571986 | B1 | | 11/2015 | |
| KR | 10-2016-0030429 | A | | 3/2016 | |
| KR | 10-1600127 | B1 | | 3/2016 | |
| KR | 10-1905721 | B1 | | 10/2018 | |
| KR | 10-2128702 | B1 | | 7/2020 | |
| KR | 20200088704 | A | * | 7/2020 | C07D 209/86 |
| TW | I498313 | B | | 9/2015 | |
| WO | WO 2010/061824 | A1 | | 6/2010 | |
| WO | WO 2014/030921 | A1 | | 2/2014 | |
| WO | WO 2016/006711 | A1 | | 1/2016 | |

OTHER PUBLICATIONS

Machine translation of CN-111732578, translation generated May 2024, 13 pages. (Year: 2024).*

Machine translation of KR-20200088704-A, translation generated Sep. 2024, 14 pages. (Year: 2024).*

Chinese Office Action, for CN Patent Application No. 202111533153.9, dated Sep. 25, 2025, 12 pages.

* cited by examiner

*Primary Examiner* — Robert S Loewe

(74) *Attorney, Agent, or Firm* — Womble Bond Dickinson (US) LLP

(57) ABSTRACT

An organic electroluminescence device of an embodiment includes a first electrode, a hole transport region on the first electrode, an emission layer on the hole transport region, an electron transport region on the emission layer, and a second electrode on the electron transport region, wherein the hole transport region includes an amine compound represented by Formula 1, thereby showing long life:

Formula 1

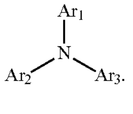

21 Claims, 6 Drawing Sheets

ORGANIC ELECTROLUMINESCENCE DEVICE AND AMINE COMPOUND FOR ORGANIC ELECTROLUMINESCENCE DEVICE

CROSS-REFERENCE TO RELATED APPLICATIONS

This application claims priority to and the benefit of Korean Patent Application No. 10-2020-0176475, filed on Dec. 16, 2020, in the Korean Intellectual Property Office, the entire content of which is hereby incorporated by reference.

BACKGROUND

One or more aspects of embodiments of the present disclosure relate to an organic electroluminescence device and an amine compound for an organic electroluminescence device.

Organic electroluminescence displays are being actively developed as image displays. An organic electroluminescence display is different from a liquid crystal display, and is so-called a self-luminescent display in which holes and electrons respectively injected from a first electrode and a second electrode recombine in an emission layer so that a light-emitting material including an organic compound in the emission layer emits light to achieve display (e.g., to display images(s)).

In the application of an organic electroluminescence device to a display, a decrease in driving voltage, an increase of emission efficiency, and/or improved lifespan of the organic electroluminescence device are desired, and continuous development of materials for an organic electroluminescence device stably achieving these requirements is desired.

SUMMARY

One or more aspects of embodiments of the present disclosure are directed toward an organic electroluminescence device and an amine compound for an organic electroluminescence device, and for example, an organic electroluminescence device showing long-life characteristics and an amine compound included in the hole transport region of an organic electroluminescence device.

One or more embodiments of the present disclosure provide an organic electroluminescence device including a first electrode, a hole transport region provided on the first electrode, an emission layer provided on the hole transport region, an electron transport region provided on the emission layer, and a second electrode provided on the electron transport region, wherein the hole transport region includes an amine compound represented by Formula 1:

Formula 1

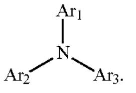

In Formula 1, $Ar_1$ may be represented by Formula 2-1, $Ar_2$ may be represented by Formula 2-2, and $Ar_3$ may be represented by Formula 2-3.

Formula 2-1

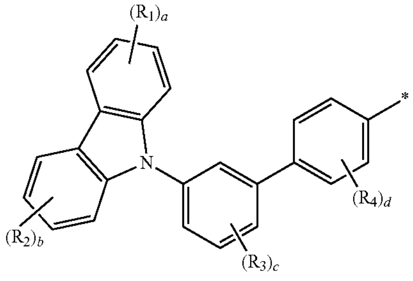

Formula 2-2

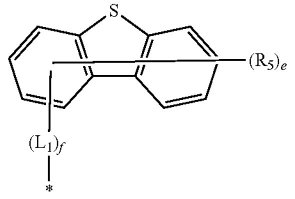

Formula 2-3

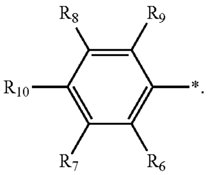

In Formula 2-1 to Formula 2-3, $R_1$ to $R_5$ may each independently be a hydrogen atom, a deuterium atom, a halogen atom, a cyano group, a substituted or unsubstituted alkyl group of 1 to 20 carbon atoms, a substituted or unsubstituted oxy group, a substituted or unsubstituted thiol group, a substituted or unsubstituted silyl group, a substituted or unsubstituted aryl group of 6 to 30 ring-forming carbon atoms, or a substituted or unsubstituted heteroaryl group of 2 to 30 ring-forming carbon atoms, $L_1$ may be a direct linkage, a substituted or unsubstituted arylene group of 6 to 30 ring-forming carbon atoms, or a substituted or unsubstituted heteroarylene group of 2 to 30 ring-forming carbon atoms, $R_6$ to $R_9$ may each independently be a hydrogen atom, a deuterium atom, a halogen atom, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, and/or combined with an adjacent group to form a ring, where a fluorenyl group is excluded, $R_{10}$ may be a hydrogen atom, a deuterium atom, a halogen atom, a substituted or unsubstituted alkyl group of 1 to 20 carbon atoms, a substituted or unsubstituted alkenyl group of 2 to 20 carbon atoms, a substituted phenyl group, a substituted or unsubstituted aryl group of 7 to 30 ring-forming carbon atoms, or a substituted or unsubstituted heteroaryl group of 2 to 30 ring-forming carbon atoms, and/or combined with an adjacent group to form a ring, where a fluorenyl group is excluded, all of $R_6$ to $R_{10}$ are not hydrogen atoms, "a" to "d" may each independently be an integer of 0 to 4, "e" may be an integer of 0 to 7, "f" may be an integer of 0 to 2, when "f" is 1 and $L_1$ is a phenylene group, $R_{10}$ is not an unsubstituted heteroaryl group, and when $L_1$ is a direct linkage and the carbon at position 3 of the dibenzothiophene group of Formula 2-2 is combined with N of Formula 1, $R_{10}$ is not combined with an adjacent group to form a 3-dibenzothiophene group or a 3-dibenzofuran group (e.g., $R_{10}$ is the same as described above, except that in the case where $R_{10}$ is combined with an adjacent group, the combination does not form a 3-dibenzothiophene group or a 3-dibenzofuran group).

In an embodiment, the hole transport region may include a hole injection layer disposed on the first electrode, and a hole transport layer disposed on the hole injection layer, and the hole injection layer or the hole transport layer may include the amine compound represented by Formula 1.

In an embodiment, the hole transport region may include a hole transport layer disposed on the first electrode, and an electron blocking layer disposed on the hole transport layer, and the electron blocking layer may include the amine compound represented by Formula 1.

In an embodiment, Formula 1 may be represented by any one among Formula 3-1 to Formula 3-4:

Formula 3-1

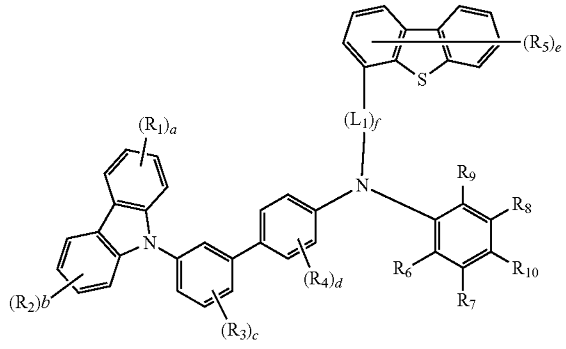

Formula 3-2

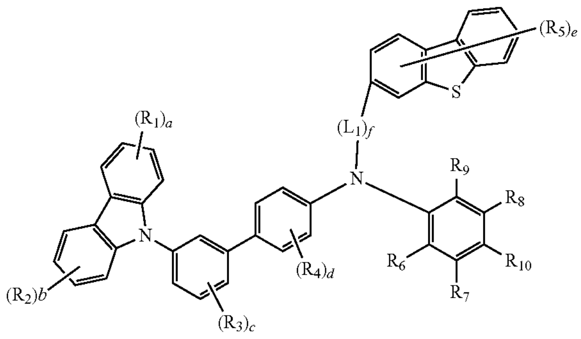

Formula 3-3

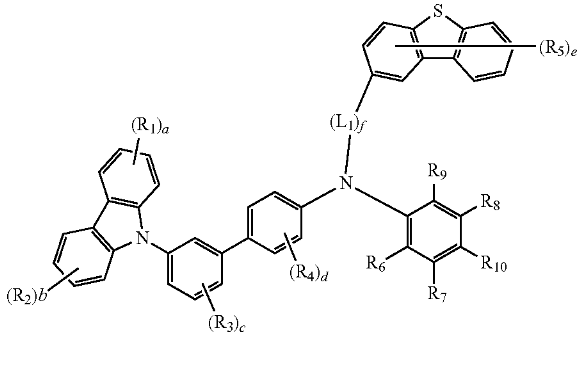

-continued

Formula 4-4

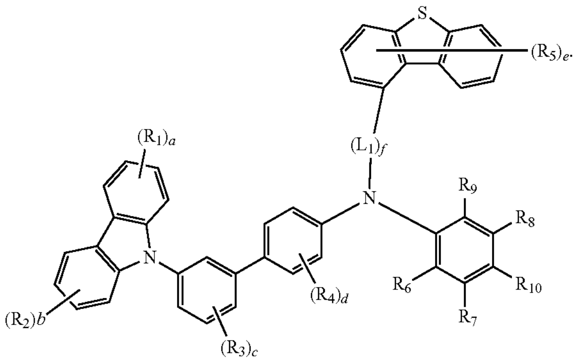

In Formula 3-1 to Formula 3-4, $R_1$ to $R_{10}$, "a" to "f", and $L_1$ may each independently be the same as defined in Formula 1 and Formula 2.

In an embodiment, $L_1$ may be a direct linkage, a substituted or unsubstituted phenylene group, a substituted or unsubstituted naphthylene group, or a substituted or unsubstituted biphenylene group.

In an embodiment, $L_1$ may be a direct linkage or represented by any one among L-1 to L-4.

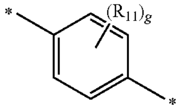

L-1

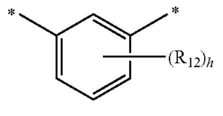

L-2

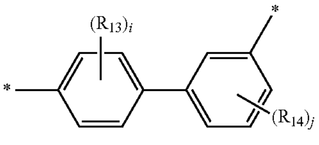

L-3

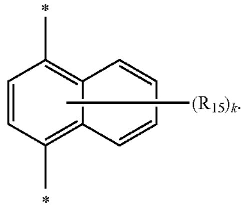

L-4

In L-1 to L-4, $R_{11}$ to $R_{15}$ may each independently be a hydrogen atom, a deuterium atom, a halogen atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, "g" to "j" may each independently be an integer of 0 to 4, and "k" may be an integer of 0 to 6.

In an embodiment, $Ar_3$ may be represented by any one among Formula 4-1 to Formula 4-4.

Formula 4-1

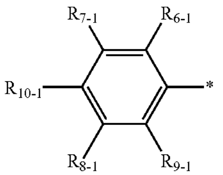

Formula 4-2

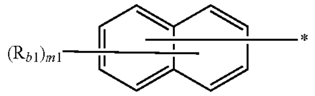

Formula 4-3

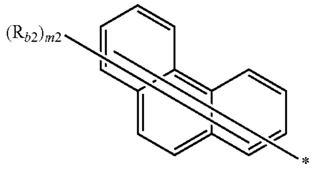

Formula 4-4

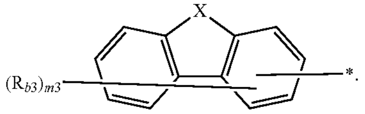

In Formula 4-1 to Formula 4-4, $R_{6-1}$ to $R_{9-1}$ may each independently be a hydrogen atom, a deuterium atom, or a substituted or unsubstituted aryl group of 6 to 20 ring-forming carbon atoms, $R_{10-1}$ may be a hydrogen atom, a deuterium atom, a substituted or unsubstituted alkyl group of 1 to 10 carbon atoms, or a substituted or unsubstituted aryl group of 7 to 20 ring-forming carbon atoms, where all of $R_{6-1}$ to $R_{10-1}$ are not hydrogen atoms, $R_{b1}$ to $R_{b3}$ may each independently be a hydrogen atom, a deuterium atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, X may be O or S, "m1" and "m3" may each independently be an integer of 0 to 7, "m2" may be an integer of 0 to 9, when $L_1$ is a direct linkage and the carbon at position 3 of the dibenzothiophene group of Formula 2-2 is combined with N of Formula 1, Formula 4-4 is not a 3-dibenzofuran group or a 3-dibenzothiophene group, and when "f" is 1 and $L_1$ is a phenylene group, $Ar_3$ is any one among Formula 4-1 to Formula 4-3 but is not Formula 4-4.

In an embodiment, Formula 4-1 may be represented by any one among Formula 5-1 to Formula 5-3.

Formula 5-1

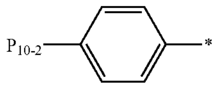

Formla 5-2

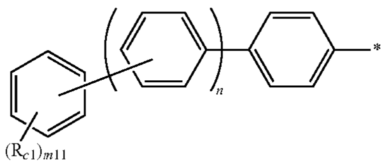

-continued

Formula 5-3

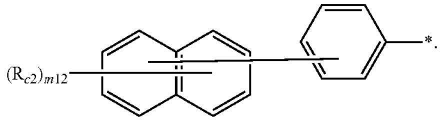

In Formula 5-1 to Formula 5-3, $R_{10-2}$ may be a substituted or unsubstituted alkyl group of 1 to 10 carbon atoms, $R_{c1}$ and $R_{c2}$ may each independently be a hydrogen atom, a deuterium atom, a halogen atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, "n" may be 1 or 2, "m11" may be an integer of 0 to 5, and "m12" may be an integer of 0 to 7.

In an embodiment, $R_3$ and $R_4$ may each independently be a hydrogen atom, a deuterium atom, a halogen atom, a cyano group, or a substituted or unsubstituted alkyl group of 1 to 10 carbon atoms.

In an embodiment, the emission layer may include an anthracene derivative represented by Formula 6.

Formula 6

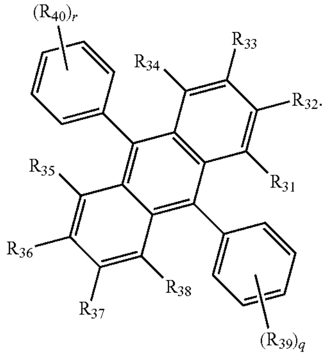

In Formula 6, $R_{31}$ to $R_{40}$ may each independently be a hydrogen atom, a deuterium atom, a halogen atom, a substituted or unsubstituted silyl group, a substituted or unsubstituted alkyl group of 1 to 10 carbon atoms, a substituted or unsubstituted aryl group of 6 to 30 ring-forming carbon atoms, or a substituted or unsubstituted heteroaryl group of 2 to 30 ring-forming carbon atoms, and/or combined with an adjacent group to form a ring, and "q" and "r" may each independently be an integer of 0 to 5.

In an embodiment, Formula 6 may be represented by any one among Compound 7-1 to Compound 7-19.

7-1

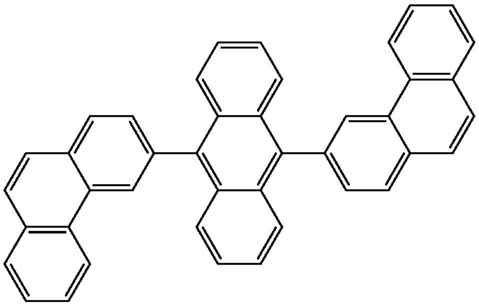

-continued
7-2
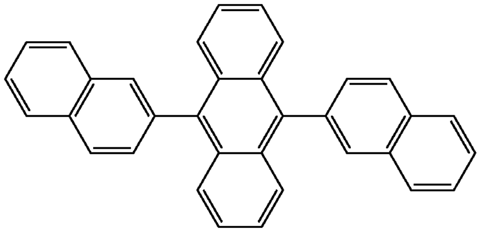
7-3
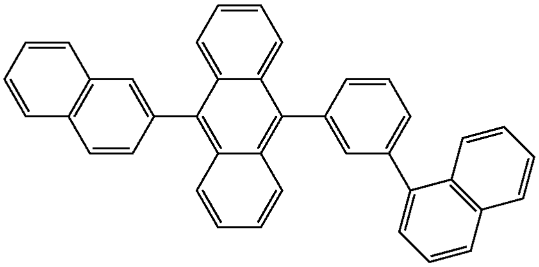
7-4
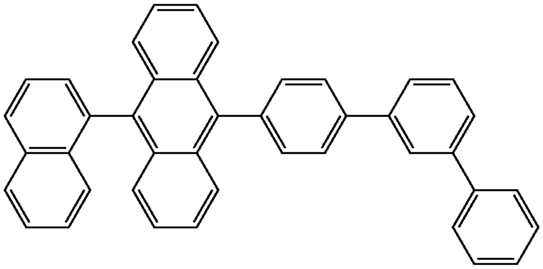
7-5
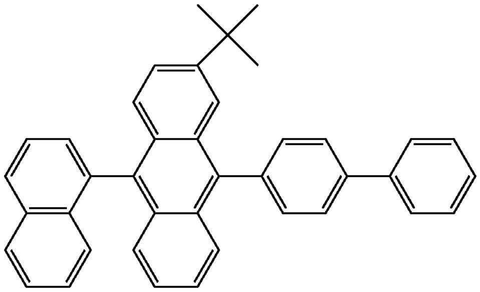
7-6
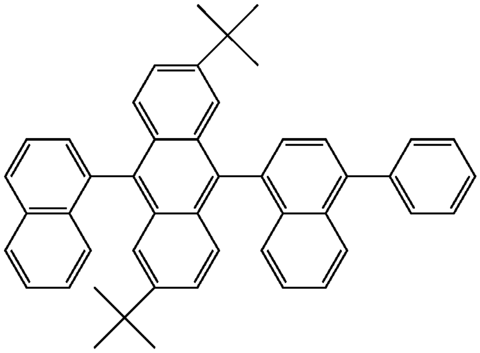
-continued
7-7
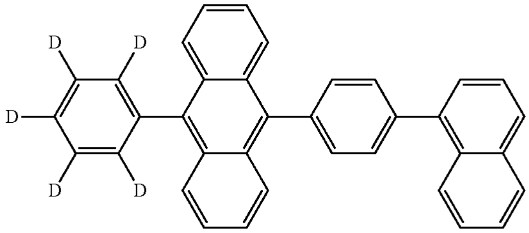
7-8
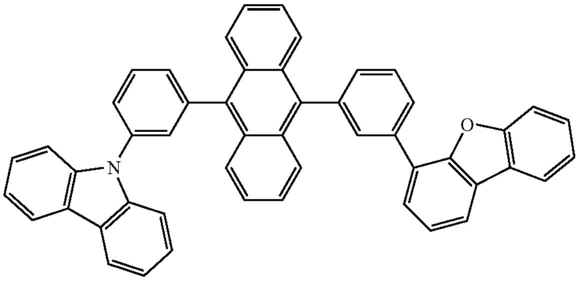
7-9
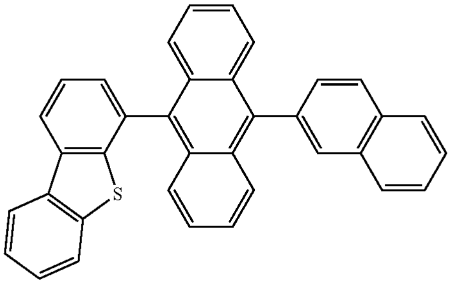
7-10
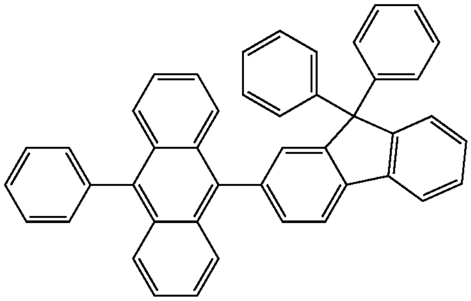
7-11
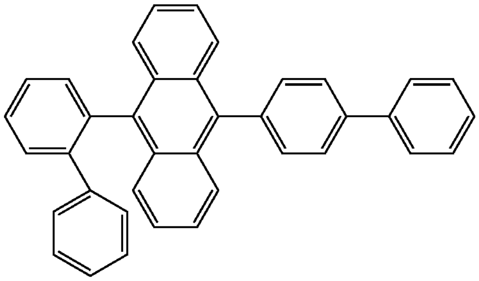

-continued
7-12
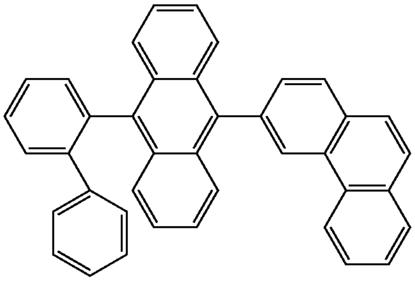
7-13
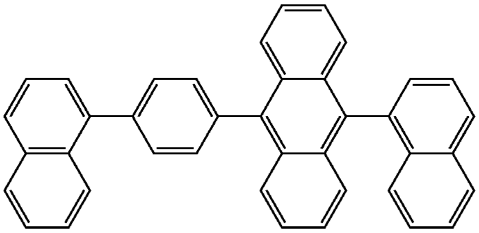
7-14
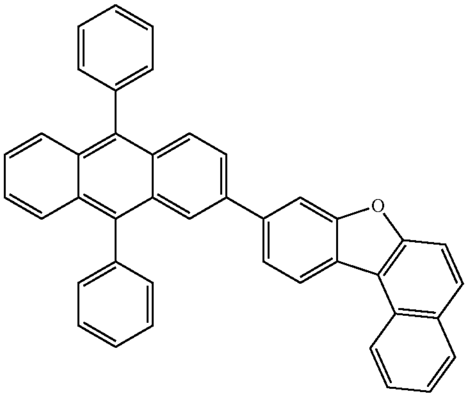
7-15
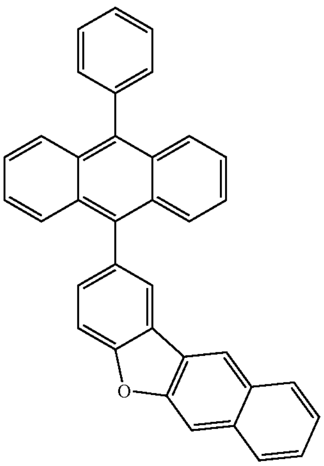
-continued
7-16
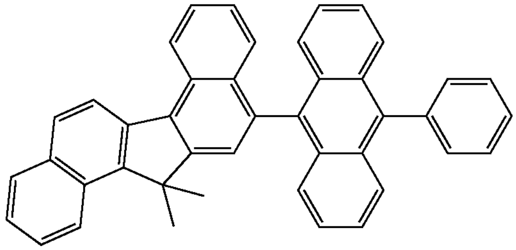
7-17
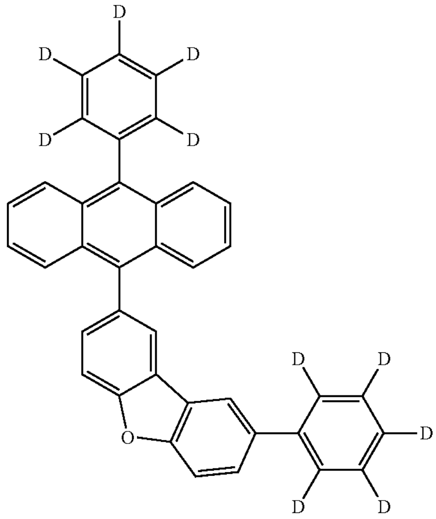
7-18
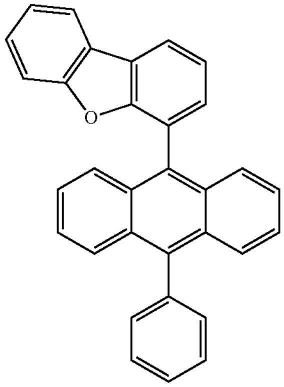
7-19
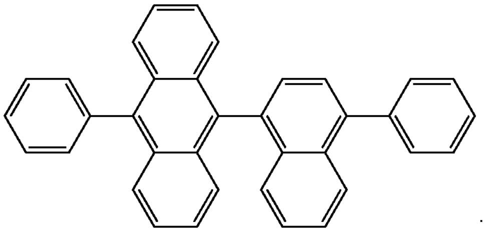
.
In an embodiment, the amine compound represented by Formula 1 may be any one among the combinations represented in Compound Group 1.
One or more embodiments of the present disclosure provide an amine compound represented by Formula 1.

BRIEF DESCRIPTION OF THE DRAWINGS

The accompanying drawings are included to provide a further understanding of the present disclosure and are incorporated in and constitute a part of this specification. The drawings illustrate embodiments of the present disclosure and, together with the description, serve to explain principles of the present disclosure. In the drawings.

DETAILED DESCRIPTION

Figure 1:
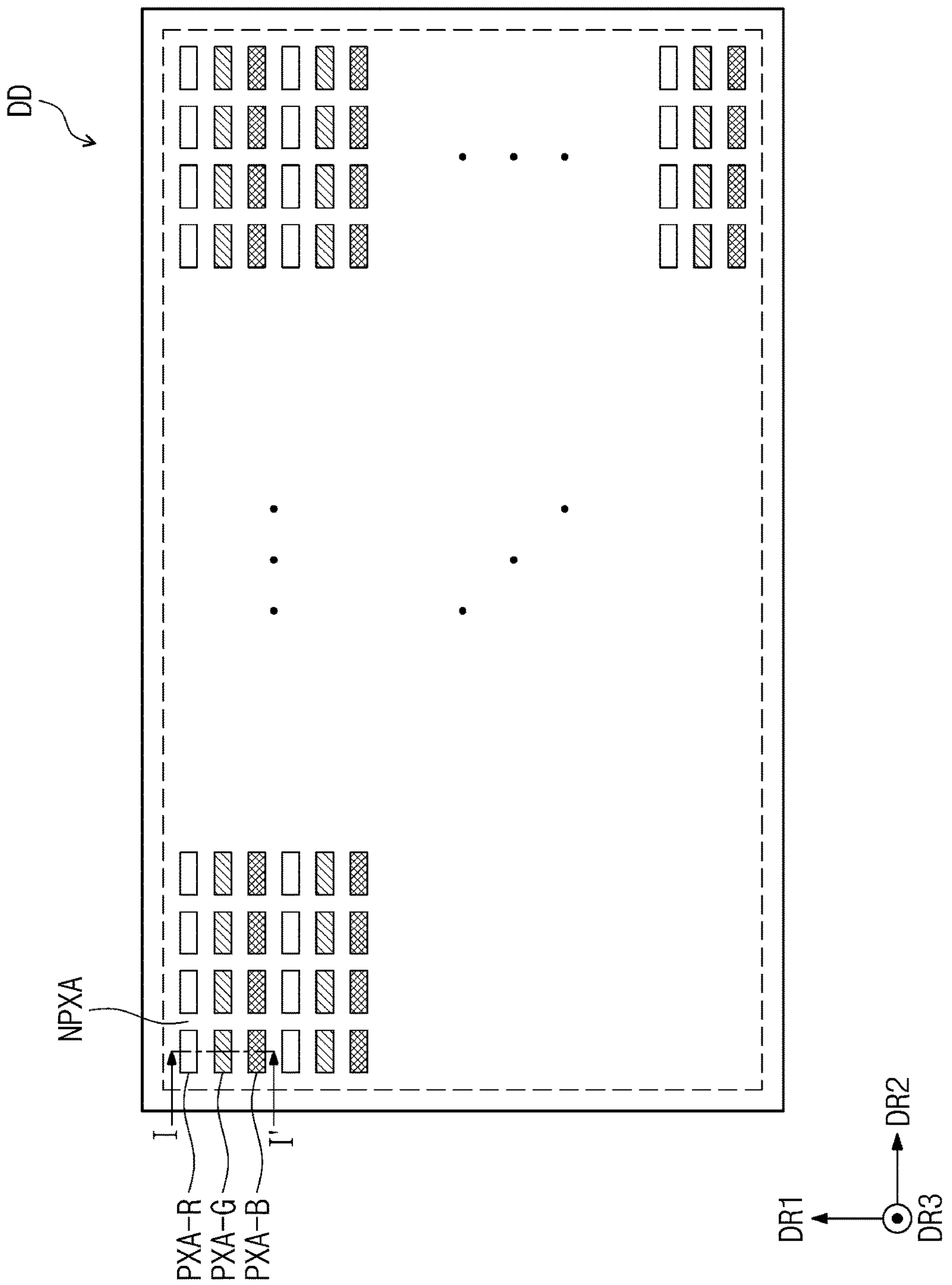
FIG. 1 is a plan view showing a display apparatus according to an embodiment of the present disclosure.

The present disclosure may have various suitable modifications and may be embodied in different forms, and embodiments will be explained in more detail with reference to the accompany drawings. The present disclosure may, however, be embodied in different forms and should not be construed as being limited to the embodiments set forth herein. Rather, all modifications, equivalents, and substituents that are included in the spirit and technical scope of the present disclosure should be included in the present disclosure.

Like reference numerals refer to like elements throughout, and duplicative descriptions thereof may not be provided. In the drawings, the dimensions of structures may be exaggerated for clarity of illustration. It will be understood that, although the terms first, second, etc. may be utilized herein to describe various elements, these elements should not be limited by these terms. These terms are only used to distinguish one element from another element. Thus, a first element could be termed a second element without departing from the teachings of the present disclosure. Similarly, a second element could be termed a first element. As utilized herein, the singular forms are intended to include the plural forms as well, unless the context clearly indicates otherwise.

In the description, it will be further understood that the terms “includes,” “including,” “comprises,” and/or “comprising,” when used in this specification, specify the presence of stated features, numerals, steps, operations, elements, parts, or the combination thereof, but do not preclude the presence or addition of one or more other features, numerals, steps, operations, elements, parts, or the combination thereof.

In the description, when a layer, a film, a region, a plate, etc. is referred to as being “on” or “above” another part, it can be “directly on” the other part, or intervening layers may also be present. When a layer, a film, a region, a plate, etc. is referred to as being “under” or “below” another part, it can be “directly under” the other part, or intervening layers may also be present. When an element is referred to as being “directly on,” or “directly under” another element, there are no intervening elements present. Also, when an element is referred to as being disposed “on” another element, it can be disposed under the other element.

As used herein, the singular forms “a,” “an,” and “the” are intended to include the plural forms as well, unless the context clearly indicates otherwise. As used herein, the terms “use,” “using,” and “used” may be considered synonymous with the terms “utilize,” “utilizing,” and “utilized,” respectively. As used herein, expressions such as “at least one of,” “one of,” and “selected from,” when preceding a list of elements, modify the entire list of elements and do not modify the individual elements of the list. As used herein, the term “and/or” includes any and all combinations of one or more of the associated listed items. Further, the use of “may” when describing embodiments of the present disclosure refers to “one or more embodiments of the present disclosure”.

Hereinafter, embodiments of the present disclosure will be explained by referring to the drawings.

Figure 2:
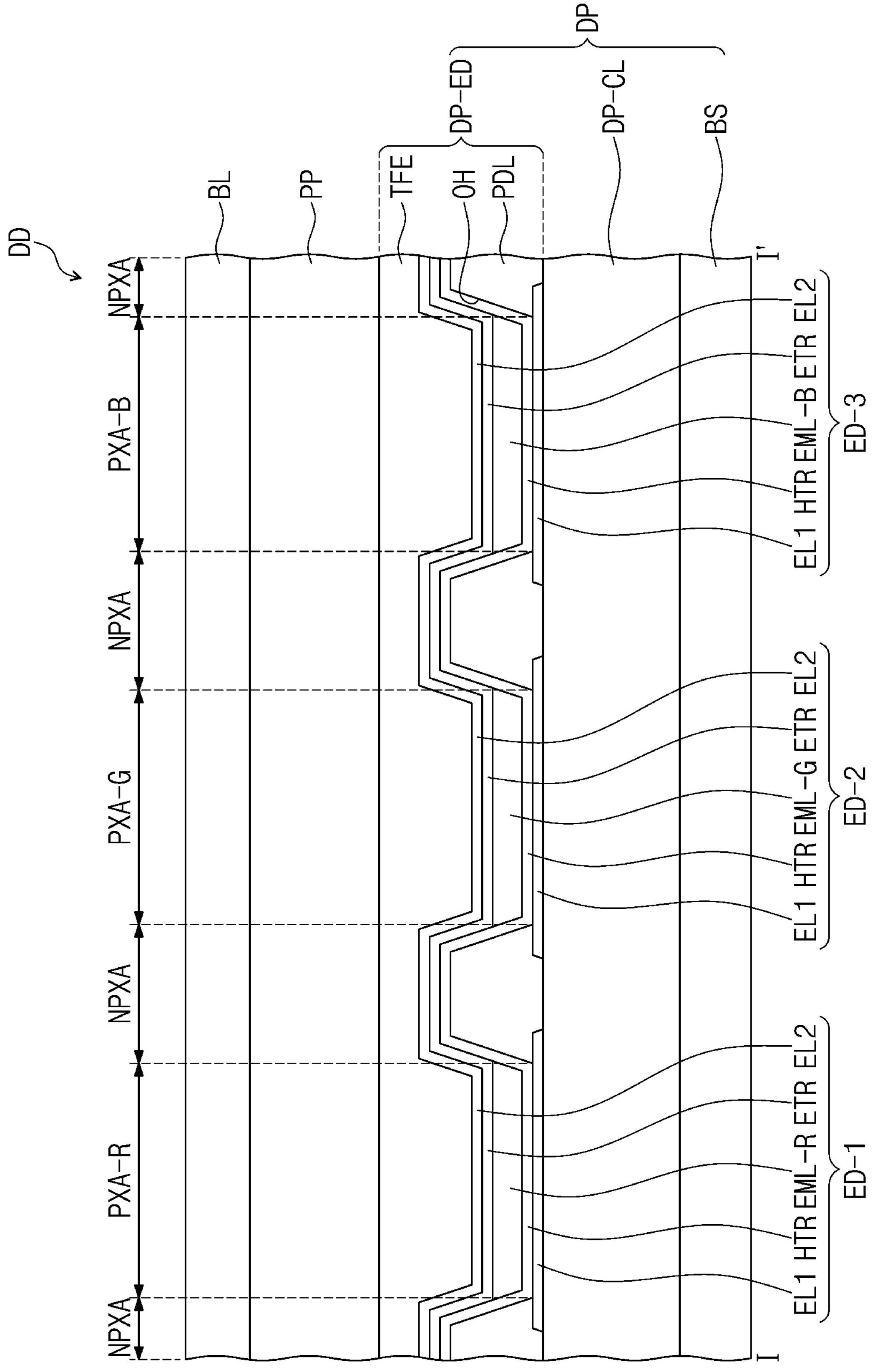
FIG. 2 is a cross-sectional view showing a display apparatus according to an embodiment of the present disclosure.

FIG. 1 is a plan view showing an embodiment of a display apparatus DD. FIG. 2 is a cross-sectional view of a display apparatus DD of an embodiment. FIG. 2 is a cross-sectional view showing a part corresponding to line I-I'.

The display apparatus DD may include a display panel DP and an optical layer PP disposed on the display panel DP. The display panel DP includes organic electroluminescence devices ED-1, ED-2 and ED-3. The display apparatus DD may include multiple organic electroluminescence devices ED-1, ED-2 and ED-3. The optical layer PP may be disposed on the display panel DP and may control reflected or reduce reflection of external light at the display panel DP. The optical layer PP may include, for example, a polarization layer and/or a color filter layer. In some embodiments, the optical layer PP may be omitted in the display apparatus DD.

On the optical layer PP, a base substrate BL may be disposed. The base substrate BL may be a member providing a base surface where the optical layer PP is disposed. The base substrate BL may be a glass substrate, a metal substrate, a plastic substrate, etc. However, embodiments of the present disclosure are not limited thereto, and the base substrate BL may be an inorganic layer, an organic layer, or a composite material layer. In some embodiments, the base substrate BL may be omitted.

The display apparatus DD according to an embodiment may further include a filling layer. The filling layer may be disposed between a display device layer DP-ED and a base substrate BL. The filling layer may be an organic layer. The filling layer may include at least one among an acrylic-based resin, a silicon-based resin and an epoxy-based resin.

The display panel DP may include a base layer BS, a circuit layer DP-CL provided on the base layer BS and a display device layer DP-ED. The display device layer DP-ED may include a pixel definition layer PDL, organic electroluminescence devices ED-1, ED-2 and ED-3 disposed in the pixel definition layer PDL, and an encapsulating layer TFE disposed on the organic electroluminescence devices ED-1, ED-2 and ED-3.

The base layer BS may provide a base surface where the display device layer DP-ED is disposed. The base layer BS may be a glass substrate, a metal substrate, a plastic substrate, etc. However, embodiments of the present disclosure are not limited thereto, and the base layer BS may be an inorganic layer, an organic layer or a composite material layer.

In an embodiment, the circuit layer DP-CL is disposed on the base layer BS, and the circuit layer DP-CL may include multiple transistors. Each of the transistors may include a control electrode, an input electrode, and an output electrode. For example, the circuit layer DP-CL may include switching transistors and/or driving transistors for driving the organic electroluminescence devices ED-1, ED-2 and ED-3 of the display device layer DP-ED.

Each of the organic electroluminescence devices ED-1, ED-2 and ED-3 may have a structure of one of the organic electroluminescence devices ED of the embodiments according to FIG. 3 to FIG. 6, which will be explained later. Each of the organic electroluminescence devices ED-1, ED-2 and ED-3 may include a first electrode EL1, a hole transport region HTR, emission layers EML-R, EML-G and EML-B, an electron transport region ETR and a second electrode EL2.

FIG. 2 illustrates an embodiment where the emission layers EML-R, EML-G and EML-B of organic electroluminescence devices ED-1, ED-2 and ED-3 are in opening portions OH defined in a pixel definition layer PDL, and a hole transport region HTR, an electron transport region ETR and a second electrode EL2 are provided as common layers to all of the organic electroluminescence devices ED-1, ED-2 and ED-3. However, embodiments of the present disclosure are not limited thereto. In some embodiments, for example, the hole transport region HTR and the electron transport region ETR may be provided by being patterned in the opening portions OH defined in the pixel definition layer PDL. For example, in an embodiment, the hole transport region HTR, the emission layers EML-R, EML-G and EML-B, and the electron transport region ETR of the organic electroluminescence devices ED-1, ED-2 and ED-3 may be provided by being patterned by an ink jet printing method.

An encapsulating layer TFE may cover the organic electroluminescence devices ED-1, ED-2 and ED-3. The encapsulating layer TFE may encapsulate the display device layer DP-ED. The encapsulating layer TFE may be a thin film encapsulating layer. The encapsulating layer TFE may be one layer or a stacked layer of multiple layers. The encapsulating layer TFE includes at least one insulating layer. The encapsulating layer TFE according to an embodiment may include at least one inorganic layer (hereinafter, encapsulating inorganic layer). In some embodiments, the encapsulating layer TFE according to an embodiment may include at least one organic layer (hereinafter, encapsulating organic layer) and at least one encapsulating inorganic layer.

The encapsulating inorganic layer protects the display device layer DP-ED from moisture/oxygen, and the encapsulating organic layer protects the display device layer DP-ED from foreign materials (such as dust particles). The encapsulating inorganic layer may include silicon nitride, silicon oxy nitride, silicon oxide, titanium oxide, and/or aluminum oxide, without limitation. The encapsulating organic layer may include an acrylic-based compound, an epoxy-based compound, etc. The encapsulating organic layer may include a photopolymerizable organic material, without limitation.

The encapsulating layer TFE may be disposed on the second electrode EL2, and may be disposed while filling the opening portion OH.

Referring to FIG. 1 and FIG. 2, the display apparatus DD may include a non-luminous area NPXA and luminous areas PXA-R, PXA-G and PXA-B. The luminous areas PXA-R, PXA-G and PXA-B may be to emit light produced from the organic electroluminescence devices ED-1, ED-2 and ED-3, respectively. The luminous areas PXA-R, PXA-G and PXA-B may be separated from each other on a plane.

The luminous areas PXA-R, PXA-G and PXA-B may be separated from each other by the pixel definition layer PDL. The non-luminous areas NPXA may be between neighboring luminous areas PXA-R, PXA-G and PXA-B and may correspond to the pixel definition layer PDL. In some embodiments, each of the luminous areas PXA-R, PXA-G and PXA-B may correspond to a separate pixel. The pixel definition layer PDL may divide (e.g., separate) the organic electroluminescence devices ED-1, ED-2 and ED-3. The emission layers EML-R, EML-G and EML-B of the organic electroluminescence devices ED-1, ED-2 and ED-3 may be disposed and divided in the opening portions OH defined in the pixel definition layer PDL.

The luminous areas PXA-R, PXA-G and PXA-B may be divided into multiple (e.g., different) groups according to the color of light produced from the organic electroluminescence devices ED-1, ED-2 and ED-3. In the display apparatus DD of an embodiment, shown in FIG. 1 and FIG. 2, three luminous areas PXA-R, PXA-G and PXA-B respectively emitting red light, green light and blue light are illustrated as an embodiment. For example, the display apparatus DD of an embodiment may include a red luminous area PXA-R, a green luminous area PXA-G and a blue luminous area PXA-B, which are separated from each other.

In the display apparatus DD according to an embodiment, multiple organic electroluminescence devices ED-1, ED-2 and ED-3 may be to emit light in different wavelength regions. For example, in an embodiment, the display apparatus DD may include a first organic electroluminescence device ED-1 to emit red light, a second organic electroluminescence device ED-2 to emit green light, and a third organic electroluminescence device ED-3 to emit blue light. For example, each of the red luminous area PXA-R, the green luminous area PXA-G, and the blue luminous area PXA-B of the display apparatus DD may correspond to the first organic electroluminescence device ED-1, the second organic electroluminescence device ED-2, and the third organic electroluminescence device ED-3, respectively.

However, embodiments of the present disclosure are not limited thereto, and the first to third organic electroluminescence devices ED-1, ED-2 and ED-3 may be to emit light in substantially the same wavelength region, or at least one thereof may be to emit light in a different wavelength region. For example, all the first to third organic electroluminescence devices ED-1, ED-2 and ED-3 may be to emit blue light.

The luminous areas PXA-R, PXA-G and PXA-B in the display apparatus DD according to an embodiment may be arranged in a stripe shape. Referring to FIG. 1, multiple red luminous areas PXA-R may be arranged with each other along a second direction DR2, multiple green luminous areas PXA-G may be arranged with each other along the second direction DR2, and multiple blue luminous areas PXA-B may be arranged with each along the second direction DR2. In some embodiments, a red luminous area PXA-R, a green luminous area PXA-G and a blue luminous area PXA-B may be arranged with each other (e.g., by turns) along a first direction DR1, which may be normal to the second direction DR2.

In FIG. 1 and FIG. 2, the areas of the luminous areas PXA-R, PXA-G and PXA-B are shown as being similar or the same, but embodiments of the present disclosure are not limited thereto. The areas of the luminous areas PXA-R, PXA-G and PXA-B may be different from each other according to the wavelength region of light emitted. The areas of the luminous areas PXA-R, PXA-G and PXA-B may be or refer to areas in a plane defined by the first direction DR1 and the second direction DR2.

The arrangement type or pattern of the luminous areas PXA-R, PXA-G and PXA-B is not limited to the configuration shown in FIG. 1, and the arrangement order of the red luminous areas PXA-R, the green luminous areas PXA-G and the blue luminous areas PXA-B may be provided in various suitable combinations according to the properties desired for the display apparatus DD. For example, the arrangement type or pattern of the luminous areas PXA-R, PXA-G and PXA-B may be a PENTILE® arrangement, or a diamond arrangement.

In some embodiments, the areas of the luminous areas PXA-R, PXA-G and PXA-B may be different from each other. For example, in an embodiment, the area of the green luminous area PXA-G may be smaller than the area of the blue luminous area PXA-B, but embodiments of the present disclosure are not limited thereto.

Hereinafter, FIG. 3 to FIG. 6 are cross-sectional views schematically showing organic electroluminescence devices according to embodiments. The organic electroluminescence device ED according to an embodiment may include a first electrode EL1, a hole transport region HTR, an emission layer EML, an electron transport region ETR, and a second electrode EL2 stacked in order.

The organic electroluminescence device ED of an embodiment may include an amine compound, which will be explained later, in the hole transport region HTR disposed between the first electrode EL1 and the second electrode EL2. However, embodiments of the present disclosure are not limited thereto, and the organic electroluminescence device ED of an embodiment may include the amine compound in an emission layer EML and/or an electron transport region ETR, which may be among the functional layers disposed between the first electrode EL1 and the second electrode EL2, and/or in a capping layer CPL disposed on the second electrode EL2 in addition to the hole transport region HTR.

Figure 3:
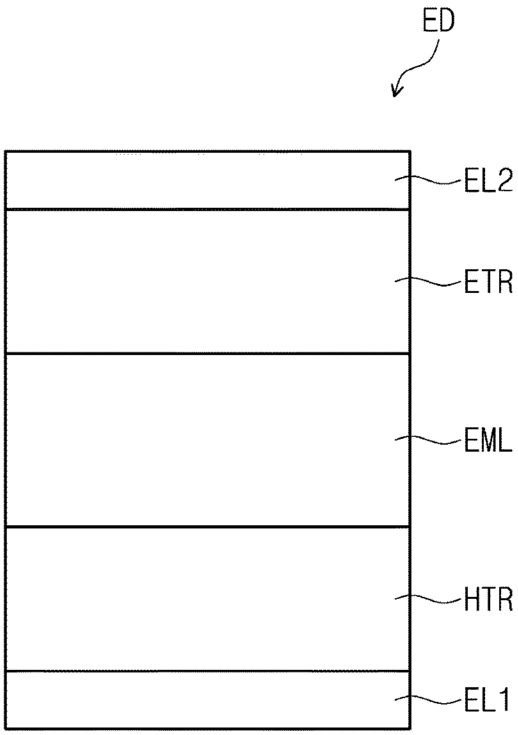
FIG. 3 is a cross-sectional view schematically showing an organic electroluminescence device according to an embodiment of the present disclosure.
Figure 4:
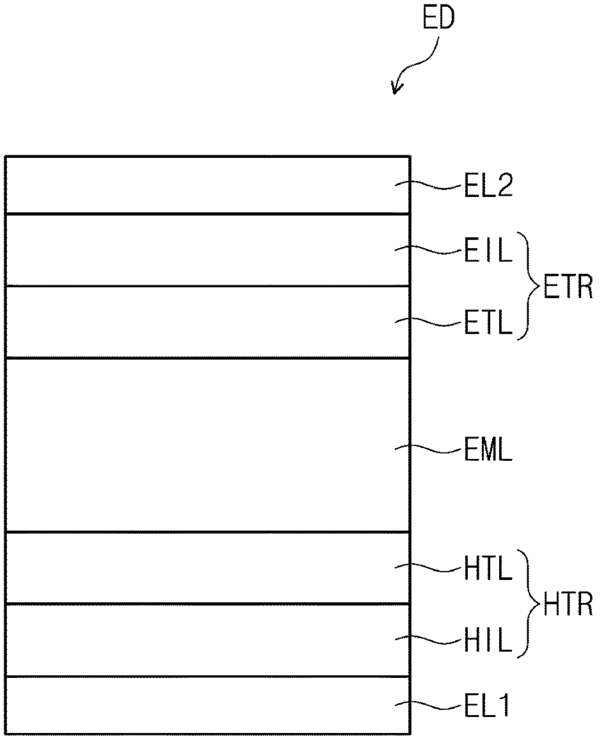
FIG. 4 is a cross-sectional view schematically showing an organic electroluminescence device according to an embodiment of the present disclosure.
Figure 5:
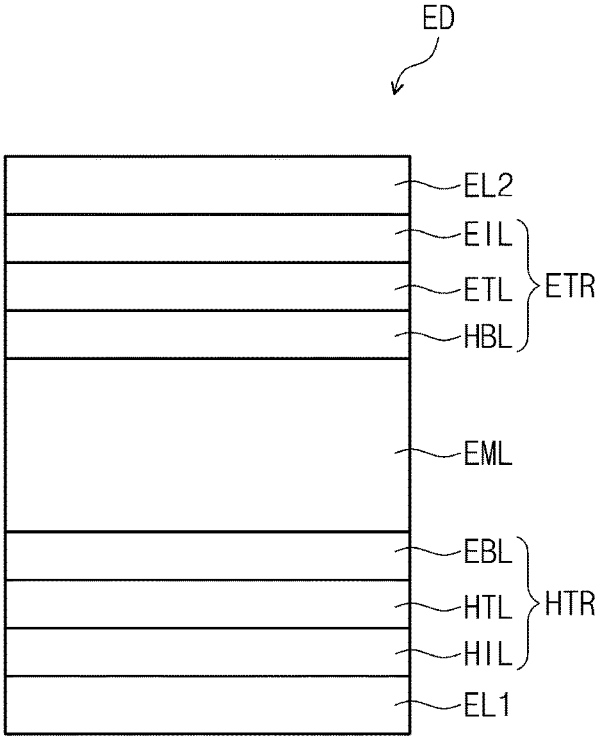
FIG. 5 is a cross-sectional view schematically showing an organic electroluminescence device according to an embodiment of the present disclosure.
Figure 6:
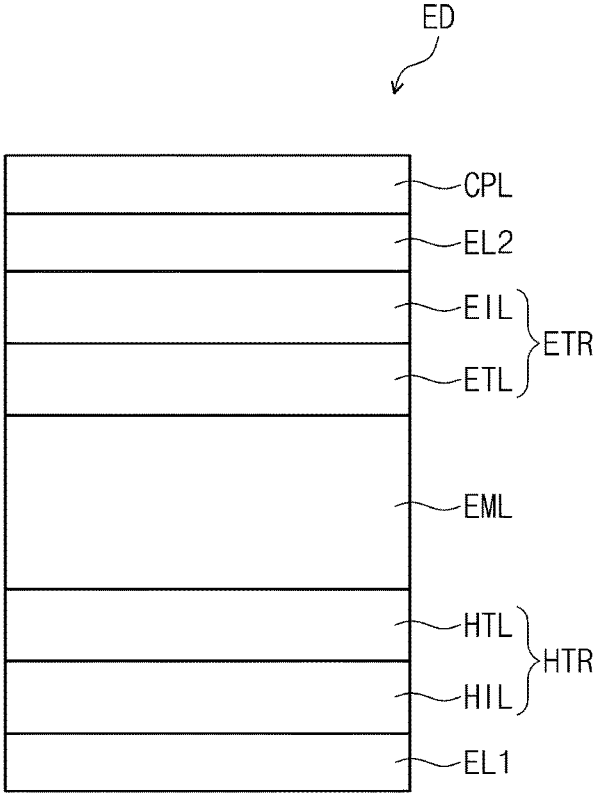
FIG. 6 is a cross-sectional view schematically showing an organic electroluminescence device according to an embodiment of the present disclosure.

Compared with FIG. 3, FIG. 4 shows the cross-sectional view of an organic electroluminescence device ED of an embodiment, wherein a hole transport region HTR includes a hole injection layer HIL and a hole transport layer HTL, and an electron transport region ETR includes an electron injection layer EIL and an electron transport layer ETL. Compared with FIG. 3, FIG. 5 shows the cross-sectional view of an organic electroluminescence device ED of an embodiment, wherein a hole transport region HTR includes a hole injection layer HIL, a hole transport layer HTL, and an electron blocking layer EBL, and an electron transport region ETR includes an electron injection layer EIL, an electron transport layer ETL, and a hole blocking layer HBL. Compared with FIG. 4, FIG. 6 shows the cross-sectional view of an organic electroluminescence device ED of an embodiment, including a capping layer CPL disposed on the second electrode EL2.

The first electrode EL1 has conductivity. The first electrode EU may be formed utilizing a metal material, a metal alloy and/or a conductive compound. The first electrode EL1 may be an anode or a cathode. However, embodiments of the present disclosure are not limited thereto. In some embodiments, the first electrode EL1 may be a pixel electrode. The first electrode EL1 may be a transmissive electrode, a transflective electrode, or a reflective electrode. When the first electrode EL1 is a transmissive electrode, the first electrode EL1 may include a transparent metal oxide (such as indium tin oxide (ITO), indium zinc oxide (IZO), zinc oxide (ZnO), and/or indium tin zinc oxide (ITZO)). When the first electrode EL1 is a transflective electrode or a reflective electrode, the first electrode EL1 may include silver (Ag), magnesium (Mg), copper (Cu), aluminum (Al), platinum (Pt), palladium (Pd), gold (Au), nickel (Ni), neodymium (Nd), iridium (Ir), chromium (Cr), lithium (Li), calcium (Ca), LiF/calcium (Ca), LiF/aluminum (Al), molybdenum (Mo), titanium (Ti), tungsten (W), compound(s) thereof, or mixture(s) thereof (for example, a mixture of Ag and Mg). In some embodiments, the first electrode EL1 may have a structure of multiple layers including a reflective layer or a transflective layer formed utilizing the above materials, and a transmissive conductive layer formed utilizing ITO, IZO, ZnO, and/or ITZO. For example, the first electrode EU may include a three-layer structure of ITO/Ag/ITO. However, embodiments of the present disclosure are not limited thereto. In some embodiments, the first electrode EL1 may include the above-described metal materials, combinations of two or more metal materials selected from the above-described metal materials, or oxides of the above-described metal materials, without limitation. The thickness of the first electrode EL1 may be about 700 Å to about 10,000 Å. For example, the thickness of the first electrode EL1 may be about 1,000 Å to about 3,000 Å.

The hole transport region HTR is provided on the first electrode EL1. The hole transport region HTR may include at least one among a hole injection layer HIL, a hole transport layer HTL, a buffer layer or an emission auxiliary layer, and an electron blocking layer EBL. The thickness of the hole transport region HTR may be, for example, about 50 Å to about 15,000 Å.

The hole transport region HTR may have a single layer formed utilizing a single material, a single layer formed utilizing multiple different materials, or a multilayer structure including multiple layers formed utilizing multiple different materials.

For example, the hole transport region HTR may have the structure of a single layer of a hole injection layer HIL or a hole transport layer HTL, or may have a structure of a single layer formed utilizing a hole injection material and a hole transport material. In some embodiments, the hole transport region HTR may have a structure of a single layer formed utilizing multiple different materials, or a structure stacked from the first electrode EL1 of hole injection layer HIL/hole transport layer HTL, hole injection layer HIL/hole transport layer HTL/buffer layer, hole injection layer HIL/buffer layer, hole transport layer HTL/buffer layer, or hole injection layer HIL/hole transport layer HTL/electron blocking layer EBL, without limitation.

The hole transport region HTR of the organic electroluminescence device ED of an embodiment may include an amine compound according to embodiments of the present disclosure.

In the description, the term "substituted or unsubstituted" corresponds to being unsubstituted, or substituted with at least one substituent selected from the group consisting of a deuterium atom, a halogen atom, a cyano group, a nitro group, an amino group, a silyl group, an oxy group, a thio group, a sulfinyl group, a sulfonyl group, a carbonyl group, a boron group, a phosphine oxide group, a phosphine sulfide group, an alkyl group, an alkenyl group, an alkynyl group, an alkoxy group, a hydrocarbon ring group, an aryl group, and a heterocyclic group. In some embodiments, each of the above substituents may be further substituted or unsubstituted. For example, a biphenyl group may be interpreted as a named aryl group or as a phenyl group substituted with a phenyl group.

In the description, the terms "forming a ring via combination with an adjacent group," and "combine[d] with an adjacent group to form a ring" may refer to forming a substituted or unsubstituted hydrocarbon ring, or a substituted or unsubstituted heterocycle via combination with an adjacent group. The term "hydrocarbon ring" includes an aliphatic hydrocarbon ring and an aromatic hydrocarbon ring. The term "heterocycle" includes an aliphatic heterocycle and an aromatic heterocycle. The hydrocarbon ring and the heterocycle may each independently be monocycles or polycycles. In some embodiments, the ring formed via combination with an adjacent group may be combined with another ring to form a spiro structure.

In the description, the term "adjacent group" may refer to a substituent on the same atom or point, a substituent on an atom that is directly connected to the base atom or point, or a substituent sterically positioned (e.g., within intramolecular bonding distance) to the corresponding substituent. For example, in 1,2-dimethylbenzene, two methyl groups may be interpreted as "adjacent groups" to each other, and in 1,1-diethylcyclopentane, two ethyl groups may be interpreted as "adjacent groups" to each other.

In the description, the halogen atom may be a fluorine atom, a chlorine atom, a bromine atom or an iodine atom.

In the description, the alkyl group may be a linear, branched or cyclic group. The carbon number of the alkyl group may be 1 to 50, 1 to 30, 1 to 20, 1 to 10, or 1 to 6. Examples of the alkyl group may include methyl, ethyl, n-propyl, isopropyl, n-butyl, s-butyl, t-butyl, i-butyl, 2-ethylbutyl, 3,3-dimethylbutyl, n-pentyl, i-pentyl, neopentyl, t-pentyl, cyclopentyl, 1-methylpentyl, 3-methylpentyl, 2-ethylpentyl, 4-methyl-2-pentyl, n-hexyl, 1-methylhexyl, 2-ethylhexyl, 2-butylhexyl, cyclohexyl, 4-methylcyclohexyl, 4-t-butylcyclohexyl, n-heptyl, 1-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, cyclooctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldocecyl, 2-octyldodecyl, n-tridecyl, n-tetradecyl, n-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyleicosyl, 2-butyleicosyl, 2-hexyleicosyl, 2-octyleicosyl, n-henicosyl, n-docosyl, n-tricosyl, n-tetracosyl, n-pentacosyl, n-hexacosyl, n-heptacosyl, n-octacosyl, n-nonacosyl, n-triacontyl, etc., without limitation.

In the description, the term "aryl group" refers to an optional functional group or substituent derived from an aromatic hydrocarbon ring. The aryl group may be a monocyclic aryl group or a polycyclic aryl group. The carbon number for forming rings in the aryl group may be 6 to 30, 6 to 20, or 6 to 15. Examples of the aryl group may include phenyl, naphthyl, fluorenyl, anthracenyl, phenanthryl, biphenyl, terphenyl, quaterphenyl, quinquephenyl, sexiphenyl, triphenylenyl, pyrenyl, benzofluoranthenyl, chrysenyl, etc., without limitation.

In the description, the fluorenyl group may be substituted, and two substituents may be combined with each other to form a spiro structure. Examples of a substituted fluorenyl group are as follows. However, embodiments of the present disclosure are not limited thereto.

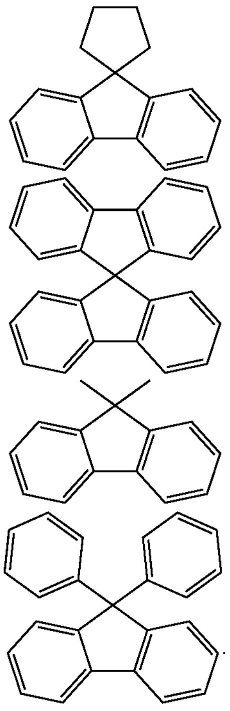

In the description, the heteroaryl group may include one or more among boron (B), oxygen (O), nitrogen (N), phosphorus (P), silicon (Si) and sulfur (S) as heteroatoms. When the heteroaryl group includes two or more heteroatoms, the two or more heteroatoms may be the same or different. The heteroaryl group may be a monocyclic heterocyclic group or a polycyclic heterocyclic group. The carbon number for forming rings of the heteroaryl group may be 2 to 30, 2 to 20, or 2 to 10. Examples of the heteroaryl group may include thiophene, furan, pyrrole, imidazole, triazole, pyridine, bipyridine, pyrimidine, triazine, triazole, acridyl, pyridazine, pyrazinyl, quinoline, quinazoline, quinoxaline, phenoxazine, phthalazine, pyrido pyrimidine, pyrido pyrazine, pyrazino pyrazine, isoquinoline, indole, carbazole, N-arylcarbazole, N-heteroarylcarbazole, N-alkylcarbazole, benzoxazole, benzimidazole, benzothiazole, benzocarbazole, benzothiophene, dibenzothiophene, thienothiophene, benzofuran, phenanthroline, thiazole, isooxazole, oxazole, oxadiazole, thiadiazole, phenothiazine, dibenzosilole, dibenzofuran, etc., without limitation.

In the description, the explanation on the aryl group may be applied to the arylene group except that the arylene group is a divalent group. The explanation on the heteroaryl group may be applied to the heteroarylene group except that the heteroarylene group is a divalent group.

In the description, the silyl group includes an alkyl silyl group and an aryl silyl group. Examples of the silyl group may include a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group, etc., without limitation.

In the description, the thiol group may include an alkyl thio group and an aryl thio group. The term "thiol group" may refer to the above-defined alkyl group or aryl group combined with a sulfur atom. Examples of the thiol group may include a methylthio group, an ethylthio group, a propylthio group, a pentylthio group, a hexylthio group, an octylthio group, a dodecylthio group, a cyclopentylthio group, a cyclohexylthio group, a phenylthio group, a naphthylthio group, etc., without limitation.

In the description, the term "oxy group" may refer to the above-defined alkyl group or aryl group combined with an oxygen atom. The oxy group may include an alkoxy group and an aryl oxy group. The alkoxy group may be a linear, branched or cyclic chain. The carbon number of the alkoxy group is not specifically limited but may be, for example, 1 to 20 or 1 to 10. Examples of the oxy group may include methoxy, ethoxy, n-propoxy, isopropoxy, butoxy, pentyloxy, hexyloxy, octyloxy, nonyloxy, decyloxy, benzyloxy, etc. However, embodiments of the present disclosure are not limited thereto.

In the description, the alkenyl group may be a linear chain or a branched chain. The carbon number is not specifically limited but may be 2 to 30, 2 to 20, or 2 to 10. Examples of the alkenyl group may include a vinyl group, a 1-butenyl group, a 1-pentenyl group, a 1,3-butadienyl aryl group, a styrenyl group, a styrylvinyl group, etc., without limitation.

In the description, a direct linkage may refer to a single bond.

In some embodiments, in the description, "-*" refers to a position to be connected.

The amine compound according to embodiments of the present disclosure are represented by Formula 1:

Formula 1

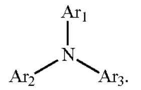

In Formula 1, $Ar_1$ may be represented by Formula 2-1, $Ar_2$ may be represented by Formula 2-2, and $Ar_3$ may be represented by Formula 2-3:

Formula 2-1

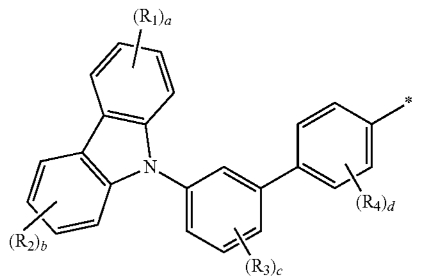

Formula 2-2

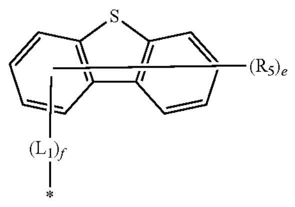

Formula 2-3

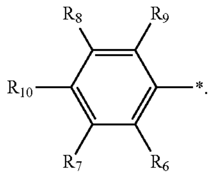

In Formula 2-1 and Formula 2-2, $R_1$ to $R_5$ may each independently be a hydrogen atom, a deuterium atom, a halogen atom, a cyano group, a substituted or unsubstituted alkyl group of 1 to 20 carbon atoms, a substituted or unsubstituted oxy group, a substituted or unsubstituted thiol group, a substituted or unsubstituted silyl group, a substituted or unsubstituted aryl group of 6 to 30 ring-forming carbon atoms, or a substituted or unsubstituted heteroaryl group of 2 to 30 ring-forming carbon atoms.

In Formula 2-1, "a" may be an integer of 0 to 4. When "a" is 2 or more, the multiple $R_1$ groups may be the same or different.

In Formula 2-1, "b" may be an integer of 0 to 4. When "b" is 2 or more, the multiple $R_2$ groups may be the same or different.

In Formula 2-1, "c" may be an integer of 0 to 4. When "c" is 2 or more, the multiple $R_3$ groups may be the same or different.

In Formula 2-1, "d" may be an integer of 0 to 4. When "d" is 2 or more, the multiple $R_4$ groups may be the same or different.

In Formula 2-2, "e" may be an integer of 0 to 7. When "e" is 2 or more, the multiple $R_5$ groups may be the same or different.

In Formula 2-2, $L_1$ may be a direct linkage, a substituted or unsubstituted arylene group of 6 to 30 ring-forming carbon atoms, or a substituted or unsubstituted heteroarylene group of 2 to 30 ring-forming carbon atoms.

In Formula 2-2, "f" may be an integer of 0 to 2. When "f" is 2, the multiple $L_1$ groups may be the same or different.

In Formula 2-3, $R_6$ to $R_9$ may each independently be a hydrogen atom, a deuterium atom, a halogen atom, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, and/or combined with an adjacent group to form a ring, where a fluorenyl group is excluded.

In Formula 2-3, $R_{10}$ may be a hydrogen atom, a deuterium atom, a halogen atom, a substituted or unsubstituted alkyl group of 1 to 20 carbon atoms, a substituted or unsubstituted alkenyl group of 2 to 20 carbon atoms, a substituted phenyl group, a substituted or unsubstituted aryl group of 7 to 30 ring-forming carbon atoms, or a substituted or unsubstituted heteroaryl group of 2 to 30 ring-forming carbon atoms, and/or combined with an adjacent group to form a ring, where a fluorenyl group is excluded.

In Formula 2-3, all of $R_6$ to $R_{10}$ are not hydrogen atoms (e.g., the case where all of $R_6$ to $R_{10}$ are hydrogen is excluded).

In Formula 2-2 and Formula 2-3, when "f" is 1 and $L_1$ is a phenylene group, $R_{10}$ is not an unsubstituted heteroaryl group. When $L_1$ is a direct linkage and the carbon at position 3 of the dibenzothiophene group of Formula 2-2 is combined with N of Formula 1, $R_{10}$ may be combined with an adjacent group but does not form a 3-dibenzothiophene group and a 3-dibenzofuran group. The carbon numbering of a dibenzothiophene group is shown in Formula 1-1, and the carbon numbering of a dibenzofuran group is shown in Formula 1-2.

Formula 1-1

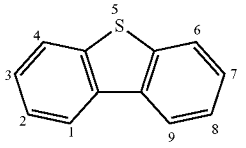

Formula 1-2

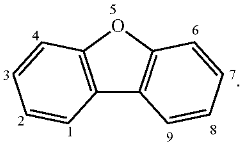

In an embodiment, when $L_1$ of Formula 2-2 is a direct linkage, and the carbon at position 3 of the dibenzothiophene group of Formula 2-2 is combined with N of Formula 1, $R_{10}$ of Formula 2-3 is combined with an adjacent group not to form a polycycle.

In an embodiment, Formula 1 may be represented by any one among Formula 3-1 to Formula 3-4:

Formula 3-1

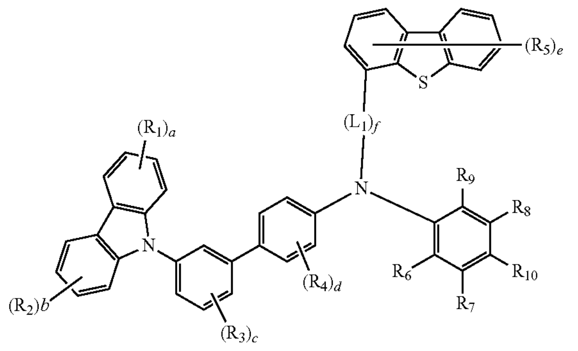

Formula 3-2

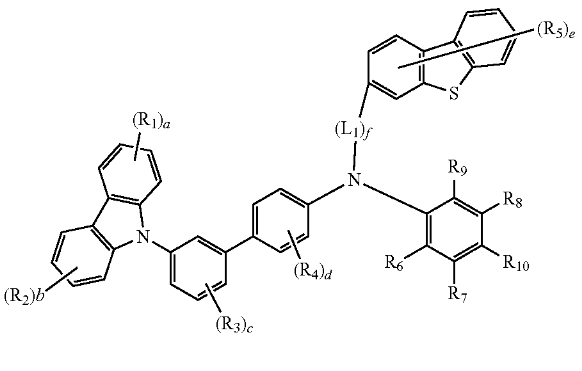

-continued

Formula 3-3

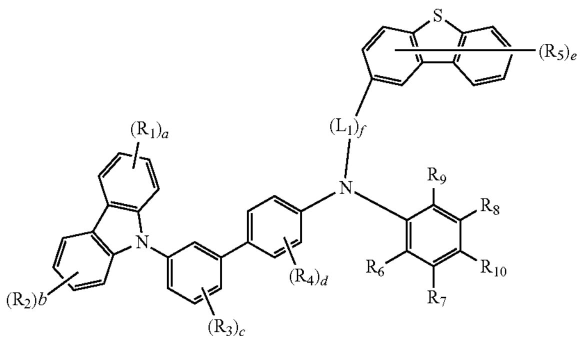

Formula 4-4

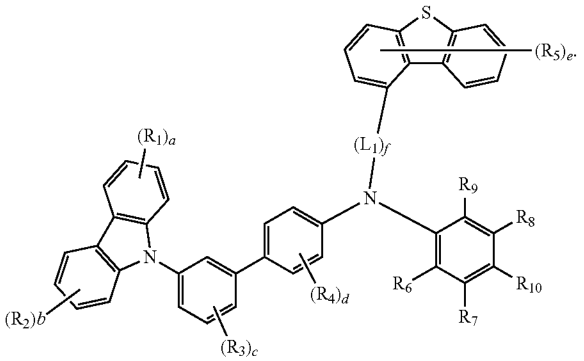

In Formula 3-1 to Formula 3-4, $R_1$ to $R_{10}$, “a” to “f”, and $L_1$ may each independently be the same as defined in Formula 1 and Formula 2. In Formula 3-2, when $L_1$ is a direct linkage, $R_{10}$ is not combined with an adjacent group to form a 3-dibenzothiophene group and a 3-dibenzofuran group.

In an embodiment, $L_1$ of Formula 2-2 may be a direct linkage, a substituted or unsubstituted phenylene group, a substituted or unsubstituted naphthylene group, or a substituted or unsubstituted biphenylene group.

In an embodiment, $L_1$ of Formula 2-2 may be a direct linkage or may be represented by any one among L-1 to L-4.

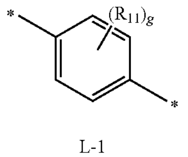

L-1

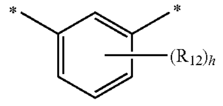

L-2

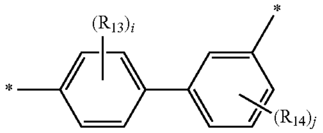

L-3

-continued

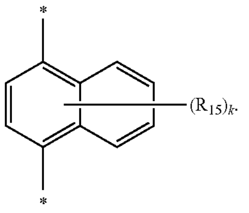

L-4

In L-1 to L-4, $R_{11}$ to $R_{15}$ may each independently be a hydrogen atom, a deuterium atom, a halogen atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

In L-1, "g" may be an integer of 0 to 4. When "g" is 2 or more, the multiple $R_{11}$ groups may be the same or different.

In L-2, "h" may be an integer of 0 to 4. When "h" is 2 or more, the multiple $R_{12}$ groups may be the same or different.

In L-3, "i" may be an integer of 0 to 4. When "i" is 2 or more, the multiple $R_{13}$ groups may be the same or different.

In L-3, "j" may be an integer of 0 to 4. When "j" is 2 or more, the multiple $R_{14}$ groups may be the same or different.

In L-4, "k" may be an integer of 0 to 6. When "k" is 2 or more, the multiple $R_{15}$ groups may be the same or different.

In an embodiment, $Ar_3$ of Formula 1 may be represented by any one among Formula 4-1 to Formula 4-4:

Formula 4-1

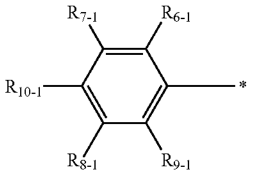

Formula 4-2

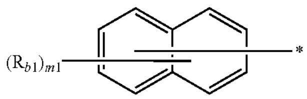

Formula 4-3

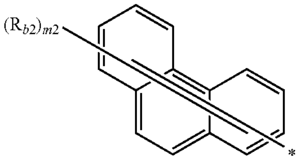

Formula 4-4

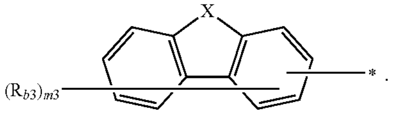

In Formula 4-1, $R_{6-1}$ to $R_{9-1}$ may each independently be a hydrogen atom, a deuterium atom, or a substituted or unsubstituted aryl group of 6 to 20 ring-forming carbon atoms.

In Formula 4-1, $R_{10-1}$ may be a hydrogen atom, a deuterium atom, a substituted or unsubstituted alkyl group of 1 to 10 carbon atoms, or a substituted or unsubstituted aryl group of 7 to 20 ring-forming carbon atoms.

In Formula 4-1, all of $R_{6-1}$ to $R_{10-1}$ are not hydrogen atoms.

In Formula 4-2 to Formula 4-4, $R_{b1}$ to $R_{b3}$ may each independently be a hydrogen atom, a deuterium atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

In Formula 4-4, X may be O or S.

However, when $L_1$ of Formula 2-2 is a direct linkage, and the carbon at position 3 of the dibenzothiophene group of Formula 2-2 is combined with N of Formula 1, Formula 4-4 is not a 3-dibenzofuran group or a 3-dibenzothiophene group. When "f" of Formula 2-2 is 1 and $L_1$ is a phenylene group, $Ar_3$ of Formula 1 is any one among Formula 4-1 to Formula 4-3 but is not Formula 4-4.

In Formula 4-2, "m1" may be an integer of 0 to 7. When "m1" is 2 or more, the multiple $R_{b1}$ groups may be the same or different.

In Formula 4-3, "m2" may be an integer of 0 to 9. When "m2" is 2 or more, the multiple $R_{b2}$ groups may be the same or different.

In Formula 4-4, "m3" may be an integer of 0 to 7. When "m3" is 2 or more, the multiple $R_{b3}$ groups may be the same or different.

In an embodiment, Formula 4-1 may be represented by any one among Formula 5-1 to Formula 5-3:

Formula 5-1

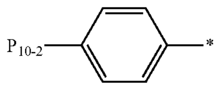

Formula 5-2

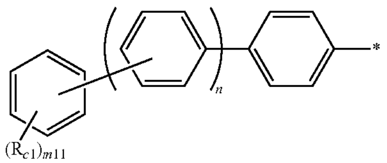

Formula 5-3

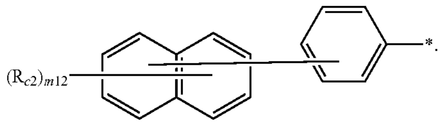

In Formula 5-1, $R_{10-2}$ may be a substituted or unsubstituted alkyl group of 1 to 10 carbon atoms. For example, in an embodiment, $R_{10-2}$ may be a methyl group.

In Formula 5-2 and Formula 5-3, $R_{c1}$ and $R_{c2}$ may each independently be a hydrogen atom, a deuterium atom, a halogen atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

In Formula 5-2, "n" may be 1 or 2.

In Formula 5-2, "m11" may be an integer of 0 to 5. When "m11" is 2 or more, the multiple $R_{c1}$ groups may be the same or different.

In Formula 5-3, "m12" may be an integer of 0 to 7. When "m12" is 2 or more, the multiple $R_{c2}$ groups may be the same or different.

In an embodiment, $R_3$ and $R_4$ of Formula 2-1 may each independently be a hydrogen atom, a deuterium atom, a halogen atom, a cyano group, or a substituted or unsubstituted alkyl group of 1 to 10 carbon atoms.

In an embodiment, the amine compound represented by Formula 1 may be any one among the combinations represented in Compound Group 1 (e.g., one selected from among Formulae A1 to V23, for example where Formula A1 is understood to be the combination of $Ar_1$, $Ar_2$, and $Ar_3$ in the same row):
Compound Group 1
| Formula 1 | $Ar_1$ | $Ar_2$ | $Ar_3$ |
|---|---|---|---|
| A1 | 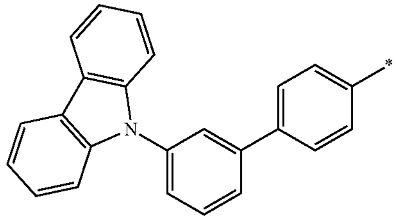 [SMILES: *c1ccc(-c2cccc(-n3c4ccccc4c4ccccc43)c2)cc1] | 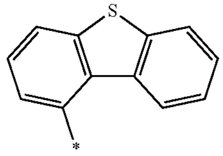 [SMILES: *c1cccc2sc3ccccc3c12] | 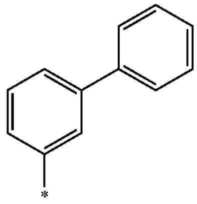 [SMILES: *c1cccc(-c2ccccc2)c1] |
| A2 | 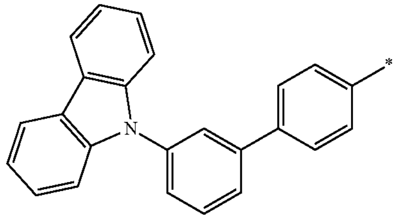 [SMILES: *c1ccc(-c2cccc(-n3c4ccccc4c4ccccc43)c2)cc1] | 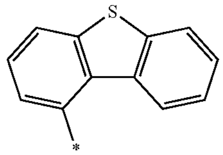 [SMILES: *c1cccc2sc3ccccc3c12] | 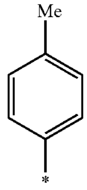 |
| A3 | 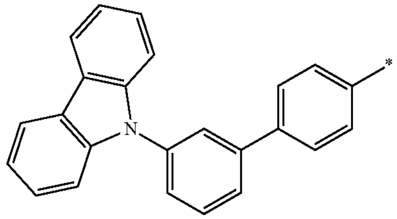 [SMILES: *c1ccc(-c2cccc(-n3c4ccccc4c4ccccc43)c2)cc1] | 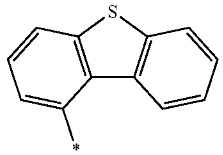 [SMILES: *c1cccc2sc3ccccc3c12] | 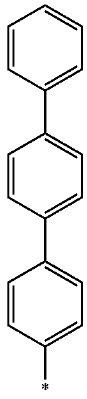 |
| A4 | 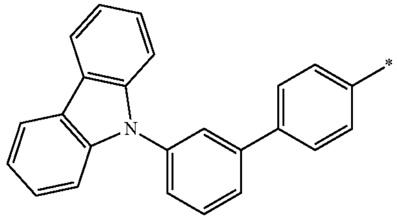 [SMILES: *c1ccc(-c2cccc(-n3c4ccccc4c4ccccc43)c2)cc1] | 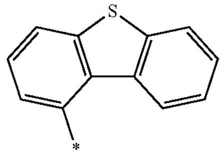 [SMILES: *c1cccc2sc3ccccc3c12] | 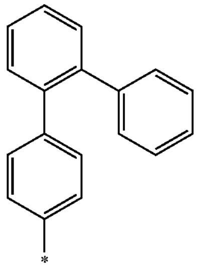 [SMILES: *c1ccc(-c2ccccc2-c2ccccc2)cc1] |

-continued
| Compound Group 1 | | | |
|---|---|---|---|
| Formula 1 | $Ar_1$ | $Ar_2$ | $Ar_3$ |
| A5 | 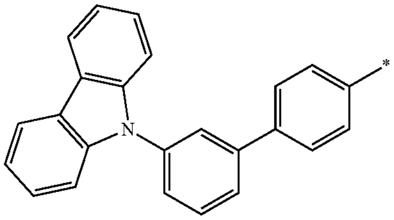 [SMILES: *c1ccc(-c2cccc(-n3c4ccccc4c4ccccc43)c2)cc1] | 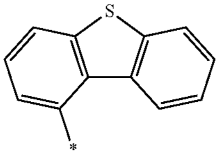 | 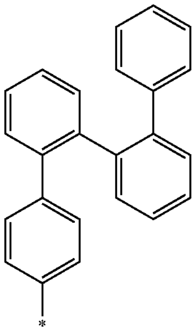 [SMILES: *c1ccc(-c2ccccc2-c2ccccc2-c2ccccc2)cc1] |
| A6 | 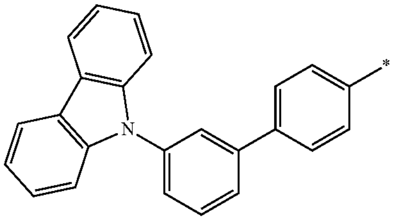 [SMILES: *c1ccc(-c2cccc(-n3c4ccccc4c4ccccc43)c2)cc1] | 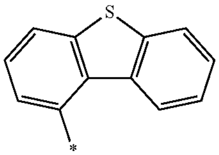 | 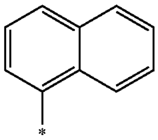 [SMILES: *c1cccc2ccccc12] |
| A7 | 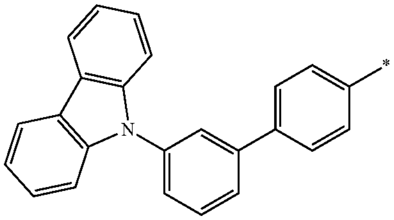 [SMILES: *c1ccc(-c2cccc(-n3c4ccccc4c4ccccc43)c2)cc1] | 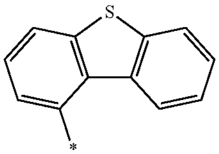 | 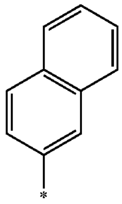 [SMILES: *c1ccc2ccccc2c1] |
| A8 | 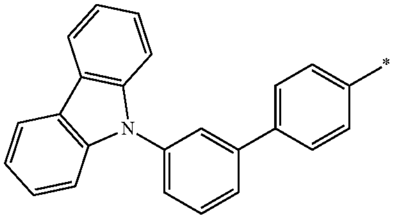 [SMILES: *c1ccc(-c2cccc(-n3c4ccccc4c4ccccc43)c2)cc1] | 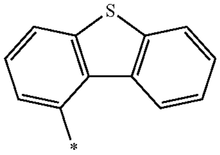 [SMILES: *c1cccc2sc3ccccc3c12] | 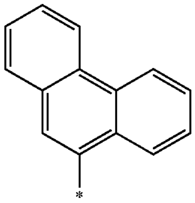 [SMILES: *c1cc2ccccc2c2ccccc12] |
| A9 | 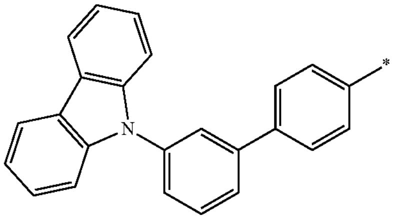 [SMILES: *c1ccc(-c2cccc(-n3c4ccccc4c4ccccc43)c2)cc1] | 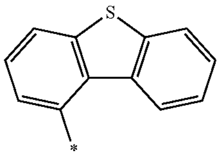 [SMILES: *c1cccc2sc3ccccc3c12] | 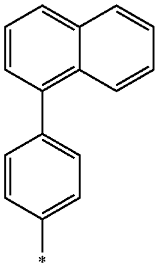 [SMILES: *c1ccc(-c2cccc3ccccc23)cc1] |

-continued
| Compound Group 1 | | | |
| --- | --- | --- | --- |
| Formula 1 | $Ar_1$ | $Ar_2$ | $Ar_3$ |
| A10 | 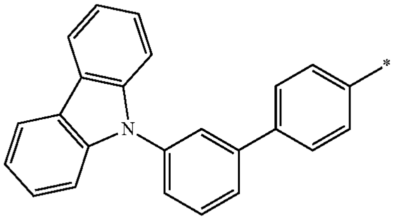 [SMILES: *c1ccc(-c2cccc(-n3c4ccccc4c4ccccc43)c2)cc1] | 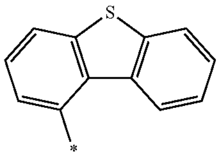 [SMILES: *c1cccc2sc3ccccc3c12] | 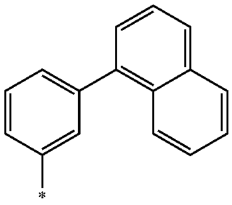 [SMILES: *c1cccc(-c2cccc3ccccc23)c1] |
| A11 | 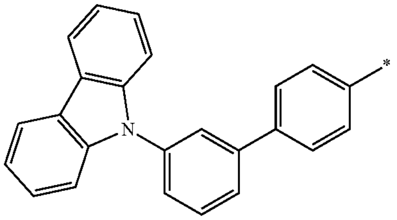 [SMILES: *c1ccc(-c2cccc(-n3c4ccccc4c4ccccc43)c2)cc1] | 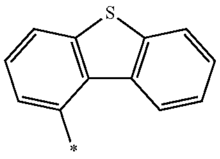 [SMILES: *c1cccc2sc3ccccc3c12] | 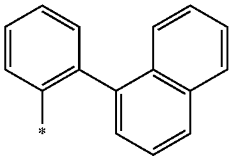 [SMILES: *c1ccccc1-c1cccc2ccccc12] |
| A12 | 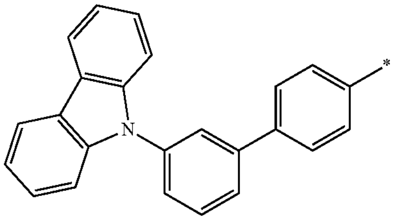 [SMILES: *c1ccc(-c2cccc(-n3c4ccccc4c4ccccc43)c2)cc1] | 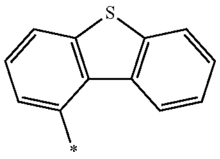 [SMILES: *c1cccc2sc3ccccc3c12] | 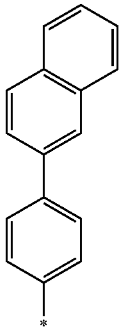 [SMILES: *c1ccc(-c2ccc3ccccc3c2)cc1] |
| A13 | 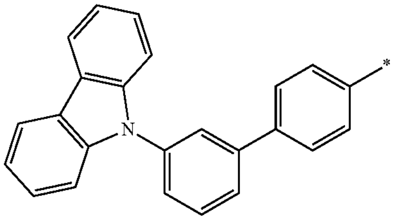 [SMILES: *c1ccc(-c2cccc(-n3c4ccccc4c4ccccc43)c2)cc1] | 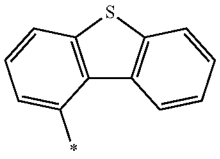 [SMILES: *c1cccc2sc3ccccc3c12] | 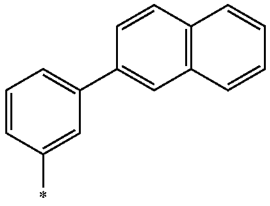 [SMILES: *c1cccc(-c2ccc3ccccc3c2)c1] |
| A14 | 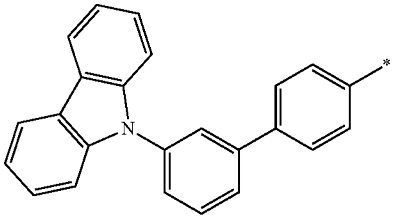 [SMILES: *c1ccc(-c2cccc(-n3c4ccccc4c4ccccc43)c2)cc1] | 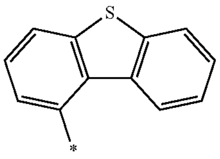 [SMILES: *c1cccc2sc3ccccc3c12] | 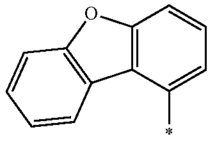 |
| A15 | 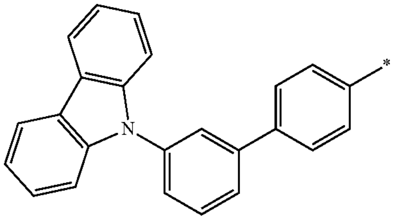 [SMILES: *c1ccc(-c2cccc(-n3c4ccccc4c4ccccc43)c2)cc1] | 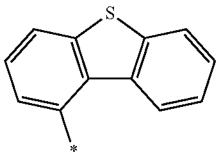 [SMILES: *c1cccc2sc3ccccc3c12] | 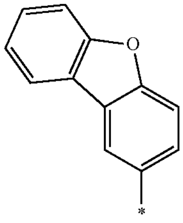 [SMILES: *c1ccc2oc3ccccc3c2c1] |

-continued
Compound Group 1
| Formula 1 | $Ar_1$ | $Ar_2$ | $Ar_3$ |
|---|---|---|---|
| A16 | 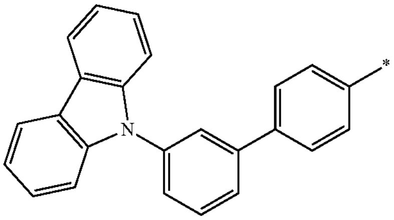 [SMILES: *c1ccc(-c2cccc(-n3c4ccccc4c4ccccc43)c2)cc1] | 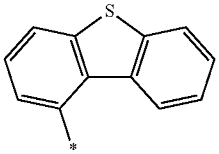 | 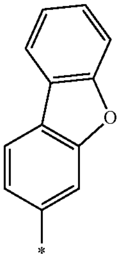 [SMILES: *c1ccc2c(c1)oc1ccccc12] |
| A17 | 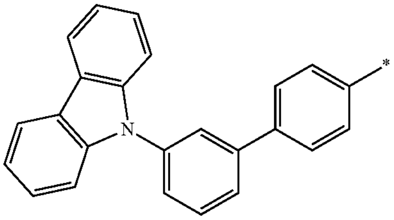 [SMILES: *c1ccc(-c2cccc(-n3c4ccccc4c4ccccc43)c2)cc1] | 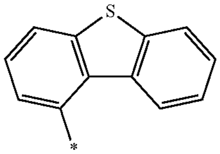 [SMILES: *c1cccc2sc3ccccc3c12] | 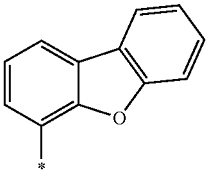 [SMILES: *c1cccc2c1oc1ccccc12] |
| A18 | 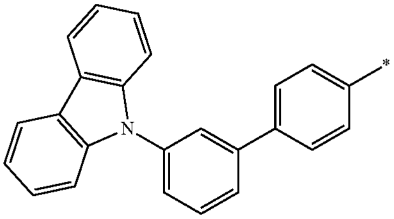 [SMILES: *c1ccc(-c2cccc(-n3c4ccccc4c4ccccc43)c2)cc1] | 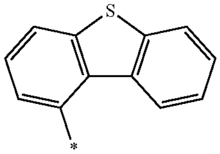 [SMILES: *c1cccc2sc3ccccc3c12] | 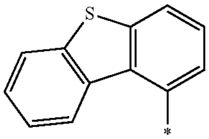 |
| A19 | 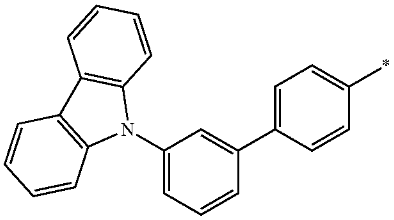 [SMILES: *c1ccc(-c2cccc(-n3c4ccccc4c4ccccc43)c2)cc1] | 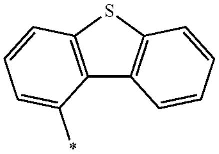 | 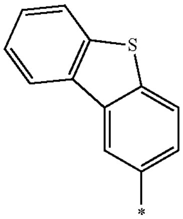 [SMILES: *c1ccc2sc3ccccc3c2c1] |
| A20 | 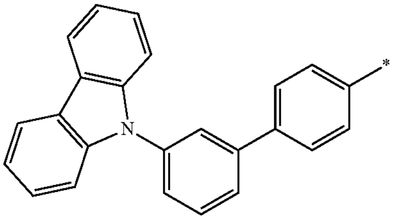 [SMILES: *c1ccc(-c2cccc(-n3c4ccccc4c4ccccc43)c2)cc1] | 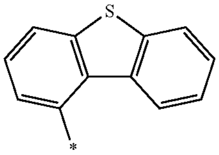 [SMILES: *c1cccc2sc3ccccc3c12] | 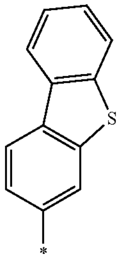 [SMILES: *c1ccc2c(c1)sc1ccccc12] |
| A21 | 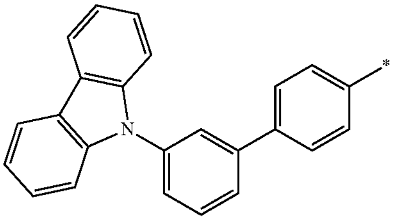 [SMILES: *c1ccc(-c2cccc(-n3c4ccccc4c4ccccc43)c2)cc1] | 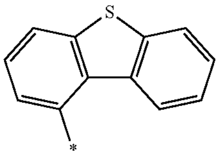 [SMILES: *c1cccc2sc3ccccc3c12] | 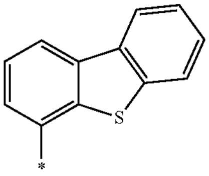 [SMILES: *c1cccc2c1sc1ccccc12] |

-continued
| Compound Group 1 | | | |
|---|---|---|---|
| Formula 1 | $Ar_1$ | $Ar_2$ | $Ar_3$ |
| A22 | 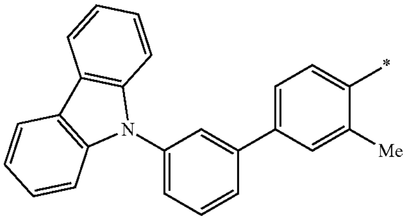 [SMILES: *c1ccc(-c2cccc(-n3c4ccccc4c4ccccc43)c2)cc1C] | 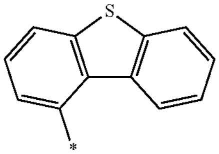 | 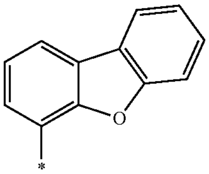 [SMILES: *c1cccc2c1oc1ccccc12] |
| A23 | 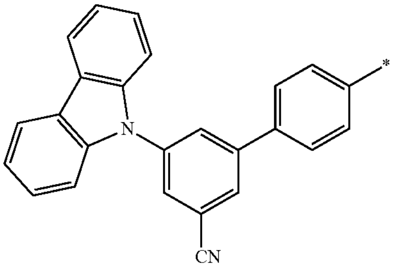 [SMILES: *c1ccc(-c2cc(C#N)cc(-n3c4ccccc4c4ccccc43)c2)cc1] | 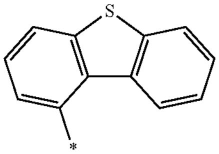 [SMILES: *c1cccc2sc3ccccc3c12] | 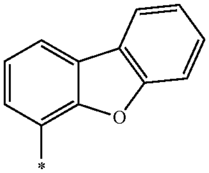 [SMILES: *c1cccc2c1oc1ccccc12] |
| B1 | 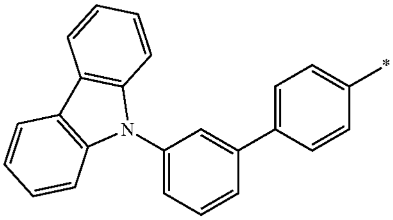 [SMILES: *c1ccc(-c2cccc(-n3c4ccccc4c4ccccc43)c2)cc1] | 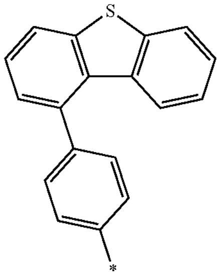 [SMILES: *c1ccc(-c2cccc3sc4ccccc4c23)cc1] | 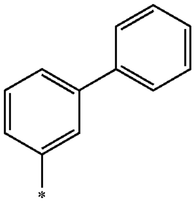 [SMILES: *c1cccc(-c2ccccc2)c1] |
| B2 | 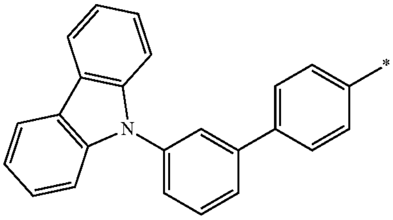 [SMILES: *c1ccc(-c2cccc(-n3c4ccccc4c4ccccc43)c2)cc1] | 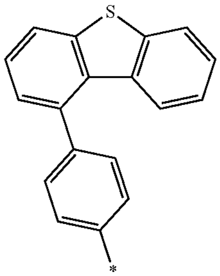 [SMILES: *c1ccc(-c2cccc3sc4ccccc4c23)cc1] | 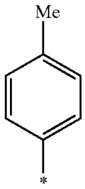 [SMILES: *c1ccc(C)cc1] |
| B3 | 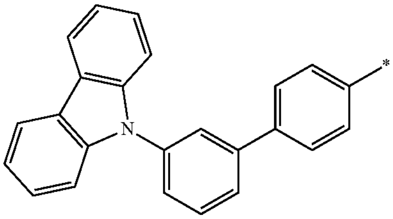 [SMILES: *c1ccc(-c2cccc(-n3c4ccccc4c4ccccc43)c2)cc1] | 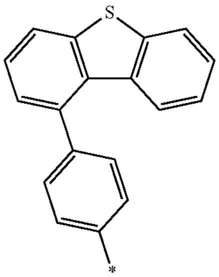 | 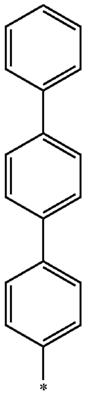 [SMILES: *c1ccc(-c2ccc(-c3ccccc3)cc2)cc1] |

-continued
| Compound Group 1 | | | |
|---|---|---|---|
| Formula 1 | $Ar_1$ | $Ar_2$ | $Ar_3$ |
| B4 | 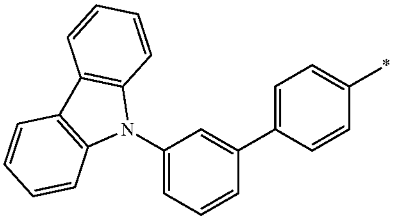 [SMILES: *c1ccc(-c2cccc(-n3c4ccccc4c4ccccc43)c2)cc1] | 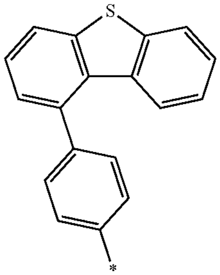 [SMILES: *c1ccc(-c2cccc3sc4ccccc4c23)cc1] | 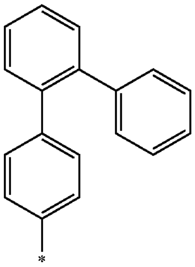 [SMILES: *c1ccc(-c2ccccc2-c2ccccc2)cc1] |
| B5 | 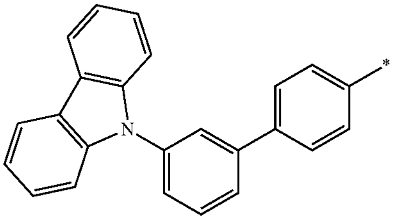 [SMILES: *c1ccc(-c2cccc(-n3c4ccccc4c4ccccc43)c2)cc1] | 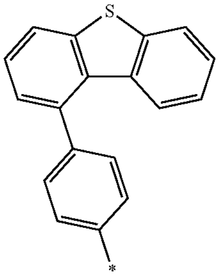 [SMILES: *c1ccc(-c2cccc3sc4ccccc4c23)cc1] | 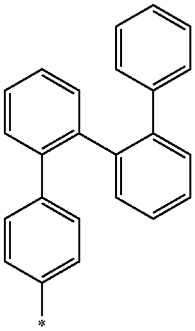 [SMILES: *c1ccc(-c2ccccc2-c2ccccc2-c2ccccc2)cc1] |
| B6 | 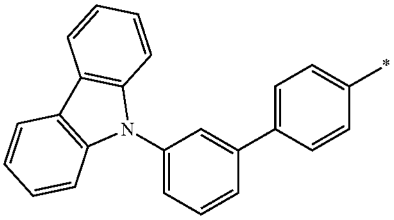 [SMILES: *c1ccc(-c2cccc(-n3c4ccccc4c4ccccc43)c2)cc1] | 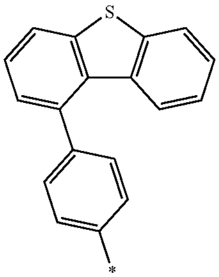 [SMILES: *c1ccc(-c2cccc3sc4ccccc4c23)cc1] | 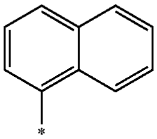 |
| B7 | 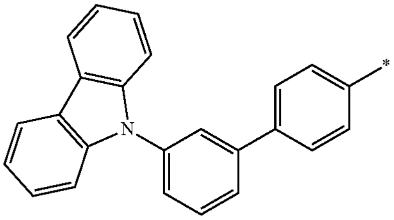 [SMILES: *c1ccc(-c2cccc(-n3c4ccccc4c4ccccc43)c2)cc1] | 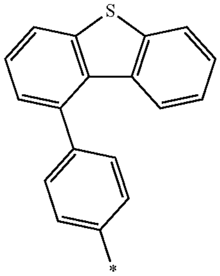 [SMILES: *c1ccc(-c2cccc3sc4ccccc4c23)cc1] | 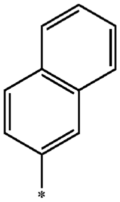 [SMILES: *c1ccc2ccccc2c1] |
| B8 | 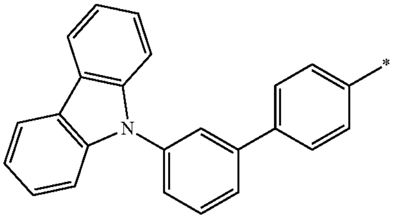 [SMILES: *c1ccc(-c2cccc(-n3c4ccccc4c4ccccc43)c2)cc1] | 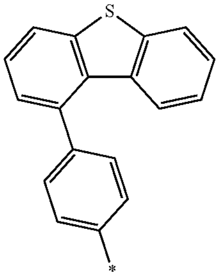 [SMILES: *c1ccc(-c2cccc3sc4ccccc4c23)cc1] | 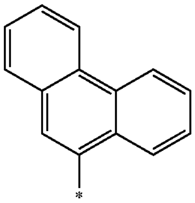 [SMILES: *c1cc2ccccc2c2ccccc12] |

-continued
Compound Group 1
| Formula 1 | $Ar_1$ | $Ar_2$ | $Ar_3$ |
| --- | --- | --- | --- |
| B9 | 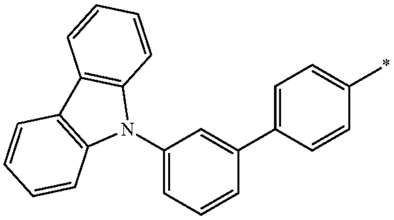 [SMILES: *c1ccc(-c2cccc(-n3c4ccccc4c4ccccc43)c2)cc1] | 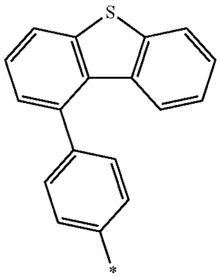 [SMILES: *c1ccc(-c2cccc3sc4ccccc4c23)cc1] | 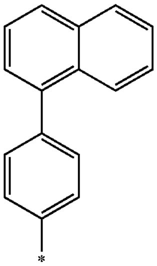 [SMILES: *c1ccc(-c2cccc3ccccc23)cc1] |
| B10 | 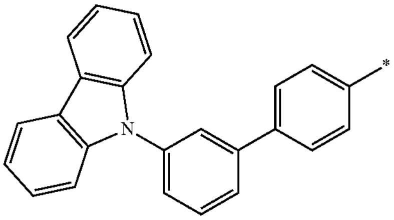 [SMILES: *c1ccc(-c2cccc(-n3c4ccccc4c4ccccc43)c2)cc1] | 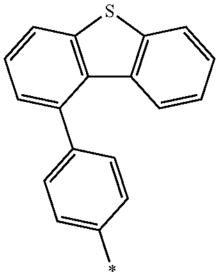 [SMILES: *c1ccc(-c2cccc3sc4ccccc4c23)cc1] | 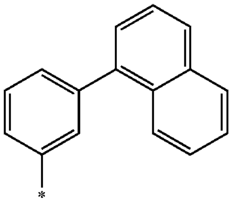 [SMILES: *c1cccc(-c2cccc3ccccc23)c1] |
| B11 | 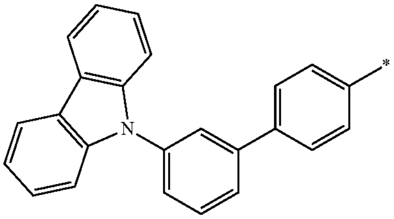 [SMILES: *c1ccc(-c2cccc(-n3c4ccccc4c4ccccc43)c2)cc1] | 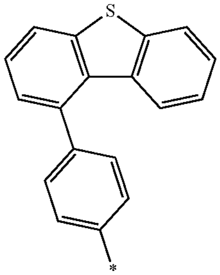 [SMILES: *c1ccc(-c2cccc3sc4ccccc4c23)cc1] | 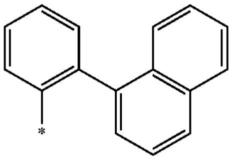 [SMILES: *c1ccccc1-c1cccc2ccccc12] |
| B12 | 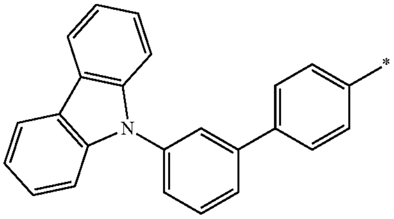 [SMILES: *c1ccc(-c2cccc(-n3c4ccccc4c4ccccc43)c2)cc1] | 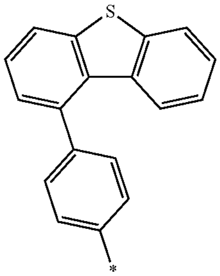 [SMILES: *c1ccc(-c2cccc3sc4ccccc4c23)cc1] | 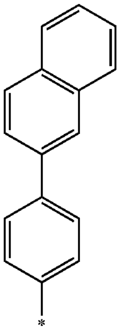 [SMILES: *c1ccc(-c2ccc3ccccc3c2)cc1] |
| B13 | 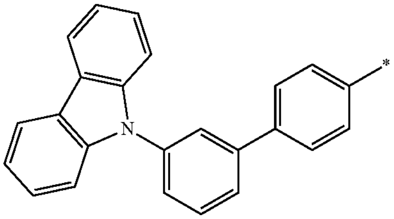 [SMILES: *c1ccc(-c2cccc(-n3c4ccccc4c4ccccc43)c2)cc1] | 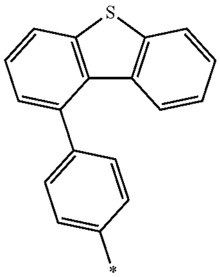 [SMILES: *c1ccc(-c2cccc3sc4ccccc4c23)cc1] | 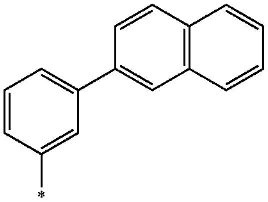 [SMILES: *c1cccc(-c2ccc3ccccc3c2)c1] |

-continued
| Compound Group 1 | | | |
|---|---|---|---|
| Formula 1 | $Ar_1$ | $Ar_2$ | $Ar_3$ |
| B14 | 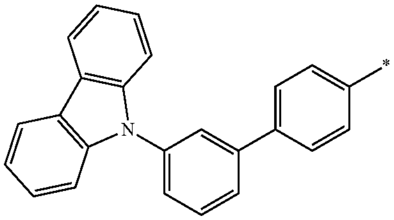 [SMILES: *c1ccc(-c2cccc(-n3c4ccccc4c4ccccc43)c2)cc1] | 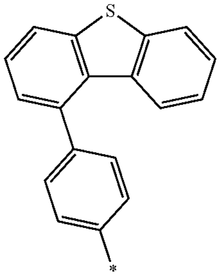 [SMILES: *c1ccc(-c2cccc3sc4ccccc4c23)cc1] | 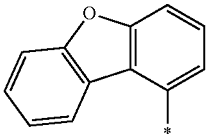 [SMILES: *c1cccc2oc3ccccc3c12] |
| B15 | 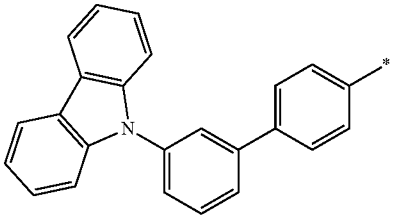 [SMILES: *c1ccc(-c2cccc(-n3c4ccccc4c4ccccc43)c2)cc1] | 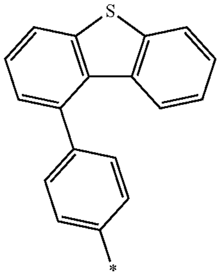 [SMILES: *c1ccc(-c2cccc3sc4ccccc4c23)cc1] | 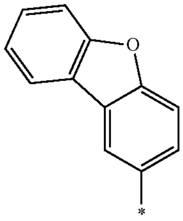 |
| B16 | 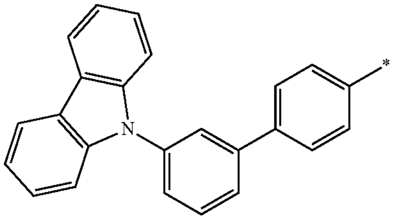 [SMILES: *c1ccc(-c2cccc(-n3c4ccccc4c4ccccc43)c2)cc1] | 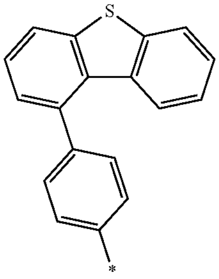 [SMILES: *c1ccc(-c2cccc3sc4ccccc4c23)cc1] | 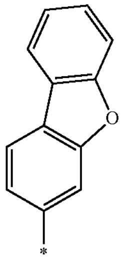 [SMILES: *c1ccc2c(c1)oc1ccccc12] |
| B17 | 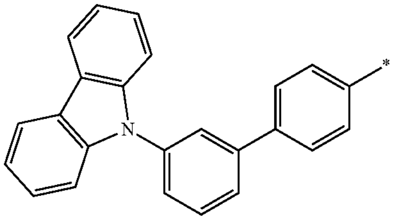 [SMILES: *c1ccc(-c2cccc(-n3c4ccccc4c4ccccc43)c2)cc1] | 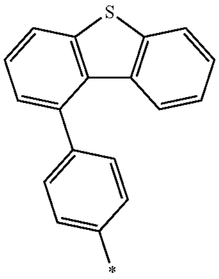 [SMILES: *c1ccc(-c2cccc3sc4ccccc4c23)cc1] | 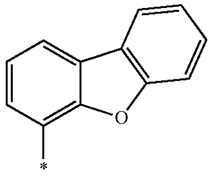 [SMILES: *c1cccc2c1oc1ccccc12] |
| B18 | 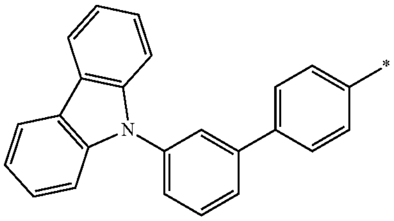 [SMILES: *c1ccc(-c2cccc(-n3c4ccccc4c4ccccc43)c2)cc1] | 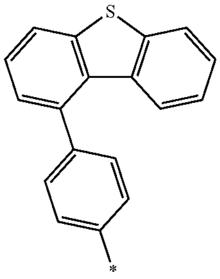 [SMILES: *c1ccc(-c2cccc3sc4ccccc4c23)cc1] | 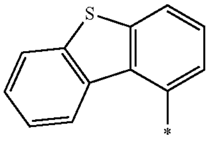 |

-continued
Compound Group 1
| Formula 1 | $Ar_1$ | $Ar_2$ | $Ar_3$ |
|---|---|---|---|
| B19 | 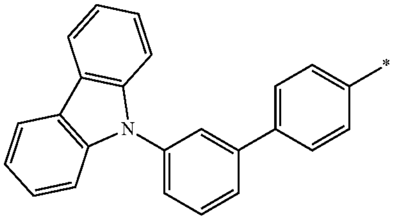 [SMILES: *c1ccc(-c2cccc(-n3c4ccccc4c4ccccc43)c2)cc1] | 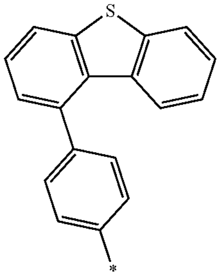 [SMILES: *c1ccc(-c2cccc3sc4ccccc4c23)cc1] | 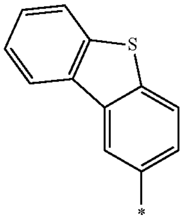 |
| B20 | 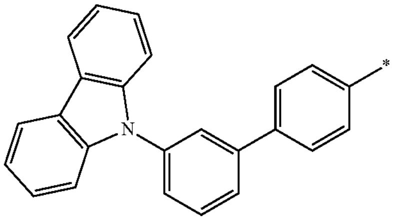 [SMILES: *c1ccc(-c2cccc(-n3c4ccccc4c4ccccc43)c2)cc1] | 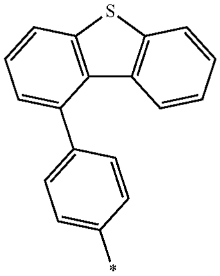 [SMILES: *c1ccc(-c2cccc3sc4ccccc4c23)cc1] | 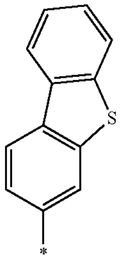 [SMILES: *c1ccc2c(c1)sc1ccccc12] |
| B21 | 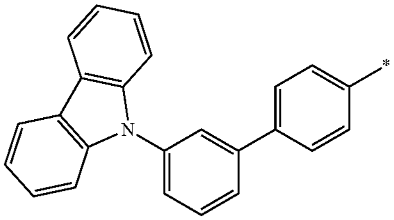 [SMILES: *c1ccc(-c2cccc(-n3c4ccccc4c4ccccc43)c2)cc1] | 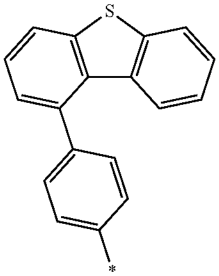 [SMILES: *c1ccc(-c2cccc3sc4ccccc4c23)cc1] | 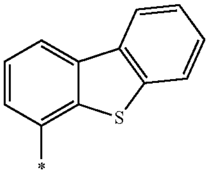 [SMILES: *c1cccc2c1sc1ccccc12] |
| B22 | 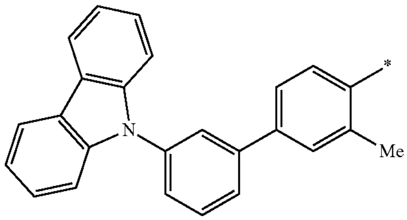 [SMILES: *c1ccc(-c2cccc(-n3c4ccccc4c4ccccc43)c2)cc1C] | 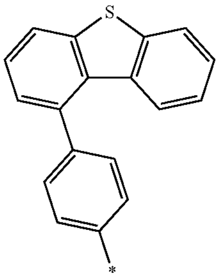 [SMILES: *c1ccc(-c2cccc3sc4ccccc4c23)cc1] | 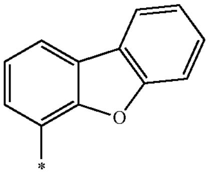 [SMILES: *c1cccc2c1oc1ccccc12] |
| B23 | 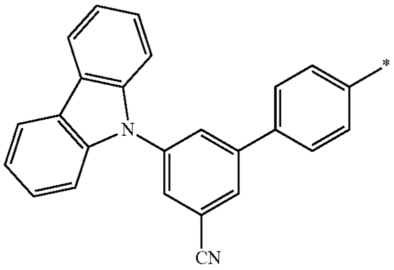 [SMILES: *c1ccc(-c2cc(C#N)cc(-n3c4ccccc4c4ccccc43)c2)cc1] | 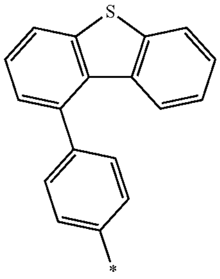 [SMILES: *c1ccc(-c2cccc3sc4ccccc4c23)cc1] | 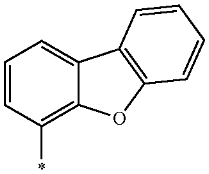 [SMILES: *c1cccc2c1oc1ccccc12] |

-continued
| Compound Group 1 | | | |
|---|---|---|---|
| Formula 1 | $Ar_1$ | $Ar_2$ | $Ar_3$ |
| C1 | 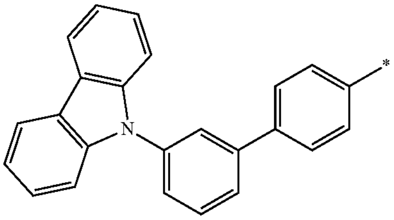 [SMILES: *c1ccc(-c2cccc(-n3c4ccccc4c4ccccc43)c2)cc1] | 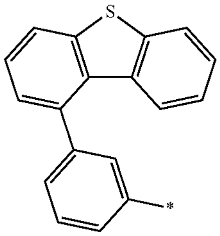 [SMILES: *c1cccc(-c2cccc3sc4ccccc4c23)c1] | 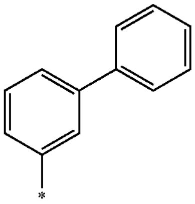 [SMILES: *c1cccc(-c2ccccc2)c1] |
| C2 | 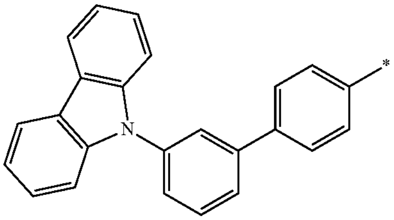 [SMILES: *c1ccc(-c2cccc(-n3c4ccccc4c4ccccc43)c2)cc1] | 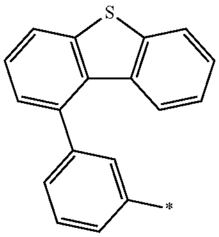 [SMILES: *c1cccc(-c2cccc3sc4ccccc4c23)c1] | 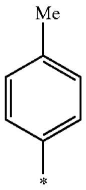 [SMILES: *c1ccc(C)cc1] |
| C3 | 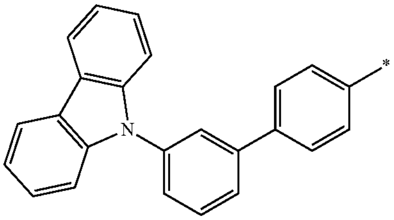 [SMILES: *c1ccc(-c2cccc(-n3c4ccccc4c4ccccc43)c2)cc1] | 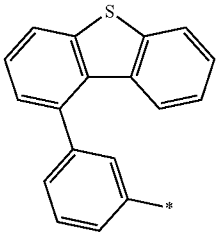 [SMILES: *c1cccc(-c2cccc3sc4ccccc4c23)c1] | 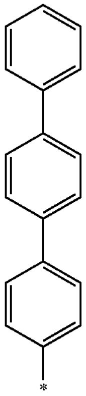 [SMILES: *c1ccc(-c2ccc(-c3ccccc3)cc2)cc1] |
| C4 | 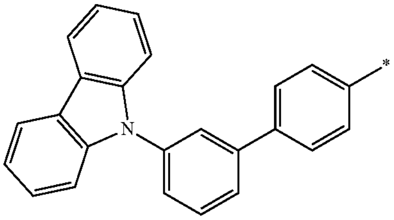 [SMILES: *c1ccc(-c2cccc(-n3c4ccccc4c4ccccc43)c2)cc1] | 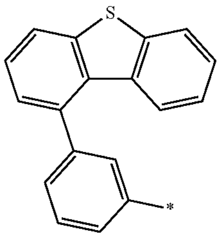 [SMILES: *c1cccc(-c2cccc3sc4ccccc4c23)c1] | 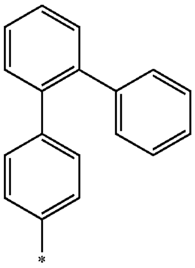 [SMILES: *c1ccc(-c2ccccc2-c2ccccc2)cc1] |
| C5 | 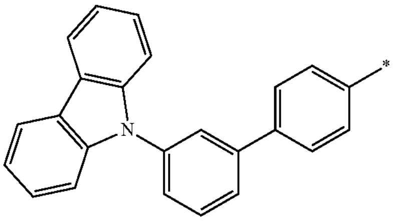 [SMILES: *c1ccc(-c2cccc(-n3c4ccccc4c4ccccc43)c2)cc1] | 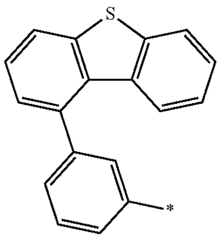 [SMILES: *c1cccc(-c2cccc3sc4ccccc4c23)c1] | 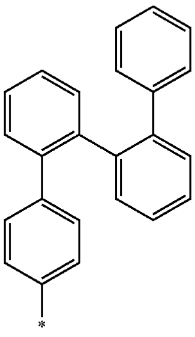 [SMILES: *c1ccc(-c2ccccc2-c2ccccc2-c2ccccc2)cc1] |

-continued
| Compound Group 1 | | | |
|---|---|---|---|
| Formula 1 | $Ar_1$ | $Ar_2$ | $Ar_3$ |
| C6 | 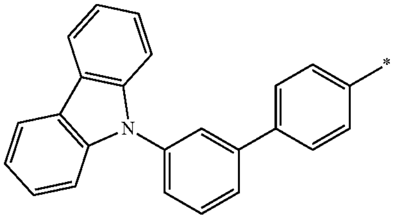 [SMILES: *c1ccc(-c2cccc(-n3c4ccccc4c4ccccc43)c2)cc1] | 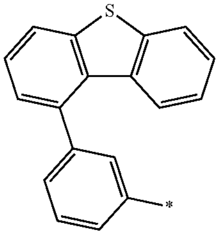 [SMILES: *c1cccc(-c2cccc3sc4ccccc4c23)c1] | 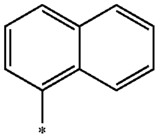 [SMILES: *c1cccc2ccccc12] |
| C7 | 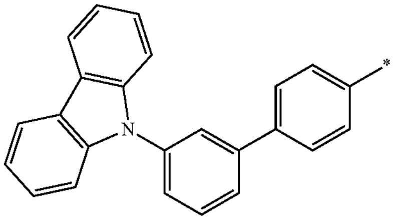 [SMILES: *c1ccc(-c2cccc(-n3c4ccccc4c4ccccc43)c2)cc1] | 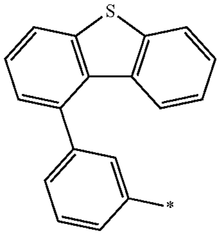 [SMILES: *c1cccc(-c2cccc3sc4ccccc4c23)c1] | 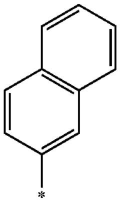 [SMILES: *c1ccc2ccccc2c1] |
| C8 | 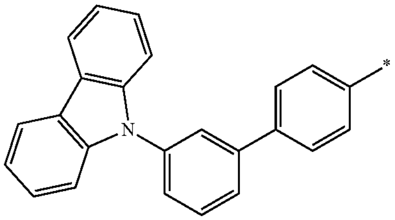 [SMILES: *c1ccc(-c2cccc(-n3c4ccccc4c4ccccc43)c2)cc1] | 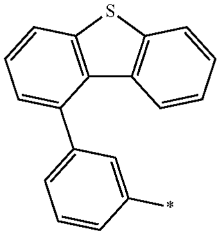 [SMILES: *c1cccc(-c2cccc3sc4ccccc4c23)c1] | 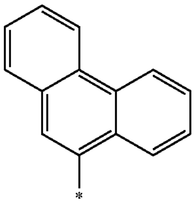 [SMILES: *c1cc2ccccc2c2ccccc12] |
| C9 | 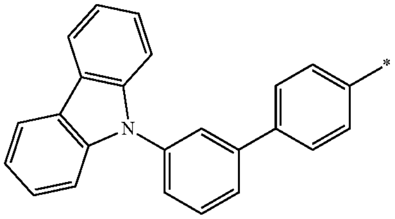 [SMILES: *c1ccc(-c2cccc(-n3c4ccccc4c4ccccc43)c2)cc1] | 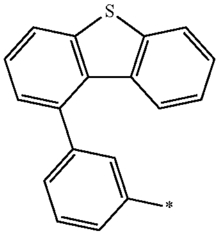 [SMILES: *c1cccc(-c2cccc3sc4ccccc4c23)c1] | 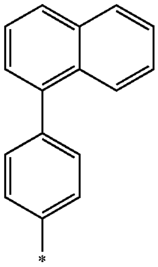 [SMILES: *c1ccc(-c2cccc3ccccc23)cc1] |
| C10 | 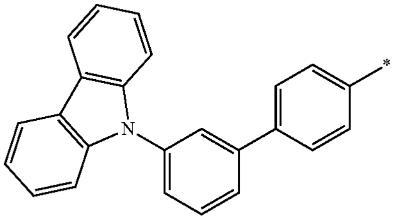 [SMILES: *c1ccc(-c2cccc(-n3c4ccccc4c4ccccc43)c2)cc1] | 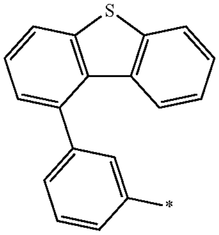 [SMILES: *c1cccc(-c2cccc3sc4ccccc4c23)c1] | 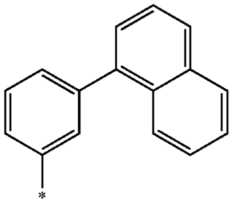 [SMILES: *c1cccc(-c2cccc3ccccc23)c1] |
| C11 | 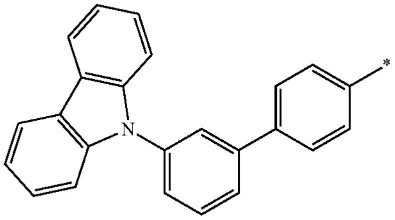 [SMILES: *c1ccc(-c2cccc(-n3c4ccccc4c4ccccc43)c2)cc1] | 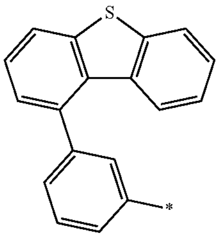 [SMILES: *c1cccc(-c2cccc3sc4ccccc4c23)c1] | 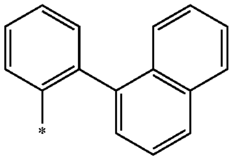 [SMILES: *c1ccccc1-c1cccc2ccccc12] |

-continued
| Compound Group 1 | | | |
|---|---|---|---|
| Formula 1 | $Ar_1$ | $Ar_2$ | $Ar_3$ |
| C12 | 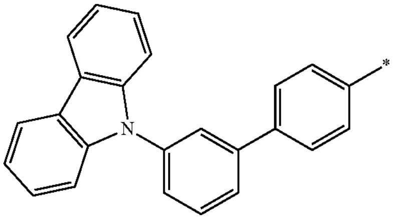 [SMILES: *c1ccc(-c2cccc(-n3c4ccccc4c4ccccc43)c2)cc1] | 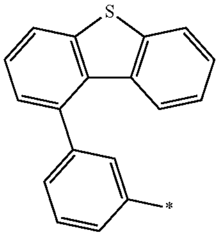 [SMILES: *c1cccc(-c2cccc3sc4ccccc4c23)c1] | 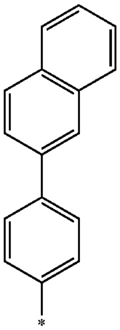 [SMILES: *c1ccc(-c2ccc3ccccc3c2)cc1] |
| C13 | 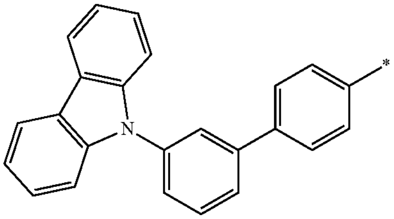 [SMILES: *c1ccc(-c2cccc(-n3c4ccccc4c4ccccc43)c2)cc1] | 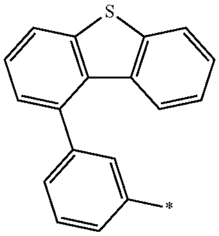 [SMILES: *c1cccc(-c2cccc3sc4ccccc4c23)c1] | 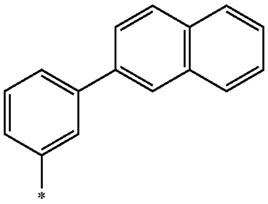 [SMILES: *c1cccc(-c2ccc3ccccc3c2)c1] |
| C14 | 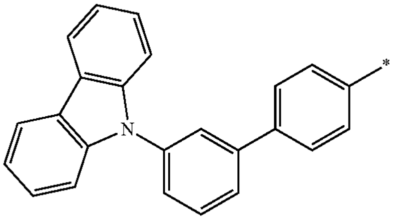 [SMILES: *c1ccc(-c2cccc(-n3c4ccccc4c4ccccc43)c2)cc1] | 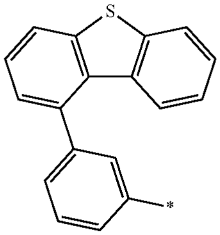 [SMILES: *c1cccc(-c2cccc3sc4ccccc4c23)c1] | 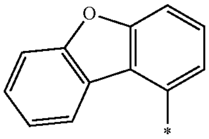 |
| C15 | 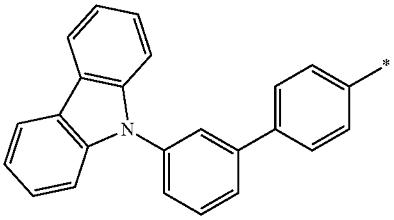 [SMILES: *c1ccc(-c2cccc(-n3c4ccccc4c4ccccc43)c2)cc1] | 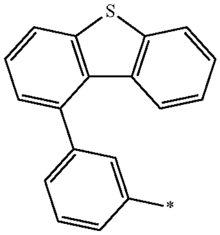 [SMILES: *c1cccc(-c2cccc3sc4ccccc4c23)c1] | 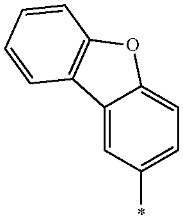 [SMILES: *c1ccc2oc3ccccc3c2c1] |
| C16 | 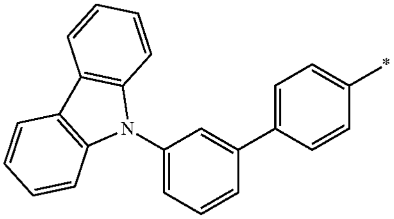 [SMILES: *c1ccc(-c2cccc(-n3c4ccccc4c4ccccc43)c2)cc1] | 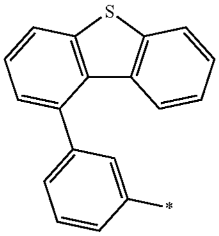 [SMILES: *c1cccc(-c2cccc3sc4ccccc4c23)c1] | 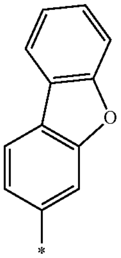 [SMILES: *c1ccc2c(c1)oc1ccccc12] |

-continued
Compound Group 1
| Formula 1 | $Ar_1$ | $Ar_2$ | $Ar_3$ |
|---|---|---|---|
| C17 | 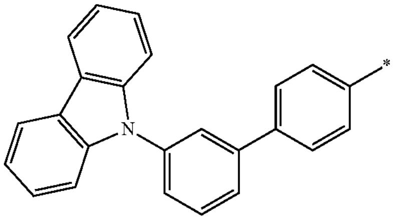 [SMILES: *c1ccc(-c2cccc(-n3c4ccccc4c4ccccc43)c2)cc1] | 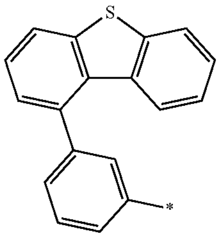 [SMILES: *c1cccc(-c2cccc3sc4ccccc4c23)c1] | 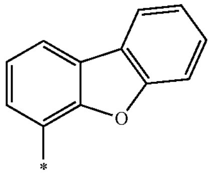 |
| C18 | 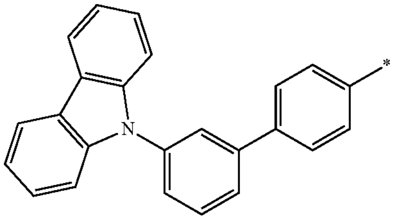 [SMILES: *c1ccc(-c2cccc(-n3c4ccccc4c4ccccc43)c2)cc1] | 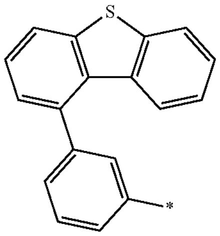 [SMILES: *c1cccc(-c2cccc3sc4ccccc4c23)c1] | 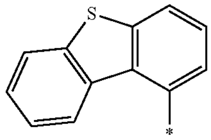 [SMILES: *c1cccc2sc3ccccc3c12] |
| C19 | 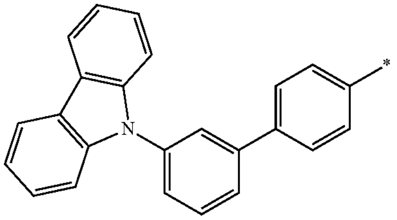 [SMILES: *c1ccc(-c2cccc(-n3c4ccccc4c4ccccc43)c2)cc1] | 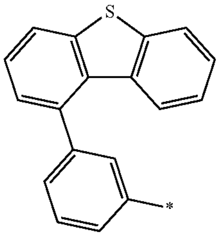 [SMILES: *c1cccc(-c2cccc3sc4ccccc4c23)c1] | 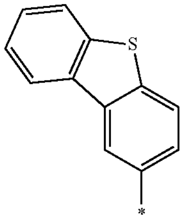 [SMILES: *c1ccc2sc3ccccc3c2c1] |
| C20 | 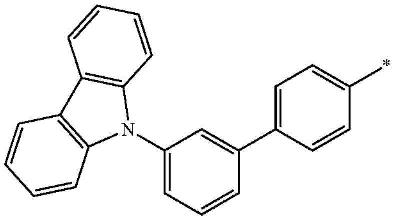 [SMILES: *c1ccc(-c2cccc(-n3c4ccccc4c4ccccc43)c2)cc1] | 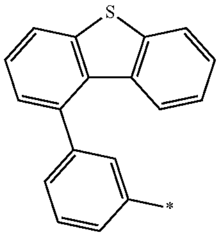 [SMILES: *c1cccc(-c2cccc3sc4ccccc4c23)c1] | 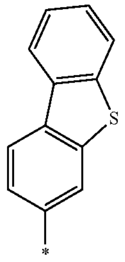 [SMILES: *c1ccc2c(c1)sc1ccccc12] |
| C21 | 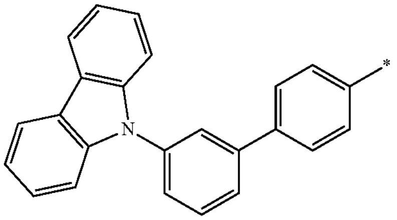 [SMILES: *c1ccc(-c2cccc(-n3c4ccccc4c4ccccc43)c2)cc1] | 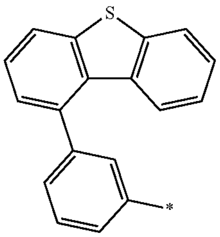 [SMILES: *c1cccc(-c2cccc3sc4ccccc4c23)c1] | 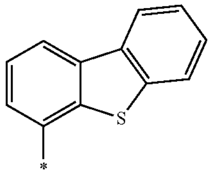 |
| C22 | 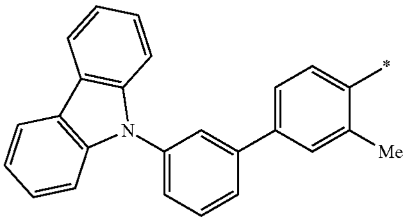 [SMILES: *c1ccc(-c2cccc(-n3c4ccccc4c4ccccc43)c2)cc1C] | 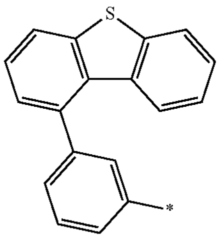 [SMILES: *c1cccc(-c2cccc3sc4ccccc4c23)c1] | 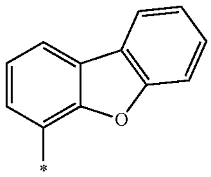 |

-continued
Compound Group 1
| Formula 1 | $Ar_1$ | $Ar_2$ | $Ar_3$ |
|---|---|---|---|
| C23 | 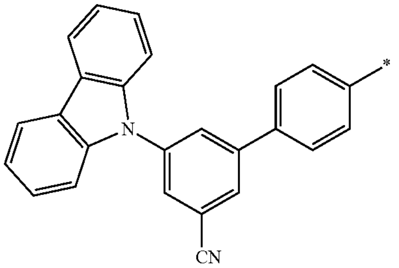 [SMILES: *c1ccc(-c2cc(C#N)cc(-n3c4ccccc4c4ccccc43)c2)cc1] | 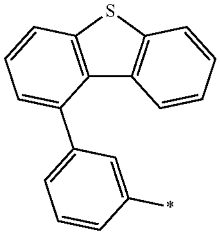 [SMILES: *c1cccc(-c2cccc3sc4ccccc4c23)c1] | 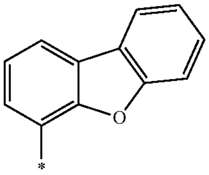 |
| D1 | 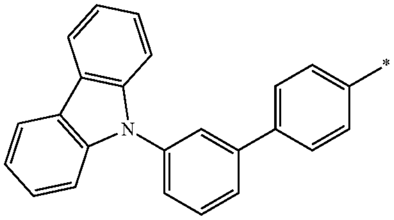 [SMILES: *c1ccc(-c2cccc(-n3c4ccccc4c4ccccc43)c2)cc1] | 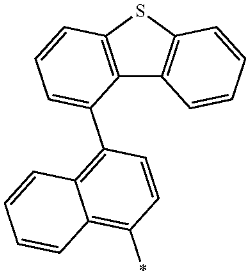 [SMILES: *c1ccc(-c2cccc3sc4ccccc4c23)c2ccccc12] | 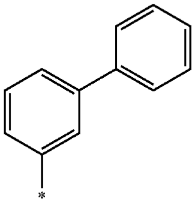 [SMILES: *c1cccc(-c2ccccc2)c1] |
| D2 | 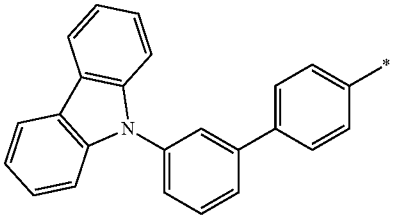 [SMILES: *c1ccc(-c2cccc(-n3c4ccccc4c4ccccc43)c2)cc1] | 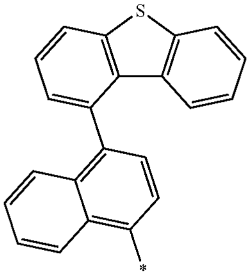 [SMILES: *c1ccc(-c2cccc3sc4ccccc4c23)c2ccccc12] | 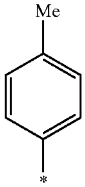 [SMILES: *c1ccc(C)cc1] |
| D3 | 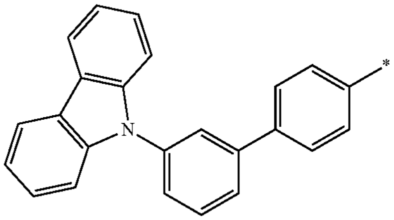 [SMILES: *c1ccc(-c2cccc(-n3c4ccccc4c4ccccc43)c2)cc1] | 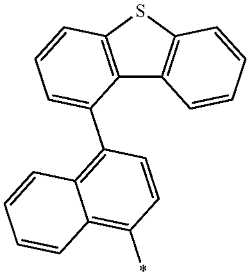 [SMILES: *c1ccc(-c2cccc3sc4ccccc4c23)c2ccccc12] | 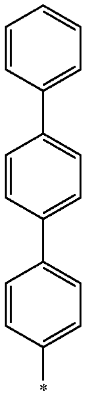 [SMILES: *c1ccc(-c2ccc(-c3ccccc3)cc2)cc1] |
| D4 | 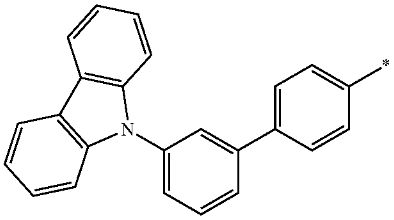 [SMILES: *c1ccc(-c2cccc(-n3c4ccccc4c4ccccc43)c2)cc1] | 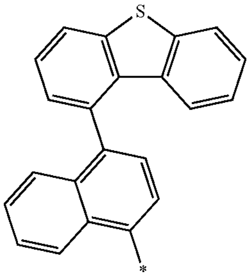 [SMILES: *c1ccc(-c2cccc3sc4ccccc4c23)c2ccccc12] | 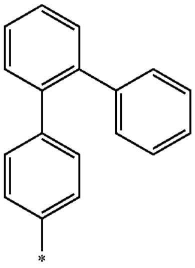 [SMILES: *c1ccc(-c2ccccc2-c2ccccc2)cc1] |

-continued
Compound Group 1
| Formula 1 | $Ar_1$ | $Ar_2$ | $Ar_3$ |
|---|---|---|---|
| D5 | 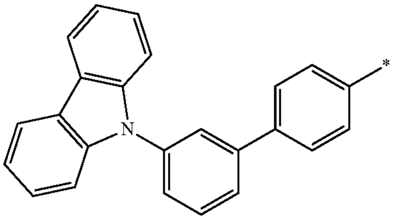 [SMILES: *c1ccc(-c2cccc(-n3c4ccccc4c4ccccc43)c2)cc1] | 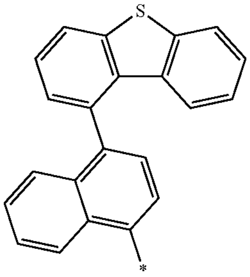 [SMILES: *c1ccc(-c2cccc3sc4ccccc4c23)c2ccccc12] | 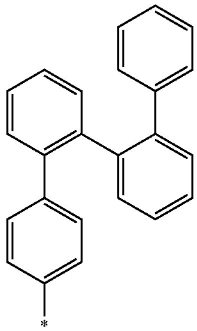 [SMILES: *c1ccc(-c2ccccc2-c2ccccc2-c2ccccc2)cc1] |
| D6 | 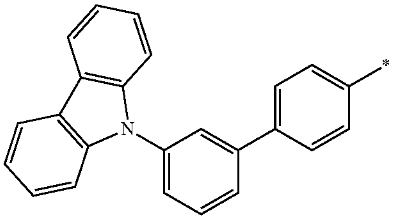 [SMILES: *c1ccc(-c2cccc(-n3c4ccccc4c4ccccc43)c2)cc1] | 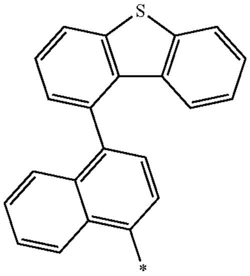 [SMILES: *c1ccc(-c2cccc3sc4ccccc4c23)c2ccccc12] | 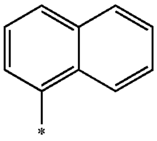 |
| D7 | 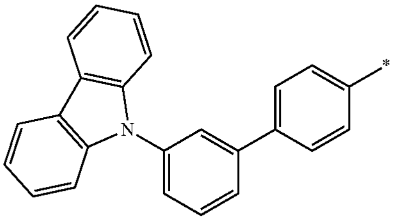 [SMILES: *c1ccc(-c2cccc(-n3c4ccccc4c4ccccc43)c2)cc1] | 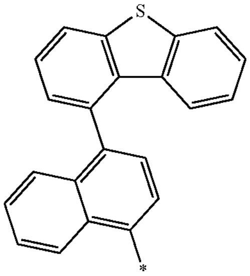 [SMILES: *c1ccc(-c2cccc3sc4ccccc4c23)c2ccccc12] | 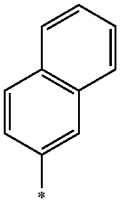 [SMILES: *c1ccc2ccccc2c1] |
| D8 | 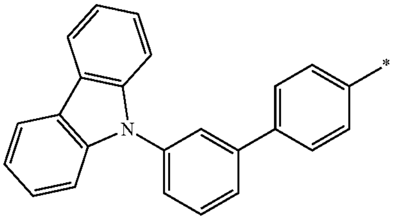 [SMILES: *c1ccc(-c2cccc(-n3c4ccccc4c4ccccc43)c2)cc1] | 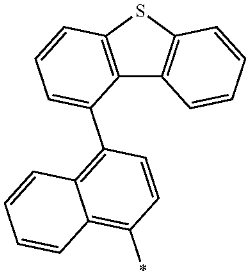 [SMILES: *c1ccc(-c2cccc3sc4ccccc4c23)c2ccccc12] | 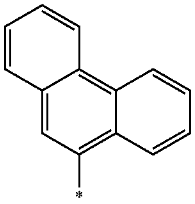 [SMILES: *c1cc2ccccc2c2ccccc12] |
| D9 | 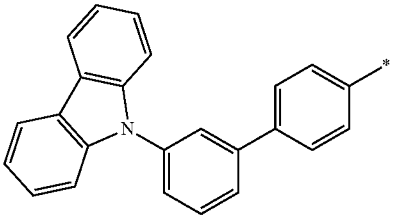 [SMILES: *c1ccc(-c2cccc(-n3c4ccccc4c4ccccc43)c2)cc1] | 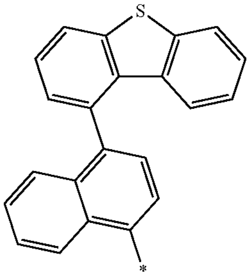 [SMILES: *c1ccc(-c2cccc3sc4ccccc4c23)c2ccccc12] | 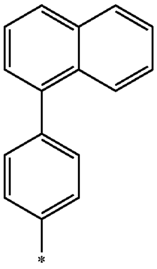 [SMILES: *c1ccc(-c2cccc3ccccc23)cc1] |

-continued
Compound Group 1
| Formula 1 | $Ar_1$ | $Ar_2$ | $Ar_3$ |
|---|---|---|---|
| D10 | 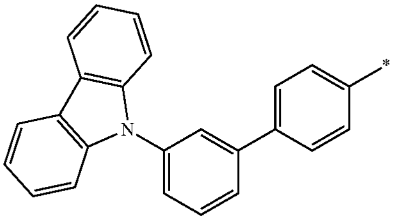 [SMILES: *c1ccc(-c2cccc(-n3c4ccccc4c4ccccc43)c2)cc1] | 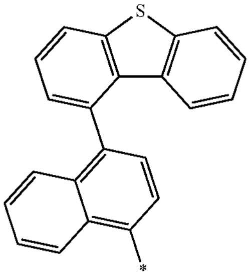 [SMILES: *c1ccc(-c2cccc3sc4ccccc4c23)c2ccccc12] | 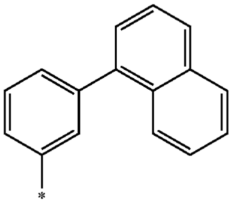 [SMILES: *c1cccc(-c2cccc3ccccc23)c1] |
| D11 | 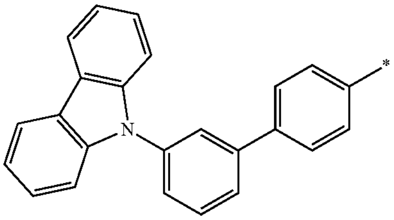 [SMILES: *c1ccc(-c2cccc(-n3c4ccccc4c4ccccc43)c2)cc1] | 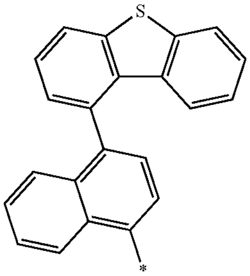 [SMILES: *c1ccc(-c2cccc3sc4ccccc4c23)c2ccccc12] | 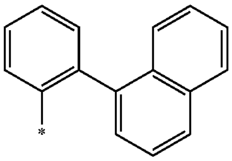 [SMILES: *c1ccccc1-c1cccc2ccccc12] |
| D12 | 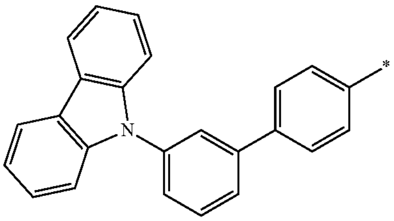 [SMILES: *c1ccc(-c2cccc(-n3c4ccccc4c4ccccc43)c2)cc1] | 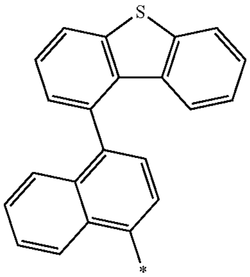 [SMILES: *c1ccc(-c2cccc3sc4ccccc4c23)c2ccccc12] | 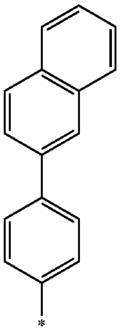 [SMILES: *c1ccc(-c2ccc3ccccc3c2)cc1] |
| D13 | 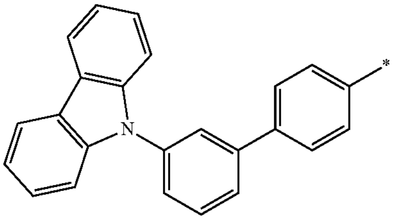 [SMILES: *c1ccc(-c2cccc(-n3c4ccccc4c4ccccc43)c2)cc1] | 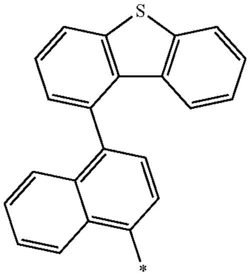 [SMILES: *c1ccc(-c2cccc3sc4ccccc4c23)c2ccccc12] | 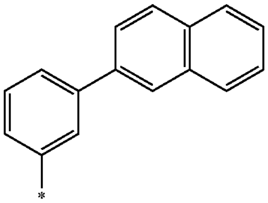 [SMILES: *c1cccc(-c2ccc3ccccc3c2)c1] |
| D14 | 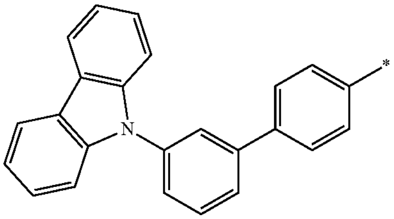 [SMILES: *c1ccc(-c2cccc(-n3c4ccccc4c4ccccc43)c2)cc1] | 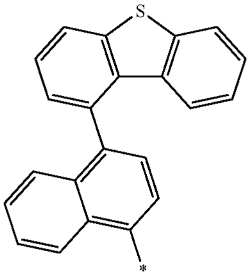 [SMILES: *c1ccc(-c2cccc3sc4ccccc4c23)c2ccccc12] | 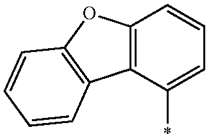 |

-continued
Compound Group 1
| Formula 1 | $Ar_1$ | $Ar_2$ | $Ar_3$ |
|---|---|---|---|
| D15 | 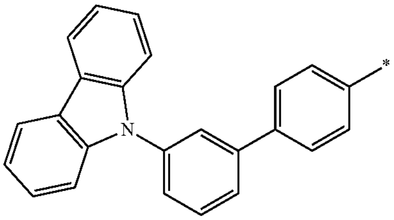 [SMILES: *c1ccc(-c2cccc(-n3c4ccccc4c4ccccc43)c2)cc1] | 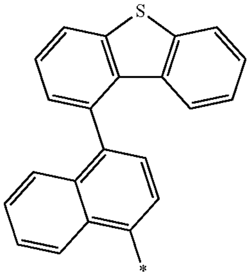 [SMILES: *c1ccc(-c2cccc3sc4ccccc4c23)c2ccccc12] | 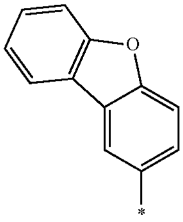 |
| D16 | 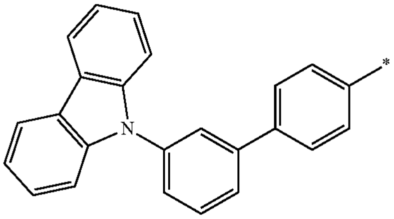 [SMILES: *c1ccc(-c2cccc(-n3c4ccccc4c4ccccc43)c2)cc1] | 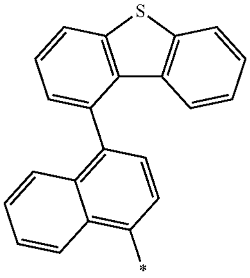 [SMILES: *c1ccc(-c2cccc3sc4ccccc4c23)c2ccccc12] | 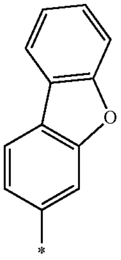 [SMILES: *c1ccc2c(c1)oc1ccccc12] |
| D17 | 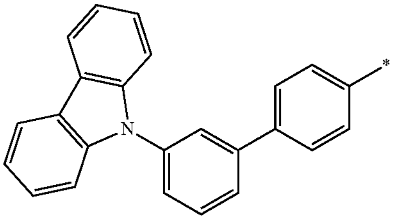 [SMILES: *c1ccc(-c2cccc(-n3c4ccccc4c4ccccc43)c2)cc1] | 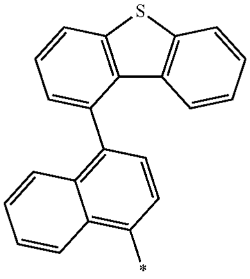 [SMILES: *c1ccc(-c2cccc3sc4ccccc4c23)c2ccccc12] | 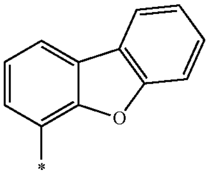 [SMILES: *c1cccc2c1oc1ccccc12] |
| D18 | 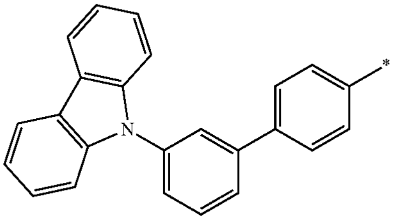 [SMILES: *c1ccc(-c2cccc(-n3c4ccccc4c4ccccc43)c2)cc1] | 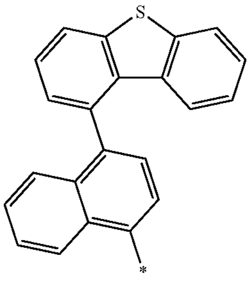 [SMILES: *c1ccc(-c2cccc3sc4ccccc4c23)c2ccccc12] | 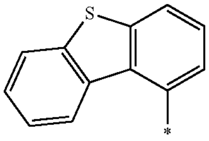 |
| D19 | 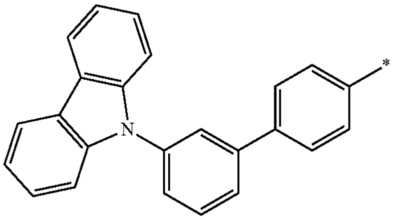 [SMILES: *c1ccc(-c2cccc(-n3c4ccccc4c4ccccc43)c2)cc1] | 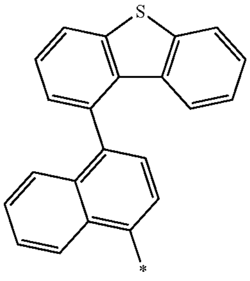 [SMILES: *c1ccc(-c2cccc3sc4ccccc4c23)c2ccccc12] | 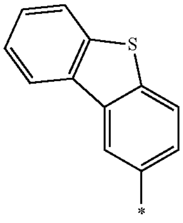 [SMILES: *c1ccc2sc3ccccc3c2c1] |

-continued
Compound Group 1
| Formula 1 | $Ar_1$ | $Ar_2$ | $Ar_3$ |
| --- | --- | --- | --- |
| D20 | 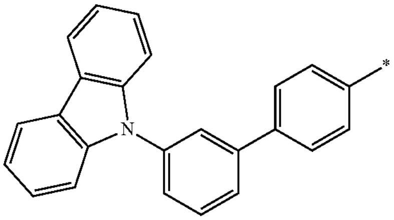 [SMILES: *c1ccc(-c2cccc(-n3c4ccccc4c4ccccc43)c2)cc1] | 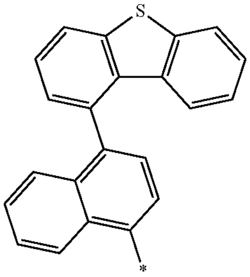 [SMILES: *c1ccc(-c2cccc3sc4ccccc4c23)c2ccccc12] | 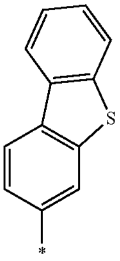 [SMILES: *c1ccc2c(c1)sc1ccccc12] |
| D21 | 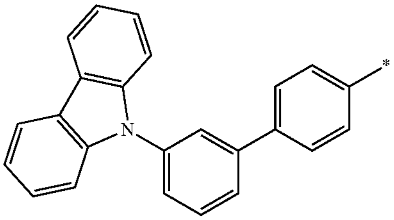 [SMILES: *c1ccc(-c2cccc(-n3c4ccccc4c4ccccc43)c2)cc1] | 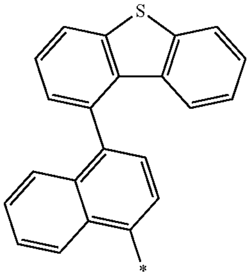 [SMILES: *c1ccc(-c2cccc3sc4ccccc4c23)c2ccccc12] | 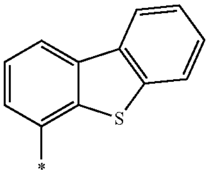 |
| D22 | 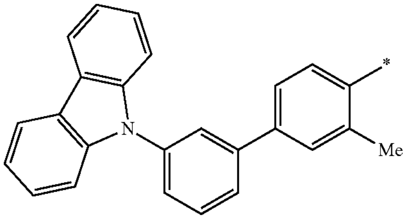 [SMILES: *c1ccc(-c2cccc(-n3c4ccccc4c4ccccc43)c2)cc1C] | 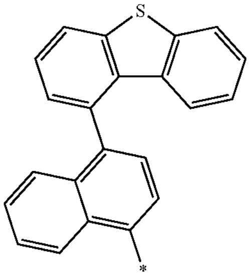 [SMILES: *c1ccc(-c2cccc3sc4ccccc4c23)c2ccccc12] | 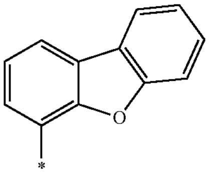 |
| D23 | 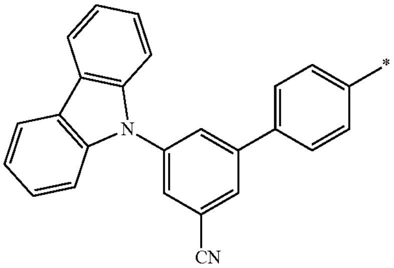 [SMILES: *c1ccc(-c2cc(C#N)cc(-n3c4ccccc4c4ccccc43)c2)cc1] | 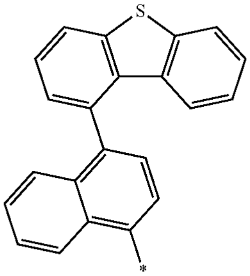 [SMILES: *c1ccc(-c2cccc3sc4ccccc4c23)c2ccccc12] | 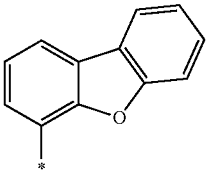 [SMILES: *c1cccc2c1oc1ccccc12] |
| E1 | 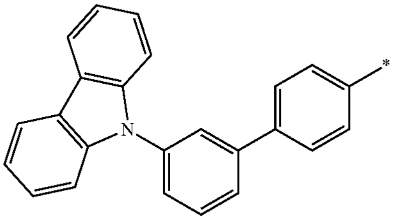 [SMILES: *c1ccc(-c2cccc(-n3c4ccccc4c4ccccc43)c2)cc1] | 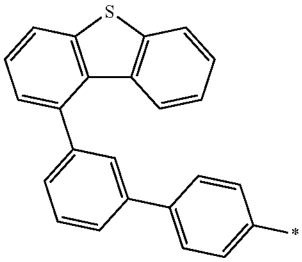 [SMILES: *c1ccc(-c2cccc(-c3cccc4sc5ccccc5c34)c2)cc1] | 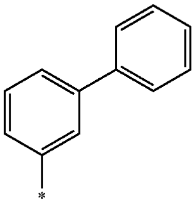 [SMILES: *c1cccc(-c2ccccc2)c1] |

-continued
| Compound Group 1 | | | |
|---|---|---|---|
| Formula 1 | $Ar_1$ | $Ar_2$ | $Ar_3$ |
| E2 | 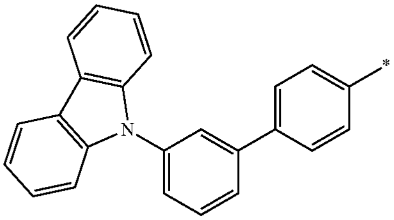 [SMILES: *c1ccc(-c2cccc(-n3c4ccccc4c4ccccc43)c2)cc1] | 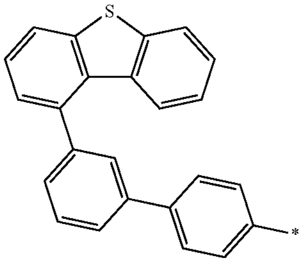 [SMILES: *c1ccc(-c2cccc(-c3cccc4sc5ccccc5c34)c2)cc1] | 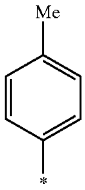 [SMILES: *c1ccc(C)cc1] |
| E3 | 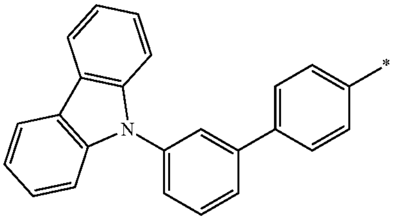 [SMILES: *c1ccc(-c2cccc(-n3c4ccccc4c4ccccc43)c2)cc1] | 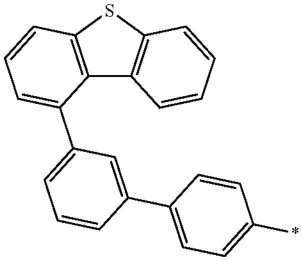 [SMILES: *c1ccc(-c2cccc(-c3cccc4sc5ccccc5c34)c2)cc1] | 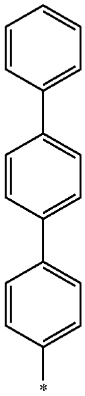 [SMILES: *c1ccc(-c2ccc(-c3ccccc3)cc2)cc1] |
| E4 | 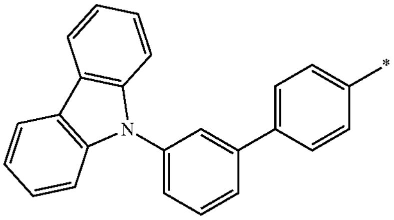 [SMILES: *c1ccc(-c2cccc(-n3c4ccccc4c4ccccc43)c2)cc1] | 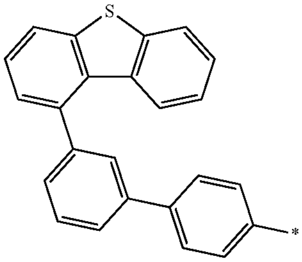 [SMILES: *c1ccc(-c2cccc(-c3cccc4sc5ccccc5c34)c2)cc1] | 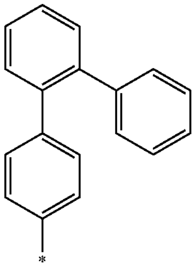 [SMILES: *c1ccc(-c2ccccc2-c2ccccc2)cc1] |
| E5 | 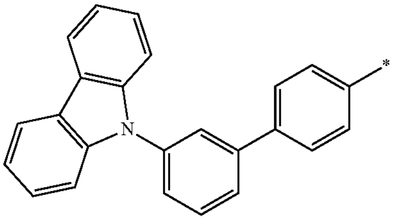 [SMILES: *c1ccc(-c2cccc(-n3c4ccccc4c4ccccc43)c2)cc1] | 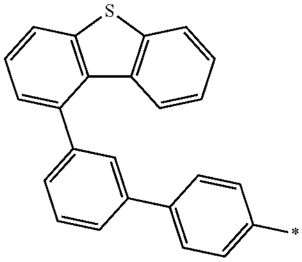 [SMILES: *c1ccc(-c2cccc(-c3cccc4sc5ccccc5c34)c2)cc1] | 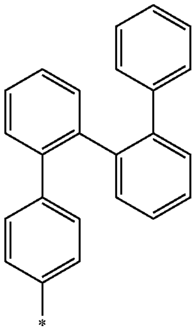 [SMILES: *c1ccc(-c2ccccc2-c2ccccc2-c2ccccc2)cc1] |

-continued
Compound Group 1
| Formula 1 | $Ar_1$ | $Ar_2$ | $Ar_3$ |
|---|---|---|---|
| E6 | 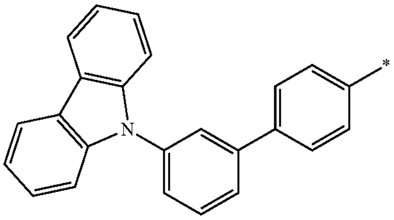 [SMILES: *c1ccc(-c2cccc(-n3c4ccccc4c4ccccc43)c2)cc1] | 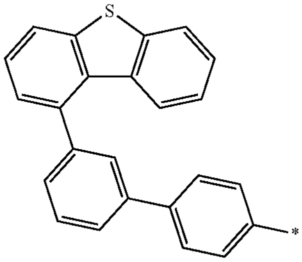 [SMILES: *c1ccc(-c2cccc(-c3cccc4sc5ccccc5c34)c2)cc1] | 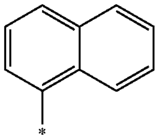 [SMILES: *c1cccc2ccccc12] |
| E7 | 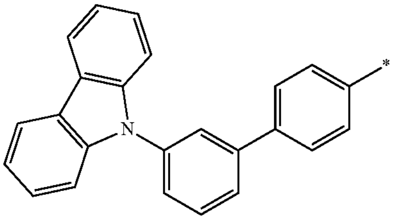 [SMILES: *c1ccc(-c2cccc(-n3c4ccccc4c4ccccc43)c2)cc1] | 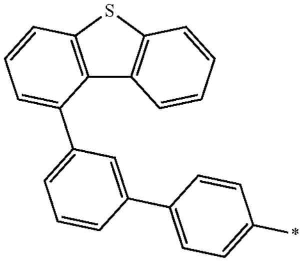 [SMILES: *c1ccc(-c2cccc(-c3cccc4sc5ccccc5c34)c2)cc1] | 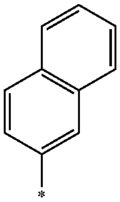 [SMILES: *c1ccc2ccccc2c1] |
| E8 | 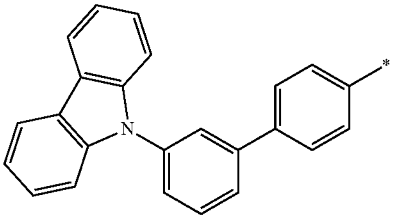 [SMILES: *c1ccc(-c2cccc(-n3c4ccccc4c4ccccc43)c2)cc1] | 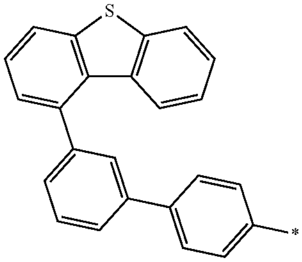 [SMILES: *c1ccc(-c2cccc(-c3cccc4sc5ccccc5c34)c2)cc1] | 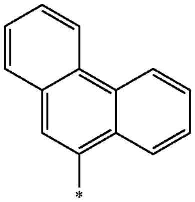 [SMILES: *c1cc2ccccc2c2ccccc12] |
| E9 | 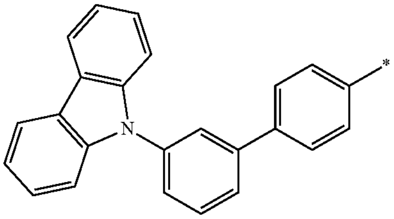 [SMILES: *c1ccc(-c2cccc(-n3c4ccccc4c4ccccc43)c2)cc1] | 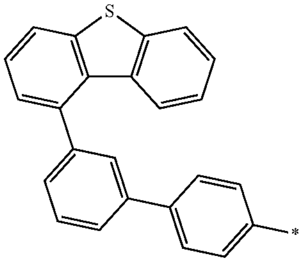 [SMILES: *c1ccc(-c2cccc(-c3cccc4sc5ccccc5c34)c2)cc1] | 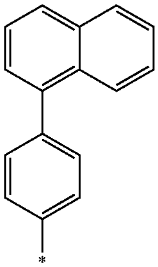 [SMILES: *c1ccc(-c2cccc3ccccc23)cc1] |
| E10 | 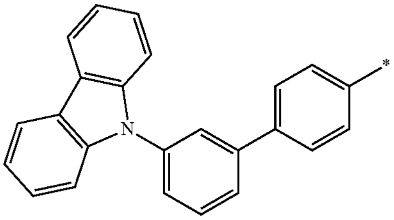 [SMILES: *c1ccc(-c2cccc(-n3c4ccccc4c4ccccc43)c2)cc1] | 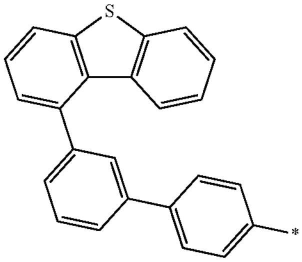 [SMILES: *c1ccc(-c2cccc(-c3cccc4sc5ccccc5c34)c2)cc1] | 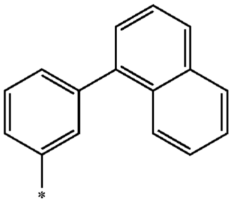 [SMILES: *c1cccc(-c2cccc3ccccc23)c1] |

-continued
| Compound Group 1 | | | |
|---|---|---|---|
| Formula 1 | $Ar_1$ | $Ar_2$ | $Ar_3$ |
| E11 | 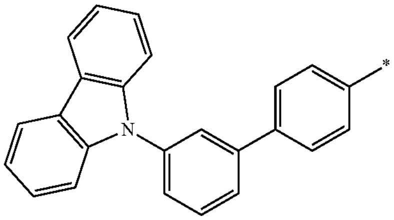 [SMILES: *c1ccc(-c2cccc(-n3c4ccccc4c4ccccc43)c2)cc1] | 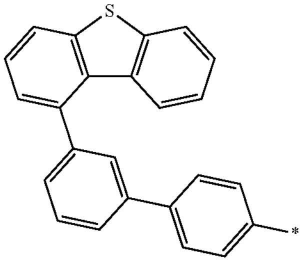 [SMILES: *c1ccc(-c2cccc(-c3cccc4sc5ccccc5c34)c2)cc1] | 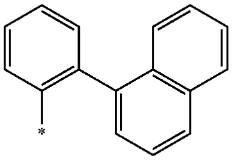 [SMILES: *c1ccccc1-c1cccc2ccccc12] |
| E12 | 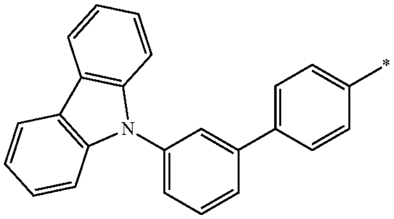 [SMILES: *c1ccc(-c2cccc(-n3c4ccccc4c4ccccc43)c2)cc1] | 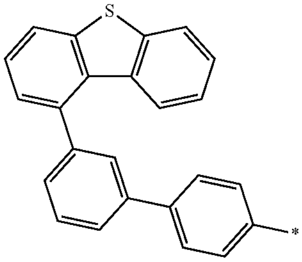 [SMILES: *c1ccc(-c2cccc(-c3cccc4sc5ccccc5c34)c2)cc1] | 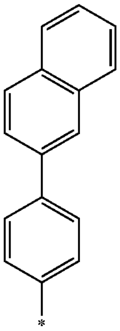 [SMILES: *c1ccc(-c2ccc3ccccc3c2)cc1] |
| E13 | 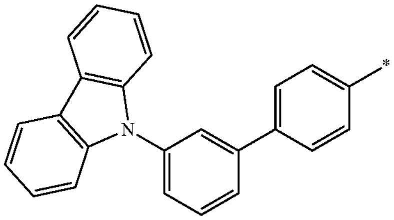 [SMILES: *c1ccc(-c2cccc(-n3c4ccccc4c4ccccc43)c2)cc1] | 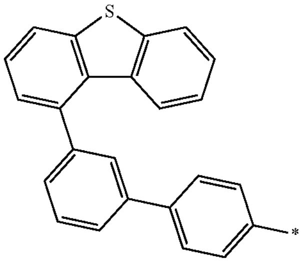 [SMILES: *c1ccc(-c2cccc(-c3cccc4sc5ccccc5c34)c2)cc1] | 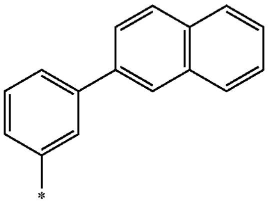 [SMILES: *c1cccc(-c2ccc3ccccc3c2)c1] |
| E14 | 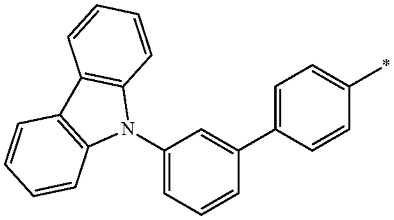 [SMILES: *c1ccc(-c2cccc(-n3c4ccccc4c4ccccc43)c2)cc1] | 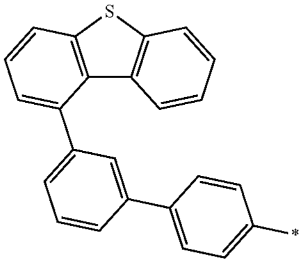 [SMILES: *c1ccc(-c2cccc(-c3cccc4sc5ccccc5c34)c2)cc1] | 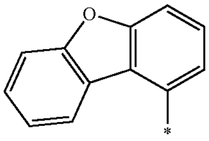 |
| E15 | 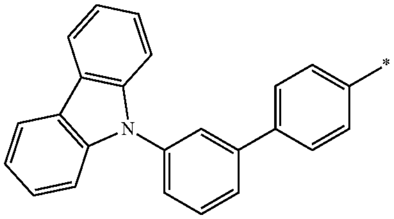 [SMILES: *c1ccc(-c2cccc(-n3c4ccccc4c4ccccc43)c2)cc1] | 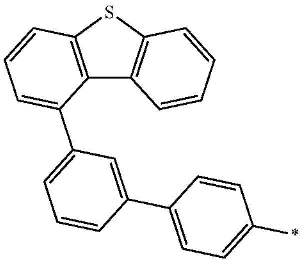 [SMILES: *c1ccc(-c2cccc(-c3cccc4sc5ccccc5c34)c2)cc1] | 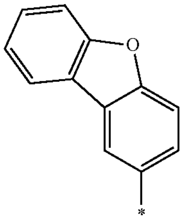 [SMILES: *c1ccc2oc3ccccc3c2c1] |

-continued
Compound Group 1
| Formula 1 | $Ar_1$ | $Ar_2$ | $Ar_3$ |
|---|---|---|---|
| E16 | 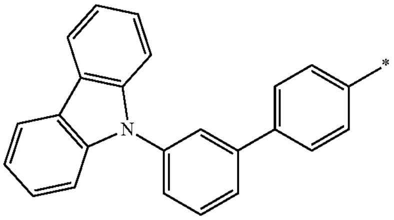 [SMILES: *c1ccc(-c2cccc(-n3c4ccccc4c4ccccc43)c2)cc1] | 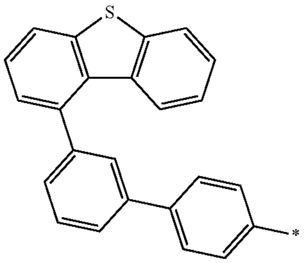 [SMILES: *c1ccc(-c2cccc(-c3cccc4sc5ccccc5c34)c2)cc1] | 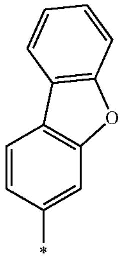 [SMILES: *c1ccc2c(c1)oc1ccccc12] |
| E17 | 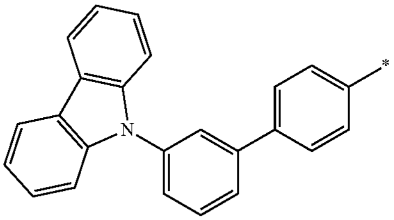 [SMILES: *c1ccc(-c2cccc(-n3c4ccccc4c4ccccc43)c2)cc1] | 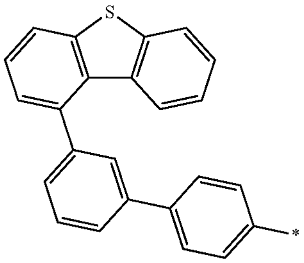 [SMILES: *c1ccc(-c2cccc(-c3cccc4sc5ccccc5c34)c2)cc1] | 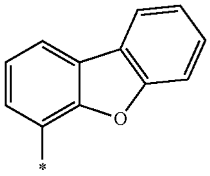 [SMILES: *c1cccc2c1oc1ccccc12] |
| E18 | 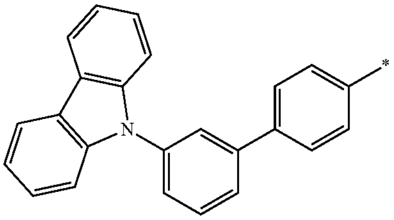 [SMILES: *c1ccc(-c2cccc(-n3c4ccccc4c4ccccc43)c2)cc1] | 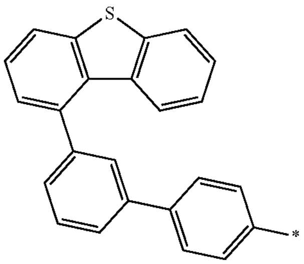 [SMILES: *c1ccc(-c2cccc(-c3cccc4sc5ccccc5c34)c2)cc1] | 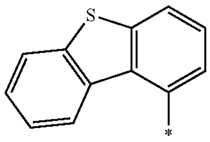 |
| E19 | 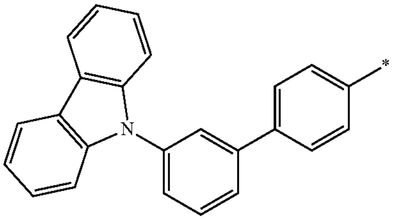 [SMILES: *c1ccc(-c2cccc(-n3c4ccccc4c4ccccc43)c2)cc1] | 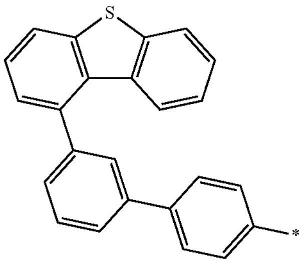 [SMILES: *c1ccc(-c2cccc(-c3cccc4sc5ccccc5c34)c2)cc1] | 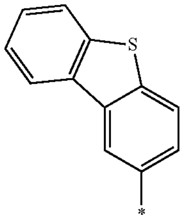 [SMILES: *c1ccc2sc3ccccc3c2c1] |
| E20 | 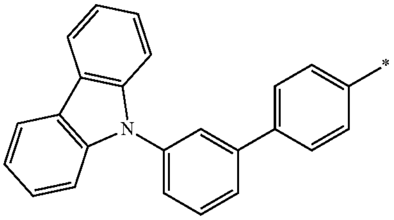 [SMILES: *c1ccc(-c2cccc(-n3c4ccccc4c4ccccc43)c2)cc1] | 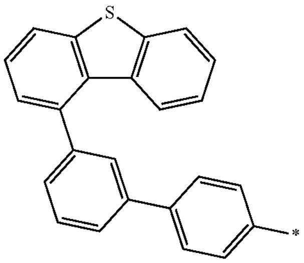 [SMILES: *c1ccc(-c2cccc(-c3cccc4sc5ccccc5c34)c2)cc1] | 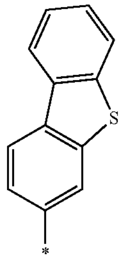 [SMILES: *c1ccc2c(c1)sc1ccccc12] |

-continued
| Compound Group 1 | | | |
|---|---|---|---|
| Formula 1 | $Ar_1$ | $Ar_2$ | $Ar_3$ |
| E21 | 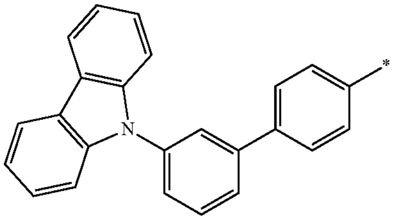 [SMILES: *c1ccc(-c2cccc(-n3c4ccccc4c4ccccc43)c2)cc1] | 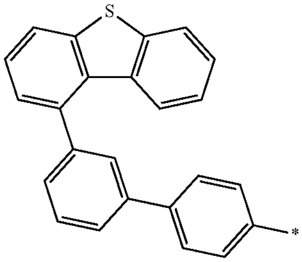 [SMILES: *c1ccc(-c2cccc(-c3cccc4sc5ccccc5c34)c2)cc1] | 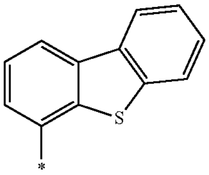 [SMILES: *c1cccc2c1sc1ccccc12] |
| E22 | 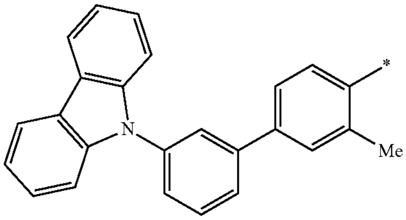 [SMILES: *c1ccc(-c2cccc(-n3c4ccccc4c4ccccc43)c2)cc1C] | 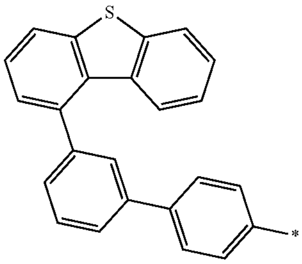 [SMILES: *c1ccc(-c2cccc(-c3cccc4sc5ccccc5c34)c2)cc1] | 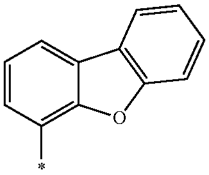 [SMILES: *c1cccc2c1oc1ccccc12] |
| E23 | 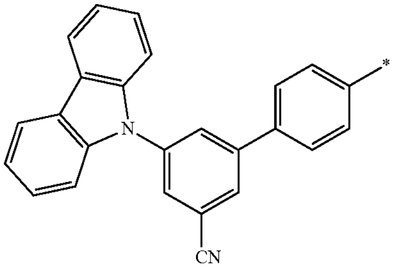 [SMILES: *c1ccc(-c2cc(C#N)cc(-n3c4ccccc4c4ccccc43)c2)cc1] | 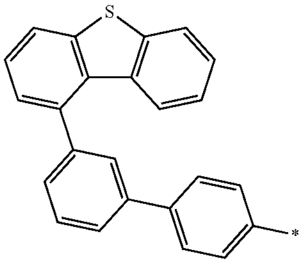 [SMILES: *c1ccc(-c2cccc(-c3cccc4sc5ccccc5c34)c2)cc1] | 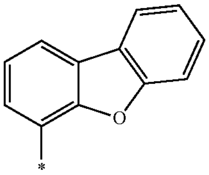 [SMILES: *c1cccc2c1oc1ccccc12] |
| F1 | 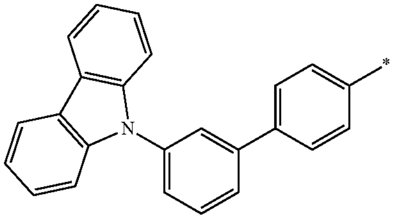 [SMILES: *c1ccc(-c2cccc(-n3c4ccccc4c4ccccc43)c2)cc1] | 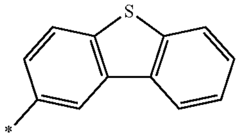 [SMILES: *c1ccc2sc3ccccc3c2c1] | 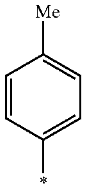 [SMILES: *c1ccc(C)cc1] |
| F2 | 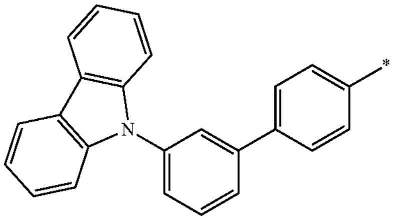 [SMILES: *c1ccc(-c2cccc(-n3c4ccccc4c4ccccc43)c2)cc1] | 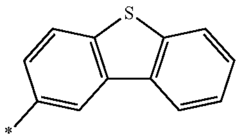 [SMILES: *c1ccc2sc3ccccc3c2c1] | 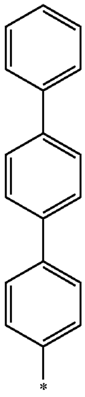 [SMILES: *c1ccc(-c2ccc(-c3ccccc3)cc2)cc1] |

-continued
| Compound Group 1 | | | |
|---|---|---|---|
| Formula 1 | $Ar_1$ | $Ar_2$ | $Ar_3$ |
| F3 | 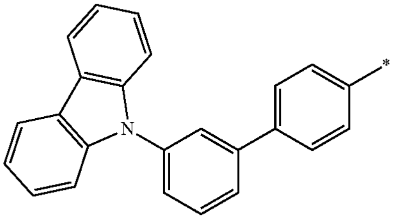 [SMILES: *c1ccc(-c2cccc(-n3c4ccccc4c4ccccc43)c2)cc1] | 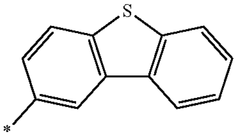 [SMILES: *c1ccc2sc3ccccc3c2c1] | 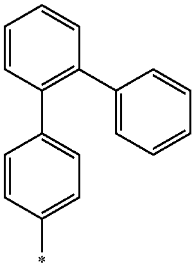 [SMILES: *c1ccc(-c2ccccc2-c2ccccc2)cc1] |
| F4 | 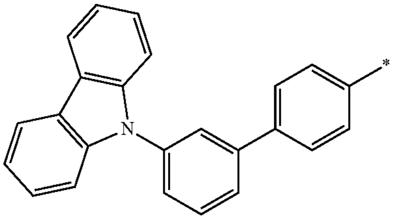 [SMILES: *c1ccc(-c2cccc(-n3c4ccccc4c4ccccc43)c2)cc1] | 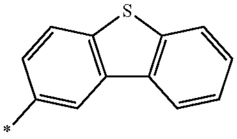 [SMILES: *c1ccc2sc3ccccc3c2c1] | 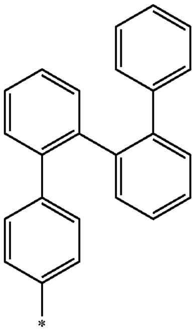 [SMILES: *c1ccc(-c2ccccc2-c2ccccc2-c2ccccc2)cc1] |
| F5 | 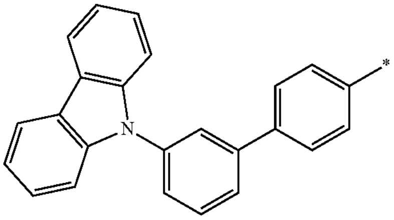 [SMILES: *c1ccc(-c2cccc(-n3c4ccccc4c4ccccc43)c2)cc1] | 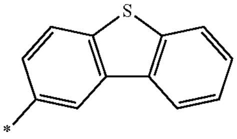 [SMILES: *c1ccc2sc3ccccc3c2c1] | 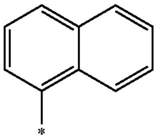 [SMILES: *c1cccc2ccccc12] |
| F6 | 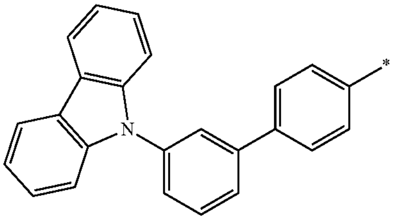 [SMILES: *c1ccc(-c2cccc(-n3c4ccccc4c4ccccc43)c2)cc1] | 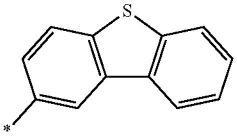 | 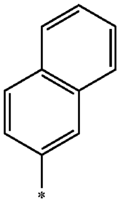 [SMILES: *c1ccc2ccccc2c1] |
| F7 | 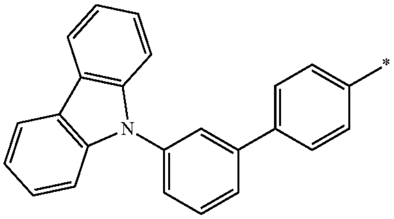 [SMILES: *c1ccc(-c2cccc(-n3c4ccccc4c4ccccc43)c2)cc1] | 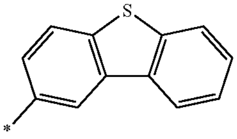 [SMILES: *c1ccc2sc3ccccc3c2c1] | 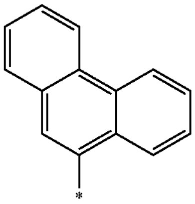 [SMILES: *c1cc2ccccc2c2ccccc12] |

-continued
| Compound Group 1 | | | |
|---|---|---|---|
| Formula 1 | $Ar_1$ | $Ar_2$ | $Ar_3$ |
| F8 | 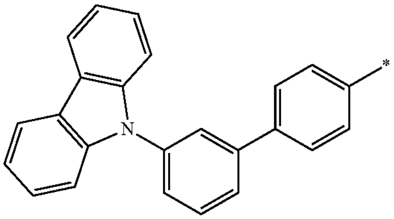 [SMILES: *c1ccc(-c2cccc(-n3c4ccccc4c4ccccc43)c2)cc1] | 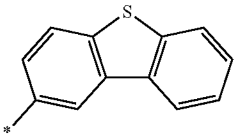 [SMILES: *c1ccc2sc3ccccc3c2c1] | 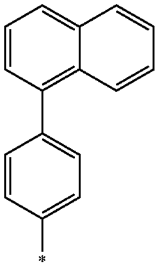 [SMILES: *c1ccc(-c2cccc3ccccc23)cc1] |
| F9 | 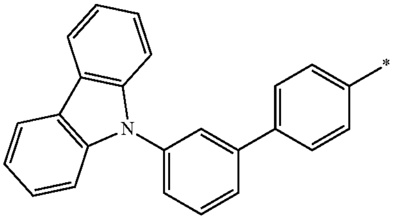 [SMILES: *c1ccc(-c2cccc(-n3c4ccccc4c4ccccc43)c2)cc1] | 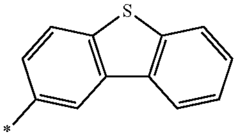 [SMILES: *c1ccc2sc3ccccc3c2c1] | 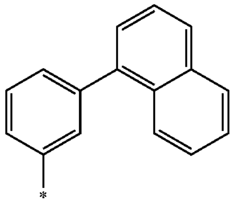 [SMILES: *c1cccc(-c2cccc3ccccc23)c1] |
| F10 | 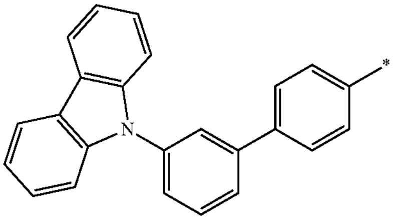 [SMILES: *c1ccc(-c2cccc(-n3c4ccccc4c4ccccc43)c2)cc1] | 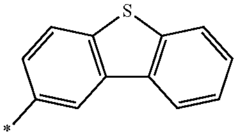 | 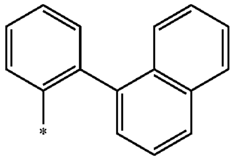 [SMILES: *c1ccccc1-c1cccc2ccccc12] |
| F11 | 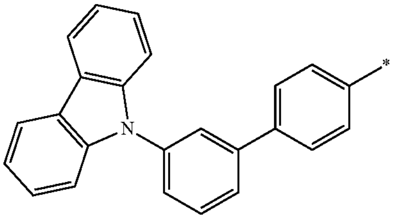 [SMILES: *c1ccc(-c2cccc(-n3c4ccccc4c4ccccc43)c2)cc1] | 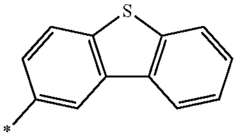 [SMILES: *c1ccc2sc3ccccc3c2c1] | 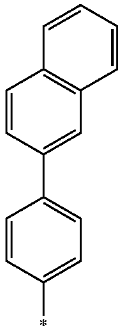 [SMILES: *c1ccc(-c2ccc3ccccc3c2)cc1] |
| F12 | 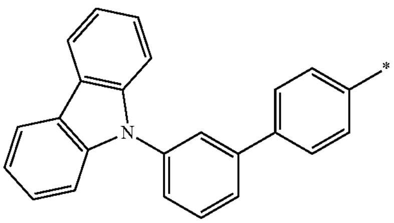 [SMILES: *c1ccc(-c2cccc(-n3c4ccccc4c4ccccc43)c2)cc1] | 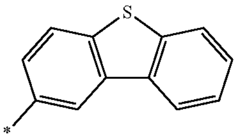 [SMILES: *c1ccc2sc3ccccc3c2c1] | 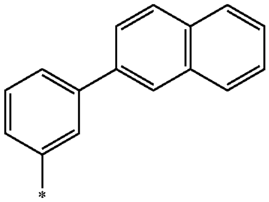 [SMILES: *c1cccc(-c2ccc3ccccc3c2)c1] |

-continued
| Compound Group 1 | | | |
|---|---|---|---|
| Formula 1 | $Ar_1$ | $Ar_2$ | $Ar_3$ |
| F13 | 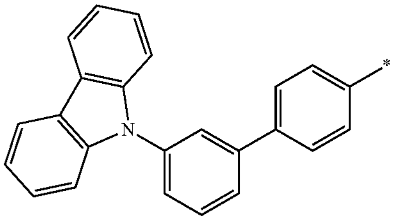 [SMILES: *c1ccc(-c2cccc(-n3c4ccccc4c4ccccc43)c2)cc1] | 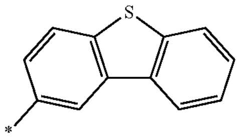 [SMILES: *c1ccc2sc3ccccc3c2c1] | 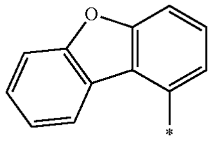 [SMILES: *c1cccc2oc3ccccc3c12] |
| F14 | 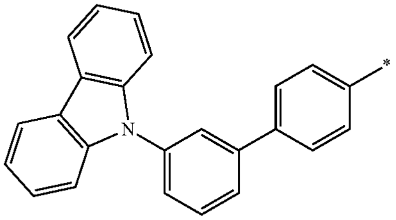 [SMILES: *c1ccc(-c2cccc(-n3c4ccccc4c4ccccc43)c2)cc1] | 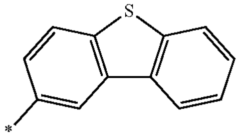 | 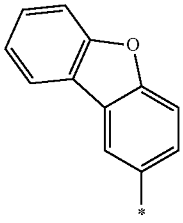 |
| F15 | 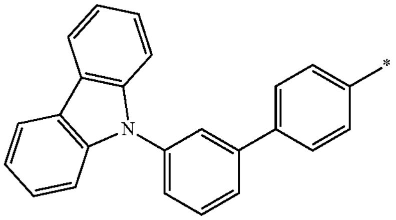 [SMILES: *c1ccc(-c2cccc(-n3c4ccccc4c4ccccc43)c2)cc1] | 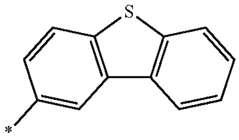 [SMILES: *c1ccc2sc3ccccc3c2c1] | 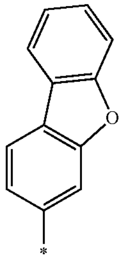 [SMILES: *c1ccc2c(c1)oc1ccccc12] |
| F16 | 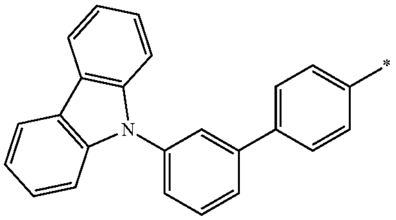 [SMILES: *c1ccc(-c2cccc(-n3c4ccccc4c4ccccc43)c2)cc1] | 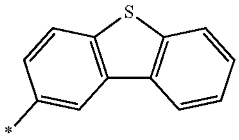 | 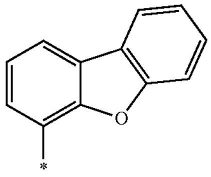 [SMILES: *c1cccc2c1oc1ccccc12] |
| F17 | 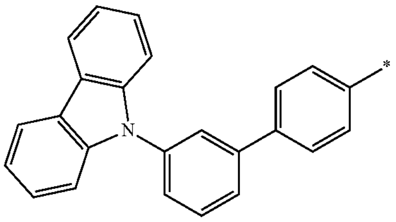 [SMILES: *c1ccc(-c2cccc(-n3c4ccccc4c4ccccc43)c2)cc1] | 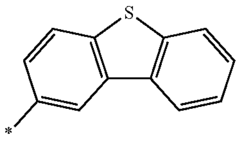 [SMILES: *c1ccc2sc3ccccc3c2c1] | 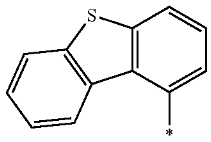 |
| F18 | 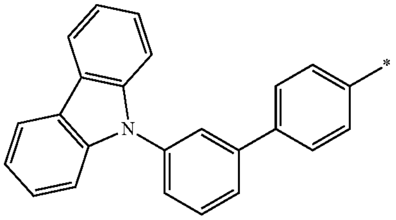 [SMILES: *c1ccc(-c2cccc(-n3c4ccccc4c4ccccc43)c2)cc1] | 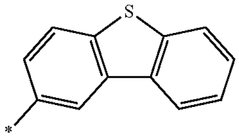 [SMILES: *c1ccc2sc3ccccc3c2c1] | 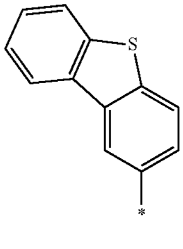 |

-continued
| Compound Group 1 | | | |
| --- | --- | --- | --- |
| Formula 1 | $Ar_1$ | $Ar_2$ | $Ar_3$ |
| F19 | 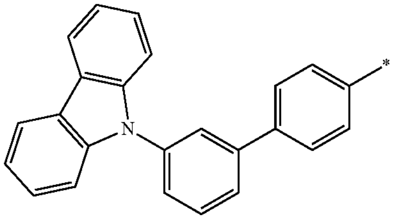 [SMILES: *c1ccc(-c2cccc(-n3c4ccccc4c4ccccc43)c2)cc1] | 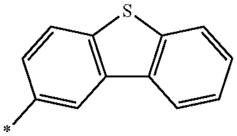 [SMILES: *c1ccc2sc3ccccc3c2c1] | 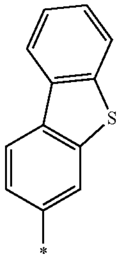 [SMILES: *c1ccc2c(c1)sc1ccccc12] |
| F20 | 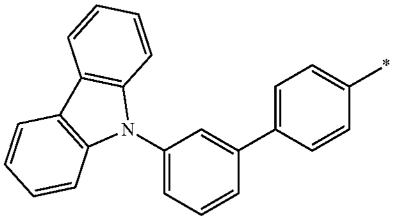 [SMILES: *c1ccc(-c2cccc(-n3c4ccccc4c4ccccc43)c2)cc1] | 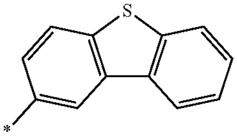 [SMILES: *c1ccc2sc3ccccc3c2c1] | 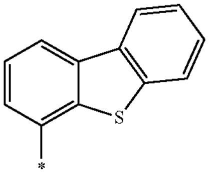 |
| F21 | 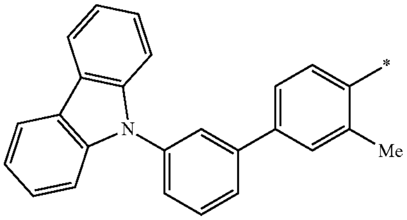 [SMILES: *c1ccc(-c2cccc(-n3c4ccccc4c4ccccc43)c2)cc1C] | 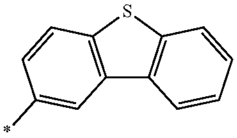 [SMILES: *c1ccc2sc3ccccc3c2c1] | 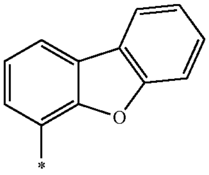 |
| F22 | 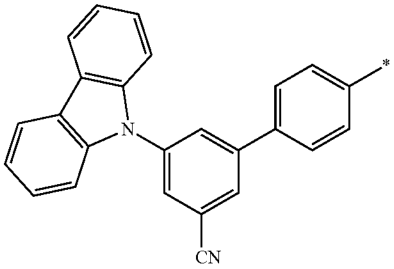 [SMILES: *c1ccc(-c2cc(C#N)cc(-n3c4ccccc4c4ccccc43)c2)cc1] | 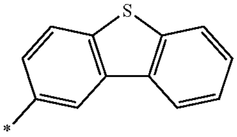 [SMILES: *c1ccc2sc3ccccc3c2c1] | 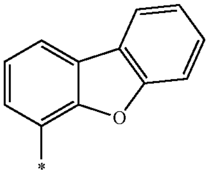 |
| G1 | 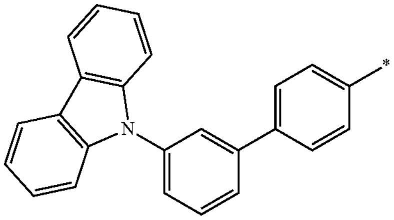 [SMILES: *c1ccc(-c2cccc(-n3c4ccccc4c4ccccc43)c2)cc1] | 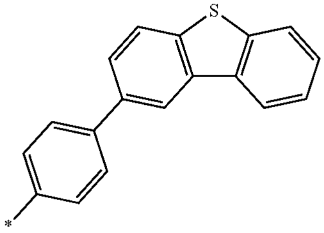 [SMILES: *c1ccc(-c2ccc3sc4ccccc4c3c2)cc1] | 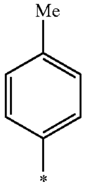 [SMILES: *c1ccc(C)cc1] |

-continued
| Compound Group 1 | | | |
|---|---|---|---|
| Formula 1 | $Ar_1$ | $Ar_2$ | $Ar_3$ |
| G2 | 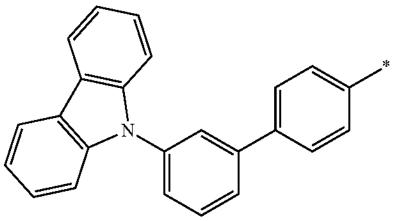 [SMILES: *c1ccc(-c2cccc(-n3c4ccccc4c4ccccc43)c2)cc1] | 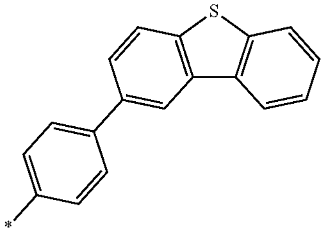 [SMILES: *c1ccc(-c2ccc3sc4ccccc4c3c2)cc1] | 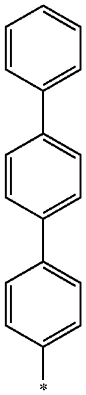 [SMILES: *c1ccc(-c2ccc(-c3ccccc3)cc2)cc1] |
| G3 | 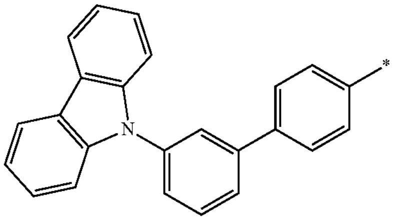 [SMILES: *c1ccc(-c2cccc(-n3c4ccccc4c4ccccc43)c2)cc1] | 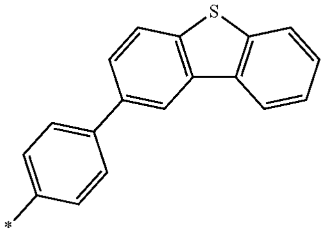 [SMILES: *c1ccc(-c2ccc3sc4ccccc4c3c2)cc1] | 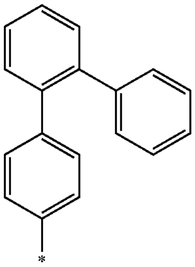 [SMILES: *c1ccc(-c2ccccc2-c2ccccc2)cc1] |
| G4 | 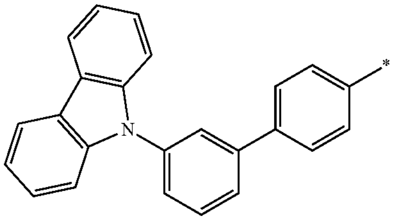 [SMILES: *c1ccc(-c2cccc(-n3c4ccccc4c4ccccc43)c2)cc1] | 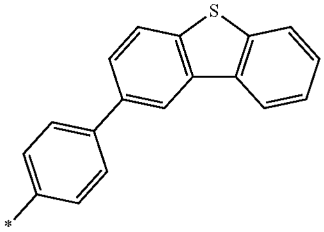 [SMILES: *c1ccc(-c2ccc3sc4ccccc4c3c2)cc1] | 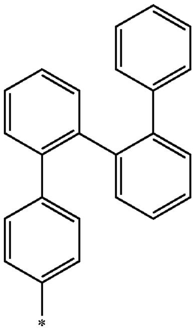 [SMILES: *c1ccc(-c2ccccc2-c2ccccc2-c2ccccc2)cc1] |
| G5 | 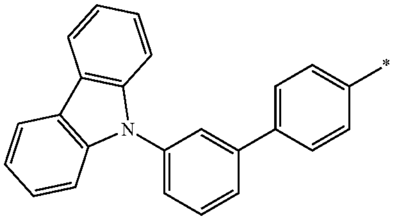 [SMILES: *c1ccc(-c2cccc(-n3c4ccccc4c4ccccc43)c2)cc1] | 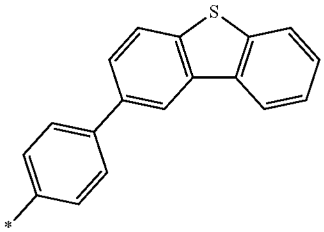 [SMILES: *c1ccc(-c2ccc3sc4ccccc4c3c2)cc1] | 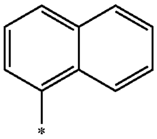 [SMILES: *c1cccc2ccccc12] |
| G6 | 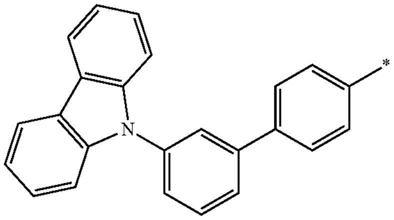 [SMILES: *c1ccc(-c2cccc(-n3c4ccccc4c4ccccc43)c2)cc1] | 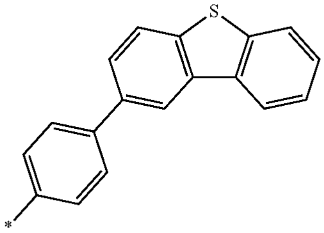 [SMILES: *c1ccc(-c2ccc3sc4ccccc4c3c2)cc1] | 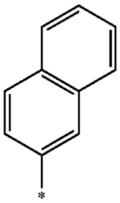 [SMILES: *c1ccc2ccccc2c1] |

-continued
Compound Group 1
| Formula 1 | $Ar_1$ | $Ar_2$ | $Ar_3$ |
|---|---|---|---|
| G7 | 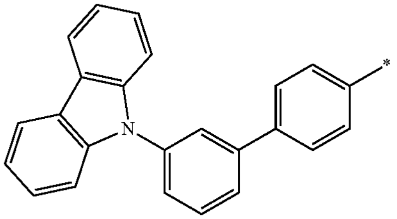 [SMILES: *c1ccc(-c2cccc(-n3c4ccccc4c4ccccc43)c2)cc1] | 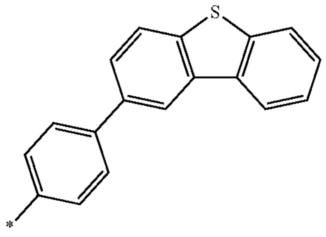 [SMILES: *c1ccc(-c2ccc3sc4ccccc4c3c2)cc1] | 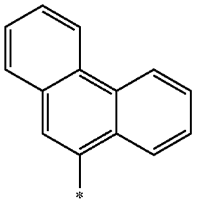 [SMILES: *c1cc2ccccc2c2ccccc12] |
| G8 | 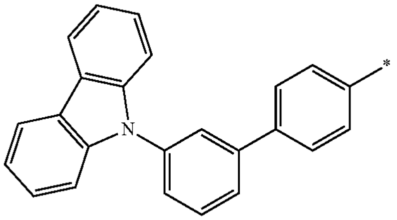 [SMILES: *c1ccc(-c2cccc(-n3c4ccccc4c4ccccc43)c2)cc1] | 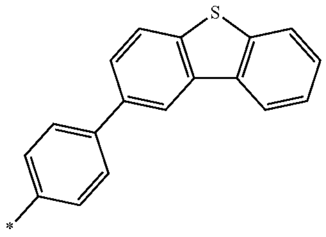 [SMILES: *c1ccc(-c2ccc3sc4ccccc4c3c2)cc1] | 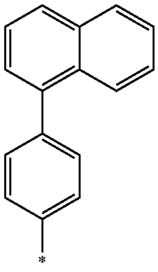 [SMILES: *c1ccc(-c2cccc3ccccc23)cc1] |
| G9 | 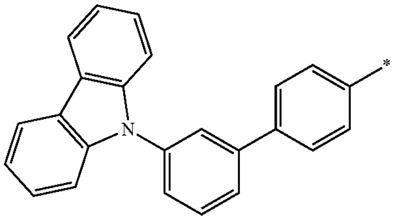 [SMILES: *c1ccc(-c2cccc(-n3c4ccccc4c4ccccc43)c2)cc1] | 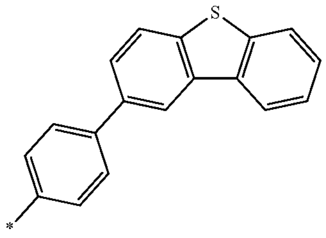 [SMILES: *c1ccc(-c2ccc3sc4ccccc4c3c2)cc1] | 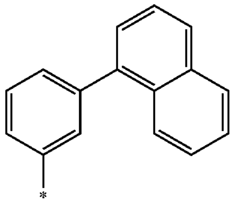 [SMILES: *c1cccc(-c2cccc3ccccc23)c1] |
| G10 | 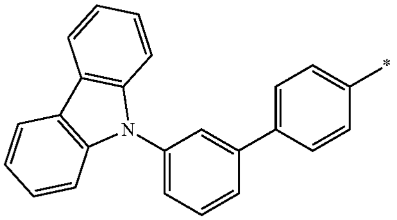 [SMILES: *c1ccc(-c2cccc(-n3c4ccccc4c4ccccc43)c2)cc1] | 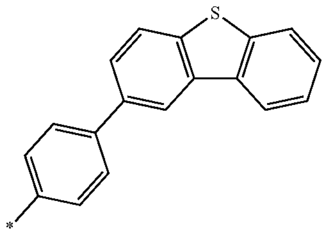 [SMILES: *c1ccc(-c2ccc3sc4ccccc4c3c2)cc1] | 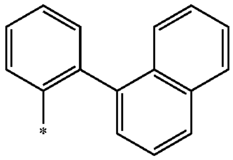 [SMILES: *c1ccccc1-c1cccc2ccccc12] |
| G11 | 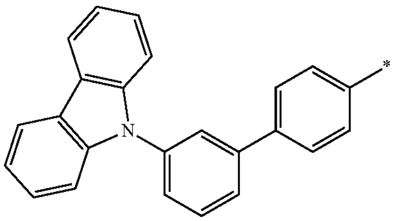 [SMILES: *c1ccc(-c2cccc(-n3c4ccccc4c4ccccc43)c2)cc1] | 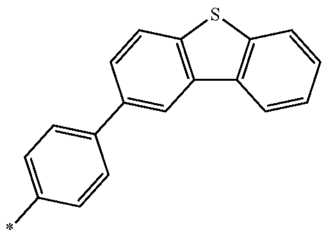 [SMILES: *c1ccc(-c2ccc3sc4ccccc4c3c2)cc1] | 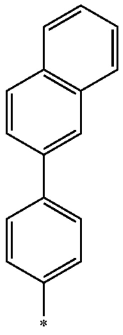 [SMILES: *c1ccc(-c2ccc3ccccc3c2)cc1] |

-continued
| Compound Group 1 | | | |
|---|---|---|---|
| Formula 1 | $Ar_1$ | $Ar_2$ | $Ar_3$ |
| G12 | 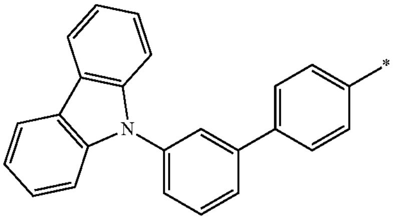 [SMILES: *c1ccc(-c2cccc(-n3c4ccccc4c4ccccc43)c2)cc1] | 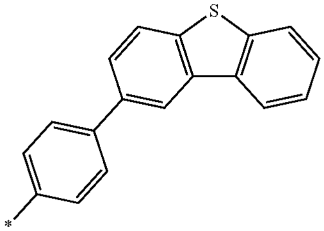 [SMILES: *c1ccc(-c2ccc3sc4ccccc4c3c2)cc1] | 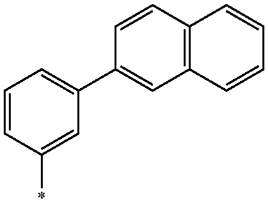 [SMILES: *c1cccc(-c2ccc3ccccc3c2)c1] |
| G13 | 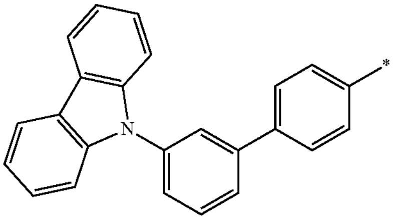 [SMILES: *c1ccc(-c2cccc(-n3c4ccccc4c4ccccc43)c2)cc1] | 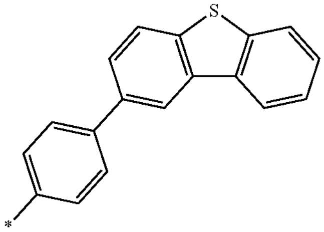 [SMILES: *c1ccc(-c2ccc3sc4ccccc4c3c2)cc1] | 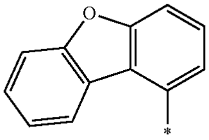 [SMILES: *c1cccc2oc3ccccc3c12] |
| G14 | 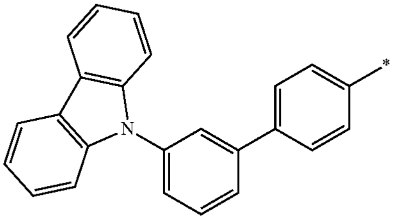 [SMILES: *c1ccc(-c2cccc(-n3c4ccccc4c4ccccc43)c2)cc1] | 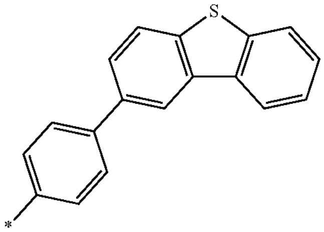 [SMILES: *c1ccc(-c2ccc3sc4ccccc4c3c2)cc1] | 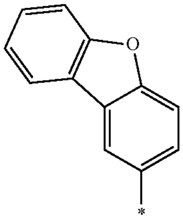 [SMILES: *c1ccc2oc3ccccc3c2c1] |
| G15 | 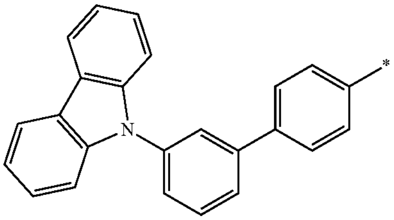 [SMILES: *c1ccc(-c2cccc(-n3c4ccccc4c4ccccc43)c2)cc1] | 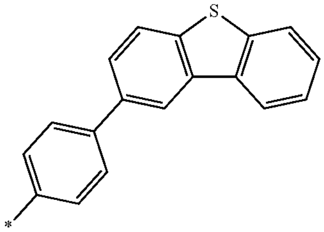 [SMILES: *c1ccc(-c2ccc3sc4ccccc4c3c2)cc1] | 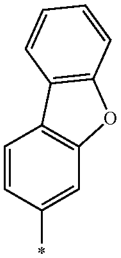 [SMILES: *c1ccc2c(c1)oc1ccccc12] |
| G16 | 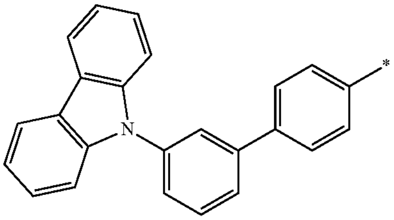 [SMILES: *c1ccc(-c2cccc(-n3c4ccccc4c4ccccc43)c2)cc1] | 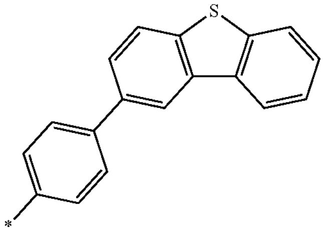 [SMILES: *c1ccc(-c2ccc3sc4ccccc4c3c2)cc1] | 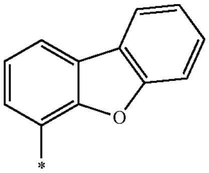 |
| G17 | 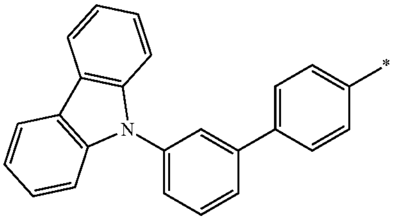 [SMILES: *c1ccc(-c2cccc(-n3c4ccccc4c4ccccc43)c2)cc1] | 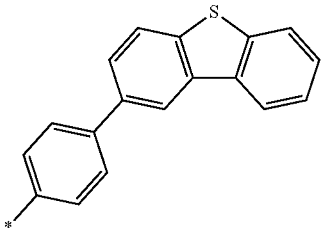 [SMILES: *c1ccc(-c2ccc3sc4ccccc4c3c2)cc1] | 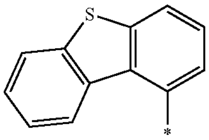 |

-continued
Compound Group 1
| Formula 1 | $Ar_1$ | $Ar_2$ | $Ar_3$ |
|---|---|---|---|
| G18 | 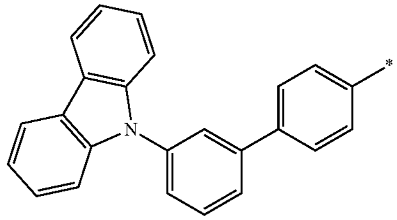 [SMILES: *c1ccc(-c2cccc(-n3c4ccccc4c4ccccc43)c2)cc1] | 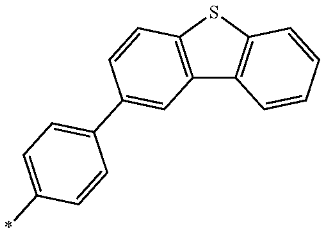 [SMILES: *c1ccc(-c2ccc3sc4ccccc4c3c2)cc1] | 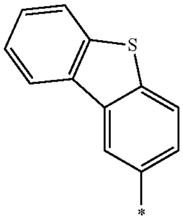 [SMILES: *c1ccc2sc3ccccc3c2c1] |
| G19 | 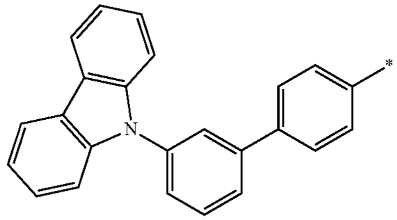 [SMILES: *c1ccc(-c2cccc(-n3c4ccccc4c4ccccc43)c2)cc1] | 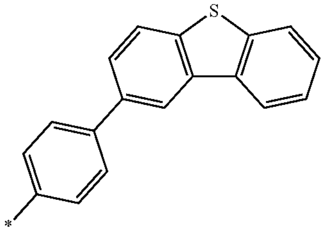 [SMILES: *c1ccc(-c2ccc3sc4ccccc4c3c2)cc1] | 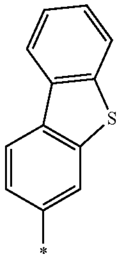 [SMILES: *c1ccc2c(c1)sc1ccccc12] |
| G20 | 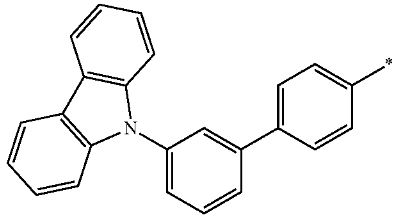 [SMILES: *c1ccc(-c2cccc(-n3c4ccccc4c4ccccc43)c2)cc1] | 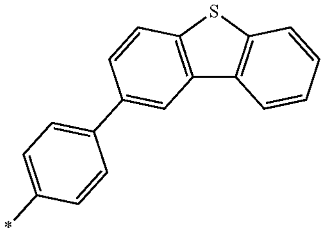 [SMILES: *c1ccc(-c2ccc3sc4ccccc4c3c2)cc1] | 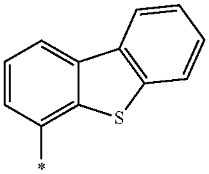 |
| G21 | 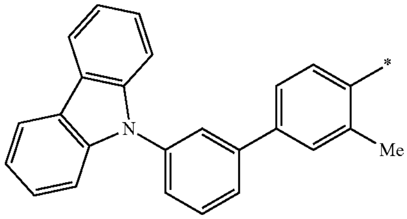 [SMILES: *c1ccc(-c2cccc(-n3c4ccccc4c4ccccc43)c2)cc1C] | 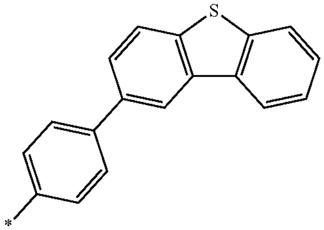 [SMILES: *c1ccc(-c2ccc3sc4ccccc4c3c2)cc1] | 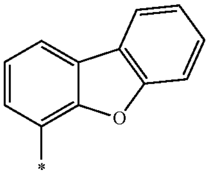 |
| G22 | 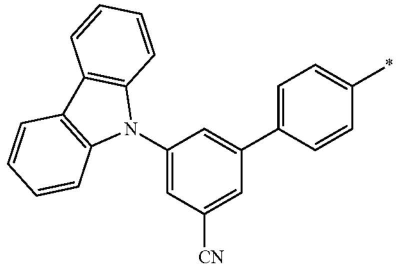 [SMILES: *c1ccc(-c2cc(C#N)cc(-n3c4ccccc4c4ccccc43)c2)cc1] | 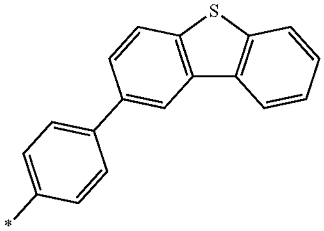 [SMILES: *c1ccc(-c2ccc3sc4ccccc4c3c2)cc1] | 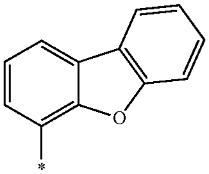 |
| H1 | 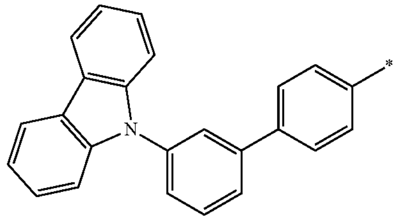 [SMILES: *c1ccc(-c2cccc(-n3c4ccccc4c4ccccc43)c2)cc1] | 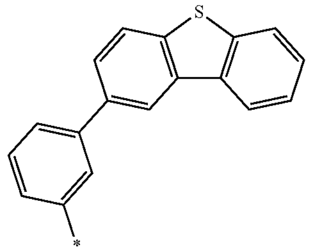 [SMILES: *c1cccc(-c2ccc3sc4ccccc4c3c2)c1] | 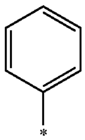 [SMILES: *c1ccccc1] |

-continued
| Compound Group 1 | | | |
|---|---|---|---|
| Formula 1 | $Ar_1$ | $Ar_2$ | $Ar_3$ |
| H2 | 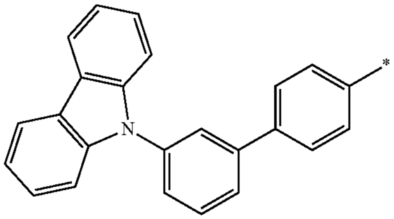 [SMILES: *c1ccc(-c2cccc(-n3c4ccccc4c4ccccc43)c2)cc1] | 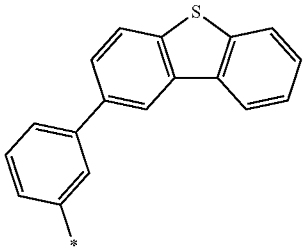 [SMILES: *c1cccc(-c2ccc3sc4ccccc4c3c2)c1] | 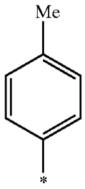 [SMILES: *c1ccc(C)cc1] |
| H3 | 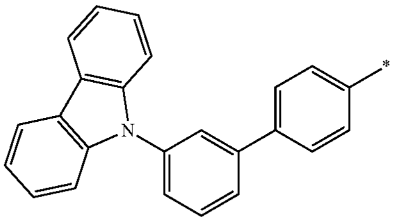 [SMILES: *c1ccc(-c2cccc(-n3c4ccccc4c4ccccc43)c2)cc1] | 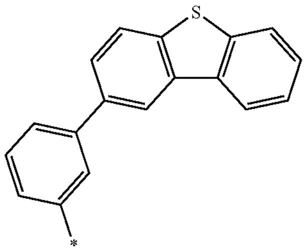 [SMILES: *c1cccc(-c2ccc3sc4ccccc4c3c2)c1] | 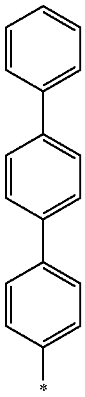 [SMILES: *c1ccc(-c2ccc(-c3ccccc3)cc2)cc1] |
| H4 | 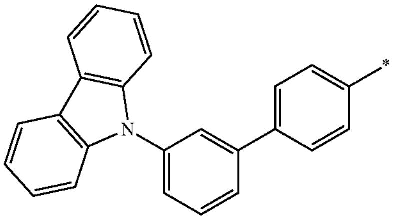 [SMILES: *c1ccc(-c2cccc(-n3c4ccccc4c4ccccc43)c2)cc1] | 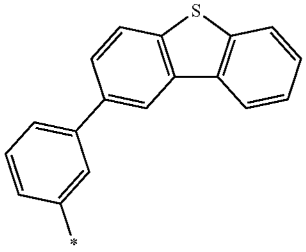 [SMILES: *c1cccc(-c2ccc3sc4ccccc4c3c2)c1] | 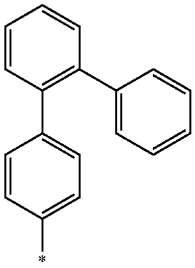 [SMILES: *c1ccc(-c2ccccc2-c2ccccc2)cc1] |
| H5 | 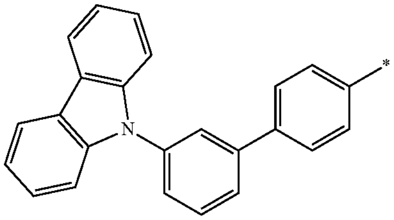 [SMILES: *c1ccc(-c2cccc(-n3c4ccccc4c4ccccc43)c2)cc1] | 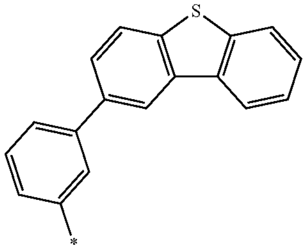 [SMILES: *c1cccc(-c2ccc3sc4ccccc4c3c2)c1] | 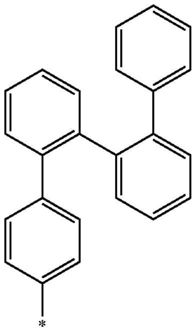 [SMILES: *c1ccc(-c2ccccc2-c2ccccc2-c2ccccc2)cc1] |

-continued
Compound Group 1
| Formula 1 | $Ar_1$ | $Ar_2$ | $Ar_3$ |
|---|---|---|---|
| H6 | 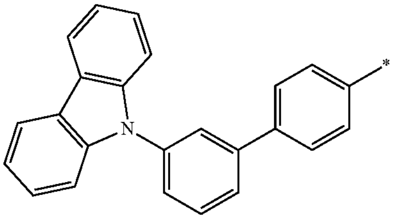 [SMILES: *c1ccc(-c2cccc(-n3c4ccccc4c4ccccc43)c2)cc1] | 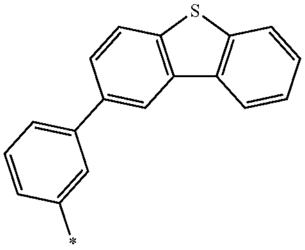 [SMILES: *c1cccc(-c2ccc3sc4ccccc4c3c2)c1] | 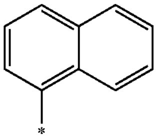 [SMILES: *c1cccc2ccccc12] |
| H7 | 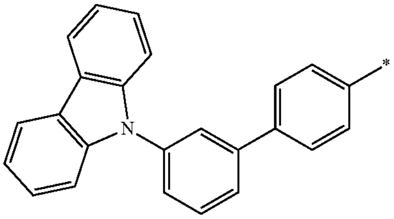 [SMILES: *c1ccc(-c2cccc(-n3c4ccccc4c4ccccc43)c2)cc1] | 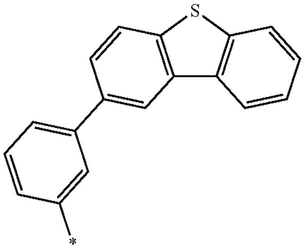 [SMILES: *c1cccc(-c2ccc3sc4ccccc4c3c2)c1] | 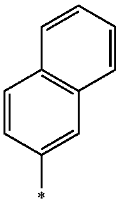 [SMILES: *c1ccc2ccccc2c1] |
| H8 | 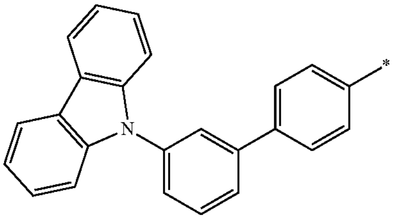 [SMILES: *c1ccc(-c2cccc(-n3c4ccccc4c4ccccc43)c2)cc1] | 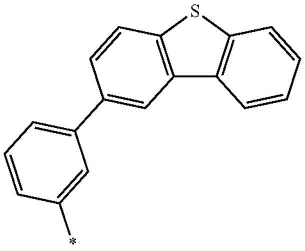 [SMILES: *c1cccc(-c2ccc3sc4ccccc4c3c2)c1] | 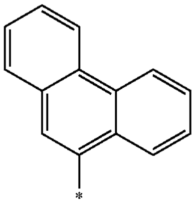 [SMILES: *c1cc2ccccc2c2ccccc12] |
| H9 | 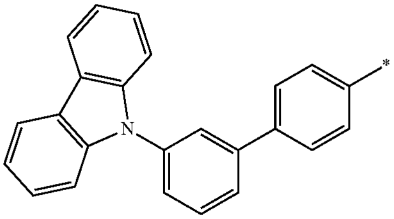 [SMILES: *c1ccc(-c2cccc(-n3c4ccccc4c4ccccc43)c2)cc1] | 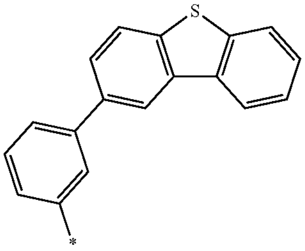 [SMILES: *c1cccc(-c2ccc3sc4ccccc4c3c2)c1] | 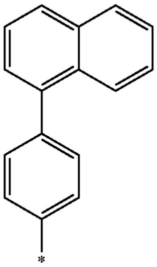 [SMILES: *c1ccc(-c2cccc3ccccc23)cc1] |
| H10 | 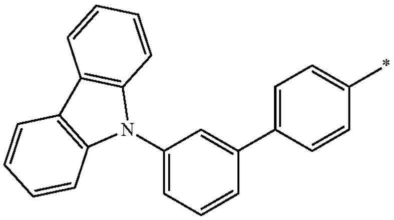 [SMILES: *c1ccc(-c2cccc(-n3c4ccccc4c4ccccc43)c2)cc1] | 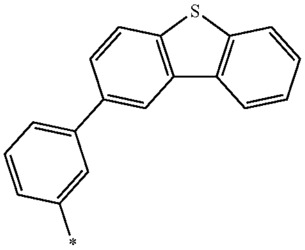 [SMILES: *c1cccc(-c2ccc3sc4ccccc4c3c2)c1] | 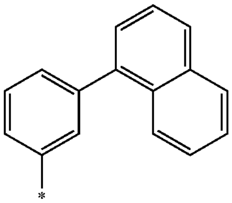 [SMILES: *c1cccc(-c2cccc3ccccc23)c1] |

-continued
| Compound Group 1 | | | |
|---|---|---|---|
| Formula 1 | $Ar_1$ | $Ar_2$ | $Ar_3$ |
| H11 | 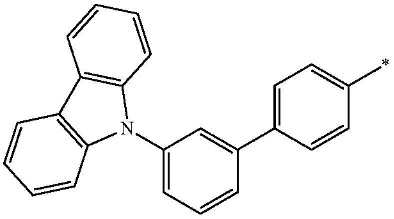 [SMILES: *c1ccc(-c2cccc(-n3c4ccccc4c4ccccc43)c2)cc1] | 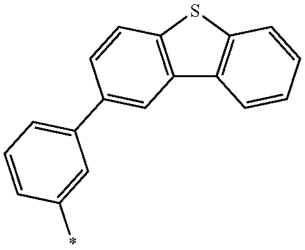 [SMILES: *c1cccc(-c2ccc3sc4ccccc4c3c2)c1] | 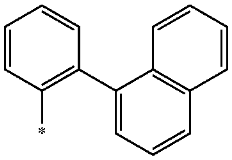 [SMILES: *c1ccccc1-c1cccc2ccccc12] |
| H12 | 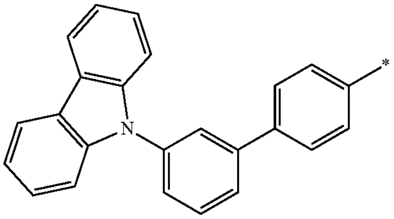 [SMILES: *c1ccc(-c2cccc(-n3c4ccccc4c4ccccc43)c2)cc1] | 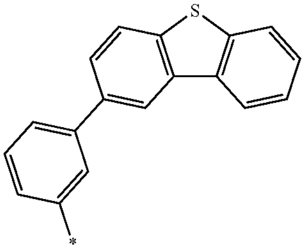 [SMILES: *c1cccc(-c2ccc3sc4ccccc4c3c2)c1] | 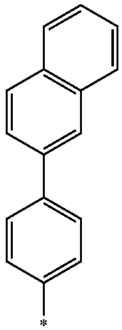 [SMILES: *c1ccc(-c2ccc3ccccc3c2)cc1] |
| H13 | 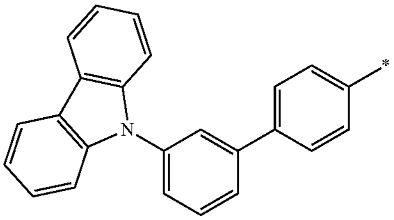 [SMILES: *c1ccc(-c2cccc(-n3c4ccccc4c4ccccc43)c2)cc1] | 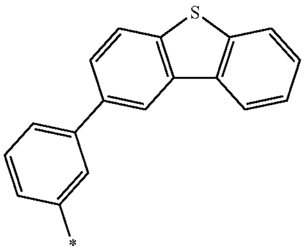 [SMILES: *c1cccc(-c2ccc3sc4ccccc4c3c2)c1] | 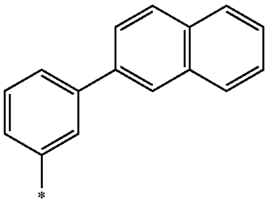 [SMILES: *c1cccc(-c2ccc3ccccc3c2)c1] |
| H14 | 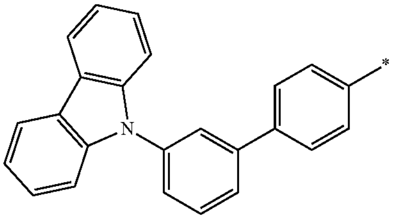 [SMILES: *c1ccc(-c2cccc(-n3c4ccccc4c4ccccc43)c2)cc1] | 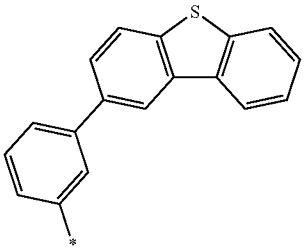 [SMILES: *c1cccc(-c2ccc3sc4ccccc4c3c2)c1] | 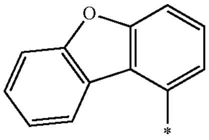 |
| H15 | 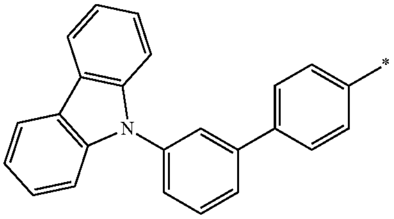 [SMILES: *c1ccc(-c2cccc(-n3c4ccccc4c4ccccc43)c2)cc1] | 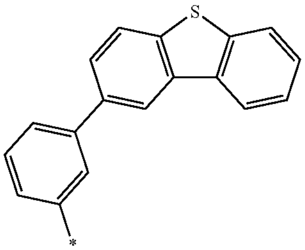 [SMILES: *c1cccc(-c2ccc3sc4ccccc4c3c2)c1] | 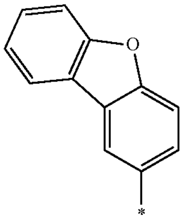 [SMILES: *c1ccc2oc3ccccc3c2c1] |

-continued
Compound Group 1
| Formula 1 | $Ar_1$ | $Ar_2$ | $Ar_3$ |
| --- | --- | --- | --- |
| H16 | 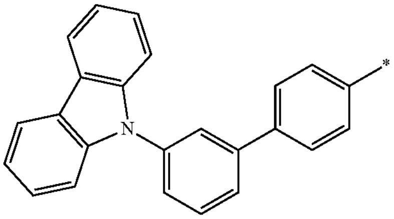 [SMILES: *c1ccc(-c2cccc(-n3c4ccccc4c4ccccc43)c2)cc1] | 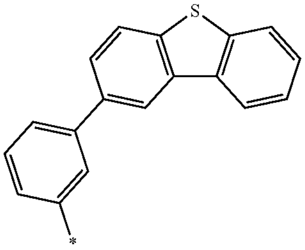 [SMILES: *c1cccc(-c2ccc3sc4ccccc4c3c2)c1] | 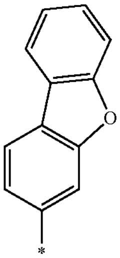 [SMILES: *c1ccc2c(c1)oc1ccccc12] |
| H17 | 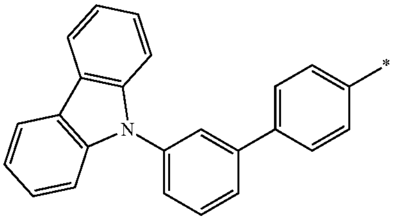 [SMILES: *c1ccc(-c2cccc(-n3c4ccccc4c4ccccc43)c2)cc1] | 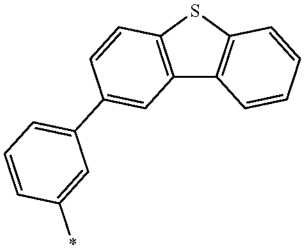 [SMILES: *c1cccc(-c2ccc3sc4ccccc4c3c2)c1] | 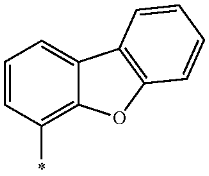 [SMILES: *c1cccc2c1oc1ccccc12] |
| H18 | 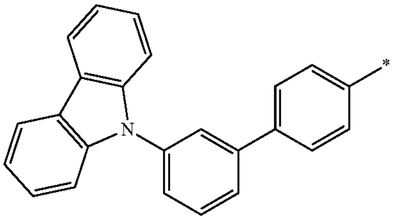 [SMILES: *c1ccc(-c2cccc(-n3c4ccccc4c4ccccc43)c2)cc1] | 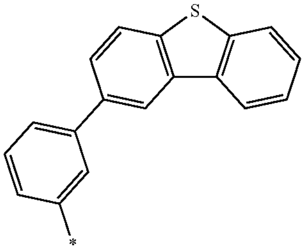 [SMILES: *c1cccc(-c2ccc3sc4ccccc4c3c2)c1] | 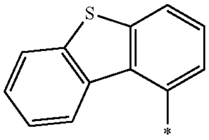 |
| H19 | 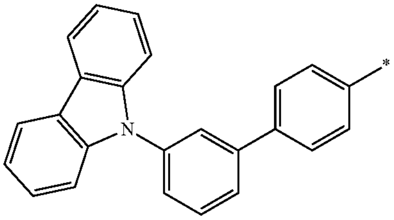 [SMILES: *c1ccc(-c2cccc(-n3c4ccccc4c4ccccc43)c2)cc1] | 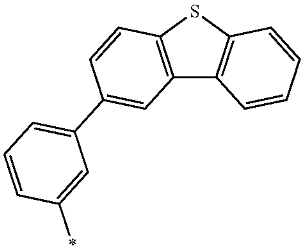 [SMILES: *c1cccc(-c2ccc3sc4ccccc4c3c2)c1] | 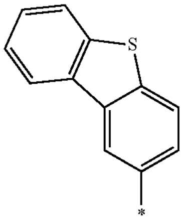 [SMILES: *c1ccc2sc3ccccc3c2c1] |
| H20 | 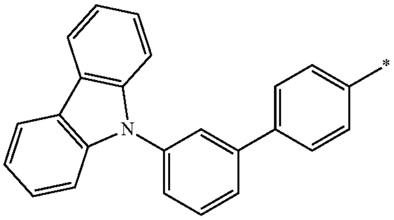 [SMILES: *c1ccc(-c2cccc(-n3c4ccccc4c4ccccc43)c2)cc1] | 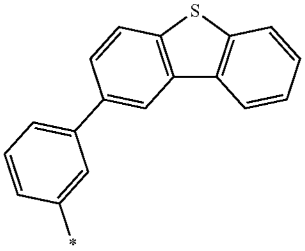 [SMILES: *c1cccc(-c2ccc3sc4ccccc4c3c2)c1] | 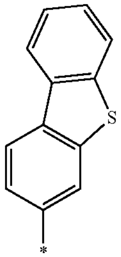 [SMILES: *c1ccc2c(c1)sc1ccccc12] |

-continued
Compound Group 1
| Formula 1 | $Ar_1$ | $Ar_2$ | $Ar_3$ |
|---|---|---|---|
| H21 | 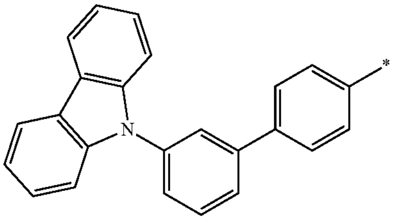 [SMILES: *c1ccc(-c2cccc(-n3c4ccccc4c4ccccc43)c2)cc1] | 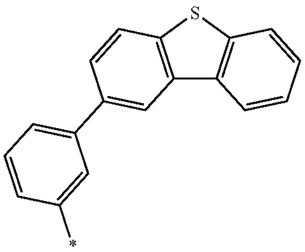 [SMILES: *c1cccc(-c2ccc3sc4ccccc4c3c2)c1] | 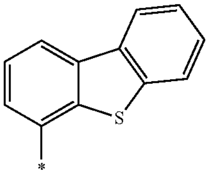 [SMILES: *c1cccc2c1sc1ccccc12] |
| H22 | 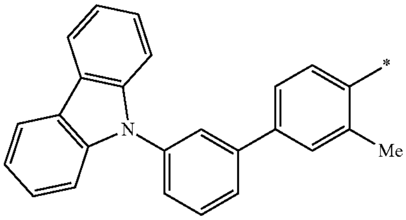 [SMILES: *c1ccc(-c2cccc(-n3c4ccccc4c4ccccc43)c2)cc1C] | 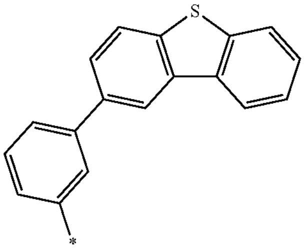 [SMILES: *c1cccc(-c2ccc3sc4ccccc4c3c2)c1] | 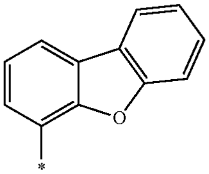 [SMILES: *c1cccc2c1oc1ccccc12] |
| H23 | 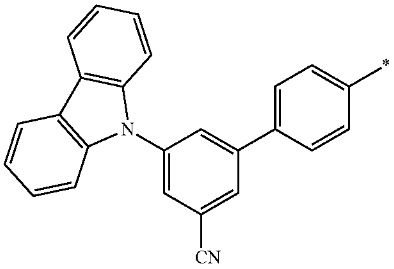 [SMILES: *c1ccc(-c2cc(C#N)cc(-n3c4ccccc4c4ccccc43)c2)cc1] | 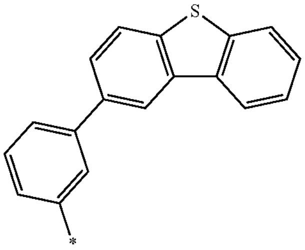 [SMILES: *c1cccc(-c2ccc3sc4ccccc4c3c2)c1] | 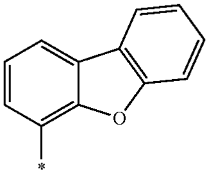 |
| I1 | 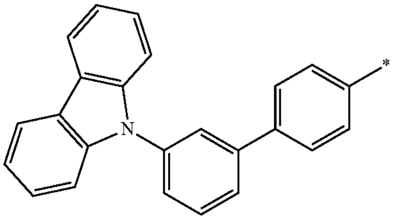 [SMILES: *c1ccc(-c2cccc(-n3c4ccccc4c4ccccc43)c2)cc1] | 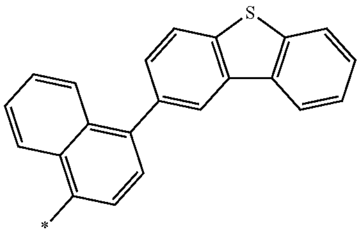 [SMILES: *c1ccc(-c2ccc3sc4ccccc4c3c2)c2ccccc12] | 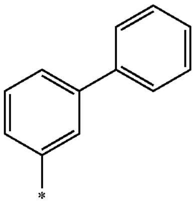 [SMILES: *c1cccc(-c2ccccc2)c1] |
| I2 | 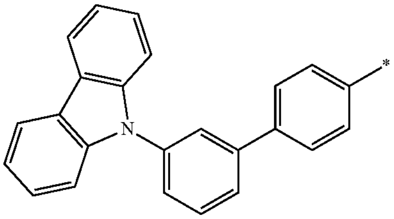 [SMILES: *c1ccc(-c2cccc(-n3c4ccccc4c4ccccc43)c2)cc1] | 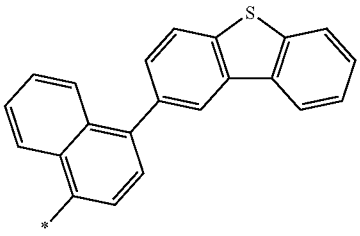 [SMILES: *c1ccc(-c2ccc3sc4ccccc4c3c2)c2ccccc12] | 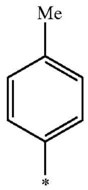 [SMILES: *c1ccc(C)cc1] |

-continued
Compound Group 1
| Formula 1 | $Ar_1$ | $Ar_2$ | $Ar_3$ |
|---|---|---|---|
| I3 | 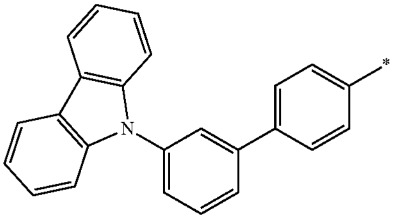 [SMILES: *c1ccc(-c2cccc(-n3c4ccccc4c4ccccc43)c2)cc1] | 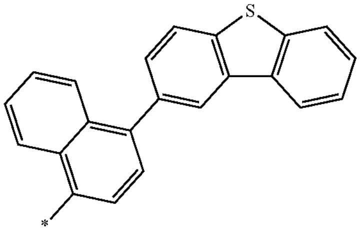 [SMILES: *c1ccc(-c2ccc3sc4ccccc4c3c2)c2ccccc12] | 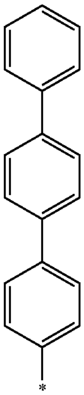 [SMILES: *c1ccc(-c2ccc(-c3ccccc3)cc2)cc1] |
| I4 | 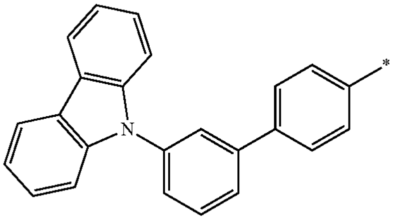 [SMILES: *c1ccc(-c2cccc(-n3c4ccccc4c4ccccc43)c2)cc1] | 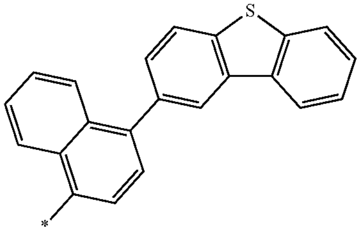 [SMILES: *c1ccc(-c2ccc3sc4ccccc4c3c2)c2ccccc12] | 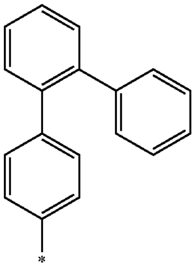 [SMILES: *c1ccc(-c2ccccc2-c2ccccc2)cc1] |
| I5 | 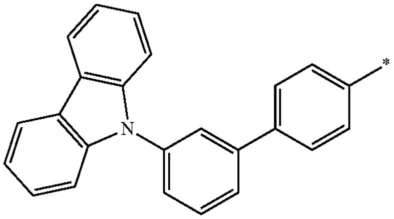 [SMILES: *c1ccc(-c2cccc(-n3c4ccccc4c4ccccc43)c2)cc1] | 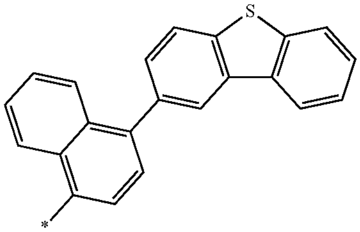 [SMILES: *c1ccc(-c2ccc3sc4ccccc4c3c2)c2ccccc12] | 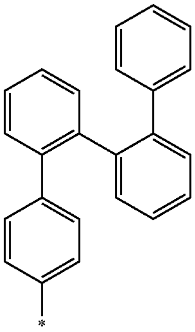 [SMILES: *c1ccc(-c2ccccc2-c2ccccc2-c2ccccc2)cc1] |
| I6 | 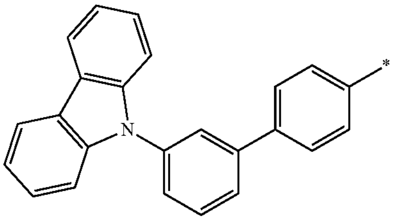 [SMILES: *c1ccc(-c2cccc(-n3c4ccccc4c4ccccc43)c2)cc1] | 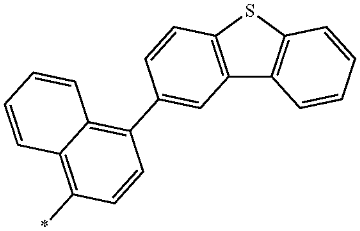 [SMILES: *c1ccc(-c2ccc3sc4ccccc4c3c2)c2ccccc12] | 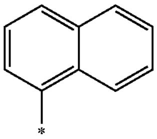 |
| I7 | 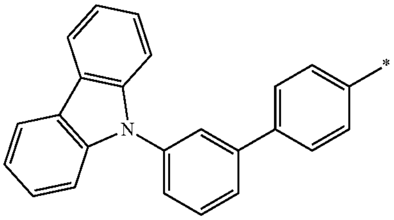 [SMILES: *c1ccc(-c2cccc(-n3c4ccccc4c4ccccc43)c2)cc1] | 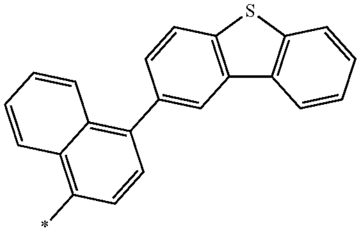 [SMILES: *c1ccc(-c2ccc3sc4ccccc4c3c2)c2ccccc12] | 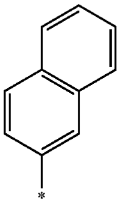 [SMILES: *c1ccc2ccccc2c1] |

-continued
| Compound Group 1 | | | |
|---|---|---|---|
| Formula 1 | $Ar_1$ | $Ar_2$ | $Ar_3$ |
| I8 | 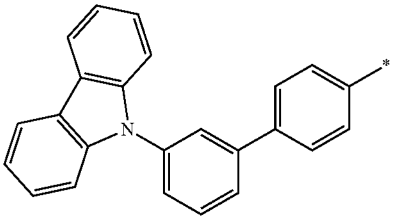 [SMILES: *c1ccc(-c2cccc(-n3c4ccccc4c4ccccc43)c2)cc1] | 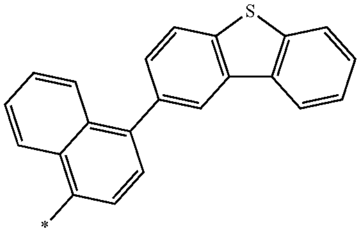 [SMILES: *c1ccc(-c2ccc3sc4ccccc4c3c2)c2ccccc12] | 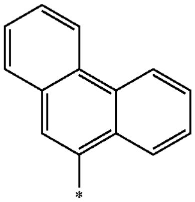 [SMILES: *c1cc2ccccc2c2ccccc12] |
| I9 | 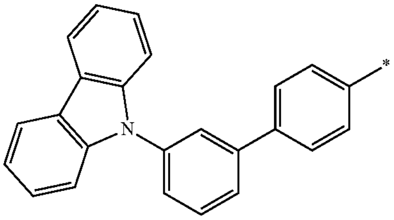 [SMILES: *c1ccc(-c2cccc(-n3c4ccccc4c4ccccc43)c2)cc1] | 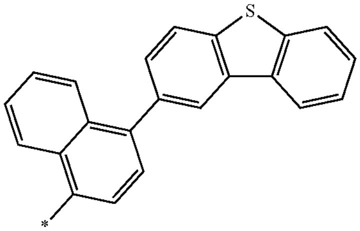 [SMILES: *c1ccc(-c2ccc3sc4ccccc4c3c2)c2ccccc12] | 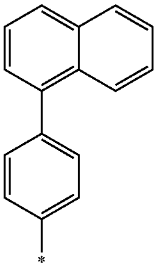 [SMILES: *c1ccc(-c2cccc3ccccc23)cc1] |
| I10 | 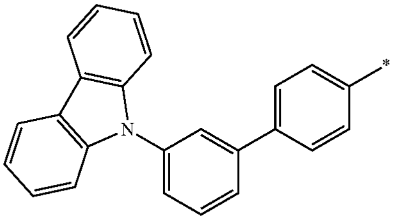 [SMILES: *c1ccc(-c2cccc(-n3c4ccccc4c4ccccc43)c2)cc1] | 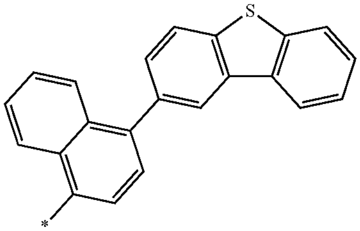 [SMILES: *c1ccc(-c2ccc3sc4ccccc4c3c2)c2ccccc12] | 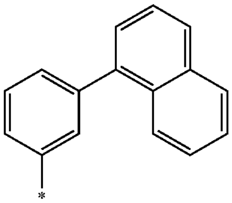 [SMILES: *c1cccc(-c2cccc3ccccc23)c1] |
| I11 | 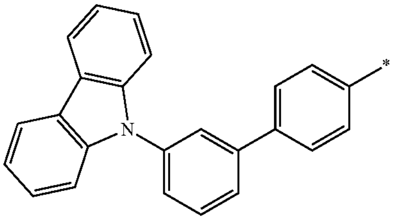 [SMILES: *c1ccc(-c2cccc(-n3c4ccccc4c4ccccc43)c2)cc1] | 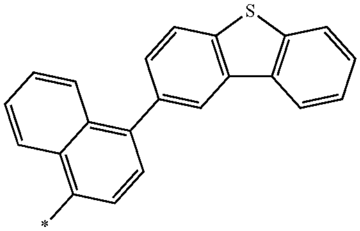 [SMILES: *c1ccc(-c2ccc3sc4ccccc4c3c2)c2ccccc12] | 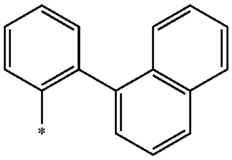 [SMILES: *c1ccccc1-c1cccc2ccccc12] |
| I12 | 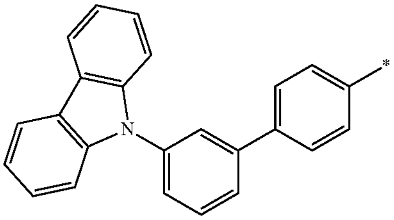 [SMILES: *c1ccc(-c2cccc(-n3c4ccccc4c4ccccc43)c2)cc1] | 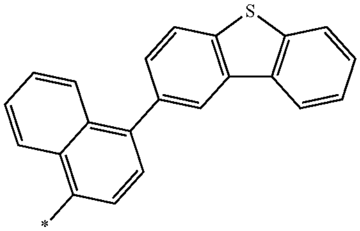 [SMILES: *c1ccc(-c2ccc3sc4ccccc4c3c2)c2ccccc12] | 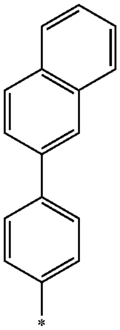 [SMILES: *c1ccc(-c2ccc3ccccc3c2)cc1] |

-continued
| Compound Group 1 | | | |
|---|---|---|---|
| Formula 1 | $Ar_1$ | $Ar_2$ | $Ar_3$ |
| I13 | 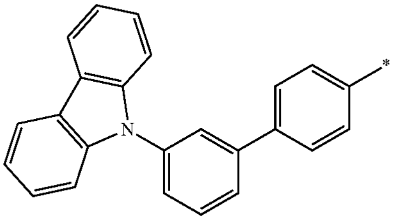 [SMILES: *c1ccc(-c2cccc(-n3c4ccccc4c4ccccc43)c2)cc1] | 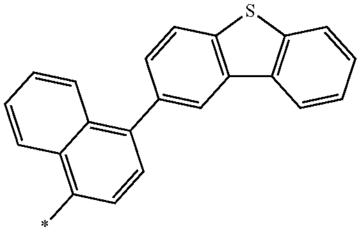 [SMILES: *c1ccc(-c2ccc3sc4ccccc4c3c2)c2ccccc12] | 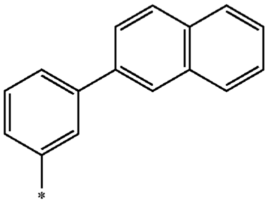 [SMILES: *c1cccc(-c2ccc3ccccc3c2)c1] |
| I14 | 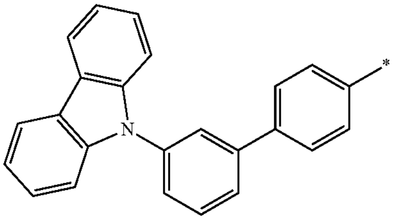 [SMILES: *c1ccc(-c2cccc(-n3c4ccccc4c4ccccc43)c2)cc1] | 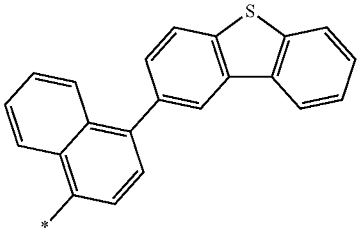 [SMILES: *c1ccc(-c2ccc3sc4ccccc4c3c2)c2ccccc12] | 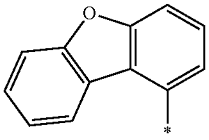 |
| I15 | 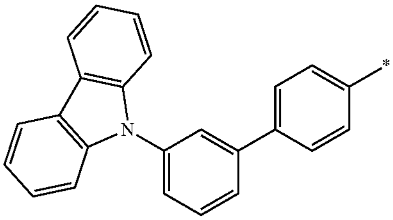 [SMILES: *c1ccc(-c2cccc(-n3c4ccccc4c4ccccc43)c2)cc1] | 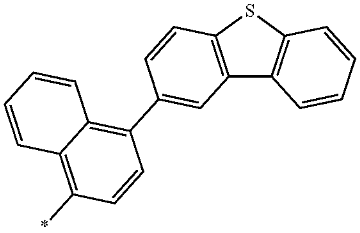 [SMILES: *c1ccc(-c2ccc3sc4ccccc4c3c2)c2ccccc12] | 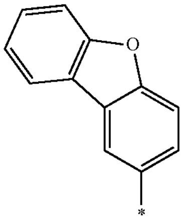 |
| I16 | 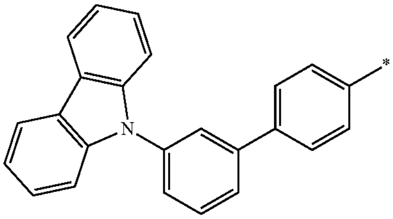 [SMILES: *c1ccc(-c2cccc(-n3c4ccccc4c4ccccc43)c2)cc1] | 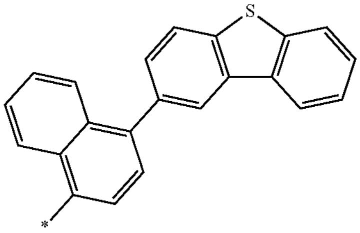 [SMILES: *c1ccc(-c2ccc3sc4ccccc4c3c2)c2ccccc12] | 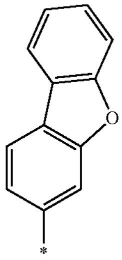 [SMILES: *c1ccc2c(c1)oc1ccccc12] |
| I17 | 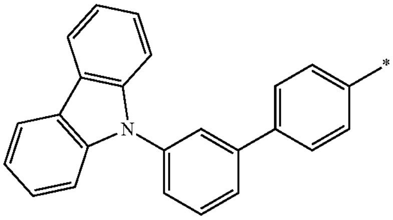 [SMILES: *c1ccc(-c2cccc(-n3c4ccccc4c4ccccc43)c2)cc1] | 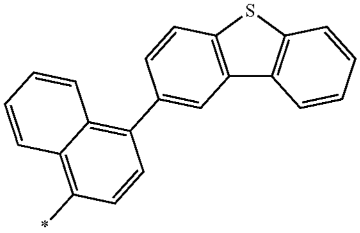 [SMILES: *c1ccc(-c2ccc3sc4ccccc4c3c2)c2ccccc12] | 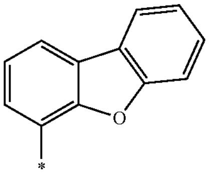 [SMILES: *c1cccc2c1oc1ccccc12] |
| I18 | 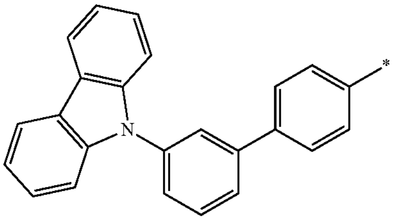 [SMILES: *c1ccc(-c2cccc(-n3c4ccccc4c4ccccc43)c2)cc1] | 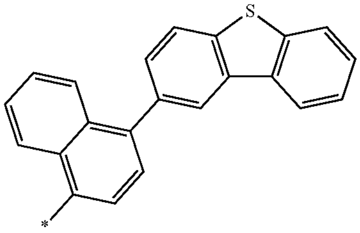 [SMILES: *c1ccc(-c2ccc3sc4ccccc4c3c2)c2ccccc12] | 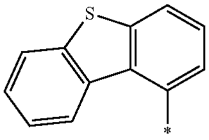 |

-continued
| Compound Group 1 | | | |
|---|---|---|---|
| Formula 1 | $Ar_1$ | $Ar_2$ | $Ar_3$ |
| I19 | 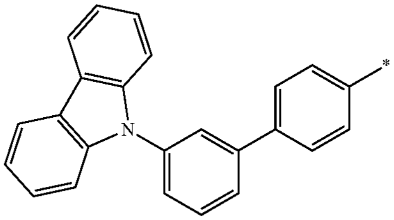 [SMILES: *c1ccc(-c2cccc(-n3c4ccccc4c4ccccc43)c2)cc1] | 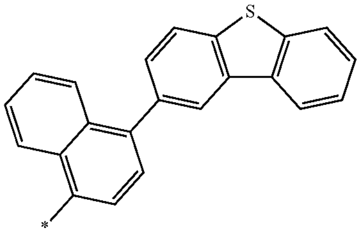 [SMILES: *c1ccc(-c2ccc3sc4ccccc4c3c2)c2ccccc12] | 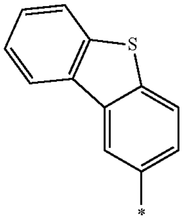 |
| I20 | 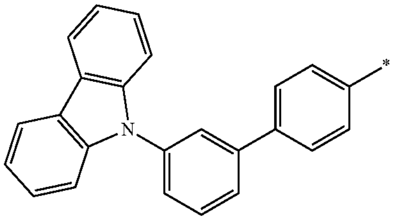 [SMILES: *c1ccc(-c2cccc(-n3c4ccccc4c4ccccc43)c2)cc1] | 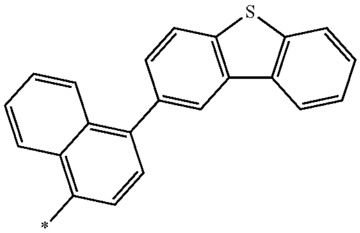 [SMILES: *c1ccc(-c2ccc3sc4ccccc4c3c2)c2ccccc12] | 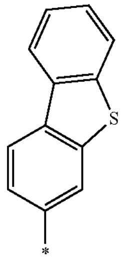 [SMILES: *c1ccc2c(c1)sc1ccccc12] |
| I21 | 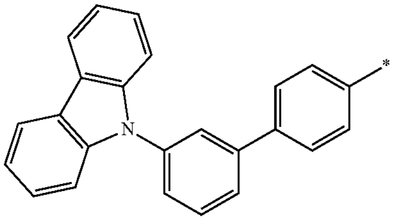 [SMILES: *c1ccc(-c2cccc(-n3c4ccccc4c4ccccc43)c2)cc1] | 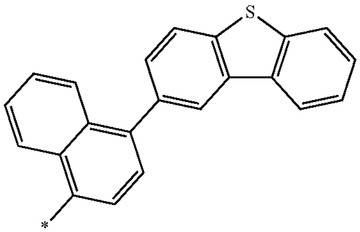 [SMILES: *c1ccc(-c2ccc3sc4ccccc4c3c2)c2ccccc12] | 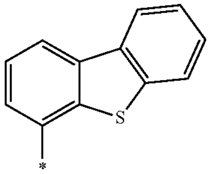 [SMILES: *c1cccc2c1sc1ccccc12] |
| I22 | 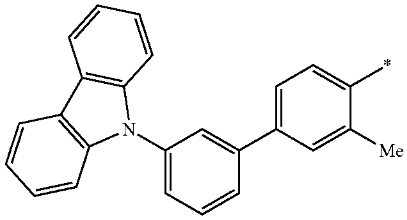 [SMILES: *c1ccc(-c2cccc(-n3c4ccccc4c4ccccc43)c2)cc1C] | 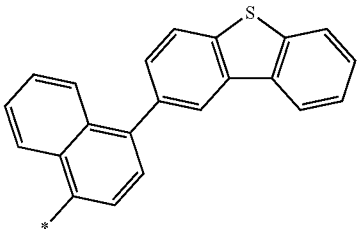 [SMILES: *c1ccc(-c2ccc3sc4ccccc4c3c2)c2ccccc12] | 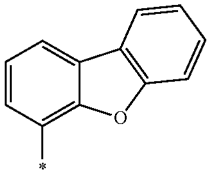 [SMILES: *c1cccc2c1oc1ccccc12] |
| I23 | 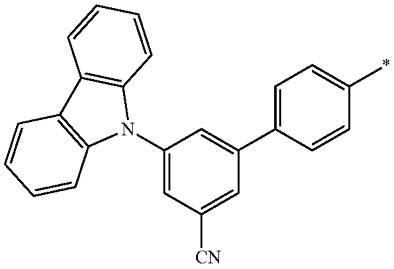 [SMILES: *c1ccc(-c2cc(C#N)cc(-n3c4ccccc4c4ccccc43)c2)cc1] | 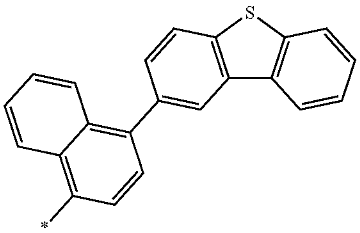 [SMILES: *c1ccc(-c2ccc3sc4ccccc4c3c2)c2ccccc12] | 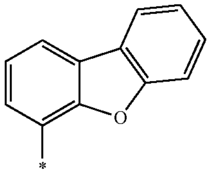 [SMILES: *c1cccc2c1oc1ccccc12] |

-continued
Compound Group 1
| Formula 1 | $Ar_1$ | $Ar_2$ | $Ar_3$ |
| --- | --- | --- | --- |
| J1 | 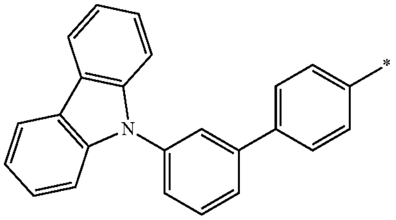 [SMILES: *c1ccc(-c2cccc(-n3c4ccccc4c4ccccc43)c2)cc1] | 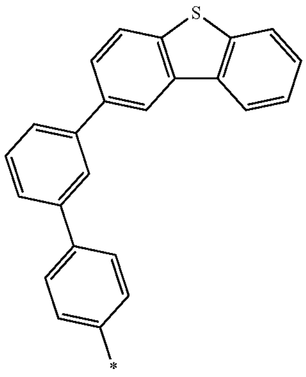 [SMILES: *c1ccc(-c2cccc(-c3ccc4sc5ccccc5c4c3)c2)cc1] | 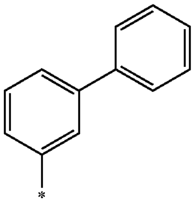 [SMILES: *c1cccc(-c2ccccc2)c1] |
| J2 | 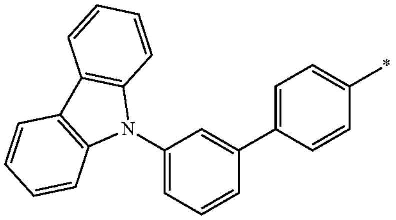 [SMILES: *c1ccc(-c2cccc(-n3c4ccccc4c4ccccc43)c2)cc1] | 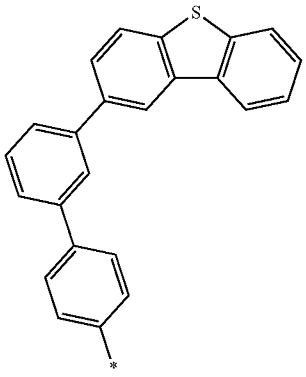 [SMILES: *c1ccc(-c2cccc(-c3ccc4sc5ccccc5c4c3)c2)cc1] | 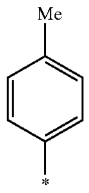 [SMILES: *c1ccc(C)cc1] |
| J3 | 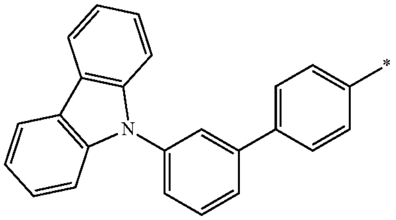 [SMILES: *c1ccc(-c2cccc(-n3c4ccccc4c4ccccc43)c2)cc1] | 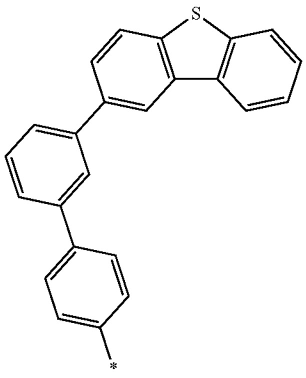 [SMILES: *c1ccc(-c2cccc(-c3ccc4sc5ccccc5c4c3)c2)cc1] | 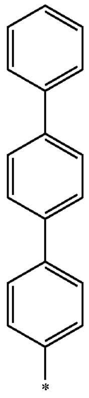 [SMILES: *c1ccc(-c2ccc(-c3ccccc3)cc2)cc1] |
| J4 | 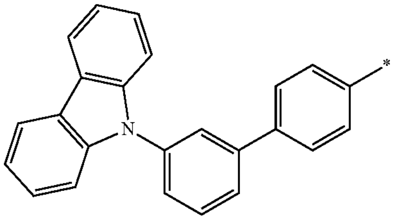 [SMILES: *c1ccc(-c2cccc(-n3c4ccccc4c4ccccc43)c2)cc1] | 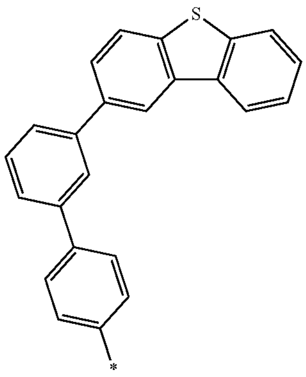 [SMILES: *c1ccc(-c2cccc(-c3ccc4sc5ccccc5c4c3)c2)cc1] | 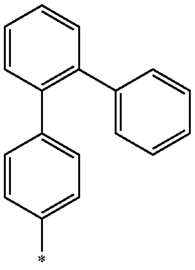 [SMILES: *c1ccc(-c2ccccc2-c2ccccc2)cc1] |

-continued
| Compound Group 1 | | | |
|---|---|---|---|
| Formula 1 | $Ar_1$ | $Ar_2$ | $Ar_3$ |
| J5 | 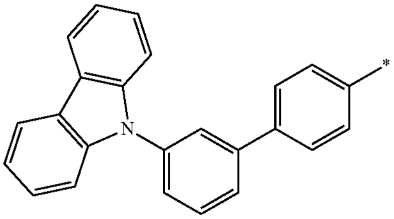 [SMILES: *c1ccc(-c2cccc(-n3c4ccccc4c4ccccc43)c2)cc1] | 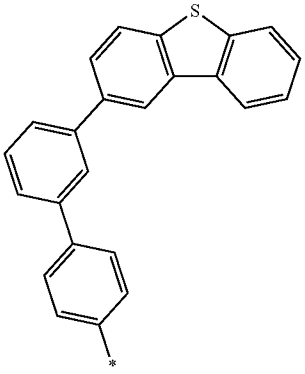 [SMILES: *c1ccc(-c2cccc(-c3ccc4sc5ccccc5c4c3)c2)cc1] | 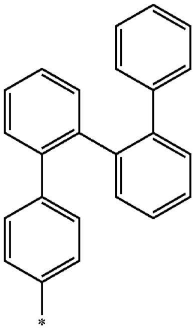 [SMILES: *c1ccc(-c2ccccc2-c2ccccc2-c2ccccc2)cc1] |
| J6 | 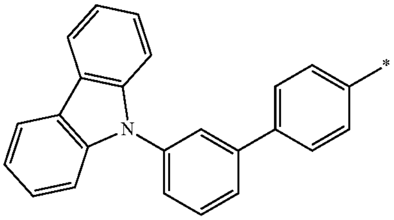 [SMILES: *c1ccc(-c2cccc(-n3c4ccccc4c4ccccc43)c2)cc1] | 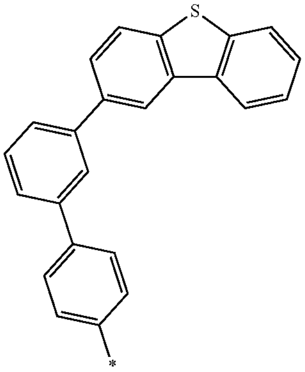 [SMILES: *c1ccc(-c2cccc(-c3ccc4sc5ccccc5c4c3)c2)cc1] | 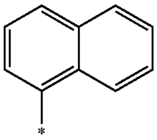 [SMILES: *c1cccc2ccccc12] |
| J7 | 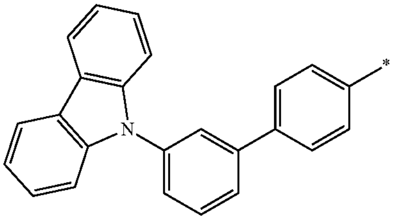 [SMILES: *c1ccc(-c2cccc(-n3c4ccccc4c4ccccc43)c2)cc1] | 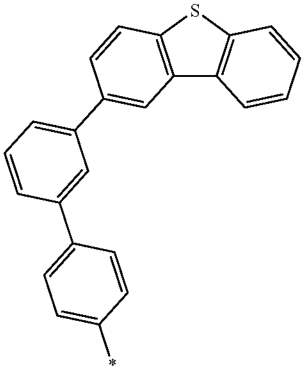 [SMILES: *c1ccc(-c2cccc(-c3ccc4sc5ccccc5c4c3)c2)cc1] | 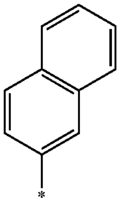 [SMILES: *c1ccc2ccccc2c1] |
| J8 | 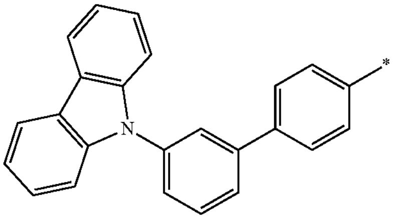 [SMILES: *c1ccc(-c2cccc(-n3c4ccccc4c4ccccc43)c2)cc1] | 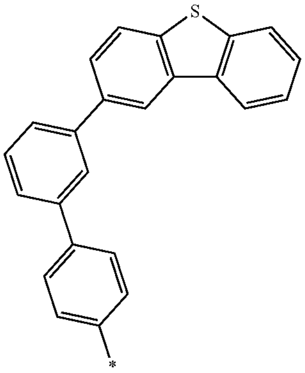 [SMILES: *c1ccc(-c2cccc(-c3ccc4sc5ccccc5c4c3)c2)cc1] | 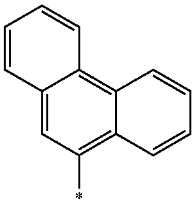 [SMILES: *c1cc2ccccc2c2ccccc12] |

-continued
| Compound Group 1 | | | |
|---|---|---|---|
| Formula 1 | $Ar_1$ | $Ar_2$ | $Ar_3$ |
| J9 | 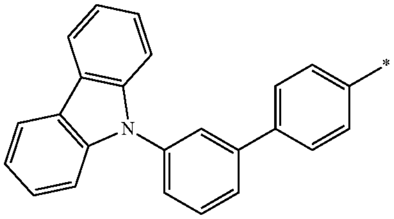 [SMILES: *c1ccc(-c2cccc(-n3c4ccccc4c4ccccc43)c2)cc1] | 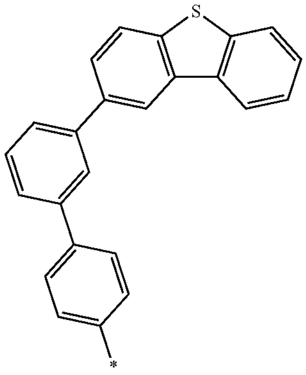 [SMILES: *c1ccc(-c2cccc(-c3ccc4sc5ccccc5c4c3)c2)cc1] | 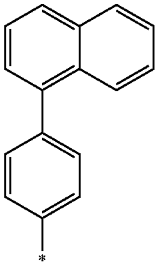 [SMILES: *c1ccc(-c2cccc3ccccc23)cc1] |
| J10 | 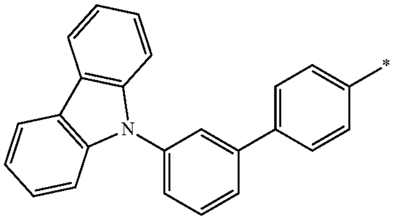 [SMILES: *c1ccc(-c2cccc(-n3c4ccccc4c4ccccc43)c2)cc1] | 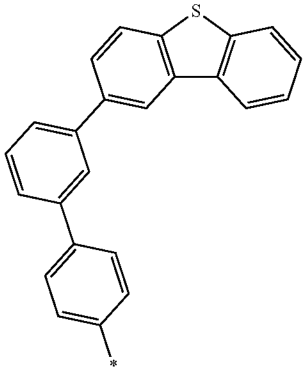 [SMILES: *c1ccc(-c2cccc(-c3ccc4sc5ccccc5c4c3)c2)cc1] | 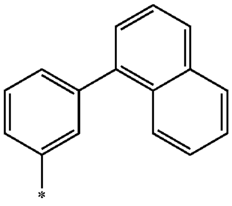 [SMILES: *c1cccc(-c2cccc3ccccc23)c1] |
| J11 | 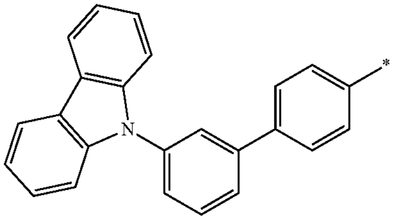 [SMILES: *c1ccc(-c2cccc(-n3c4ccccc4c4ccccc43)c2)cc1] | 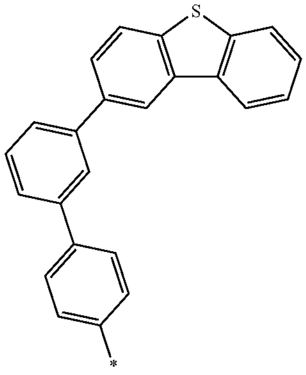 [SMILES: *c1ccc(-c2cccc(-c3ccc4sc5ccccc5c4c3)c2)cc1] | 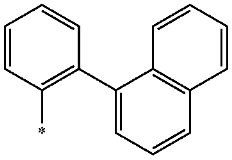 [SMILES: *c1ccccc1-c1cccc2ccccc12] |
| J12 | 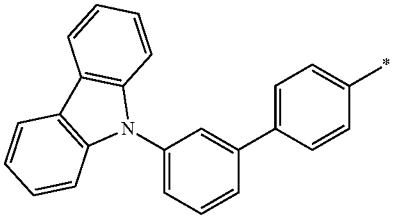 [SMILES: *c1ccc(-c2cccc(-n3c4ccccc4c4ccccc43)c2)cc1] | 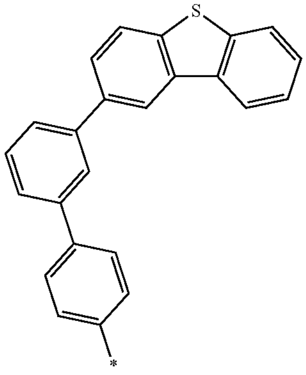 [SMILES: *c1ccc(-c2cccc(-c3ccc4sc5ccccc5c4c3)c2)cc1] | 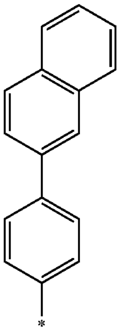 [SMILES: *c1ccc(-c2ccc3ccccc3c2)cc1] |

-continued
| Compound Group 1 | | | |
|---|---|---|---|
| Formula 1 | $Ar_1$ | $Ar_2$ | $Ar_3$ |
| J13 | 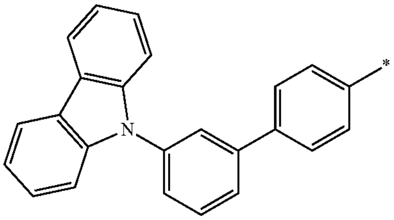 [SMILES: *c1ccc(-c2cccc(-n3c4ccccc4c4ccccc43)c2)cc1] | 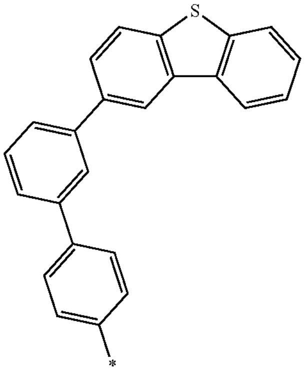 [SMILES: *c1ccc(-c2cccc(-c3ccc4sc5ccccc5c4c3)c2)cc1] | 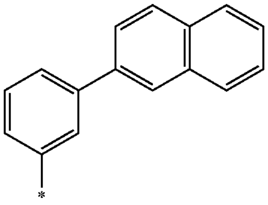 [SMILES: *c1cccc(-c2ccc3ccccc3c2)c1] |
| J14 | 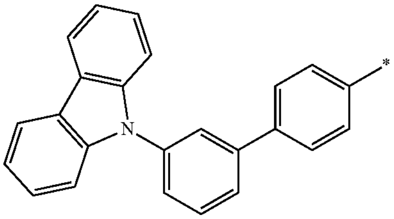 [SMILES: *c1ccc(-c2cccc(-n3c4ccccc4c4ccccc43)c2)cc1] | 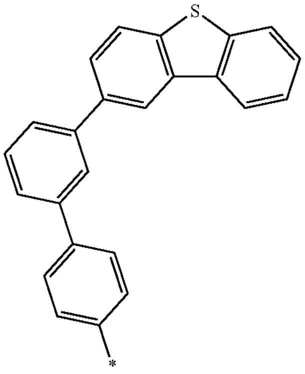 [SMILES: *c1ccc(-c2cccc(-c3ccc4sc5ccccc5c4c3)c2)cc1] | 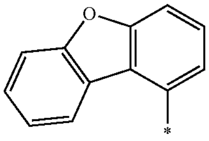 |
| J15 | 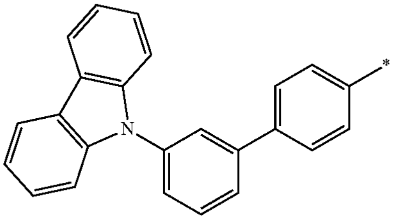 [SMILES: *c1ccc(-c2cccc(-n3c4ccccc4c4ccccc43)c2)cc1] | 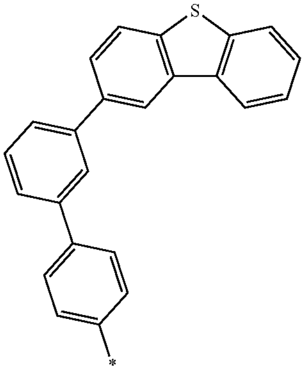 [SMILES: *c1ccc(-c2cccc(-c3ccc4sc5ccccc5c4c3)c2)cc1] | 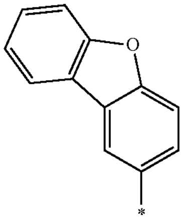 [SMILES: *c1ccc2oc3ccccc3c2c1] |
| J16 | 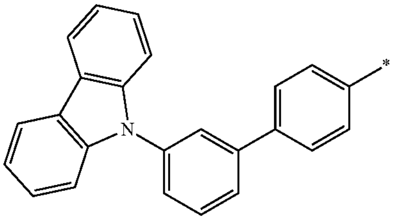 [SMILES: *c1ccc(-c2cccc(-n3c4ccccc4c4ccccc43)c2)cc1] | 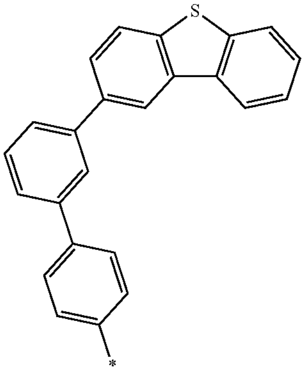 [SMILES: *c1ccc(-c2cccc(-c3ccc4sc5ccccc5c4c3)c2)cc1] | 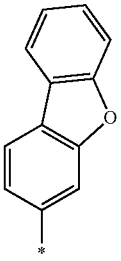 [SMILES: *c1ccc2c(c1)oc1ccccc12] |

-continued
| Compound Group 1 | | | |
|---|---|---|---|
| Formula 1 | $Ar_1$ | $Ar_2$ | $Ar_3$ |
| J17 | 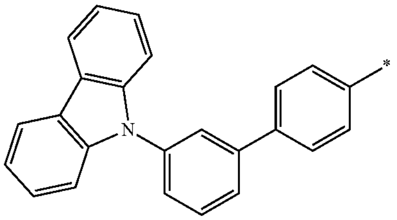 [SMILES: *c1ccc(-c2cccc(-n3c4ccccc4c4ccccc43)c2)cc1] | 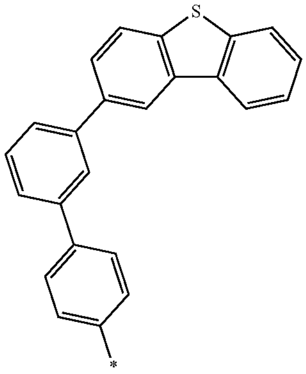 [SMILES: *c1ccc(-c2cccc(-c3ccc4sc5ccccc5c4c3)c2)cc1] | 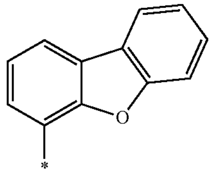 [SMILES: *c1cccc2c1oc1ccccc12] |
| J18 | 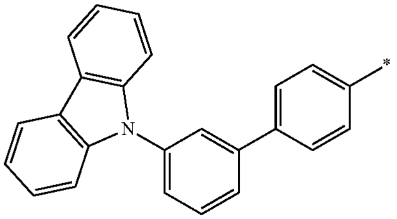 [SMILES: *c1ccc(-c2cccc(-n3c4ccccc4c4ccccc43)c2)cc1] | 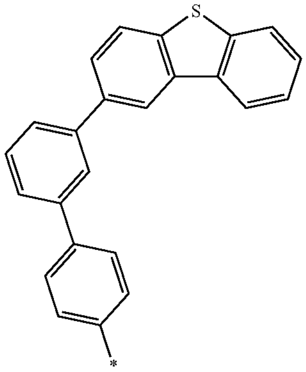 [SMILES: *c1ccc(-c2cccc(-c3ccc4sc5ccccc5c4c3)c2)cc1] | 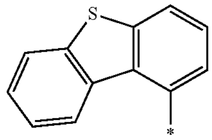 |
| J19 | 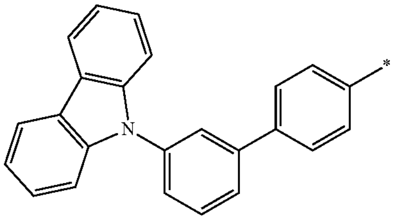 [SMILES: *c1ccc(-c2cccc(-n3c4ccccc4c4ccccc43)c2)cc1] | 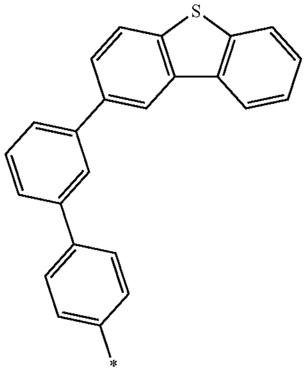 [SMILES: *c1ccc(-c2cccc(-c3ccc4sc5ccccc5c4c3)c2)cc1] | 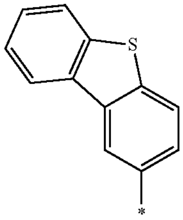 [SMILES: *c1ccc2sc3ccccc3c2c1] |
| J20 | 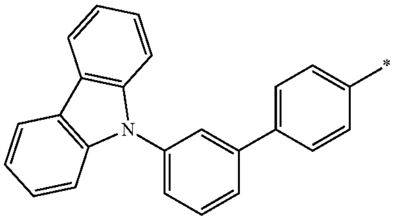 [SMILES: *c1ccc(-c2cccc(-n3c4ccccc4c4ccccc43)c2)cc1] | 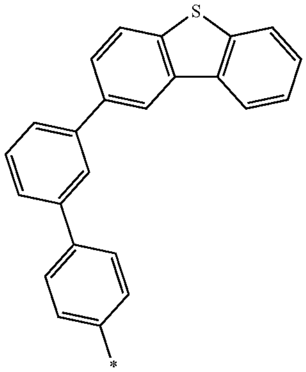 [SMILES: *c1ccc(-c2cccc(-c3ccc4sc5ccccc5c4c3)c2)cc1] | 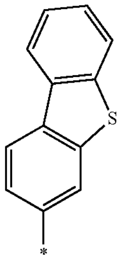 [SMILES: *c1ccc2c(c1)sc1ccccc12] |

-continued
| Compound Group 1 | | | |
|---|---|---|---|
| Formula 1 | $Ar_1$ | $Ar_2$ | $Ar_3$ |
| J21 | 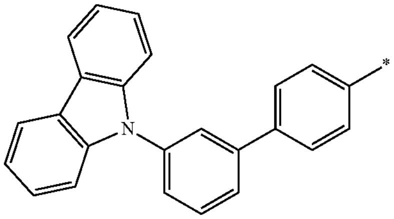 [SMILES: *c1ccc(-c2cccc(-n3c4ccccc4c4ccccc43)c2)cc1] | 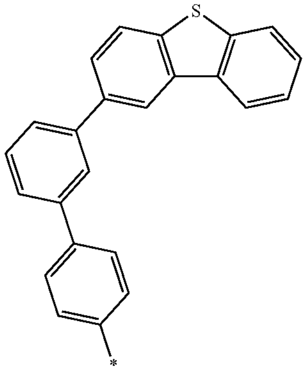 [SMILES: *c1ccc(-c2cccc(-c3ccc4sc5ccccc5c4c3)c2)cc1] | 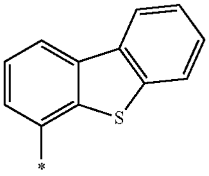 [SMILES: *c1cccc2c1sc1ccccc12] |
| J22 | 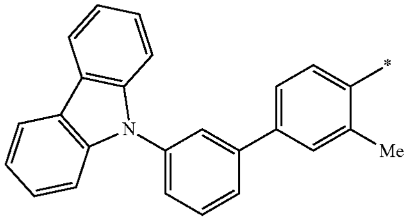 [SMILES: *c1ccc(-c2cccc(-n3c4ccccc4c4ccccc43)c2)cc1C] | 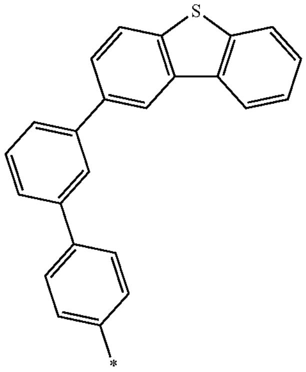 [SMILES: *c1ccc(-c2cccc(-c3ccc4sc5ccccc5c4c3)c2)cc1] | 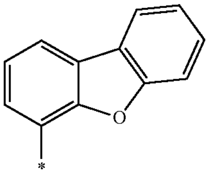 [SMILES: *c1cccc2c1oc1ccccc12] |
| J23 | 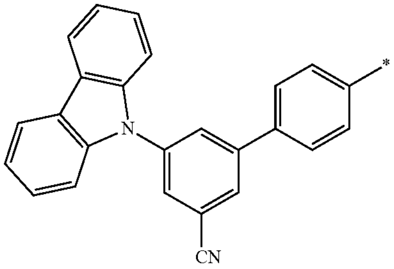 [SMILES: *c1ccc(-c2cc(C#N)cc(-n3c4ccccc4c4ccccc43)c2)cc1] | 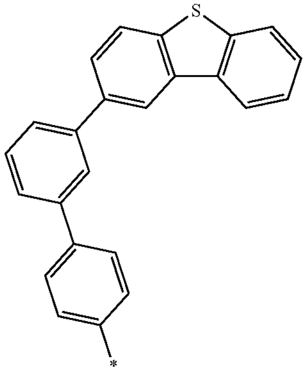 [SMILES: *c1ccc(-c2cccc(-c3ccc4sc5ccccc5c4c3)c2)cc1] | 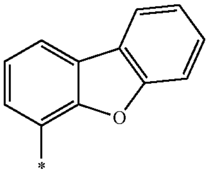 [SMILES: *c1cccc2c1oc1ccccc12] |
| K1 | 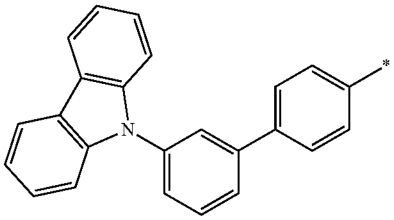 [SMILES: *c1ccc(-c2cccc(-n3c4ccccc4c4ccccc43)c2)cc1] | 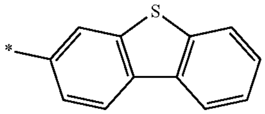 [SMILES: *c1ccc2c(c1)sc1ccccc12] | 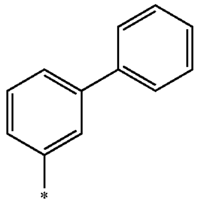 [SMILES: *c1cccc(-c2ccccc2)c1] |

-continued
Compound Group 1
| Formula 1 | $Ar_1$ | $Ar_2$ | $Ar_3$ |
|---|---|---|---|
| K2 | 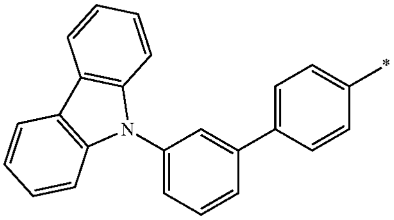 [SMILES: *c1ccc(-c2cccc(-n3c4ccccc4c4ccccc43)c2)cc1] | 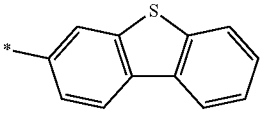 [SMILES: *c1ccc2c(c1)sc1ccccc12] | 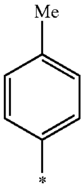 [SMILES: *c1ccc(C)cc1] |
| K3 | 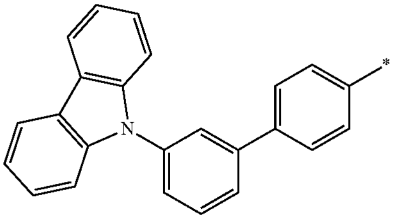 [SMILES: *c1ccc(-c2cccc(-n3c4ccccc4c4ccccc43)c2)cc1] | 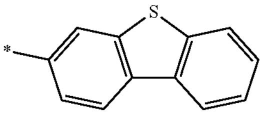 [SMILES: *c1ccc2c(c1)sc1ccccc12] | 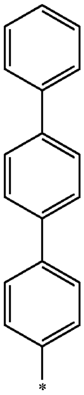 [SMILES: *c1ccc(-c2ccc(-c3ccccc3)cc2)cc1] |
| K4 | 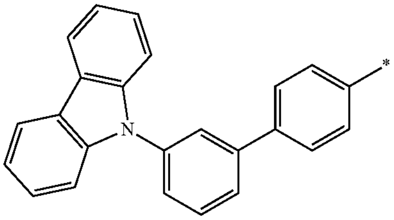 [SMILES: *c1ccc(-c2cccc(-n3c4ccccc4c4ccccc43)c2)cc1] | 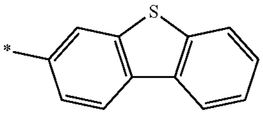 [SMILES: *c1ccc2c(c1)sc1ccccc12] | 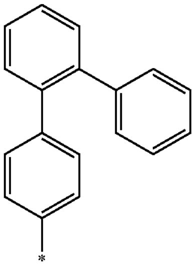 [SMILES: *c1ccc(-c2ccccc2-c2ccccc2)cc1] |
| K5 | 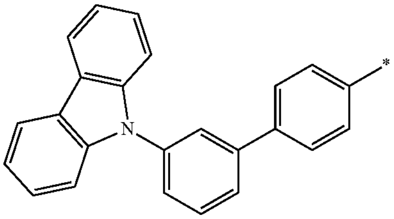 [SMILES: *c1ccc(-c2cccc(-n3c4ccccc4c4ccccc43)c2)cc1] | 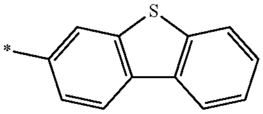 [SMILES: *c1ccc2c(c1)sc1ccccc12] | 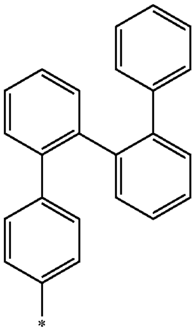 [SMILES: *c1ccc(-c2ccccc2-c2ccccc2-c2ccccc2)cc1] |
| K6 | 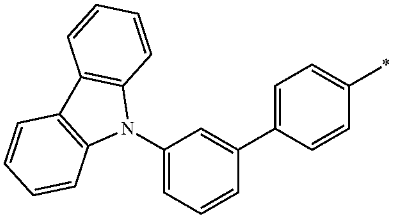 [SMILES: *c1ccc(-c2cccc(-n3c4ccccc4c4ccccc43)c2)cc1] | 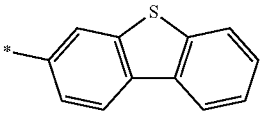 [SMILES: *c1ccc2c(c1)sc1ccccc12] | 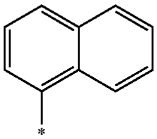 [SMILES: *c1cccc2ccccc12] |

-continued
| Compound Group 1 | | | |
|---|---|---|---|
| Formula 1 | $Ar_1$ | $Ar_2$ | $Ar_3$ |
| K7 | 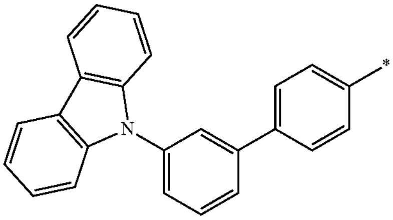 [SMILES: *c1ccc(-c2cccc(-n3c4ccccc4c4ccccc43)c2)cc1] | 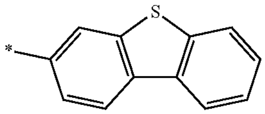 [SMILES: *c1ccc2c(c1)sc1ccccc12] | 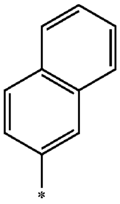 [SMILES: *c1ccc2ccccc2c1] |
| K8 | 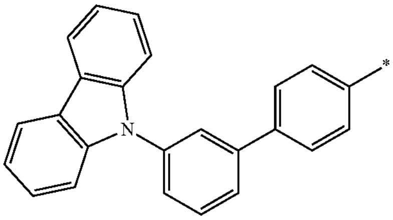 [SMILES: *c1ccc(-c2cccc(-n3c4ccccc4c4ccccc43)c2)cc1] | 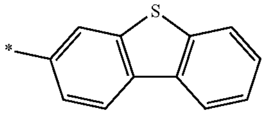 [SMILES: *c1ccc2c(c1)sc1ccccc12] | 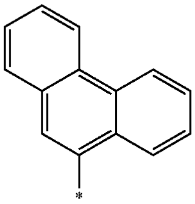 [SMILES: *c1cc2ccccc2c2ccccc12] |
| K9 | 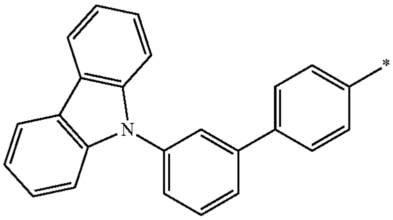 [SMILES: *c1ccc(-c2cccc(-n3c4ccccc4c4ccccc43)c2)cc1] | 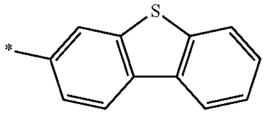 [SMILES: *c1ccc2c(c1)sc1ccccc12] | 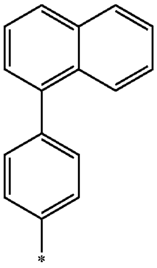 [SMILES: *c1ccc(-c2cccc3ccccc23)cc1] |
| K10 | 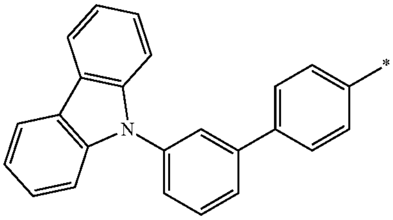 [SMILES: *c1ccc(-c2cccc(-n3c4ccccc4c4ccccc43)c2)cc1] | 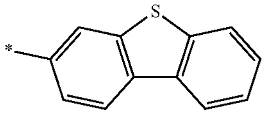 [SMILES: *c1ccc2c(c1)sc1ccccc12] | 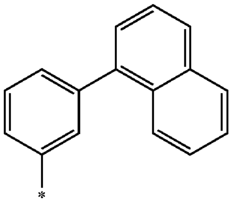 [SMILES: *c1cccc(-c2cccc3ccccc23)c1] |
| K11 | 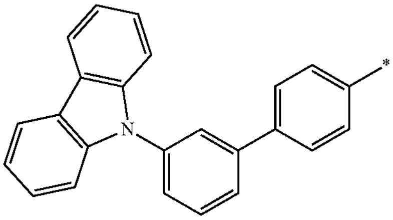 [SMILES: *c1ccc(-c2cccc(-n3c4ccccc4c4ccccc43)c2)cc1] | 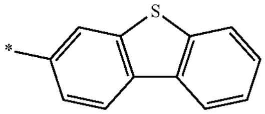 [SMILES: *c1ccc2c(c1)sc1ccccc12] | 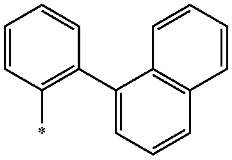 [SMILES: *c1ccccc1-c1cccc2ccccc12] |
| K12 | 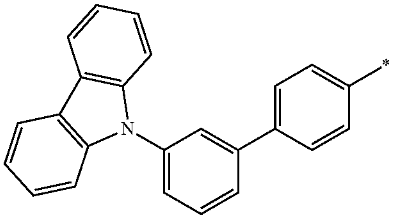 [SMILES: *c1ccc(-c2cccc(-n3c4ccccc4c4ccccc43)c2)cc1] | 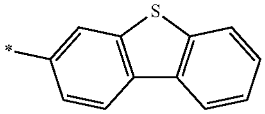 [SMILES: *c1ccc2c(c1)sc1ccccc12] | 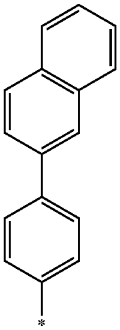 [SMILES: *c1ccc(-c2ccc3ccccc3c2)cc1] |

-continued
| Compound Group 1 | | | |
|---|---|---|---|
| Formula 1 | $Ar_1$ | $Ar_2$ | $Ar_3$ |
| K13 | 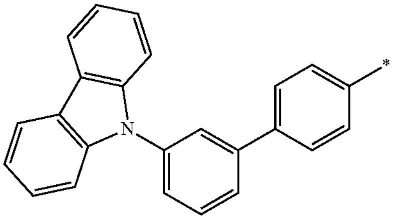 [SMILES: *c1ccc(-c2cccc(-n3c4ccccc4c4ccccc43)c2)cc1] | 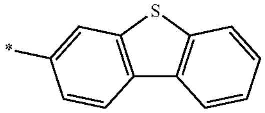 [SMILES: *c1ccc2c(c1)sc1ccccc12] | 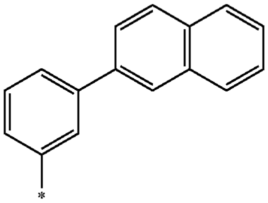 [SMILES: *c1cccc(-c2ccc3ccccc3c2)c1] |
| K14 | 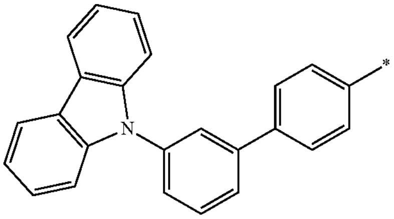 [SMILES: *c1ccc(-c2cccc(-n3c4ccccc4c4ccccc43)c2)cc1] | 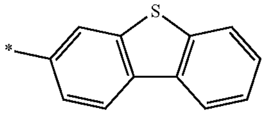 [SMILES: *c1ccc2c(c1)sc1ccccc12] | 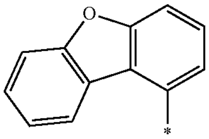 |
| K15 | 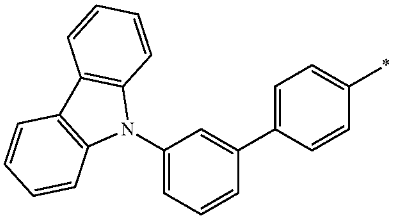 [SMILES: *c1ccc(-c2cccc(-n3c4ccccc4c4ccccc43)c2)cc1] | 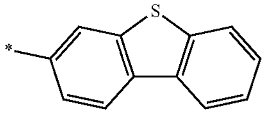 [SMILES: *c1ccc2c(c1)sc1ccccc12] | 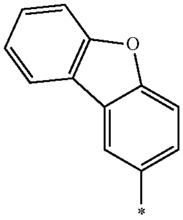 [SMILES: *c1ccc2oc3ccccc3c2c1] |
| K16 | 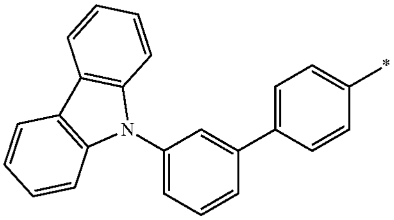 [SMILES: *c1ccc(-c2cccc(-n3c4ccccc4c4ccccc43)c2)cc1] | 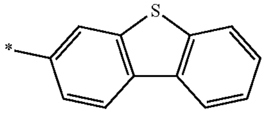 [SMILES: *c1ccc2c(c1)sc1ccccc12] | 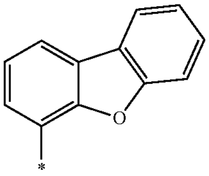 |
| K17 | 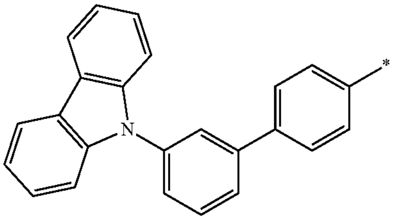 [SMILES: *c1ccc(-c2cccc(-n3c4ccccc4c4ccccc43)c2)cc1] | 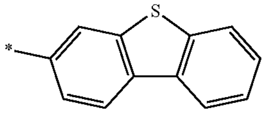 [SMILES: *c1ccc2c(c1)sc1ccccc12] | 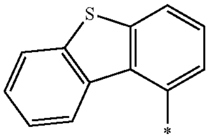 |
| K18 | 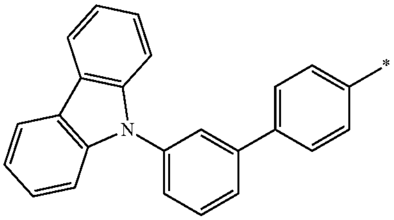 [SMILES: *c1ccc(-c2cccc(-n3c4ccccc4c4ccccc43)c2)cc1] | 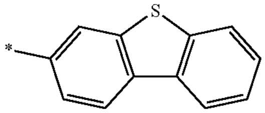 [SMILES: *c1ccc2c(c1)sc1ccccc12] | 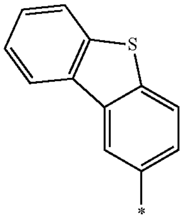 [SMILES: *c1ccc2sc3ccccc3c2c1] |

-continued
| Compound Group 1 | | | |
|---|---|---|---|
| Formula 1 | $Ar_1$ | $Ar_2$ | $Ar_3$ |
| K19 | 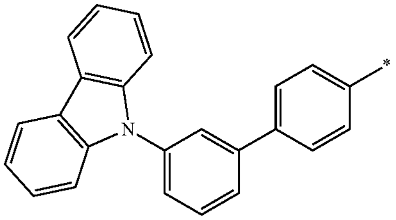 [SMILES: *c1ccc(-c2cccc(-n3c4ccccc4c4ccccc43)c2)cc1] | 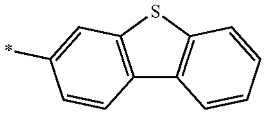 [SMILES: *c1ccc2c(c1)sc1ccccc12] | 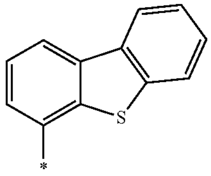 |
| K20 | 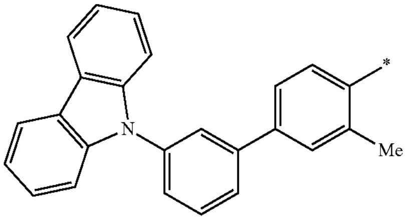 [SMILES: *c1ccc(-c2cccc(-n3c4ccccc4c4ccccc43)c2)cc1C] | 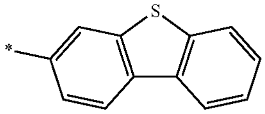 [SMILES: *c1ccc2c(c1)sc1ccccc12] | 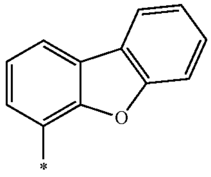 |
| K21 | 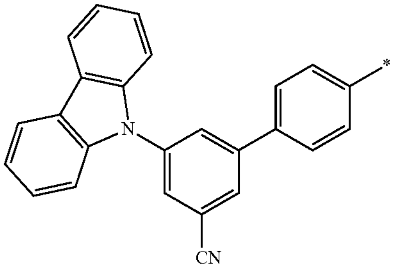 [SMILES: *c1ccc(-c2cc(C#N)cc(-n3c4ccccc4c4ccccc43)c2)cc1] | 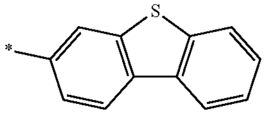 [SMILES: *c1ccc2c(c1)sc1ccccc12] | 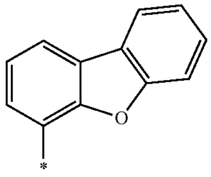 |
| M1 | 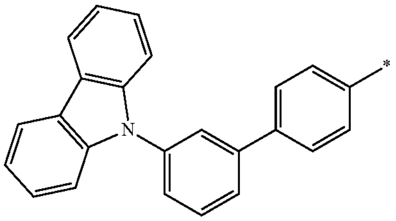 [SMILES: *c1ccc(-c2cccc(-n3c4ccccc4c4ccccc43)c2)cc1] | 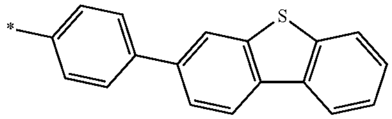 [SMILES: *c1ccc(-c2ccc3c(c2)sc2ccccc23)cc1] | 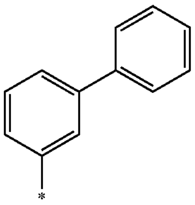 [SMILES: *c1cccc(-c2ccccc2)c1] |
| M2 | 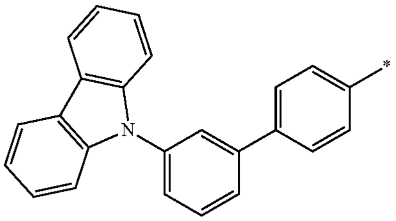 [SMILES: *c1ccc(-c2cccc(-n3c4ccccc4c4ccccc43)c2)cc1] | 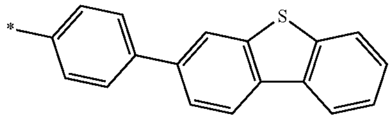 [SMILES: *c1ccc(-c2ccc3c(c2)sc2ccccc23)cc1] | 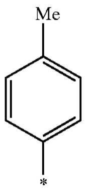 [SMILES: *c1ccc(C)cc1] |

-continued
| Compound Group 1 | | | |
|---|---|---|---|
| Formula 1 | $Ar_1$ | $Ar_2$ | $Ar_3$ |
| M3 | 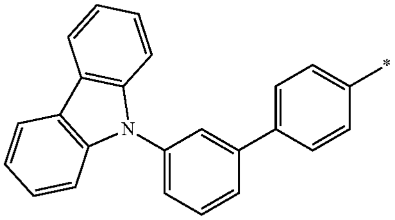 [SMILES: *c1ccc(-c2cccc(-n3c4ccccc4c4ccccc43)c2)cc1] | 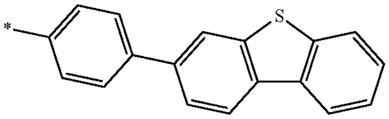 [SMILES: *c1ccc(-c2ccc3c(c2)sc2ccccc23)cc1] | 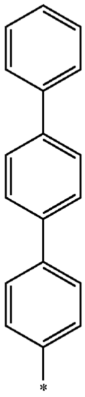 [SMILES: *c1ccc(-c2ccc(-c3ccccc3)cc2)cc1] |
| M4 | 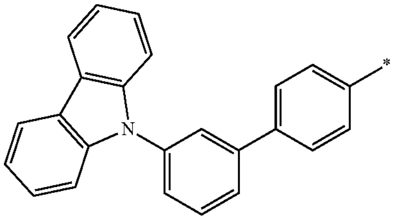 [SMILES: *c1ccc(-c2cccc(-n3c4ccccc4c4ccccc43)c2)cc1] | 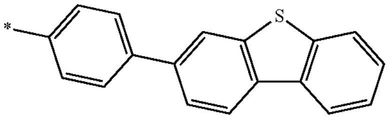 [SMILES: *c1ccc(-c2ccc3c(c2)sc2ccccc23)cc1] | 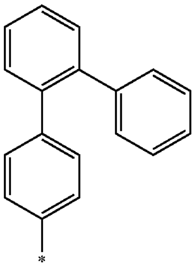 [SMILES: *c1ccc(-c2ccccc2-c2ccccc2)cc1] |
| M5 | 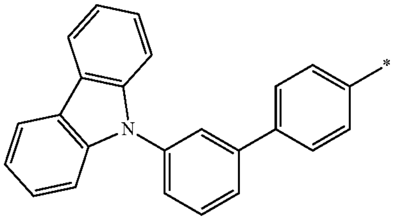 [SMILES: *c1ccc(-c2cccc(-n3c4ccccc4c4ccccc43)c2)cc1] | 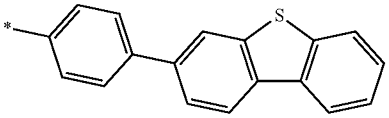 [SMILES: *c1ccc(-c2ccc3c(c2)sc2ccccc23)cc1] | 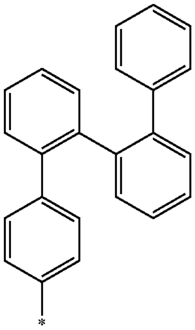 [SMILES: *c1ccc(-c2ccccc2-c2ccccc2-c2ccccc2)cc1] |
| M6 | 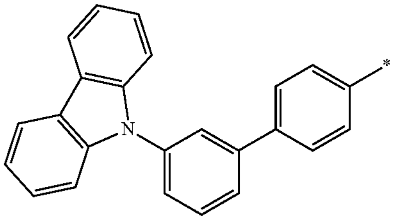 [SMILES: *c1ccc(-c2cccc(-n3c4ccccc4c4ccccc43)c2)cc1] | 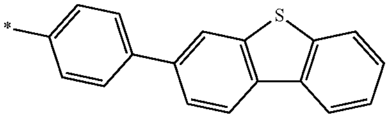 [SMILES: *c1ccc(-c2ccc3c(c2)sc2ccccc23)cc1] | 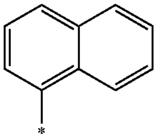 [SMILES: *c1cccc2ccccc12] |
| M7 | 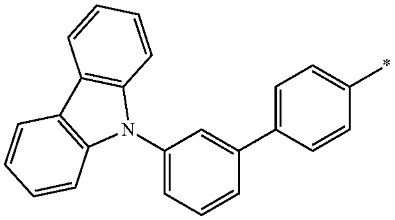 [SMILES: *c1ccc(-c2cccc(-n3c4ccccc4c4ccccc43)c2)cc1] | 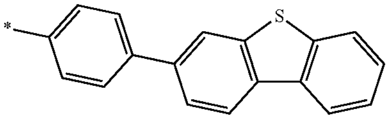 [SMILES: *c1ccc(-c2ccc3c(c2)sc2ccccc23)cc1] | 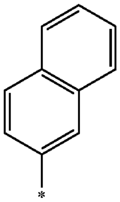 [SMILES: *c1ccc2ccccc2c1] |

-continued
| Compound Group 1 | | | |
|---|---|---|---|
| Formula 1 | $Ar_1$ | $Ar_2$ | $Ar_3$ |
| M8 | 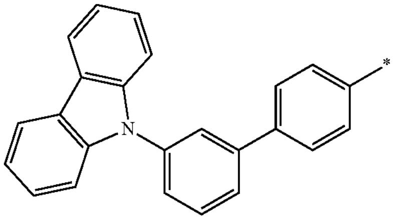 [SMILES: *c1ccc(-c2cccc(-n3c4ccccc4c4ccccc43)c2)cc1] | 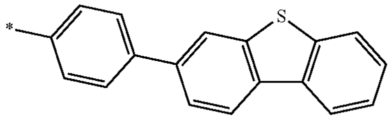 [SMILES: *c1ccc(-c2ccc3c(c2)sc2ccccc23)cc1] | 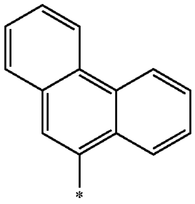 [SMILES: *c1cc2ccccc2c2ccccc12] |
| M9 | 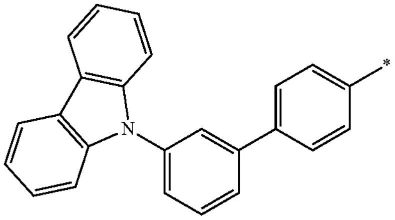 [SMILES: *c1ccc(-c2cccc(-n3c4ccccc4c4ccccc43)c2)cc1] | 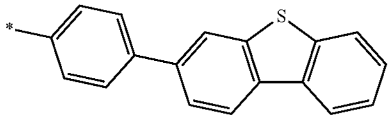 [SMILES: *c1ccc(-c2ccc3c(c2)sc2ccccc23)cc1] | 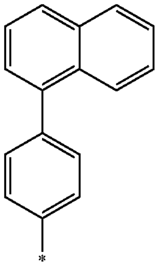 [SMILES: *c1ccc(-c2cccc3ccccc23)cc1] |
| M10 | 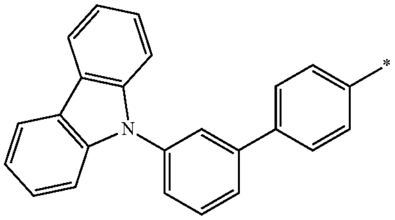 [SMILES: *c1ccc(-c2cccc(-n3c4ccccc4c4ccccc43)c2)cc1] | 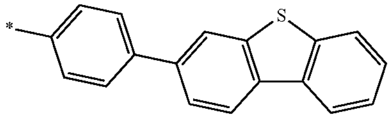 [SMILES: *c1ccc(-c2ccc3c(c2)sc2ccccc23)cc1] | 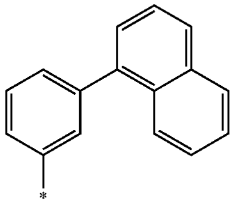 [SMILES: *c1cccc(-c2cccc3ccccc23)c1] |
| M11 | 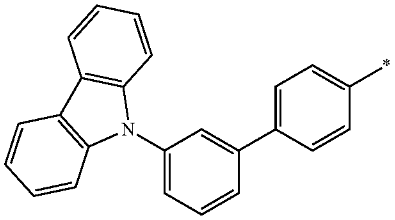 [SMILES: *c1ccc(-c2cccc(-n3c4ccccc4c4ccccc43)c2)cc1] | 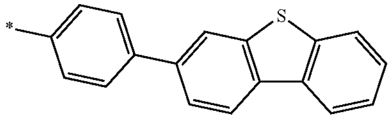 [SMILES: *c1ccc(-c2ccc3c(c2)sc2ccccc23)cc1] | 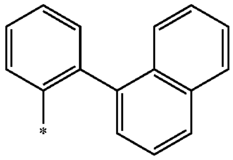 [SMILES: *c1ccccc1-c1cccc2ccccc12] |
| M12 | 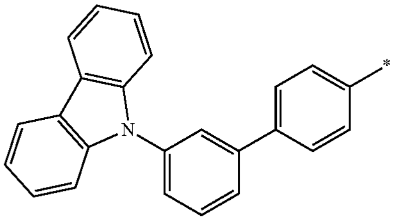 [SMILES: *c1ccc(-c2cccc(-n3c4ccccc4c4ccccc43)c2)cc1] | 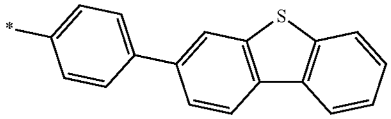 [SMILES: *c1ccc(-c2ccc3c(c2)sc2ccccc23)cc1] | 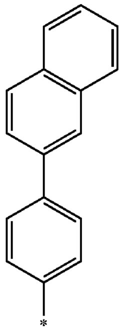 [SMILES: *c1ccc(-c2ccc3ccccc3c2)cc1] |

-continued
Compound Group 1
| Formula 1 | $Ar_1$ | $Ar_2$ | $Ar_3$ |
|---|---|---|---|
| M13 | 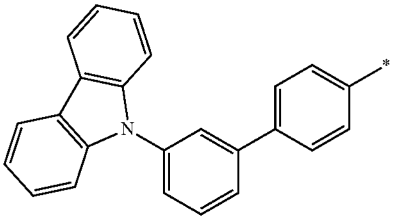 [SMILES: *c1ccc(-c2cccc(-n3c4ccccc4c4ccccc43)c2)cc1] | 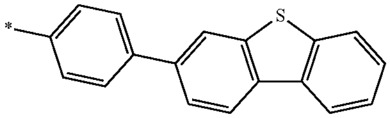 [SMILES: *c1ccc(-c2ccc3c(c2)sc2ccccc23)cc1] | 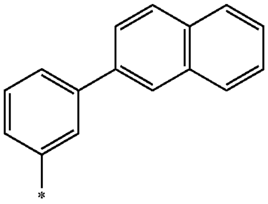 [SMILES: *c1cccc(-c2ccc3ccccc3c2)c1] |
| M14 | 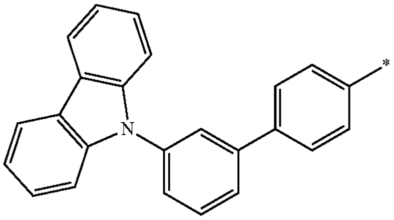 [SMILES: *c1ccc(-c2cccc(-n3c4ccccc4c4ccccc43)c2)cc1] | 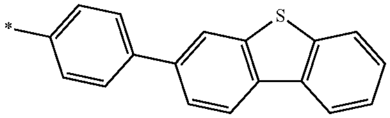 [SMILES: *c1ccc(-c2ccc3c(c2)sc2ccccc23)cc1] | 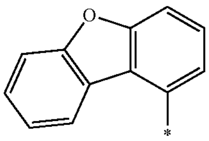 |
| M15 | 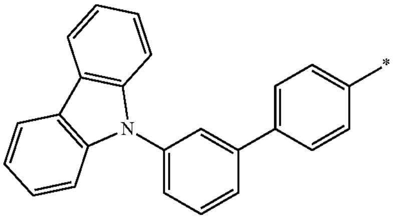 [SMILES: *c1ccc(-c2cccc(-n3c4ccccc4c4ccccc43)c2)cc1] | 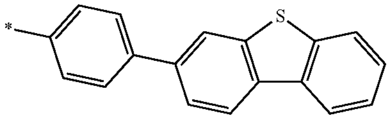 [SMILES: *c1ccc(-c2ccc3c(c2)sc2ccccc23)cc1] | 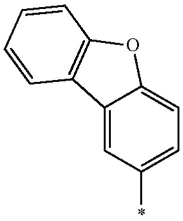 |
| M16 | 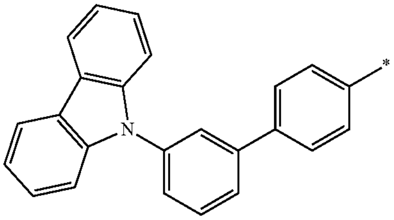 [SMILES: *c1ccc(-c2cccc(-n3c4ccccc4c4ccccc43)c2)cc1] | 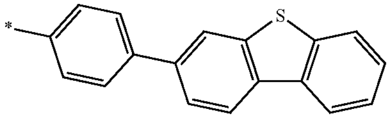 [SMILES: *c1ccc(-c2ccc3c(c2)sc2ccccc23)cc1] | 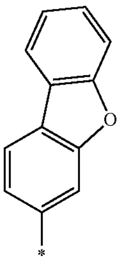 [SMILES: *c1ccc2c(c1)oc1ccccc12] |
| M17 | 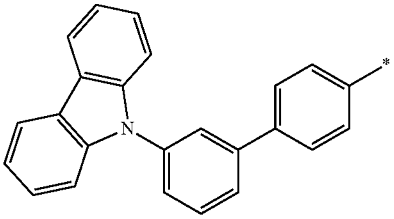 [SMILES: *c1ccc(-c2cccc(-n3c4ccccc4c4ccccc43)c2)cc1] | 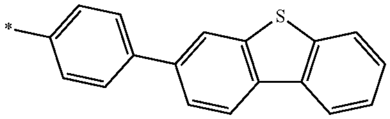 [SMILES: *c1ccc(-c2ccc3c(c2)sc2ccccc23)cc1] | 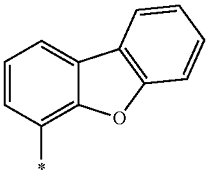 |
| M18 | 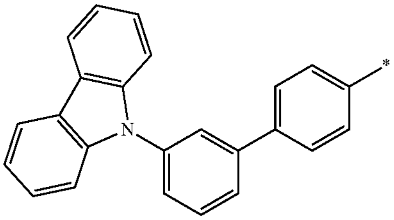 [SMILES: *c1ccc(-c2cccc(-n3c4ccccc4c4ccccc43)c2)cc1] | 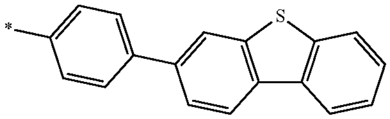 [SMILES: *c1ccc(-c2ccc3c(c2)sc2ccccc23)cc1] | 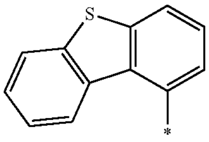 |

-continued
Compound Group 1
| Formula 1 | $Ar_1$ | $Ar_2$ | $Ar_3$ |
|---|---|---|---|
| M19 | 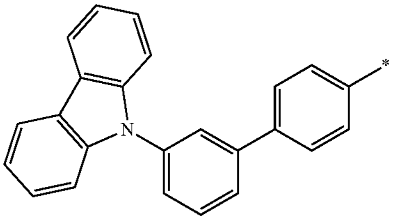 [SMILES: *c1ccc(-c2cccc(-n3c4ccccc4c4ccccc43)c2)cc1] | 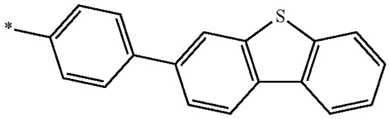 [SMILES: *c1ccc(-c2ccc3c(c2)sc2ccccc23)cc1] | 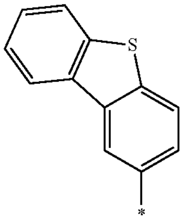 |
| M20 | 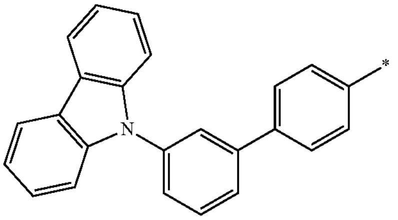 [SMILES: *c1ccc(-c2cccc(-n3c4ccccc4c4ccccc43)c2)cc1] | 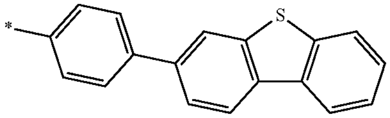 [SMILES: *c1ccc(-c2ccc3c(c2)sc2ccccc23)cc1] | 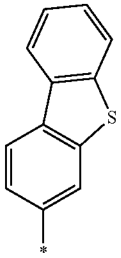 [SMILES: *c1ccc2c(c1)sc1ccccc12] |
| M21 | 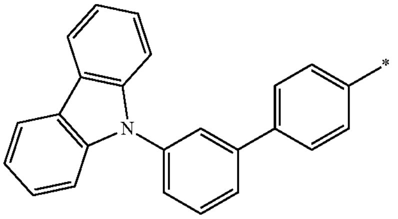 [SMILES: *c1ccc(-c2cccc(-n3c4ccccc4c4ccccc43)c2)cc1] | 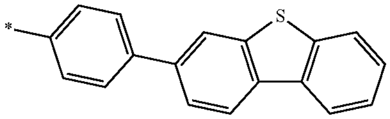 [SMILES: *c1ccc(-c2ccc3c(c2)sc2ccccc23)cc1] | 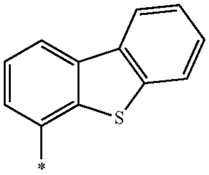 |
| M22 | 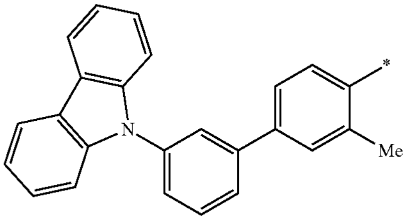 [SMILES: *c1ccc(-c2cccc(-n3c4ccccc4c4ccccc43)c2)cc1C] | 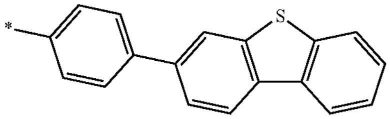 [SMILES: *c1ccc(-c2ccc3c(c2)sc2ccccc23)cc1] | 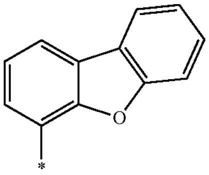 |
| M23 | 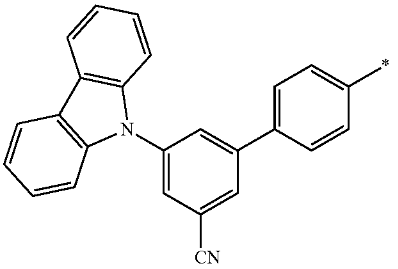 [SMILES: *c1ccc(-c2cc(C#N)cc(-n3c4ccccc4c4ccccc43)c2)cc1] | 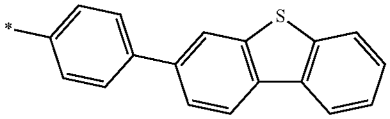 [SMILES: *c1ccc(-c2ccc3c(c2)sc2ccccc23)cc1] | 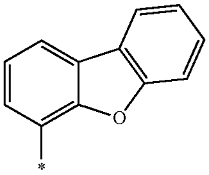 |
| N1 | 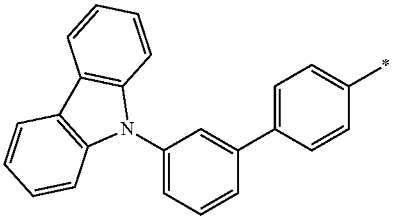 [SMILES: *c1ccc(-c2cccc(-n3c4ccccc4c4ccccc43)c2)cc1] | 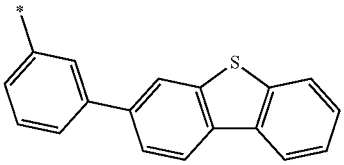 [SMILES: *c1cccc(-c2ccc3c(c2)sc2ccccc23)c1] | 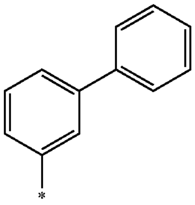 [SMILES: *c1cccc(-c2ccccc2)c1] |

-continued
Compound Group 1
| Formula 1 | $Ar_1$ | $Ar_2$ | $Ar_3$ |
|---|---|---|---|
| N2 | 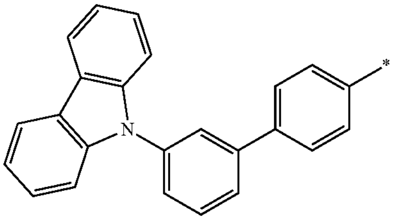 [SMILES: *c1ccc(-c2cccc(-n3c4ccccc4c4ccccc43)c2)cc1] | 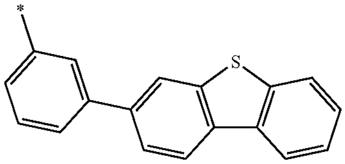 [SMILES: *c1cccc(-c2ccc3c(c2)sc2ccccc23)c1] | 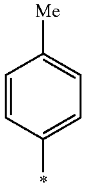 [SMILES: *c1ccc(C)cc1] |
| N3 | 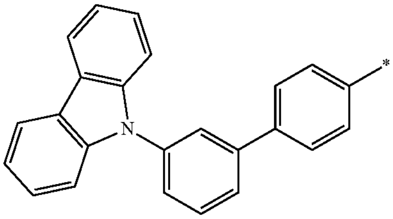 [SMILES: *c1ccc(-c2cccc(-n3c4ccccc4c4ccccc43)c2)cc1] | 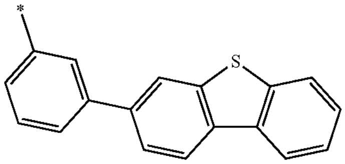 [SMILES: *c1cccc(-c2ccc3c(c2)sc2ccccc23)c1] | 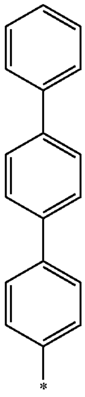 [SMILES: *c1ccc(-c2ccc(-c3ccccc3)cc2)cc1] |
| N4 | 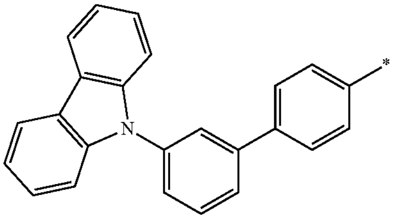 [SMILES: *c1ccc(-c2cccc(-n3c4ccccc4c4ccccc43)c2)cc1] | 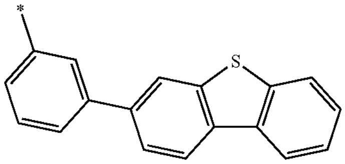 | 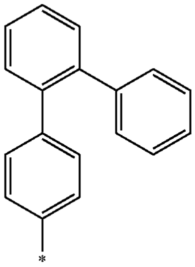 [SMILES: *c1ccc(-c2ccccc2-c2ccccc2)cc1] |
| N5 | 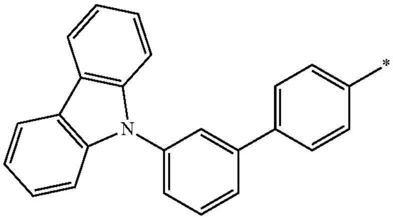 [SMILES: *c1ccc(-c2cccc(-n3c4ccccc4c4ccccc43)c2)cc1] | 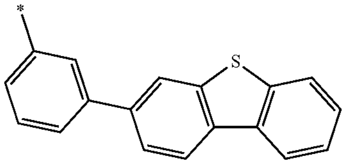 [SMILES: *c1cccc(-c2ccc3c(c2)sc2ccccc23)c1] | 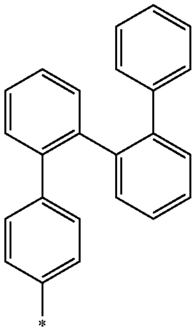 [SMILES: *c1ccc(-c2ccccc2-c2ccccc2-c2ccccc2)cc1] |
| N6 | 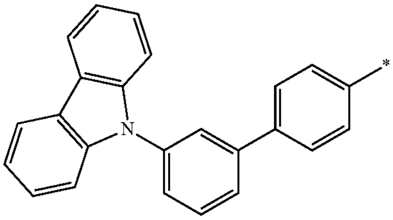 [SMILES: *c1ccc(-c2cccc(-n3c4ccccc4c4ccccc43)c2)cc1] | 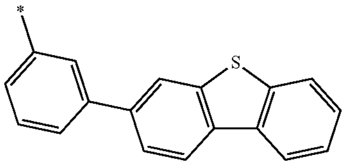 [SMILES: *c1cccc(-c2ccc3c(c2)sc2ccccc23)c1] | 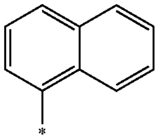 [SMILES: *c1cccc2ccccc12] |

-continued
| Compound Group 1 | | | |
|---|---|---|---|
| Formula 1 | $Ar_1$ | $Ar_2$ | $Ar_3$ |
| N7 | 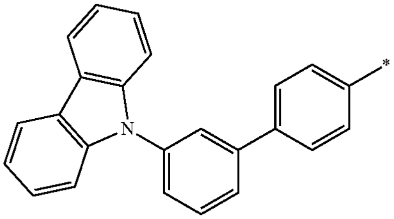 [SMILES: *c1ccc(-c2cccc(-n3c4ccccc4c4ccccc43)c2)cc1] | 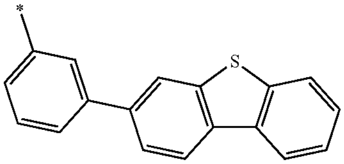 [SMILES: *c1cccc(-c2ccc3c(c2)sc2ccccc23)c1] | 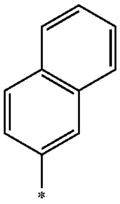 [SMILES: *c1ccc2ccccc2c1] |
| N8 | 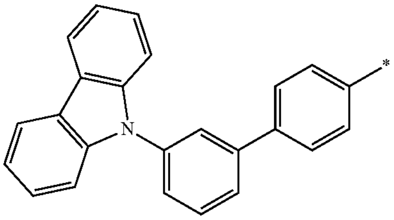 [SMILES: *c1ccc(-c2cccc(-n3c4ccccc4c4ccccc43)c2)cc1] | 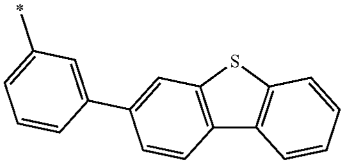 [SMILES: *c1cccc(-c2ccc3c(c2)sc2ccccc23)c1] | 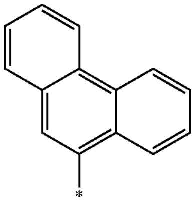 [SMILES: *c1cc2ccccc2c2ccccc12] |
| N9 | 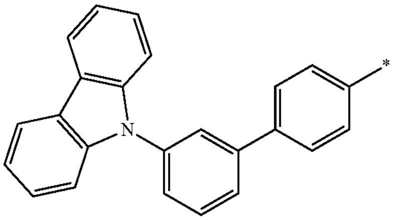 [SMILES: *c1ccc(-c2cccc(-n3c4ccccc4c4ccccc43)c2)cc1] | 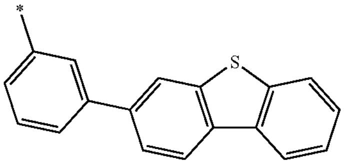 [SMILES: *c1cccc(-c2ccc3c(c2)sc2ccccc23)c1] | 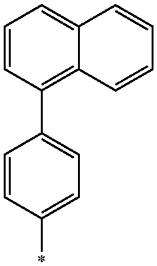 [SMILES: *c1ccc(-c2cccc3ccccc23)cc1] |
| N10 | 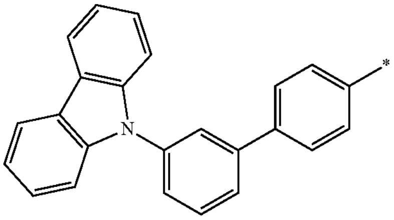 [SMILES: *c1ccc(-c2cccc(-n3c4ccccc4c4ccccc43)c2)cc1] | 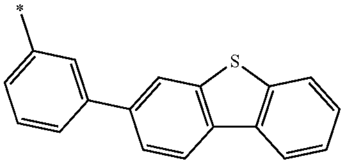 [SMILES: *c1cccc(-c2ccc3c(c2)sc2ccccc23)c1] | 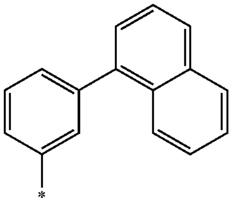 [SMILES: *c1cccc(-c2cccc3ccccc23)c1] |
| N11 | 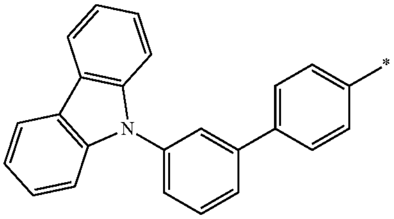 [SMILES: *c1ccc(-c2cccc(-n3c4ccccc4c4ccccc43)c2)cc1] | 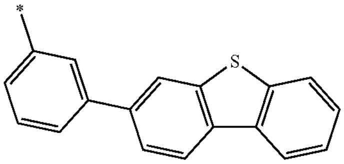 | 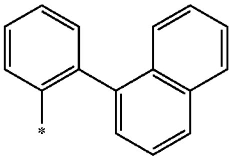 [SMILES: *c1ccccc1-c1cccc2ccccc12] |

-continued
| Compound Group 1 | | | |
|---|---|---|---|
| Formula 1 | $Ar_1$ | $Ar_2$ | $Ar_3$ |
| N12 | 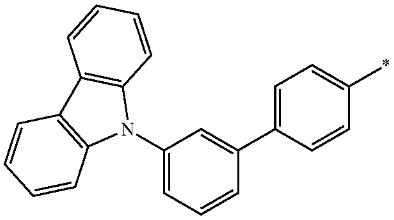 [SMILES: *c1ccc(-c2cccc(-n3c4ccccc4c4ccccc43)c2)cc1] | 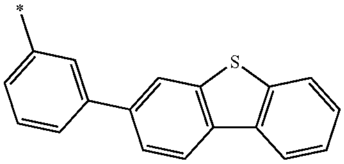 [SMILES: *c1cccc(-c2ccc3c(c2)sc2ccccc23)c1] | 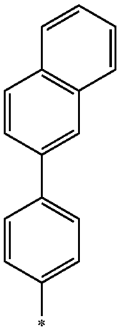 [SMILES: *c1ccc(-c2ccc3ccccc3c2)cc1] |
| N13 | 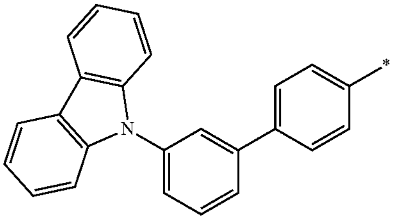 [SMILES: *c1ccc(-c2cccc(-n3c4ccccc4c4ccccc43)c2)cc1] | 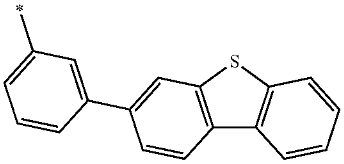 [SMILES: *c1cccc(-c2ccc3c(c2)sc2ccccc23)c1] | 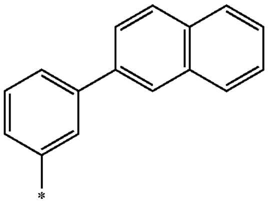 [SMILES: *c1cccc(-c2ccc3ccccc3c2)c1] |
| N14 | 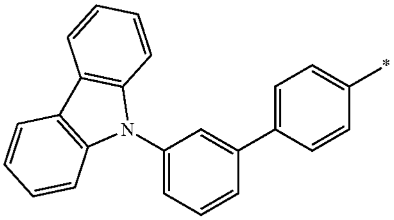 [SMILES: *c1ccc(-c2cccc(-n3c4ccccc4c4ccccc43)c2)cc1] | 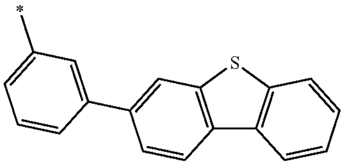 [SMILES: *c1cccc(-c2ccc3c(c2)sc2ccccc23)c1] | 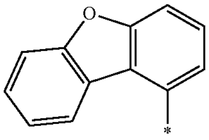 |
| N15 | 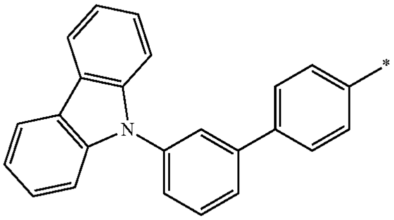 [SMILES: *c1ccc(-c2cccc(-n3c4ccccc4c4ccccc43)c2)cc1] | 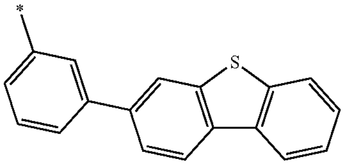 [SMILES: *c1cccc(-c2ccc3c(c2)sc2ccccc23)c1] | 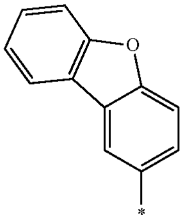 |
| N16 | 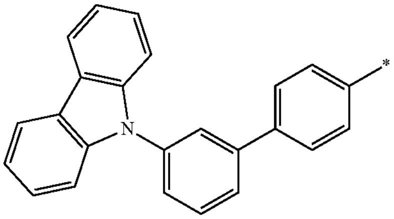 [SMILES: *c1ccc(-c2cccc(-n3c4ccccc4c4ccccc43)c2)cc1] | 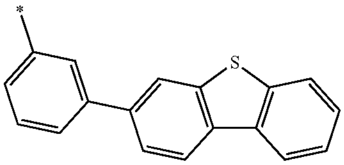 | 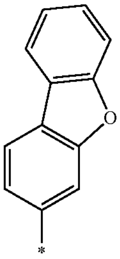 [SMILES: *c1ccc2c(c1)oc1ccccc12] |
| N17 | 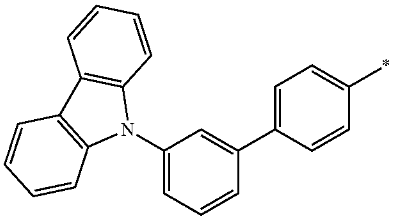 [SMILES: *c1ccc(-c2cccc(-n3c4ccccc4c4ccccc43)c2)cc1] | 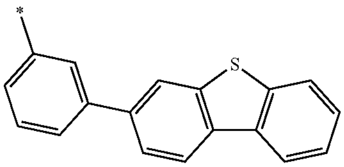 [SMILES: *c1cccc(-c2ccc3c(c2)sc2ccccc23)c1] | 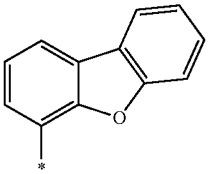 [SMILES: *c1cccc2c1oc1ccccc12] |

-continued
| Compound Group 1 | | | |
|---|---|---|---|
| Formula 1 | $Ar_1$ | $Ar_2$ | $Ar_3$ |
| N18 | 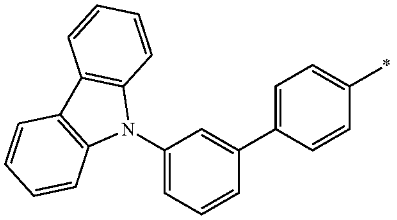 [SMILES: *c1ccc(-c2cccc(-n3c4ccccc4c4ccccc43)c2)cc1] | 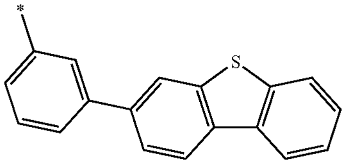 [SMILES: *c1cccc(-c2ccc3c(c2)sc2ccccc23)c1] | 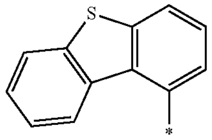 |
| N19 | 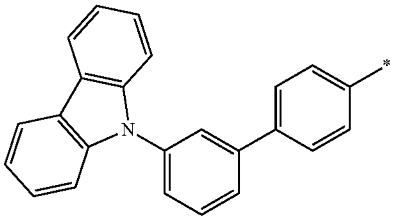 [SMILES: *c1ccc(-c2cccc(-n3c4ccccc4c4ccccc43)c2)cc1] | 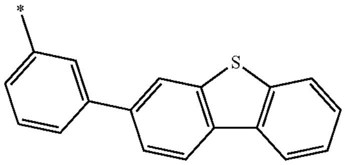 [SMILES: *c1cccc(-c2ccc3c(c2)sc2ccccc23)c1] | 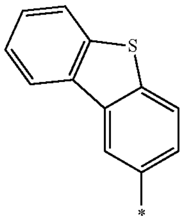 |
| N20 | 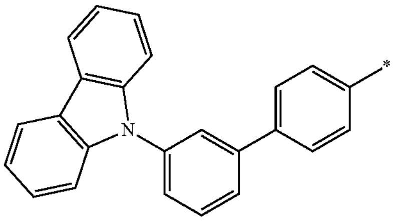 [SMILES: *c1ccc(-c2cccc(-n3c4ccccc4c4ccccc43)c2)cc1] | 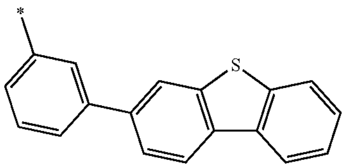 [SMILES: *c1cccc(-c2ccc3c(c2)sc2ccccc23)c1] | 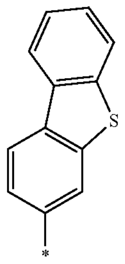 [SMILES: *c1ccc2c(c1)sc1ccccc12] |
| N21 | 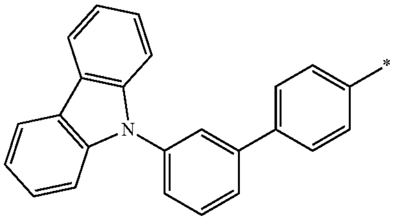 [SMILES: *c1ccc(-c2cccc(-n3c4ccccc4c4ccccc43)c2)cc1] | 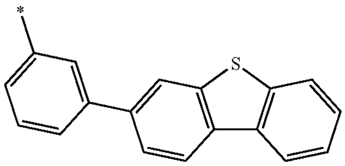 [SMILES: *c1cccc(-c2ccc3c(c2)sc2ccccc23)c1] | 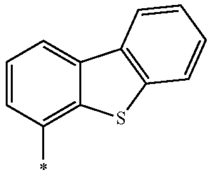 |
| N22 | 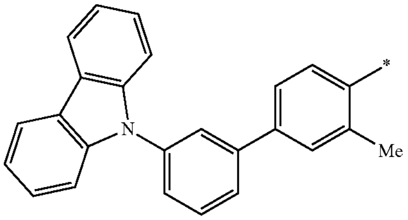 [SMILES: *c1ccc(-c2cccc(-n3c4ccccc4c4ccccc43)c2)cc1C] | 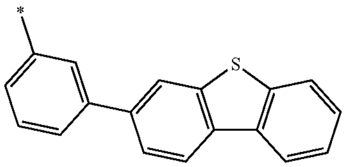 [SMILES: *c1cccc(-c2ccc3c(c2)sc2ccccc23)c1] | 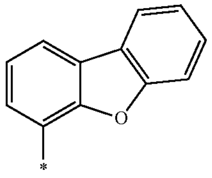 |
| N23 | 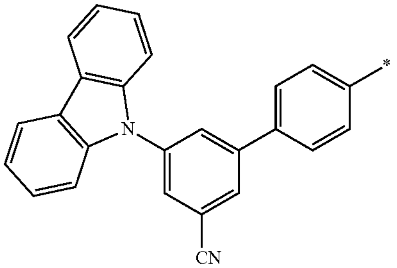 [SMILES: *c1ccc(-c2cc(C#N)cc(-n3c4ccccc4c4ccccc43)c2)cc1] | 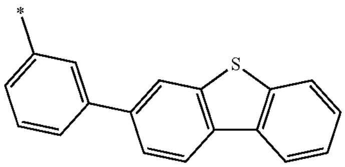 [SMILES: *c1cccc(-c2ccc3c(c2)sc2ccccc23)c1] | 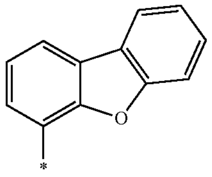 |

-continued
| Compound Group 1 | | | |
|---|---|---|---|
| Formula 1 | $Ar_1$ | $Ar_2$ | $Ar_3$ |
| O1 | 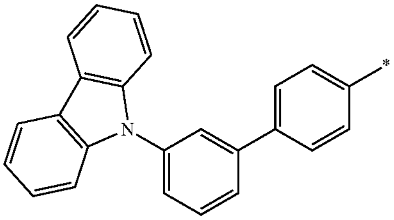 [SMILES: *c1ccc(-c2cccc(-n3c4ccccc4c4ccccc43)c2)cc1] | 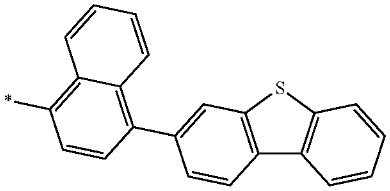 [SMILES: *c1ccc(-c2ccc3c(c2)sc2ccccc23)c2ccccc12] | 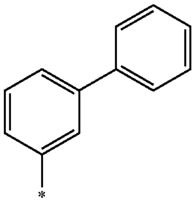 [SMILES: *c1cccc(-c2ccccc2)c1] |
| O2 | 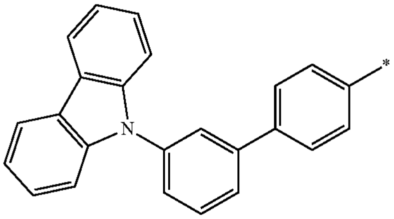 [SMILES: *c1ccc(-c2cccc(-n3c4ccccc4c4ccccc43)c2)cc1] | 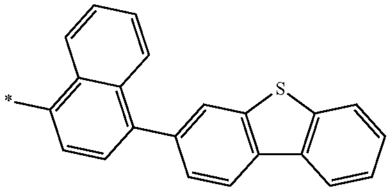 [SMILES: *c1ccc(-c2ccc3c(c2)sc2ccccc23)c2ccccc12] | 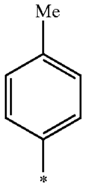 [SMILES: *c1ccc(C)cc1] |
| O3 | 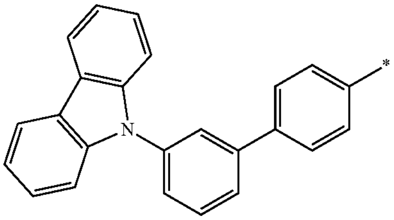 [SMILES: *c1ccc(-c2cccc(-n3c4ccccc4c4ccccc43)c2)cc1] | 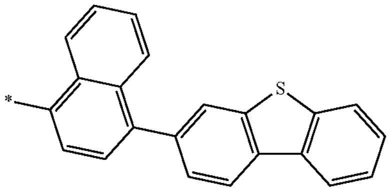 [SMILES: *c1ccc(-c2ccc3c(c2)sc2ccccc23)c2ccccc12] | 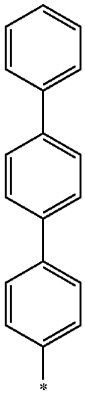 [SMILES: *c1ccc(-c2ccc(-c3ccccc3)cc2)cc1] |
| O4 | 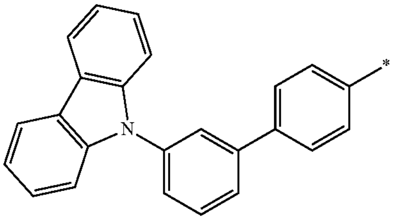 [SMILES: *c1ccc(-c2cccc(-n3c4ccccc4c4ccccc43)c2)cc1] | 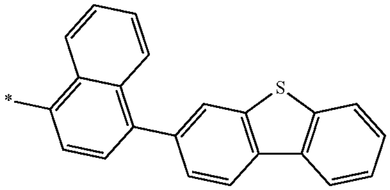 [SMILES: *c1ccc(-c2ccc3c(c2)sc2ccccc23)c2ccccc12] | 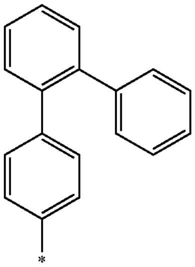 [SMILES: *c1ccc(-c2ccccc2-c2ccccc2)cc1] |
| O5 | 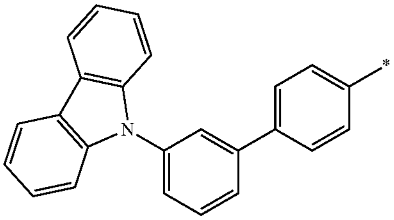 [SMILES: *c1ccc(-c2cccc(-n3c4ccccc4c4ccccc43)c2)cc1] | 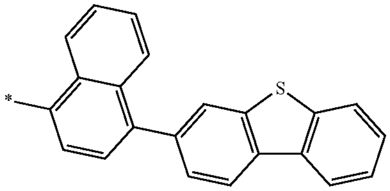 [SMILES: *c1ccc(-c2ccc3c(c2)sc2ccccc23)c2ccccc12] | 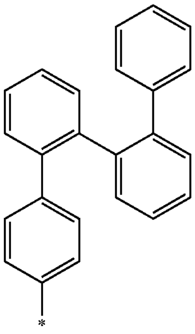 [SMILES: *c1ccc(-c2ccccc2-c2ccccc2-c2ccccc2)cc1] |

-continued
Compound Group 1
| Formula 1 | $Ar_1$ | $Ar_2$ | $Ar_3$ |
|---|---|---|---|
| O6 | 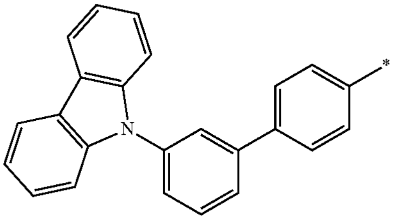 [SMILES: *c1ccc(-c2cccc(-n3c4ccccc4c4ccccc43)c2)cc1] | 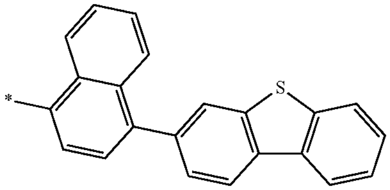 [SMILES: *c1ccc(-c2ccc3c(c2)sc2ccccc23)c2ccccc12] | 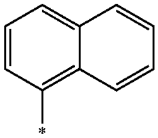 [SMILES: *c1cccc2ccccc12] |
| O7 | 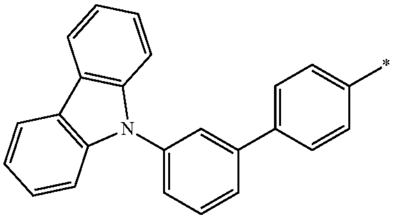 [SMILES: *c1ccc(-c2cccc(-n3c4ccccc4c4ccccc43)c2)cc1] | 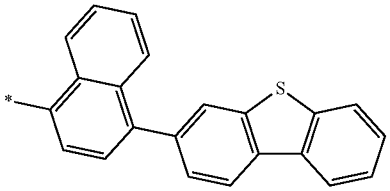 [SMILES: *c1ccc(-c2ccc3c(c2)sc2ccccc23)c2ccccc12] | 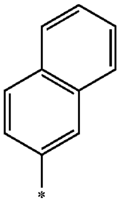 [SMILES: *c1ccc2ccccc2c1] |
| O8 | 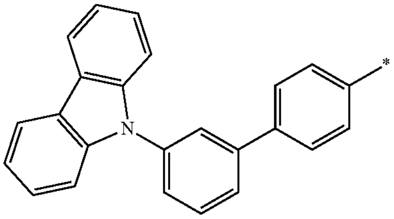 [SMILES: *c1ccc(-c2cccc(-n3c4ccccc4c4ccccc43)c2)cc1] | 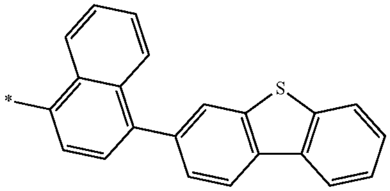 [SMILES: *c1ccc(-c2ccc3c(c2)sc2ccccc23)c2ccccc12] | 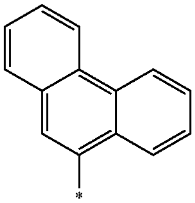 [SMILES: *c1cc2ccccc2c2ccccc12] |
| O9 | 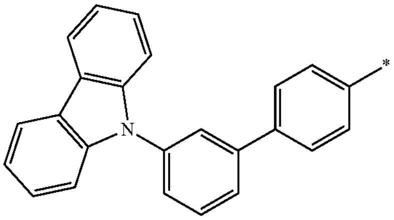 [SMILES: *c1ccc(-c2cccc(-n3c4ccccc4c4ccccc43)c2)cc1] | 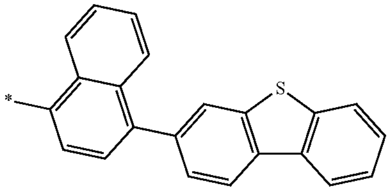 [SMILES: *c1ccc(-c2ccc3c(c2)sc2ccccc23)c2ccccc12] | 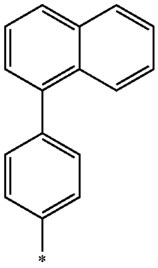 [SMILES: *c1ccc(-c2cccc3ccccc23)cc1] |
| O10 | 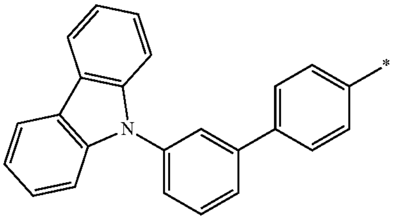 [SMILES: *c1ccc(-c2cccc(-n3c4ccccc4c4ccccc43)c2)cc1] | 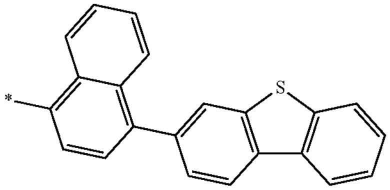 [SMILES: *c1ccc(-c2ccc3c(c2)sc2ccccc23)c2ccccc12] | 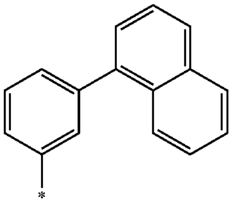 [SMILES: *c1cccc(-c2cccc3ccccc23)c1] |
| O11 | 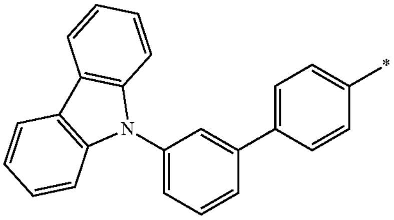 [SMILES: *c1ccc(-c2cccc(-n3c4ccccc4c4ccccc43)c2)cc1] | 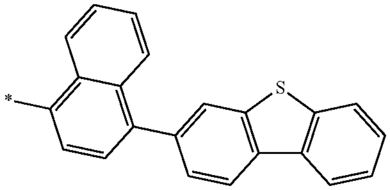 [SMILES: *c1ccc(-c2ccc3c(c2)sc2ccccc23)c2ccccc12] | 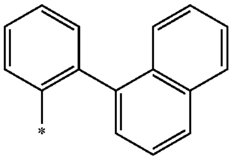 [SMILES: *c1ccccc1-c1cccc2ccccc12] |

-continued
| Compound Group 1 | | | |
|---|---|---|---|
| Formula 1 | Ar1 | Ar2 | Ar3 |
| O12 | 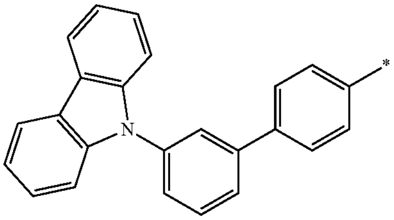 [SMILES: *c1ccc(-c2cccc(-n3c4ccccc4c4ccccc43)c2)cc1] | 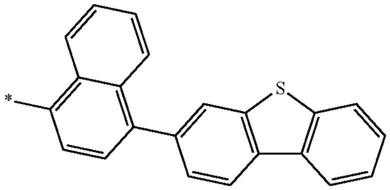 [SMILES: *c1ccc(-c2ccc3c(c2)sc2ccccc23)c2ccccc12] | 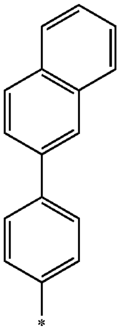 [SMILES: *c1ccc(-c2ccc3ccccc3c2)cc1] |
| O13 | 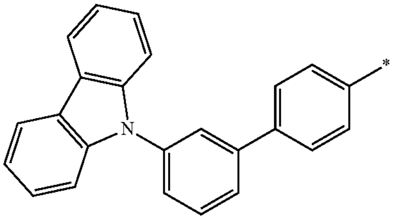 [SMILES: *c1ccc(-c2cccc(-n3c4ccccc4c4ccccc43)c2)cc1] | 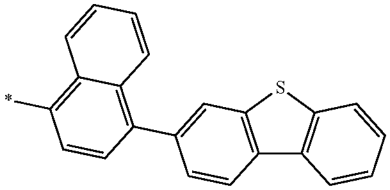 [SMILES: *c1ccc(-c2ccc3c(c2)sc2ccccc23)c2ccccc12] | 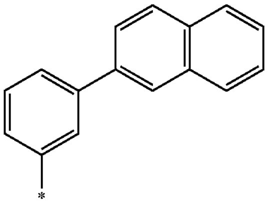 [SMILES: *c1cccc(-c2ccc3ccccc3c2)c1] |
| O14 | 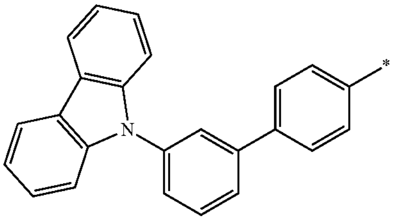 [SMILES: *c1ccc(-c2cccc(-n3c4ccccc4c4ccccc43)c2)cc1] | 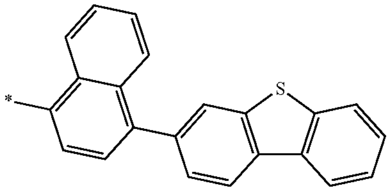 [SMILES: *c1ccc(-c2ccc3c(c2)sc2ccccc23)c2ccccc12] | 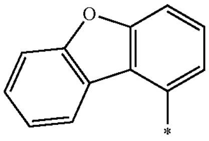 |
| O15 | 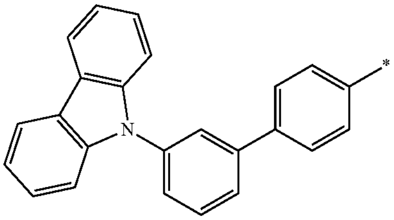 [SMILES: *c1ccc(-c2cccc(-n3c4ccccc4c4ccccc43)c2)cc1] | 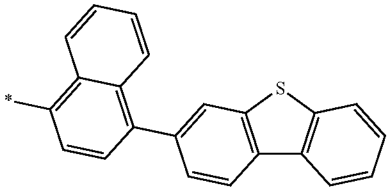 [SMILES: *c1ccc(-c2ccc3c(c2)sc2ccccc23)c2ccccc12] | 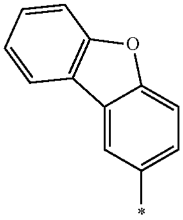 [SMILES: *c1ccc2oc3ccccc3c2c1] |
| O16 | 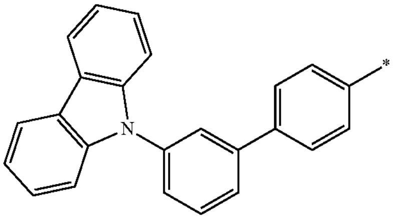 [SMILES: *c1ccc(-c2cccc(-n3c4ccccc4c4ccccc43)c2)cc1] | 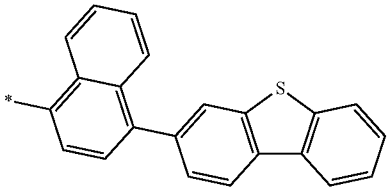 [SMILES: *c1ccc(-c2ccc3c(c2)sc2ccccc23)c2ccccc12] | 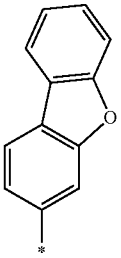 [SMILES: *c1ccc2c(c1)oc1ccccc12] |
| O17 | 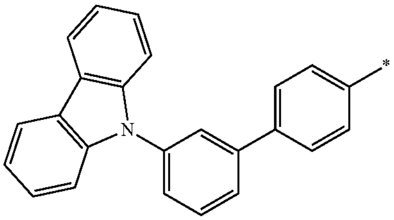 [SMILES: *c1ccc(-c2cccc(-n3c4ccccc4c4ccccc43)c2)cc1] | 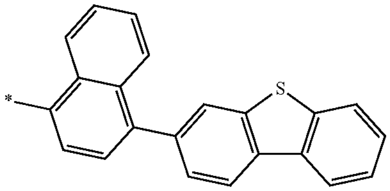 [SMILES: *c1ccc(-c2ccc3c(c2)sc2ccccc23)c2ccccc12] | 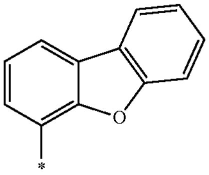 |

-continued
| Compound Group 1 | | | |
|---|---|---|---|
| Formula 1 | $Ar_1$ | $Ar_2$ | $Ar_3$ |
| O18 | 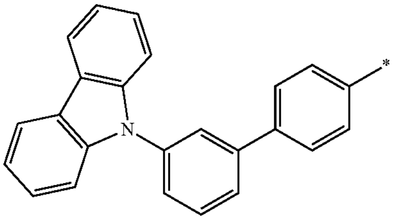 [SMILES: *c1ccc(-c2cccc(-n3c4ccccc4c4ccccc43)c2)cc1] | 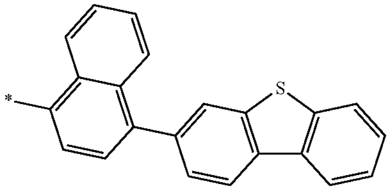 [SMILES: *c1ccc(-c2ccc3c(c2)sc2ccccc23)c2ccccc12] | 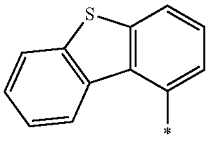 |
| O19 | 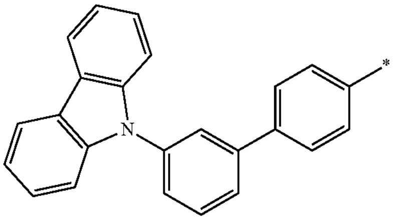 [SMILES: *c1ccc(-c2cccc(-n3c4ccccc4c4ccccc43)c2)cc1] | 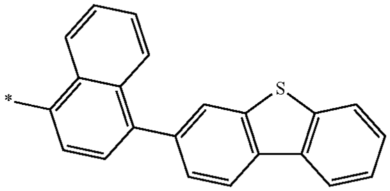 [SMILES: *c1ccc(-c2ccc3c(c2)sc2ccccc23)c2ccccc12] | 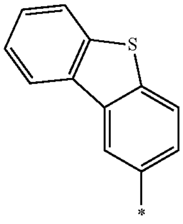 [SMILES: *c1ccc2sc3ccccc3c2c1] |
| O20 | 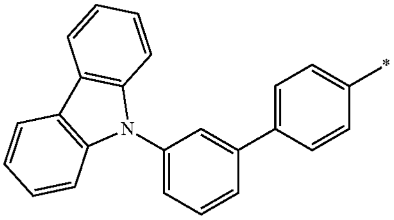 [SMILES: *c1ccc(-c2cccc(-n3c4ccccc4c4ccccc43)c2)cc1] | 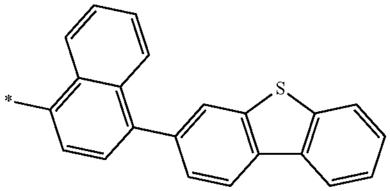 [SMILES: *c1ccc(-c2ccc3c(c2)sc2ccccc23)c2ccccc12] | 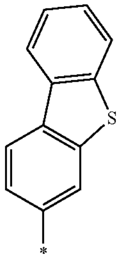 [SMILES: *c1ccc2c(c1)sc1ccccc12] |
| O21 | 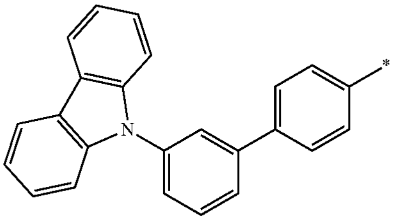 [SMILES: *c1ccc(-c2cccc(-n3c4ccccc4c4ccccc43)c2)cc1] | 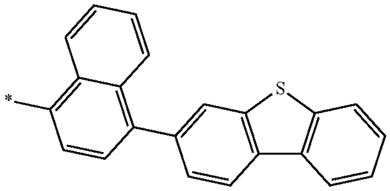 [SMILES: *c1ccc(-c2ccc3c(c2)sc2ccccc23)c2ccccc12] | 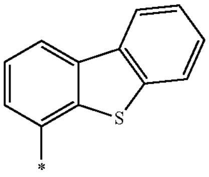 |
| O22 | 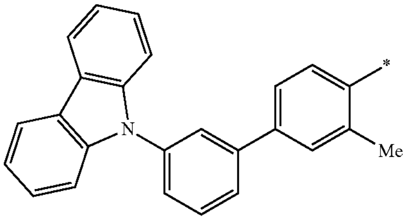 [SMILES: *c1ccc(-c2cccc(-n3c4ccccc4c4ccccc43)c2)cc1C] | 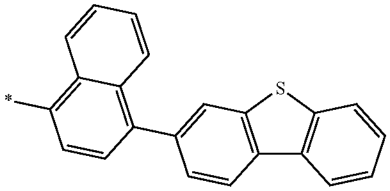 [SMILES: *c1ccc(-c2ccc3c(c2)sc2ccccc23)c2ccccc12] | 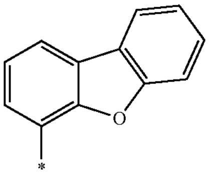 |
| O23 | 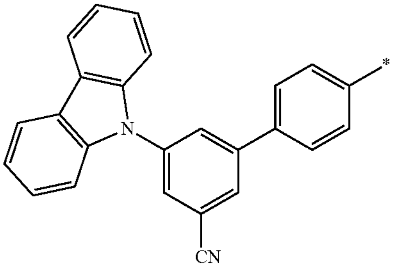 [SMILES: *c1ccc(-c2cc(C#N)cc(-n3c4ccccc4c4ccccc43)c2)cc1] | 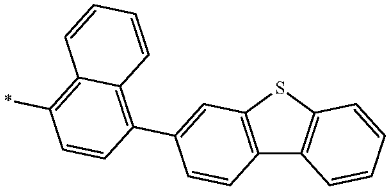 [SMILES: *c1ccc(-c2ccc3c(c2)sc2ccccc23)c2ccccc12] | 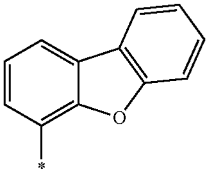 |

-continued
| Compound Group 1 | | | |
|---|---|---|---|
| Formula 1 | $Ar_1$ | $Ar_2$ | $Ar_3$ |
| P1 | 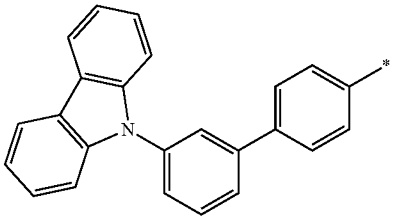 [SMILES: *c1ccc(-c2cccc(-n3c4ccccc4c4ccccc43)c2)cc1] | 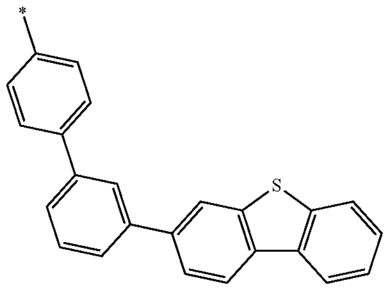 [SMILES: *c1ccc(-c2cccc(-c3ccc4c(c3)sc3ccccc34)c2)cc1] | 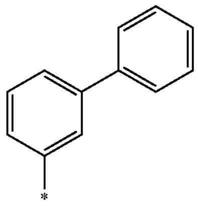 [SMILES: *c1cccc(-c2ccccc2)c1] |
| P2 | 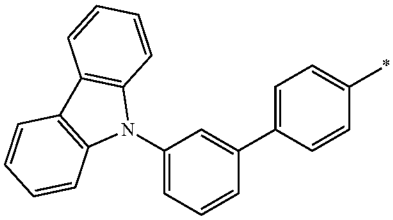 [SMILES: *c1ccc(-c2cccc(-n3c4ccccc4c4ccccc43)c2)cc1] | 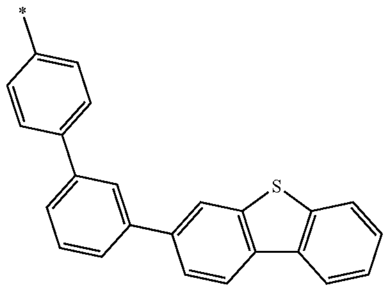 [SMILES: *c1ccc(-c2cccc(-c3ccc4c(c3)sc3ccccc34)c2)cc1] | 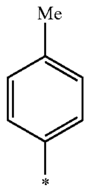 [SMILES: *c1ccc(C)cc1] |
| P3 | 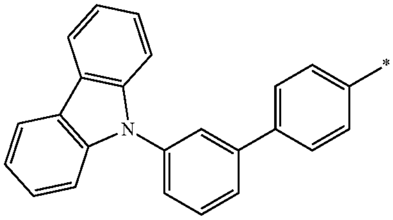 [SMILES: *c1ccc(-c2cccc(-n3c4ccccc4c4ccccc43)c2)cc1] | 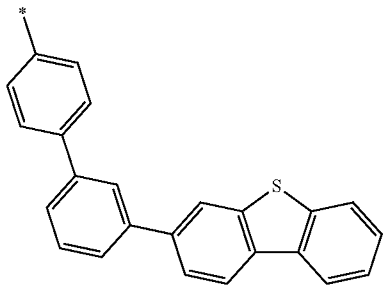 [SMILES: *c1ccc(-c2cccc(-c3ccc4c(c3)sc3ccccc34)c2)cc1] | 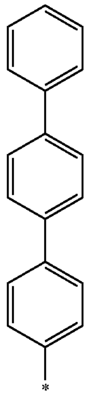 [SMILES: *c1ccc(-c2ccc(-c3ccccc3)cc2)cc1] |
| P4 | 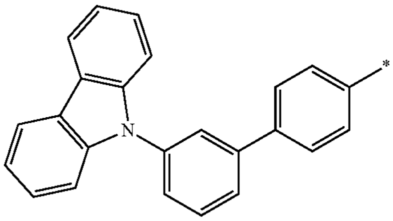 [SMILES: *c1ccc(-c2cccc(-n3c4ccccc4c4ccccc43)c2)cc1] | 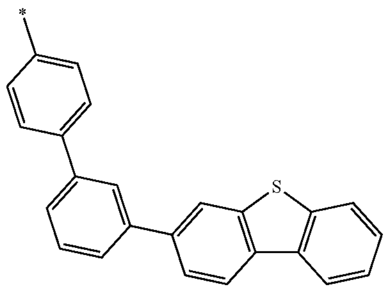 [SMILES: *c1ccc(-c2cccc(-c3ccc4c(c3)sc3ccccc34)c2)cc1] | 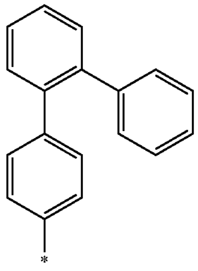 [SMILES: *c1ccc(-c2ccccc2-c2ccccc2)cc1] |

-continued
| Compound Group 1 | | | |
|---|---|---|---|
| Formula 1 | $Ar_1$ | $Ar_2$ | $Ar_3$ |
| P5 | 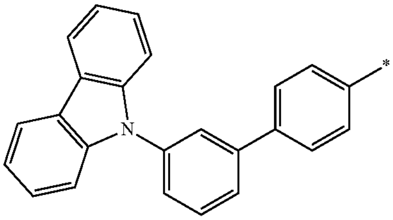 [SMILES: *c1ccc(-c2cccc(-n3c4ccccc4c4ccccc43)c2)cc1] | 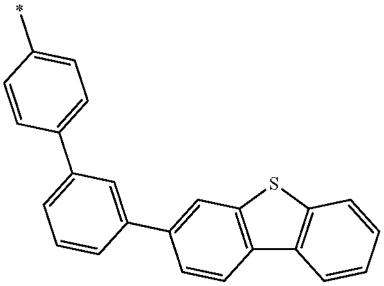 [SMILES: *c1ccc(-c2cccc(-c3ccc4c(c3)sc3ccccc34)c2)cc1] | 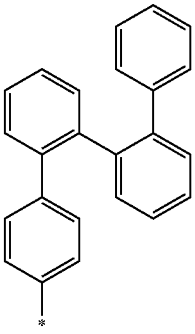 [SMILES: *c1ccc(-c2ccccc2-c2ccccc2-c2ccccc2)cc1] |
| P6 | 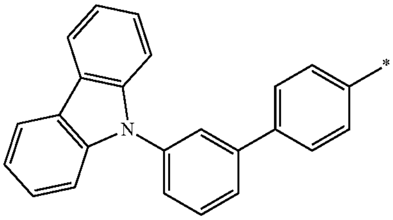 [SMILES: *c1ccc(-c2cccc(-n3c4ccccc4c4ccccc43)c2)cc1] | 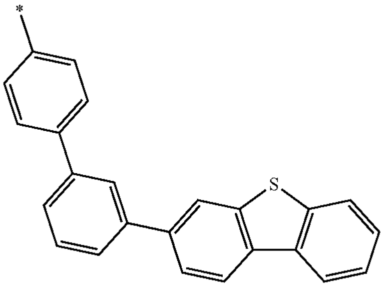 [SMILES: *c1ccc(-c2cccc(-c3ccc4c(c3)sc3ccccc34)c2)cc1] | 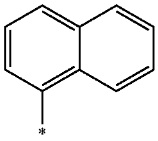 [SMILES: *c1cccc2ccccc12] |
| P7 | 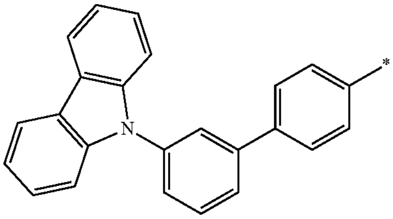 [SMILES: *c1ccc(-c2cccc(-n3c4ccccc4c4ccccc43)c2)cc1] | 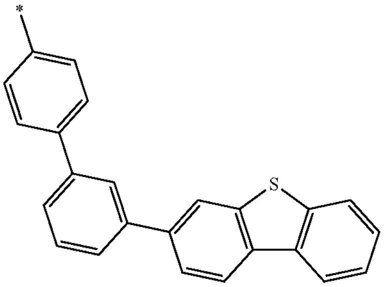 [SMILES: *c1ccc(-c2cccc(-c3ccc4c(c3)sc3ccccc34)c2)cc1] | 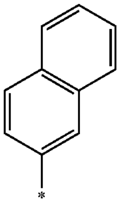 [SMILES: *c1ccc2ccccc2c1] |
| P8 | 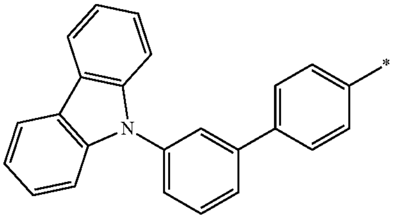 [SMILES: *c1ccc(-c2cccc(-n3c4ccccc4c4ccccc43)c2)cc1] | 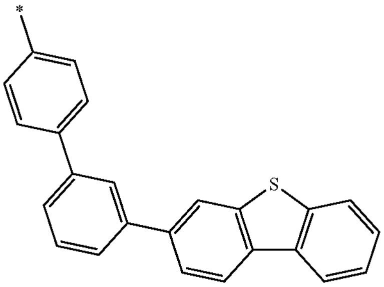 [SMILES: *c1ccc(-c2cccc(-c3ccc4c(c3)sc3ccccc34)c2)cc1] | 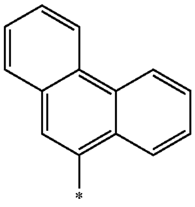 [SMILES: *c1cc2ccccc2c2ccccc12] |
| P9 | 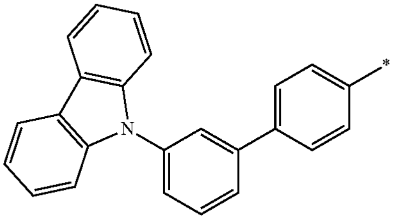 [SMILES: *c1ccc(-c2cccc(-n3c4ccccc4c4ccccc43)c2)cc1] | 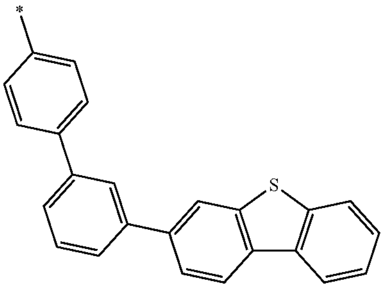 [SMILES: *c1ccc(-c2cccc(-c3ccc4c(c3)sc3ccccc34)c2)cc1] | 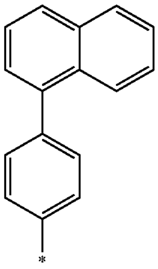 [SMILES: *c1ccc(-c2cccc3ccccc23)cc1] |

-continued
| Compound Group 1 | | | |
| --- | --- | --- | --- |
| Formula 1 | $Ar_1$ | $Ar_2$ | $Ar_3$ |
| P10 | 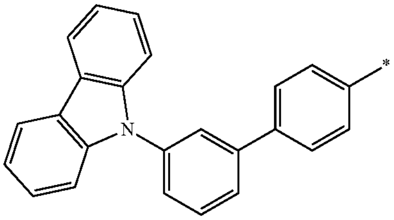 [SMILES: *c1ccc(-c2cccc(-n3c4ccccc4c4ccccc43)c2)cc1] | 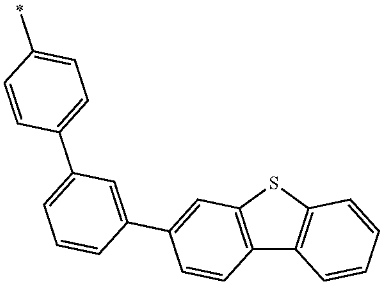 [SMILES: *c1ccc(-c2cccc(-c3ccc4c(c3)sc3ccccc34)c2)cc1] | 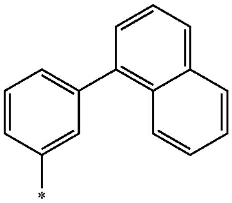 [SMILES: *c1cccc(-c2cccc3ccccc23)c1] |
| P11 | 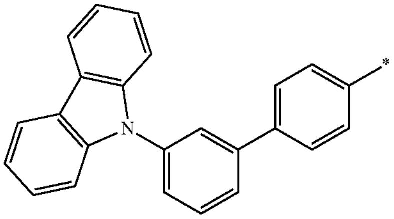 [SMILES: *c1ccc(-c2cccc(-n3c4ccccc4c4ccccc43)c2)cc1] | 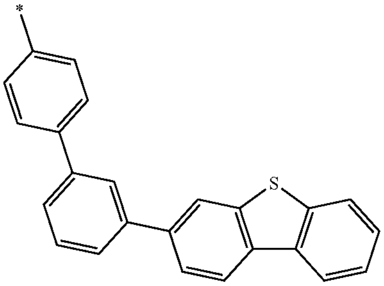 [SMILES: *c1ccc(-c2cccc(-c3ccc4c(c3)sc3ccccc34)c2)cc1] | 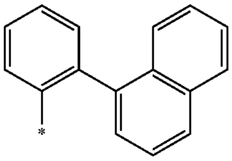 [SMILES: *c1ccccc1-c1cccc2ccccc12] |
| P12 | 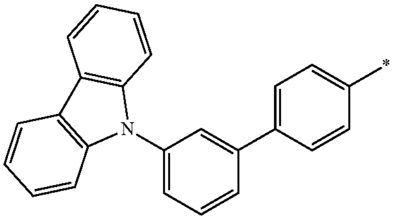 [SMILES: *c1ccc(-c2cccc(-n3c4ccccc4c4ccccc43)c2)cc1] | 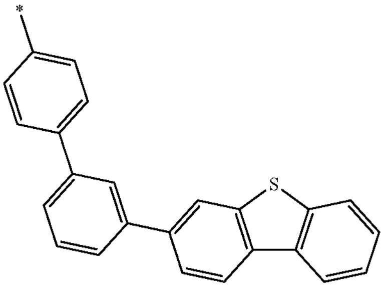 [SMILES: *c1ccc(-c2cccc(-c3ccc4c(c3)sc3ccccc34)c2)cc1] | 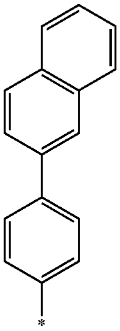 [SMILES: *c1ccc(-c2ccc3ccccc3c2)cc1] |
| P13 | 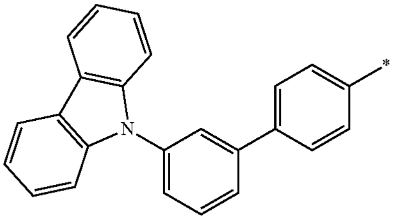 [SMILES: *c1ccc(-c2cccc(-n3c4ccccc4c4ccccc43)c2)cc1] | 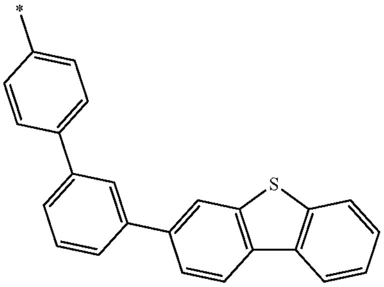 [SMILES: *c1ccc(-c2cccc(-c3ccc4c(c3)sc3ccccc34)c2)cc1] | 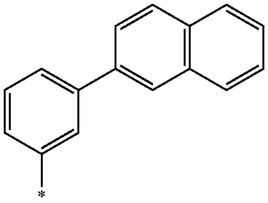 [SMILES: *c1cccc(-c2ccc3ccccc3c2)c1] |
| P14 | 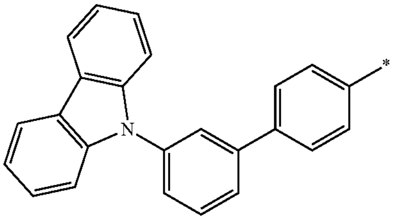 [SMILES: *c1ccc(-c2cccc(-n3c4ccccc4c4ccccc43)c2)cc1] | 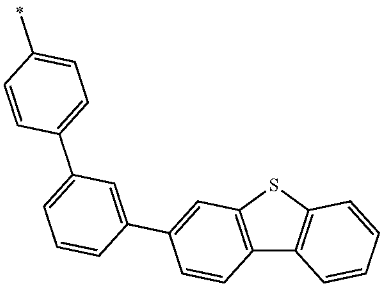 [SMILES: *c1ccc(-c2cccc(-c3ccc4c(c3)sc3ccccc34)c2)cc1] | 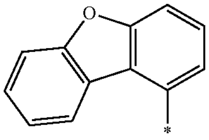 |

-continued
| Compound Group 1 | | | |
|---|---|---|---|
| Formula 1 | $Ar_1$ | $Ar_2$ | $Ar_3$ |
| P15 | 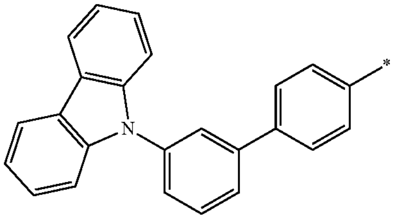 [SMILES: *c1ccc(-c2cccc(-n3c4ccccc4c4ccccc43)c2)cc1] | 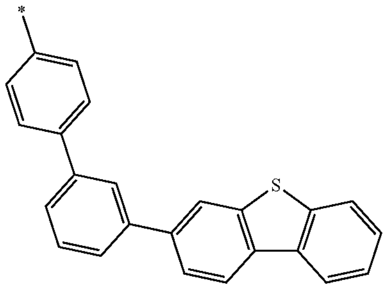 [SMILES: *c1ccc(-c2cccc(-c3ccc4c(c3)sc3ccccc34)c2)cc1] | 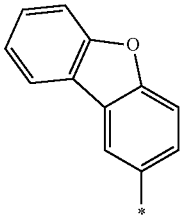 |
| P16 | 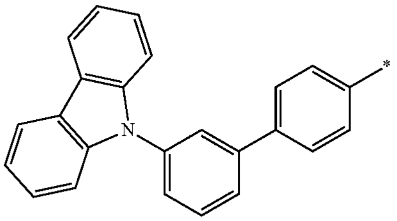 [SMILES: *c1ccc(-c2cccc(-n3c4ccccc4c4ccccc43)c2)cc1] | 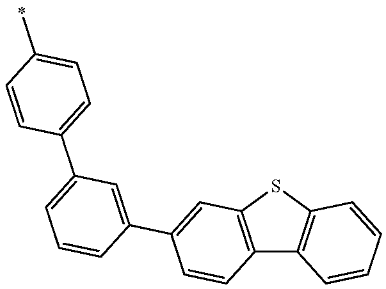 [SMILES: *c1ccc(-c2cccc(-c3ccc4c(c3)sc3ccccc34)c2)cc1] | 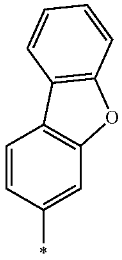 [SMILES: *c1ccc2c(c1)oc1ccccc12] |
| P17 | 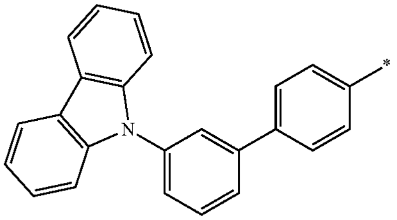 [SMILES: *c1ccc(-c2cccc(-n3c4ccccc4c4ccccc43)c2)cc1] | 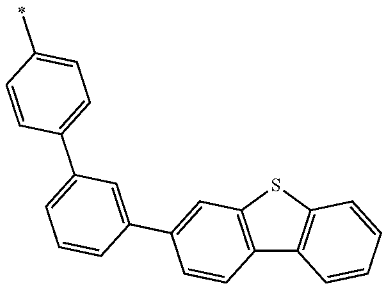 [SMILES: *c1ccc(-c2cccc(-c3ccc4c(c3)sc3ccccc34)c2)cc1] | 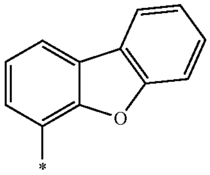 |
| P18 | 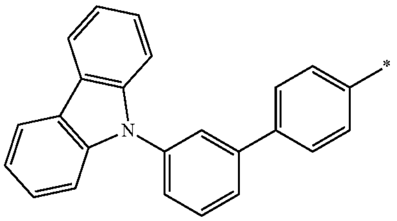 [SMILES: *c1ccc(-c2cccc(-n3c4ccccc4c4ccccc43)c2)cc1] | 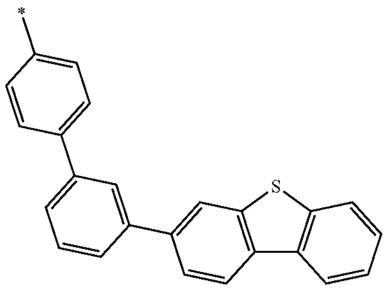 [SMILES: *c1ccc(-c2cccc(-c3ccc4c(c3)sc3ccccc34)c2)cc1] | 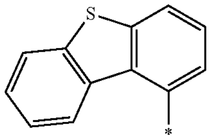 |
| P19 | 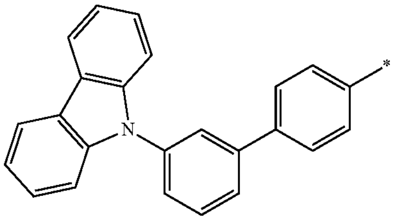 [SMILES: *c1ccc(-c2cccc(-n3c4ccccc4c4ccccc43)c2)cc1] | 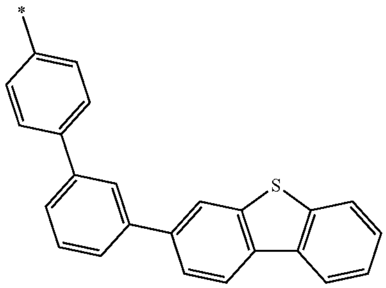 [SMILES: *c1ccc(-c2cccc(-c3ccc4c(c3)sc3ccccc34)c2)cc1] | 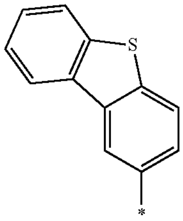 |

-continued
Compound Group 1
| Formula 1 | $Ar_1$ | $Ar_2$ | $Ar_3$ |
|---|---|---|---|
| P20 | 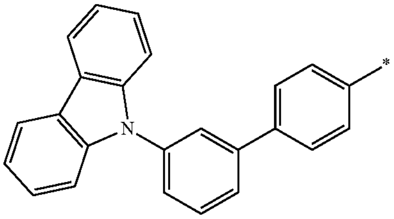 [SMILES: *c1ccc(-c2cccc(-n3c4ccccc4c4ccccc43)c2)cc1] | 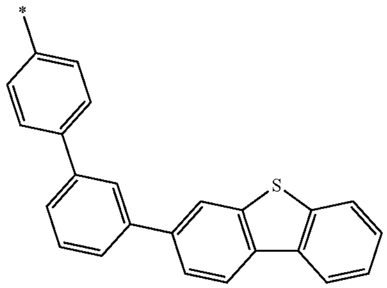 [SMILES: *c1ccc(-c2cccc(-c3ccc4c(c3)sc3ccccc34)c2)cc1] | 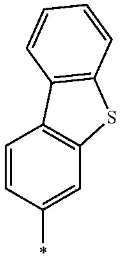 [SMILES: *c1ccc2c(c1)sc1ccccc12] |
| P21 | 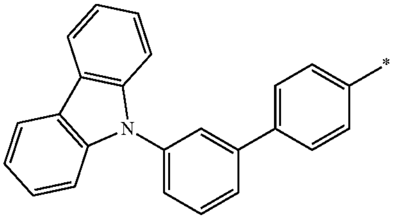 [SMILES: *c1ccc(-c2cccc(-n3c4ccccc4c4ccccc43)c2)cc1] | 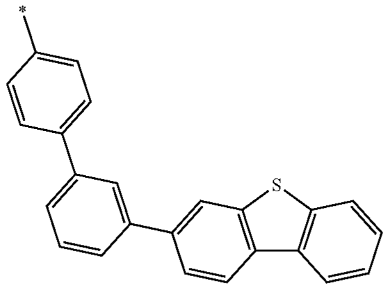 [SMILES: *c1ccc(-c2cccc(-c3ccc4c(c3)sc3ccccc34)c2)cc1] | 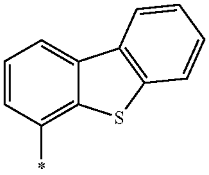 [SMILES: *c1cccc2c1sc1ccccc12] |
| P22 | 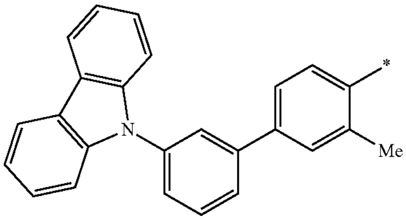 [SMILES: *c1ccc(-c2cccc(-n3c4ccccc4c4ccccc43)c2)cc1C] | 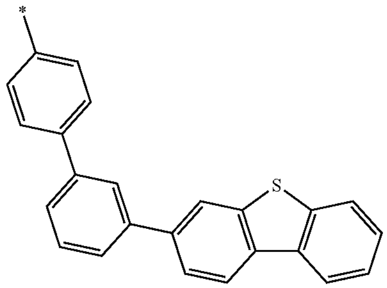 [SMILES: *c1ccc(-c2cccc(-c3ccc4c(c3)sc3ccccc34)c2)cc1] | 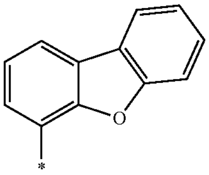 |
| P23 | 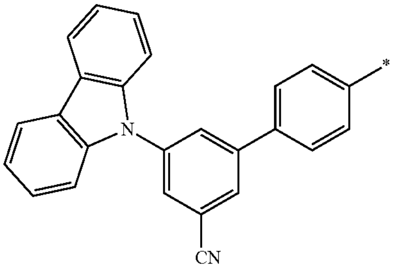 [SMILES: *c1ccc(-c2cc(C#N)cc(-n3c4ccccc4c4ccccc43)c2)cc1] | 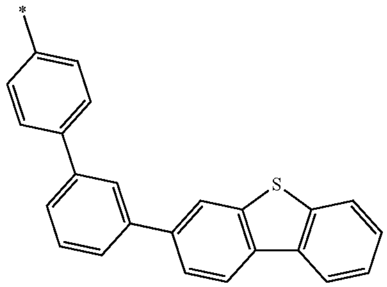 [SMILES: *c1ccc(-c2cccc(-c3ccc4c(c3)sc3ccccc34)c2)cc1] | 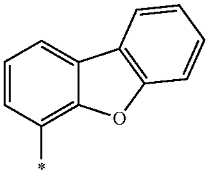 |
| Q1 | 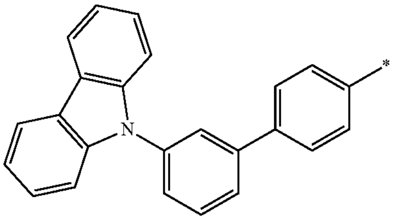 [SMILES: *c1ccc(-c2cccc(-n3c4ccccc4c4ccccc43)c2)cc1] | 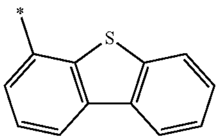 [SMILES: *c1cccc2c1sc1ccccc12] | 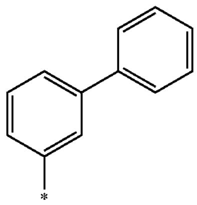 [SMILES: *c1cccc(-c2ccccc2)c1] |

-continued
| Compound Group 1 | | | |
|---|---|---|---|
| Formula 1 | $Ar_1$ | $Ar_2$ | $Ar_3$ |
| Q2 | 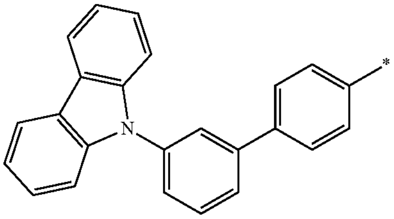 [SMILES: *c1ccc(-c2cccc(-n3c4ccccc4c4ccccc43)c2)cc1] | 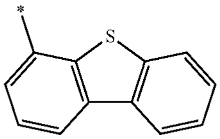 [SMILES: *c1cccc2c1sc1ccccc12] | 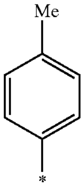 [SMILES: *c1ccc(C)cc1] |
| Q3 | 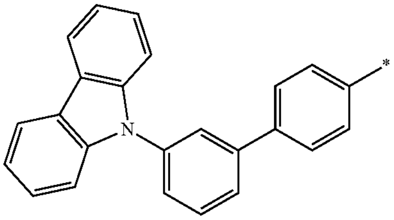 [SMILES: *c1ccc(-c2cccc(-n3c4ccccc4c4ccccc43)c2)cc1] | 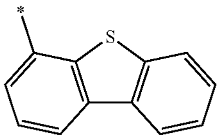 [SMILES: *c1cccc2c1sc1ccccc12] | 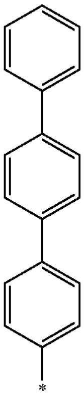 [SMILES: *c1ccc(-c2ccc(-c3ccccc3)cc2)cc1] |
| Q4 | 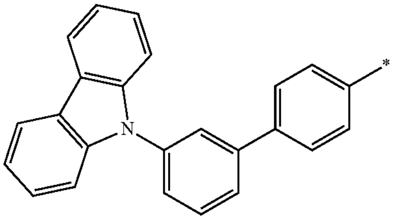 [SMILES: *c1ccc(-c2cccc(-n3c4ccccc4c4ccccc43)c2)cc1] | 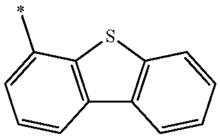 [SMILES: *c1cccc2c1sc1ccccc12] | 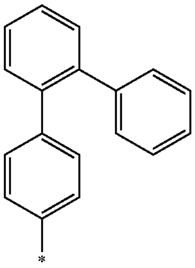 [SMILES: *c1ccc(-c2ccccc2-c2ccccc2)cc1] |
| Q5 | 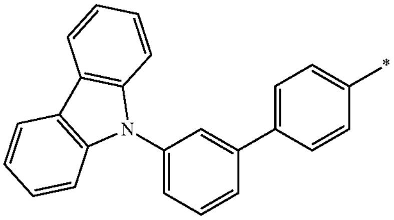 [SMILES: *c1ccc(-c2cccc(-n3c4ccccc4c4ccccc43)c2)cc1] | 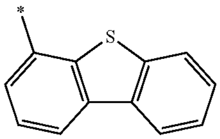 | 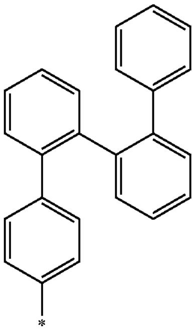 [SMILES: *c1ccc(-c2ccccc2-c2ccccc2-c2ccccc2)cc1] |
| Q6 | 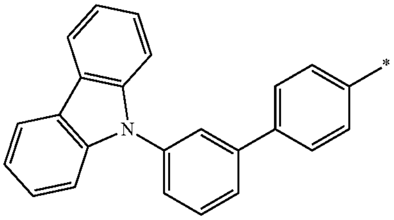 [SMILES: *c1ccc(-c2cccc(-n3c4ccccc4c4ccccc43)c2)cc1] | 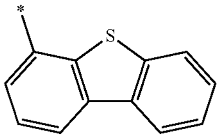 [SMILES: *c1cccc2c1sc1ccccc12] | 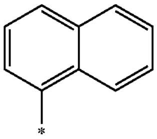 [SMILES: *c1cccc2ccccc12] |

-continued
| Compound Group 1 | | | |
|---|---|---|---|
| Formula 1 | $Ar_1$ | $Ar_2$ | $Ar_3$ |
| Q7 | 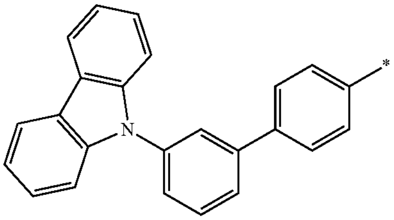 [SMILES: *c1ccc(-c2cccc(-n3c4ccccc4c4ccccc43)c2)cc1] | 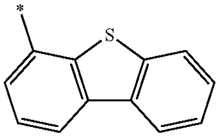 [SMILES: *c1cccc2c1sc1ccccc12] | 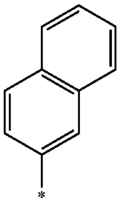 [SMILES: *c1ccc2ccccc2c1] |
| Q8 | 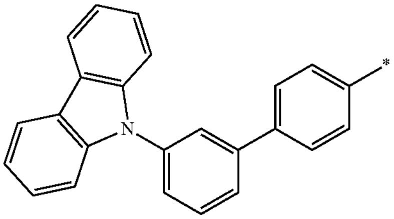 [SMILES: *c1ccc(-c2cccc(-n3c4ccccc4c4ccccc43)c2)cc1] | 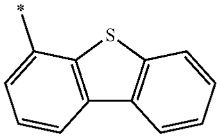 [SMILES: *c1cccc2c1sc1ccccc12] | 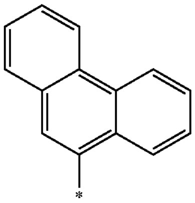 [SMILES: *c1cc2ccccc2c2ccccc12] |
| Q9 | 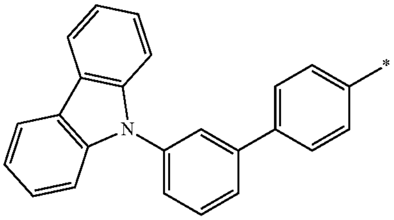 [SMILES: *c1ccc(-c2cccc(-n3c4ccccc4c4ccccc43)c2)cc1] | 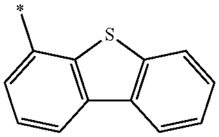 [SMILES: *c1cccc2c1sc1ccccc12] | 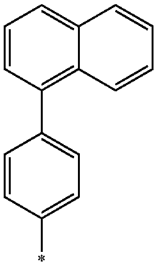 [SMILES: *c1ccc(-c2cccc3ccccc23)cc1] |
| Q10 | 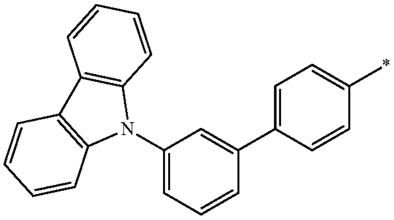 [SMILES: *c1ccc(-c2cccc(-n3c4ccccc4c4ccccc43)c2)cc1] | 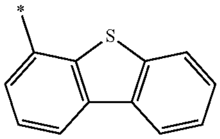 [SMILES: *c1cccc2c1sc1ccccc12] | 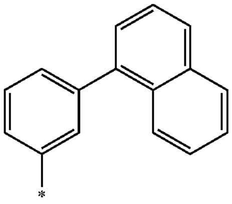 [SMILES: *c1cccc(-c2cccc3ccccc23)c1] |
| Q11 | 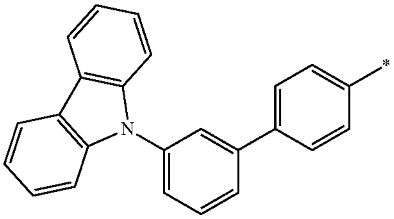 [SMILES: *c1ccc(-c2cccc(-n3c4ccccc4c4ccccc43)c2)cc1] | 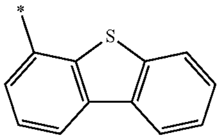 [SMILES: *c1cccc2c1sc1ccccc12] | 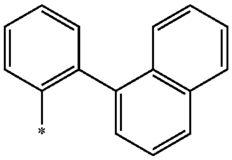 [SMILES: *c1ccccc1-c1cccc2ccccc12] |

-continued
Compound Group 1
| Formula 1 | Ar1 | Ar2 | Ar3 |
| --- | --- | --- | --- |
| Q12 | 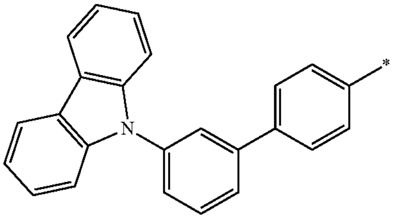 [SMILES: *c1ccc(-c2cccc(-n3c4ccccc4c4ccccc43)c2)cc1] | 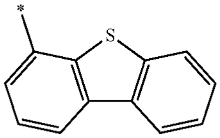 [SMILES: *c1cccc2c1sc1ccccc12] | 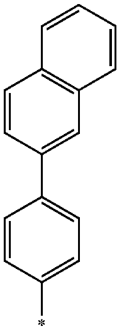 [SMILES: *c1ccc(-c2ccc3ccccc3c2)cc1] |
| Q13 | 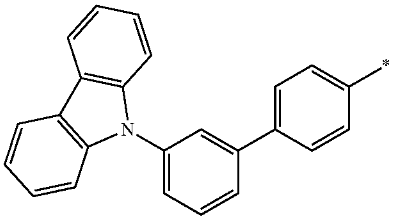 [SMILES: *c1ccc(-c2cccc(-n3c4ccccc4c4ccccc43)c2)cc1] | 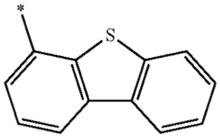 [SMILES: *c1cccc2c1sc1ccccc12] | 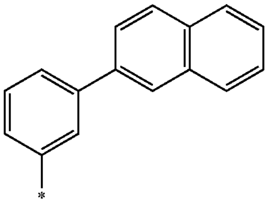 [SMILES: *c1cccc(-c2ccc3ccccc3c2)c1] |
| Q14 | 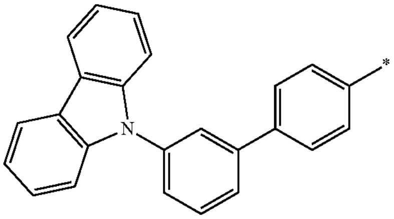 [SMILES: *c1ccc(-c2cccc(-n3c4ccccc4c4ccccc43)c2)cc1] | 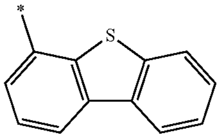 [SMILES: *c1cccc2c1sc1ccccc12] | 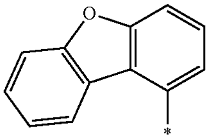 |
| Q15 | 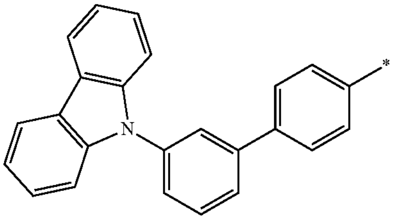 [SMILES: *c1ccc(-c2cccc(-n3c4ccccc4c4ccccc43)c2)cc1] | 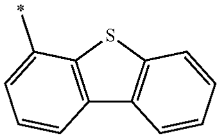 [SMILES: *c1cccc2c1sc1ccccc12] | 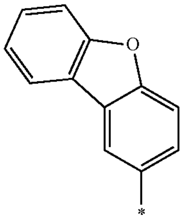 [SMILES: *c1ccc2oc3ccccc3c2c1] |
| Q16 | 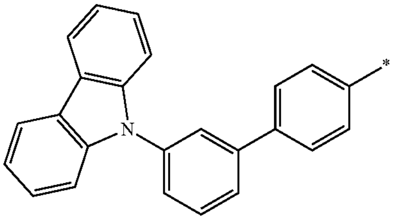 [SMILES: *c1ccc(-c2cccc(-n3c4ccccc4c4ccccc43)c2)cc1] | 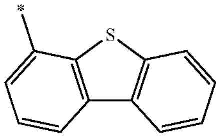 [SMILES: *c1cccc2c1sc1ccccc12] | 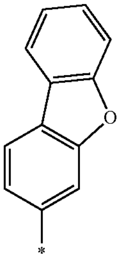 [SMILES: *c1ccc2c(c1)oc1ccccc12] |
| Q17 | 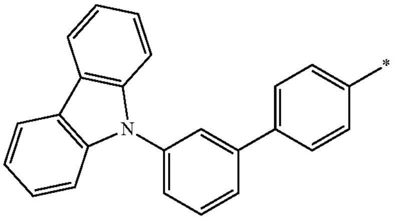 [SMILES: *c1ccc(-c2cccc(-n3c4ccccc4c4ccccc43)c2)cc1] | 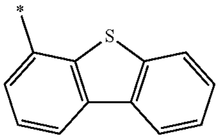 [SMILES: *c1cccc2c1sc1ccccc12] | 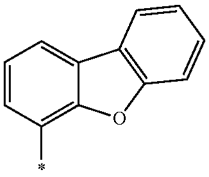 |

-continued
Compound Group 1
| Formula 1 | $Ar_1$ | $Ar_2$ | $Ar_3$ |
|---|---|---|---|
| Q18 | 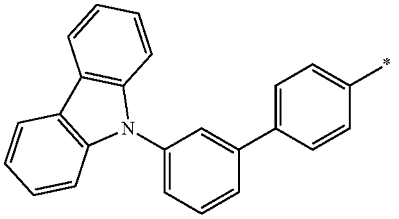 [SMILES: *c1ccc(-c2cccc(-n3c4ccccc4c4ccccc43)c2)cc1] | 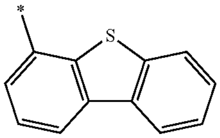 [SMILES: *c1cccc2c1sc1ccccc12] | 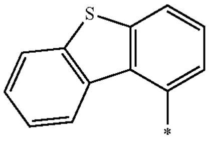 |
| Q19 | 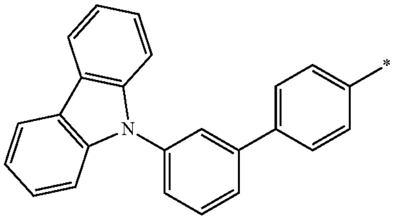 [SMILES: *c1ccc(-c2cccc(-n3c4ccccc4c4ccccc43)c2)cc1] | 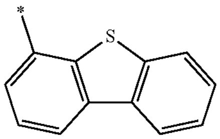 [SMILES: *c1cccc2c1sc1ccccc12] | 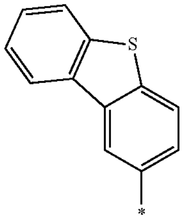 |
| Q20 | 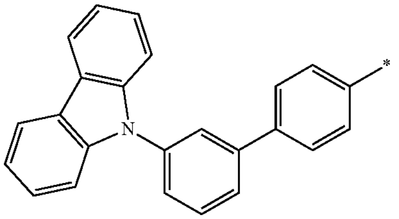 [SMILES: *c1ccc(-c2cccc(-n3c4ccccc4c4ccccc43)c2)cc1] | 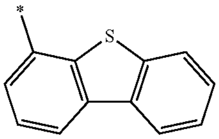 | 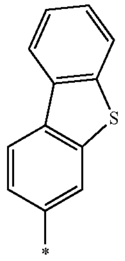 [SMILES: *c1ccc2c(c1)sc1ccccc12] |
| Q21 | 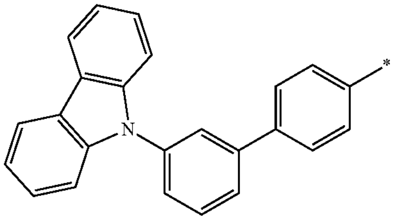 [SMILES: *c1ccc(-c2cccc(-n3c4ccccc4c4ccccc43)c2)cc1] | 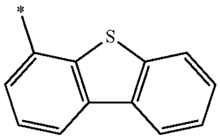 [SMILES: *c1cccc2c1sc1ccccc12] | 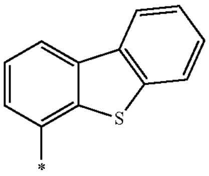 |
| Q22 | 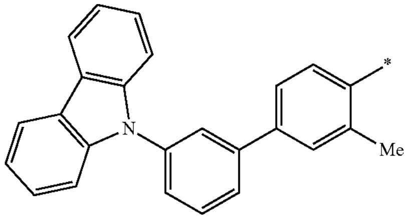 [SMILES: *c1ccc(-c2cccc(-n3c4ccccc4c4ccccc43)c2)cc1C] | 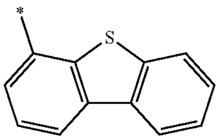 | 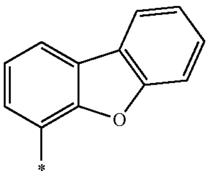 [SMILES: *c1cccc2c1oc1ccccc12] |
| Q23 | 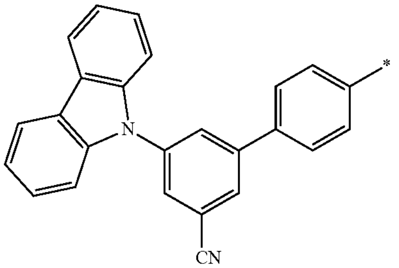 [SMILES: *c1ccc(-c2cc(C#N)cc(-n3c4ccccc4c4ccccc43)c2)cc1] | 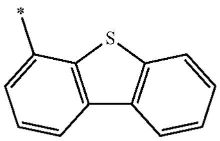 [SMILES: *c1cccc2c1sc1ccccc12] | 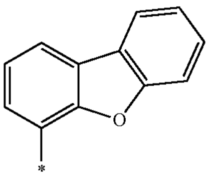 |

-continued
Compound Group 1
| Formula 1 | $Ar_1$ | $Ar_2$ | $Ar_3$ |
|---|---|---|---|
| Q24 | 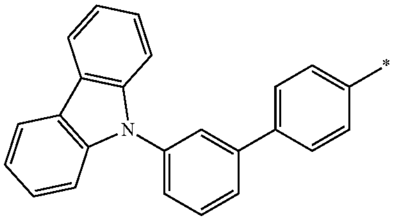 [SMILES: *c1ccc(-c2cccc(-n3c4ccccc4c4ccccc43)c2)cc1] | 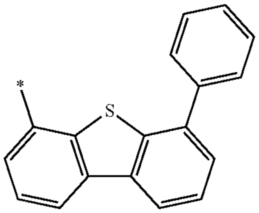 [SMILES: *c1cccc2c1sc1c(-c3ccccc3)cccc12] | 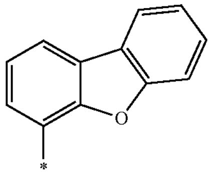 |
| Q25 | 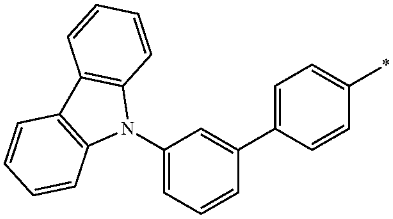 [SMILES: *c1ccc(-c2cccc(-n3c4ccccc4c4ccccc43)c2)cc1] | 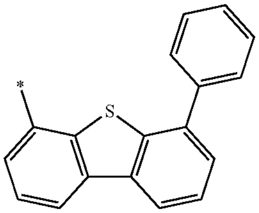 [SMILES: *c1cccc2c1sc1c(-c3ccccc3)cccc12] | 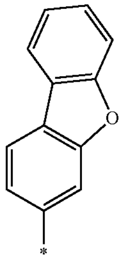 [SMILES: *c1ccc2c(c1)oc1ccccc12] |
| Q26 | 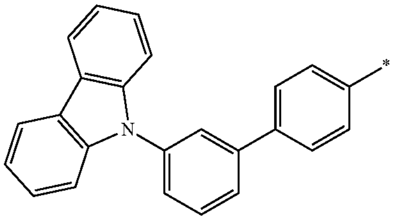 [SMILES: *c1ccc(-c2cccc(-n3c4ccccc4c4ccccc43)c2)cc1] | 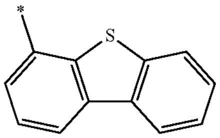 [SMILES: *c1cccc2c1sc1ccccc12] | 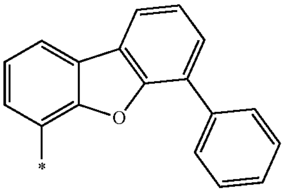 [SMILES: *c1cccc2c1oc1c(-c3ccccc3)cccc12] |
| Q27 | 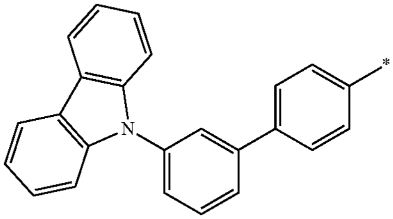 [SMILES: *c1ccc(-c2cccc(-n3c4ccccc4c4ccccc43)c2)cc1] | 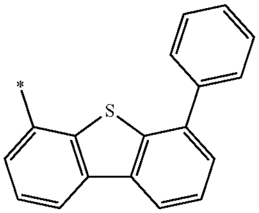 [SMILES: *c1cccc2c1sc1c(-c3ccccc3)cccc12] | 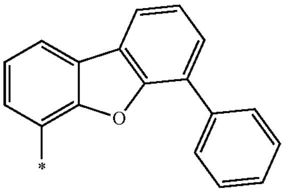 [SMILES: *c1cccc2c1oc1c(-c3ccccc3)cccc12] |
| S1 | 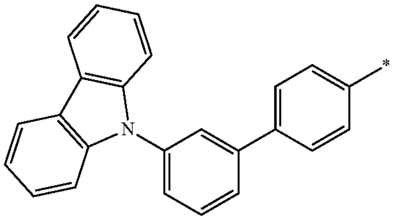 [SMILES: *c1ccc(-c2cccc(-n3c4ccccc4c4ccccc43)c2)cc1] | 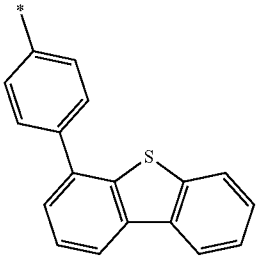 [SMILES: *c1ccc(-c2cccc3c2sc2ccccc23)cc1] | 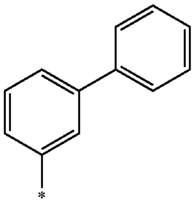 [SMILES: *c1cccc(-c2ccccc2)c1] |
| S2 | 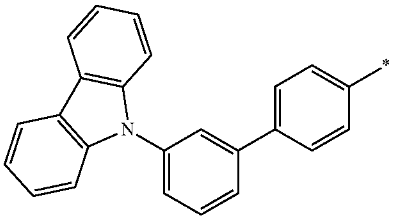 [SMILES: *c1ccc(-c2cccc(-n3c4ccccc4c4ccccc43)c2)cc1] | 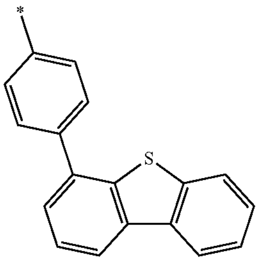 [SMILES: *c1ccc(-c2cccc3c2sc2ccccc23)cc1] | 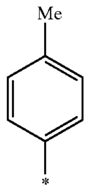 [SMILES: *c1ccc(C)cc1] |

-continued
Compound Group 1
| Formula 1 | $Ar_1$ | $Ar_2$ | $Ar_3$ |
|---|---|---|---|
| S3 | 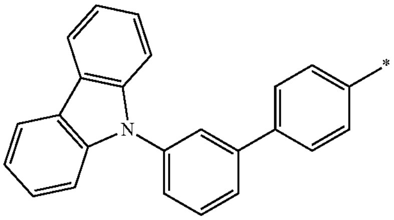 [SMILES: *c1ccc(-c2cccc(-n3c4ccccc4c4ccccc43)c2)cc1] | 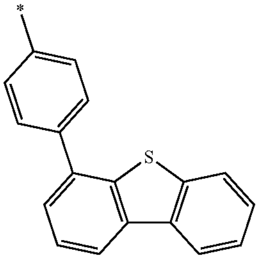 [SMILES: *c1ccc(-c2cccc3c2sc2ccccc23)cc1] | 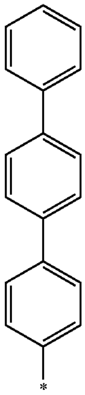 [SMILES: *c1ccc(-c2ccc(-c3ccccc3)cc2)cc1] |
| S4 | 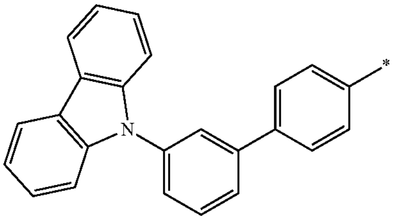 [SMILES: *c1ccc(-c2cccc(-n3c4ccccc4c4ccccc43)c2)cc1] | 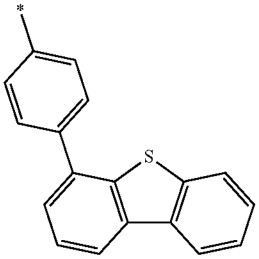 [SMILES: *c1ccc(-c2cccc3c2sc2ccccc23)cc1] | 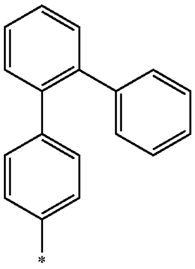 [SMILES: *c1ccc(-c2ccccc2-c2ccccc2)cc1] |
| S5 | 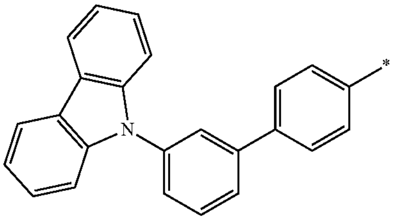 [SMILES: *c1ccc(-c2cccc(-n3c4ccccc4c4ccccc43)c2)cc1] | 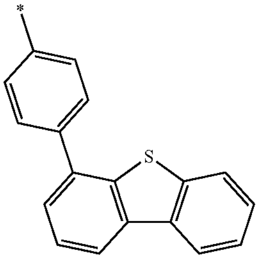 [SMILES: *c1ccc(-c2cccc3c2sc2ccccc23)cc1] | 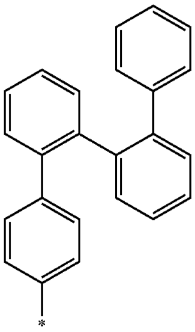 [SMILES: *c1ccc(-c2ccccc2-c2ccccc2-c2ccccc2)cc1] |
| S6 | 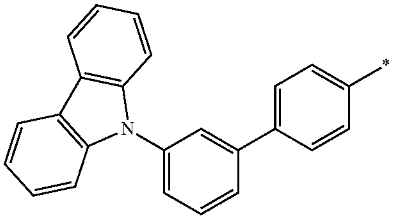 [SMILES: *c1ccc(-c2cccc(-n3c4ccccc4c4ccccc43)c2)cc1] | 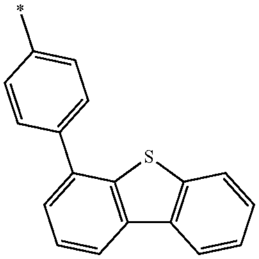 [SMILES: *c1ccc(-c2cccc3c2sc2ccccc23)cc1] | 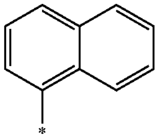 [SMILES: *c1cccc2ccccc12] |

-continued
| Compound Group 1 | | | |
|---|---|---|---|
| Formula 1 | $Ar_1$ | $Ar_2$ | $Ar_3$ |
| S7 | 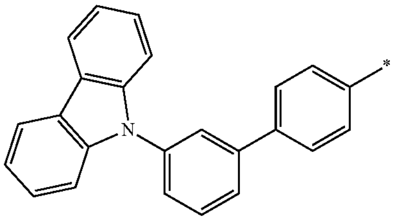 [SMILES: *c1ccc(-c2cccc(-n3c4ccccc4c4ccccc43)c2)cc1] | 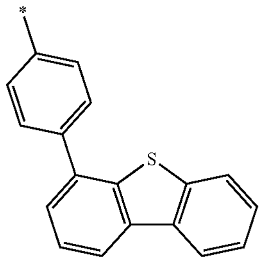 [SMILES: *c1ccc(-c2cccc3c2sc2ccccc23)cc1] | 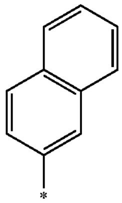 [SMILES: *c1ccc2ccccc2c1] |
| S8 | 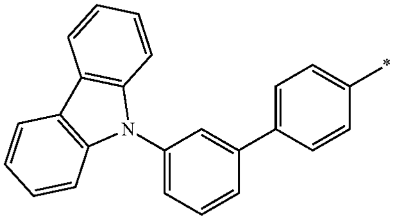 [SMILES: *c1ccc(-c2cccc(-n3c4ccccc4c4ccccc43)c2)cc1] | 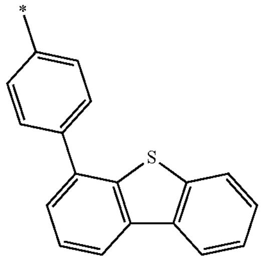 [SMILES: *c1ccc(-c2cccc3c2sc2ccccc23)cc1] | 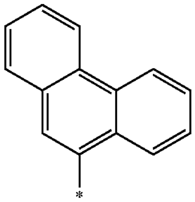 [SMILES: *c1cc2ccccc2c2ccccc12] |
| S9 | 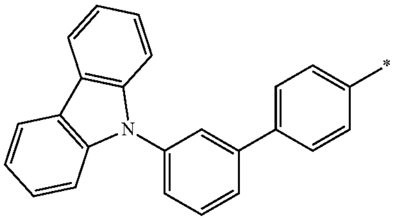 [SMILES: *c1ccc(-c2cccc(-n3c4ccccc4c4ccccc43)c2)cc1] | 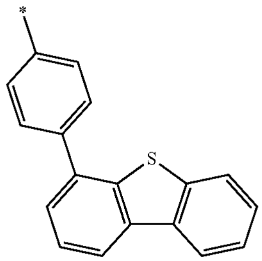 [SMILES: *c1ccc(-c2cccc3c2sc2ccccc23)cc1] | 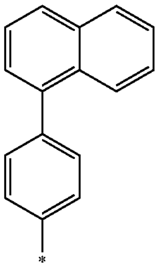 [SMILES: *c1ccc(-c2cccc3ccccc23)cc1] |
| S10 | 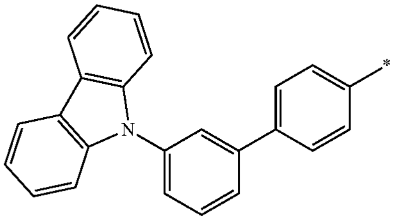 [SMILES: *c1ccc(-c2cccc(-n3c4ccccc4c4ccccc43)c2)cc1] | 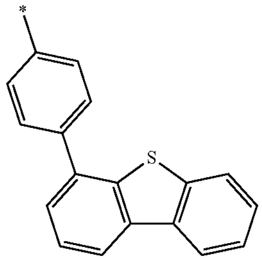 [SMILES: *c1ccc(-c2cccc3c2sc2ccccc23)cc1] | 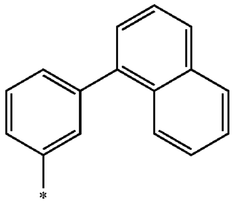 [SMILES: *c1cccc(-c2cccc3ccccc23)c1] |
| S11 | 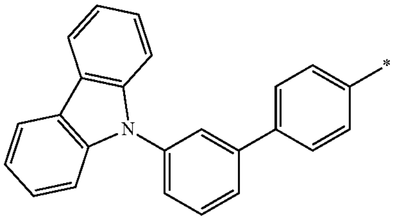 [SMILES: *c1ccc(-c2cccc(-n3c4ccccc4c4ccccc43)c2)cc1] | 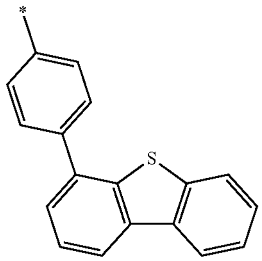 [SMILES: *c1ccc(-c2cccc3c2sc2ccccc23)cc1] | 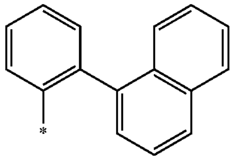 [SMILES: *c1ccccc1-c1cccc2ccccc12] |

-continued
Compound Group 1
| Formula 1 | $Ar_1$ | $Ar_2$ | $Ar_3$ |
|---|---|---|---|
| S12 | 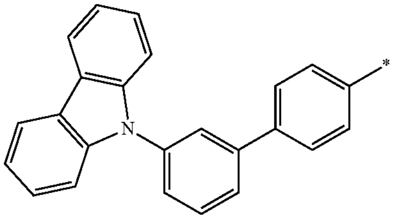 [SMILES: *c1ccc(-c2cccc(-n3c4ccccc4c4ccccc43)c2)cc1] | 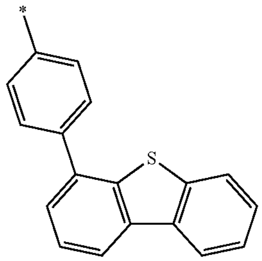 [SMILES: *c1ccc(-c2cccc3c2sc2ccccc23)cc1] | 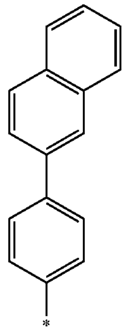 [SMILES: *c1ccc(-c2ccc3ccccc3c2)cc1] |
| S13 | 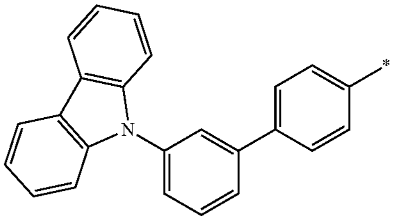 [SMILES: *c1ccc(-c2cccc(-n3c4ccccc4c4ccccc43)c2)cc1] | 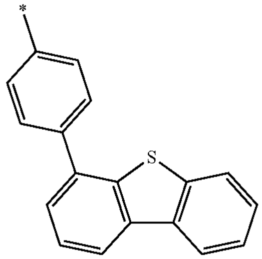 [SMILES: *c1ccc(-c2cccc3c2sc2ccccc23)cc1] | 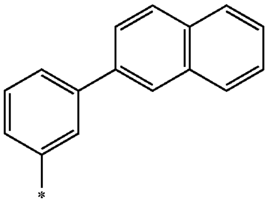 [SMILES: *c1cccc(-c2ccc3ccccc3c2)c1] |
| S14 | 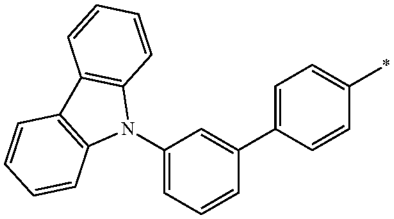 [SMILES: *c1ccc(-c2cccc(-n3c4ccccc4c4ccccc43)c2)cc1] | 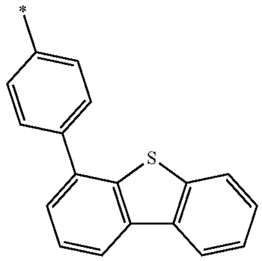 [SMILES: *c1ccc(-c2cccc3c2sc2ccccc23)cc1] | 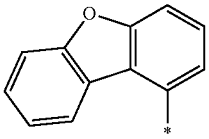 |
| S15 | 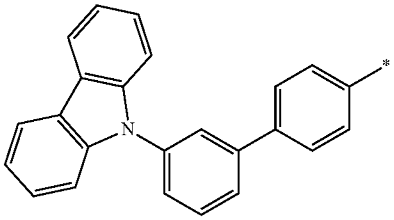 [SMILES: *c1ccc(-c2cccc(-n3c4ccccc4c4ccccc43)c2)cc1] | 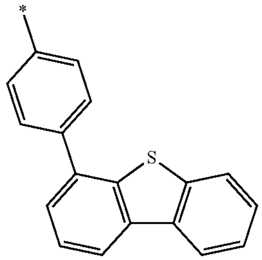 [SMILES: *c1ccc(-c2cccc3c2sc2ccccc23)cc1] | 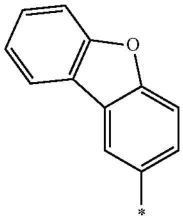 [SMILES: *c1ccc2oc3ccccc3c2c1] |
| S16 | 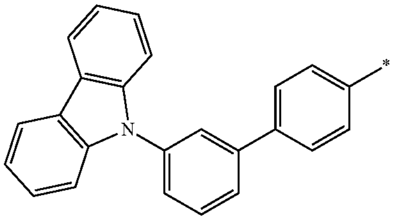 [SMILES: *c1ccc(-c2cccc(-n3c4ccccc4c4ccccc43)c2)cc1] | 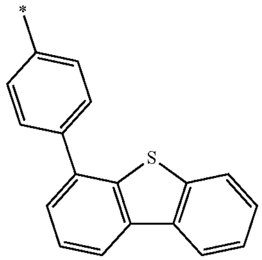 [SMILES: *c1ccc(-c2cccc3c2sc2ccccc23)cc1] | 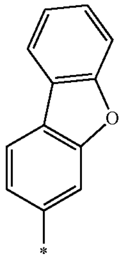 [SMILES: *c1ccc2c(c1)oc1ccccc12] |

-continued
| Compound Group 1 | | | |
|---|---|---|---|
| Formula 1 | $Ar_1$ | $Ar_2$ | $Ar_3$ |
| S17 | 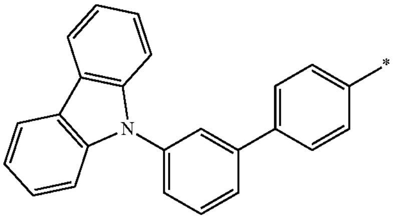 [SMILES: *c1ccc(-c2cccc(-n3c4ccccc4c4ccccc43)c2)cc1] | 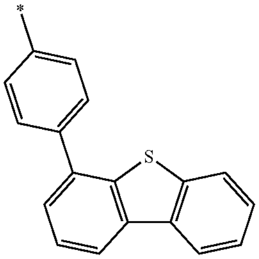 [SMILES: *c1ccc(-c2cccc3c2sc2ccccc23)cc1] | 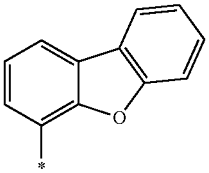 |
| S18 | 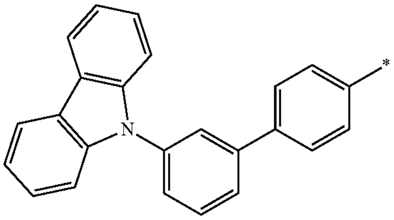 [SMILES: *c1ccc(-c2cccc(-n3c4ccccc4c4ccccc43)c2)cc1] | 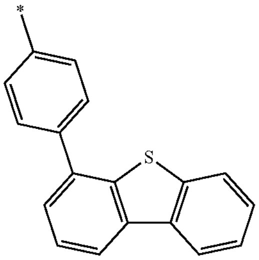 [SMILES: *c1ccc(-c2cccc3c2sc2ccccc23)cc1] | 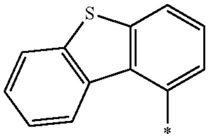 |
| S19 | 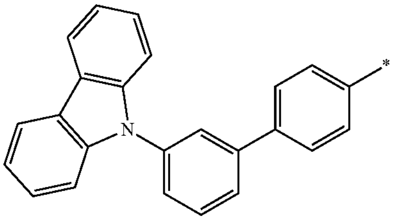 [SMILES: *c1ccc(-c2cccc(-n3c4ccccc4c4ccccc43)c2)cc1] | 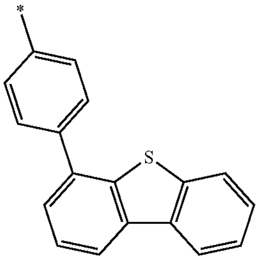 [SMILES: *c1ccc(-c2cccc3c2sc2ccccc23)cc1] | 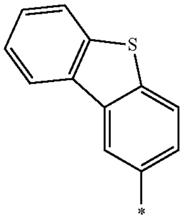 [SMILES: *c1ccc2sc3ccccc3c2c1] |
| S20 | 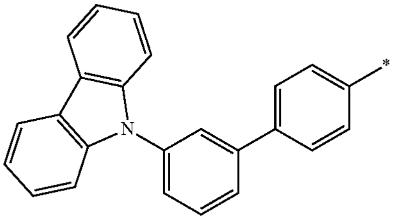 [SMILES: *c1ccc(-c2cccc(-n3c4ccccc4c4ccccc43)c2)cc1] | 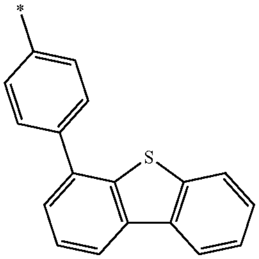 [SMILES: *c1ccc(-c2cccc3c2sc2ccccc23)cc1] | 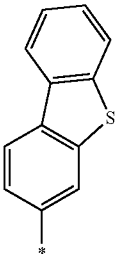 [SMILES: *c1ccc2c(c1)sc1ccccc12] |
| S21 | 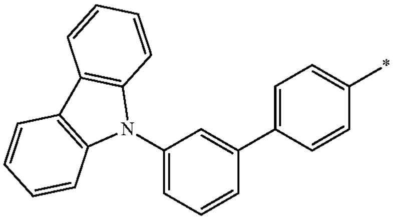 [SMILES: *c1ccc(-c2cccc(-n3c4ccccc4c4ccccc43)c2)cc1] | 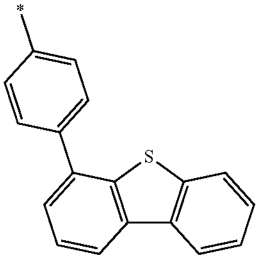 [SMILES: *c1ccc(-c2cccc3c2sc2ccccc23)cc1] | 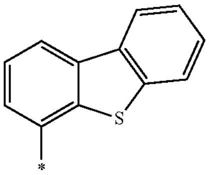 |

-continued
| Compound Group 1 | | | |
|---|---|---|---|
| Formula 1 | $Ar_1$ | $Ar_2$ | $Ar_3$ |
| S22 | 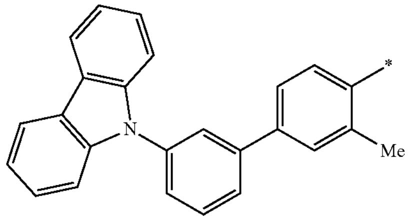 [SMILES: *c1ccc(-c2cccc(-n3c4ccccc4c4ccccc43)c2)cc1C] | 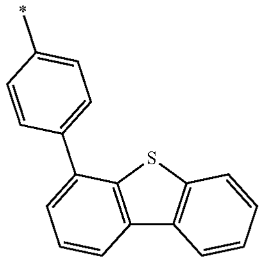 [SMILES: *c1ccc(-c2cccc3c2sc2ccccc23)cc1] | 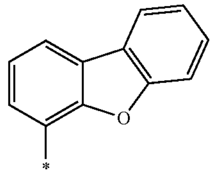 |
| S23 | 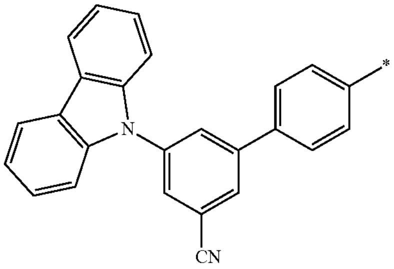 [SMILES: *c1ccc(-c2cc(C#N)cc(-n3c4ccccc4c4ccccc43)c2)cc1] | 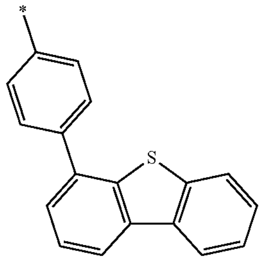 [SMILES: *c1ccc(-c2cccc3c2sc2ccccc23)cc1] | 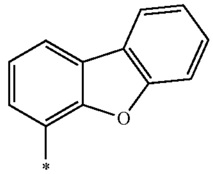 |
| T1 | 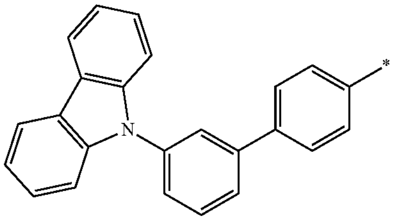 [SMILES: *c1ccc(-c2cccc(-n3c4ccccc4c4ccccc43)c2)cc1] | 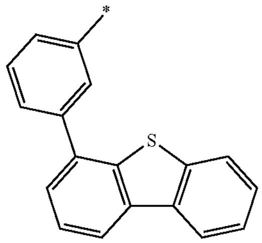 [SMILES: *c1cccc(-c2cccc3c2sc2ccccc23)c1] | 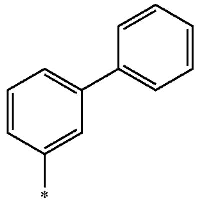 [SMILES: *c1cccc(-c2ccccc2)c1] |
| T2 | 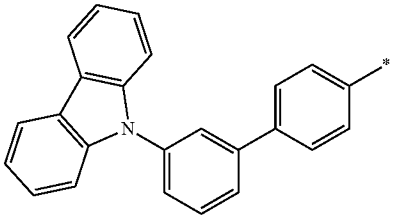 [SMILES: *c1ccc(-c2cccc(-n3c4ccccc4c4ccccc43)c2)cc1] | 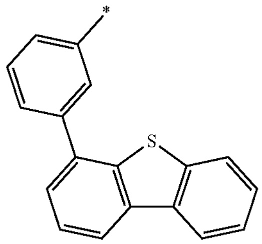 [SMILES: *c1cccc(-c2cccc3c2sc2ccccc23)c1] | 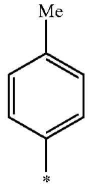 [SMILES: *c1ccc(C)cc1] |
| T3 | 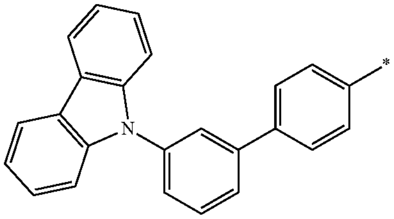 [SMILES: *c1ccc(-c2cccc(-n3c4ccccc4c4ccccc43)c2)cc1] | 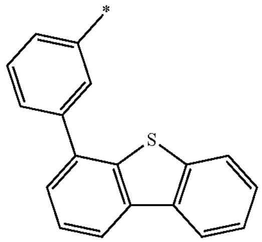 [SMILES: *c1cccc(-c2cccc3c2sc2ccccc23)c1] | 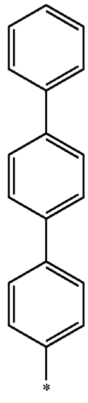 [SMILES: *c1ccc(-c2ccc(-c3ccccc3)cc2)cc1] |

-continued
Compound Group 1
| Formula 1 | $Ar_1$ | $Ar_2$ | $Ar_3$ |
|---|---|---|---|
| T4 | 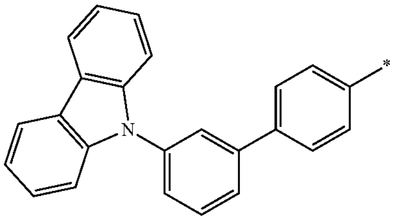 [SMILES: *c1ccc(-c2cccc(-n3c4ccccc4c4ccccc43)c2)cc1] | 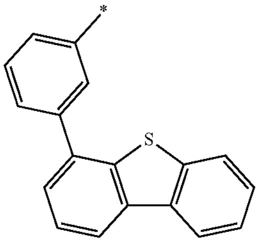 [SMILES: *c1cccc(-c2cccc3c2sc2ccccc23)c1] | 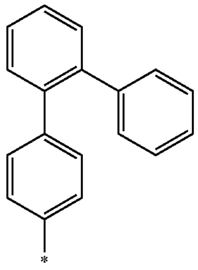 [SMILES: *c1ccc(-c2ccccc2-c2ccccc2)cc1] |
| T5 | 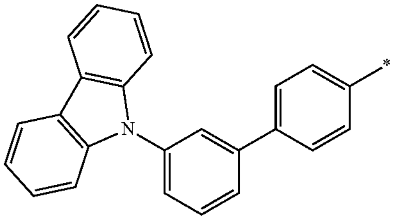 [SMILES: *c1ccc(-c2cccc(-n3c4ccccc4c4ccccc43)c2)cc1] | 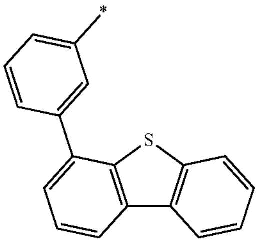 [SMILES: *c1cccc(-c2cccc3c2sc2ccccc23)c1] | 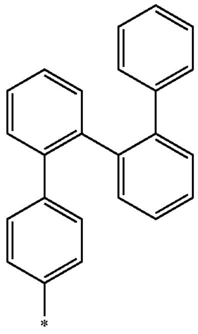 [SMILES: *c1ccc(-c2ccccc2-c2ccccc2-c2ccccc2)cc1] |
| T6 | 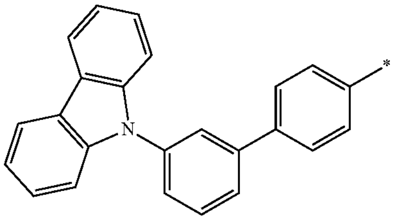 [SMILES: *c1ccc(-c2cccc(-n3c4ccccc4c4ccccc43)c2)cc1] | 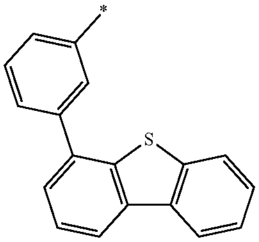 [SMILES: *c1cccc(-c2cccc3c2sc2ccccc23)c1] | 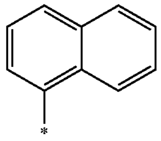 [SMILES: *c1cccc2ccccc12] |
| T7 | 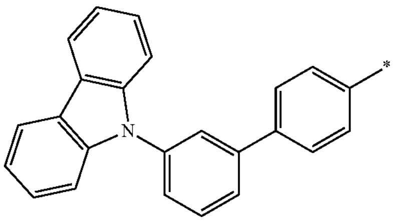 [SMILES: *c1ccc(-c2cccc(-n3c4ccccc4c4ccccc43)c2)cc1] | 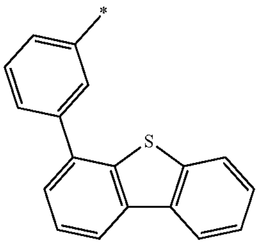 [SMILES: *c1cccc(-c2cccc3c2sc2ccccc23)c1] | 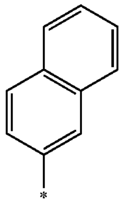 [SMILES: *c1ccc2ccccc2c1] |
| T8 | 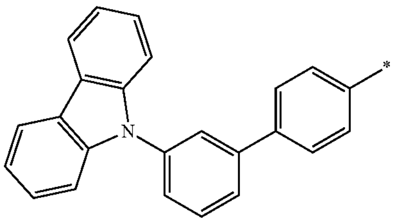 [SMILES: *c1ccc(-c2cccc(-n3c4ccccc4c4ccccc43)c2)cc1] | 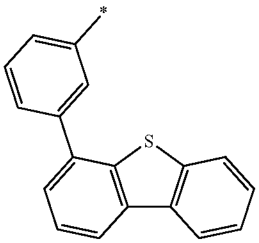 [SMILES: *c1cccc(-c2cccc3c2sc2ccccc23)c1] | 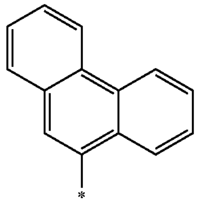 [SMILES: *c1cc2ccccc2c2ccccc12] |

-continued
| Compound Group 1 | | | |
|---|---|---|---|
| Formula 1 | $Ar_1$ | $Ar_2$ | $Ar_3$ |
| T9 | 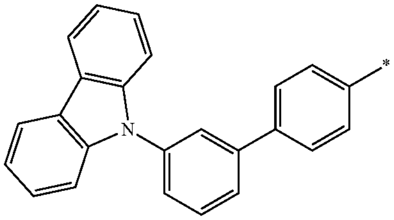 [SMILES: *c1ccc(-c2cccc(-n3c4ccccc4c4ccccc43)c2)cc1] | 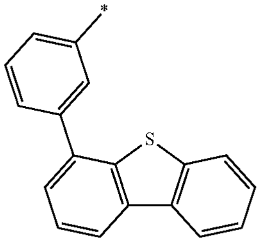 [SMILES: *c1cccc(-c2cccc3c2sc2ccccc23)c1] | 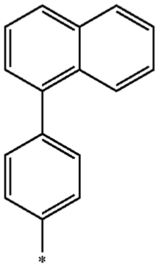 [SMILES: *c1ccc(-c2cccc3ccccc23)cc1] |
| T10 | 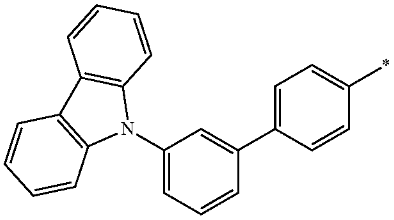 [SMILES: *c1ccc(-c2cccc(-n3c4ccccc4c4ccccc43)c2)cc1] | 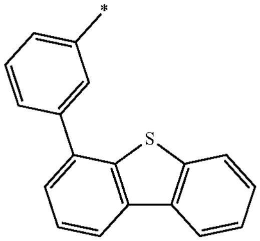 [SMILES: *c1cccc(-c2cccc3c2sc2ccccc23)c1] | 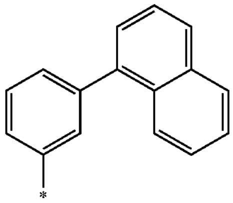 [SMILES: *c1cccc(-c2cccc3ccccc23)c1] |
| T11 | 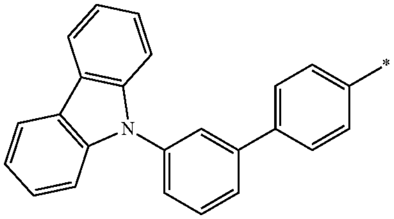 [SMILES: *c1ccc(-c2cccc(-n3c4ccccc4c4ccccc43)c2)cc1] | 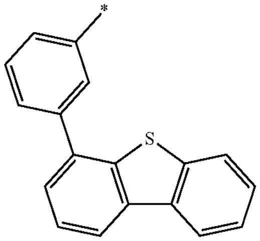 [SMILES: *c1cccc(-c2cccc3c2sc2ccccc23)c1] | 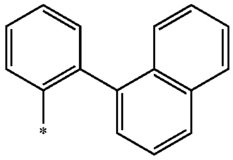 [SMILES: *c1ccccc1-c1cccc2ccccc12] |
| T12 | 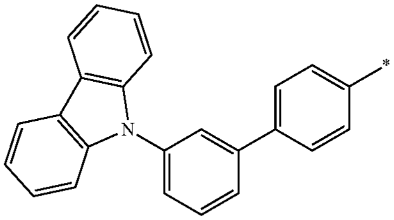 [SMILES: *c1ccc(-c2cccc(-n3c4ccccc4c4ccccc43)c2)cc1] | 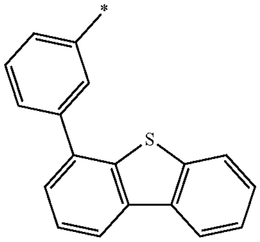 [SMILES: *c1cccc(-c2cccc3c2sc2ccccc23)c1] | 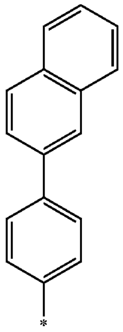 [SMILES: *c1ccc(-c2ccc3ccccc3c2)cc1] |
| T13 | 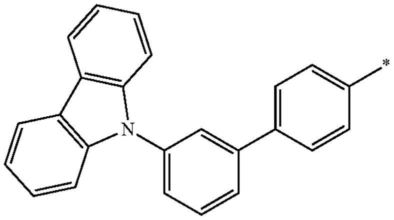 [SMILES: *c1ccc(-c2cccc(-n3c4ccccc4c4ccccc43)c2)cc1] | 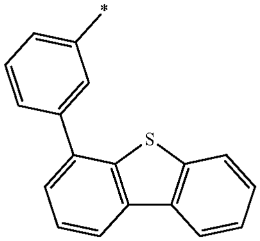 [SMILES: *c1cccc(-c2cccc3c2sc2ccccc23)c1] | 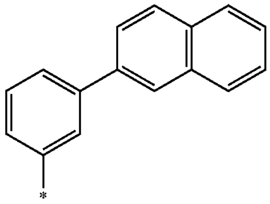 [SMILES: *c1cccc(-c2ccc3ccccc3c2)c1] |

-continued
Compound Group 1
| Formula 1 | $Ar_1$ | $Ar_2$ | $Ar_3$ |
|---|---|---|---|
| T14 | 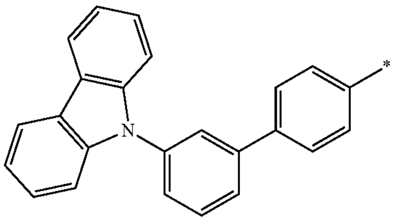 [SMILES: *c1ccc(-c2cccc(-n3c4ccccc4c4ccccc43)c2)cc1] | 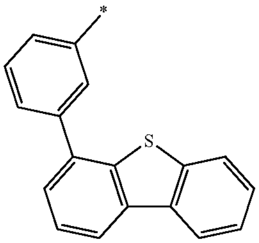 [SMILES: *c1cccc(-c2cccc3c2sc2ccccc23)c1] | 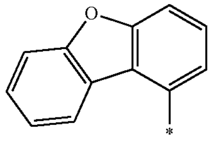 |
| T15 | 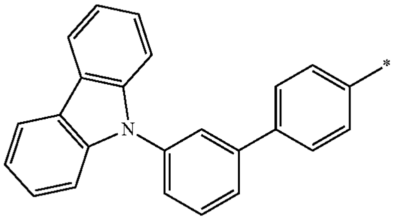 [SMILES: *c1ccc(-c2cccc(-n3c4ccccc4c4ccccc43)c2)cc1] | 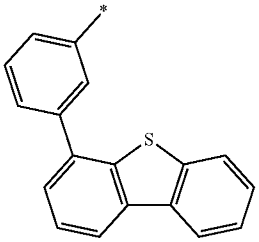 [SMILES: *c1cccc(-c2cccc3c2sc2ccccc23)c1] | 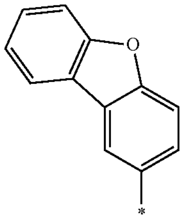 [SMILES: *c1ccc2oc3ccccc3c2c1] |
| T16 | 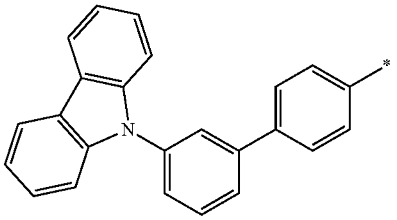 [SMILES: *c1ccc(-c2cccc(-n3c4ccccc4c4ccccc43)c2)cc1] | 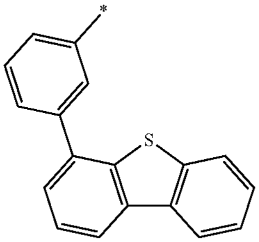 [SMILES: *c1cccc(-c2cccc3c2sc2ccccc23)c1] | 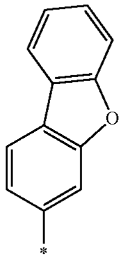 [SMILES: *c1ccc2c(c1)oc1ccccc12] |
| T17 | 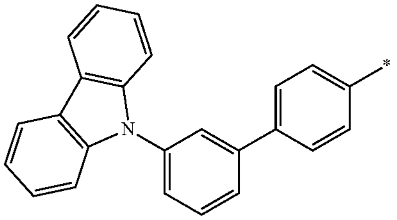 [SMILES: *c1ccc(-c2cccc(-n3c4ccccc4c4ccccc43)c2)cc1] | 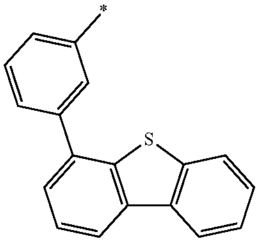 [SMILES: *c1cccc(-c2cccc3c2sc2ccccc23)c1] | 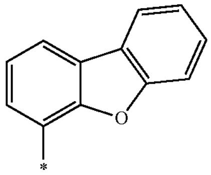 [SMILES: *c1cccc2c1oc1ccccc12] |
| T18 | 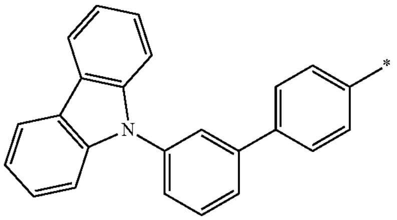 [SMILES: *c1ccc(-c2cccc(-n3c4ccccc4c4ccccc43)c2)cc1] | 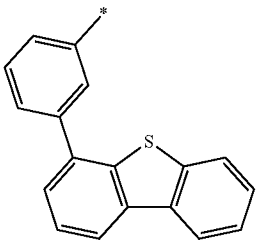 [SMILES: *c1cccc(-c2cccc3c2sc2ccccc23)c1] | 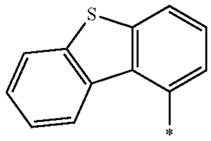 |
| T19 | 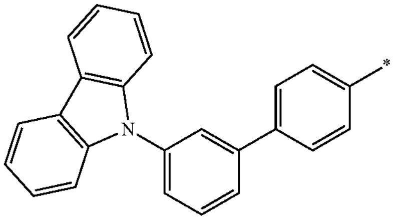 [SMILES: *c1ccc(-c2cccc(-n3c4ccccc4c4ccccc43)c2)cc1] | 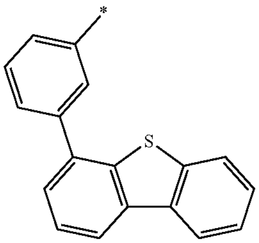 [SMILES: *c1cccc(-c2cccc3c2sc2ccccc23)c1] | 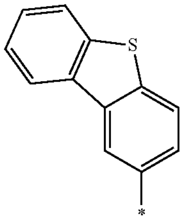 [SMILES: *c1ccc2sc3ccccc3c2c1] |

-continued
| Compound Group 1 | | | |
|---|---|---|---|
| Formula 1 | Ar<sub></sub>$Ar_1$ | $Ar_2$ | $Ar_3$ |
| T20 | 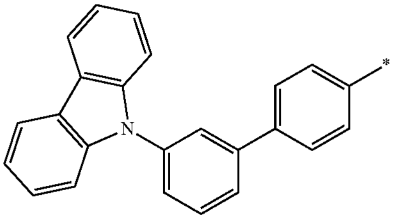 [SMILES: *c1ccc(-c2cccc(-n3c4ccccc4c4ccccc43)c2)cc1] | 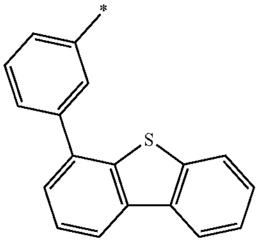 [SMILES: *c1cccc(-c2cccc3c2sc2ccccc23)c1] | 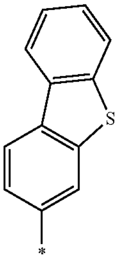 [SMILES: *c1ccc2c(c1)sc1ccccc12] |
| T21 | 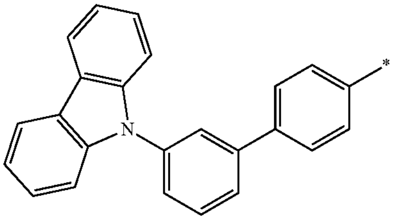 [SMILES: *c1ccc(-c2cccc(-n3c4ccccc4c4ccccc43)c2)cc1] | 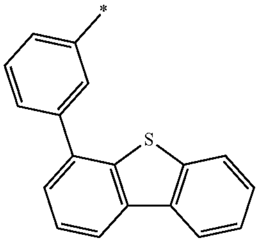 [SMILES: *c1cccc(-c2cccc3c2sc2ccccc23)c1] | 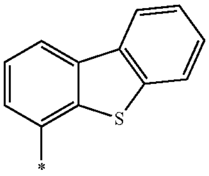 [SMILES: *c1cccc2c1sc1ccccc12] |
| T22 | 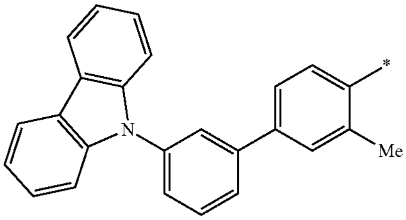 [SMILES: *c1ccc(-c2cccc(-n3c4ccccc4c4ccccc43)c2)cc1C] | 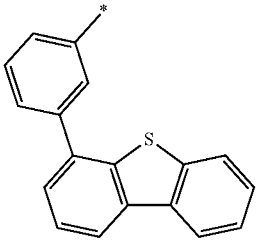 [SMILES: *c1cccc(-c2cccc3c2sc2ccccc23)c1] | 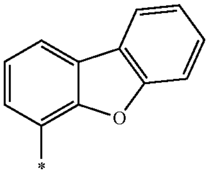 [SMILES: *c1cccc2c1oc1ccccc12] |
| T23 | 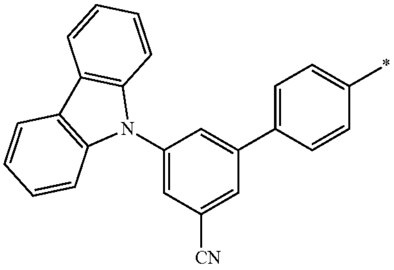 [SMILES: *c1ccc(-c2cc(C#N)cc(-n3c4ccccc4c4ccccc43)c2)cc1] | 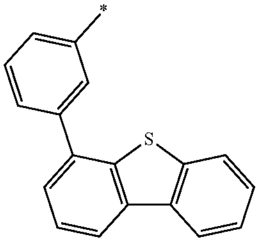 [SMILES: *c1cccc(-c2cccc3c2sc2ccccc23)c1] | 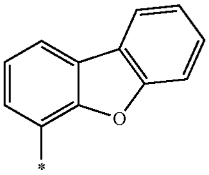 [SMILES: *c1cccc2c1oc1ccccc12] |
| U1 | 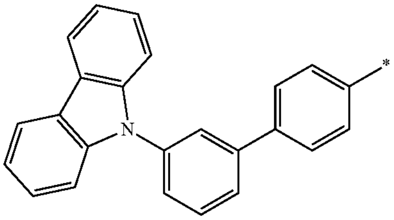 [SMILES: *c1ccc(-c2cccc(-n3c4ccccc4c4ccccc43)c2)cc1] | 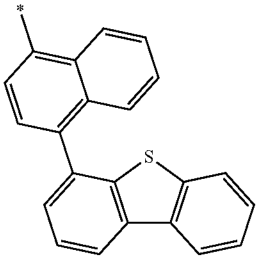 [SMILES: *c1ccc(-c2cccc3c2sc2ccccc23)c2ccccc12] | 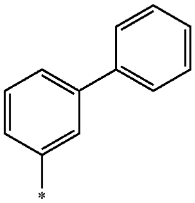 [SMILES: *c1cccc(-c2ccccc2)c1] |

-continued
| Compound Group 1 | | | |
|---|---|---|---|
| Formula 1 | $Ar_1$ | $Ar_2$ | $Ar_3$ |
| U2 | 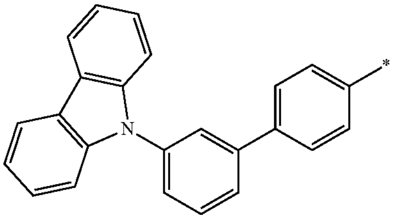 [SMILES: *c1ccc(-c2cccc(-n3c4ccccc4c4ccccc43)c2)cc1] | 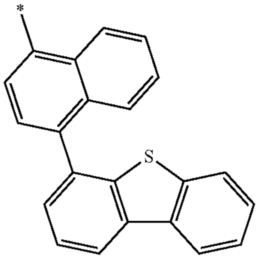 [SMILES: *c1ccc(-c2cccc3c2sc2ccccc23)c2ccccc12] | 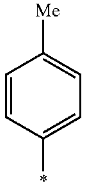 [SMILES: *c1ccc(C)cc1] |
| U3 | 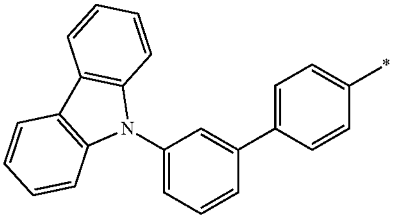 [SMILES: *c1ccc(-c2cccc(-n3c4ccccc4c4ccccc43)c2)cc1] | 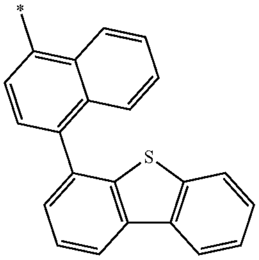 [SMILES: *c1ccc(-c2cccc3c2sc2ccccc23)c2ccccc12] | 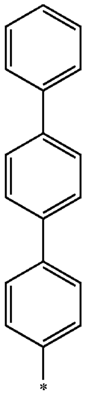 [SMILES: *c1ccc(-c2ccc(-c3ccccc3)cc2)cc1] |
| U4 | 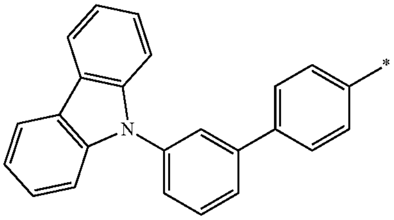 [SMILES: *c1ccc(-c2cccc(-n3c4ccccc4c4ccccc43)c2)cc1] | 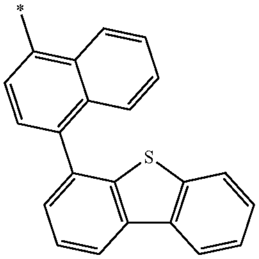 [SMILES: *c1ccc(-c2cccc3c2sc2ccccc23)c2ccccc12] | 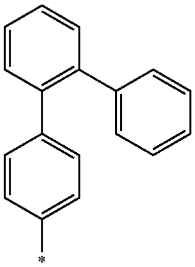 [SMILES: *c1ccc(-c2ccccc2-c2ccccc2)cc1] |
| U5 | 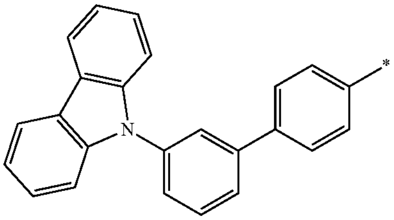 [SMILES: *c1ccc(-c2cccc(-n3c4ccccc4c4ccccc43)c2)cc1] | 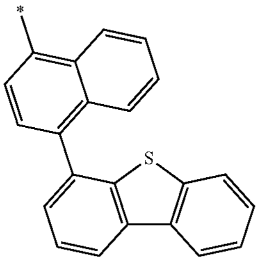 [SMILES: *c1ccc(-c2cccc3c2sc2ccccc23)c2ccccc12] | 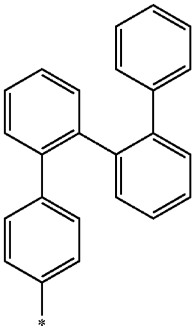 [SMILES: *c1ccc(-c2ccccc2-c2ccccc2-c2ccccc2)cc1] |

-continued
| Compound Group 1 | | | |
|---|---|---|---|
| Formula 1 | $Ar_1$ | $Ar_2$ | $Ar_3$ |
| U6 | 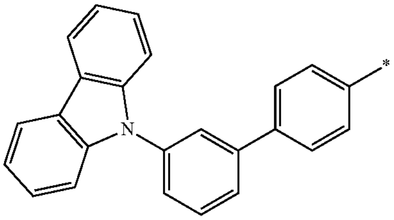 [SMILES: *c1ccc(-c2cccc(-n3c4ccccc4c4ccccc43)c2)cc1] | 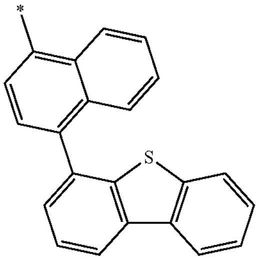 [SMILES: *c1ccc(-c2cccc3c2sc2ccccc23)c2ccccc12] | 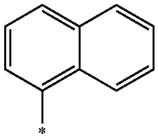 [SMILES: *c1cccc2ccccc12] |
| U7 | 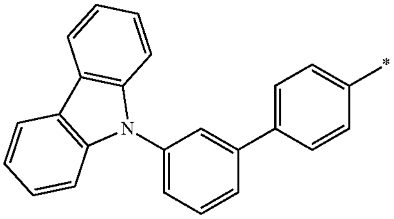 [SMILES: *c1ccc(-c2cccc(-n3c4ccccc4c4ccccc43)c2)cc1] | 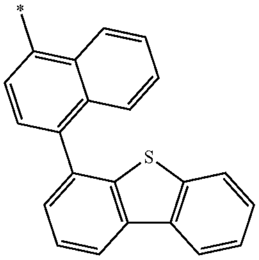 [SMILES: *c1ccc(-c2cccc3c2sc2ccccc23)c2ccccc12] | 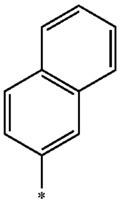 [SMILES: *c1ccc2ccccc2c1] |
| U8 | 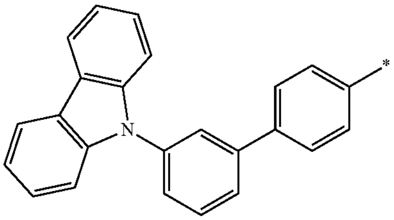 [SMILES: *c1ccc(-c2cccc(-n3c4ccccc4c4ccccc43)c2)cc1] | 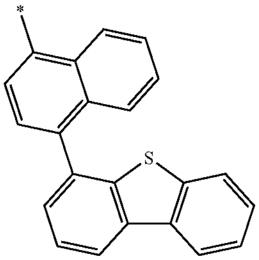 [SMILES: *c1ccc(-c2cccc3c2sc2ccccc23)c2ccccc12] | 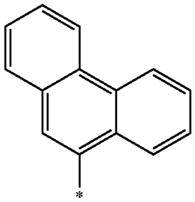 [SMILES: *c1cc2ccccc2c2ccccc12] |
| U9 | 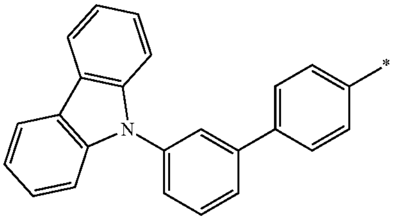 [SMILES: *c1ccc(-c2cccc(-n3c4ccccc4c4ccccc43)c2)cc1] | 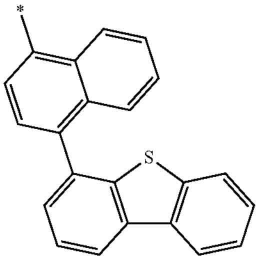 [SMILES: *c1ccc(-c2cccc3c2sc2ccccc23)c2ccccc12] | 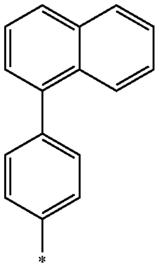 [SMILES: *c1ccc(-c2cccc3ccccc23)cc1] |
| U10 | 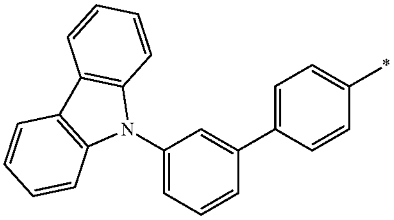 [SMILES: *c1ccc(-c2cccc(-n3c4ccccc4c4ccccc43)c2)cc1] | 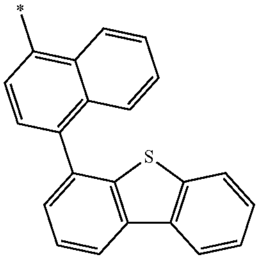 [SMILES: *c1ccc(-c2cccc3c2sc2ccccc23)c2ccccc12] | 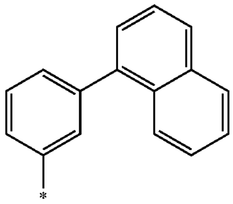 [SMILES: *c1cccc(-c2cccc3ccccc23)c1] |

-continued
Compound Group 1
| Formula 1 | $Ar_1$ | $Ar_2$ | $Ar_3$ |
|---|---|---|---|
| U11 | 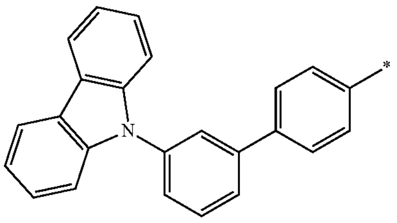 [SMILES: *c1ccc(-c2cccc(-n3c4ccccc4c4ccccc43)c2)cc1] | 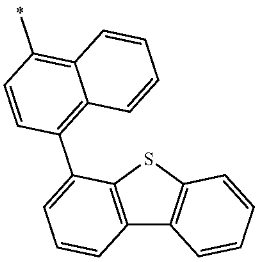 [SMILES: *c1ccc(-c2cccc3c2sc2ccccc23)c2ccccc12] | 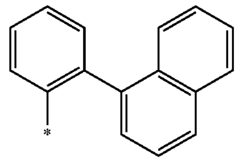 [SMILES: *c1ccccc1-c1cccc2ccccc12] |
| U12 | 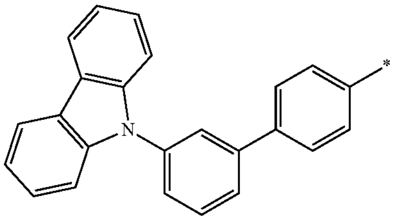 [SMILES: *c1ccc(-c2cccc(-n3c4ccccc4c4ccccc43)c2)cc1] | 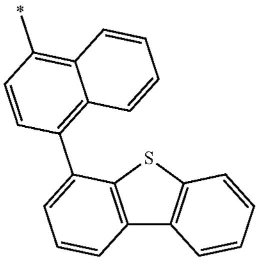 [SMILES: *c1ccc(-c2cccc3c2sc2ccccc23)c2ccccc12] | 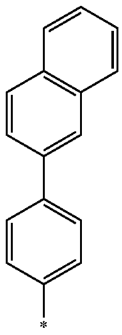 [SMILES: *c1ccc(-c2ccc3ccccc3c2)cc1] |
| U13 | 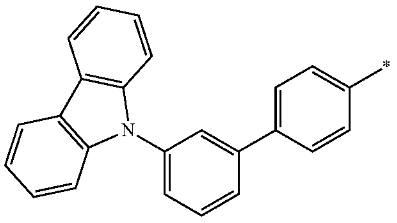 [SMILES: *c1ccc(-c2cccc(-n3c4ccccc4c4ccccc43)c2)cc1] | 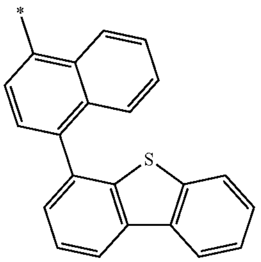 [SMILES: *c1ccc(-c2cccc3c2sc2ccccc23)c2ccccc12] | 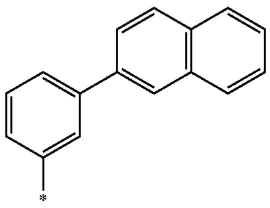 [SMILES: *c1cccc(-c2ccc3ccccc3c2)c1] |
| U14 | 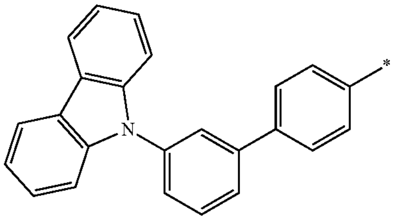 [SMILES: *c1ccc(-c2cccc(-n3c4ccccc4c4ccccc43)c2)cc1] | 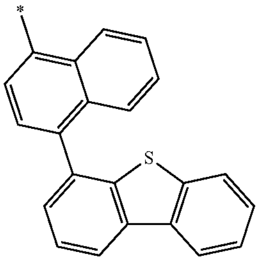 [SMILES: *c1ccc(-c2cccc3c2sc2ccccc23)c2ccccc12] | 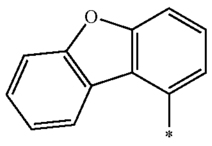 |
| U15 | 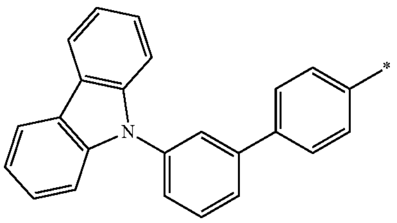 [SMILES: *c1ccc(-c2cccc(-n3c4ccccc4c4ccccc43)c2)cc1] | 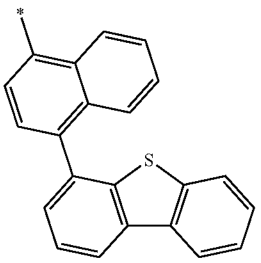 [SMILES: *c1ccc(-c2cccc3c2sc2ccccc23)c2ccccc12] | 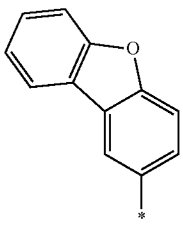 |

-continued
| Compound Group 1 | | | |
|---|---|---|---|
| Formula 1 | $Ar_1$ | $Ar_2$ | $Ar_3$ |
| U16 | 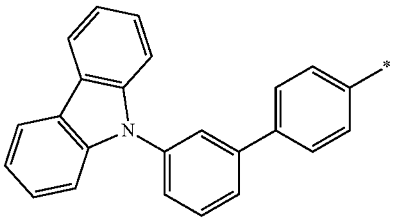 [SMILES: *c1ccc(-c2cccc(-n3c4ccccc4c4ccccc43)c2)cc1] | 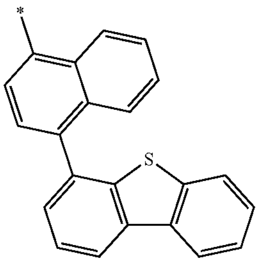 [SMILES: *c1ccc(-c2cccc3c2sc2ccccc23)c2ccccc12] | 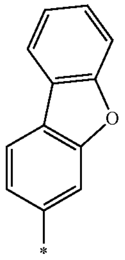 [SMILES: *c1ccc2c(c1)oc1ccccc12] |
| U17 | 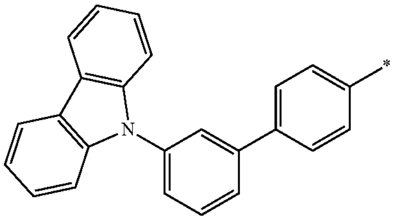 [SMILES: *c1ccc(-c2cccc(-n3c4ccccc4c4ccccc43)c2)cc1] | 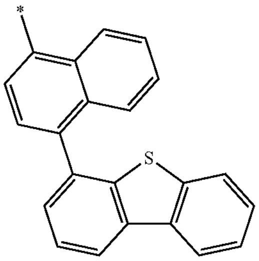 [SMILES: *c1ccc(-c2cccc3c2sc2ccccc23)c2ccccc12] | 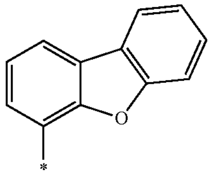 [SMILES: *c1cccc2c1oc1ccccc12] |
| U18 | 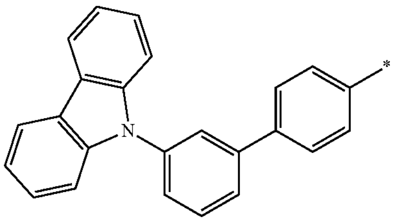 [SMILES: *c1ccc(-c2cccc(-n3c4ccccc4c4ccccc43)c2)cc1] | 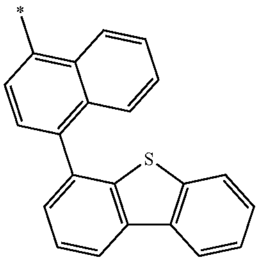 [SMILES: *c1ccc(-c2cccc3c2sc2ccccc23)c2ccccc12] | 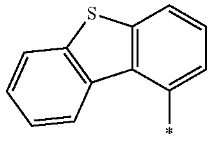 [SMILES: *c1cccc2sc3ccccc3c12] |
| U19 | 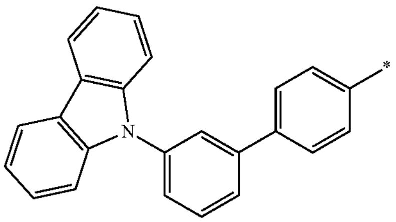 [SMILES: *c1ccc(-c2cccc(-n3c4ccccc4c4ccccc43)c2)cc1] | 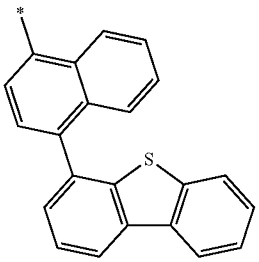 [SMILES: *c1ccc(-c2cccc3c2sc2ccccc23)c2ccccc12] | 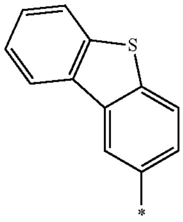 |
| U20 | 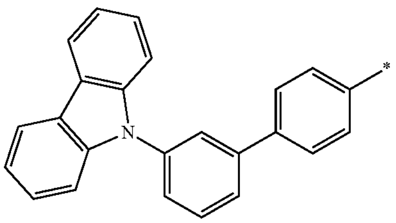 [SMILES: *c1ccc(-c2cccc(-n3c4ccccc4c4ccccc43)c2)cc1] | 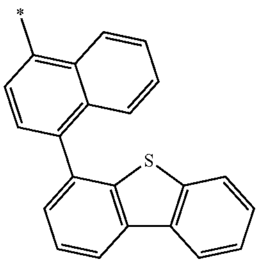 [SMILES: *c1ccc(-c2cccc3c2sc2ccccc23)c2ccccc12] | 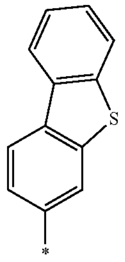 [SMILES: *c1ccc2c(c1)sc1ccccc12] |

-continued
| Compound Group 1 | | | |
|---|---|---|---|
| Formula 1 | $Ar_1$ | $Ar_2$ | $Ar_3$ |
| U21 | 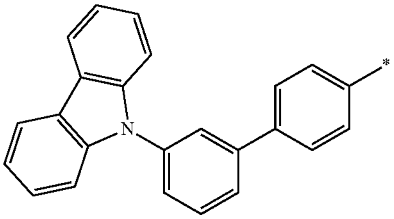 [SMILES: *c1ccc(-c2cccc(-n3c4ccccc4c4ccccc43)c2)cc1] | 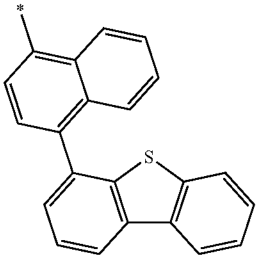 [SMILES: *c1ccc(-c2cccc3c2sc2ccccc23)c2ccccc12] | 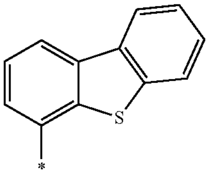 [SMILES: *c1cccc2c1sc1ccccc12] |
| U22 | 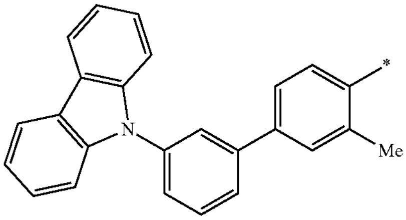 [SMILES: *c1ccc(-c2cccc(-n3c4ccccc4c4ccccc43)c2)cc1C] | 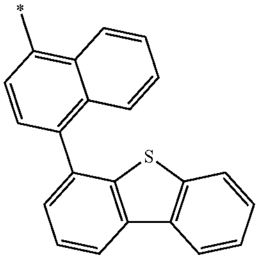 [SMILES: *c1ccc(-c2cccc3c2sc2ccccc23)c2ccccc12] | 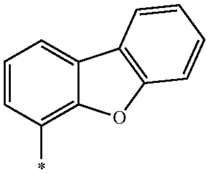 [SMILES: *c1cccc2c1oc1ccccc12] |
| U23 | 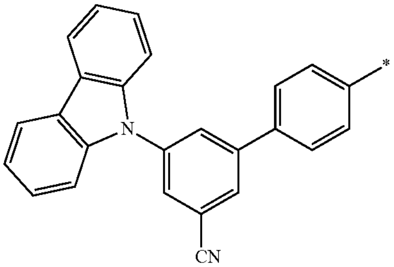 [SMILES: *c1ccc(-c2cc(C#N)cc(-n3c4ccccc4c4ccccc43)c2)cc1] | 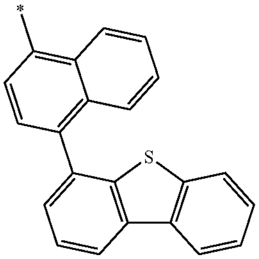 [SMILES: *c1ccc(-c2cccc3c2sc2ccccc23)c2ccccc12] | 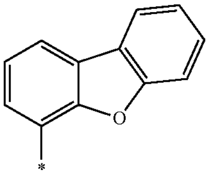 [SMILES: *c1cccc2c1oc1ccccc12] |
| V1 | 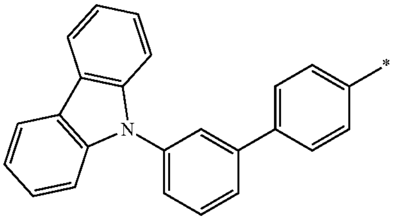 [SMILES: *c1ccc(-c2cccc(-n3c4ccccc4c4ccccc43)c2)cc1] | 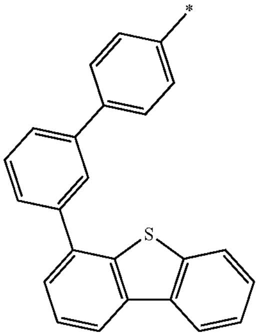 [SMILES: *c1ccc(-c2cccc(-c3cccc4c3sc3ccccc34)c2)cc1] | 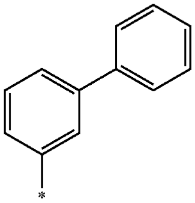 [SMILES: *c1cccc(-c2ccccc2)c1] |
| V2 | 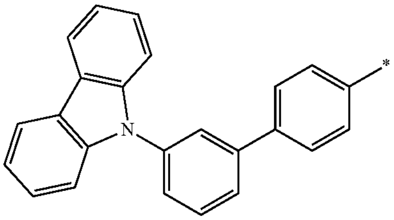 [SMILES: *c1ccc(-c2cccc(-n3c4ccccc4c4ccccc43)c2)cc1] | 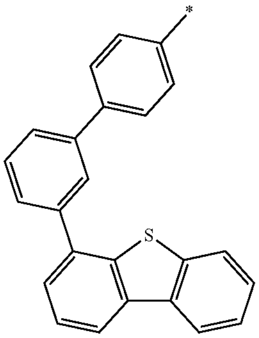 [SMILES: *c1ccc(-c2cccc(-c3cccc4c3sc3ccccc34)c2)cc1] | 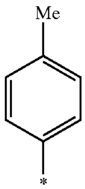 [SMILES: *c1ccc(C)cc1] |

-continued
Compound Group 1
| Formula 1 | $Ar_1$ | $Ar_2$ | $Ar_3$ |
|---|---|---|---|
| V3 | 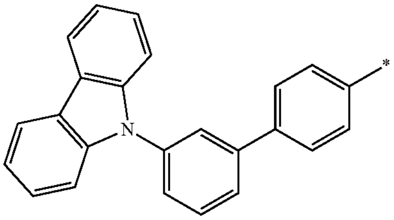 [SMILES: *c1ccc(-c2cccc(-n3c4ccccc4c4ccccc43)c2)cc1] | 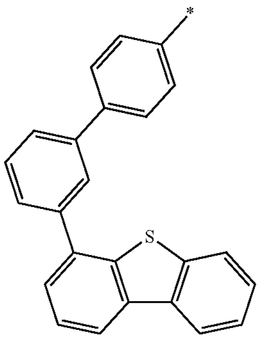 [SMILES: *c1ccc(-c2cccc(-c3cccc4c3sc3ccccc34)c2)cc1] | 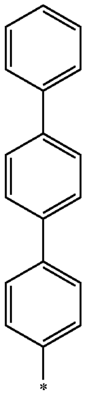 [SMILES: *c1ccc(-c2ccc(-c3ccccc3)cc2)cc1] |
| V4 | 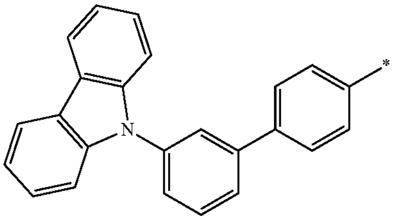 [SMILES: *c1ccc(-c2cccc(-n3c4ccccc4c4ccccc43)c2)cc1] | 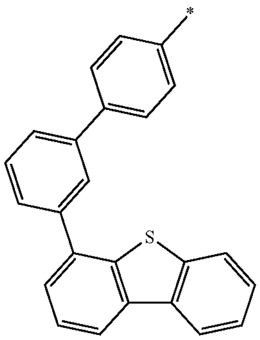 [SMILES: *c1ccc(-c2cccc(-c3cccc4c3sc3ccccc34)c2)cc1] | 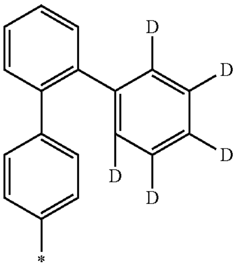 [SMILES: *c1ccc(-c2ccccc2-c2c([2H])c([2H])c([2H])c([2H])c2[2H])cc1] |
| V5 | 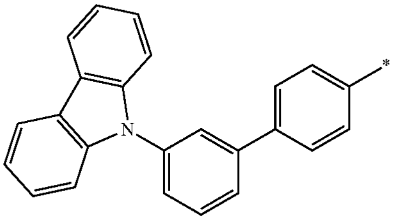 [SMILES: *c1ccc(-c2cccc(-n3c4ccccc4c4ccccc43)c2)cc1] | 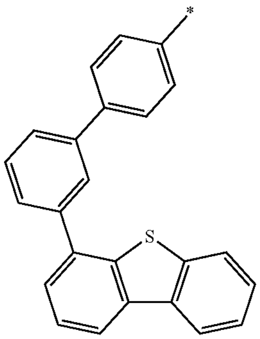 [SMILES: *c1ccc(-c2cccc(-c3cccc4c3sc3ccccc34)c2)cc1] | 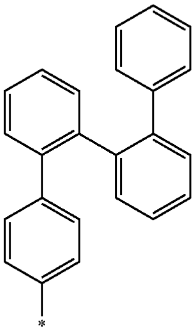 [SMILES: *c1ccc(-c2ccccc2-c2ccccc2-c2ccccc2)cc1] |
| V6 | 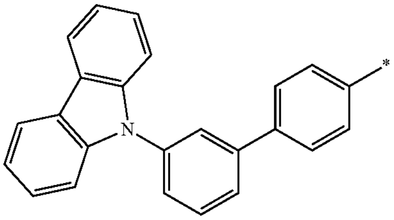 [SMILES: *c1ccc(-c2cccc(-n3c4ccccc4c4ccccc43)c2)cc1] | 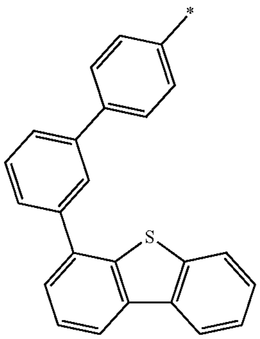 [SMILES: *c1ccc(-c2cccc(-c3cccc4c3sc3ccccc34)c2)cc1] | 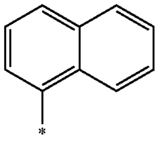 [SMILES: *c1cccc2ccccc12] |

-continued
| Compound Group 1 | | | |
|---|---|---|---|
| Formula 1 | $Ar_1$ | $Ar_2$ | $Ar_3$ |
| V7 | 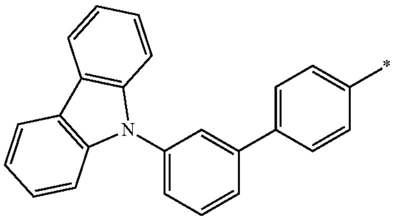 [SMILES: *c1ccc(-c2cccc(-n3c4ccccc4c4ccccc43)c2)cc1] | 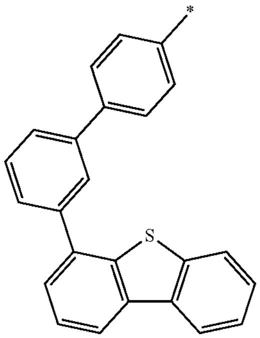 [SMILES: *c1ccc(-c2cccc(-c3cccc4c3sc3ccccc34)c2)cc1] | 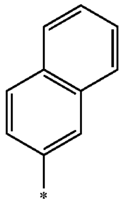 [SMILES: *c1ccc2ccccc2c1] |
| V8 | 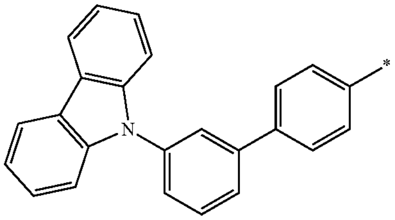 [SMILES: *c1ccc(-c2cccc(-n3c4ccccc4c4ccccc43)c2)cc1] | 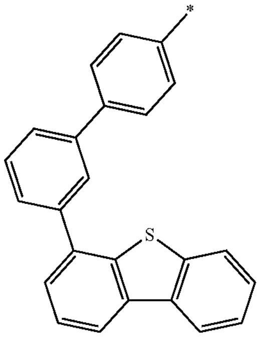 [SMILES: *c1ccc(-c2cccc(-c3cccc4c3sc3ccccc34)c2)cc1] | 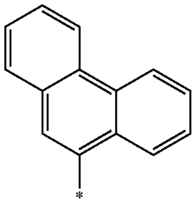 [SMILES: *c1cc2ccccc2c2ccccc12] |
| V9 | 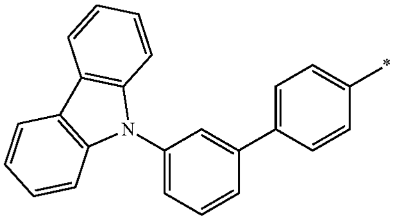 [SMILES: *c1ccc(-c2cccc(-n3c4ccccc4c4ccccc43)c2)cc1] | 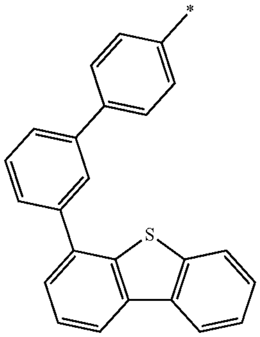 [SMILES: *c1ccc(-c2cccc(-c3cccc4c3sc3ccccc34)c2)cc1] | 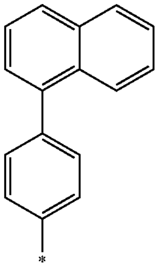 [SMILES: *c1ccc(-c2cccc3ccccc23)cc1] |
| V10 | 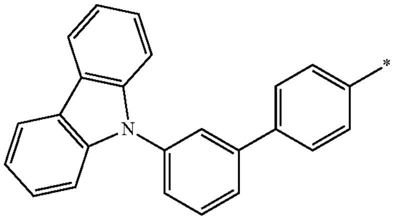 [SMILES: *c1ccc(-c2cccc(-n3c4ccccc4c4ccccc43)c2)cc1] | 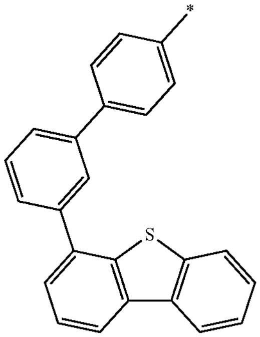 [SMILES: *c1ccc(-c2cccc(-c3cccc4c3sc3ccccc34)c2)cc1] | 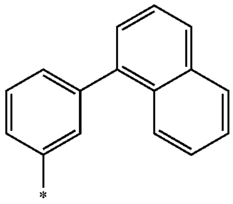 [SMILES: *c1cccc(-c2cccc3ccccc23)c1] |

-continued
| Compound Group 1 | | | |
|---|---|---|---|
| Formula 1 | $Ar_1$ | $Ar_2$ | $Ar_3$ |
| V11 | 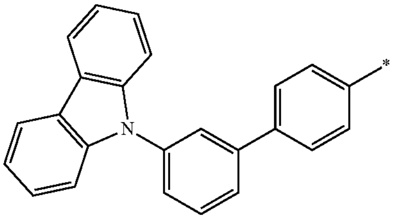 [SMILES: *c1ccc(-c2cccc(-n3c4ccccc4c4ccccc43)c2)cc1] | 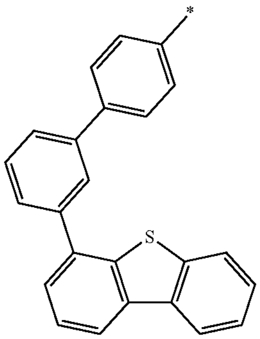 [SMILES: *c1ccc(-c2cccc(-c3cccc4c3sc3ccccc34)c2)cc1] | 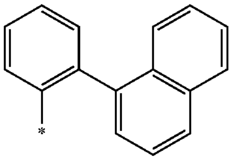 [SMILES: *c1ccccc1-c1cccc2ccccc12] |
| V12 | 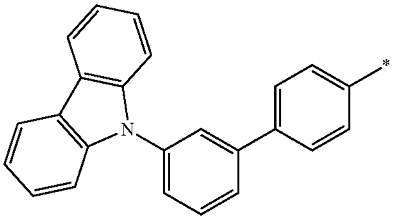 [SMILES: *c1ccc(-c2cccc(-n3c4ccccc4c4ccccc43)c2)cc1] | 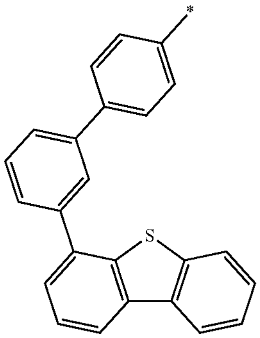 [SMILES: *c1ccc(-c2cccc(-c3cccc4c3sc3ccccc34)c2)cc1] | 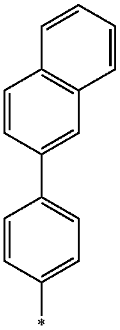 [SMILES: *c1ccc(-c2ccc3ccccc3c2)cc1] |
| V13 | 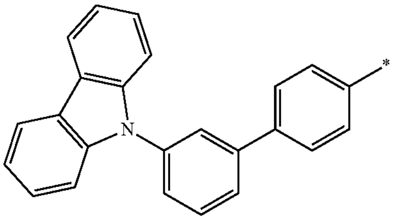 [SMILES: *c1ccc(-c2cccc(-n3c4ccccc4c4ccccc43)c2)cc1] | 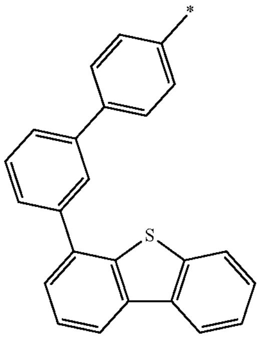 [SMILES: *c1ccc(-c2cccc(-c3cccc4c3sc3ccccc34)c2)cc1] | 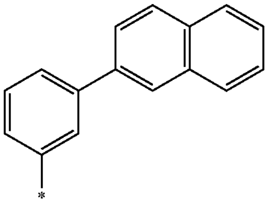 [SMILES: *c1cccc(-c2ccc3ccccc3c2)c1] |
| V14 | 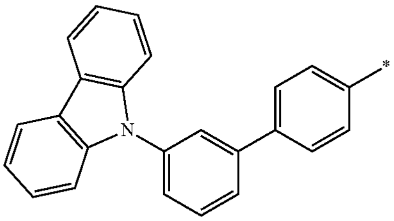 [SMILES: *c1ccc(-c2cccc(-n3c4ccccc4c4ccccc43)c2)cc1] | 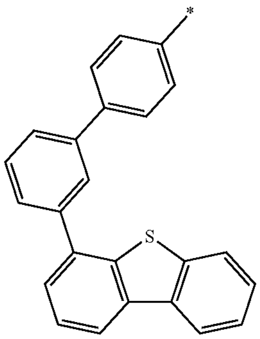 [SMILES: *c1ccc(-c2cccc(-c3cccc4c3sc3ccccc34)c2)cc1] | 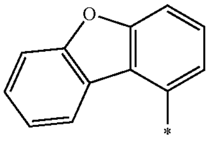 |

-continued
| Compound Group 1 | | | |
|---|---|---|---|
| Formula 1 | $Ar_1$ | $Ar_2$ | $Ar_3$ |
| V15 | 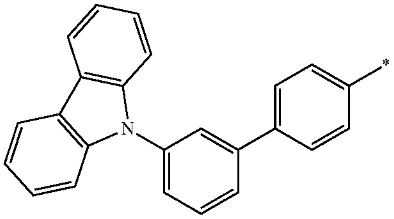 [SMILES: *c1ccc(-c2cccc(-n3c4ccccc4c4ccccc43)c2)cc1] | 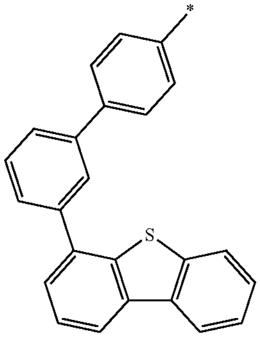 [SMILES: *c1ccc(-c2cccc(-c3cccc4c3sc3ccccc34)c2)cc1] | 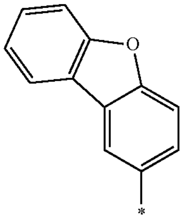 [SMILES: *c1ccc2oc3ccccc3c2c1] |
| V16 | 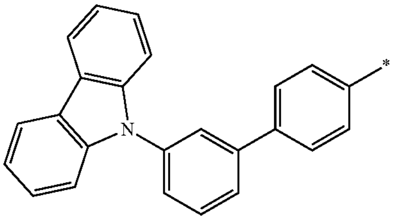 [SMILES: *c1ccc(-c2cccc(-n3c4ccccc4c4ccccc43)c2)cc1] | 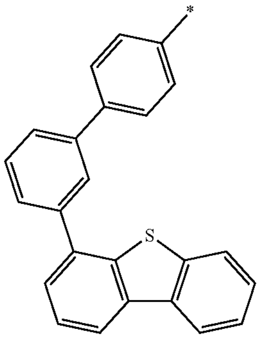 [SMILES: *c1ccc(-c2cccc(-c3cccc4c3sc3ccccc34)c2)cc1] | 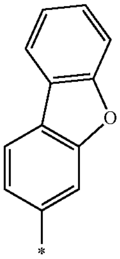 [SMILES: *c1ccc2c(c1)oc1ccccc12] |
| V17 | 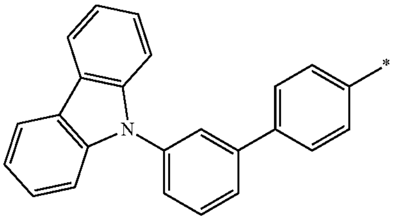 [SMILES: *c1ccc(-c2cccc(-n3c4ccccc4c4ccccc43)c2)cc1] | 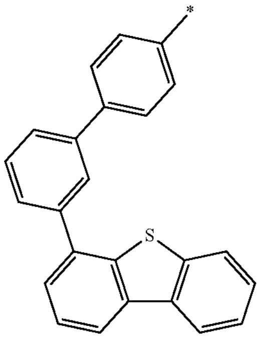 [SMILES: *c1ccc(-c2cccc(-c3cccc4c3sc3ccccc34)c2)cc1] | 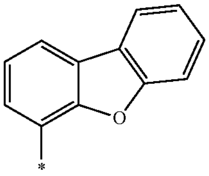 |
| V18 | 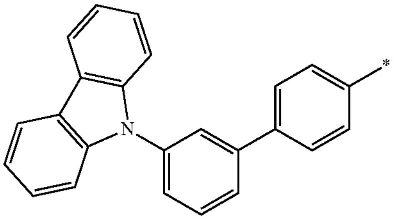 [SMILES: *c1ccc(-c2cccc(-n3c4ccccc4c4ccccc43)c2)cc1] | 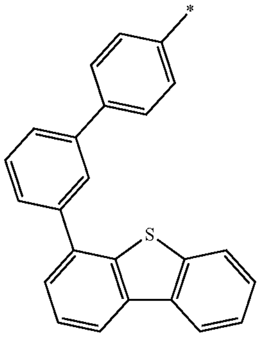 [SMILES: *c1ccc(-c2cccc(-c3cccc4c3sc3ccccc34)c2)cc1] | 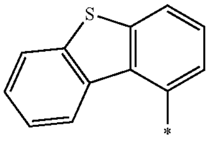 |

-continued
Compound Group 1
| Formula 1 | $Ar_1$ | $Ar_2$ | $Ar_3$ |
|---|---|---|---|
| V19 | 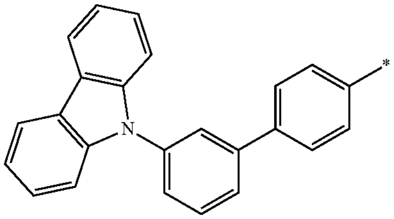 [SMILES: *c1ccc(-c2cccc(-n3c4ccccc4c4ccccc43)c2)cc1] | 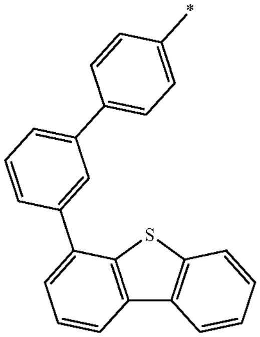 [SMILES: *c1ccc(-c2cccc(-c3cccc4c3sc3ccccc34)c2)cc1] | 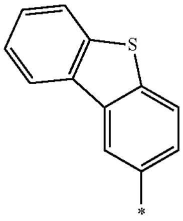 [SMILES: *c1ccc2sc3ccccc3c2c1] |
| V20 | 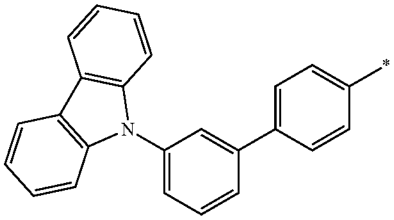 [SMILES: *c1ccc(-c2cccc(-n3c4ccccc4c4ccccc43)c2)cc1] | 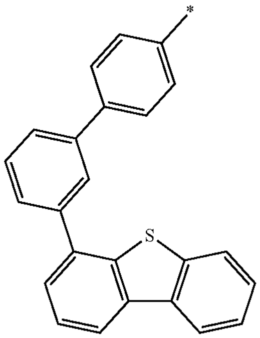 [SMILES: *c1ccc(-c2cccc(-c3cccc4c3sc3ccccc34)c2)cc1] | 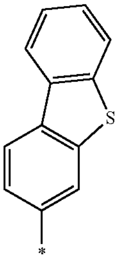 [SMILES: *c1ccc2c(c1)sc1ccccc12] |
| V21 | 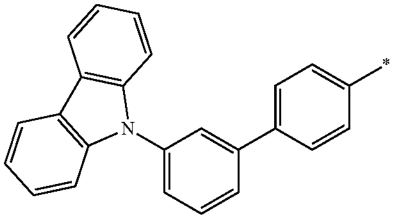 [SMILES: *c1ccc(-c2cccc(-n3c4ccccc4c4ccccc43)c2)cc1] | 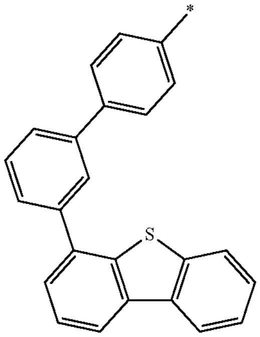 [SMILES: *c1ccc(-c2cccc(-c3cccc4c3sc3ccccc34)c2)cc1] | 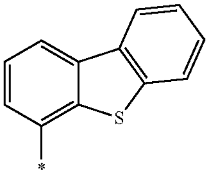 [SMILES: *c1cccc2c1sc1ccccc12] |
| V22 | 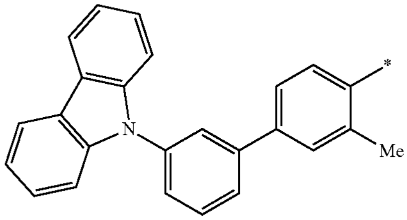 [SMILES: *c1ccc(-c2cccc(-n3c4ccccc4c4ccccc43)c2)cc1C] | 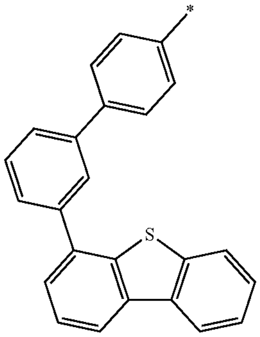 [SMILES: *c1ccc(-c2cccc(-c3cccc4c3sc3ccccc34)c2)cc1] | 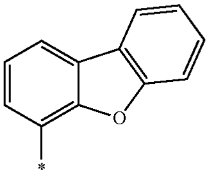 [SMILES: *c1cccc2c1oc1ccccc12] |

-continued

Compound Group 1

| Formula 1 | $Ar_1$ | $Ar_2$ | $Ar_3$ |
|---|---|---|---|
| V23 | 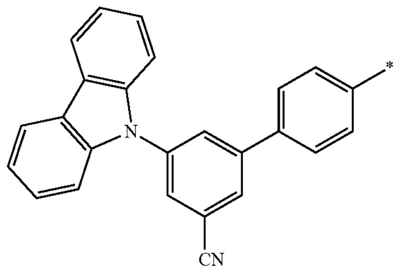 [SMILES: *c1ccc(-c2cc(C#N)cc(-n3c4ccccc4c4ccccc43)c2)cc1] | 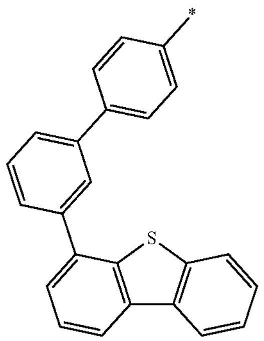 [SMILES: *c1ccc(-c2cccc(-c3cccc4c3sc3ccccc34)c2)cc1] | 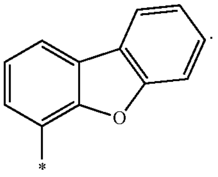 [SMILES: *c1cccc2c1oc1ccccc12] |

The amine compound of an embodiment includes a dibenzothiophene group and a carbazole group (e.g., as substituents), and the carbazole group is selectively connected (e.g., at particular carbon positions) with the nitrogen atom of the amine group via biphenyl as a linker (linking group between the carbazole nitrogen and the amine nitrogen). For example, the nitrogen atom of the carbazole group may be bonded to position 3' of the biphenyl, and position 4 of the biphenyl may be combined with the nitrogen atom of the amine group. The sulfur atom of the dibenzothiophene group has high p orbital properties (e.g., has an electron lone pair in a 3p orbital perpendicular to the plane of the group), and if the dibenzothiophene group is combined with the nitrogen of the amine compound, the bond order of the amine group may be increased, and accordingly, the electronic stability of the compound may be improved. Because the carbazole group and the amine group are selectively connected (e.g., at particular carbon positions) with respect to the biphenyl linker, selective electronic effects may be induced, and accordingly, steric orientation may be improved, and when the amine compound is utilized as the material of an organic electroluminescence device, the device may have long-life characteristics.

Referring to FIG. 3 to FIG. 6 again, the organic electroluminescence device ED according to embodiments of the present disclosure will be explained.

As described above, the hole transport region HTR includes the aforementioned amine compound according to embodiments of the present disclosure. For example, the hole transport region HTR includes the amine compound represented by Formula 1.

When the hole transport region HTR has a multilayer structure having multiple layers, any one layer among the multiple layers may include the amine compound represented by Formula 1. For example, a hole transport region HTR may include a hole injection layer HIL disposed on a first electrode EL1 and a hole transport layer HTL disposed on the hole injection layer HIL, and the hole transport layer HTL may include the amine compound represented by Formula 1. However, embodiments of the present disclosure are not limited thereto, and for example, the hole injection layer HIL may include the amine compound represented by Formula 1.

The hole transport region HTR may include one, two, or more than two types (kinds) of the amine compound represented by Formula 1. For example, the hole transport region HTR may include at least one selected from the compounds represented in Compound Group 1.

The hole transport region HTR may be formed utilizing one or more suitable methods (such as a vacuum deposition method, a spin coating method, a cast method, a Langmuir-Blodgett (LB) method, an inkjet printing method, a laser printing method, and/or a laser induced thermal imaging (LITI) method).

The hole transport region HTR may include a compound represented by Formula H-1.

Formula H-1

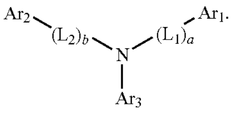

In Formula H-1, $L_1$ and $L_2$ may each independently be a direct linkage, a substituted or unsubstituted arylene group of 6 to 30 ring-forming carbon atoms, or a substituted or unsubstituted heteroarylene group of 2 to 30 ring-forming carbon atoms. "a" and "b" may each independently be an integer of 0 to 10. When "a" or "b" is an integer of 2 or more, multiple $L_1$ and $L_2$ may each independently be a substituted or unsubstituted arylene group of 6 to 30 ring-forming carbon atoms, or a substituted or unsubstituted heteroarylene group of 2 to 30 ring-forming carbon atoms.

In Formula H-1, $Ar_1$ and $Ar_2$ may each independently be a substituted or unsubstituted aryl group of 6 to 30 ring-forming carbon atoms, or a substituted or unsubstituted heteroaryl group of 2 to 30 ring-forming carbon atoms. In some embodiments, in Formula H-1, $Ar_3$ may be a substituted or unsubstituted aryl group of 6 to 30 ring-forming carbon atoms.

The compound represented by Formula H-1 may be a monoamine compound (e.g., having only one amine group nitrogen atom). In some embodiments, the compound represented by Formula H-1 may be a diamine compound in which at least one among $Ar_1$ to $Ar_3$ includes an amine group as a substituent. In some embodiments, the compound represented by Formula H-1 may be a carbazole-based compound, in which at least one among $Ar_1$ to $Ar_3$ includes a substituted or unsubstituted carbazole group, or a fluorene-based compound in which at least one among $Ar_1$ to $Ar_3$ includes a substituted or unsubstituted fluorene group.

The compound represented by Formula H-1 may be represented by any one among the compounds in Compound Group H. However, the compounds shown in Compound Group H are only examples, and the compound represented by Formula H-1 is not limited to the compounds represented in Compound Group H:

Compound Group H

H-1-1

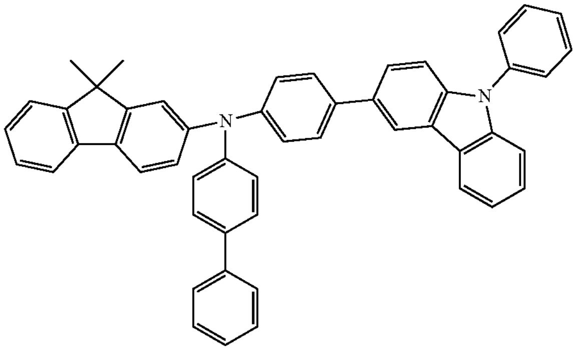

H-1-2

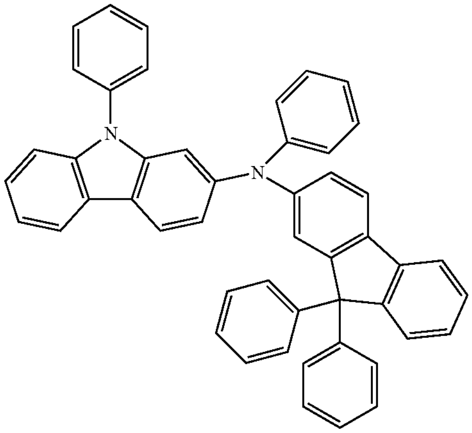

H-1-3

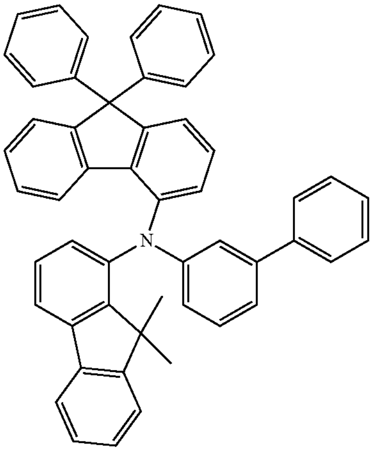

-continued

H-1-4

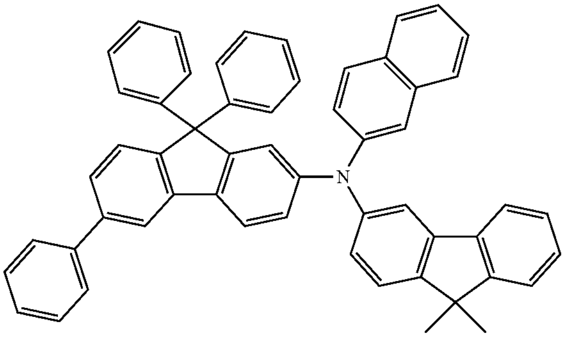

H-1-5

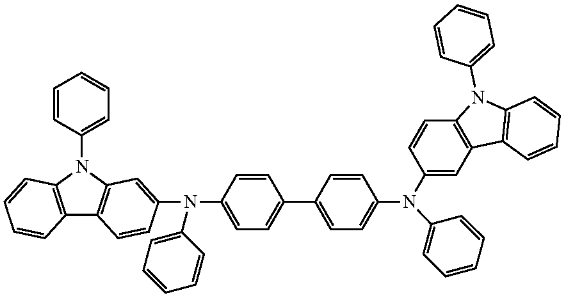

H-1-6

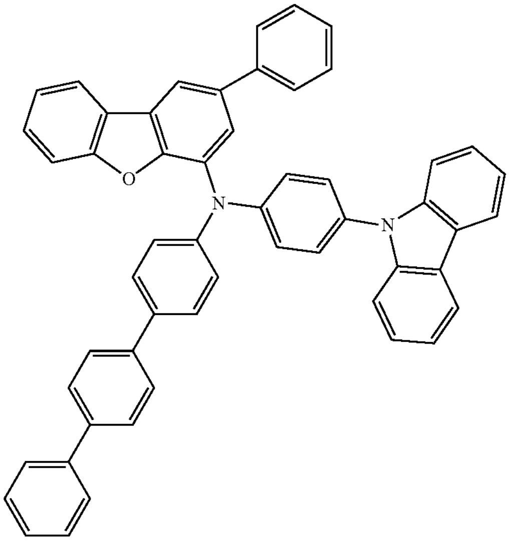

-continued
H-1-7
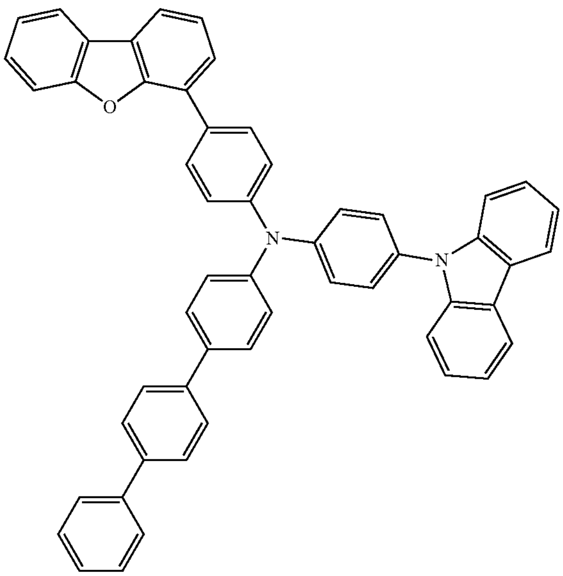
H-1-8
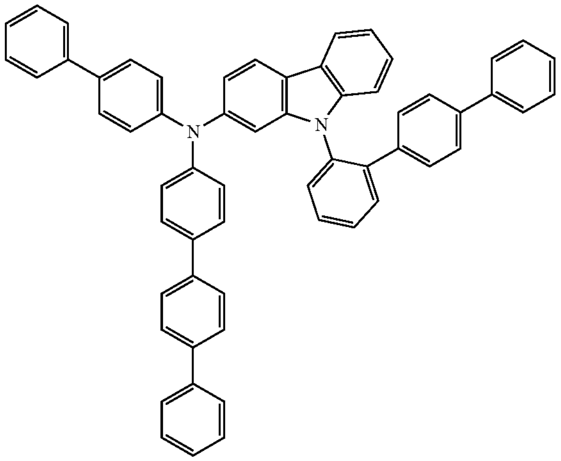
H-1-9
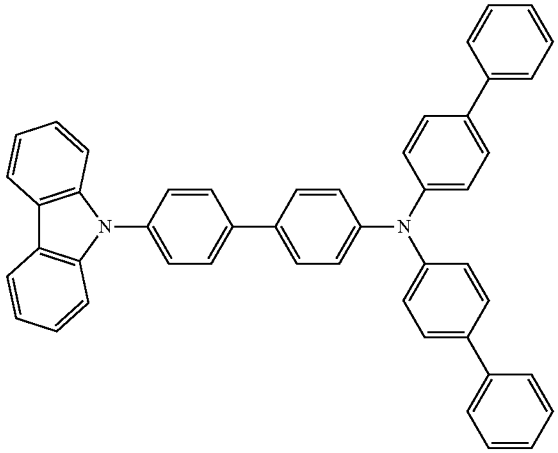
-continued
H-1-10
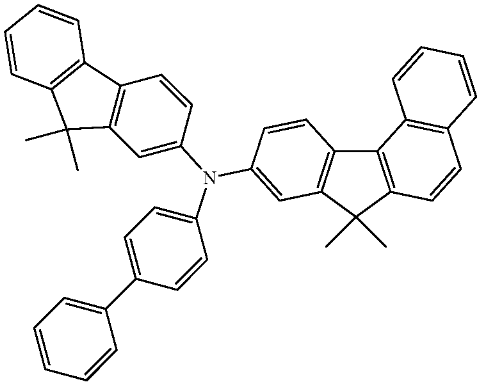
H-1-11
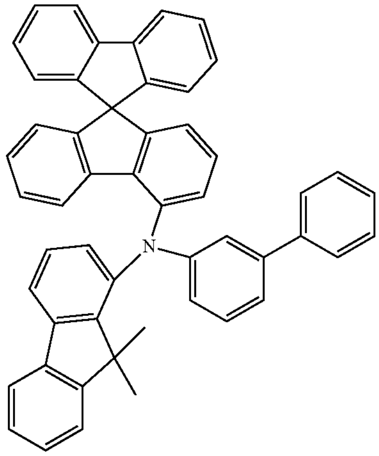
H-1-12
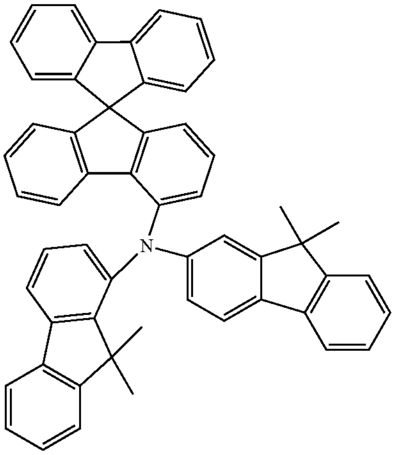
H-1-13
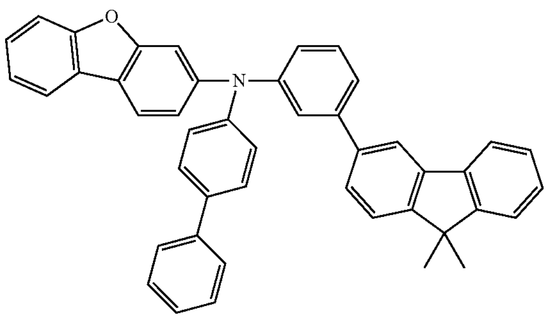

-continued

H-1-14

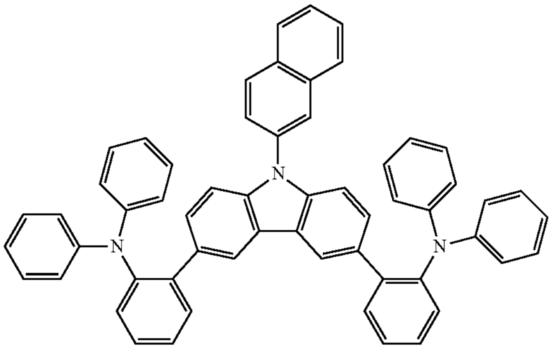

H-1-15

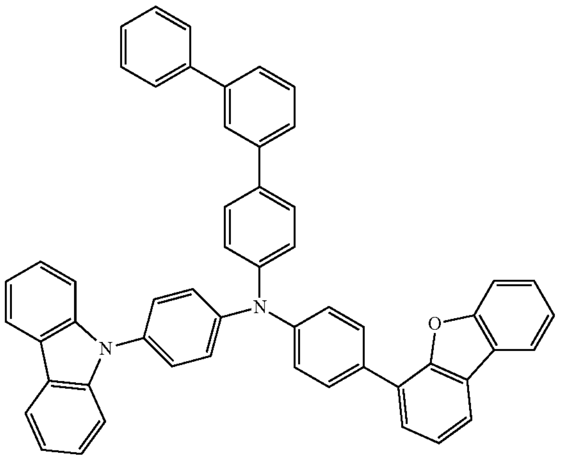

H-1-16

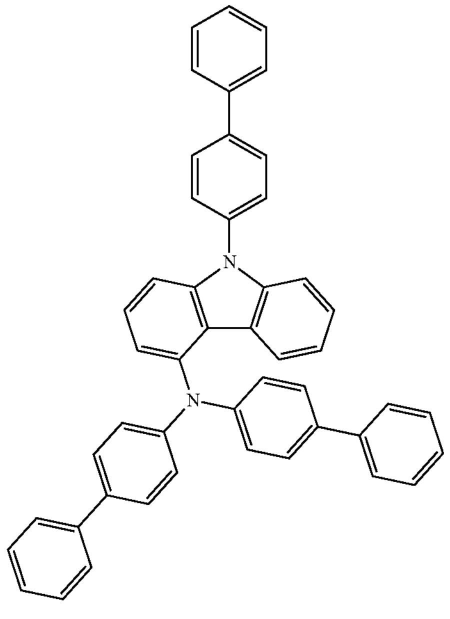

-continued

H-1-17

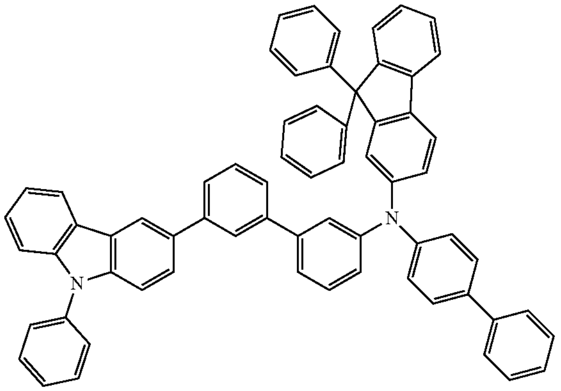

H-1-18

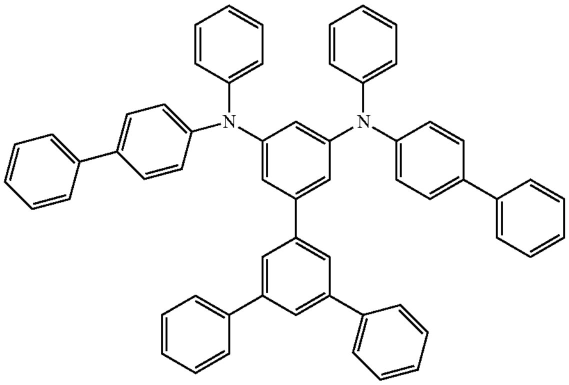

H-1-19

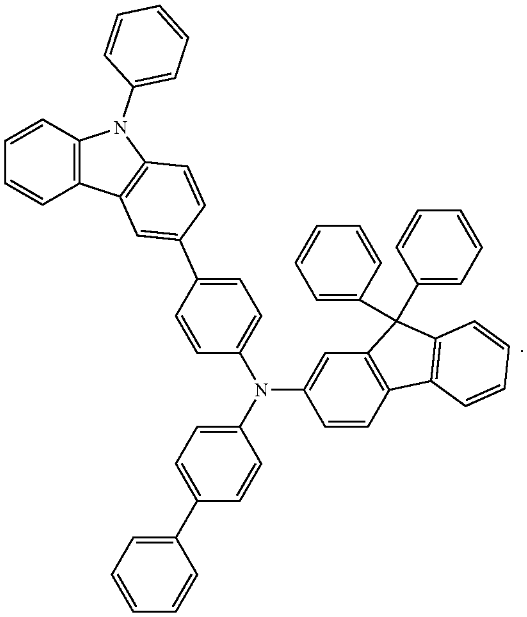

The hole transport region HTR may include a phthalocyanine compound (such as copper phthalocyanine), $N^1$,$N^{1'}$-([1,1'-biphenyl]-4,4'-diyl)bis($N^1$-phenyl-$N^4$,$N^4$-di-m-tolyl-benzene-1,4-diamine) (DNTPD), 4,4',4"-[tris(3-methylphenyl)phenylamino] triphenylamine (m-MTDATA), 4,4',4"-tris(N,N-diphenylamino)triphenylamine (TDATA), 4,4',4"-tris[N(2-naphthyl)-N-phenylamino]-triphenylamine (2-TNATA), poly(3,4-ethylene dioxythiophene)/poly(4-styrene sulfonate) (PEDOT/PSS), polyaniline/dodecylbenzene sulfonic acid (PANI/DBSA), polyaniline/camphor sulfonic acid (PANI/CSA), polyaniline/poly(4-styrene sulfonate) (PANI/PSS), N,N'-di(1-naphthalene-1-yl)-N,N'-diphenyl-benzidine (NPB), triphenylamine-containing polyether ketone (TPAPEK), 4-isopropyl-4'-methyldiphenyliodonium [tetrakis(pentafluorophenyl)borate], dipyrazino[2,3-f:2',3'-h] quinoxaline-2,3,6,7,10,11-hexacarbonitrile (HATCN), etc.

The hole transport region HTR may include carbazole derivatives (such as N-phenyl carbazole and/or polyvinyl carbazole), fluorene-based derivatives, N,N'-bis(3-methylphenyl)-N,N'-diphenyl-[1,1'-biphenyl]-4,4'-diamine (TPD), triphenylamine-based derivatives (such as 4,4',4"-tris(N-carbazolyl)triphenylamine (TCTA)), N,N'-di(1-naphthalen-1-yl)-N,N'-diphenyl-benzidine (NPB), 4,4'-cyclohexylidene bis[N,N-bis(4-methylphenyl)benzeneamine (TAPC), 4,4'-bis[N,N'-(3-tolyl)amino]-3,3'-dimethylbiphenyl (HMTPD), 1,3-bis(N-carbazolyl)benzene (mCP), etc.

In some embodiments, the hole transport region HTR may include 9-(4-tert-butylphenyl)-3,6-bis(triphenylsilyl)-9H-carbazole (CzSi), 9-phenyl-9H-3,9'-bicarbazole (CCP), 1,3-bis(1,8-dimethyl-9H-carbazol-9-yl)benzene (mDCP), etc.

The hole transport region HTR may include the compounds of the hole transport region in at least one among the hole injection layer HIL, hole transport layer HTL, and electron blocking layer EBL.

The thickness of the hole transport region HTR may be about 100 Å to about 10,000 Å, for example, about 100 Å to about 5,000 Å. When the hole transport region HTR includes a hole injection layer HIL, the thickness of the hole injection region HIL may be, for example, about 30 Å to about 1,000 Å. When the hole transport region HTR includes a hole transport layer HTL, the thickness of the hole transport layer HTL may be about 30 Å to about 1,000 Å. For example, when the hole transport region HTR includes an electron blocking layer, the thickness of the electron blocking layer EBL may be about 10 Å to about 1,000 Å. When the thicknesses of the hole transport region HTR, the hole injection layer HIL, the hole transport layer HTL and the electron blocking layer EBL satisfy the above-described ranges, satisfactory hole transport properties may be achieved without substantial increase of a driving voltage.

The hole transport region HTR may further include a charge generating material to increase conductivity in addition to the above-described materials. The charge generating material may be dispersed substantially uniformly or non-uniformly in the hole transport region HTR. The charge generating material may be, for example, a p-dopant. The p-dopant may include at least one of metal halide compounds, quinone derivatives, metal oxides, or cyano group-containing compounds, without limitation. For example, the p-dopant may include metal halide compounds (such as CuI and/or RbI), quinone derivatives (such as tetracyanoquinodimethane (TCNQ) and/or 2,3,5,6-tetrafluoro-7,7',8,8-tetracyanoquinodimethane (F4-TCNQ)), metal oxides (such as tungsten oxide and/or molybdenum oxide), cyano group-containing compounds (such as dipyrazino[2,3-f: 2',3'-h] quinoxaline-2,3,6,7,10,11-hexacarbonitrile (HATCN) and/or 4-[[2,3-bis[cyano-(4-cyano-2,3,5,6-tetrafluorophenyl) methylidene]cyclopropylidene]-cyanomethyl]-2,3,5,6-tetrafluorobenzonitrile (NDP9)), etc., without limitation.

As described above, the hole transport region HTR may further include at least one of a buffer layer or an electron blocking layer EBL in addition to the hole injection layer HIL and the hole transport layer HTL. The buffer layer may compensate for a resonance distance of to the wavelength of light emitted from an emission layer EML, and may thereby increase the light emitting efficiency of the device. Materials that may be included in the hole transport region HTR may be utilized in the buffer layer. The electron blocking layer may block or reduce injection of electrons from an electron transport region ETR to a hole transport region HTR.

The emission layer EML is provided on the hole transport region HTR. The emission layer EML may have a thickness of, for example, about 100 Å to about 1,000 Å or about 100 Å to about 300 Å. The emission layer EML may have a single layer formed utilizing a single material, a single layer formed utilizing multiple different materials, or a multilayer structure having multiple layers formed utilizing multiple different materials.

In the organic electroluminescence device ED of an embodiment, the emission layer EML may include anthracene derivatives, pyrene derivatives, fluoranthene derivatives, chrysene derivatives, dihydrobenzanthracene derivatives, and/or triphenylene derivatives. For example, the emission layer EML may further include anthracene derivatives and/or pyrene derivatives.

In the organic electroluminescence devices ED of embodiments, shown in FIG. 3 to FIG. 6, the emission layer EML may include a host and a dopant, and the emission layer EML may include a compound represented by Formula 6. The compound represented by Formula 6 may be utilized as a fluorescence host material.

Formula 6

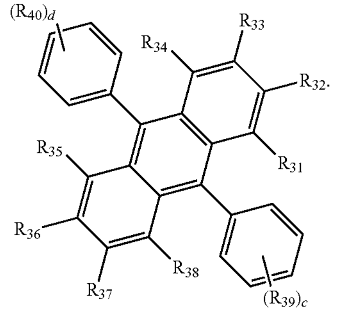

In Formula 6, $R_{31}$ to $R_{40}$ may each independently be a hydrogen atom, a deuterium atom, a halogen atom, a substituted or unsubstituted silyl group, a substituted or unsubstituted alkyl group of 1 to 10 carbon atoms, a substituted or unsubstituted aryl group of 6 to 30 ring-forming carbon atoms, or a substituted or unsubstituted heteroaryl group of 2 to 30 ring-forming carbon atoms, and/or combined with an adjacent group to form a ring. In some embodiments, $R_{31}$ to $R_{40}$ may be combined with an adjacent group to form a saturated hydrocarbon ring or an unsaturated hydrocarbon ring.

In Formula 6, “q” may be an integer of 0 to 5. When “q” is 2 or more, the multiple $R_{39}$ groups may be the same or different.

In Formula 6, “r” may be an integer of 0 to 5. When “r” is 2 or more, the multiple $R_{40}$ groups may be the same or different.

In an embodiment, Formula 6 may be represented by any one among Compound 7-1 to Compound 7-19:
7-1
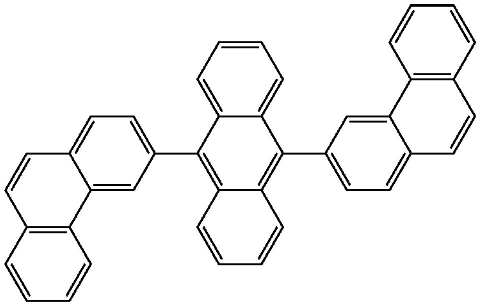
7-2
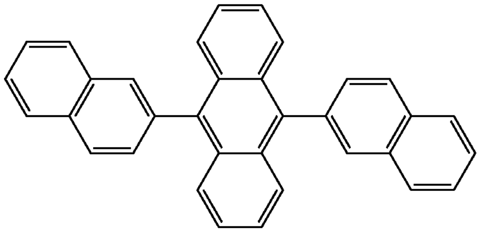
7-3
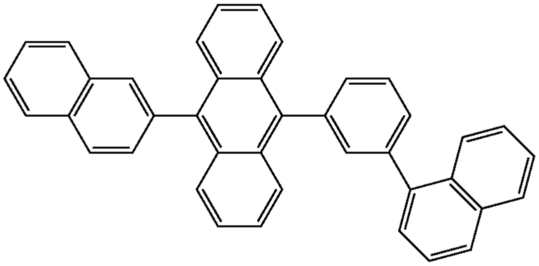
7-4
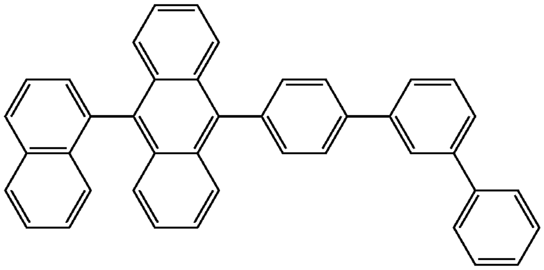
7-5
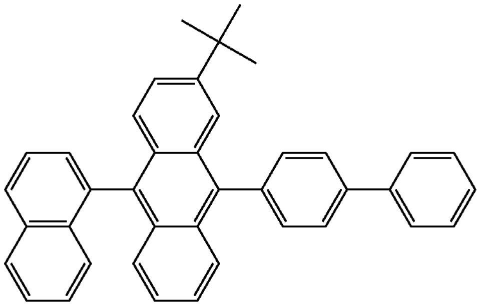
-continued
7-6
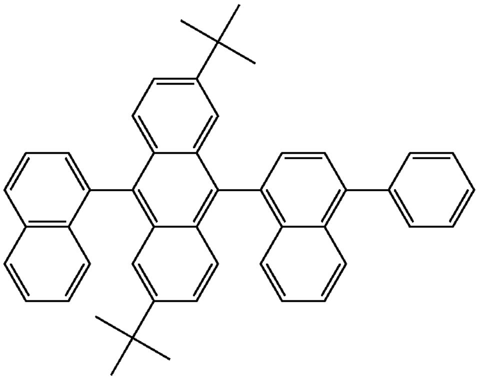
7-7
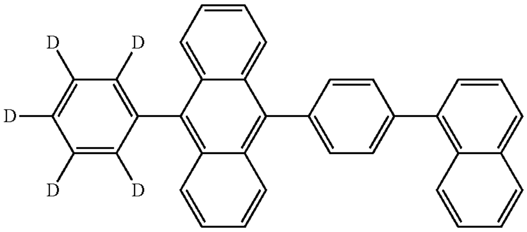
7-8
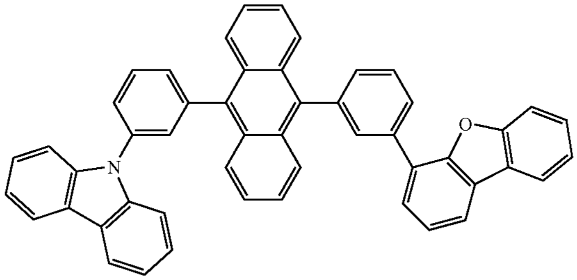
7-9
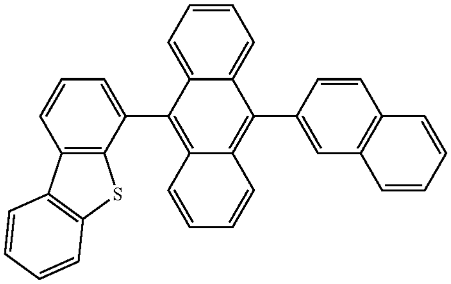
7-10
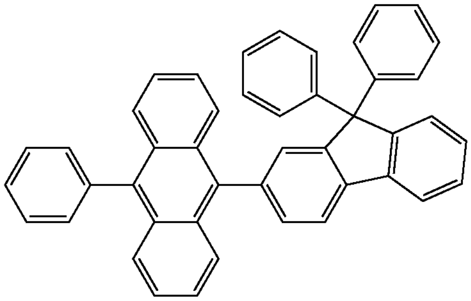

-continued
7-11
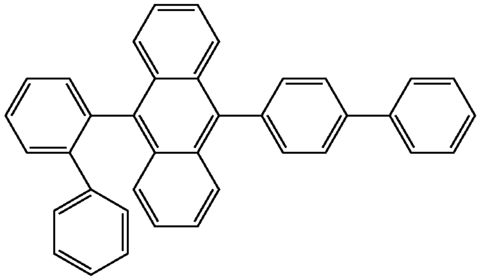
7-12
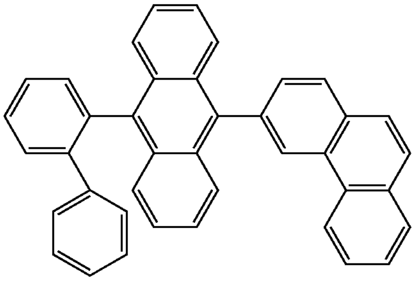
7-13
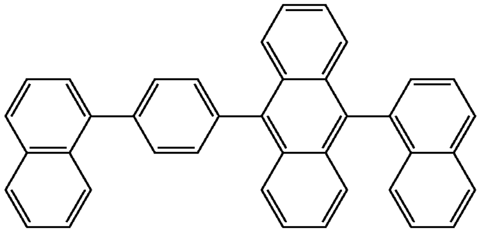
7-14
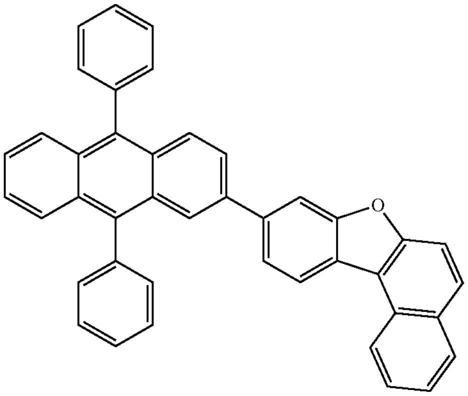
-continued
7-15
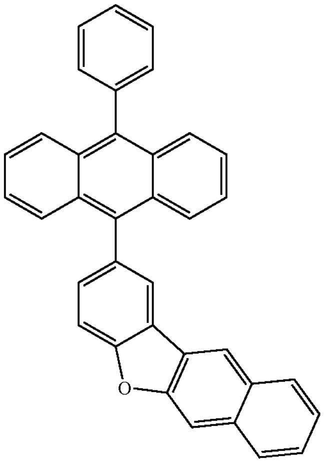
7-16
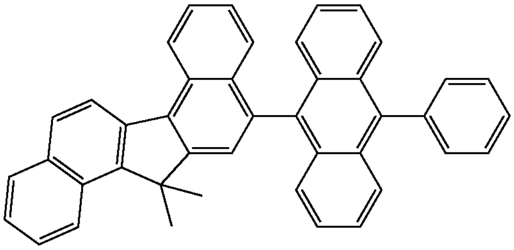
7-17
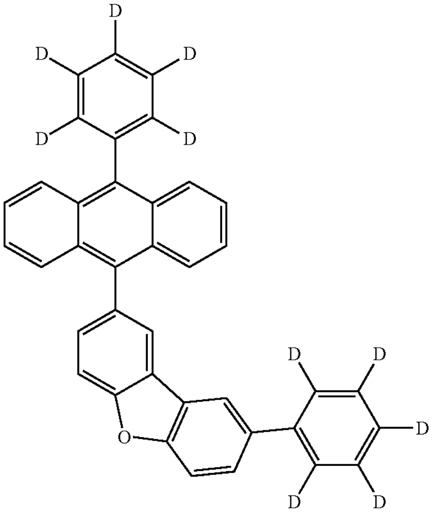
7-18
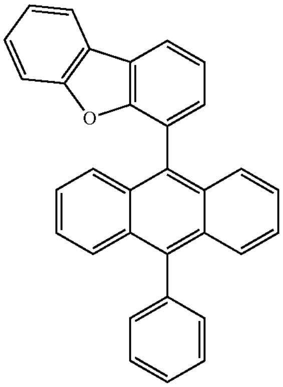

-continued 7-19

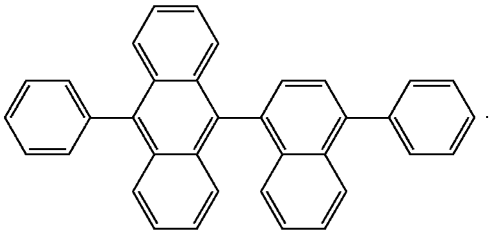

In an embodiment, the emission layer EML may include a compound represented by Formula E-2a or Formula E-2b. The compound represented by Formula E-2a or Formula E-2b may be utilized as a phosphorescence host material.

Formula E-2a

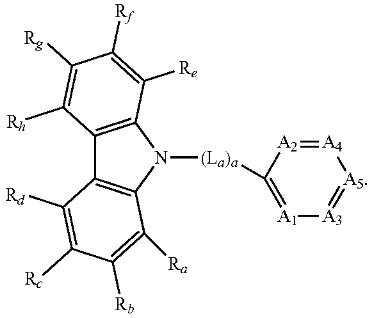

In Formula E-2a, "a" may be an integer of 0 to 10, $L_a$ may be a direct linkage, a substituted or unsubstituted arylene group of 6 to 30 ring-forming carbon atoms, or a substituted or unsubstituted heteroarylene group of 2 to 30 ring-forming carbon atoms. When "a" is an integer of 2 or more, multiple $L_a$ may each independently be a substituted or unsubstituted arylene group of 6 to 30 ring-forming carbon atoms, or a substituted or unsubstituted heteroarylene group of 2 to 30 ring-forming carbon atoms.

In some embodiments, in Formula E-2a, $A_1$ to $A_5$ may each independently be N or $CR_i$. $R_a$ to $R_i$ may each independently be a hydrogen atom, a deuterium atom, a substituted or unsubstituted amine group, a substituted or unsubstituted thio group, a substituted or unsubstituted oxy group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, and/or may be combined with an adjacent group to form a ring. $R_a$ to $R_i$ may each independently be combined with an adjacent group to form a hydrocarbon ring or a heterocycle including N, O, S, etc. as a ring-forming atom.

In some embodiments, in Formula E-2a, two or three selected from $A_1$ to $A_5$ may be N, and the remainder may be $CR_i$.

Formula E-2b $$(Cbz1)—(L_b)_b—(Cbz2).$$

In Formula E-2b, Cbz1 and Cbz2 may each independently be an unsubstituted carbazole group, or a carbazole group substituted with an aryl group of 6 to 30 ring-forming carbon atoms. $L_b$ may be a direct linkage, a substituted or unsubstituted arylene group of 6 to 30 ring-forming carbon atoms, or a substituted or unsubstituted heteroarylene group of 2 to 30 ring-forming carbon atoms. "b" may be an integer of 0 to 10, and when "b" is an integer of 2 or more, the multiple $L_b$ may each independently be a substituted or unsubstituted arylene group of 6 to 30 ring-forming carbon atoms, or a substituted or unsubstituted heteroarylene group of 2 to 30 ring-forming carbon atoms.

The compound represented by Formula E-2a or Formula E-2b may be represented by any one among the compounds in Compound Group E-2. However, the compounds shown in Compound Group E-2 are only illustrations, and the compound represented by Formula E-2a or Formula E-2b is not limited to the compounds represented in Compound Group E-2.

Compound Group E-2

E-2-1

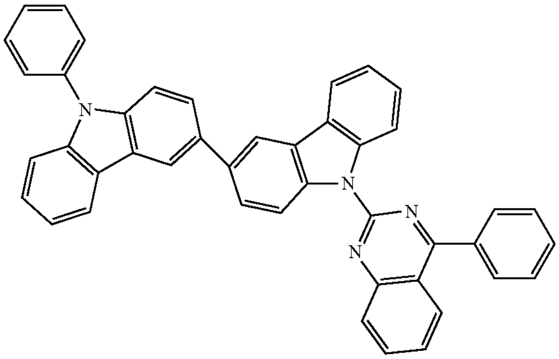

E-2-2

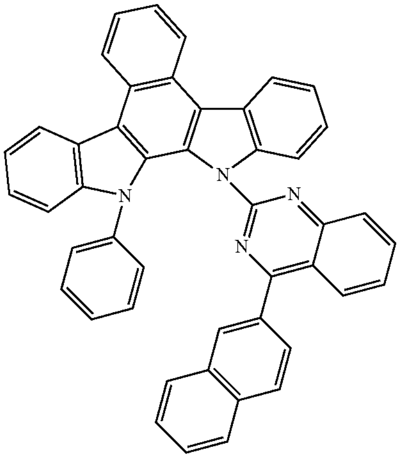

-continued
E-2-3
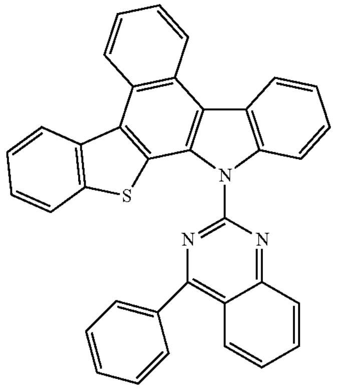
E-2-4
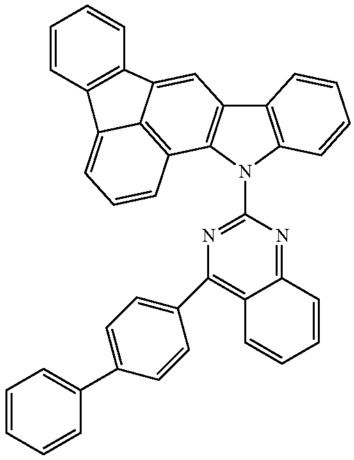
E-2-5
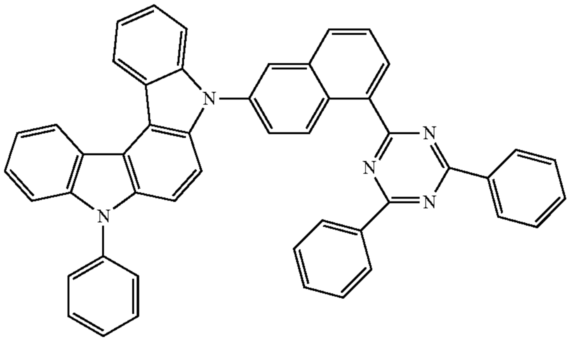
-continued
E-2-6
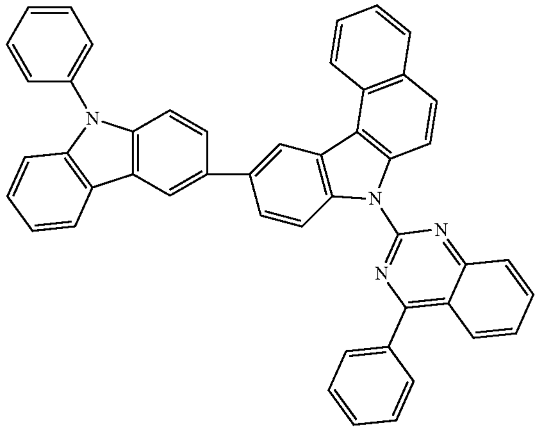
E-2-7
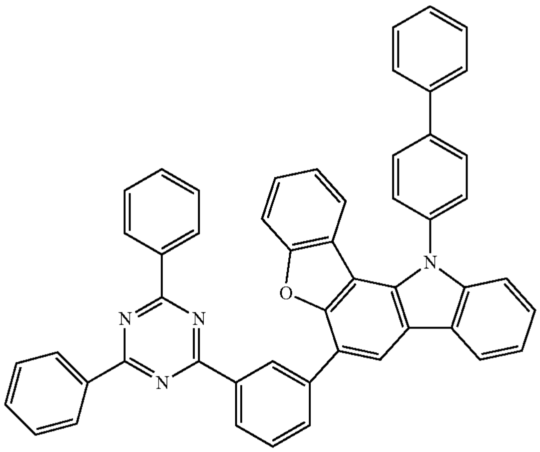
E-2-8
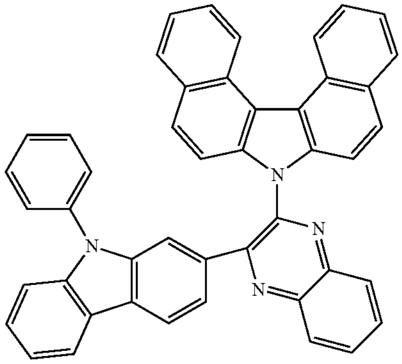

-continued
E-2-9
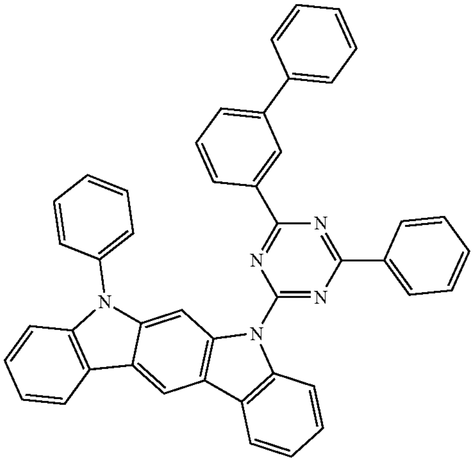
E-2-10
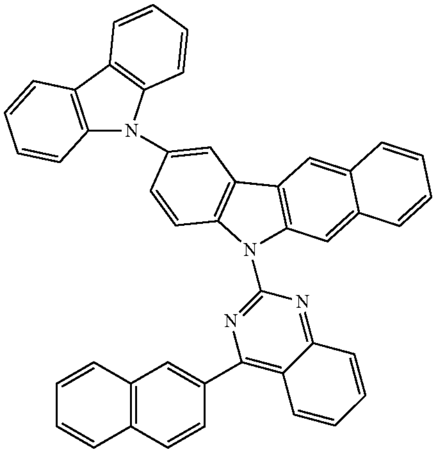
E-2-11
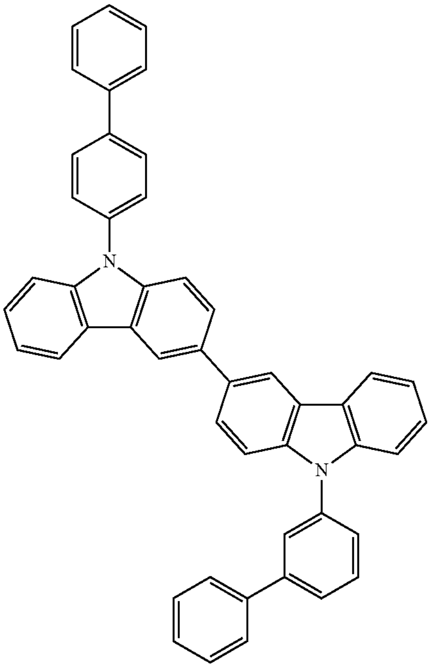
-continued
E-2-12
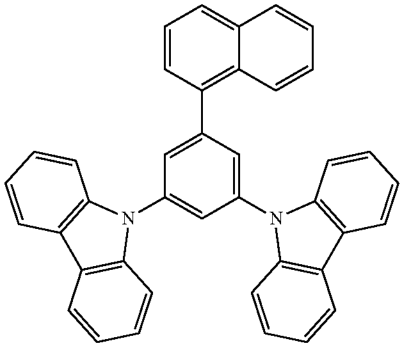
E-2-13
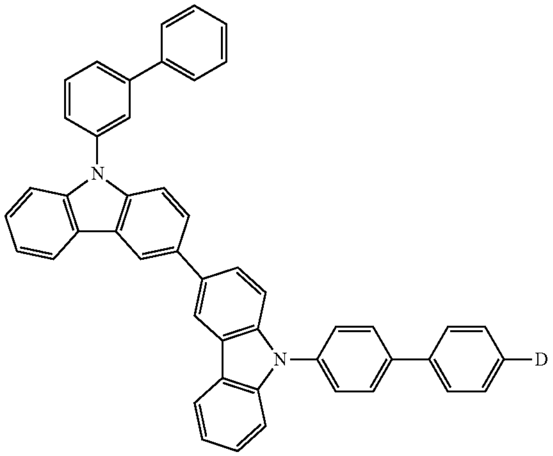
E-2-14
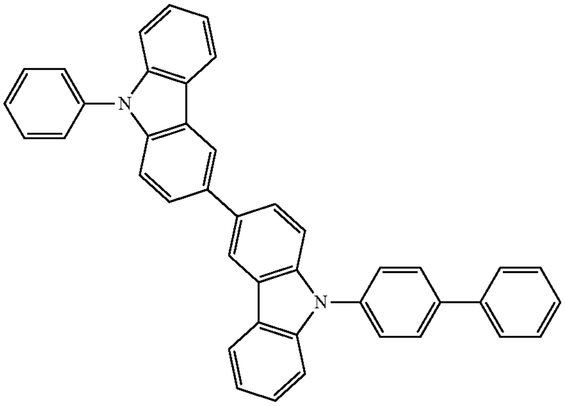
E-2-15
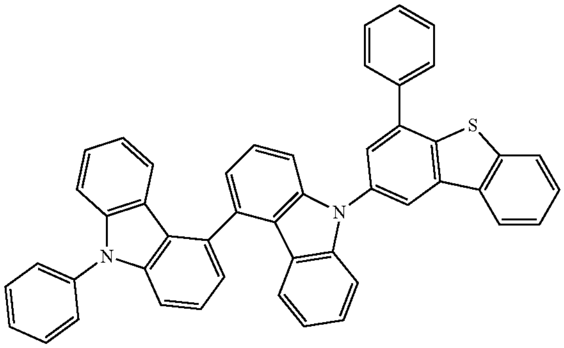

-continued
E-2-16
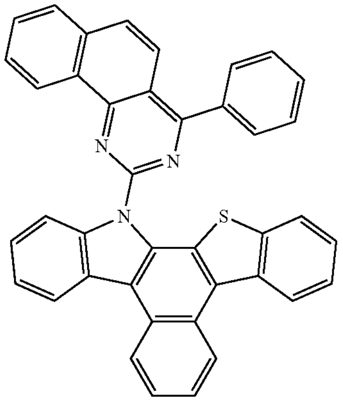
E-2-17
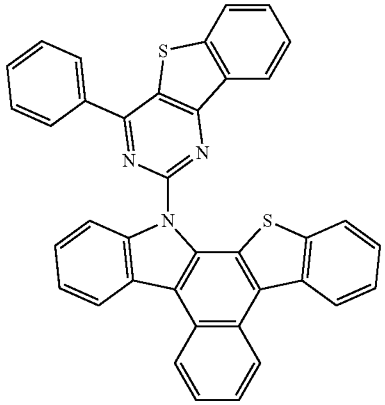
E-2-18
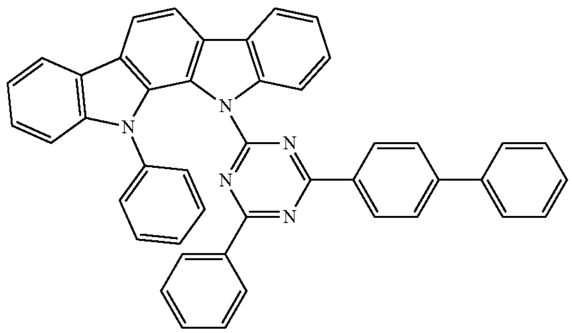
E-2-19
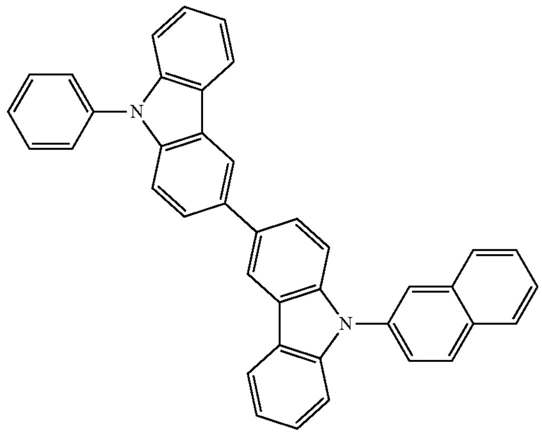
-continued
E-2-20
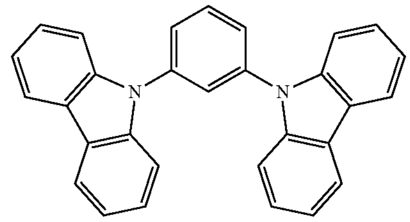
E-2-21
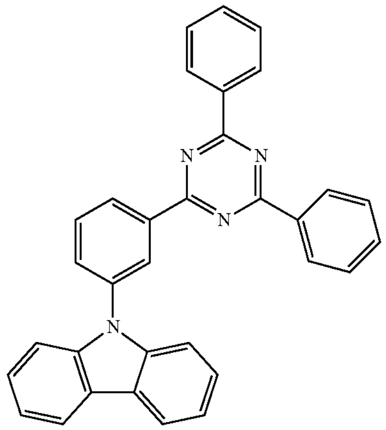
E-2-22
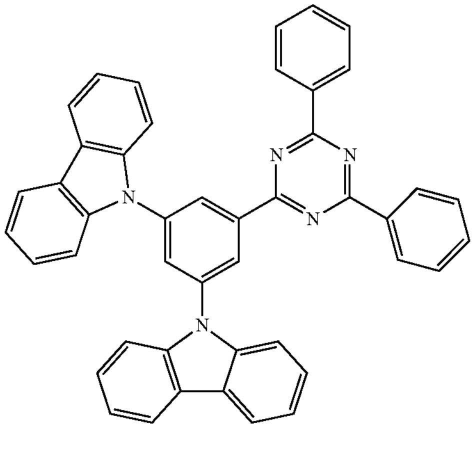
E-2-23
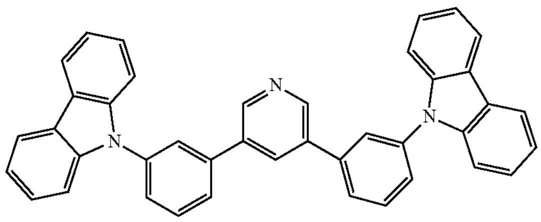

-continued

E-2-24

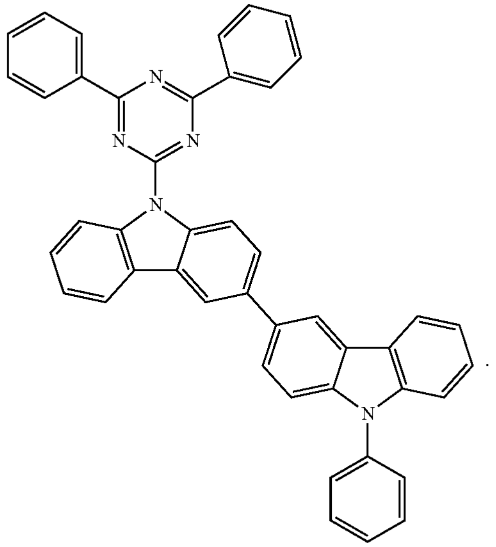

The emission layer EML may further include any suitable material in the art as a host material. For example, the emission layer EML may include as a host material, at least one of bis[2-(diphenylphosphino)phenyl] ether oxide (DPEPO), 4,4'-bis(carbazol-9-yl)-1,1'-biphenyl (CBP), 1,3-bis(carbazol-9-yl)benzene (mCP), 2,8-bis(diphenylphosphoryl)dibenzo[b,d]furan (PPF), 4,4',4"-tris(carbazol-9-yl)-triphenylamine (TCTA), or 1,3,5-tris(1-phenyl-1H-benzo[d]imidazole-2-yl)benzene (TPBi). However, embodiments of the present disclosure are not limited thereto. For example, tris(8-hydroxyquinolino)aluminum ($Alq_3$), 9,10-di(naphthalen-2-yl)anthracene (ADN), 2-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), hexaphenyl cyclotriphosphazene (CP1), 1,4-bis(triphenylsilyl)benzene (UGH2), hexaphenylcyclotrisiloxane ($DPSiO_3$), octaphenylcyclotetra siloxane ($DPSiO_4$), etc. may be utilized as the host material.

The emission layer EML may include a compound represented by Formula M-a or Formula M-b. The compound represented by Formula M-a or Formula M-b may be utilized as a phosphorescence dopant material.

Formula M-a

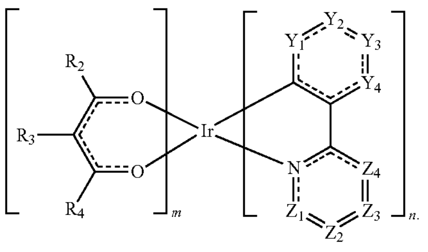

In Formula M-a, $Y_1$ to $Y_4$ and $Z_1$ to $Z_4$ may each independently be $CR_1$ or N, and $R_1$ to $R_4$ may each independently be a hydrogen atom, a deuterium atom, a substituted or unsubstituted amine group, a substituted or unsubstituted thio group, a substituted or unsubstituted oxy group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, and/or may be combined with an adjacent group to form a ring. In Formula M-a, "m" may be 0 or 1, and "n" may be 2 or 3. In Formula M-a, when "m" is 0, "n" is 3, and when "m" is 1, "n" is 2.

The compound represented by Formula M-a may be utilized as a phosphorescence dopant.

The compound represented by Formula M-a may be represented by any one among Compounds M-a1 to M-a23. However, Compounds M-a1 to M-a23 are examples, and the compound represented by Formula M-a is not limited to the compounds represented by Compounds M-a1 to M-a23.

M-a1

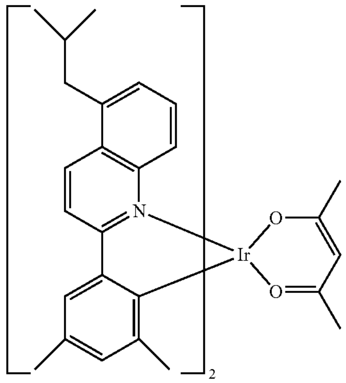

M-a2

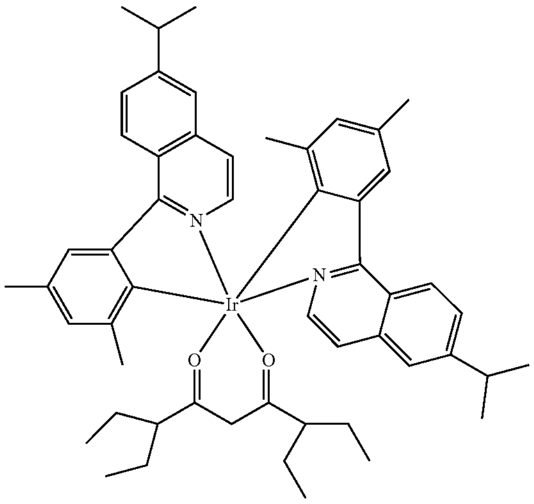

M-a3

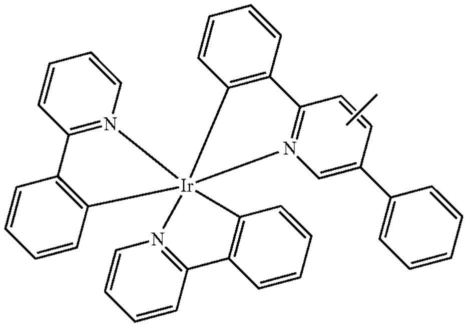

M-a4
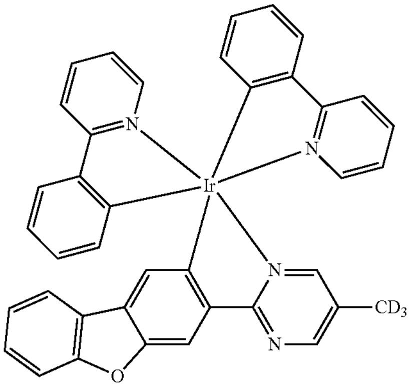
M-a5
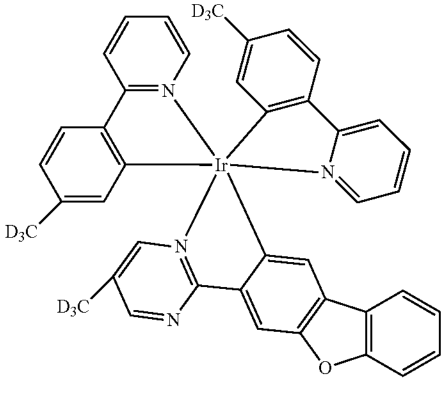
M-a6
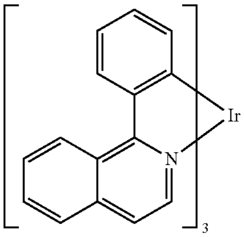
M-a7
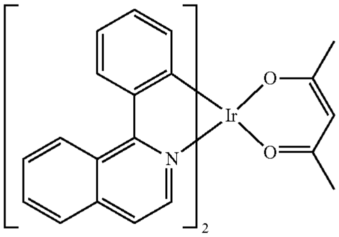
M-a8
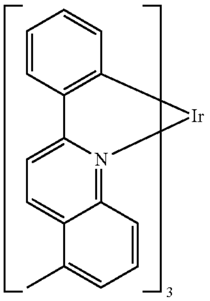
M-a9
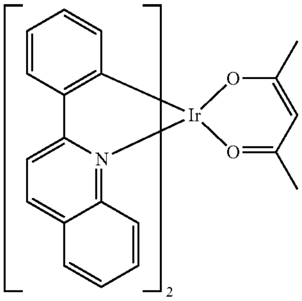
M-a10
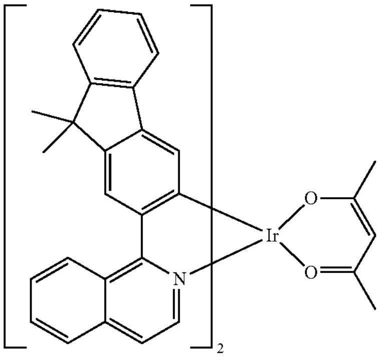
M-a11
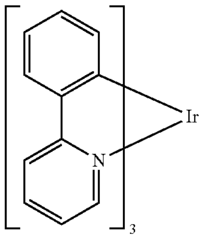
M-a12
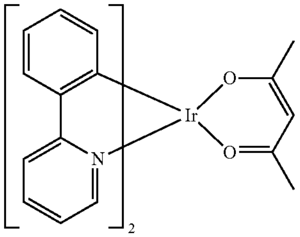
M-a13
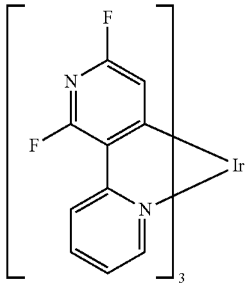

-continued
M-a14
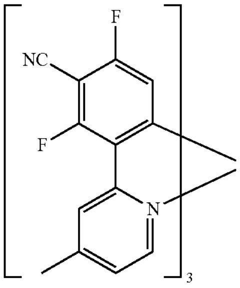
M-a15
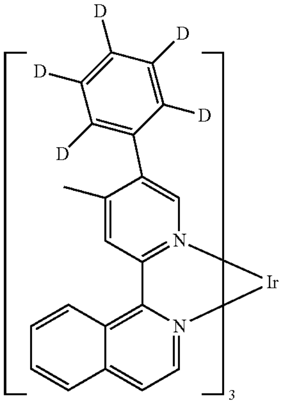
M-a16
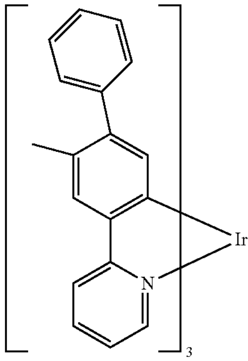
M-a17
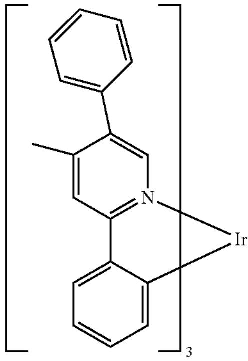
-continued
M-a18
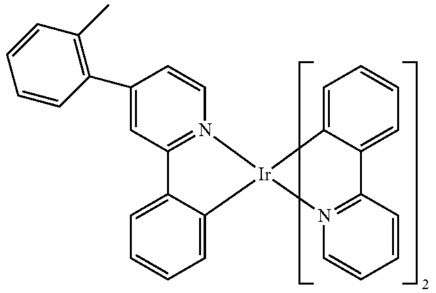
M-a19
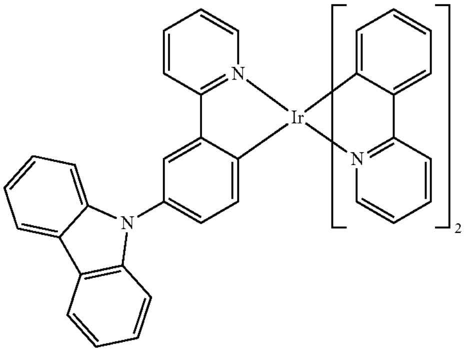
M-a20
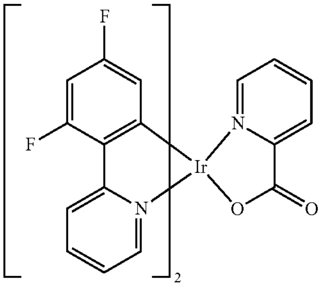
M-a21
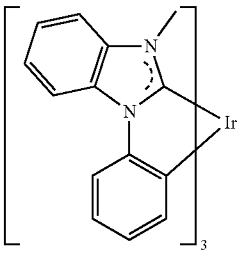
M-a22
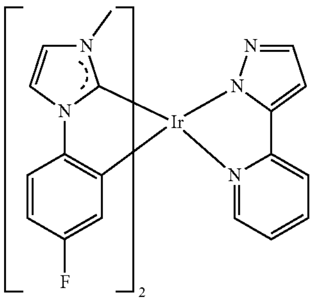

-continued

M-a23

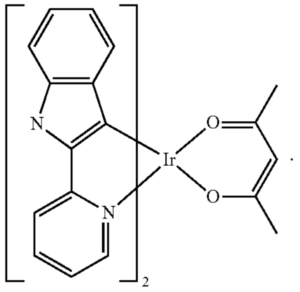

Compound M-a1 and Compound M-a2 may be utilized as red dopant materials, and Compound M-a3 to Compound M-a5 may be utilized as green dopant materials.

Formula M-b

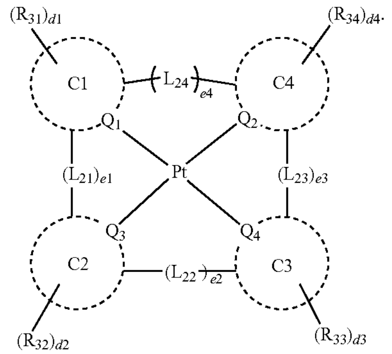

In Formula M-b, $Q_1$ to $Q_4$ may each independently be C or N, C1 to C4 may each independently be a substituted or unsubstituted hydrocarbon ring of 5 to 30 ring-forming carbon atoms, or a substituted or unsubstituted heterocycle of 2 to 30 ring-forming carbon atoms. $L_{21}$ to $L_{24}$ may each independently be a direct linkage,

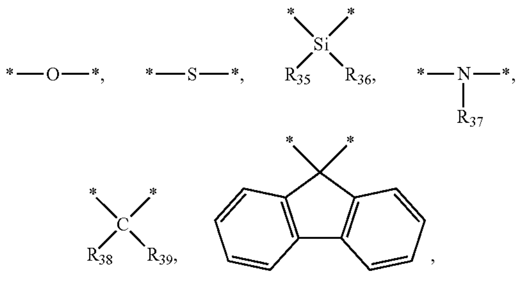

a substituted or unsubstituted divalent alkyl group of 1 to 20 carbon atoms, a substituted or unsubstituted arylene group of 6 to 30 ring-forming carbon atoms, or a substituted or unsubstituted heteroarylene group of 2 to 30 ring-forming carbon atoms, and e1 to e4 may each independently be 0 or 1. $R_{31}$ to $R_{39}$ may each independently be a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, and/or combined with an adjacent group to form a ring, and d1 to d4 may each independently be an integer of 0 to 4.

The compound represented by Formula M-b may be utilized as a blue phosphorescence dopant or a green phosphorescence dopant.

The compound represented by Formula M-b may be represented by any one among the compounds below. However, the compounds below are illustrations, and the compound represented by Formula M-b is not limited to the compounds represented below.

M-b-1

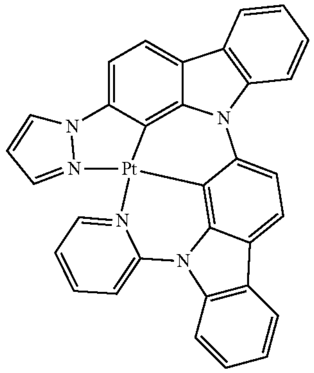

M-b-2

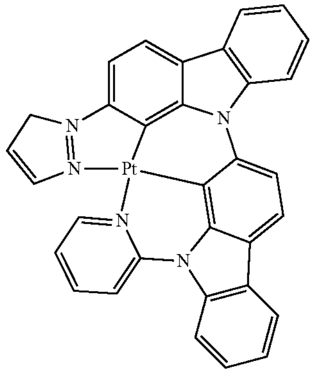

M-b-3

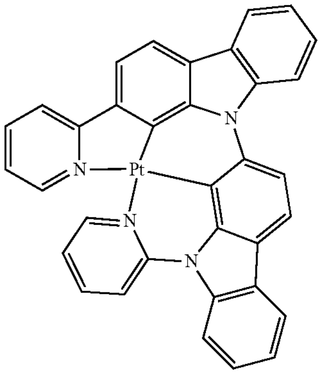

-continued
M-b-4
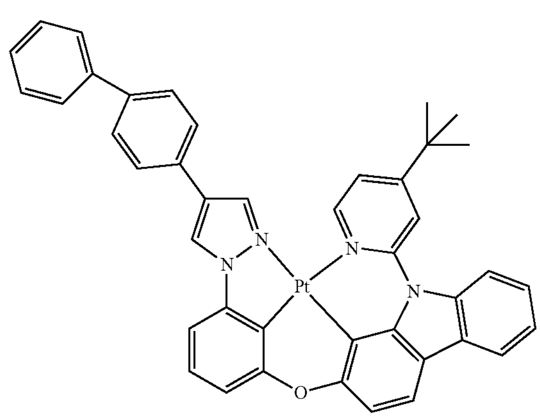
M-b-5
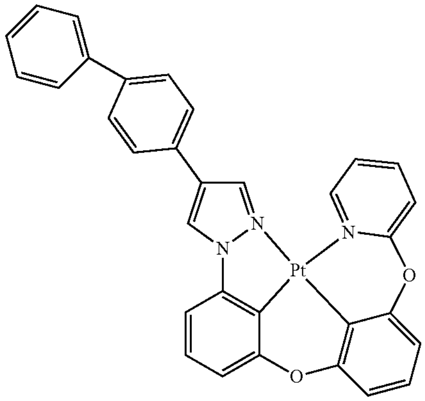
M-b-6
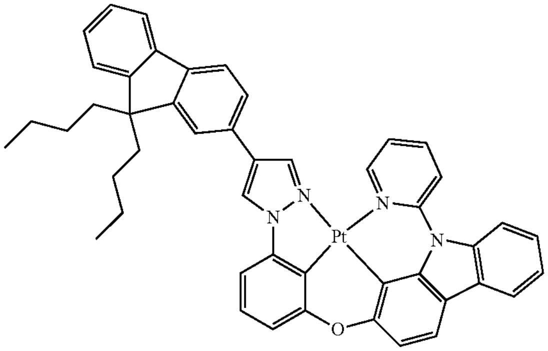
M-b-7
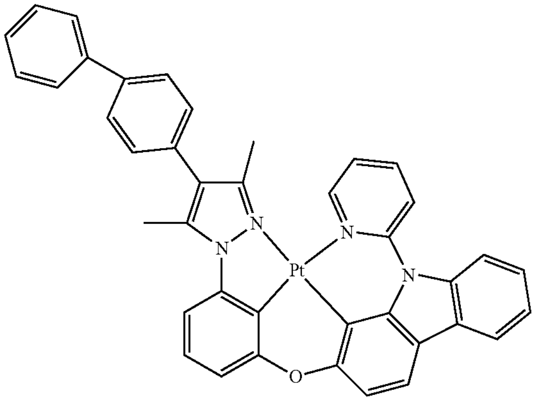
-continued
M-b-8
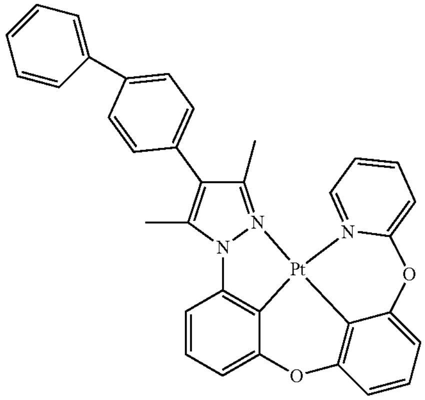
M-b-9
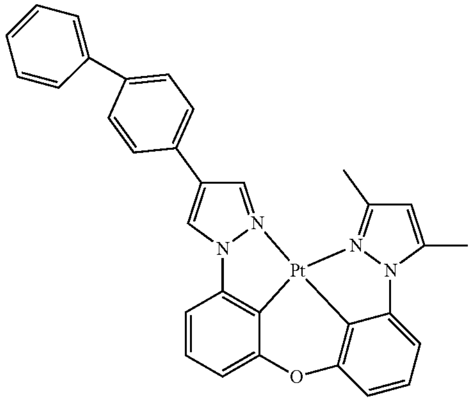
M-b-10
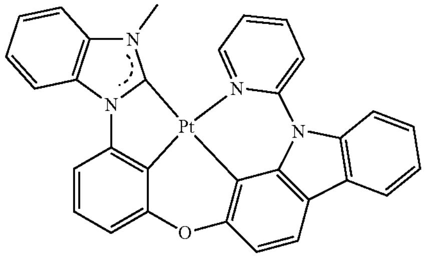
M-b-11
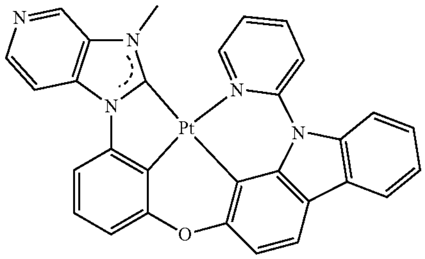
M-b-12
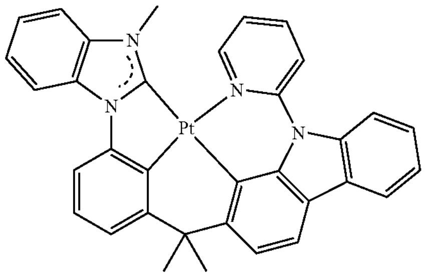

-continued

M-b-12

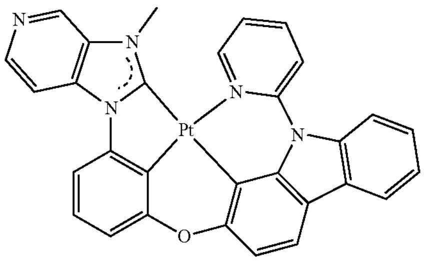

M-b-13

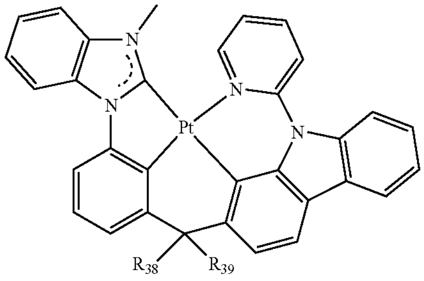

M-b-14

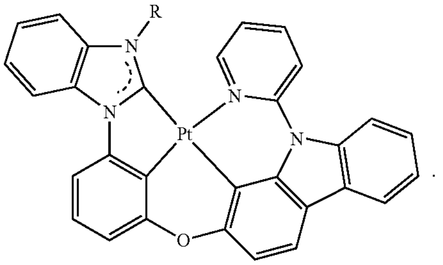

In the compounds above, R, $R_{38}$, and $R_{39}$ may each independently be a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

The emission layer EML may include any one among Formula F-a to Formula F-c. The compounds represented by Formula F-a to Formula F-c may be utilized as fluorescence dopant materials.

Formula F-a

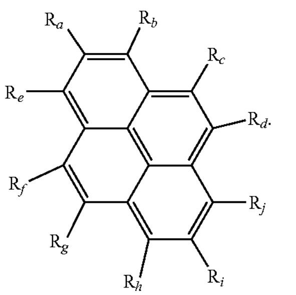

In Formula F-a, two selected from $R_a$ to $R_j$ may each independently be substituted with *—$NAr_1Ar_2$. The remainder of $R_a$ to $R_j$ that are not substituted with *—$NAr_1Ar_2$ may each independently be a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

In *—$NAr_1Ar_2$, $Ar_1$ and $Ar_2$ may each independently be a substituted or unsubstituted aryl group of 6 to 30 ring-forming carbon atoms, or a substituted or unsubstituted heteroaryl group of 2 to 30 ring-forming carbon atoms. For example, at least one among $Ar_1$ and $Ar_2$ may be a heteroaryl group including O or S as a ring-forming atom.

Formula F-b

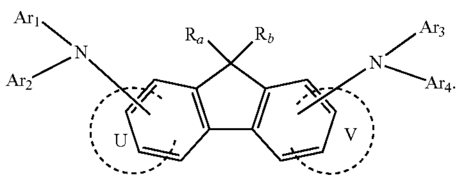

In Formula F-b, $R_a$ and $R_b$ may each independently be a hydrogen atom, a deuterium atom, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, and/or may be combined with an adjacent group to form a ring. $Ar_1$ to $Ar_4$ may each independently be a substituted or unsubstituted aryl group of 6 to 30 ring-forming carbon atoms, or a substituted or unsubstituted heteroaryl group of 2 to 30 ring-forming carbon atoms.

In Formula F-b, U and V may each independently be a substituted or unsubstituted hydrocarbon ring of 5 to 30 ring-forming carbon atoms, or a substituted or unsubstituted heterocycle of 2 to 30 ring-forming carbon atoms.

In Formula F-b, the number of rings represented by U and V may each independently be 0 or 1. For example, in Formula F-b, when the number of U or V is 1, one ring forms a fused ring at the designated part by U or V, and when the number of U or V is 0, a ring is not present at the designated part by U or V. For example, when the number of U is 0, and the number of V is 1, or when the number of U is 1, and the number of V is 0, a fused ring having the fluorene core of Formula F-b may be a ring compound with four rings. When the number of both U and V is 0 (e.g., simultaneously), the fused ring of Formula F-b may be a ring compound with three rings. When the number of both U and V is 1 (e.g., simultaneously), a fused ring including the fluorene core of Formula F-b may be a ring compound with five rings.

Formula F-c

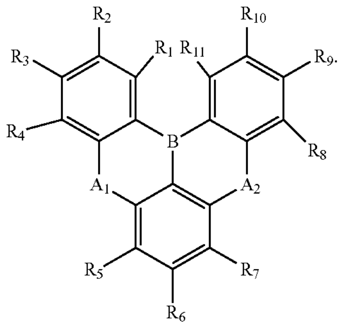

In Formula F-c, $A_1$ and $A_2$ may each independently be O, S, Se, or $NR_m$, and $R_m$ may be a hydrogen atom, a deuterium atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms. $R_1$ to $R_{11}$ may each independently be a hydrogen atom, a deuterium atom, a halogen atom, a cyano group, a substituted or unsubstituted amine group, a substituted or unsubstituted boryl group, a substituted or unsubstituted oxy group, a substituted or unsubstituted thio group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, and/or combined with an adjacent group to form a ring.

In Formula F-c, $A_1$ and $A_2$ may each independently be combined with the substituents of an adjacent ring to form a fused ring. For example, when $A_1$ and $A_2$ are each independently $NR_m$, $A_1$ may be combined with $R_4$ or $R_5$ to form a ring (e.g., $A_1$ as $NR_m$ may be combined with $R_4$ or $R_5$ to form a ring). In some embodiments, similarly, $A_2$ (e.g., as $NR_m$) may be combined with $R_7$ or $R_8$ to form a ring.

In an embodiment, the emission layer EML may include as a suitable dopant material, styryl derivatives (for example, 1,4-bis[2-(3-N-ethylcarbazolyl)vinyl]benzene (BCzVB), 4-(di-p-tolylamino)-4'-[(di-p-tolylamino)styryl]stilbene (DPAVB), N-(4-((E)-2-(6-((E)-4-(diphenylamino)styryl)naphthalen-2-yl)vinyl)phenyl)-N-phenylbenzenamine (N-BDAVBi), and 4,4'-bis[2-(4-(N,N-diphenylamino)phenyl)vinyl]biphenyl (DPAVBi)), perylene and/or derivatives thereof (for example, 2,5,8,11-tetra-t-butylperylene (TBP)), pyrene and/or derivatives thereof (for example, 1,1-dipyrene, 1,4-dipyrenylbenzene, and/or 1,4-bis(N,N-diphenylamino)pyrene), etc.

The emission layer EML may include any suitable phosphorescence dopant material. For example, the phosphorescence dopant may be or include a metal complex including iridium (Ir), platinum (Pt), osmium (Os), gold (Au), titanium (Ti), zirconium (Zr), hafnium (Hf), europium (Eu), terbium (Tb) and/or thulium (Tm). For example, iridium(III) bis(4,6-difluorophenylpyridinato-N,C2')picolinate (Flrpic), bis(2,4-difluorophenylpyridinato)-tetrakis(1-pyrazolyl)borate iridium(III) (Fir6), and/or platinum octaethyl porphyrin (PtOEP) may be utilized as the phosphorescence dopant. However, embodiments of the present disclosure are not limited thereto.

In the organic electroluminescence device ED of an embodiment, as shown in FIG. 3 to FIG. 6, the electron transport region ETR is provided on the emission layer EML. The electron transport region ETR may include at least one of a hole blocking layer HBL, an electron transport layer ETL or an electron injection layer EIL. However, embodiments of the present disclosure are not limited thereto.

The electron transport region ETR may have a single layer formed utilizing a single material, a single layer formed utilizing multiple different materials, or a multilayer structure having multiple layers formed utilizing multiple different materials.

For example, the electron transport region ETR may have a single layer structure of an electron injection layer EIL or an electron transport layer ETL, or a single layer structure formed utilizing an electron injection material and an electron transport material. Further, the electron transport region ETR may have a single layer structure formed utilizing multiple different materials, or a structure stacked from the emission layer EML of electron transport layer ETL/electron injection layer EIL, or hole blocking layer HBL/electron transport layer ETL/electron injection layer EIL, without limitation. The thickness of the electron transport region ETR may be, for example, about 1,000 Å to about 1,500 Å.

The electron transport region ETR may be formed utilizing one or more suitable methods (such as a vacuum deposition method, a spin coating method, a cast method, a Langmuir-Blodgett (LB) method, an inkjet printing method, a laser printing method, and/or a laser induced thermal imaging (LITI) method).

The electron transport region ETR may include a compound represented by Formula ET-1.

Formula ET-1

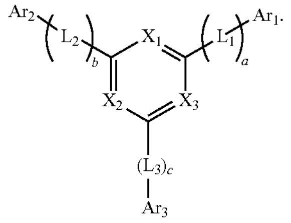

In Formula ET-1, at least one among $X_1$ to $X_3$ may be N, and the remainder may be $CR_a$. $R_a$ may be a hydrogen atom, a deuterium atom, a substituted or unsubstituted alkyl of 1 to 20 carbon atoms, a substituted or unsubstituted aryl group of 6 to 30 ring-forming carbon atoms, or a substituted or unsubstituted heteroaryl group of 2 to 30 ring-forming carbon atoms. $Ar_1$ to $Ar_3$ may each independently be a hydrogen atom, a deuterium atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

In Formula ET-1, "a" to "c" may each independently be an integer of 0 to 10. In Formula ET-1, $L_1$ to $L_3$ may each independently be a direct linkage, a substituted or unsubstituted arylene group of 6 to 30 ring-forming carbon atoms, or a substituted or unsubstituted heteroarylene group of 2 to 30 ring-forming carbon atoms. When "a" to "c" are integers of 2 or more, $L_1$ to $L_3$ may each independently be a substituted or unsubstituted arylene group of 6 to 30 ring-forming carbon atoms, or a substituted or unsubstituted heteroarylene group of 2 to 30 ring-forming carbon atoms.

The electron transport region ETR may include an anthracene-based compound. However, embodiments of the present disclosure are not limited thereto, and the electron transport region ETR may include, for example, tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato) aluminum (BAlq), beryllium bis(benzoquinolin-10-olate ($Bebq_2$), 9,10-di(naphthalene-2-yl)anthracene (ADN), 1,3-bis[3,5-di(pyridin-3-yl)phenyl]benzene (BmPyPhB), and/or mixture(s) thereof, without limitation.

The electron transport region ETR may include at least one among Compounds ET1 to ET36.

ET1

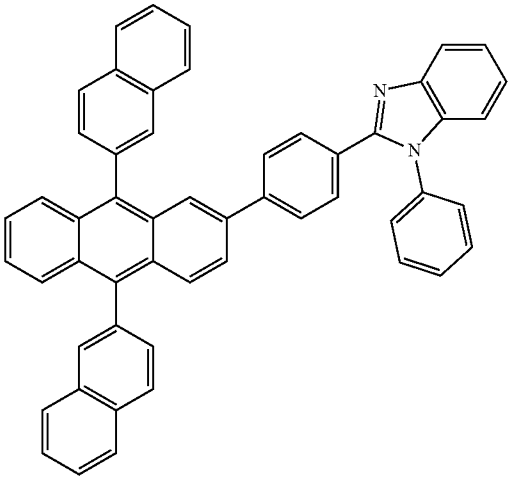

ET2

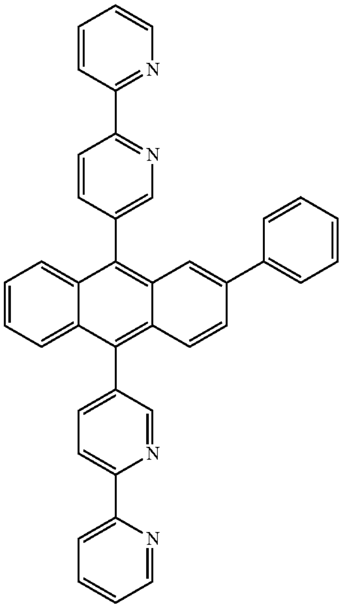

-continued

ET3

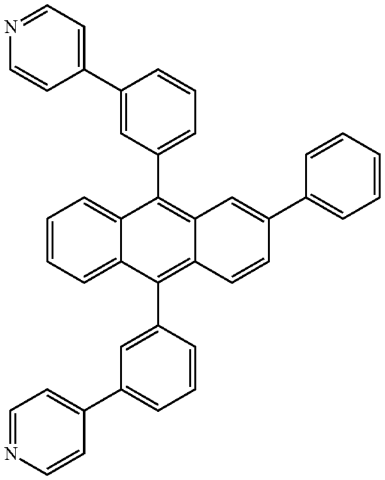

ET4

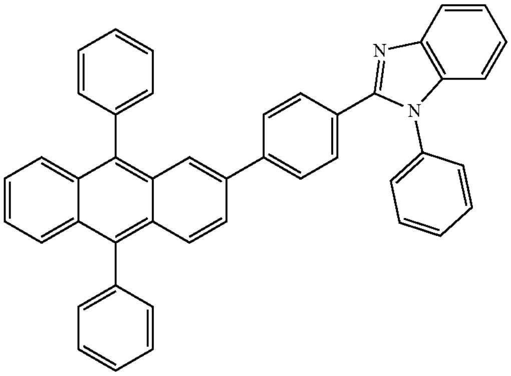

ET5

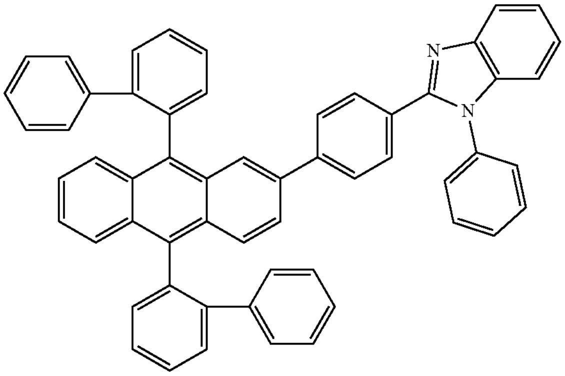

-continued
ET6
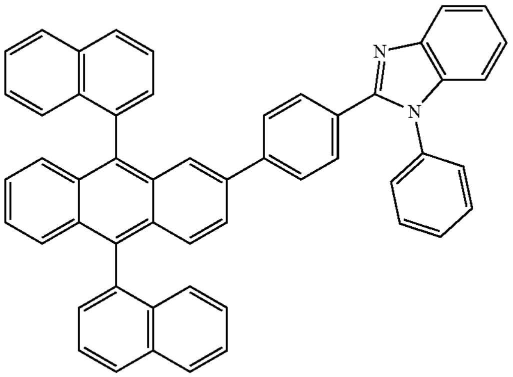
ET7
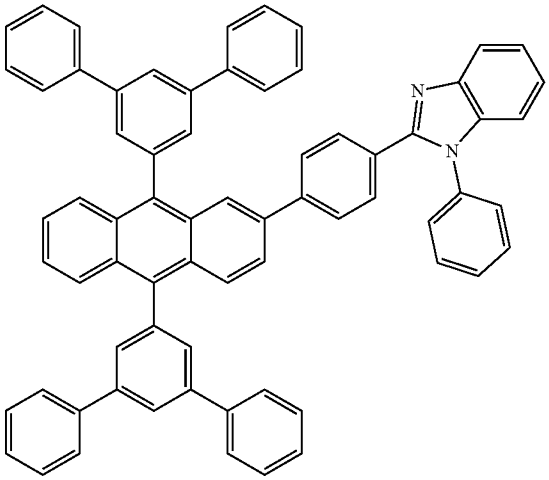
ET8
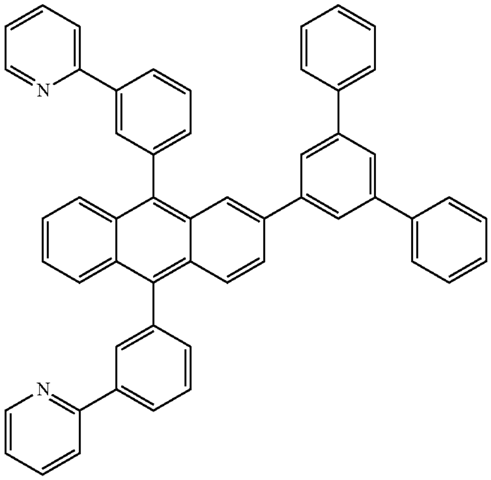
-continued
ET9
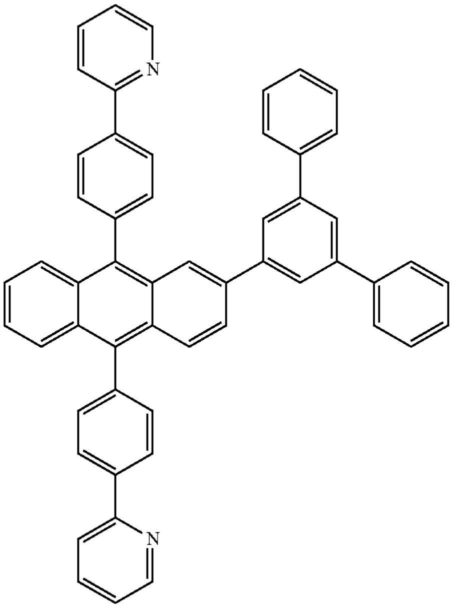
ET10
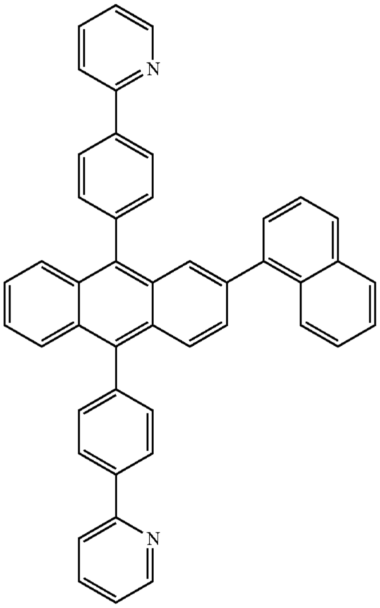

-continued
ET11
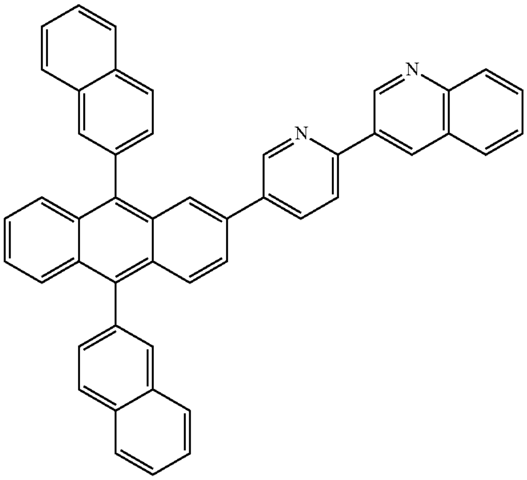
ET12
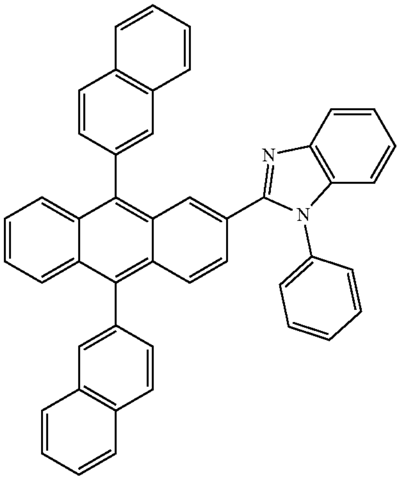
ET13
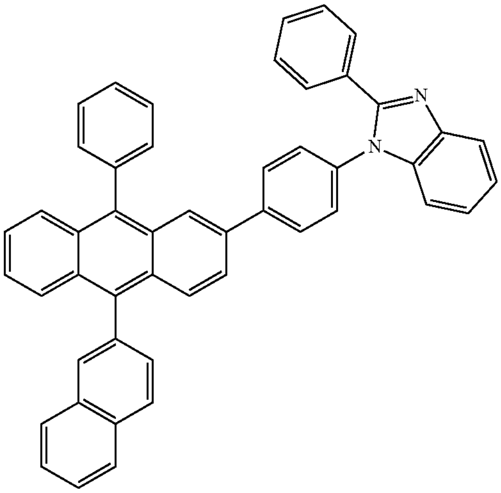
-continued
ET14
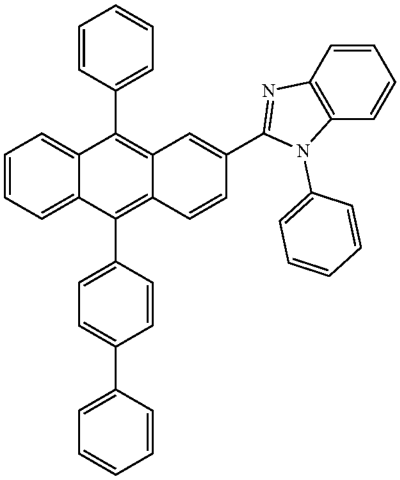
ET15
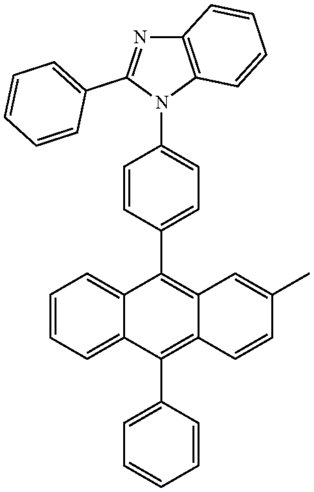
ET16
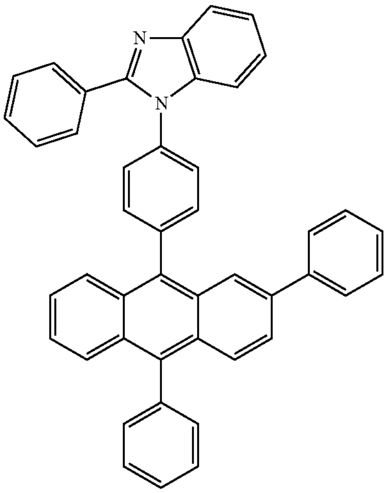

-continued
ET17
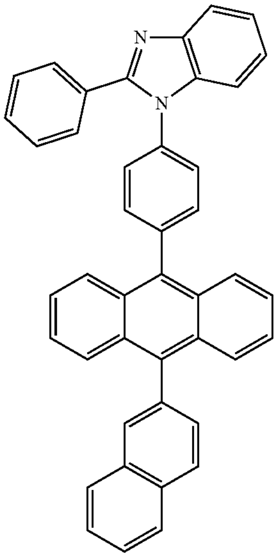
ET18
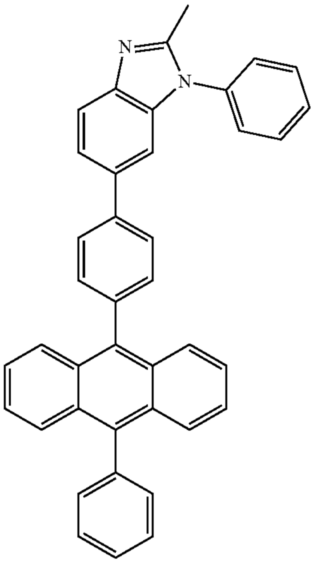
ET19
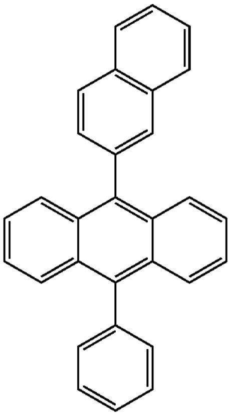
-continued
ET20
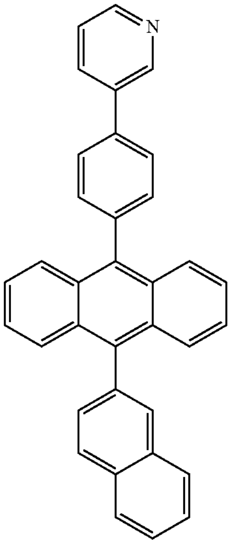
ET21
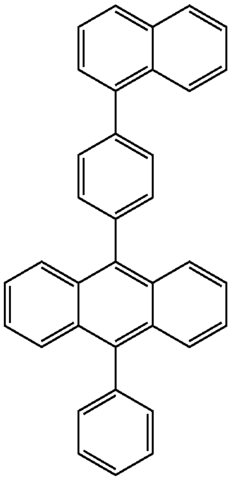
ET22
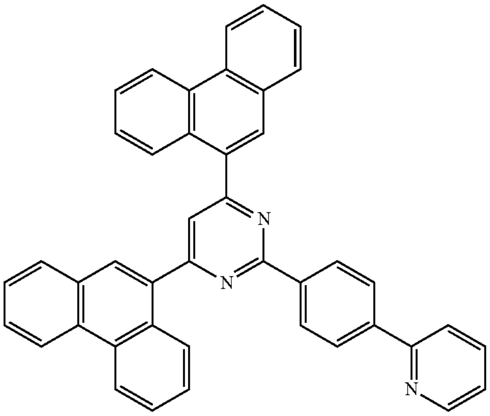

-continued
ET23
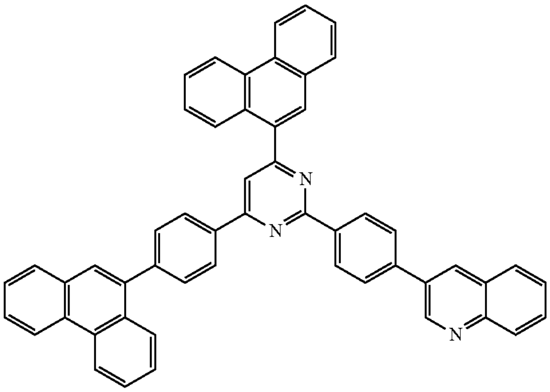
ET24
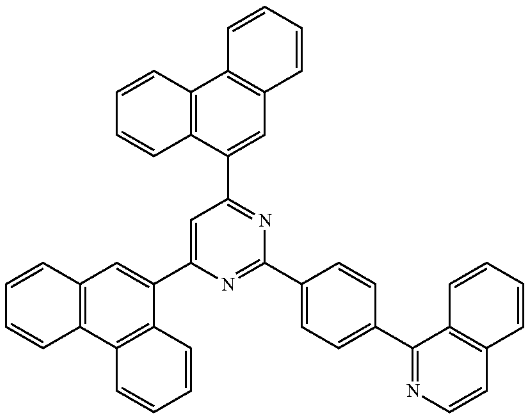
ET25
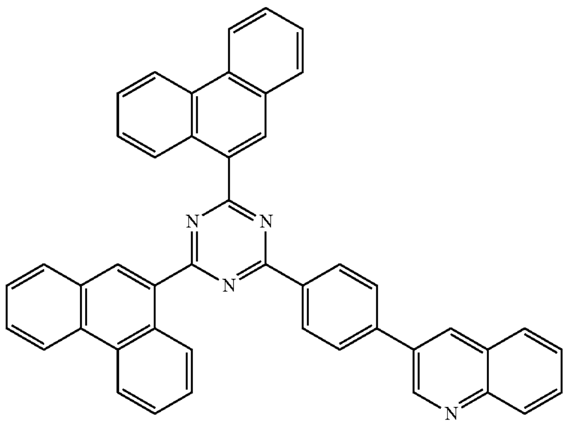
-continued
ET26
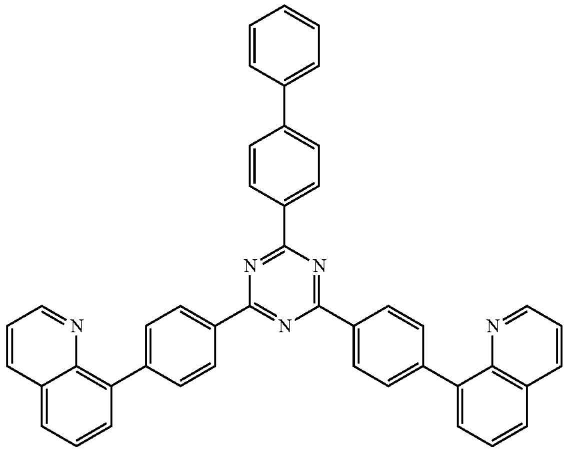
ET27
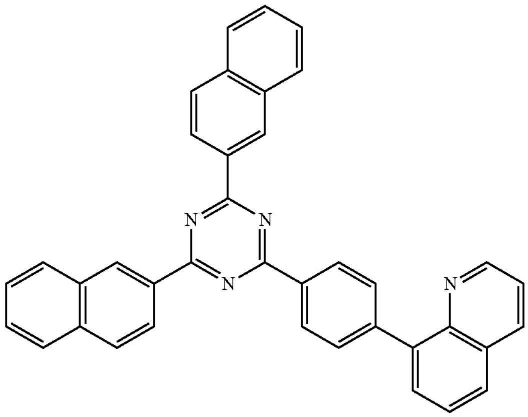
ET28
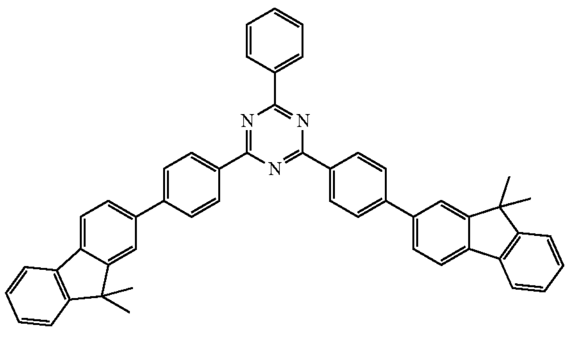

-continued
ET29
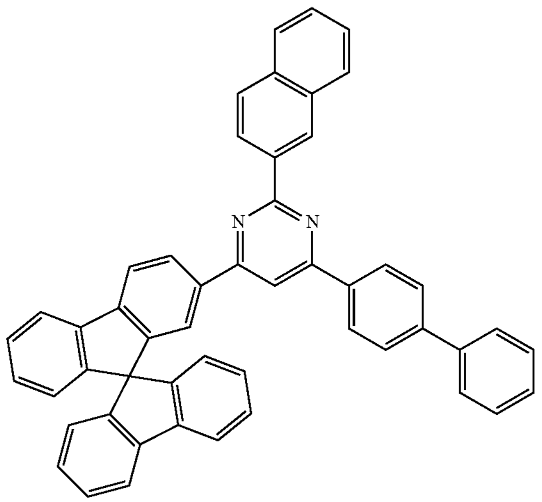
ET30
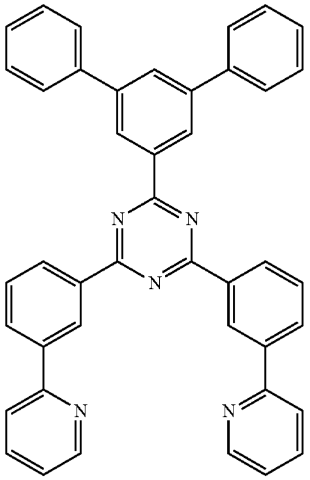
ET31
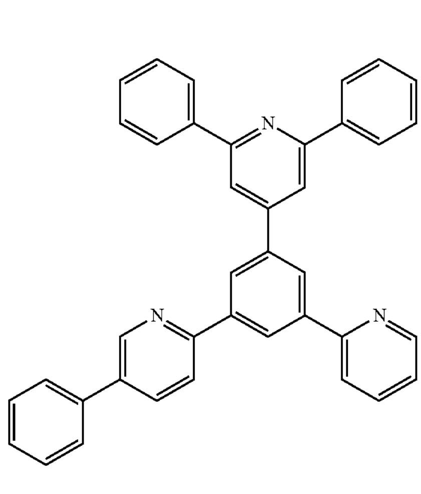
-continued
ET32
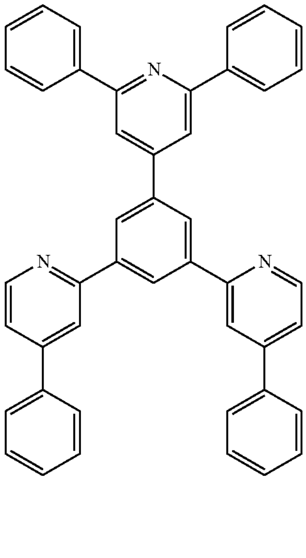
ET33
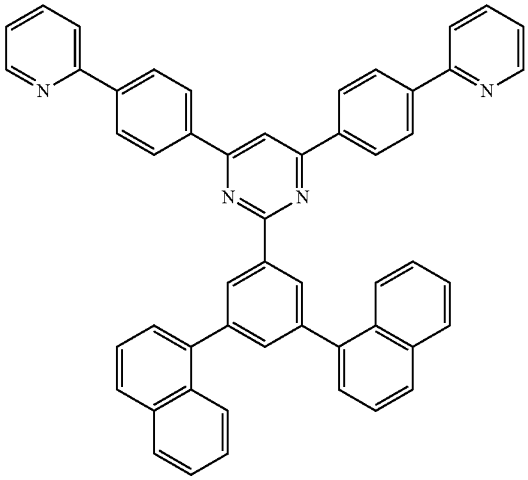
ET34
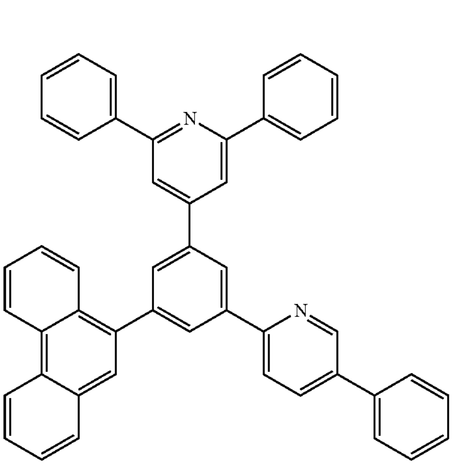

-continued

ET35

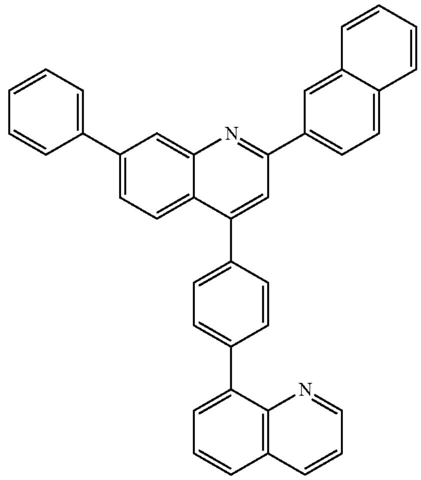

ET36

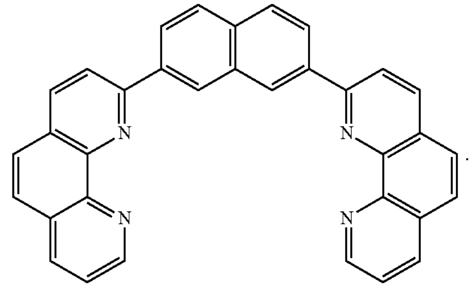

In some embodiments, the electron transport region ETR may include a metal halide (such as LiF, NaCl, CsF, RbCl, RbI, CuI and/or KI), a lanthanide metal (such as Yb), or a co-deposited material of the metal halide and the lanthanide metal. For example, the electron transport region ETR may include KI:Yb, RbI:Yb, etc., as the co-depositing material. In some embodiments, the electron transport region ETR may utilize a metal oxide (such as $Li_2O$ and/or BaO), or 8-hydroxy-lithium quinolate (LiQ). However, embodiments of the present disclosure are not limited thereto. The electron transport region ETR also may be formed utilizing a mixture of an electron transport material and an insulating organo metal salt. The organo metal salt may be a material having an energy band gap of about 4 eV or more. For example, the organo metal salt may include, for example, metal acetates, metal benzoates, metal acetoacetates, metal acetylacetonates, and/or metal stearates.

The electron transport region ETR may include at least one of 2,9-dimethyl-4,7-diphenyl-1,10-phenanthroline (BCP), or 4,7-diphenyl-1,10-phenanthroline (Bphen) in addition to the aforementioned materials. However, embodiments of the present disclosure are not limited thereto.

The electron transport region ETR may include the compounds of the electron transport region in at least one among an electron injection layer EIL, an electron transport layer ETL, and a hole blocking layer HBL.

When the electron transport region ETR includes the electron transport layer ETL, the thickness of the electron transport layer ETL may be about 100 Å to about 1,000 Å, for example, about 150 Å to about 500 Å. When the thickness of the electron transport layer ETL satisfies the above-described range, satisfactory electron transport properties may be obtained without substantial increase of a driving voltage. When the electron transport region ETR includes the electron injection layer EIL, the thickness of the electron injection layer EIL may be about 1 Å to about 100 Å, and about 3 Å to about 90 Å. When the thickness of the electron injection layer EIL satisfies the above described range, satisfactory electron injection properties may be obtained without inducing substantial increase of a driving voltage.

The second electrode EL2 is provided on the electron transport region ETR. The second electrode EL2 may be a common electrode. The second electrode EL2 may be a cathode or an anode, but embodiments of the present disclosure are not limited thereto. For example, when the first electrode EL1 is an anode, the second cathode EL2 may be a cathode, and when the first electrode EL1 is a cathode, the second electrode EL2 may be an anode.

The second electrode EL2 may be a transmissive electrode, a transflective electrode or a reflective electrode. When the second electrode EL2 is a transmissive electrode, the second electrode EL2 may include a transparent metal oxide, for example, ITO, IZO, ZnO, ITZO, etc.

When the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, Yb, W, compounds thereof, or mixtures thereof (for example, AgMg, AgYb, or MgAg). In some embodiments, the second electrode EL2 may have a multilayered structure including a reflective layer or a transflective layer formed utilizing the above-described materials and a transparent conductive layer formed utilizing ITO, IZO, ZnO, ITZO, etc. For example, the second electrode EL2 may include the aforementioned metal material(s), combination(s) of two or more metal materials selected from the aforementioned metal materials, and/or oxide(s) of the aforementioned metal materials.

In some embodiments, the second electrode EL2 may be connected with an auxiliary electrode. When the second electrode EL2 is connected with the auxiliary electrode, the resistance of the second electrode EL2 may decrease.

In some embodiments, on the second electrode EL2 in the organic electroluminescence device ED of an embodiment, a capping layer CPL may be further disposed. The capping layer CPL may include a multilayer or a single layer.

In an embodiment, the capping layer CPL may be an organic layer or an inorganic layer. For example, when the capping layer CPL includes an inorganic material, the inorganic material may include an alkali metal compound (such as LiF), an alkaline earth metal compound (such as $MgF_2$, SiON, $SiN_x$, and/or $SiO_y$), etc.

For example, when the capping layer CPL includes an organic material, the organic material may include α-NPD, NPB, TPD, m-MTDATA, $Alq_3$, CuPc, N4,N4,N4',N4'-tetra(biphenyl-4-yl) biphenyl-4,4'-diamine (TPD15), 4,4',4"-tris(carbazol-9-yl) triphenylamine (TCTA), etc., an epoxy resin, or an acrylate (such as methacrylate). In some embodiments, a capping layer CPL may include at least one among Compounds P1 to P5, but embodiments of the present disclosure are not limited thereto.

-continued

P1

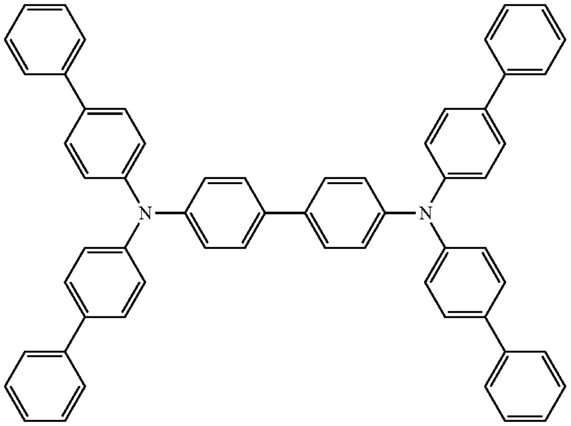

P2

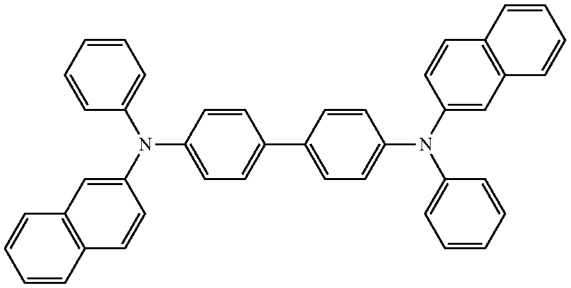

P3

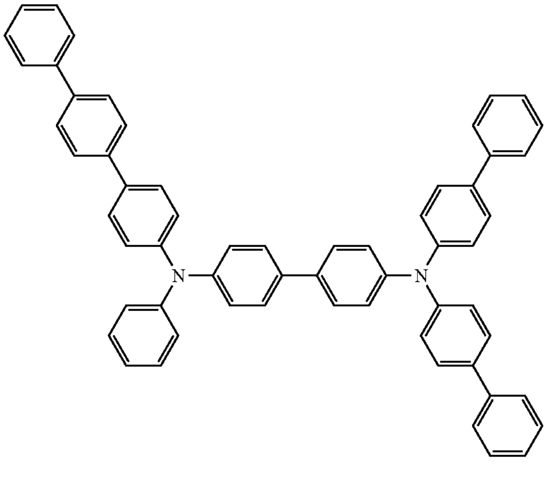

P4

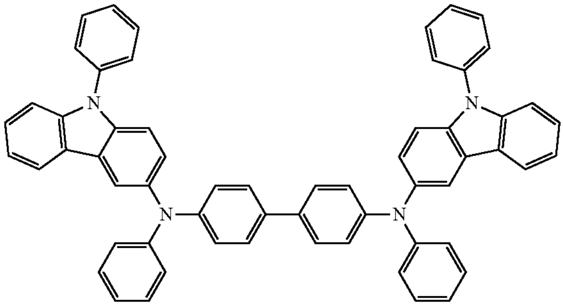

P5

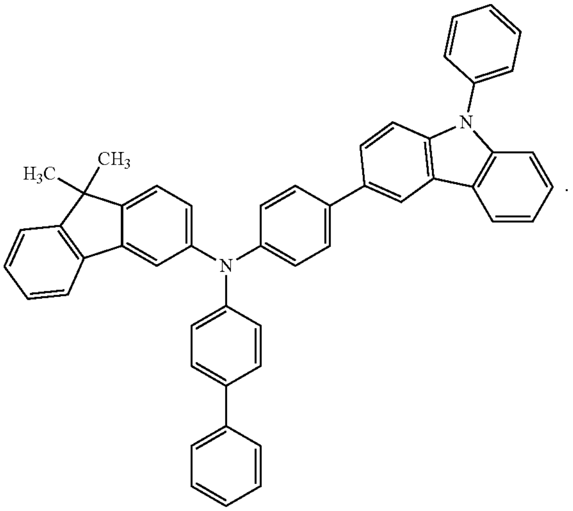

In some embodiments, the refractive index of the capping layer CPL may be about 1.6 or more. For example, the refractive index of the capping layer CPL with respect to light in a wavelength range of about 550 nm to about 660 nm may be about 1.6 or more.

Figure 7:
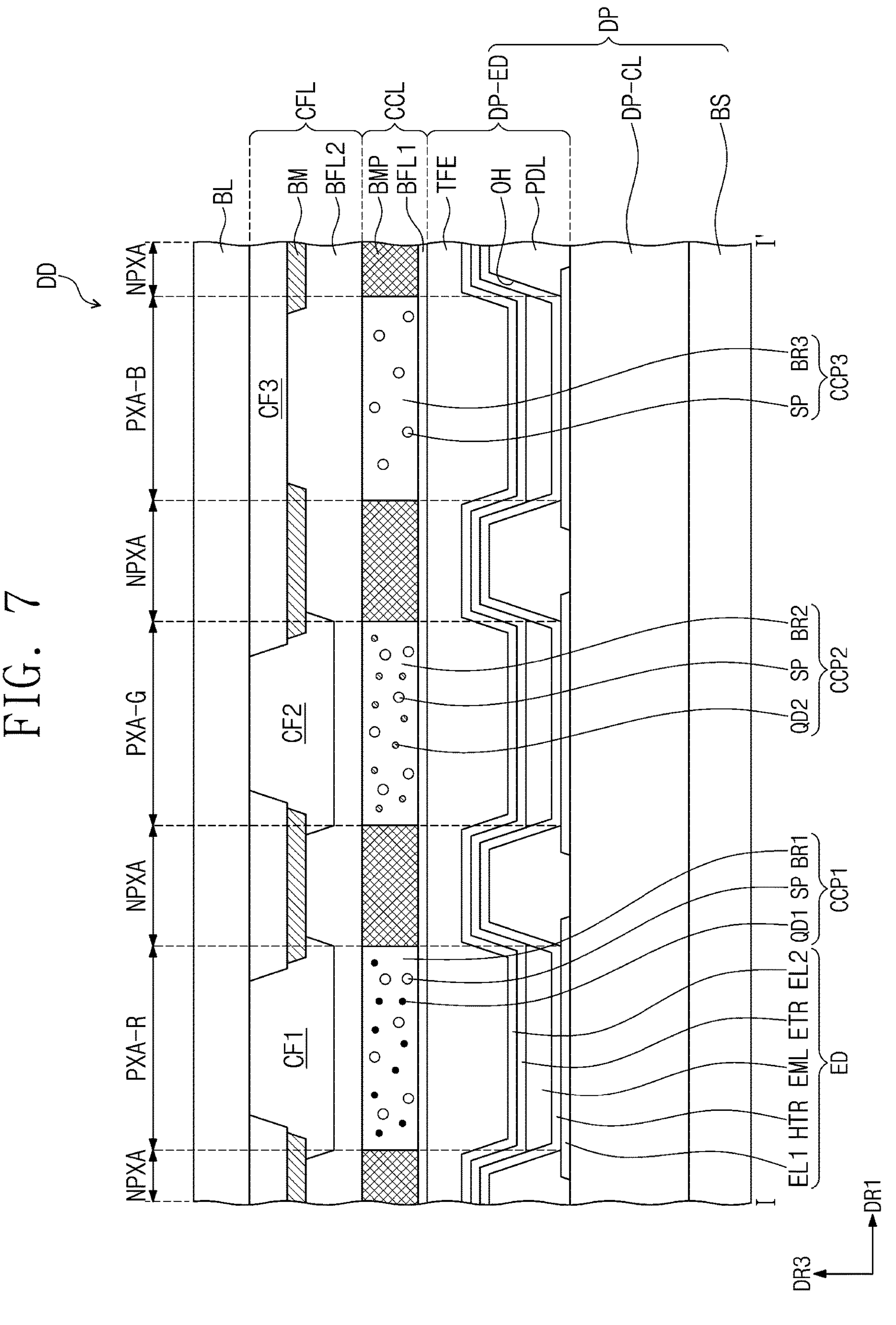
FIG. 7 is a cross-sectional view showing a display apparatus according to an embodiment of the present disclosure.
Figure 8:
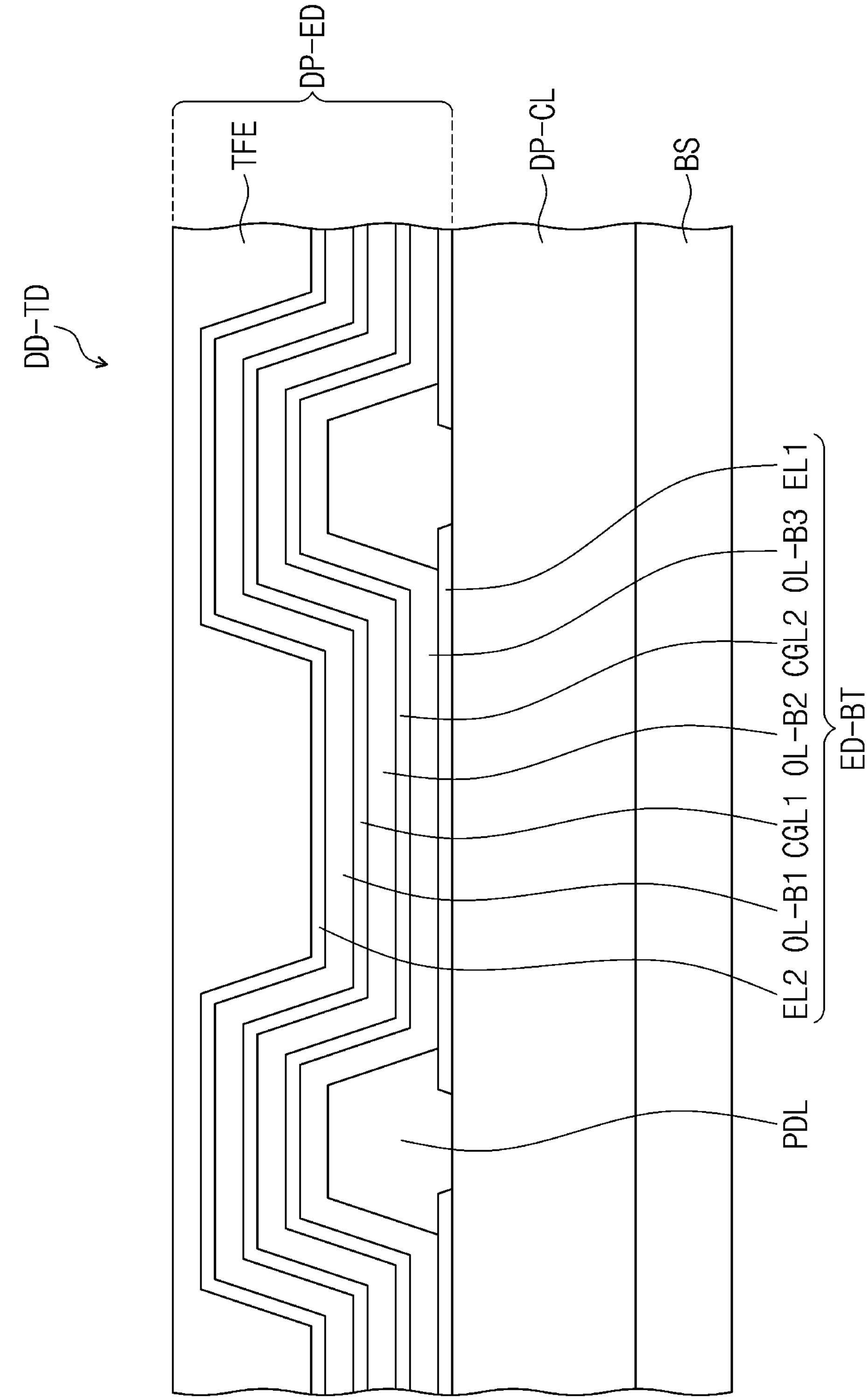
FIG. 8 is a cross-sectional view showing a display apparatus according to an embodiment of the present disclosure.

FIG. 7 and FIG. 8 are cross-sectional views of display apparatuses according to embodiments. In the explanation on the display apparatuses of the embodiments of FIG. 7 and FIG. 8, parts from the explanations of FIG. 1 to FIG. 6 will not be explained again, and the different features will be emphasized.

Referring to FIG. 7, a display apparatus DD according to an embodiment may include a display panel DP including a display device layer DP-ED, and a light controlling layer CCL and a color filter layer CFL disposed on the display panel DP.

In an embodiment shown in FIG. 7, the display panel DP includes a base layer BS, a circuit layer DP-CL provided on the base layer BS, and a display device layer DP-ED, and the display device layer DP-ED may include an organic electroluminescence device ED.

The organic electroluminescence device ED may include a first electrode EL1, a hole transport region HTR disposed on the first electrode EL1, an emission layer EML disposed on the hole transport region HTR, an electron transport region ETR disposed on the emission layer EML, and a second electrode EL2 disposed on the electron transport region ETR. The structures of the organic electroluminescence devices of FIG. 3 to FIG. 6 may be applied to the structure of the organic electroluminescence device ED shown in FIG. 7.

Referring to FIG. 7, the emission layer EML may be disposed in an opening part OH defined in a pixel definition layer PDL. For example, the emission layer EML divided by the pixel definition layer PDL and correspondingly provided to each of luminous areas PXA-R, PXA-G and PXA-B may be to emit light in substantially the same wavelength region. In the display apparatus DD of an embodiment, the emission layer EML may be to emit blue light. In some embodiments, the emission layer EML may be provided as a common layer for all luminous areas PXA-R, PXA-G and PXA-B.

The light controlling layer CCL may be disposed on the display panel DP. The light controlling layer CCL may include a light converter. The light converter may be or include a quantum dot and/or a phosphor. The light converter may transform the wavelength of light provided and then emit (e.g., transform the wavelength of incident light to be emitted as light having a different wavelength). For example, the light controlling layer CCL may be a layer including a quantum dot or a layer including a phosphor.

The emission layer EML may include a quantum dot material. The core of the quantum dot may be selected from a II-VI group compound, a III-VI group compound, a group compound, a III-V group compound, a III-II-V group compound, a IV-VI group compound, a IV group element, a IV group compound, and combinations thereof.

The II-VI group compound may be selected from the group consisting of: a binary compound selected from the group consisting of CdSe, CdTe, CdS, ZnS, ZnSe, ZnTe, ZnO, HgS, HgSe, HgTe, MgSe, MgS, and mixtures thereof; a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and mixtures thereof; and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and mixtures thereof.

The III-VI group compound may include a binary compound (such as $In_2S_3$ and/or $In_2Se_3$), a ternary compound (such as $InGaS_3$ and/or $InGaSe_3$), or optional combinations thereof.

The I-III-VI group compound may be selected from a ternary compound selected from the group consisting of AgInS, $AgInS_2$, CuInS, $CuInS_2$, $AgGaS_2$, $CuGaS_2$, $CuGaO_2$, $AgGaO_2$, $AgAlO_2$ and mixtures thereof, and a quaternary compound (such as $AgInGaS_2$ and/or $CuInGaS_2$).

The III-V group compound may be selected from the group consisting of a binary compound selected from the group consisting of GaN, GaP, GaAs, GaSb, AlN, AlP, AlAs, AlSb, InN, InP, InAs, InSb, and mixtures thereof, a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and mixtures thereof, and a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and mixtures thereof. In some embodiments, the III-V group compound may further include a II group metal. For example, InZnP, etc. may be selected as a III-II-V group compound.

The IV-VI group compound may be selected from the group consisting of a binary compound selected from the group consisting of SnS, SnSe, SnTe, PbS, PbSe, PbTe, and mixtures thereof, a ternary compound selected from the group consisting of SnSeS, SnSeTe, SnSTe, PbSeS, PbSeTe, PbSTe, SnPbS, SnPbSe, SnPbTe, and mixtures thereof, and a quaternary compound selected from the group consisting of SnPbSSe, SnPbSeTe, SnPbSTe, and mixtures thereof. The IV group element may be selected from the group consisting of Si, Ge, and a mixture thereof. The IV group compound may be a binary compound selected from the group consisting of SiC, SiGe, and a mixture thereof.

In this case, the binary compound, the ternary compound and/or the quaternary compound may be present at substantially uniform concentration in a particle, or may be present at a partially different concentrations or distributions in the same particle. A core/shell structure (in which one quantum dot wraps another quantum dot) may be possible. The interface of the core and the shell may have a concentration gradient in which the concentration of an element present in the shell is decreased toward the center (e.g., decreased in the core).

In some embodiments, the quantum dot may have the above-described core-shell structure including a core including a nanocrystal and a shell wrapping the core. The shell of the quantum dot may play the role of a protection layer for preventing or reducing the chemical deformation of the core to maintain semiconductor properties and/or the role of a charging layer for imparting the quantum dot with electrophoretic properties. The shell may have a single layer or may be a multilayer shell. Examples of the shell of the quantum dot may include a metal oxide, a non-metal oxide, a semiconductor compound, and combinations thereof.

For example, the metal oxide or non-metal oxide may include a binary compound (such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$ and/or NiO), and/or a ternary compound (such as $MgAl_2O_4$, $CoFe_2O_4$, $NiFe_2O_4$ and/or $CoMn_2O_4$), but embodiments of the present disclosure are not limited thereto.

Also, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but embodiments of the present disclosure are not limited thereto.

The quantum dot may have a full width at half maximum (FWHM) of emission wavelength spectrum of about 45 nm or less, about 40 nm or less, or about 30 nm or less. Within this range, color purity or color reproducibility may be improved. In some embodiments, light emitted via the quantum dot may be emitted in all directions, and light view angle properties may be improved.

In some embodiments, the shape of the quantum dot may be any suitable shape in the art, without limitation. For example, a spherical, pyramidal, multi-arm, or cubic nanoparticle, nanotube, nanowire, nanofiber, or nanoplate particle, etc. may be utilized.

The quantum dot may control the color of light emitted according to the particle size (e.g., may emit a light color that corresponds to the particle size), and accordingly, the quantum dot may have various suitable emission colors such as blue, red and green.

The light controlling layer CCL may include multiple light controlling parts CCP1, CCP2 and CCP3. The light controlling parts CCP1, CCP2 and CCP3 may be separated from one another.

Referring to FIG. 7, a partition pattern BMP may be disposed between the separated light controlling parts CCP1, CCP2 and CCP3, but embodiments of the present disclosure are not limited thereto. In FIG. 7, the partition pattern BMP is shown not to be overlapped with the light controlling parts CCP1, CCP2 and CCP3, but at least a portion of the edge of the light controlling parts CCP1, CCP2 and CCP3 may be overlapped with the partition pattern BMP.

The light controlling layer CCL may include a first light controlling part CCP1 including a first quantum dot QD1 converting first color light provided from the organic electroluminescence device ED into second color light, a second light controlling part CCP2 including a second quantum dot QD2 converting first color light into third color light, and a third light controlling part CCP3 transmitting first color light.

In an embodiment, the first light controlling part CCP1 may provide red light (which is the second color light), and the second light controlling part CCP2 may provide green light (which is the third color light). The third light controlling part CCP3 may transmit and provide blue light (which is the first color light) provided from the organic electroluminescence device ED. For example, the first quantum dot QD1 may be a red quantum dot, and the second quantum dot QD2 may be a green quantum dot. On the quantum dots QD1 and QD2, the same contents as those described above may be applied.

In some embodiments, the light controlling layer CCL may further include a scatterer SP. The first light controlling part CCP1 may include the first quantum dot QD1 and the scatterer SP, the second light controlling part CCP2 may include the second quantum dot QD2 and the scatterer SP, and the third light controlling part CCP3 may not include a quantum dot but include the scatterer SP.

The scatterer SP may be an inorganic particle. For example, the scatterer SP may include at least one selected from among $TiO_2$, ZnO, $Al_2O_3$, $SiO_2$, and hollow silica. The scatterer SP may include at least one selected from among $TiO_2$, ZnO, $Al_2O_3$, $SiO_2$, and hollow silica, or may be a mixture of two or more materials selected from among $TiO_2$, ZnO, $Al_2O_3$, $SiO_2$, and hollow silica.

Each of the first light controlling part CCP1, the second light controlling part CCP2, and the third light controlling part CCP3 may include base resins BR1, BR2 and BR3 dispersing the quantum dots QD1 and QD2 and the scatterer SP. In an embodiment, the first light controlling part CCP1 may include the first quantum dot QD1 and the scatterer SP dispersed in the first base resin BR1, the second light controlling part CCP2 may include the second quantum dot QD2 and the scatterer SP dispersed in the second base resin BR2, and the third light controlling part CCP3 may include the scatterer particle SP dispersed in the third base resin BR3. The base resins BR1, BR2 and BR3 are mediums in which the quantum dots QD1 and QD2 and the scatterer SP are dispersed, and may be composed of one or more suitable resin compositions (which may be generally referred to as binders). For example, the base resins BR1, BR2 and BR3 may be acrylic-based resins, urethane-based resins, silicone-based resins, epoxy-based resins, etc. The base resins BR1, BR2 and BR3 may be transparent resins. In an embodiment, the first base resin BR1, the second base resin BR2 and the third base resin BR3 may be the same or different from each other.

The light controlling layer CCL may include a barrier layer BFL1. The barrier layer BFL1 may block or reduce the penetration of moisture and/or oxygen (hereinafter, will be referred to as "humidity/oxygen"). The barrier layer BFL1 may be disposed on the light controlling parts CCP1, CCP2 and CCP3 to block or reduce the exposure of the light controlling parts CCP1, CCP2 and CCP3 to humidity/oxygen. In some embodiments, the barrier layer BFL1 may cover the light controlling parts CCP1, CCP2 and CCP3. In some embodiments, the barrier layer BFL2 may be provided between the light controlling parts CCP1, CCP2 and CCP3 and a color filter layer CFL.

The barrier layers BFL1 and BFL2 may include at least one inorganic layer. For example, the barrier layers BFL1 and BFL2 may be formed by including an inorganic material. For example, the barrier layers BFL1 and BFL2 may be formed by including silicon nitride, aluminum nitride, zirconium nitride, titanium nitride, hafnium nitride, tantalum nitride, silicon oxide, aluminum oxide, titanium oxide, tin oxide, cerium oxide and/or silicon oxynitride and/or a metal thin film securing light transmittance. In some embodiments, the barrier layers BFL1 and BFL2 may further include an organic layer. The barrier layers BFL1 and BFL2 may be composed of a single layer or multiple layers.

In the display apparatus DD of an embodiment, the color filter layer CFL may be disposed on the light controlling layer CCL. For example, the color filter layer CFL may be disposed directly on the light controlling layer CCL. In this case, the barrier layer BFL2 may not be provided.

The color filter layer CFL may include a light blocking part BM and filters CF-B, CF-G and CF-R. The color filter layer CFL may include a first filter CF1 transmitting second color light, a second filter CF2 transmitting third color light, and a third filter CF3 transmitting first color light. For example, the first filter CF1 may be a red filter, the second filter CF2 may be a green filter, and the third filter CF3 may be a blue filter. Each of the filters CF1, CF2 and CF3 may include a polymer photosensitive resin and a pigment and/or dye. The first filter CF1 may include a red pigment and/or dye, the second filter CF2 may include a green pigment and/or dye, and the third filter CF3 may include a blue pigment and/or dye. In some embodiments, the third filter CF3 may not include the pigment or dye. For example, the third filter CF3 may include a polymer photosensitive resin and not include a pigment or dye. The third filter CF3 may be transparent. The third filter CF3 may be formed utilizing a transparent photosensitive resin.

In some embodiments, in an embodiment, the first filter CF1 and the second filter CF2 may be yellow filters. The first filter CF1 and the second filter CF2 may be provided in one body without distinction.

The light blocking part BM may be a black matrix. The light blocking part BM may be formed by including an organic light blocking material or an inorganic light blocking material including a black pigment and/or black dye. The light blocking part BM may prevent or reduce light leakage phenomenon and divide the boundaries among adjacent filters CF1, CF2 and CF3. In some embodiments, the light blocking part BM may be formed as a blue filter.

Each of the first to third filters CF1, CF2 and CF3 may be disposed to correspond to each of a red luminous area PXA-R, green luminous area PXA-G, and blue luminous area PXA-B, respectively.

On the color filter layer CFL, a base substrate BL may be disposed. The base substrate BL may be a member providing a base surface on which the color filter layer CFL, the light controlling layer CCL, etc. are disposed. The base substrate BL may be a glass substrate, a metal substrate, a plastic substrate, etc. However, embodiments of the present disclosure are not limited thereto, and the base substrate BL may be an inorganic layer, an organic layer or a composite material layer. In some embodiments, the base substrate BL may not be provided.

FIG. 8 is a cross-sectional view showing a portion of the display apparatus according to an embodiment. In FIG. 8, the cross-sectional view of a portion corresponding to the display panel DP in FIG. 7 is shown. In a display apparatus DD-TD of an embodiment, the luminescence device ED-BT may include multiple light emitting structures OL-B1, OL-B2 and OL-B3. The luminescence device ED-BT may include oppositely disposed first electrode EL1 and second electrode EL2, and multiple light emitting structures OL-B1, OL-B2 and OL-B3 stacked in order in a thickness direction and provided between the first electrode EU and the second electrode EL2. Each of the light emitting structures OL-B1, OL-B2 and OL-B3 may include an emission layer EML (FIG. 7), and a hole transport region HTR and an electron transport region ETR disposed with the emission layer EML (FIG. 7) therebetween.

For example, the luminescence device ED-BT included in the display apparatus DD-TD of an embodiment may be an organic electroluminescence device of a tandem structure including multiple emission layers.

In an embodiment shown in FIG. 8, light to be emitted from the light emitting structures OL-B1, OL-B2 and OL-B3 may be all blue light. However, embodiments of the present disclosure are not limited thereto, and the wavelength regions of light emitted from the light emitting structures OL-B1, OL-B2 and OL-B3 may be different from each other. For example, the organic electroluminescence device ED-BT including the multiple light emitting structures OL-B1, OL-B2 and OL-B3 emitting light in different wavelength regions may be to emit white light.

Between neighboring light emitting structures OL-B1, OL-B2 and OL-B3, charge generating layers CGL1 and CGL2 may be disposed (e.g., interposed). The charge generating layer CGL1 and CGL2 may include a p-type charge generating layer and/or an n-type charge generating layer.

Hereinafter, the present disclosure will be explained with reference to example embodiments and comparative embodiments. The embodiments are only illustrations to assist the understanding of the present disclosure, and the scope of the present disclosure is not limited thereto.

SYNTHETIC EXAMPLES

The amine compound according to an embodiment of the present disclosure may be synthesized, for example, as follows. However, the synthetic method of the amine compound according to embodiments of the present disclosure are not limited to the embodiments below.

1. Synthesis of Compound K1

1.1 Synthesis of Compound X3

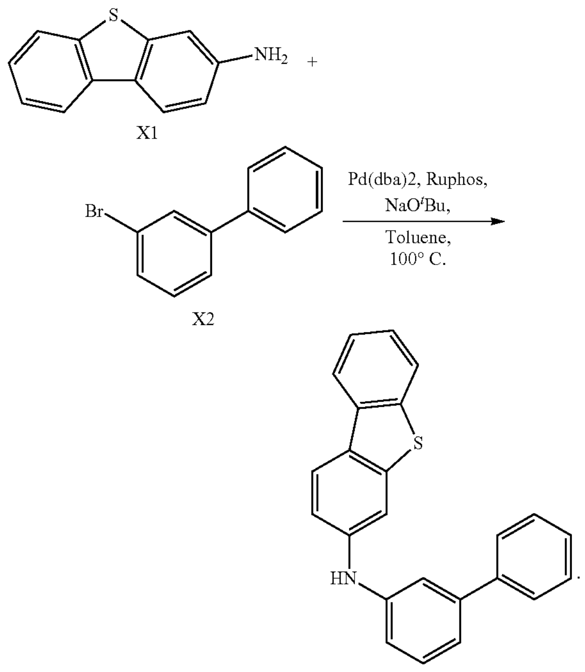

X1 X2 X3

To Compound X1 (2.0 g, 10 mmol), X2 (2.3 g, 10 mmol), NaO$^t$Bu (0.96 g, 10 mmol), and Ruphos (0.46 g, 1 mmol), toluene (200 mL) was added and degassed. Under an argon atmosphere, bis(dibenzylideneacetone)palladium (0.29 g, 0.5 mmol) was added thereto, and heated to about 100° C. and stirred for about 6 hours. After standing and cooling to room temperature, the reaction solution was extracted with toluene, washed with $H_2O$ and brine, and dried with $Na_2SO_4$. The solution thus obtained was concentrated and separated by column chromatography to obtain Compound X3 (3.2 g, 9.1 mmol, 91%, MS 351.11).

1.2 Synthesis of Compound K1

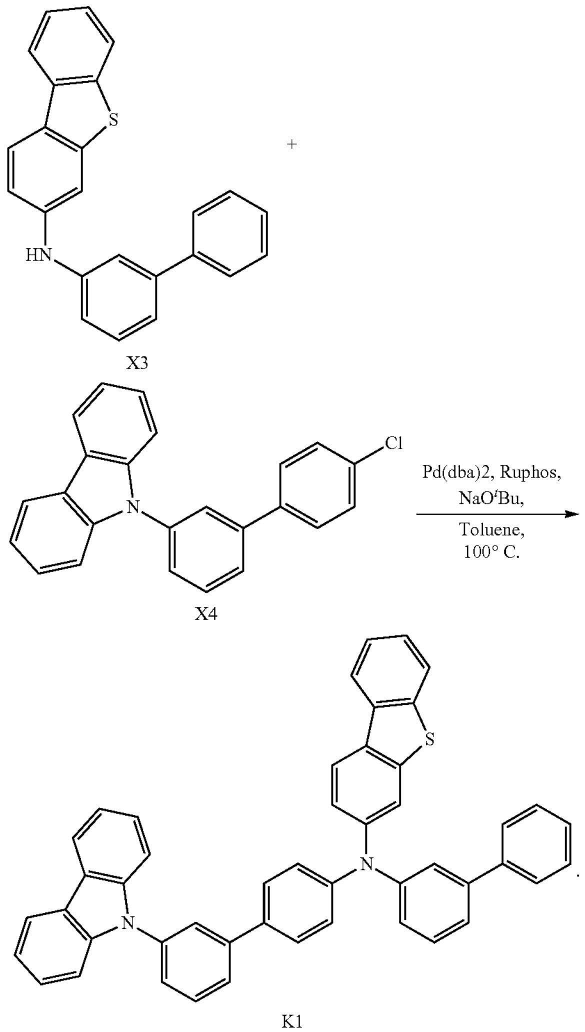

X3 X4 K1

To Compound X3 (1.9 g, 10 mmol), X4 (3.5 g, 10 mmol), NaO$^t$Bu (0.96 g, 10 mmol), and Ruphos (0.46 g, 1 mmol), toluene (200 mL) was added and degassed. Under an argon atmosphere, bis(dibenzylideneacetone)palladium (0.29 g, 0.5 mmol) was added thereto, and heated to about 100° C. and stirred for about 6 hours. After standing and cooling to room temperature, the reaction solution was extracted with toluene, washed with $H_2O$ and brine, and dried with $Na_2SO_4$. The solution thus obtained was concentrated and separated by column chromatography to obtain Compound K1 (5.8 g, 8.5 mmol, 85%, MS 668.23).

2. Synthesis of Compound Q9

2.1 Synthesis of Compound X7

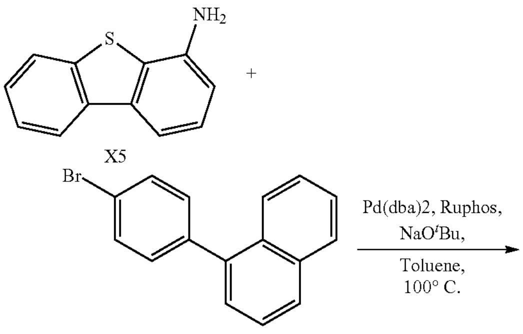

X5

X6

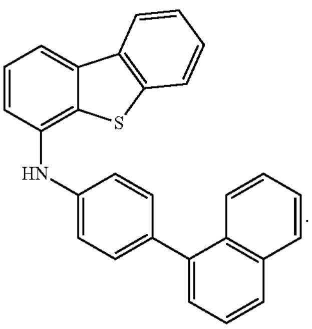

X7

To Compound X5 (2.0 g, 10 mmol), X6 (2.8 g, 10 mmol), NaO$^t$Bu (0.96 g, 10 mmol), and Ruphos (0.46 g, 1 mmol), toluene (200 mL) was added and degassed. Under an argon atmosphere, bis(dibenzylideneacetone)palladium (0.29 g, 0.5 mmol) was added thereto, and heated to about 100° C. and stirred for about 6 hours. After standing and cooling to room temperature, the reaction solution was extracted with toluene, washed with $H_2O$ and brine, and dried with $Na_2SO_4$. The solution thus obtained was concentrated and separated by column chromatography to obtain Compound X7 (3.7 g, 9.2 mmol, 92%, MS 401.12).

2.2 Synthesis of Compound Q9

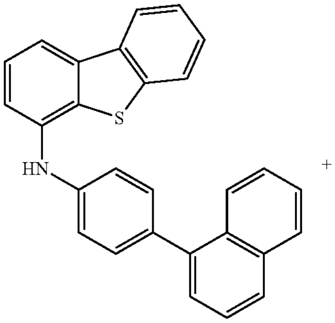

X7

-continued

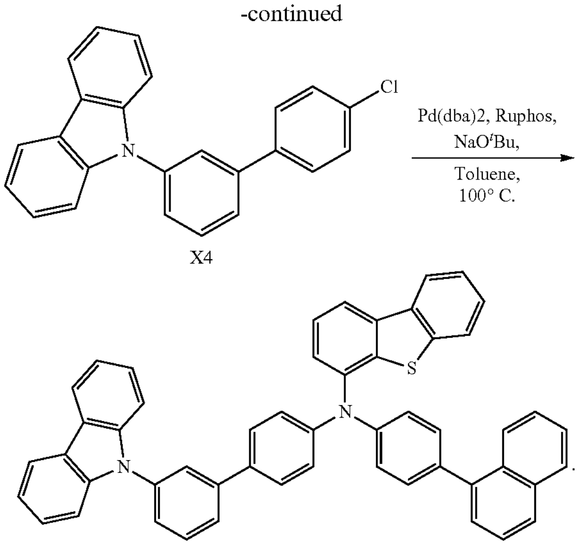

X4

Q9

To Compound X7 (4.0 g, 10 mmol), X4 (3.5 g, 10 mmol), NaO$^t$Bu (0.96 g, 10 mmol), and Ruphos (0.46 g, 1 mmol), toluene (200 mL) was added and degassed. Under an argon atmosphere, bis(dibenzylideneacetone)palladium (0.29 g, 0.5 mmol) was added thereto, and heated to about 100° C. and stirred for about 6 hours. After standing and cooling to room temperature, the reaction solution was extracted with toluene, washed with $H_2O$ and brine, and dried with $Na_2SO_4$. The solution thus obtained was concentrated and separated by column chromatography to obtain Compound Q9 (5.8 g, 8.2 mmol, 82%, MS 708.24).

3. Synthesis of Compound Q12

3.1 Synthesis of Compound X9

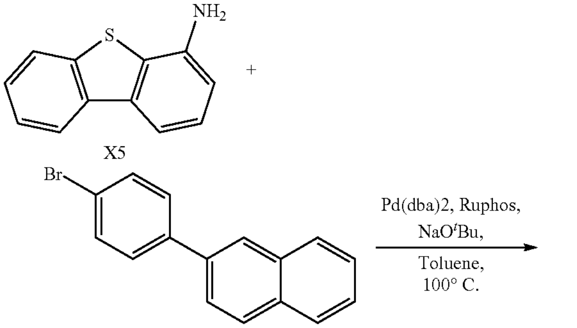

X5

X8

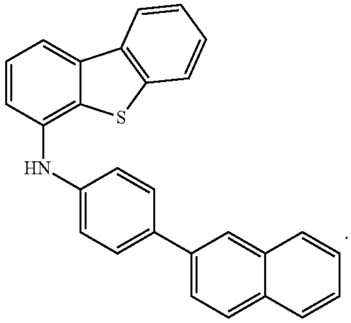

X9

To Compound X5 (2.0 g, 10 mmol), X8 (2.8 g, 10 mmol), NaO$^t$Bu (0.96 g, 10 mmol), and Ruphos (0.46 g, 1 mmol), toluene (200 mL) was added and degassed. Under an argon atmosphere, bis(dibenzylideneacetone)palladium (0.29 g, 0.5 mmol) was added thereto, and heated to about 100° C. and stirred for about 6 hours. After standing and cooling to room temperature, the reaction solution was extracted with toluene, washed with $H_2O$ and brine, and dried with $Na_2SO_4$. The solution thus obtained was concentrated and separated by column chromatography to obtain Compound X9 (3.7 g, 9.2 mmol, 93%, MS 401.12).

3.2 Synthesis of Compound Q12

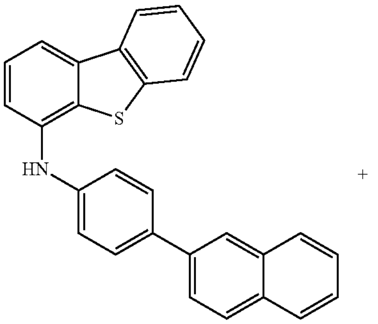

X9

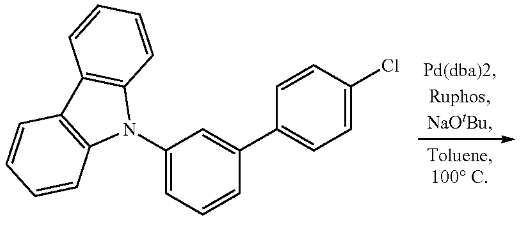

X4

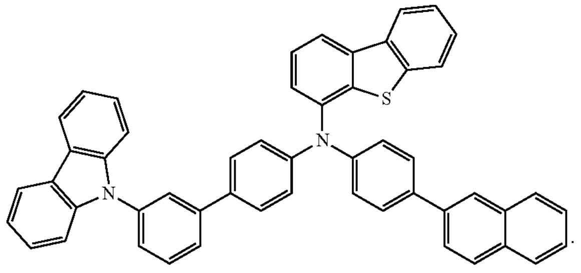

Q12

To Compound X9 (4.0 g, 10 mmol), X4 (3.5 g, 10 mmol), NaO$^t$Bu (0.96 g, 10 mmol), and Ruphos (0.46 g, 1 mmol), toluene (200 mL) was added and degassed. Under an argon atmosphere, bis(dibenzylideneacetone)palladium (0.29 g, 0.5 mmol) was added thereto, and heated to about 100° C. and stirred for about 6 hours. After standing and cooling to room temperature, the reaction solution was extracted with toluene, washed with $H_2O$ and brine, and dried with $Na_2SO_4$. The solution thus obtained was concentrated and separated by column chromatography to obtain Compound Q12 (5.8 g, 8.2 mmol, 82%, MS 708.24).

4. Synthesis of Compound S12

4.1 Synthesis of Compound X11

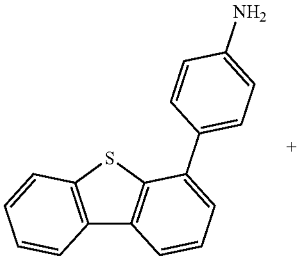

X10

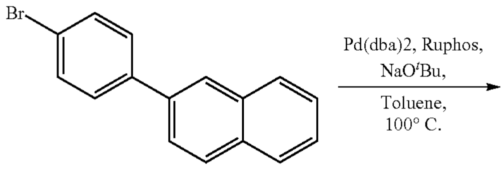

X8

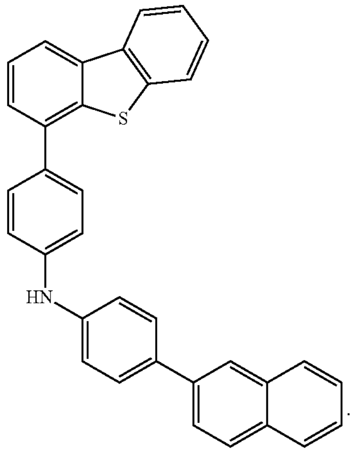

X9

To Compound X10 (2.8 g, 10 mmol), X8 (2.8 g, 10 mmol), NaO$^t$Bu (0.96 g, 10 mmol), and Ruphos (0.46 g, 1 mmol), toluene (200 mL) was added and degassed. Under an argon atmosphere, bis(dibenzylideneacetone)palladium (0.29 g, 0.5 mmol) was added thereto, and heated to about 100° C. and stirred for about 6 hours. After standing and cooling to room temperature, the reaction solution was extracted with toluene, washed with $H_2O$ and brine, and dried with $Na_2SO_4$. The solution thus obtained was concentrated and separated by column chromatography to obtain Compound X11 (3.9 g, 8.1 mmol, 81%, MS 477.16).

4.2 Synthesis of Compound S12

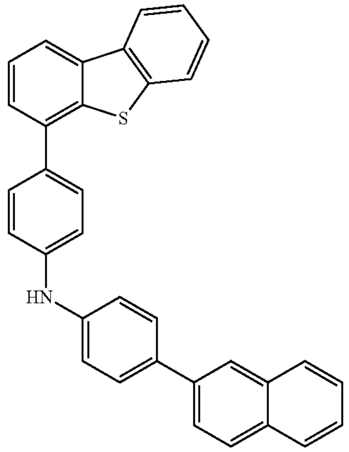

X11

+

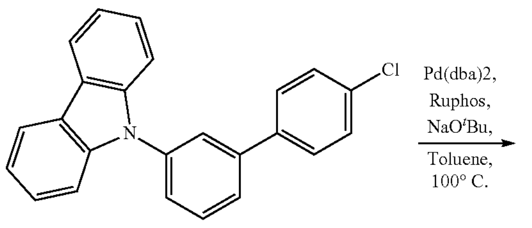

X4

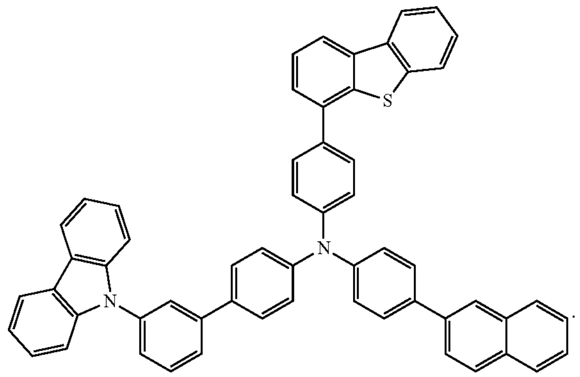

S12

To Compound X11 (4.8 g, 10 mmol), X4 (3.5 g, 10 mmol), NaO$^t$Bu (0.96 g, 10 mmol), and Ruphos (0.46 g, 1 mmol), toluene (200 mL) was added and degassed. Under an argon atmosphere, bis(dibenzylideneacetone)palladium (0.29 g, 0.5 mmol) was added thereto, and heated to about 100° C. and stirred for about 6 hours. After standing and cooling to room temperature, the reaction solution was extracted with toluene, washed with $H_2O$ and brine, and dried with $Na_2SO_4$. The solution thus obtained was concentrated and separated by column chromatography to obtain Compound S12 (6.0 g, 7.5 mmol, 75%, MS 794.28).

5. Synthesis of Compound Q16

5.1 Synthesis of Compound X13

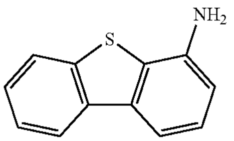

X5

+

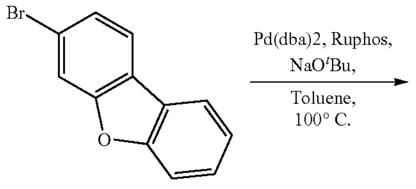

X12

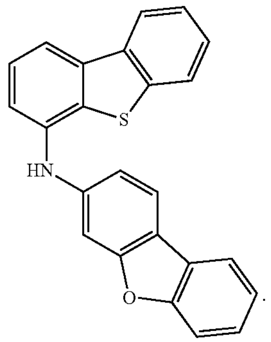

X13

To Compound X5 (2.0 g, 10 mmol), X12 (2.5 g, 10 mmol), NaO$^t$Bu (0.96 g, 10 mmol), and Ruphos (0.46 g, 1 mmol), toluene (200 mL) was added and degassed. Under an argon atmosphere, bis(dibenzylideneacetone)palladium (0.29 g, 0.5 mmol) was added thereto, and heated to about 100° C. and stirred for about 6 hours. After standing and cooling to room temperature, the reaction solution was extracted with toluene, washed with $H_2O$ and brine, and dried with $Na_2SO_4$. The solution thus obtained was concentrated and separated by column chromatography to obtain Compound X13 (3.4 g, 9.4 mmol, 94%, MS 365.09).

5.2 Synthesis of Compound Q16

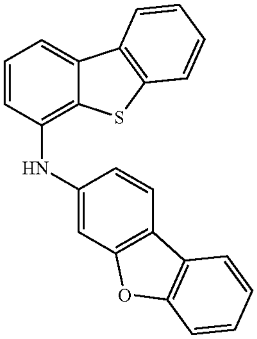

X13

+

-continued

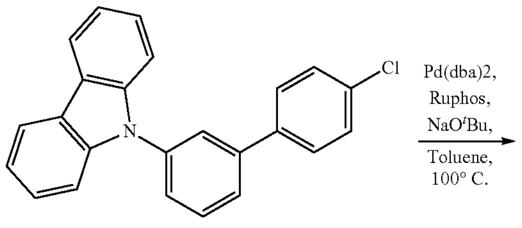

X4

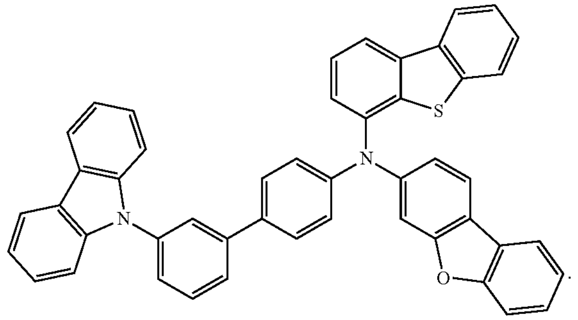

Q16

To Compound X13 (3.7 g, 10 mmol), X4 (3.5 g, 10 mmol), NaO$^t$Bu (0.96 g, 10 mmol), and Ruphos (0.46 g, 1 mmol), toluene (200 mL) was added and degassed. Under an argon atmosphere, bis(dibenzylideneacetone)palladium (0.29 g, 0.5 mmol) was added thereto, and heated to about 100° C. and stirred for about 6 hours. After standing and cooling to room temperature, the reaction solution was extracted with toluene, washed with $H_2O$ and brine, and dried with $Na_2SO_4$. The solution thus obtained was concentrated and separated by column chromatography to obtain Compound Q16 (5.2 g, 7.6 mmol, 76%, MS 682.21).

6. Synthesis of Compound S21

6.1 Synthesis of Compound X15

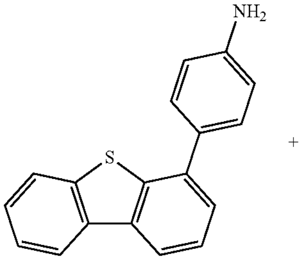

X10

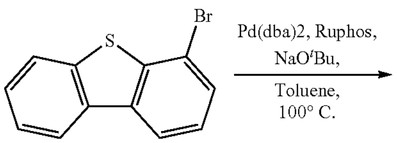

X14

-continued

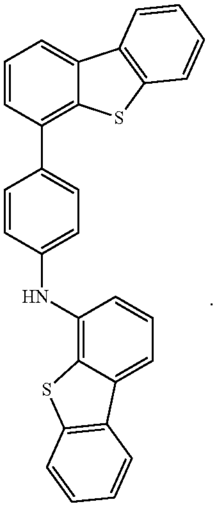

X15

To Compound X10 (2.8 g, 10 mmol), X14 (2.6 g, 10 mmol), NaO$^t$Bu (0.96 g, 10 mmol), and Ruphos (0.46 g, 1 mmol), toluene (200 mL) was added and degassed. Under an argon atmosphere, bis(dibenzylideneacetone)palladium (0.29 g, 0.5 mmol) was added thereto, and heated to about 100° C. and stirred for about 6 hours. After standing and cooling to room temperature, the reaction solution was extracted with toluene, washed with $H_2O$ and brine, and dried with $Na_2SO_4$. The solution thus obtained was concentrated and separated by column chromatography to obtain Compound X15 (3.7 g, 8.1 mmol, 81%, MS 457.10).

6.2 Synthesis of Compound S21

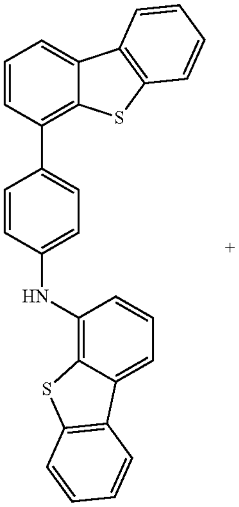

X15

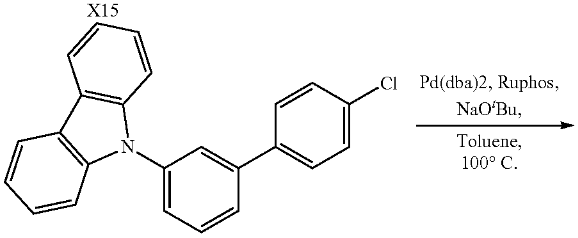

X4

-continued

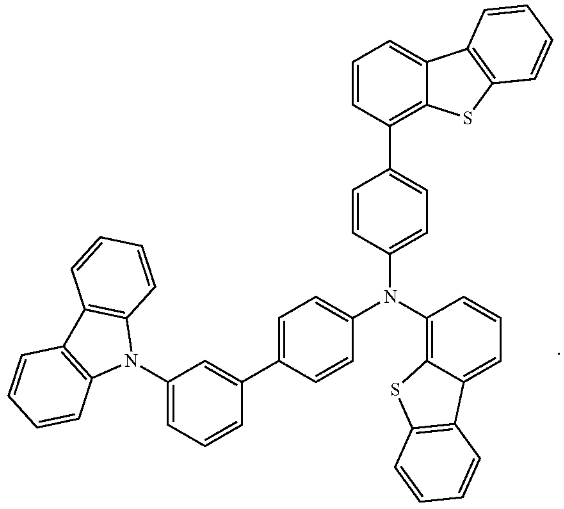

S21

To Compound X15 (4.6 g, 10 mmol), X4 (3.5 g, 10 mmol), NaO$^{t}$Bu (0.96 g, 10 mmol), and Ruphos (0.46 g, 1 mmol), toluene (200 mL) was added and degassed. Under an argon atmosphere, bis(dibenzylideneacetone)palladium (0.29 g, 0.5 mmol) was added thereto, and heated to about 100° C. and stirred for about 6 hours. After standing and cooling to room temperature, the reaction solution was extracted with toluene, washed with $H_2O$ and brine, and dried with $Na_2SO_4$. The solution thus obtained was concentrated and separated by column chromatography to obtain Compound S21 (5.7 g, 7.4 mmol, 74%, MS 774.22).

Manufacture of Organic Electroluminescence Device

Organic electroluminescence devices were manufactured utilizing Example Compounds and Comparative Compounds as materials of a hole transport region.

Example Compounds

K1

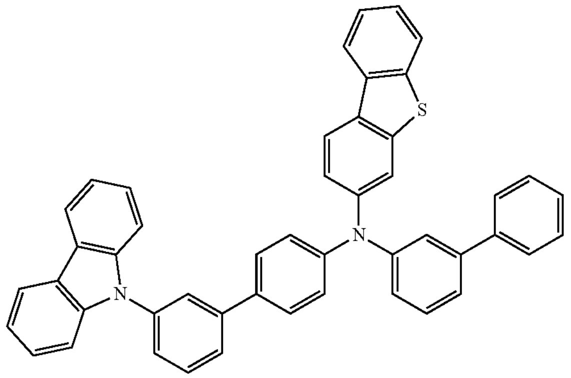

-continued

Q9

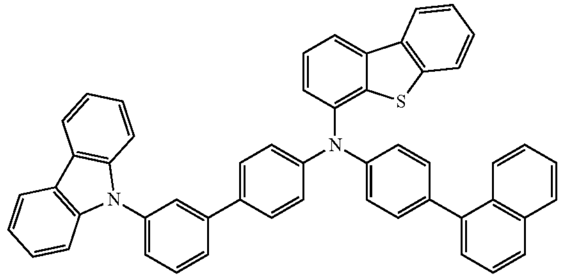

Q12

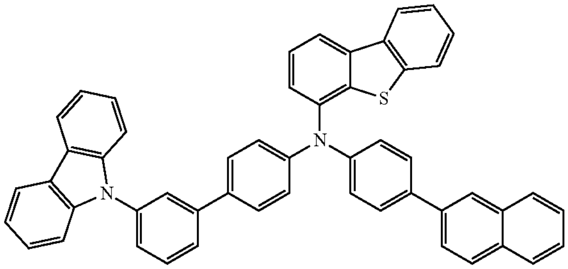

S12

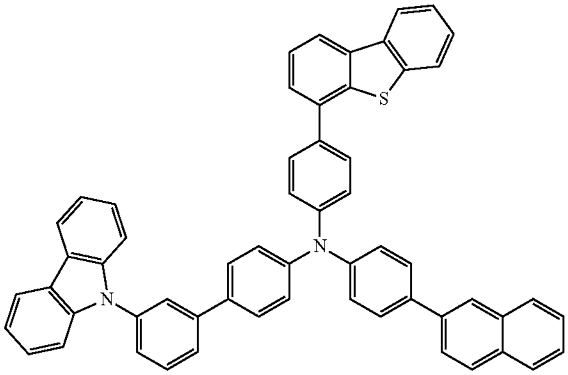

Q16

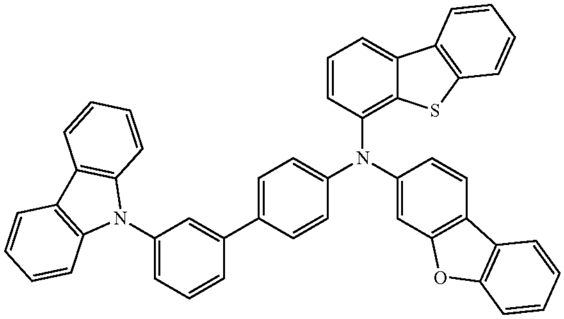

-continued
S21
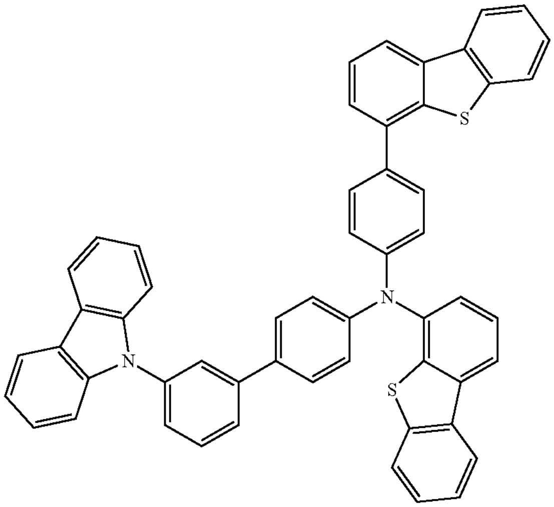
Comparative Compounds
R1
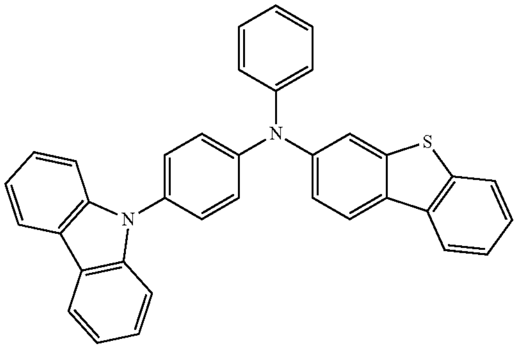
R2
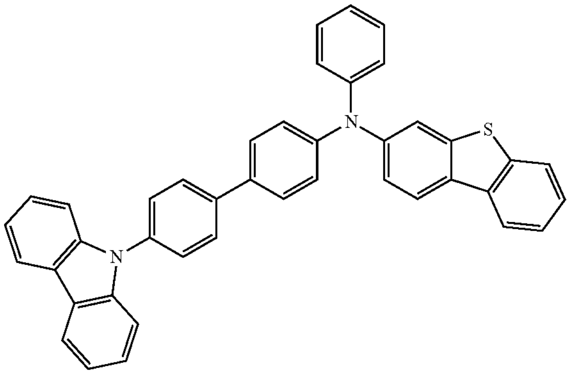
-continued
R3
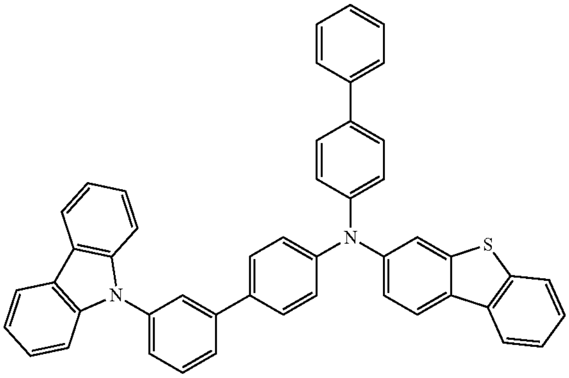
R4
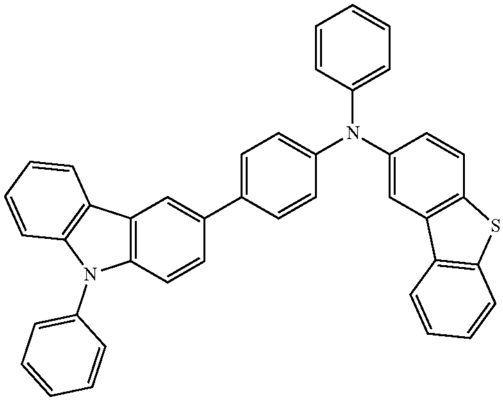
R5
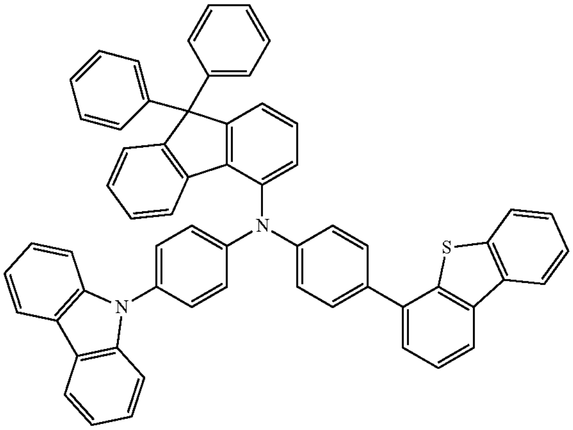

-continued

R6

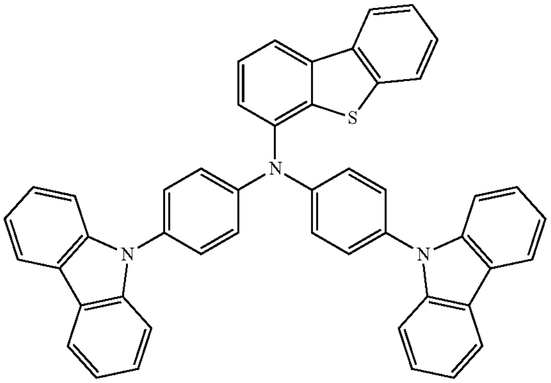

R7

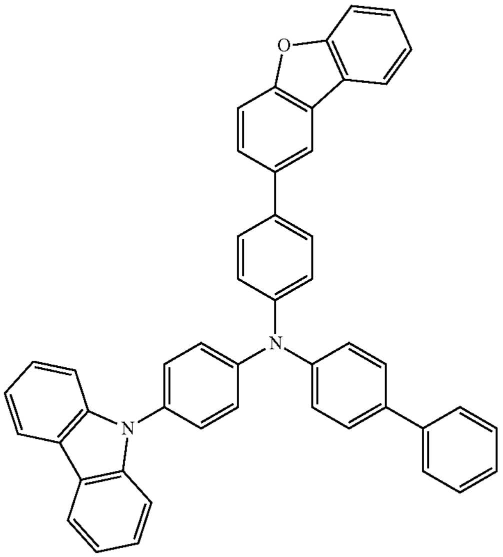

R8

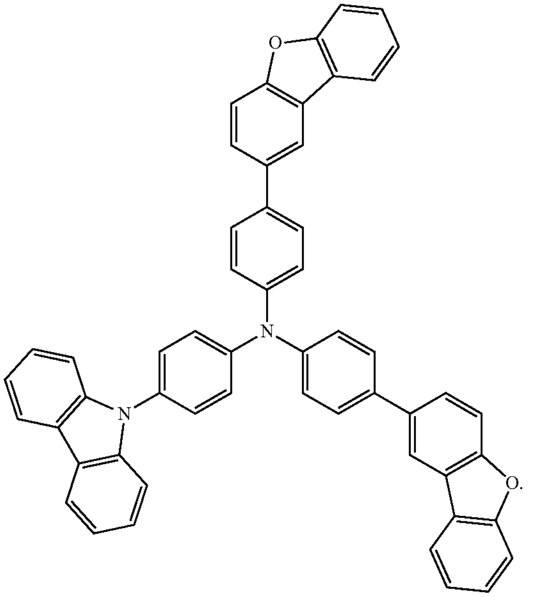

The organic electroluminescence devices of the Examples and Comparative Examples were manufactured by a method below. On a glass substrate, ITO with a thickness of about 150 nm was patterned, washed with ultrapure water and treated with UV ozone to form a first electrode. Then, 2-TNATA was deposited to a thickness of about 60 nm, and the Example Compound or Comparative Compound was deposited to a thickness of about 30 nm to form a hole transport layer. After that, an emission layer was formed utilizing ADN doped with 3% TBP to a thickness of about 25 nm. On the emission layer, a layer with a thickness of about 25 nm was formed utilizing $Alq_3$, and a layer with a thickness of about 1 nm was formed utilizing LiF to form an electron transport region. Then, a second electrode with a thickness of about 100 nm was formed utilizing aluminum (Al). All layers were formed by a vacuum deposition method.

Evaluation of Properties of Organic Electroluminescence Device

The life of each organic electroluminescence device was measured and shown in Table 1. The reported life (lifespan) of the luminescence device refers to the time from an initial luminance to a point where luminance was deteriorated by about 3%, and is shown as a relative value based on Comparative Example 6.

TABLE 1

| | Hole transport layer | Device life (%) |
|---|---|---|
| Example 1 | Example Compound K1 | 108 |
| Example 2 | Example Compound Q9 | 107 |
| Example 3 | Example Compound Q12 | 110 |
| Example 4 | Example Compound S12 | 108 |
| Example 5 | Example Compound Q16 | 112 |
| Example 6 | Example Compound S21 | 111 |
| Comparative Example 1 | Comparative Compound R1 | 93 |
| Comparative Example 2 | Comparative Compound R2 | 95 |
| Comparative Example 3 | Comparative Compound R3 | 99 |
| Comparative Example 4 | Comparative Compound R4 | 95 |
| Comparative Example 5 | Comparative Compound R5 | 97 |
| Comparative Example 6 | Comparative Compound R6 | 100 |
| Comparative Example 7 | Comparative Compound R7 | 100 |
| Comparative Example 8 | Comparative Compound R8 | 94 |

Table 1 shows the results for Examples 1 to 6 and Comparative Examples 1 to 8. Referring to Table 1, it could be confirmed that Examples 1 to 6 showed improved device life by a great deal when compared with Comparative Examples 1 to 8.

The amine compound according to embodiments of the present disclosure includes a dibenzothiophene group and a carbazole group, and the carbazole group is selectively connected at particular positions with the amine group via biphenyl as a linker. For example, the nitrogen atom (e.g., position 9) of the carbazole group is bonded to position 3' of the biphenyl, and the nitrogen atom of the amine group is bonded to position 4 of the biphenyl. The sulfur atom of the dibenzothiophene group has high p orbital properties, and when combined with the amine compound, the bond order of an amine group may be increased, and accordingly, the stability of a compound may be improved. In some embodiments, because the carbazole group is selectively connected at particular positions with the amine group via a phenylene group (e.g., at meta positions), selective electronic effects between the carbazole group and dibenzothiophene group may be induced. Accordingly, in the amine compound of an embodiment, the bond order increasing effects and the position-selective electron donating effects of the carbazole group may synergistic occur at substantially the same time, and when the amine compound is applied in an organic electroluminescence device, device life may be increased.

In Comparative Example 1, a carbazole group was bonded to a nitrogen atom of an amine group via a phenyl linker (e.g., at para positions) which has a high localization degree, and the interaction between the carbazole group and a dibenzothiophene group was degraded, and device life was deteriorated.

In Comparative Example 2, a carbazole group was combined with a nitrogen atom of an amine group via biphenyl, but the carbazole group was connected not at position 3' but at position 4' of the biphenyl (e.g., at para positions). Thus, position selective electron donating effects of the carbazole group were deteriorated, and device life was deteriorated. In Comparative Example 4, a carbazole group was connected with an amine group not via the nitrogen atom of the carbazole group, but via a phenylene carbon at position 3 of the carbazole group, and electron donating effects were deteriorated, and device life was deteriorated.

In Comparative Example 3, a dibenzothiophene group was included, and a carbazole group position selectively connected via biphenyl was included, but a p-biphenyl group was included as an another (e.g., the third) substituent. Accordingly, device life was deteriorated. When comparing Example 1 and Comparative Example 3, in Example 1, the nitrogen atom of an amine group was connected at a meta position of a biphenyl group, and through the interaction of the biphenyl group and a dibenzothiophene group, position selective electron donating effects due to a carbazole group could be expected. However, in Comparative Example 3, a localization degree due to the interaction between two biphenyl groups increased, and the position selective electron donating effects by a carbazole group was relatively degraded, and device life was thought to decrease.

In Comparative Examples 5 and 6, due to the amine group including a fluorenyl group or a carbazole group as a substituent, other than (e.g., in addition to) a carbazole group and a dibenzothiophene group, device life was deteriorated. Because the substituent strongly interacts with a carbazole group concerning position selective electron donating effects, the interaction of the carbazole group and the dibenzothiophene group was relatively suppressed or reduced, and it is thought that selective electronic effects were reduced.

In some embodiments, when comparing Comparative Examples 5 and 6, it could be confirmed that the deterioration of the device life of Comparative Example 6 including a carbazole group as another substituent was suppressed or reduced compared to Comparative Example 5 including a fluorenyl group. It is thought that interaction of the dibenzothiophene group expressing position selective electron donating effects with the carbazole group in the case of Comparative Example 6 provides increased electron donating effects and thereby improved device life, compared with Comparative Example 5 including a fluorenyl group.

In Comparative Examples 7 and 8, an amine group includes a dibenzoheterole group including an oxygen atom instead of a sulfur atom, and due to the reduction of the bond order increasing effects of an amine group, the stability of the compound was deteriorated, and as a result, device life was deteriorated.

The amine compound according to embodiments of the present disclosure may be utilized in a hole transport region to contribute to the increase of the life of an organic electroluminescence device.

The organic electroluminescence device according to embodiments of the present disclosure may show improved device life characteristics.

The amine compound according to an embodiment of the present disclosure may be utilized as a material of a hole transport region of an organic electroluminescence device, and by utilizing the same, the life characteristics of the organic electroluminescence device may be improved.

As used herein, the terms "substantially," "about," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Although embodiments of the present disclosure have been described, it is understood that the present disclosure should not be limited to these embodiments, but various changes and modifications can be made by one ordinary skilled in the art within the spirit and scope of the present disclosure as set forth in the following claims and their equivalents.

What is claimed is:

1. An organic electroluminescence device, comprising:

a first electrode;

a hole transport region on the first electrode;

an emission layer on the hole transport region;

an electron transport region on the emission layer; and a second electrode on the electron transport region, wherein the hole transport region comprises a plurality of layers, one layer from the plurality of layers consisting of an amine compound represented by Formula 1 and the amine compound represented by Formula 1 is only in the one layer:

Formula 1

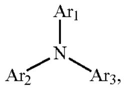

wherein in Formula 1, $Ar_1$ is represented by Formula 2-1, $Ar_2$ is represented by Formula 2-2, and $Ar_3$ is represented by Formula 2-3:

Formula 2-1

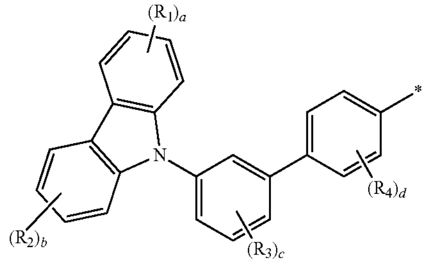

Formula 2-2

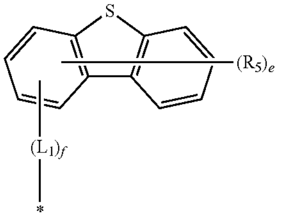

Formula 2-3

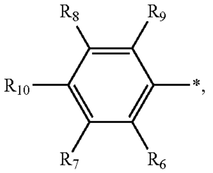

and wherein in Formula 2-1 to Formula 2-3, $R_1$ and $R_2$ are each independently a hydrogen atom, a deuterium atom, a chlorine atom, a bromine atom, an iodine atom, a cyano group, a substituted or unsubstituted alkyl group of 1 to 20 carbon atoms, a substituted or unsubstituted oxy group, a substituted or unsubstituted thiol group, a substituted or unsubstituted silyl group, a substituted or unsubstituted aryl group of 6 to 30 ring-forming carbon atoms, or a substituted or unsubstituted heteroaryl group of 2 to 30 ring-forming carbon atoms, $R_3$ to $R_5$ are each independently a hydrogen atom, a deuterium atom, a halogen atom, a cyano group, a substituted or unsubstituted alkyl group of 1 to 20 carbon atoms, a substituted or unsubstituted oxy group, a substituted or unsubstituted thiol group, a substituted or unsubstituted silyl group, a substituted or unsubstituted aryl group of 6 to 30 ring-forming carbon atoms, or a substituted or unsubstituted heteroaryl group of 2 to 30 ring-forming carbon atoms, $L_1$ is a direct linkage, a substituted or unsubstituted arylene group of 6 to 30 ring-forming carbon atoms, or a substituted or unsubstituted heteroarylene group of 2 to 30 ring-forming carbon atoms, $R_6$ to $R_9$ are each independently a hydrogen atom, a deuterium atom, a halogen atom, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, and/or combined with an adjacent group to form a ring, where a fluorenyl group is excluded, $R_{10}$ is a hydrogen atom, a deuterium atom, a halogen atom, a substituted or unsubstituted alkyl group of 1 to 20 carbon atoms, a substituted or unsubstituted alkenyl group of 2 to 20 carbon atoms, a substituted phenyl group, a substituted or unsubstituted aryl group of 7 to 30 ring-forming carbon atoms, or a substituted or unsubstituted heteroaryl group of 2 to 30 ring-forming carbon atoms, and/or combined with an adjacent group to form a ring, where a fluorenyl group is excluded, $R_6$ to $R_{10}$ are not all hydrogen atoms, a to d are each independently an integer of 0 to 4, e is an integer of 0 to 7, f is an integer of 0 to 2, when f is 1 and $L_1$ is a phenylene group, then $R_{10}$ is not an unsubstituted heteroaryl group, an unsubstituted naphthalene group, an unsubstituted p-biphenyl group, a substituted or unsubstituted phenanthryl group, or a phenyl group para-substituted by an unsubstituted naphthalene group, and $R_6$ to $R_9$ are not a substituted or unsubstituted phenanthryl group, when $L_1$ is a direct linkage, one selected from $R_6$ to $R_9$ is an unsubstituted phenyl group and the rest selected from $R_6$ to $R_9$ and $R_{10}$ are each a hydrogen atom, and all $R_1$ to $R_3$ groups are each a hydrogen atom, then all $R_5$ groups are each a hydrogen atom, and when $L_1$ is a direct linkage and the carbon at position 3 of the dibenzothiophene group of Formula 2-2 is combined with N of Formula 1, then $R_{10}$ is not combined with an adjacent group to form a 3-dibenzothiophene group, or a 3-dibenzofuran group.

2. The organic electroluminescence device of claim 1, wherein the hole transport region comprises:

a hole injection layer on the first electrode; and a hole transport layer on the hole injection layer, and the hole injection layer or the hole transport layer consists of the amine compound represented by Formula 1.

3. The organic electroluminescence device of claim 1, wherein the hole transport region comprises:

a hole transport layer on the first electrode; and an electron blocking layer on the hole transport layer, and the electron blocking layer consists of the amine compound represented by Formula 1.

4. The organic electroluminescence device of claim 1, wherein Formula 1 is represented by any one among Formula 3-1 to Formula 3-4:

Formula 3-1

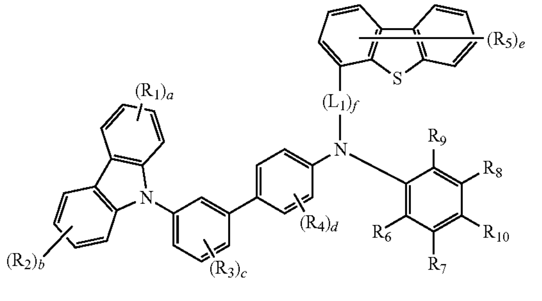

-continued

Formula 3-2

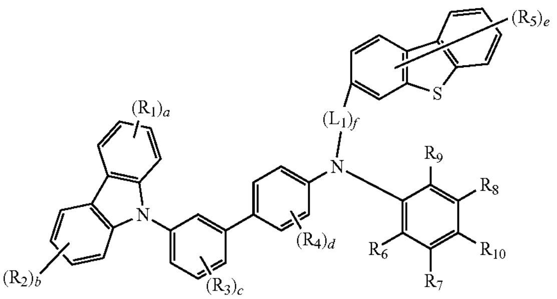

Formula 3-3

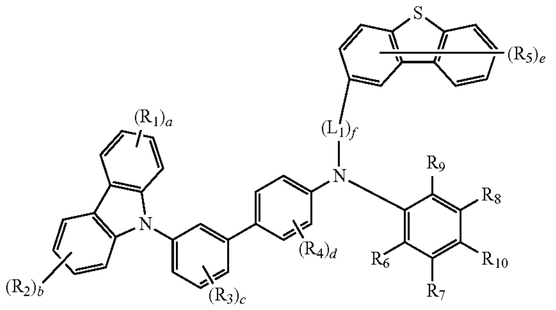

Formula 3-4

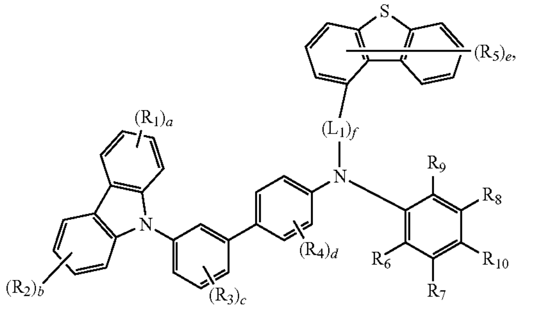

and wherein in Formula 3-1 to Formula 3-4, $R_1$ to $R_{10}$, a to f, and $L_1$ are each independently the same as defined in Formula 1 and Formula 2.

5. The organic electroluminescence device of claim 1, wherein $L_1$ is a direct linkage, a substituted or unsubstituted phenylene group, a substituted or unsubstituted naphthylene group, or a substituted or unsubstituted biphenylene group.

6. The organic electroluminescence device of claim 1, wherein $L_1$ is a direct linkage or represented by any one among L-1 to L-4:

L-1

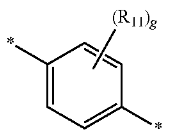

L-2

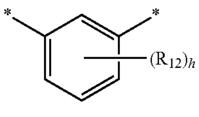

-continued

L-3

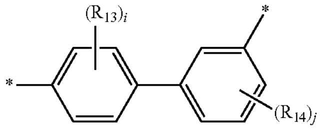

L-4

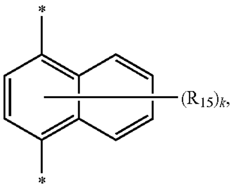

and wherein in L-1 to L-4, $R_{11}$ to $R_{15}$ are each independently a hydrogen atom, a deuterium atom, a halogen atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, g to j are each independently an integer of 0 to 4, and k is an integer of 0 to 6.

7. The organic electroluminescence device of claim 1, wherein $Ar_3$ is represented by any one among Formula 4-1 to Formula 4-4:

Formula 4-1

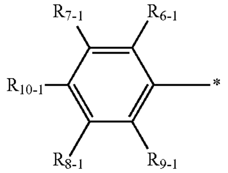

Formula 4-2

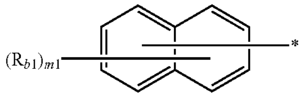

Formula 4-3

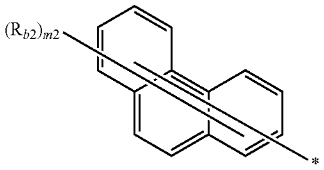

Formula 4-4

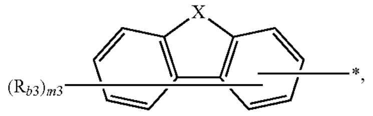

and wherein in Formula 4-1 to Formula 4-4, $R_{6-1}$ to $R_{9-1}$ are each independently a hydrogen atom, a deuterium atom, or a substituted or unsubstituted aryl group of 6 to 20 ring-forming carbon atoms, $R_{10-1}$ is a hydrogen atom, a deuterium atom, a substituted or unsubstituted alkyl group of 1 to 10 carbon atoms, or a substituted or unsubstituted aryl group of 7 to 20 ring-forming carbon atoms, where $R_{6-1}$ to $R_{10-1}$ are not all hydrogen atoms, $R_{b1}$ to $R_{b3}$ are each independently a hydrogen atom, a deuterium atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, X is O or S, m1 and m3 are each independently an integer of 0 to 7, m2 is an integer of 0 to 9, when $L_1$ is a direct linkage and the carbon at position 3 of the dibenzothiophene group of Formula 2-2 is combined with N of Formula 1, then Formula 4-4 is not a 3-dibenzofuran group or a 3-dibenzothiophene group, and when f is 1 and $L_1$ is a phenylene group, then $Ar_3$ is any one among Formula 4-1 to Formula 4-3, and is not Formula 4-4, and in Formula 4-1, $R_{10-1}$ is not an unsubstituted naphthalene group, an unsubstituted p-biphenyl group, or a substituted or unsubstituted phenanthryl group, and $R_{6-1}$ to $R_{9-1}$ are not a substituted or unsubstituted phenanthryl group.

8. The organic electroluminescence device of claim 7, wherein $A_{r3}$ represented by Formula 4-1 is represented by any one among Formula 5-1 to Formula 5-3:

Formula 5-1

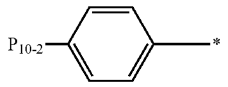

Formula 5-2

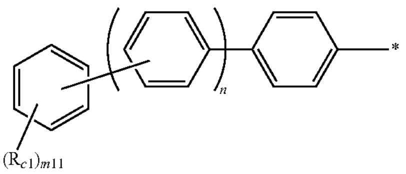

Formula 5-3

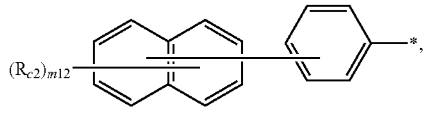

and wherein in Formula 5-1 to Formula 5-3, $P_{10-2}$ is a substituted or unsubstituted alkyl group of 1 to 10 carbon atoms, $R_{c1}$ and $R_{c2}$ are each independently a hydrogen atom, a deuterium atom, a halogen atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, n is 1 or 2, m11 is an integer of 0 to 5, and m12 is an integer of 0 to 7, wherein when f is 1, $L_1$ is a phenylene group, $Ar_3$ is represented by Formula 5-2, and n of Formula 5-2 is 1, then m11 is 1 to 5 and at least one $R_{c1}$ is not hydrogen, and when f is 1, $L_1$ is a phenylene group, and $Ar_3$ is represented by Formula 5-3, then m12 is 1 to 7 and at least one $R_{c2}$ of Formula 5-3 is not hydrogen.

9. The organic electroluminescence device of claim 1, wherein $R_3$ and $R_4$ are each independently a hydrogen atom, a deuterium atom, a halogen atom, a cyano group, or a substituted or unsubstituted alkyl group of 1 to 10 carbon atoms.

10. The organic electroluminescence device of claim 1, wherein the emission layer comprises an anthracene derivative represented by Formula 6:

Formula 6

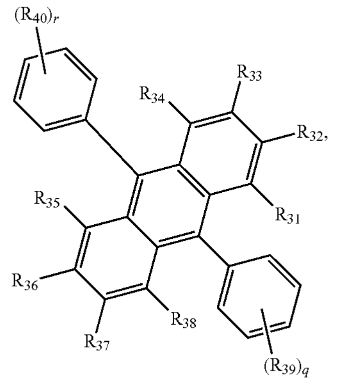

and wherein in Formula 6, $R_{31}$ to $R_{40}$ are each independently a hydrogen atom, a deuterium atom, a halogen atom, a substituted or unsubstituted silyl group, a substituted or unsubstituted alkyl group of 1 to 10 carbon atoms, a substituted or unsubstituted aryl group of 6 to 30 ring-forming carbon atoms, or a substituted or unsubstituted heteroaryl group of 2 to 30 ring-forming carbon atoms, and/or combined with an adjacent group to form a ring, and q and r are each independently an integer of 0 to 5.

11. The organic electroluminescence device of claim 10, wherein Formula 6 is represented by any one among Compound 7-1 to Compound 7-19:

7-1

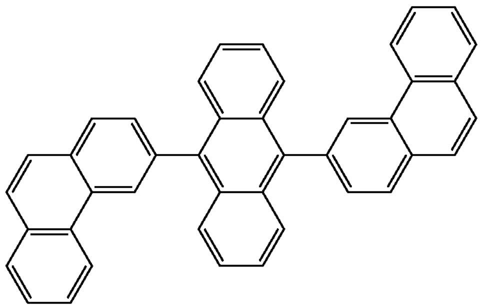

7-2

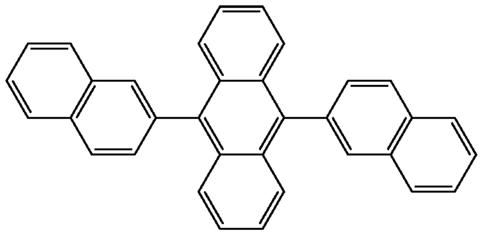

-continued
7-3
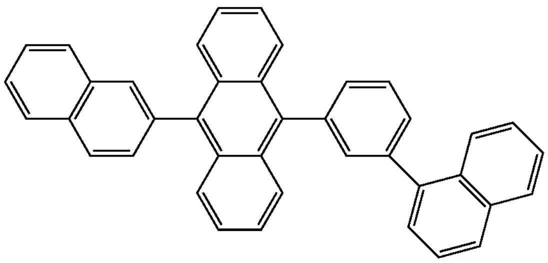
7-4
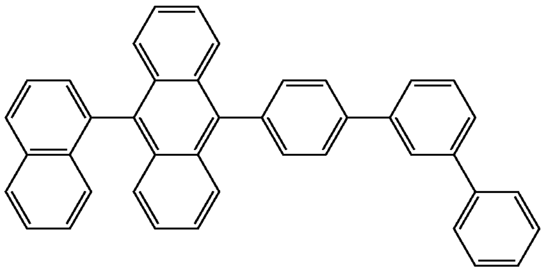
7-5
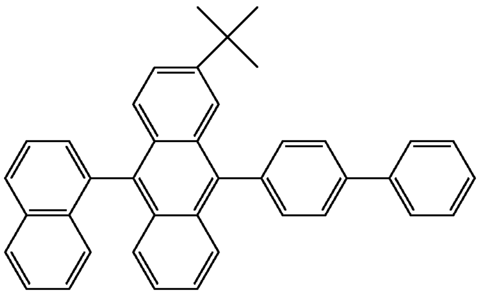
7-6
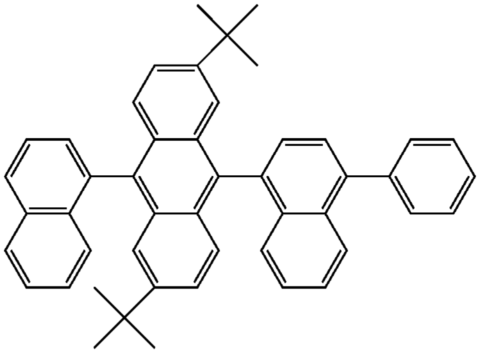
7-7
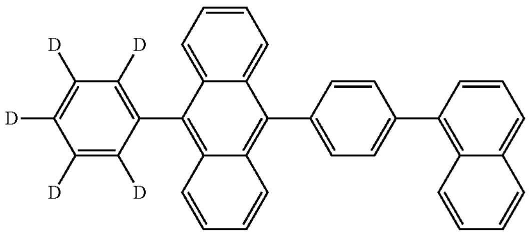
-continued
7-8
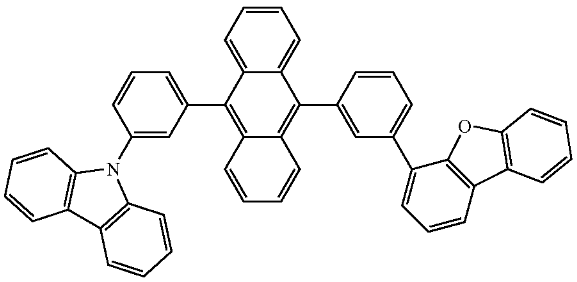
7-9
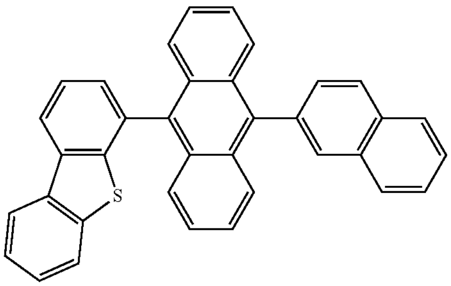
7-10
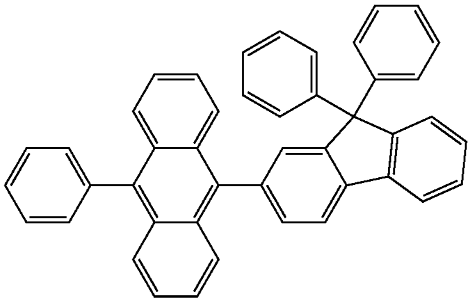
7-11
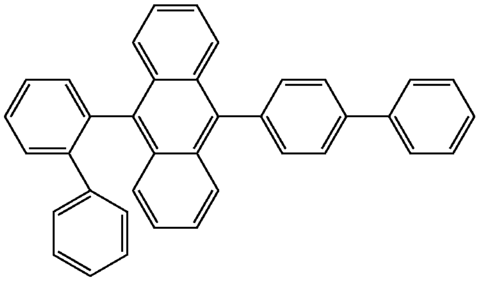
7-12
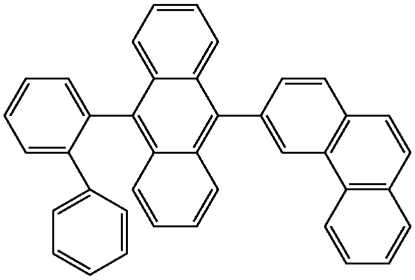

-continued
7-13
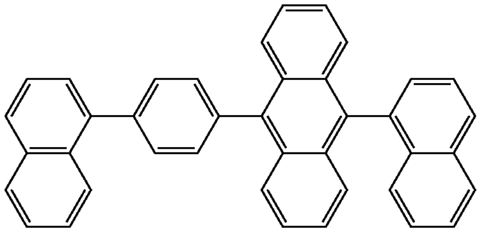
7-14
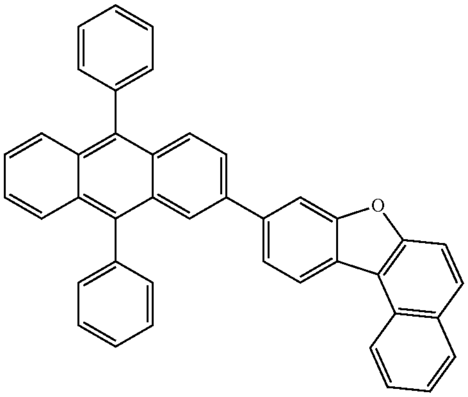
7-15
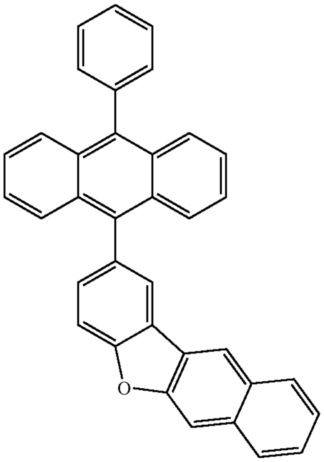
-continued
7-16
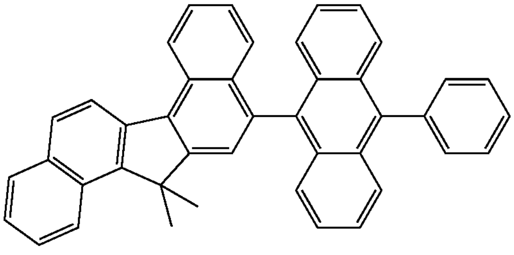
7-17
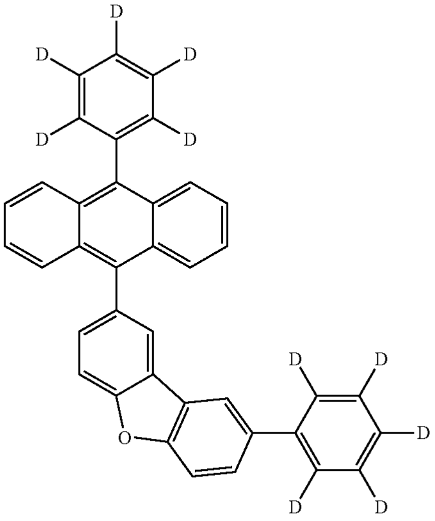
7-18
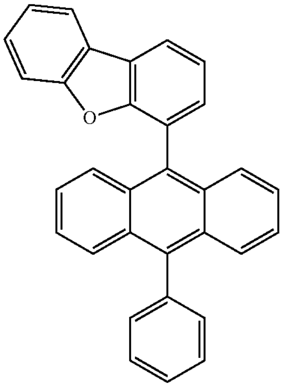
7-19
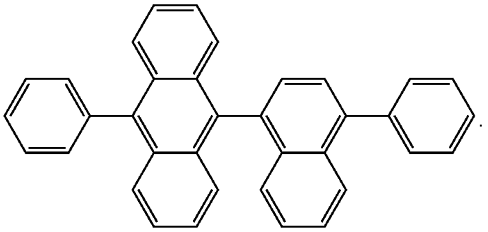
12. The organic electroluminescence device of claim 1, wherein the amine compound represented by Formula 1 is any one among combinations represented in Compound Group 1:

Compound Group 1
| Formula 1 | $Ar_1$ | $Ar_2$ | $Ar_3$ |
|---|---|---|---|
| A1 | 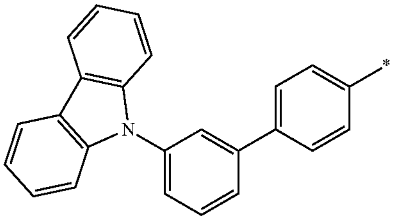 [SMILES: *c1ccc(-c2cccc(-n3c4ccccc4c4ccccc43)c2)cc1] | 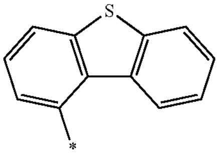 [SMILES: *c1cccc2sc3ccccc3c12] | 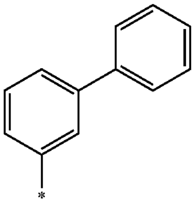 [SMILES: *c1cccc(-c2ccccc2)c1] |
| A2 | 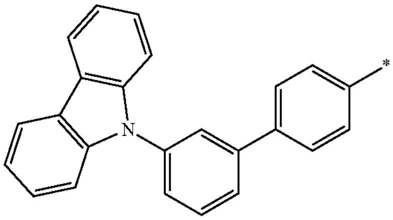 [SMILES: *c1ccc(-c2cccc(-n3c4ccccc4c4ccccc43)c2)cc1] | 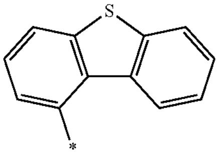 [SMILES: *c1cccc2sc3ccccc3c12] | 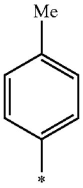 |
| A3 | 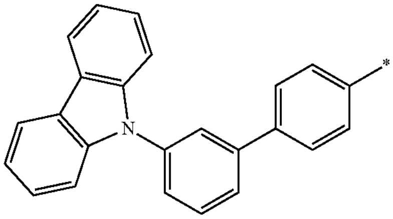 [SMILES: *c1ccc(-c2cccc(-n3c4ccccc4c4ccccc43)c2)cc1] | 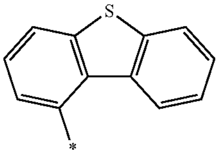 [SMILES: *c1cccc2sc3ccccc3c12] | 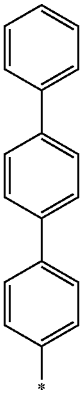 |
| A4 | 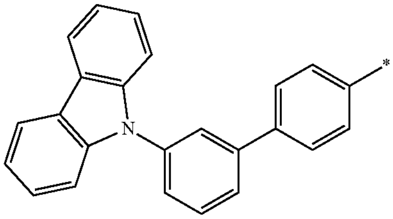 [SMILES: *c1ccc(-c2cccc(-n3c4ccccc4c4ccccc43)c2)cc1] | 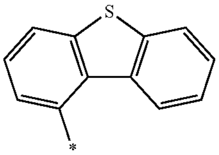 [SMILES: *c1cccc2sc3ccccc3c12] | 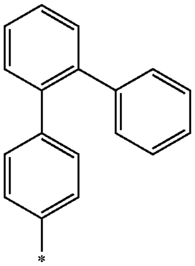 [SMILES: *c1ccc(-c2ccccc2-c2ccccc2)cc1] |
| A5 | 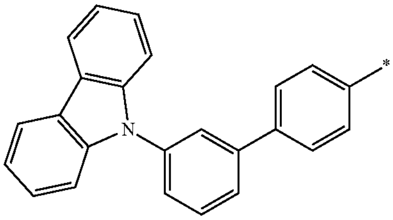 [SMILES: *c1ccc(-c2cccc(-n3c4ccccc4c4ccccc43)c2)cc1] | 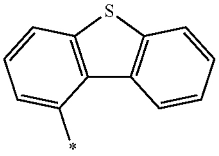 | 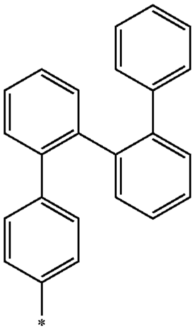 [SMILES: *c1ccc(-c2ccccc2-c2ccccc2-c2ccccc2)cc1] |

-continued
Compound Group 1
| Formula 1 | $Ar_1$ | $Ar_2$ | $Ar_3$ |
|---|---|---|---|
| A6 | 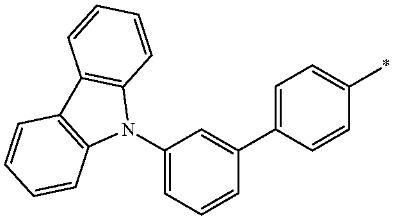 [SMILES: *c1ccc(-c2cccc(-n3c4ccccc4c4ccccc43)c2)cc1] | 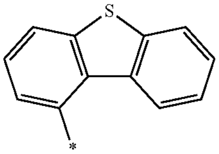 [SMILES: *c1cccc2sc3ccccc3c12] | 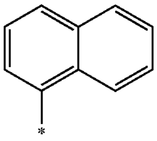 [SMILES: *c1cccc2ccccc12] |
| A7 | 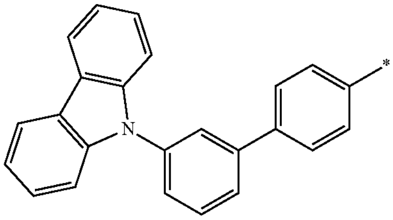 [SMILES: *c1ccc(-c2cccc(-n3c4ccccc4c4ccccc43)c2)cc1] | 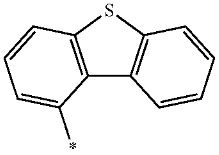 [SMILES: *c1cccc2sc3ccccc3c12] | 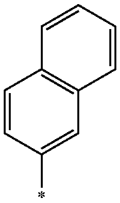 |
| A8 | 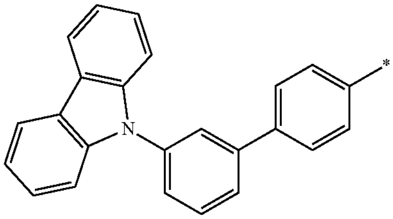 [SMILES: *c1ccc(-c2cccc(-n3c4ccccc4c4ccccc43)c2)cc1] | 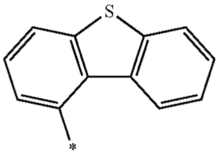 [SMILES: *c1cccc2sc3ccccc3c12] | 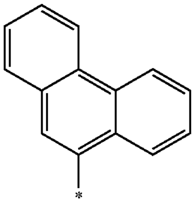 [SMILES: *c1cc2ccccc2c2ccccc12] |
| A9 | 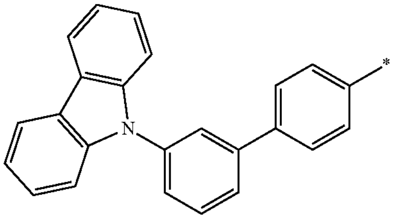 [SMILES: *c1ccc(-c2cccc(-n3c4ccccc4c4ccccc43)c2)cc1] | 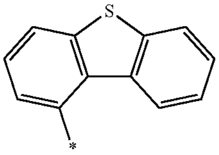 [SMILES: *c1cccc2sc3ccccc3c12] | 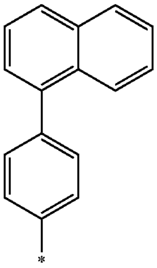 [SMILES: *c1ccc(-c2cccc3ccccc23)cc1] |
| A10 | 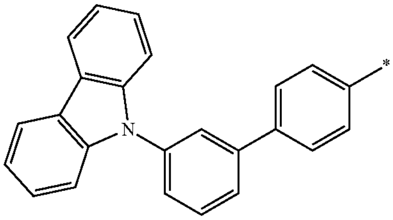 [SMILES: *c1ccc(-c2cccc(-n3c4ccccc4c4ccccc43)c2)cc1] | 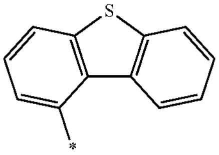 [SMILES: *c1cccc2sc3ccccc3c12] | 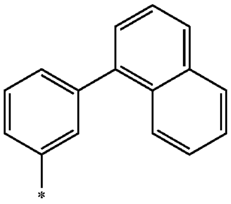 [SMILES: *c1cccc(-c2cccc3ccccc23)c1] |
| A11 | 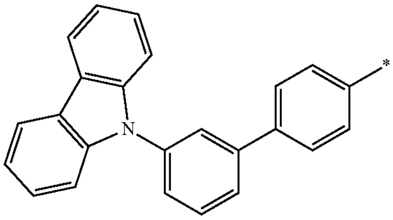 [SMILES: *c1ccc(-c2cccc(-n3c4ccccc4c4ccccc43)c2)cc1] | 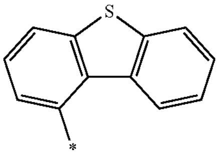 [SMILES: *c1cccc2sc3ccccc3c12] | 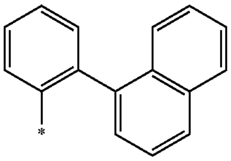 [SMILES: *c1ccccc1-c1cccc2ccccc12] |

-continued
Compound Group 1
| Formula 1 | $Ar_1$ | $Ar_2$ | $Ar_3$ |
| --- | --- | --- | --- |
| A12 | 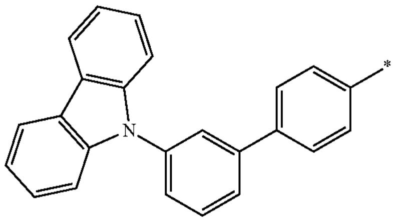 [SMILES: *c1ccc(-c2cccc(-n3c4ccccc4c4ccccc43)c2)cc1] | 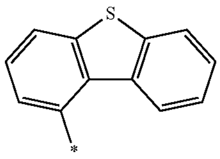 | 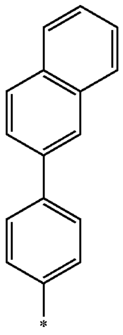 |
| A13 | 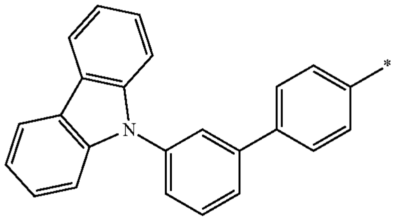 [SMILES: *c1ccc(-c2cccc(-n3c4ccccc4c4ccccc43)c2)cc1] | 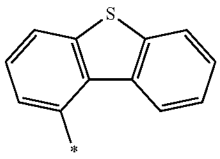 [SMILES: *c1cccc2sc3ccccc3c12] | 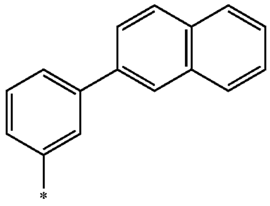 [SMILES: *c1cccc(-c2ccc3ccccc3c2)c1] |
| A14 | 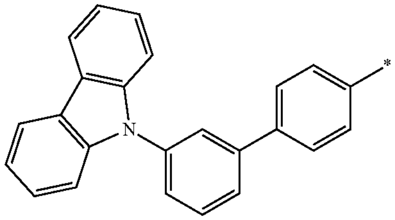 [SMILES: *c1ccc(-c2cccc(-n3c4ccccc4c4ccccc43)c2)cc1] | 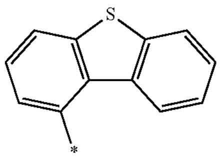 [SMILES: *c1cccc2sc3ccccc3c12] | 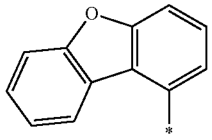 |
| A15 | 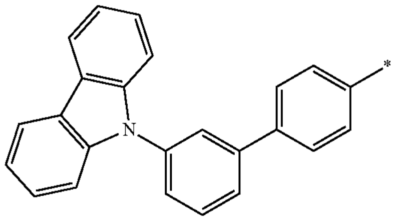 [SMILES: *c1ccc(-c2cccc(-n3c4ccccc4c4ccccc43)c2)cc1] | 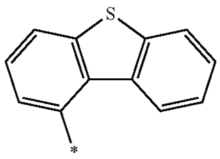 [SMILES: *c1cccc2sc3ccccc3c12] | 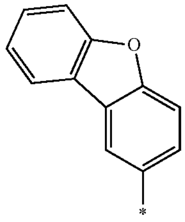 |
| A16 | 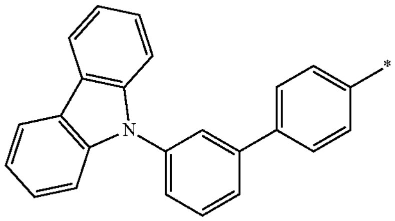 [SMILES: *c1ccc(-c2cccc(-n3c4ccccc4c4ccccc43)c2)cc1] | 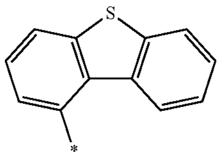 [SMILES: *c1cccc2sc3ccccc3c12] | 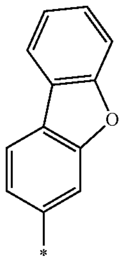 [SMILES: *c1ccc2c(c1)oc1ccccc12] |
| A17 | 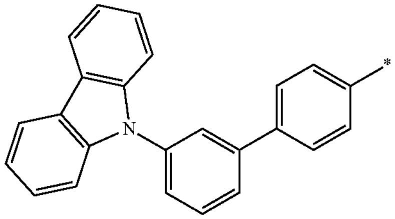 [SMILES: *c1ccc(-c2cccc(-n3c4ccccc4c4ccccc43)c2)cc1] | 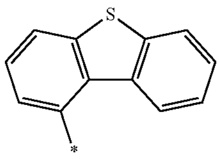 [SMILES: *c1cccc2sc3ccccc3c12] | 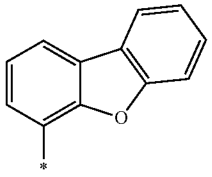 |

-continued
| Compound Group 1 | | | |
|---|---|---|---|
| Formula 1 | $Ar_1$ | $Ar_2$ | $Ar_3$ |
| A18 | 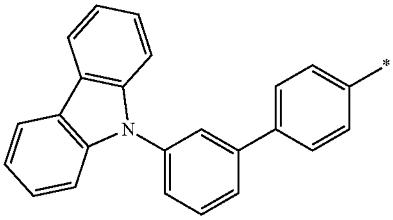 [SMILES: *c1ccc(-c2cccc(-n3c4ccccc4c4ccccc43)c2)cc1] | 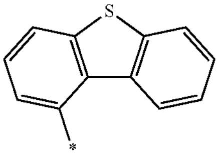 | 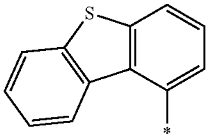 |
| A19 | 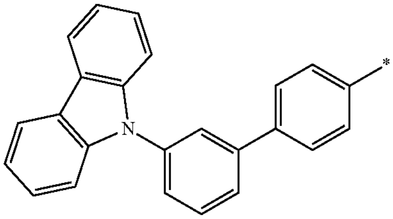 [SMILES: *c1ccc(-c2cccc(-n3c4ccccc4c4ccccc43)c2)cc1] | 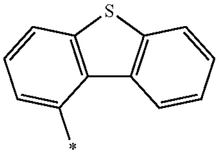 [SMILES: *c1cccc2sc3ccccc3c12] | 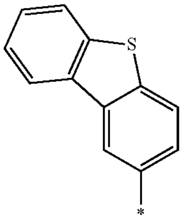 |
| A20 | 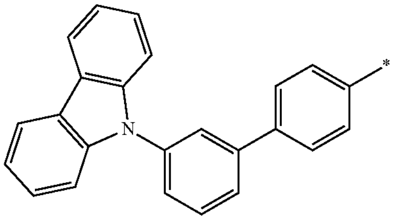 [SMILES: *c1ccc(-c2cccc(-n3c4ccccc4c4ccccc43)c2)cc1] | 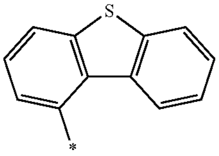 [SMILES: *c1cccc2sc3ccccc3c12] | 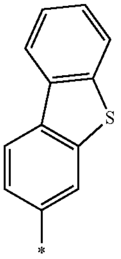 [SMILES: *c1ccc2c(c1)sc1ccccc12] |
| A21 | 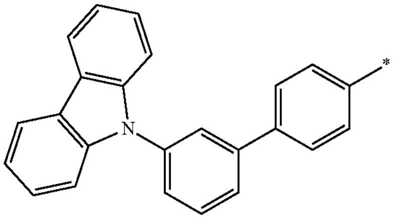 [SMILES: *c1ccc(-c2cccc(-n3c4ccccc4c4ccccc43)c2)cc1] | 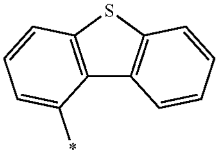 [SMILES: *c1cccc2sc3ccccc3c12] | 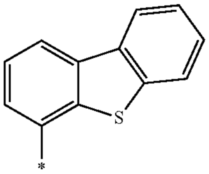 |
| A22 | 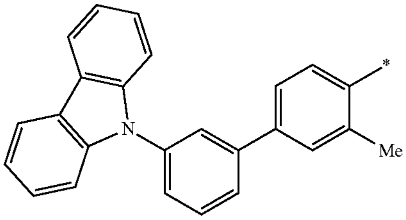 [SMILES: *c1ccc(-c2cccc(-n3c4ccccc4c4ccccc43)c2)cc1C] | 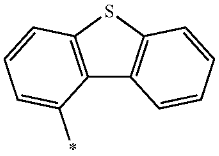 [SMILES: *c1cccc2sc3ccccc3c12] | 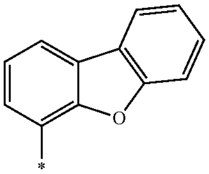 |
| A23 | 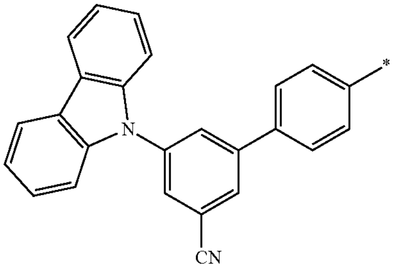 [SMILES: *c1ccc(-c2cc(C#N)cc(-n3c4ccccc4c4ccccc43)c2)cc1] | 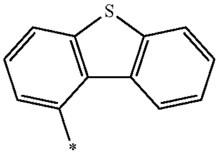 | 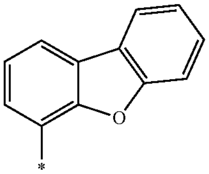 |

-continued
Compound Group 1
| Formula 1 | $Ar_1$ | $Ar_2$ | $Ar_3$ |
|---|---|---|---|
| B1 | 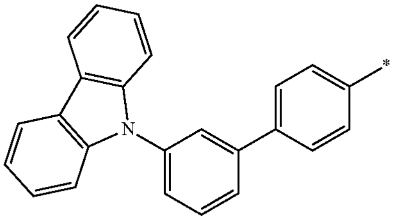 [SMILES: *c1ccc(-c2cccc(-n3c4ccccc4c4ccccc43)c2)cc1] | 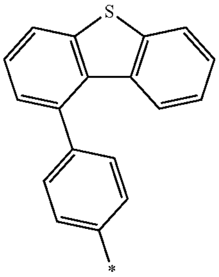 [SMILES: *c1ccc(-c2cccc3sc4ccccc4c23)cc1] | 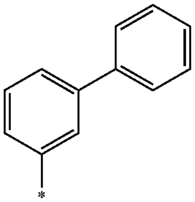 [SMILES: *c1cccc(-c2ccccc2)c1] |
| B2 | 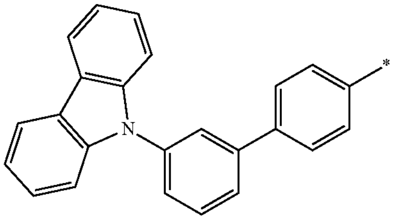 [SMILES: *c1ccc(-c2cccc(-n3c4ccccc4c4ccccc43)c2)cc1] | 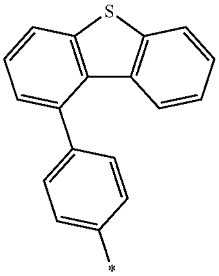 [SMILES: *c1ccc(-c2cccc3sc4ccccc4c23)cc1] | 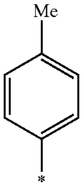 |
| B4 | 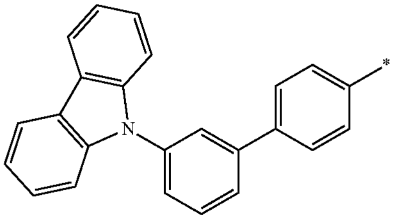 [SMILES: *c1ccc(-c2cccc(-n3c4ccccc4c4ccccc43)c2)cc1] | 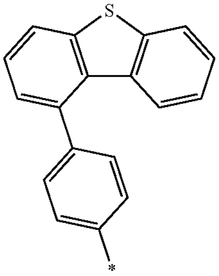 [SMILES: *c1ccc(-c2cccc3sc4ccccc4c23)cc1] | 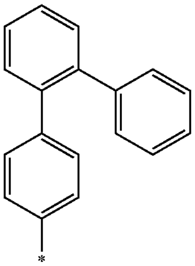 [SMILES: *c1ccc(-c2ccccc2-c2ccccc2)cc1] |
| B5 | 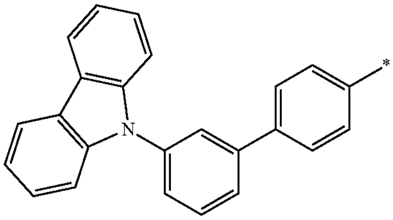 [SMILES: *c1ccc(-c2cccc(-n3c4ccccc4c4ccccc43)c2)cc1] | 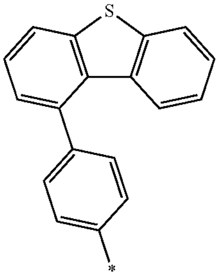 [SMILES: *c1ccc(-c2cccc3sc4ccccc4c23)cc1] | 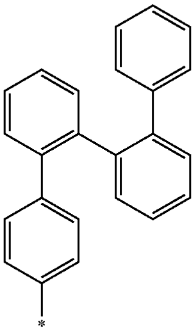 [SMILES: *c1ccc(-c2ccccc2-c2ccccc2-c2ccccc2)cc1] |
| B6 | 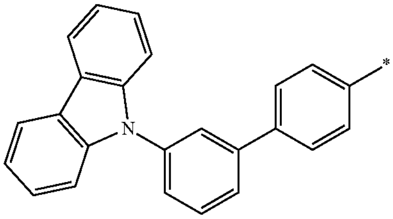 [SMILES: *c1ccc(-c2cccc(-n3c4ccccc4c4ccccc43)c2)cc1] | 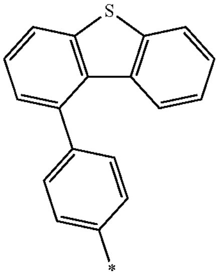 [SMILES: *c1ccc(-c2cccc3sc4ccccc4c23)cc1] | 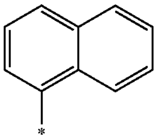 [SMILES: *c1cccc2ccccc12] |

-continued
| Compound Group 1 | | | |
|---|---|---|---|
| Formula 1 | $Ar_1$ | $Ar_2$ | $Ar_3$ |
| B7 | 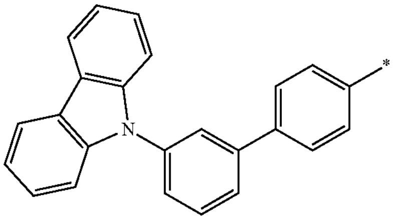 [SMILES: *c1ccc(-c2cccc(-n3c4ccccc4c4ccccc43)c2)cc1] | 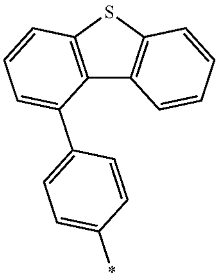 [SMILES: *c1ccc(-c2cccc3sc4ccccc4c23)cc1] | 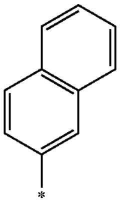 |
| B8 | 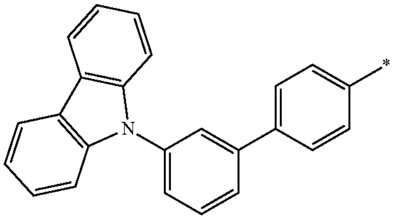 [SMILES: *c1ccc(-c2cccc(-n3c4ccccc4c4ccccc43)c2)cc1] | 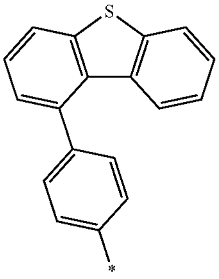 [SMILES: *c1ccc(-c2cccc3sc4ccccc4c23)cc1] | 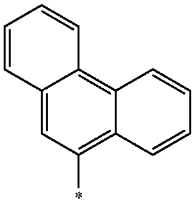 [SMILES: *c1cc2ccccc2c2ccccc12] |
| B10 | 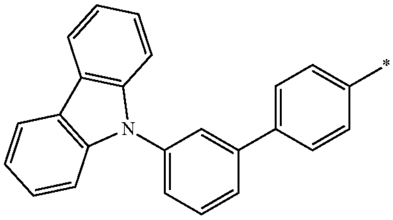 [SMILES: *c1ccc(-c2cccc(-n3c4ccccc4c4ccccc43)c2)cc1] | 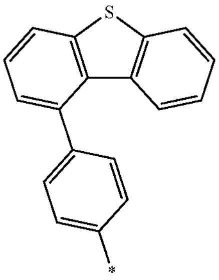 [SMILES: *c1ccc(-c2cccc3sc4ccccc4c23)cc1] | 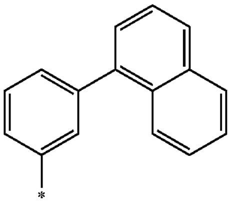 [SMILES: *c1cccc(-c2cccc3ccccc23)c1] |
| B11 | 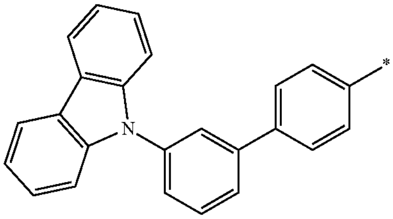 [SMILES: *c1ccc(-c2cccc(-n3c4ccccc4c4ccccc43)c2)cc1] | 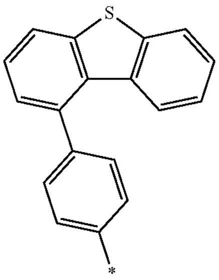 [SMILES: *c1ccc(-c2cccc3sc4ccccc4c23)cc1] | 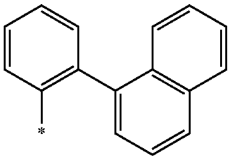 [SMILES: *c1ccccc1-c1cccc2ccccc12] |
| B12 | 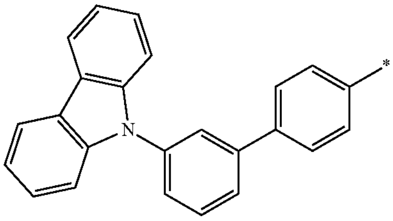 [SMILES: *c1ccc(-c2cccc(-n3c4ccccc4c4ccccc43)c2)cc1] | 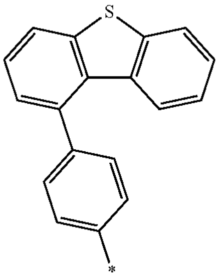 [SMILES: *c1ccc(-c2cccc3sc4ccccc4c23)cc1] | 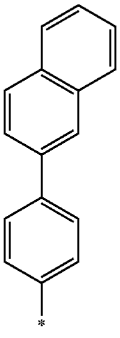 |

-continued
| Compound Group 1 | | | |
|---|---|---|---|
| Formula 1 | $Ar_1$ | $Ar_2$ | $Ar_3$ |
| B13 | 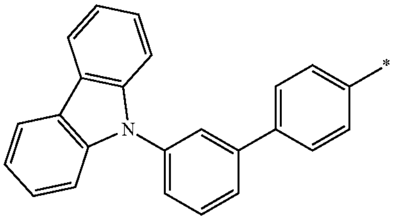 [SMILES: *c1ccc(-c2cccc(-n3c4ccccc4c4ccccc43)c2)cc1] | 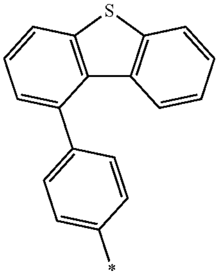 [SMILES: *c1ccc(-c2cccc3sc4ccccc4c23)cc1] | 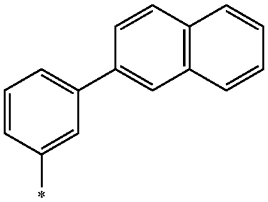 [SMILES: *c1cccc(-c2ccc3ccccc3c2)c1] |
| B14 | 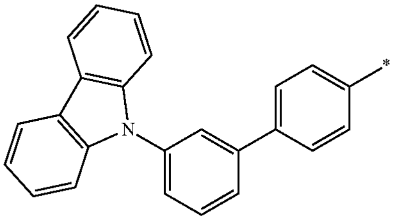 [SMILES: *c1ccc(-c2cccc(-n3c4ccccc4c4ccccc43)c2)cc1] | 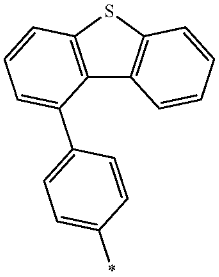 [SMILES: *c1ccc(-c2cccc3sc4ccccc4c23)cc1] | 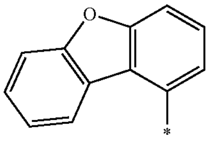 |
| B15 | 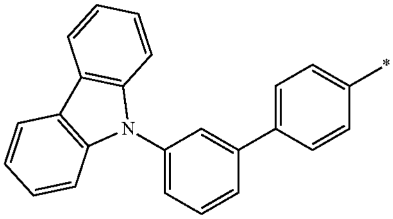 [SMILES: *c1ccc(-c2cccc(-n3c4ccccc4c4ccccc43)c2)cc1] | 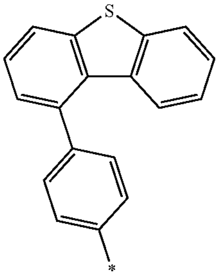 [SMILES: *c1ccc(-c2cccc3sc4ccccc4c23)cc1] | 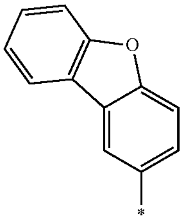 |
| B16 | 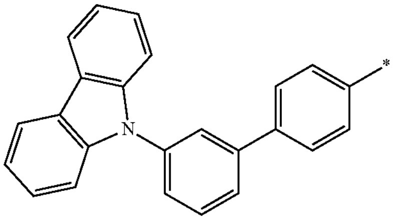 [SMILES: *c1ccc(-c2cccc(-n3c4ccccc4c4ccccc43)c2)cc1] | 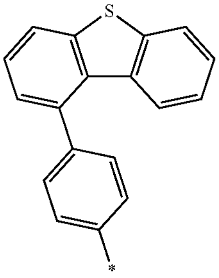 [SMILES: *c1ccc(-c2cccc3sc4ccccc4c23)cc1] | 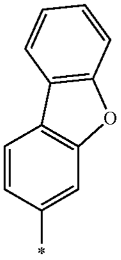 [SMILES: *c1ccc2c(c1)oc1ccccc12] |
| B17 | 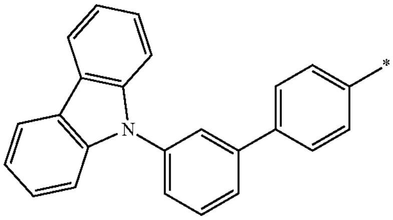 [SMILES: *c1ccc(-c2cccc(-n3c4ccccc4c4ccccc43)c2)cc1] | 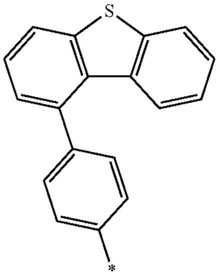 [SMILES: *c1ccc(-c2cccc3sc4ccccc4c23)cc1] | 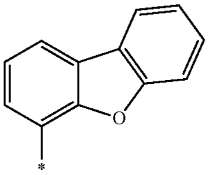 |

-continued
| Compound Group 1 | | | |
|---|---|---|---|
| Formula 1 | $Ar_1$ | $Ar_2$ | $Ar_3$ |
| B18 | 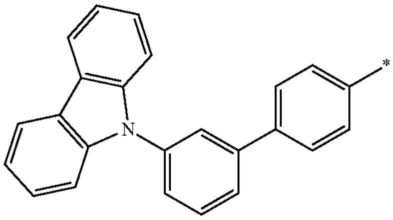 [SMILES: *c1ccc(-c2cccc(-n3c4ccccc4c4ccccc43)c2)cc1] | 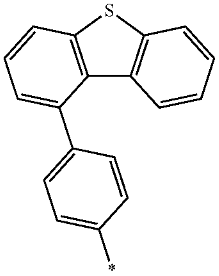 [SMILES: *c1ccc(-c2cccc3sc4ccccc4c23)cc1] | 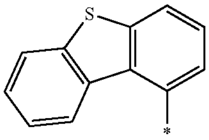 |
| B19 | 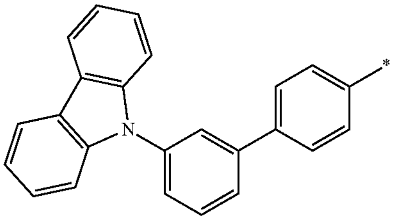 [SMILES: *c1ccc(-c2cccc(-n3c4ccccc4c4ccccc43)c2)cc1] | 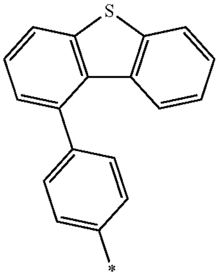 [SMILES: *c1ccc(-c2cccc3sc4ccccc4c23)cc1] | 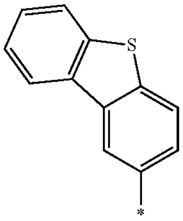 |
| B20 | 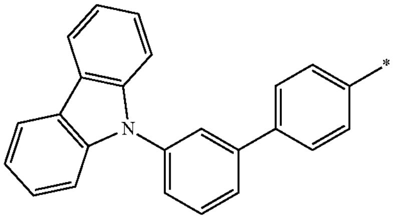 [SMILES: *c1ccc(-c2cccc(-n3c4ccccc4c4ccccc43)c2)cc1] | 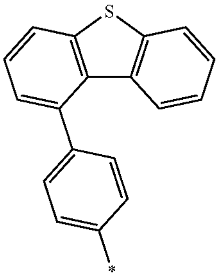 [SMILES: *c1ccc(-c2cccc3sc4ccccc4c23)cc1] | 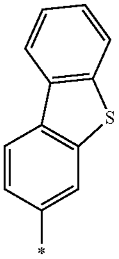 [SMILES: *c1ccc2c(c1)sc1ccccc12] |
| B21 | 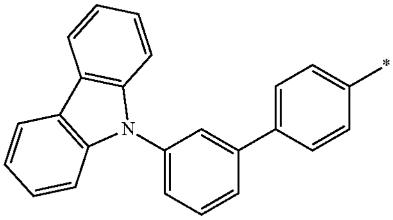 [SMILES: *c1ccc(-c2cccc(-n3c4ccccc4c4ccccc43)c2)cc1] | 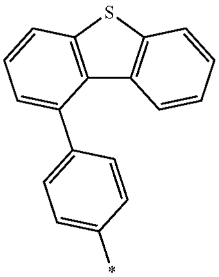 [SMILES: *c1ccc(-c2cccc3sc4ccccc4c23)cc1] | 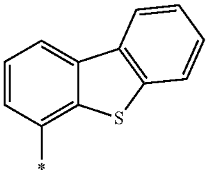 |
| B22 | 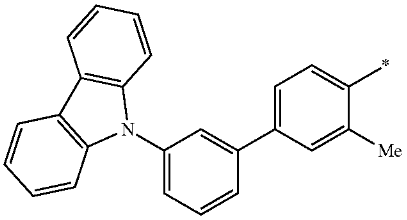 [SMILES: *c1ccc(-c2cccc(-n3c4ccccc4c4ccccc43)c2)cc1C] | 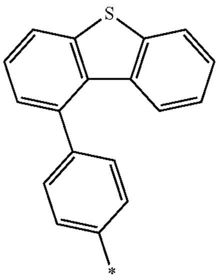 [SMILES: *c1ccc(-c2cccc3sc4ccccc4c23)cc1] | 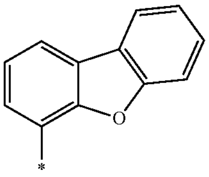 |

-continued
Compound Group 1
| Formula 1 | $Ar_1$ | $Ar_2$ | $Ar_3$ |
|---|---|---|---|
| B23 | 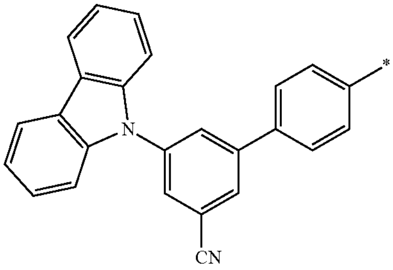 [SMILES: *c1ccc(-c2cc(C#N)cc(-n3c4ccccc4c4ccccc43)c2)cc1] | 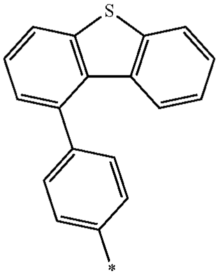 [SMILES: *c1ccc(-c2cccc3sc4ccccc4c23)cc1] | 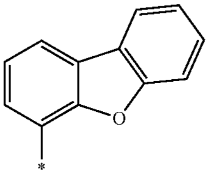 |
| C1 | 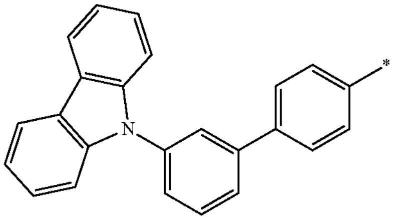 [SMILES: *c1ccc(-c2cccc(-n3c4ccccc4c4ccccc43)c2)cc1] | 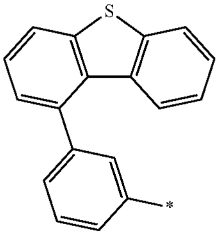 [SMILES: *c1cccc(-c2cccc3sc4ccccc4c23)c1] | 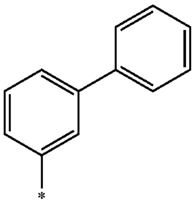 [SMILES: *c1cccc(-c2ccccc2)c1] |
| C2 | 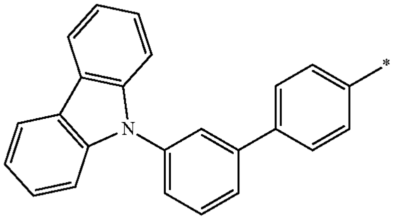 [SMILES: *c1ccc(-c2cccc(-n3c4ccccc4c4ccccc43)c2)cc1] | 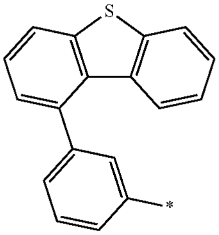 [SMILES: *c1cccc(-c2cccc3sc4ccccc4c23)c1] | 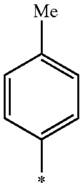 |
| C4 | 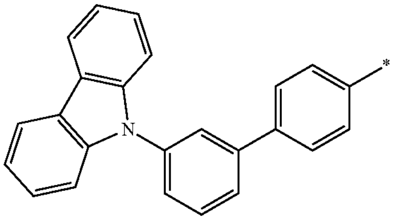 [SMILES: *c1ccc(-c2cccc(-n3c4ccccc4c4ccccc43)c2)cc1] | 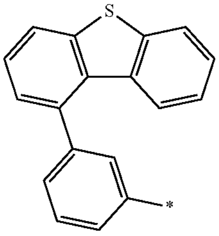 [SMILES: *c1cccc(-c2cccc3sc4ccccc4c23)c1] | 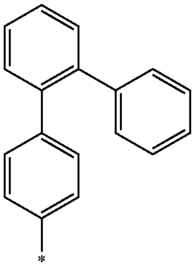 [SMILES: *c1ccc(-c2ccccc2-c2ccccc2)cc1] |
| C5 | 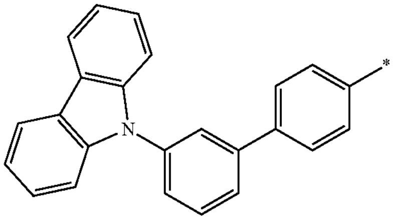 [SMILES: *c1ccc(-c2cccc(-n3c4ccccc4c4ccccc43)c2)cc1] | 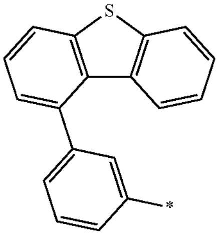 [SMILES: *c1cccc(-c2cccc3sc4ccccc4c23)c1] | 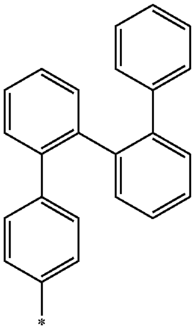 [SMILES: *c1ccc(-c2ccccc2-c2ccccc2-c2ccccc2)cc1] |

-continued
| Compound Group 1 | | | |
|---|---|---|---|
| Formula 1 | $Ar_1$ | $Ar_2$ | $Ar_3$ |
| C6 | 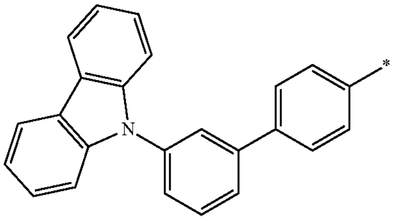 [SMILES: *c1ccc(-c2cccc(-n3c4ccccc4c4ccccc43)c2)cc1] | 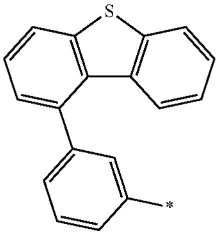 [SMILES: *c1cccc(-c2cccc3sc4ccccc4c23)c1] | 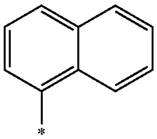 [SMILES: *c1cccc2ccccc12] |
| C7 | 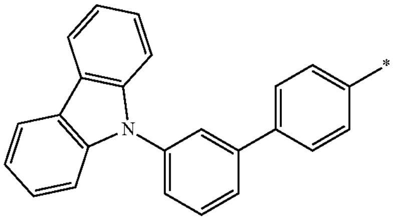 [SMILES: *c1ccc(-c2cccc(-n3c4ccccc4c4ccccc43)c2)cc1] | 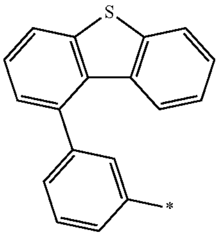 [SMILES: *c1cccc(-c2cccc3sc4ccccc4c23)c1] | 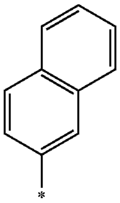 |
| C8 | 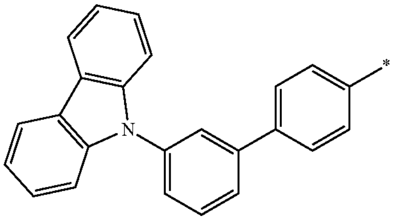 [SMILES: *c1ccc(-c2cccc(-n3c4ccccc4c4ccccc43)c2)cc1] | 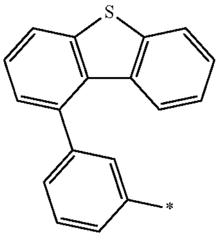 [SMILES: *c1cccc(-c2cccc3sc4ccccc4c23)c1] | 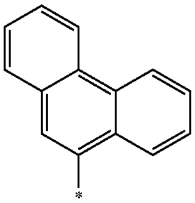 [SMILES: *c1cc2ccccc2c2ccccc12] |
| C10 | 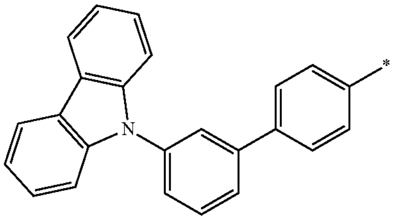 [SMILES: *c1ccc(-c2cccc(-n3c4ccccc4c4ccccc43)c2)cc1] | 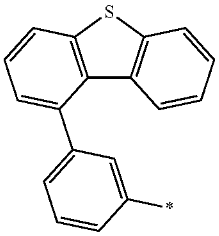 [SMILES: *c1cccc(-c2cccc3sc4ccccc4c23)c1] | 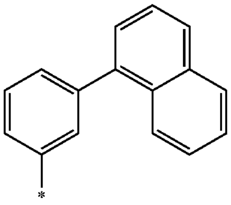 [SMILES: *c1cccc(-c2cccc3ccccc23)c1] |
| C11 | 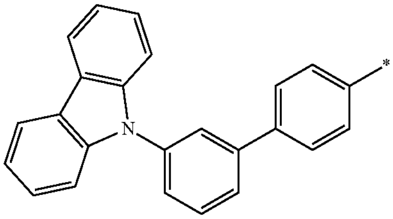 [SMILES: *c1ccc(-c2cccc(-n3c4ccccc4c4ccccc43)c2)cc1] | 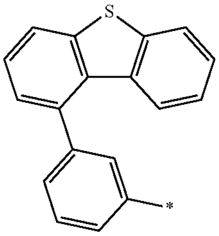 [SMILES: *c1cccc(-c2cccc3sc4ccccc4c23)c1] | 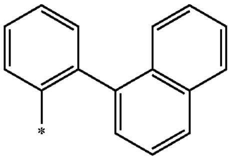 [SMILES: *c1ccccc1-c1cccc2ccccc12] |

-continued
Compound Group 1
| Formula 1 | $Ar_1$ | $Ar_2$ | $Ar_3$ |
|---|---|---|---|
| C12 | 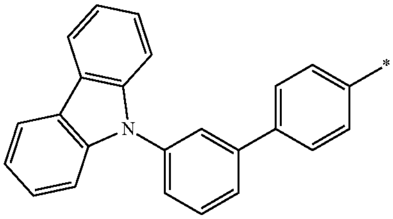 [SMILES: *c1ccc(-c2cccc(-n3c4ccccc4c4ccccc43)c2)cc1] | 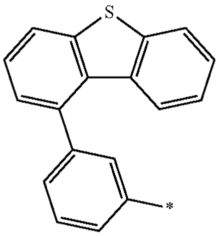 [SMILES: *c1cccc(-c2cccc3sc4ccccc4c23)c1] | 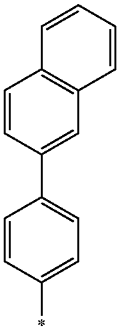 |
| C13 | 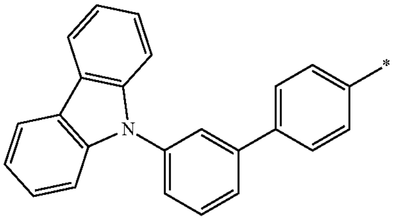 [SMILES: *c1ccc(-c2cccc(-n3c4ccccc4c4ccccc43)c2)cc1] | 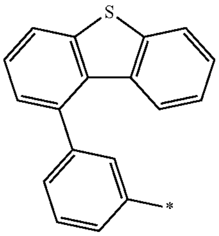 [SMILES: *c1cccc(-c2cccc3sc4ccccc4c23)c1] | 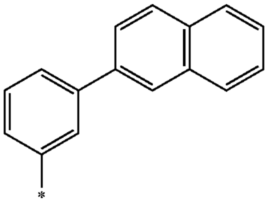 [SMILES: *c1cccc(-c2ccc3ccccc3c2)c1] |
| C14 | 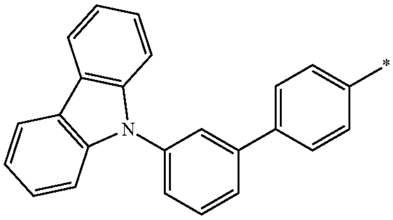 [SMILES: *c1ccc(-c2cccc(-n3c4ccccc4c4ccccc43)c2)cc1] | 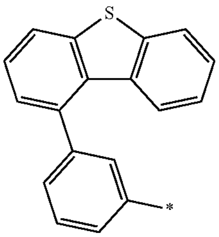 [SMILES: *c1cccc(-c2cccc3sc4ccccc4c23)c1] | 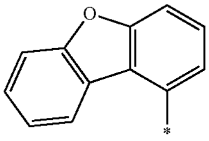 |
| C15 | 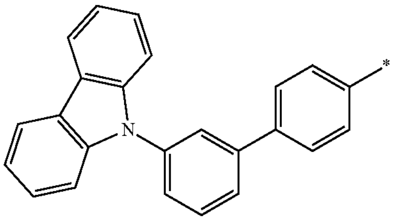 [SMILES: *c1ccc(-c2cccc(-n3c4ccccc4c4ccccc43)c2)cc1] | 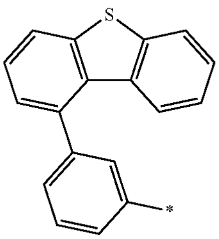 [SMILES: *c1cccc(-c2cccc3sc4ccccc4c23)c1] | 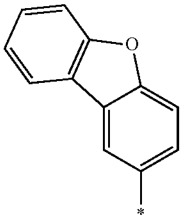 |
| C16 | 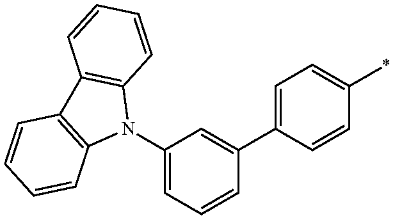 [SMILES: *c1ccc(-c2cccc(-n3c4ccccc4c4ccccc43)c2)cc1] | 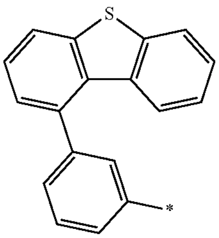 [SMILES: *c1cccc(-c2cccc3sc4ccccc4c23)c1] | 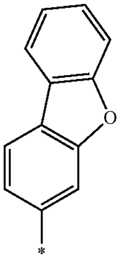 [SMILES: *c1ccc2c(c1)oc1ccccc12] |

-continued
Compound Group 1
| Formula 1 | $Ar_1$ | $Ar_2$ | $Ar_3$ |
|---|---|---|---|
| C17 | 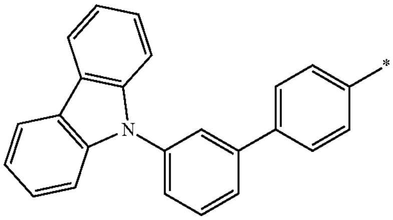 [SMILES: *c1ccc(-c2cccc(-n3c4ccccc4c4ccccc43)c2)cc1] | 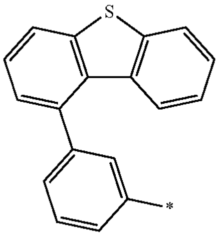 [SMILES: *c1cccc(-c2cccc3sc4ccccc4c23)c1] | 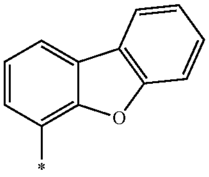 |
| C18 | 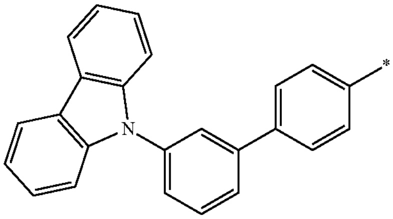 [SMILES: *c1ccc(-c2cccc(-n3c4ccccc4c4ccccc43)c2)cc1] | 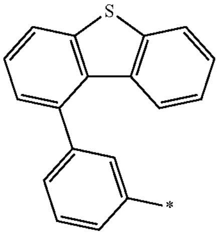 [SMILES: *c1cccc(-c2cccc3sc4ccccc4c23)c1] | 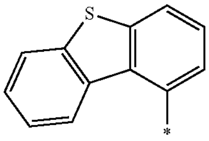 |
| C19 | 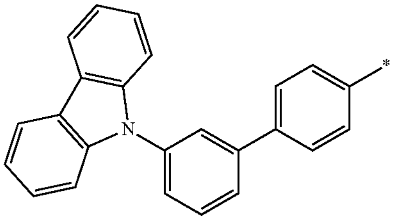 [SMILES: *c1ccc(-c2cccc(-n3c4ccccc4c4ccccc43)c2)cc1] | 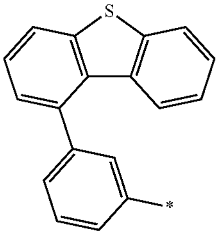 [SMILES: *c1cccc(-c2cccc3sc4ccccc4c23)c1] | 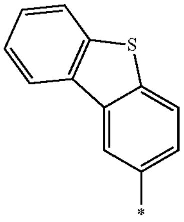 |
| C20 | 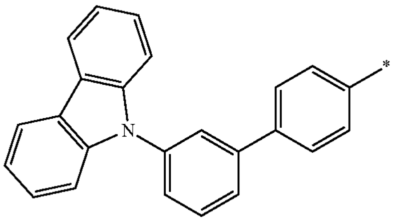 [SMILES: *c1ccc(-c2cccc(-n3c4ccccc4c4ccccc43)c2)cc1] | 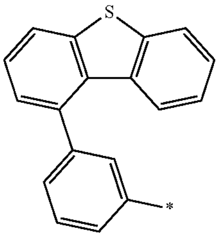 [SMILES: *c1cccc(-c2cccc3sc4ccccc4c23)c1] | 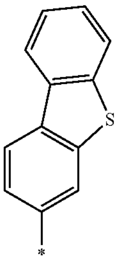 [SMILES: *c1ccc2c(c1)sc1ccccc12] |
| C21 | 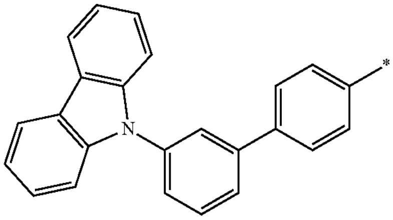 [SMILES: *c1ccc(-c2cccc(-n3c4ccccc4c4ccccc43)c2)cc1] | 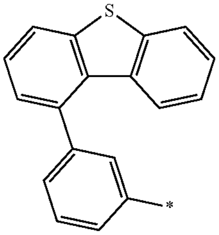 [SMILES: *c1cccc(-c2cccc3sc4ccccc4c23)c1] | 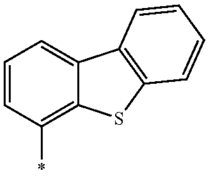 |
| C22 | 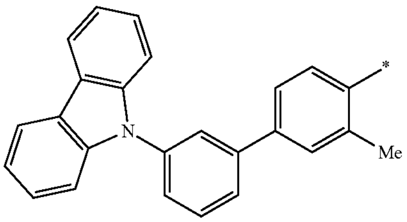 [SMILES: *c1ccc(-c2cccc(-n3c4ccccc4c4ccccc43)c2)cc1C] | 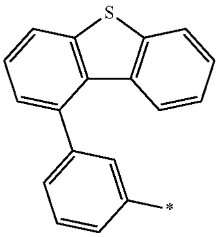 [SMILES: *c1cccc(-c2cccc3sc4ccccc4c23)c1] | 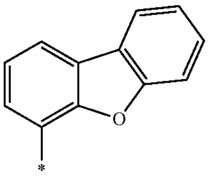 |

-continued
| Compound Group 1 | | | |
|---|---|---|---|
| Formula 1 | $Ar_1$ | $Ar_2$ | $Ar_3$ |
| C23 | 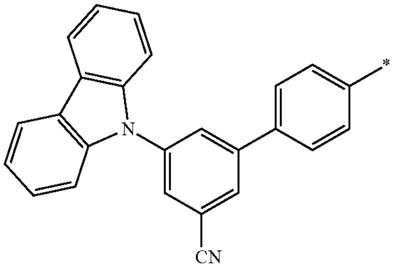 [SMILES: *c1ccc(-c2cc(C#N)cc(-n3c4ccccc4c4ccccc43)c2)cc1] | 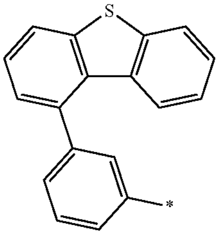 [SMILES: *c1cccc(-c2cccc3sc4ccccc4c23)c1] | 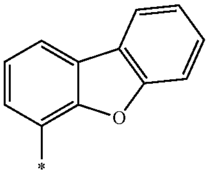 |
| D1 | 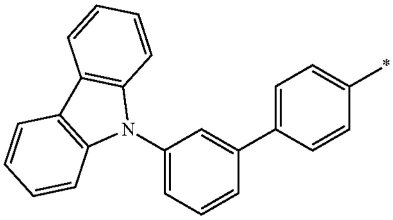 [SMILES: *c1ccc(-c2cccc(-n3c4ccccc4c4ccccc43)c2)cc1] | 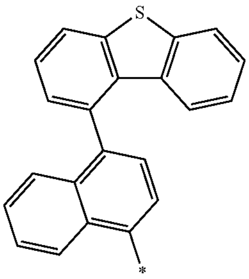 [SMILES: *c1ccc(-c2cccc3sc4ccccc4c23)c2ccccc12] | 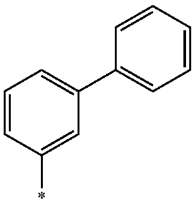 [SMILES: *c1cccc(-c2ccccc2)c1] |
| D2 | 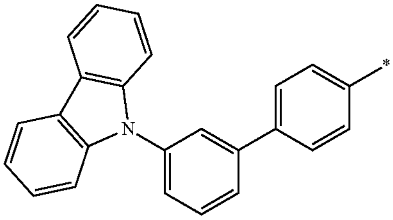 [SMILES: *c1ccc(-c2cccc(-n3c4ccccc4c4ccccc43)c2)cc1] | 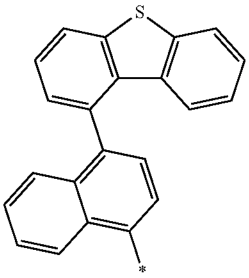 [SMILES: *c1ccc(-c2cccc3sc4ccccc4c23)c2ccccc12] | 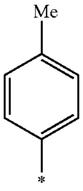 |
| D3 | 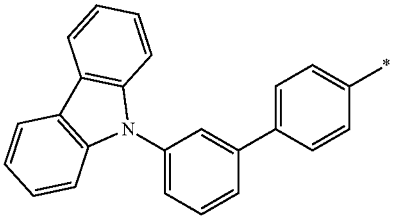 [SMILES: *c1ccc(-c2cccc(-n3c4ccccc4c4ccccc43)c2)cc1] | 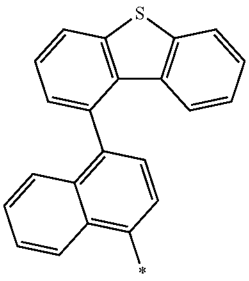 [SMILES: *c1ccc(-c2cccc3sc4ccccc4c23)c2ccccc12] | 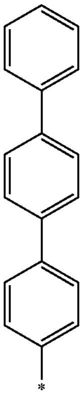 |
| D4 | 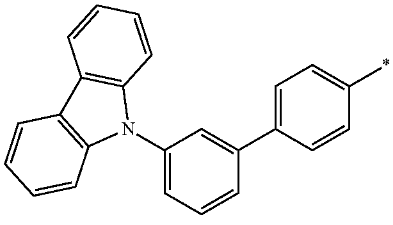 [SMILES: *c1ccc(-c2cccc(-n3c4ccccc4c4ccccc43)c2)cc1] | 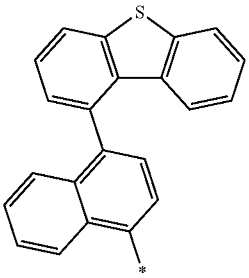 [SMILES: *c1ccc(-c2cccc3sc4ccccc4c23)c2ccccc12] | 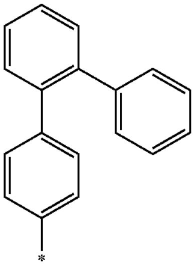 [SMILES: *c1ccc(-c2ccccc2-c2ccccc2)cc1] |

-continued
Compound Group 1
| Formula 1 | $Ar_1$ | $Ar_2$ | $Ar_3$ |
|---|---|---|---|
| D5 | 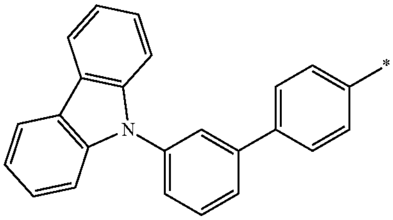 [SMILES: *c1ccc(-c2cccc(-n3c4ccccc4c4ccccc43)c2)cc1] | 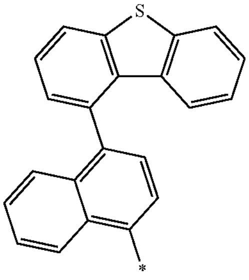 [SMILES: *c1ccc(-c2cccc3sc4ccccc4c23)c2ccccc12] | 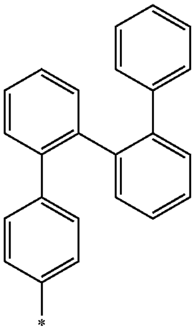 [SMILES: *c1ccc(-c2ccccc2-c2ccccc2-c2ccccc2)cc1] |
| D6 | 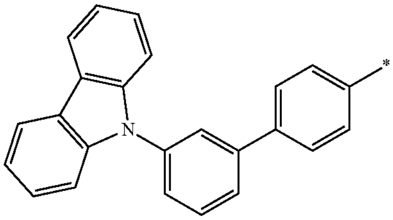 [SMILES: *c1ccc(-c2cccc(-n3c4ccccc4c4ccccc43)c2)cc1] | 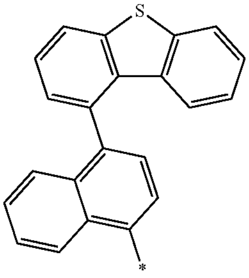 [SMILES: *c1ccc(-c2cccc3sc4ccccc4c23)c2ccccc12] | 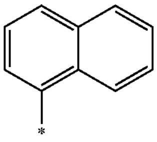 [SMILES: *c1cccc2ccccc12] |
| D7 | 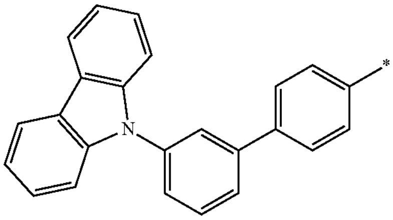 [SMILES: *c1ccc(-c2cccc(-n3c4ccccc4c4ccccc43)c2)cc1] | 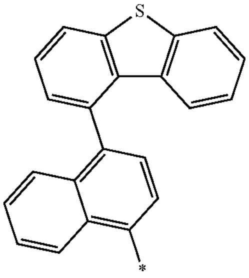 [SMILES: *c1ccc(-c2cccc3sc4ccccc4c23)c2ccccc12] | 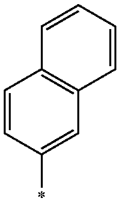 |
| D8 | 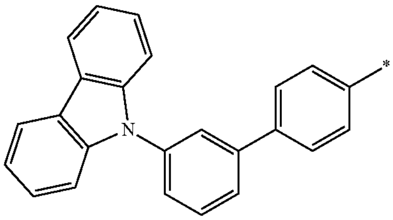 [SMILES: *c1ccc(-c2cccc(-n3c4ccccc4c4ccccc43)c2)cc1] | 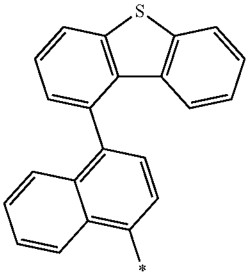 [SMILES: *c1ccc(-c2cccc3sc4ccccc4c23)c2ccccc12] | 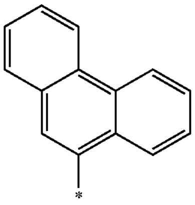 [SMILES: *c1cc2ccccc2c2ccccc12] |
| D9 | 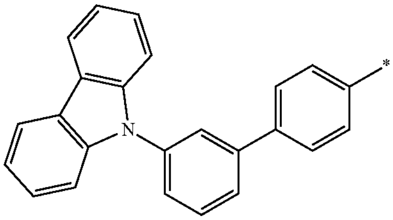 [SMILES: *c1ccc(-c2cccc(-n3c4ccccc4c4ccccc43)c2)cc1] | 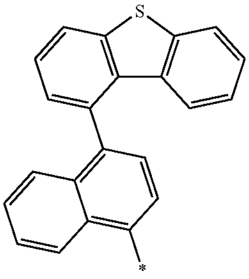 [SMILES: *c1ccc(-c2cccc3sc4ccccc4c23)c2ccccc12] | 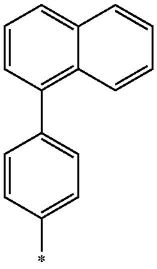 [SMILES: *c1ccc(-c2cccc3ccccc23)cc1] |

-continued
| Compound Group 1 | | | |
|---|---|---|---|
| Formula 1 | $Ar_1$ | $Ar_2$ | $Ar_3$ |
| D10 | 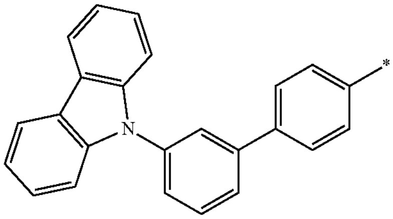 [SMILES: *c1ccc(-c2cccc(-n3c4ccccc4c4ccccc43)c2)cc1] | 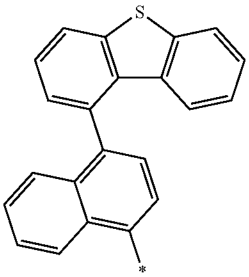 [SMILES: *c1ccc(-c2cccc3sc4ccccc4c23)c2ccccc12] | 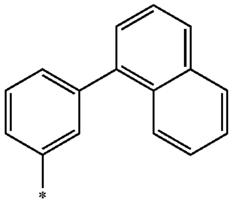 [SMILES: *c1cccc(-c2cccc3ccccc23)c1] |
| D11 | 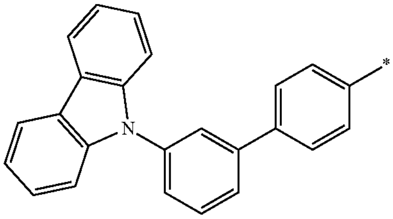 [SMILES: *c1ccc(-c2cccc(-n3c4ccccc4c4ccccc43)c2)cc1] | 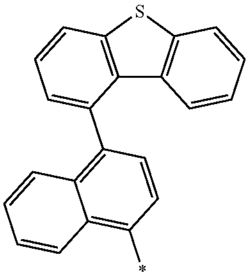 [SMILES: *c1ccc(-c2cccc3sc4ccccc4c23)c2ccccc12] | 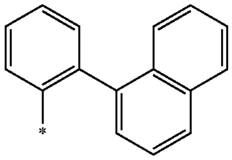 [SMILES: *c1ccccc1-c1cccc2ccccc12] |
| D12 | 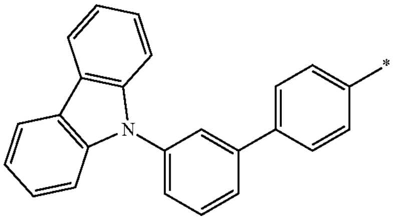 [SMILES: *c1ccc(-c2cccc(-n3c4ccccc4c4ccccc43)c2)cc1] | 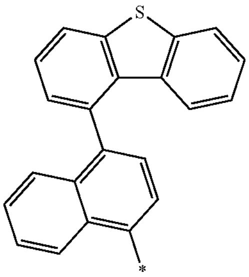 [SMILES: *c1ccc(-c2cccc3sc4ccccc4c23)c2ccccc12] | 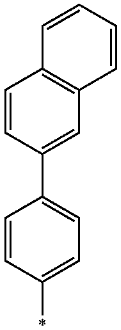 |
| D13 | 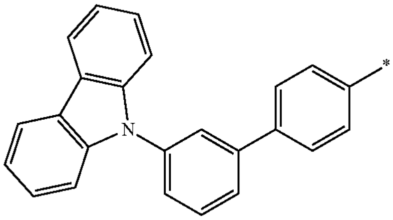 [SMILES: *c1ccc(-c2cccc(-n3c4ccccc4c4ccccc43)c2)cc1] | 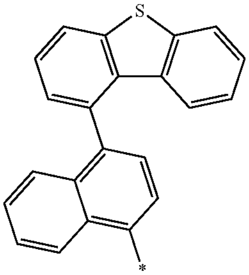 [SMILES: *c1ccc(-c2cccc3sc4ccccc4c23)c2ccccc12] | 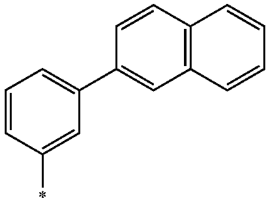 [SMILES: *c1cccc(-c2ccc3ccccc3c2)c1] |
| D14 | 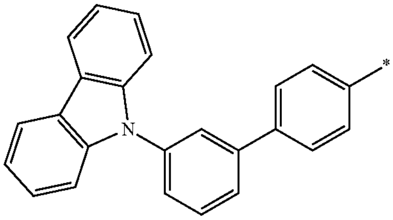 [SMILES: *c1ccc(-c2cccc(-n3c4ccccc4c4ccccc43)c2)cc1] | 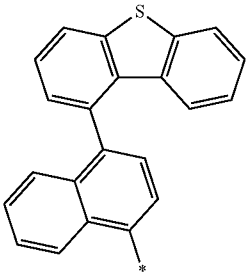 [SMILES: *c1ccc(-c2cccc3sc4ccccc4c23)c2ccccc12] | 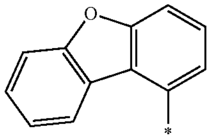 |

-continued
| Compound Group 1 | | | |
|---|---|---|---|
| Formula 1 | $Ar_1$ | $Ar_2$ | $Ar_3$ |
| D15 | 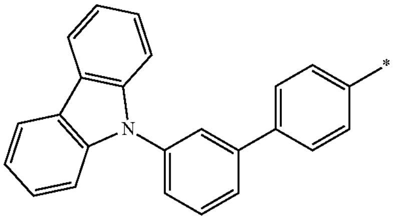 [SMILES: *c1ccc(-c2cccc(-n3c4ccccc4c4ccccc43)c2)cc1] | 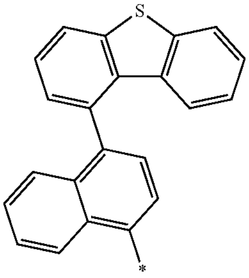 [SMILES: *c1ccc(-c2cccc3sc4ccccc4c23)c2ccccc12] | 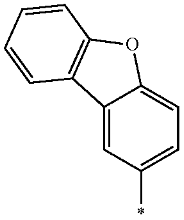 |
| D16 | 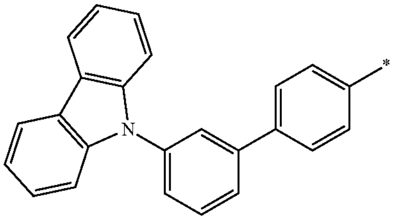 [SMILES: *c1ccc(-c2cccc(-n3c4ccccc4c4ccccc43)c2)cc1] | 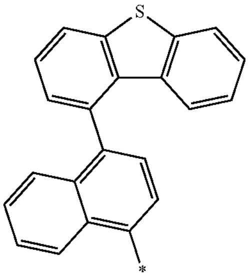 [SMILES: *c1ccc(-c2cccc3sc4ccccc4c23)c2ccccc12] | 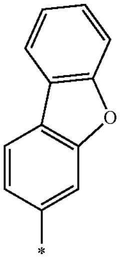 [SMILES: *c1ccc2c(c1)oc1ccccc12] |
| D17 | 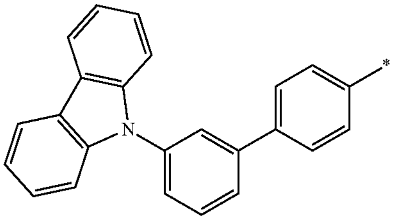 [SMILES: *c1ccc(-c2cccc(-n3c4ccccc4c4ccccc43)c2)cc1] | 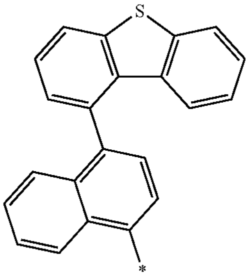 [SMILES: *c1ccc(-c2cccc3sc4ccccc4c23)c2ccccc12] | 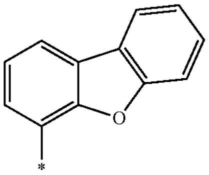 |
| D18 | 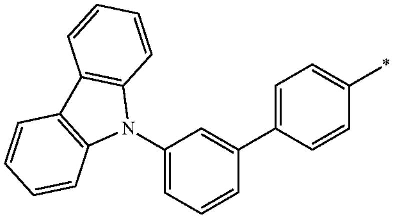 [SMILES: *c1ccc(-c2cccc(-n3c4ccccc4c4ccccc43)c2)cc1] | 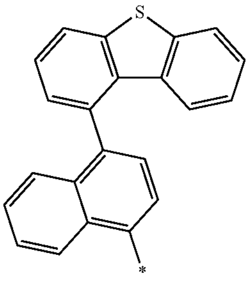 [SMILES: *c1ccc(-c2cccc3sc4ccccc4c23)c2ccccc12] | 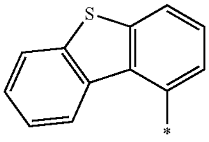 |
| D19 | 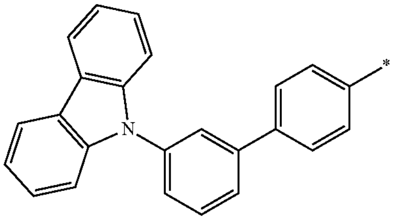 [SMILES: *c1ccc(-c2cccc(-n3c4ccccc4c4ccccc43)c2)cc1] | 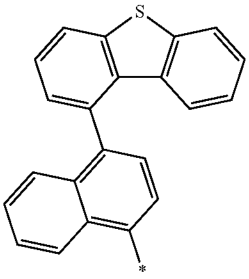 [SMILES: *c1ccc(-c2cccc3sc4ccccc4c23)c2ccccc12] | 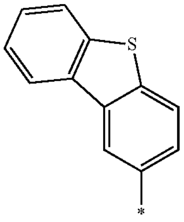 |

-continued
| Compound Group 1 | | | |
|---|---|---|---|
| Formula 1 | $Ar_1$ | $Ar_2$ | $Ar_3$ |
| D20 | 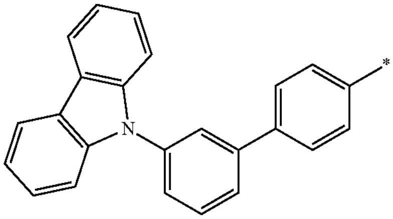 [SMILES: *c1ccc(-c2cccc(-n3c4ccccc4c4ccccc43)c2)cc1] | 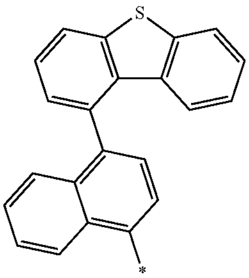 [SMILES: *c1ccc(-c2cccc3sc4ccccc4c23)c2ccccc12] | 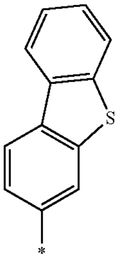 [SMILES: *c1ccc2c(c1)sc1ccccc12] |
| D21 | 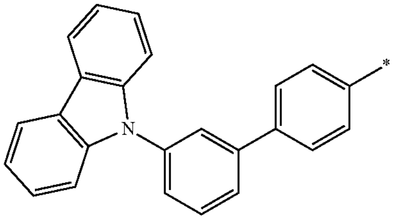 [SMILES: *c1ccc(-c2cccc(-n3c4ccccc4c4ccccc43)c2)cc1] | 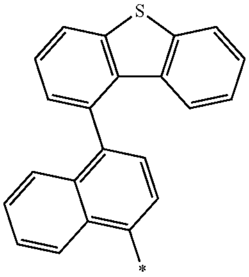 [SMILES: *c1ccc(-c2cccc3sc4ccccc4c23)c2ccccc12] | 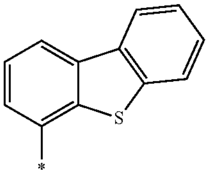 |
| D22 | 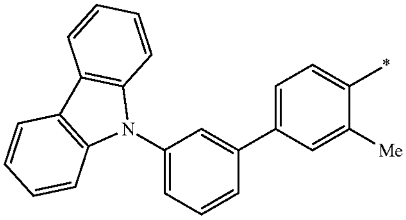 [SMILES: *c1ccc(-c2cccc(-n3c4ccccc4c4ccccc43)c2)cc1C] | 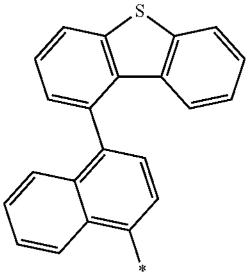 [SMILES: *c1ccc(-c2cccc3sc4ccccc4c23)c2ccccc12] | 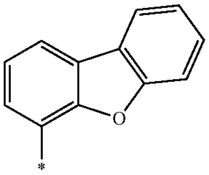 |
| D23 | 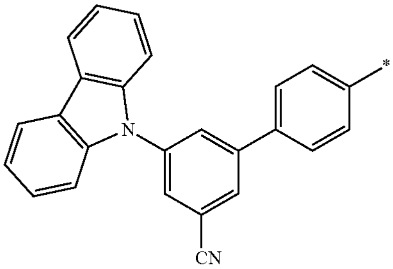 [SMILES: *c1ccc(-c2cc(C#N)cc(-n3c4ccccc4c4ccccc43)c2)cc1] | 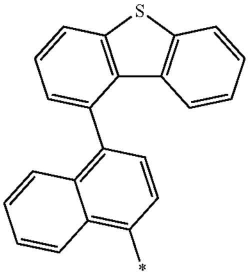 [SMILES: *c1ccc(-c2cccc3sc4ccccc4c23)c2ccccc12] | 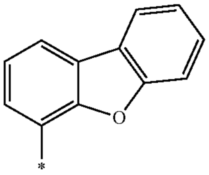 |
| E1 | 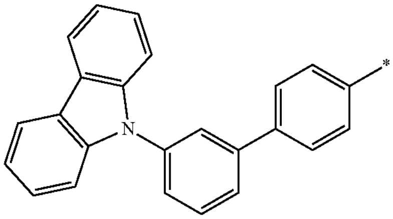 [SMILES: *c1ccc(-c2cccc(-n3c4ccccc4c4ccccc43)c2)cc1] | 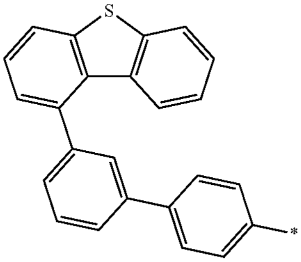 [SMILES: *c1ccc(-c2cccc(-c3cccc4sc5ccccc5c34)c2)cc1] | 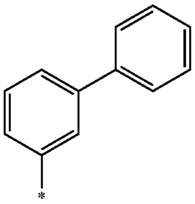 [SMILES: *c1cccc(-c2ccccc2)c1] |

-continued
| Compound Group 1 | | | |
| --- | --- | --- | --- |
| Formula 1 | $Ar_1$ | $Ar_2$ | $Ar_3$ |
| E2 | 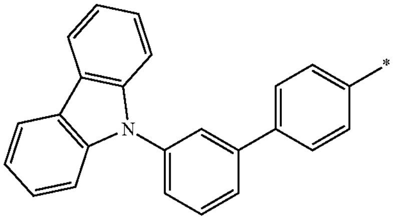 [SMILES: *c1ccc(-c2cccc(-n3c4ccccc4c4ccccc43)c2)cc1] | 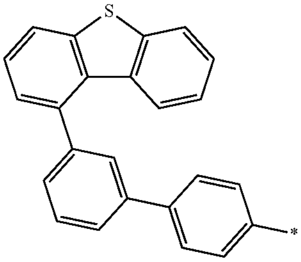 [SMILES: *c1ccc(-c2cccc(-c3cccc4sc5ccccc5c34)c2)cc1] | 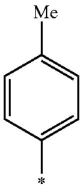 |
| E3 | 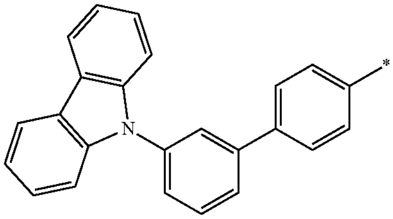 [SMILES: *c1ccc(-c2cccc(-n3c4ccccc4c4ccccc43)c2)cc1] | 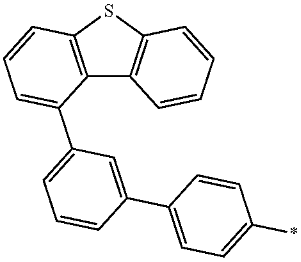 [SMILES: *c1ccc(-c2cccc(-c3cccc4sc5ccccc5c34)c2)cc1] | 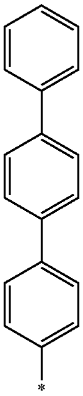 |
| E4 | 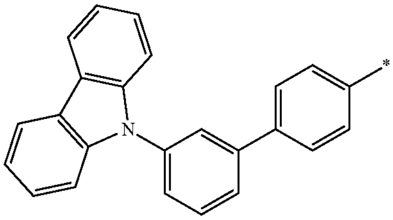 [SMILES: *c1ccc(-c2cccc(-n3c4ccccc4c4ccccc43)c2)cc1] | 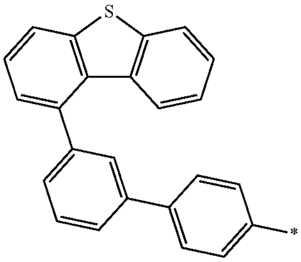 [SMILES: *c1ccc(-c2cccc(-c3cccc4sc5ccccc5c34)c2)cc1] | 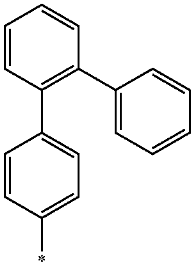 [SMILES: *c1ccc(-c2ccccc2-c2ccccc2)cc1] |
| E5 | 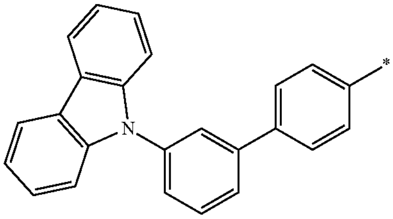 [SMILES: *c1ccc(-c2cccc(-n3c4ccccc4c4ccccc43)c2)cc1] | 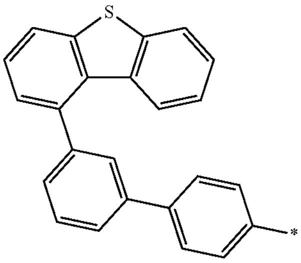 [SMILES: *c1ccc(-c2cccc(-c3cccc4sc5ccccc5c34)c2)cc1] | 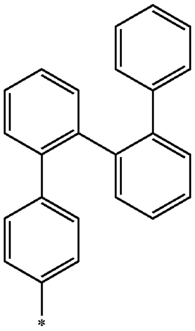 [SMILES: *c1ccc(-c2ccccc2-c2ccccc2-c2ccccc2)cc1] |

-continued
| Compound Group 1 | | | |
|---|---|---|---|
| Formula 1 | $Ar_1$ | $Ar_2$ | $Ar_3$ |
| E6 | 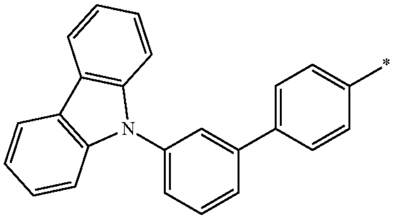 [SMILES: *c1ccc(-c2cccc(-n3c4ccccc4c4ccccc43)c2)cc1] | 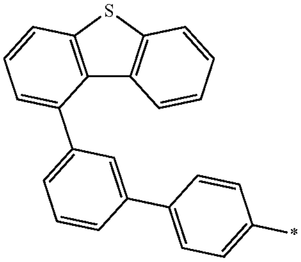 [SMILES: *c1ccc(-c2cccc(-c3cccc4sc5ccccc5c34)c2)cc1] | 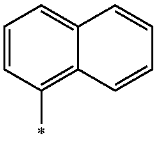 [SMILES: *c1cccc2ccccc12] |
| E7 | 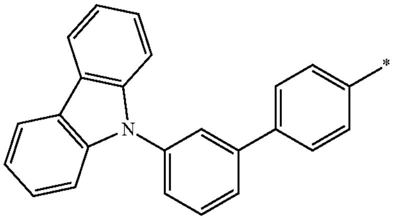 [SMILES: *c1ccc(-c2cccc(-n3c4ccccc4c4ccccc43)c2)cc1] | 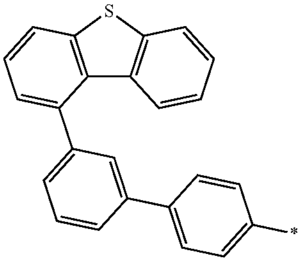 [SMILES: *c1ccc(-c2cccc(-c3cccc4sc5ccccc5c34)c2)cc1] | 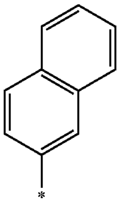 |
| E8 | 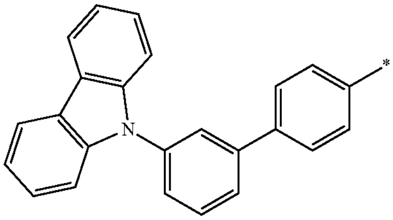 [SMILES: *c1ccc(-c2cccc(-n3c4ccccc4c4ccccc43)c2)cc1] | 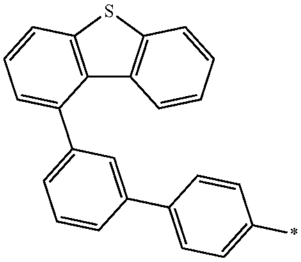 [SMILES: *c1ccc(-c2cccc(-c3cccc4sc5ccccc5c34)c2)cc1] | 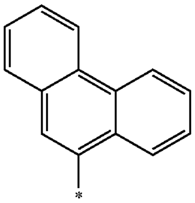 [SMILES: *c1cc2ccccc2c2ccccc12] |
| E9 | 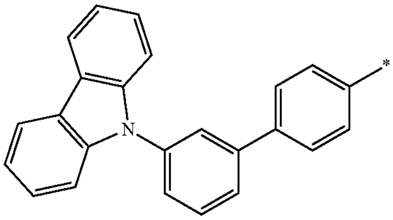 [SMILES: *c1ccc(-c2cccc(-n3c4ccccc4c4ccccc43)c2)cc1] | 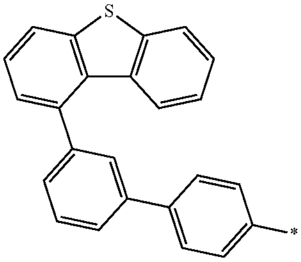 [SMILES: *c1ccc(-c2cccc(-c3cccc4sc5ccccc5c34)c2)cc1] | 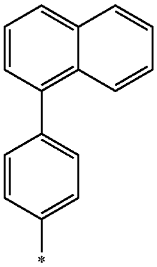 [SMILES: *c1ccc(-c2cccc3ccccc23)cc1] |
| E10 | 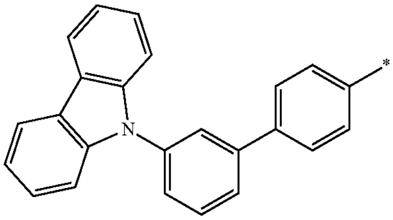 [SMILES: *c1ccc(-c2cccc(-n3c4ccccc4c4ccccc43)c2)cc1] | 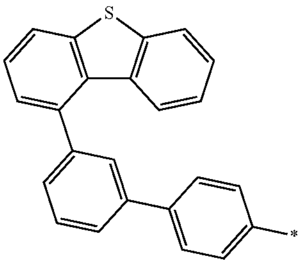 [SMILES: *c1ccc(-c2cccc(-c3cccc4sc5ccccc5c34)c2)cc1] | 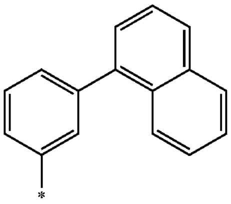 [SMILES: *c1cccc(-c2cccc3ccccc23)c1] |

-continued
| Compound Group 1 | | | |
|---|---|---|---|
| Formula 1 | $Ar_1$ | $Ar_2$ | $Ar_3$ |
| E11 | 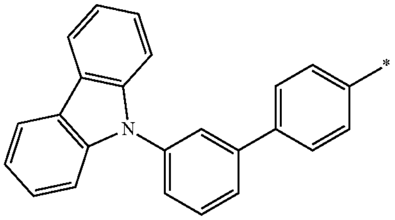 [SMILES: *c1ccc(-c2cccc(-n3c4ccccc4c4ccccc43)c2)cc1] | 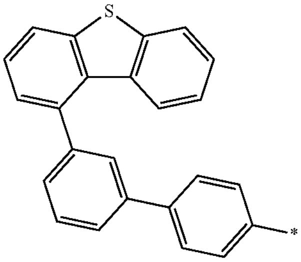 [SMILES: *c1ccc(-c2cccc(-c3cccc4sc5ccccc5c34)c2)cc1] | 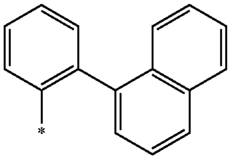 [SMILES: *c1ccccc1-c1cccc2ccccc12] |
| E12 | 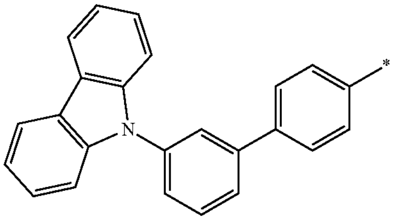 [SMILES: *c1ccc(-c2cccc(-n3c4ccccc4c4ccccc43)c2)cc1] | 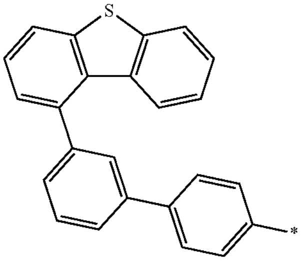 [SMILES: *c1ccc(-c2cccc(-c3cccc4sc5ccccc5c34)c2)cc1] | 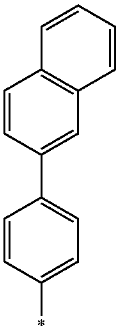 |
| E13 | 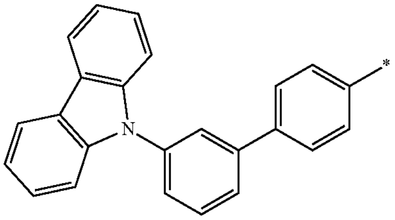 [SMILES: *c1ccc(-c2cccc(-n3c4ccccc4c4ccccc43)c2)cc1] | 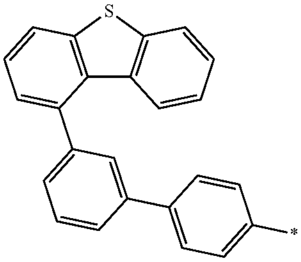 [SMILES: *c1ccc(-c2cccc(-c3cccc4sc5ccccc5c34)c2)cc1] | 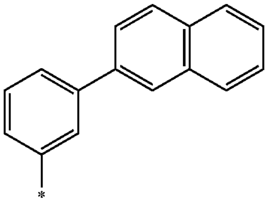 [SMILES: *c1cccc(-c2ccc3ccccc3c2)c1] |
| E14 | 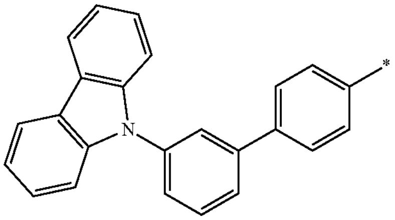 [SMILES: *c1ccc(-c2cccc(-n3c4ccccc4c4ccccc43)c2)cc1] | 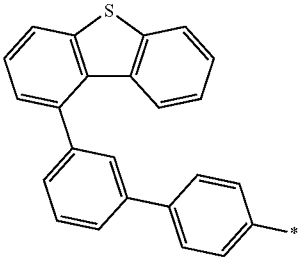 [SMILES: *c1ccc(-c2cccc(-c3cccc4sc5ccccc5c34)c2)cc1] | 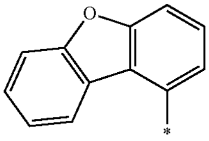 |
| E15 | 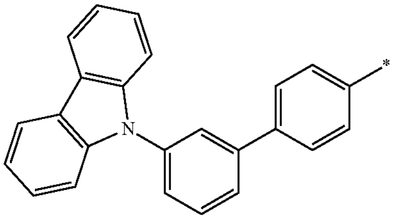 [SMILES: *c1ccc(-c2cccc(-n3c4ccccc4c4ccccc43)c2)cc1] | 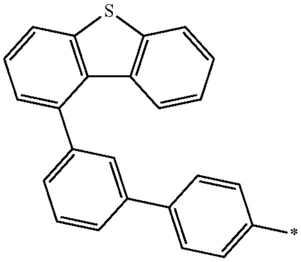 [SMILES: *c1ccc(-c2cccc(-c3cccc4sc5ccccc5c34)c2)cc1] | 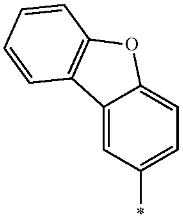 [SMILES: *c1ccc2oc3ccccc3c2c1] |

-continued
| Compound Group 1 | | | |
|---|---|---|---|
| Formula 1 | $Ar_1$ | $Ar_2$ | $Ar_3$ |
| E16 | 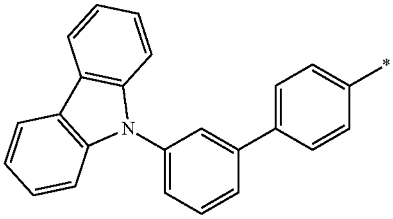 [SMILES: *c1ccc(-c2cccc(-n3c4ccccc4c4ccccc43)c2)cc1] | 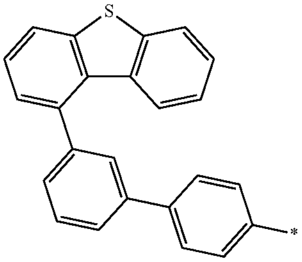 [SMILES: *c1ccc(-c2cccc(-c3cccc4sc5ccccc5c34)c2)cc1] | 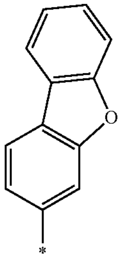 [SMILES: *c1ccc2c(c1)oc1ccccc12] |
| E17 | 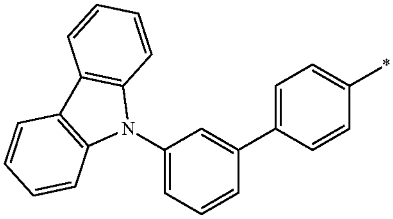 [SMILES: *c1ccc(-c2cccc(-n3c4ccccc4c4ccccc43)c2)cc1] | 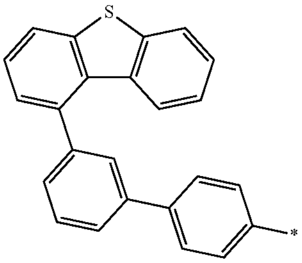 [SMILES: *c1ccc(-c2cccc(-c3cccc4sc5ccccc5c34)c2)cc1] | 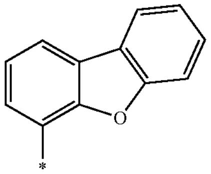 |
| E18 | 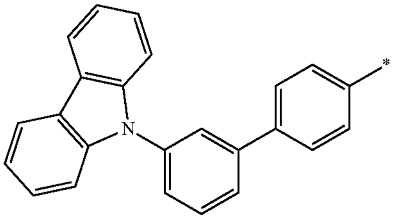 [SMILES: *c1ccc(-c2cccc(-n3c4ccccc4c4ccccc43)c2)cc1] | 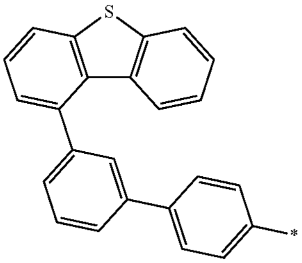 [SMILES: *c1ccc(-c2cccc(-c3cccc4sc5ccccc5c34)c2)cc1] | 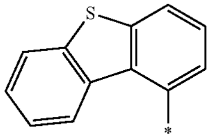 |
| E19 | 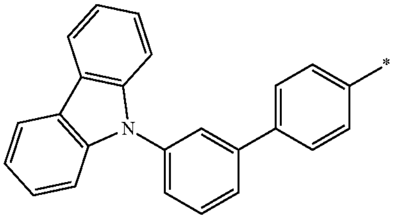 [SMILES: *c1ccc(-c2cccc(-n3c4ccccc4c4ccccc43)c2)cc1] | 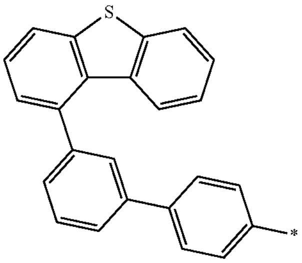 [SMILES: *c1ccc(-c2cccc(-c3cccc4sc5ccccc5c34)c2)cc1] | 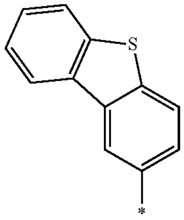 |
| E20 | 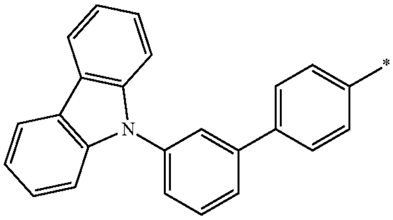 [SMILES: *c1ccc(-c2cccc(-n3c4ccccc4c4ccccc43)c2)cc1] | 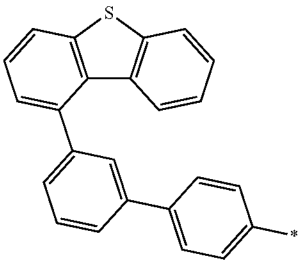 [SMILES: *c1ccc(-c2cccc(-c3cccc4sc5ccccc5c34)c2)cc1] | 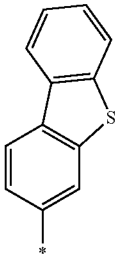 [SMILES: *c1ccc2c(c1)sc1ccccc12] |

-continued
| Compound Group 1 | | | |
|---|---|---|---|
| Formula 1 | $Ar_1$ | $Ar_2$ | $Ar_3$ |
| E21 | 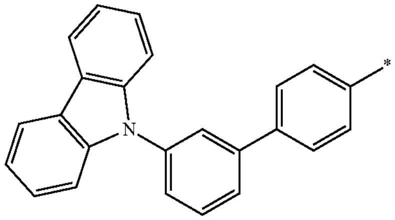 [SMILES: *c1ccc(-c2cccc(-n3c4ccccc4c4ccccc43)c2)cc1] | 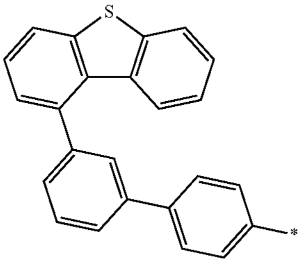 [SMILES: *c1ccc(-c2cccc(-c3cccc4sc5ccccc5c34)c2)cc1] | 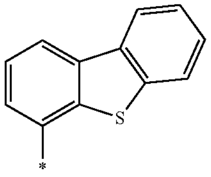 |
| E22 | 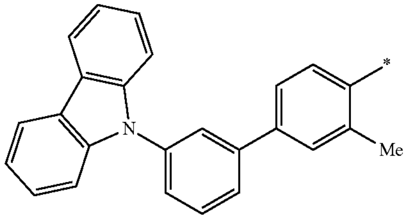 [SMILES: *c1ccc(-c2cccc(-n3c4ccccc4c4ccccc43)c2)cc1C] | 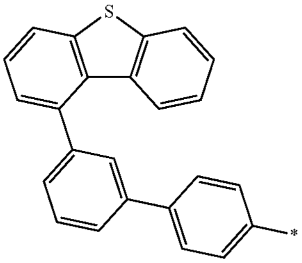 [SMILES: *c1ccc(-c2cccc(-c3cccc4sc5ccccc5c34)c2)cc1] | 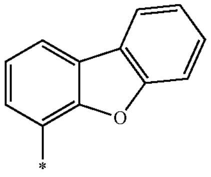 |
| E23 | 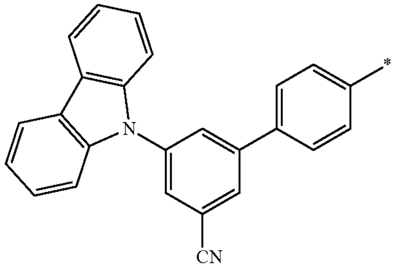 [SMILES: *c1ccc(-c2cc(C#N)cc(-n3c4ccccc4c4ccccc43)c2)cc1] | 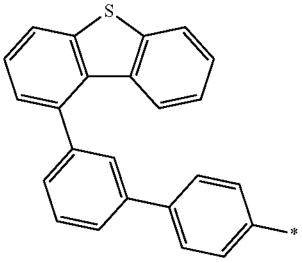 [SMILES: *c1ccc(-c2cccc(-c3cccc4sc5ccccc5c34)c2)cc1] | 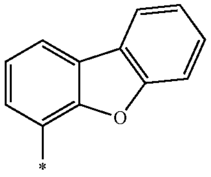 |
| F1 | 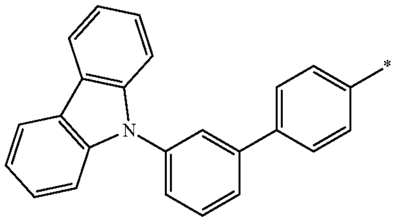 [SMILES: *c1ccc(-c2cccc(-n3c4ccccc4c4ccccc43)c2)cc1] | 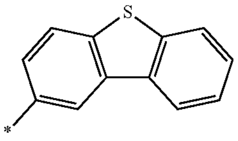 | 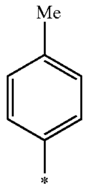 |
| F2 | 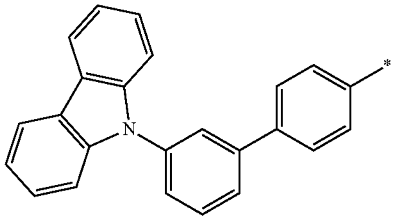 [SMILES: *c1ccc(-c2cccc(-n3c4ccccc4c4ccccc43)c2)cc1] | 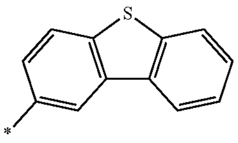 [SMILES: *c1ccc2sc3ccccc3c2c1] | 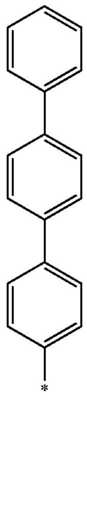 |

-continued
Compound Group 1
| Formula 1 | $Ar_1$ | $Ar_2$ | $Ar_3$ |
|---|---|---|---|
| F3 | 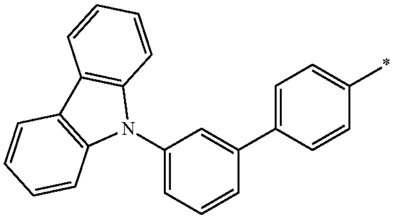 [SMILES: *c1ccc(-c2cccc(-n3c4ccccc4c4ccccc43)c2)cc1] | 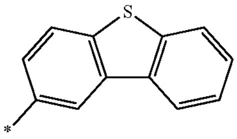 [SMILES: *c1ccc2sc3ccccc3c2c1] | 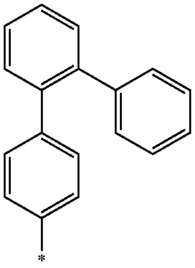 [SMILES: *c1ccc(-c2ccccc2-c2ccccc2)cc1] |
| F4 | 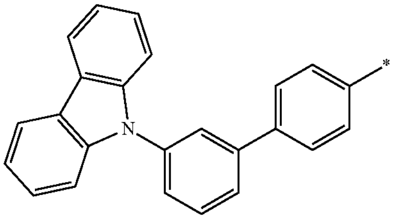 [SMILES: *c1ccc(-c2cccc(-n3c4ccccc4c4ccccc43)c2)cc1] | 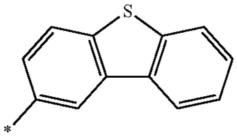 [SMILES: *c1ccc2sc3ccccc3c2c1] | 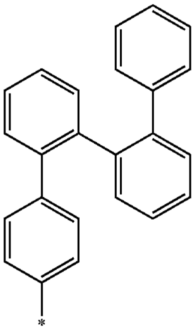 [SMILES: *c1ccc(-c2ccccc2-c2ccccc2-c2ccccc2)cc1] |
| F5 | 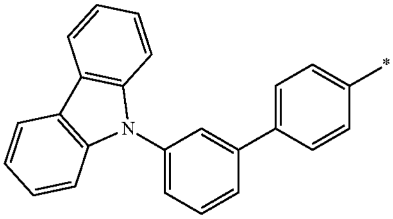 [SMILES: *c1ccc(-c2cccc(-n3c4ccccc4c4ccccc43)c2)cc1] | 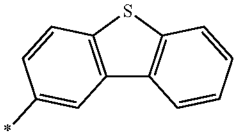 [SMILES: *c1ccc2sc3ccccc3c2c1] | 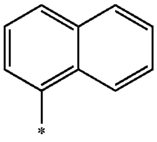 [SMILES: *c1cccc2ccccc12] |
| F6 | 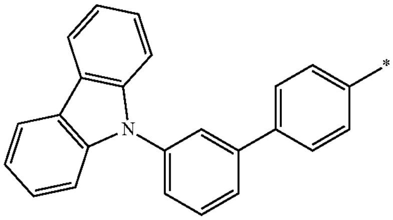 [SMILES: *c1ccc(-c2cccc(-n3c4ccccc4c4ccccc43)c2)cc1] | 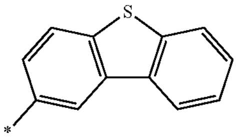 [SMILES: *c1ccc2sc3ccccc3c2c1] | 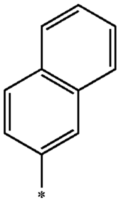 |
| F7 | 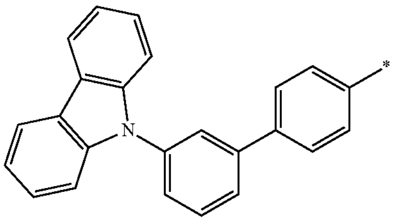 [SMILES: *c1ccc(-c2cccc(-n3c4ccccc4c4ccccc43)c2)cc1] | 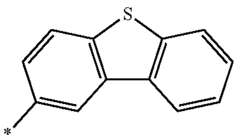 [SMILES: *c1ccc2sc3ccccc3c2c1] | 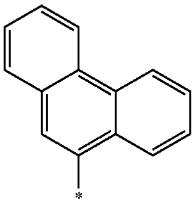 [SMILES: *c1cc2ccccc2c2ccccc12] |

-continued
| Compound Group 1 | | | |
|---|---|---|---|
| Formula 1 | $Ar_1$ | $Ar_2$ | $Ar_3$ |
| F8 | 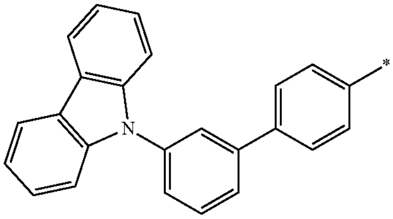 [SMILES: *c1ccc(-c2cccc(-n3c4ccccc4c4ccccc43)c2)cc1] | 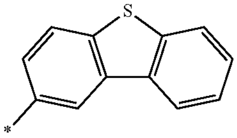 [SMILES: *c1ccc2sc3ccccc3c2c1] | 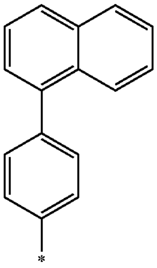 [SMILES: *c1ccc(-c2cccc3ccccc23)cc1] |
| F9 | 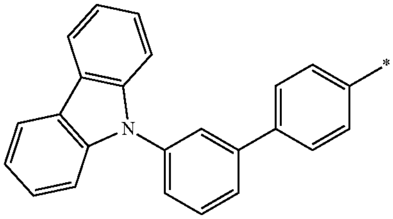 [SMILES: *c1ccc(-c2cccc(-n3c4ccccc4c4ccccc43)c2)cc1] | 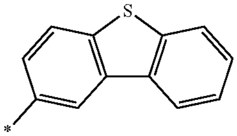 [SMILES: *c1ccc2sc3ccccc3c2c1] | 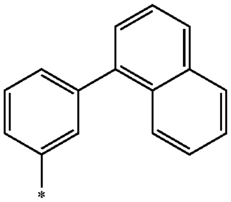 [SMILES: *c1cccc(-c2cccc3ccccc23)c1] |
| F10 | 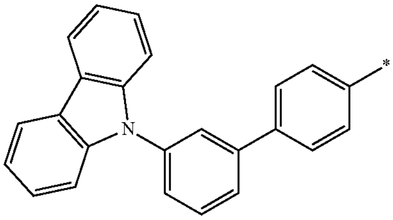 [SMILES: *c1ccc(-c2cccc(-n3c4ccccc4c4ccccc43)c2)cc1] | 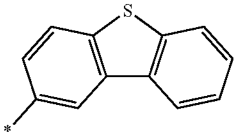 [SMILES: *c1ccc2sc3ccccc3c2c1] | 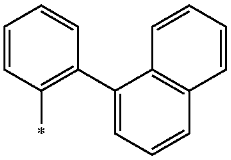 [SMILES: *c1ccccc1-c1cccc2ccccc12] |
| F11 | 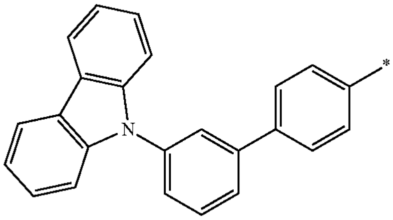 [SMILES: *c1ccc(-c2cccc(-n3c4ccccc4c4ccccc43)c2)cc1] | 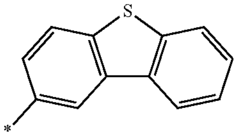 [SMILES: *c1ccc2sc3ccccc3c2c1] | 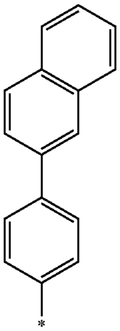 |
| F12 | 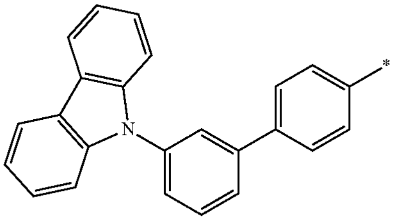 [SMILES: *c1ccc(-c2cccc(-n3c4ccccc4c4ccccc43)c2)cc1] | 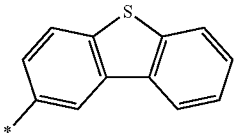 [SMILES: *c1ccc2sc3ccccc3c2c1] | 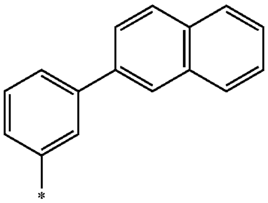 [SMILES: *c1cccc(-c2ccc3ccccc3c2)c1] |

-continued
| Compound Group 1 | | | |
|---|---|---|---|
| Formula 1 | $Ar_1$ | $Ar_2$ | $Ar_3$ |
| F13 | 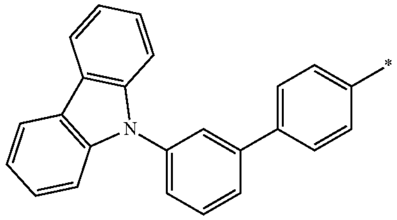 [SMILES: *c1ccc(-c2cccc(-n3c4ccccc4c4ccccc43)c2)cc1] | 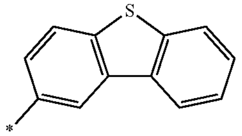 [SMILES: *c1ccc2sc3ccccc3c2c1] | 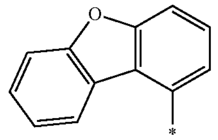 |
| F14 | 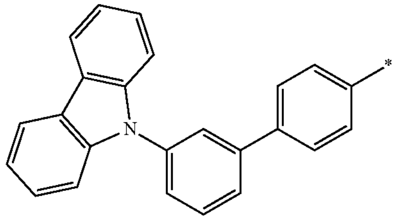 [SMILES: *c1ccc(-c2cccc(-n3c4ccccc4c4ccccc43)c2)cc1] | 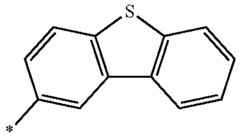 [SMILES: *c1ccc2sc3ccccc3c2c1] | 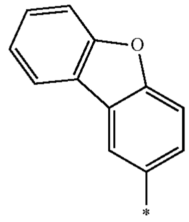 |
| F15 | 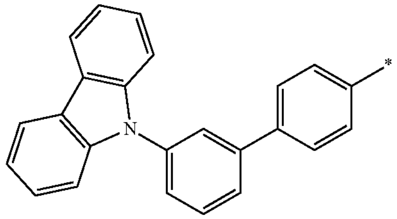 [SMILES: *c1ccc(-c2cccc(-n3c4ccccc4c4ccccc43)c2)cc1] | 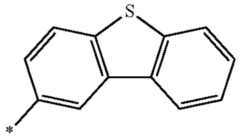 [SMILES: *c1ccc2sc3ccccc3c2c1] | 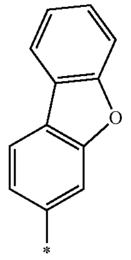 [SMILES: *c1ccc2c(c1)oc1ccccc12] |
| F16 | 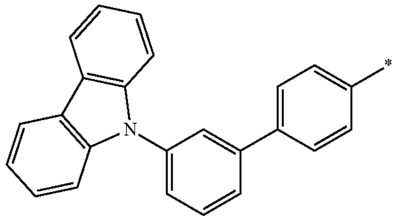 [SMILES: *c1ccc(-c2cccc(-n3c4ccccc4c4ccccc43)c2)cc1] | 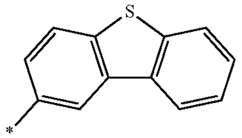 [SMILES: *c1ccc2sc3ccccc3c2c1] | 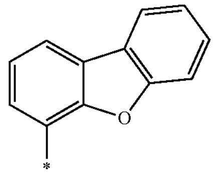 |
| F17 | 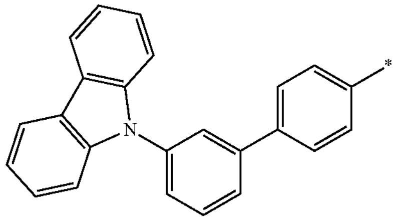 [SMILES: *c1ccc(-c2cccc(-n3c4ccccc4c4ccccc43)c2)cc1] | 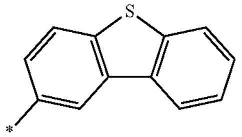 [SMILES: *c1ccc2sc3ccccc3c2c1] | 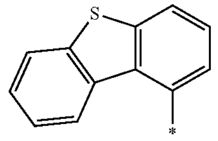 |
| F18 | 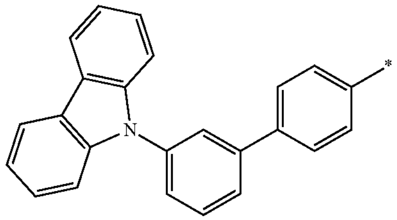 [SMILES: *c1ccc(-c2cccc(-n3c4ccccc4c4ccccc43)c2)cc1] | 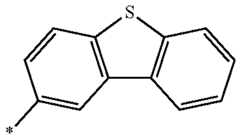 [SMILES: *c1ccc2sc3ccccc3c2c1] | 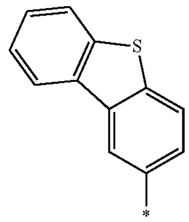 |

-continued
| Compound Group 1 | | | |
|---|---|---|---|
| Formula 1 | $Ar_1$ | $Ar_2$ | $Ar_3$ |
| F19 | 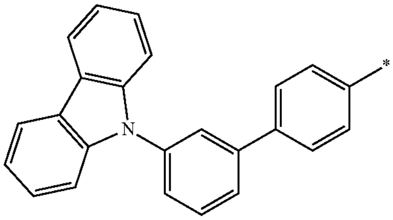 [SMILES: *c1ccc(-c2cccc(-n3c4ccccc4c4ccccc43)c2)cc1] | 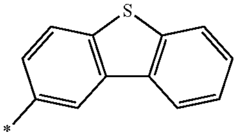 [SMILES: *c1ccc2sc3ccccc3c2c1] | 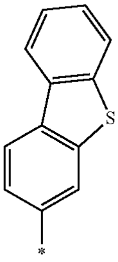 [SMILES: *c1ccc2c(c1)sc1ccccc12] |
| F20 | 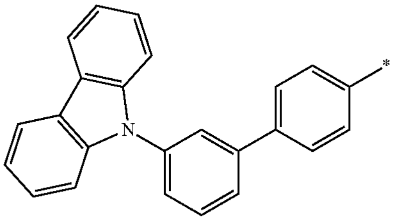 [SMILES: *c1ccc(-c2cccc(-n3c4ccccc4c4ccccc43)c2)cc1] | 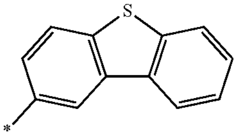 [SMILES: *c1ccc2sc3ccccc3c2c1] | 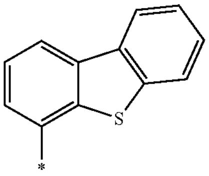 |
| F21 | 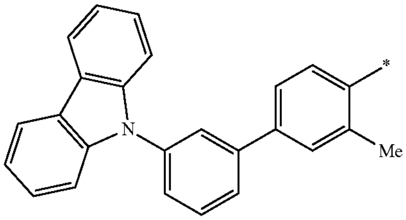 [SMILES: *c1ccc(-c2cccc(-n3c4ccccc4c4ccccc43)c2)cc1C] | 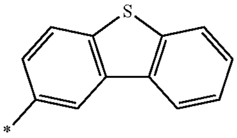 [SMILES: *c1ccc2sc3ccccc3c2c1] | 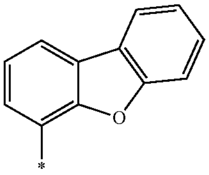 |
| F22 | 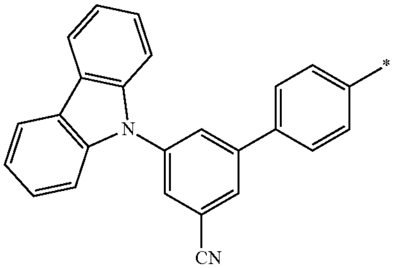 [SMILES: *c1ccc(-c2cc(C#N)cc(-n3c4ccccc4c4ccccc43)c2)cc1] | 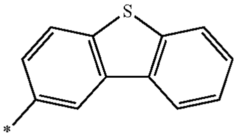 [SMILES: *c1ccc2sc3ccccc3c2c1] | 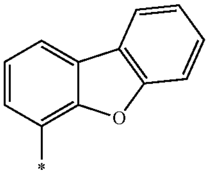 |
| G1 | 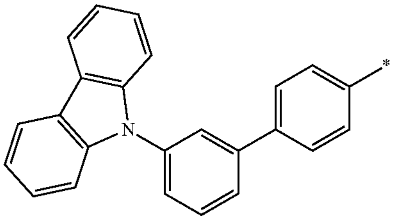 [SMILES: *c1ccc(-c2cccc(-n3c4ccccc4c4ccccc43)c2)cc1] | 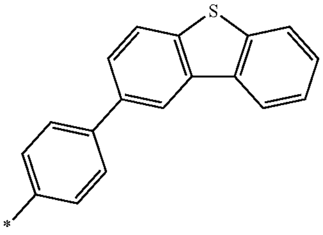 [SMILES: *c1ccc(-c2ccc3sc4ccccc4c3c2)cc1] | 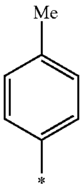 |
| G3 | 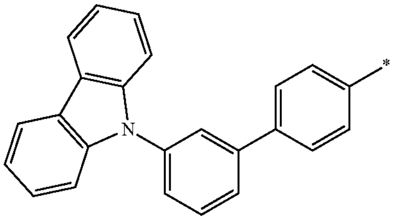 [SMILES: *c1ccc(-c2cccc(-n3c4ccccc4c4ccccc43)c2)cc1] | 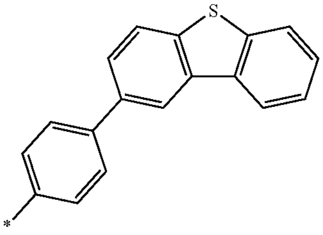 [SMILES: *c1ccc(-c2ccc3sc4ccccc4c3c2)cc1] | 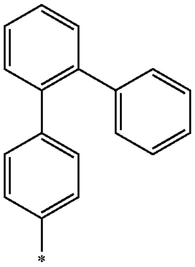 [SMILES: *c1ccc(-c2ccccc2-c2ccccc2)cc1] |

-continued
| Compound Group 1 | | | |
|---|---|---|---|
| Formula 1 | $Ar_1$ | $Ar_2$ | $Ar_3$ |
| G4 | 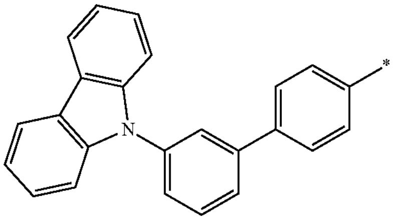 [SMILES: *c1ccc(-c2cccc(-n3c4ccccc4c4ccccc43)c2)cc1] | 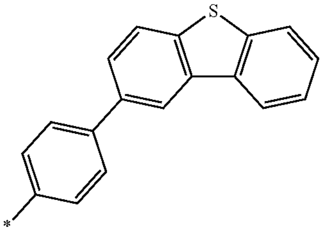 [SMILES: *c1ccc(-c2ccc3sc4ccccc4c3c2)cc1] | 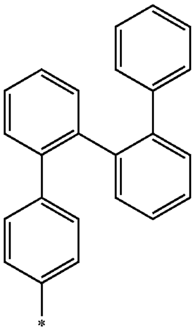 [SMILES: *c1ccc(-c2ccccc2-c2ccccc2-c2ccccc2)cc1] |
| G5 | 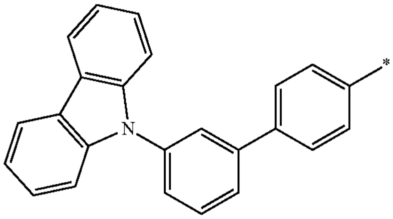 [SMILES: *c1ccc(-c2cccc(-n3c4ccccc4c4ccccc43)c2)cc1] | 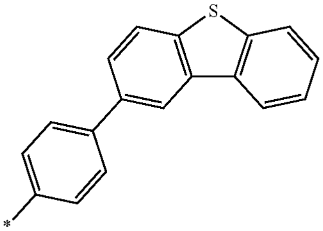 [SMILES: *c1ccc(-c2ccc3sc4ccccc4c3c2)cc1] | 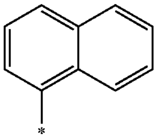 [SMILES: *c1cccc2ccccc12] |
| G6 | 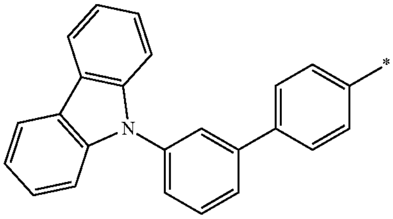 [SMILES: *c1ccc(-c2cccc(-n3c4ccccc4c4ccccc43)c2)cc1] | 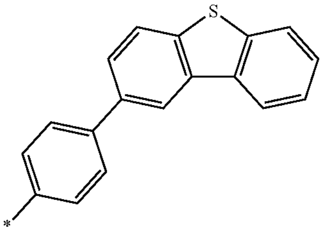 [SMILES: *c1ccc(-c2ccc3sc4ccccc4c3c2)cc1] | 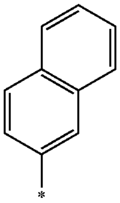 |
| G7 | 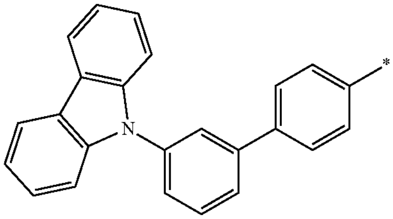 [SMILES: *c1ccc(-c2cccc(-n3c4ccccc4c4ccccc43)c2)cc1] | 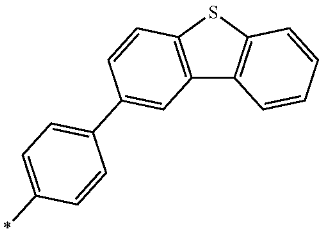 [SMILES: *c1ccc(-c2ccc3sc4ccccc4c3c2)cc1] | 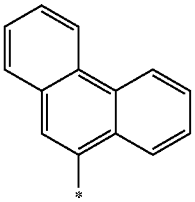 [SMILES: *c1cc2ccccc2c2ccccc12] |
| G9 | 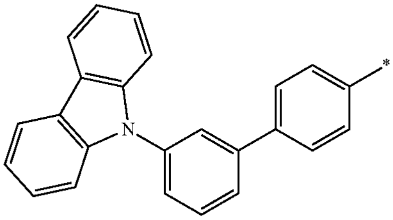 [SMILES: *c1ccc(-c2cccc(-n3c4ccccc4c4ccccc43)c2)cc1] | 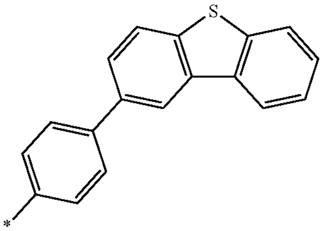 [SMILES: *c1ccc(-c2ccc3sc4ccccc4c3c2)cc1] | 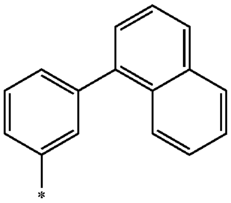 [SMILES: *c1cccc(-c2cccc3ccccc23)c1] |

-continued
| Compound Group 1 | | | |
|---|---|---|---|
| Formula 1 | $Ar_1$ | $Ar_2$ | $Ar_3$ |
| G10 | 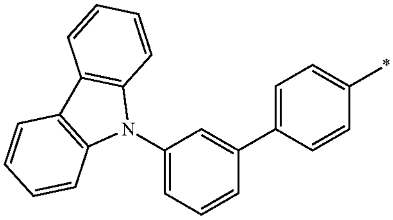 [SMILES: *c1ccc(-c2cccc(-n3c4ccccc4c4ccccc43)c2)cc1] | 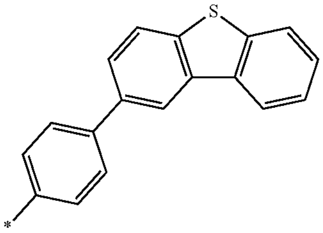 [SMILES: *c1ccc(-c2ccc3sc4ccccc4c3c2)cc1] | 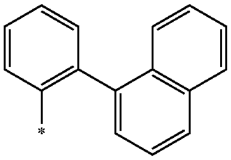 [SMILES: *c1ccccc1-c1cccc2ccccc12] |
| G11 | 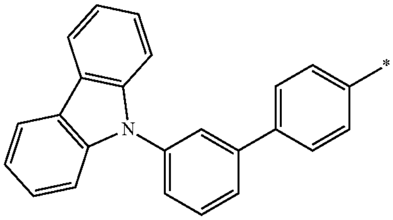 [SMILES: *c1ccc(-c2cccc(-n3c4ccccc4c4ccccc43)c2)cc1] | 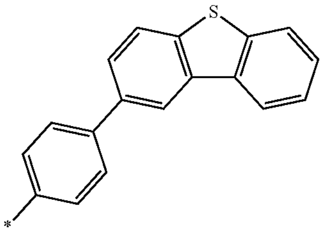 [SMILES: *c1ccc(-c2ccc3sc4ccccc4c3c2)cc1] | 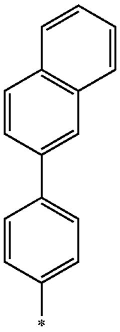 |
| G12 | 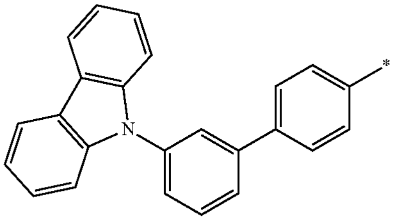 [SMILES: *c1ccc(-c2cccc(-n3c4ccccc4c4ccccc43)c2)cc1] | 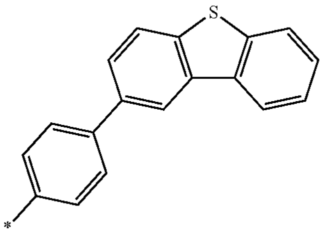 [SMILES: *c1ccc(-c2ccc3sc4ccccc4c3c2)cc1] | 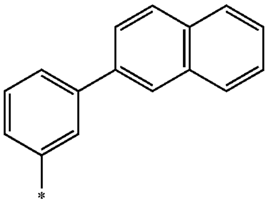 [SMILES: *c1cccc(-c2ccc3ccccc3c2)c1] |
| G13 | 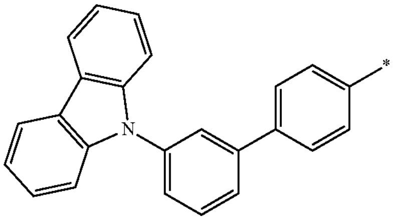 [SMILES: *c1ccc(-c2cccc(-n3c4ccccc4c4ccccc43)c2)cc1] | 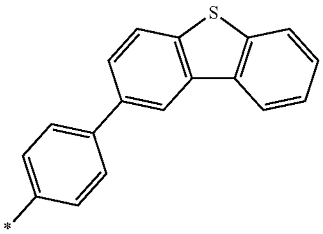 [SMILES: *c1ccc(-c2ccc3sc4ccccc4c3c2)cc1] | 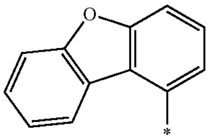 |
| G14 | 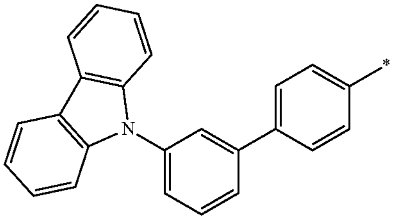 [SMILES: *c1ccc(-c2cccc(-n3c4ccccc4c4ccccc43)c2)cc1] | 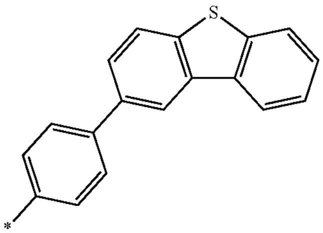 [SMILES: *c1ccc(-c2ccc3sc4ccccc4c3c2)cc1] | 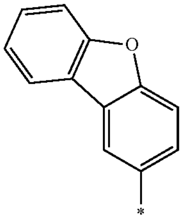 |

-continued
Compound Group 1
| Formula 1 | $Ar_1$ | $Ar_2$ | $Ar_3$ |
|---|---|---|---|
| G15 | 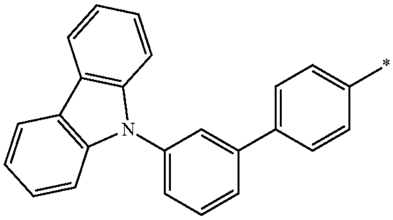 [SMILES: *c1ccc(-c2cccc(-n3c4ccccc4c4ccccc43)c2)cc1] | 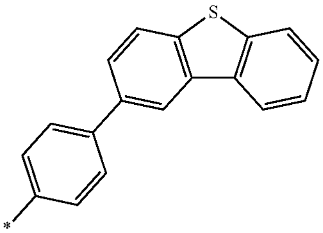 [SMILES: *c1ccc(-c2ccc3sc4ccccc4c3c2)cc1] | 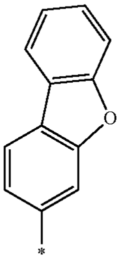 [SMILES: *c1ccc2c(c1)oc1ccccc12] |
| G16 | 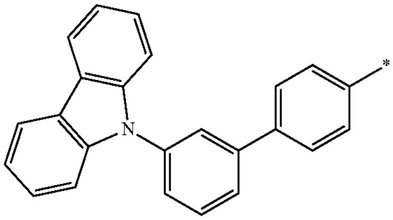 [SMILES: *c1ccc(-c2cccc(-n3c4ccccc4c4ccccc43)c2)cc1] | 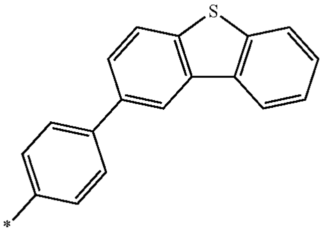 [SMILES: *c1ccc(-c2ccc3sc4ccccc4c3c2)cc1] | 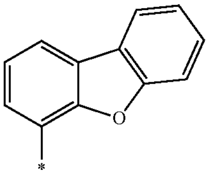 |
| G17 | 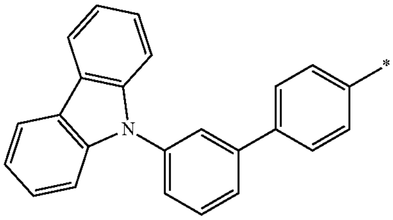 [SMILES: *c1ccc(-c2cccc(-n3c4ccccc4c4ccccc43)c2)cc1] | 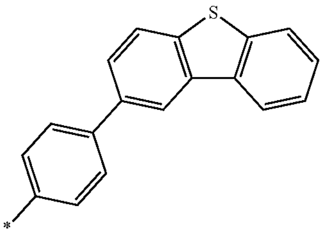 [SMILES: *c1ccc(-c2ccc3sc4ccccc4c3c2)cc1] | 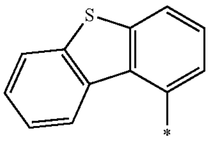 |
| G18 | 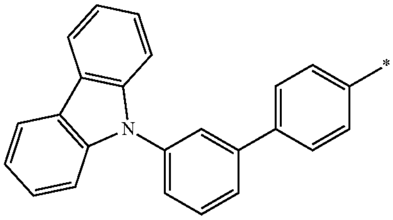 [SMILES: *c1ccc(-c2cccc(-n3c4ccccc4c4ccccc43)c2)cc1] | 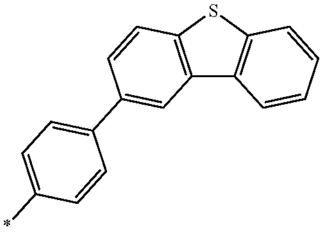 [SMILES: *c1ccc(-c2ccc3sc4ccccc4c3c2)cc1] | 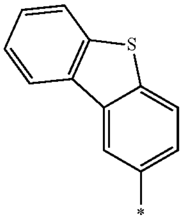 |
| G19 | 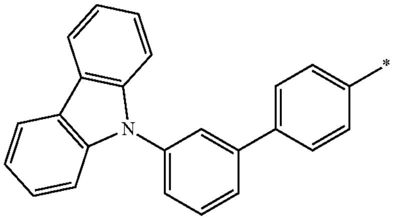 [SMILES: *c1ccc(-c2cccc(-n3c4ccccc4c4ccccc43)c2)cc1] | 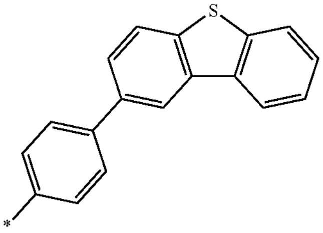 [SMILES: *c1ccc(-c2ccc3sc4ccccc4c3c2)cc1] | 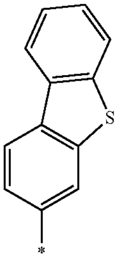 [SMILES: *c1ccc2c(c1)sc1ccccc12] |
| G20 | 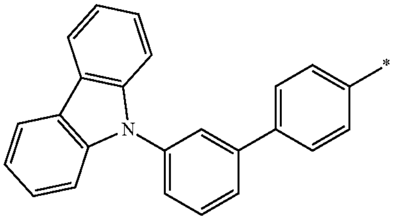 [SMILES: *c1ccc(-c2cccc(-n3c4ccccc4c4ccccc43)c2)cc1] | 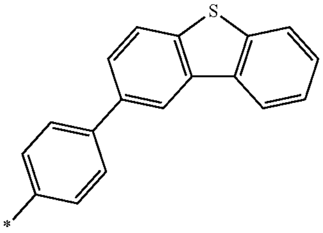 [SMILES: *c1ccc(-c2ccc3sc4ccccc4c3c2)cc1] | 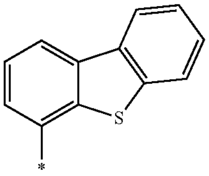 |

-continued
Compound Group 1
| Formula 1 | $Ar_1$ | $Ar_2$ | $Ar_3$ |
| --- | --- | --- | --- |
| G21 | 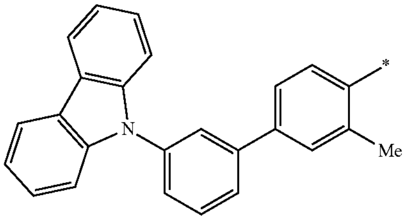 [SMILES: *c1ccc(-c2cccc(-n3c4ccccc4c4ccccc43)c2)cc1C] | 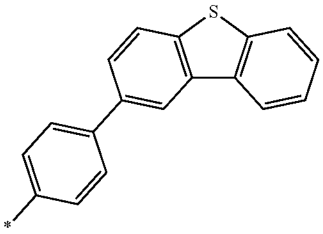 [SMILES: *c1ccc(-c2ccc3sc4ccccc4c3c2)cc1] | 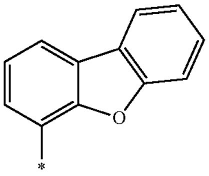 |
| G22 | 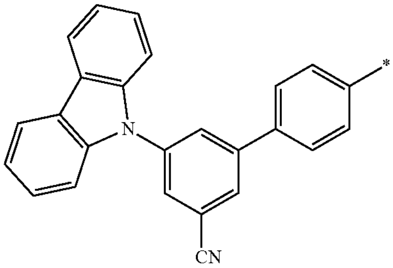 [SMILES: *c1ccc(-c2cc(C#N)cc(-n3c4ccccc4c4ccccc43)c2)cc1] | 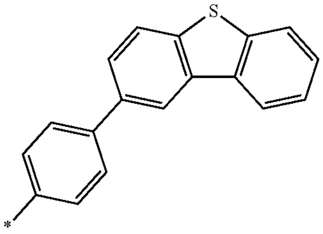 [SMILES: *c1ccc(-c2ccc3sc4ccccc4c3c2)cc1] | 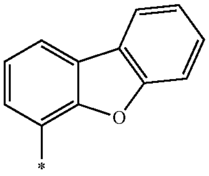 |
| H2 | 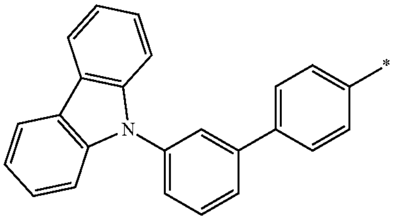 [SMILES: *c1ccc(-c2cccc(-n3c4ccccc4c4ccccc43)c2)cc1] | 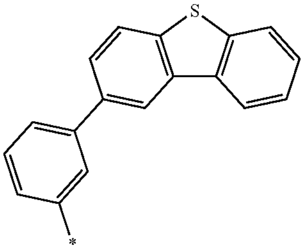 [SMILES: *c1cccc(-c2ccc3sc4ccccc4c3c2)c1] | 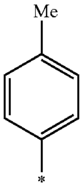 |
| H4 | 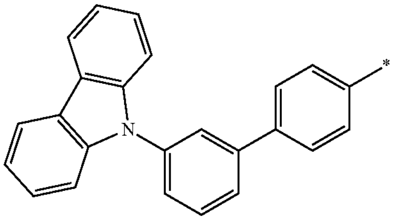 [SMILES: *c1ccc(-c2cccc(-n3c4ccccc4c4ccccc43)c2)cc1] | 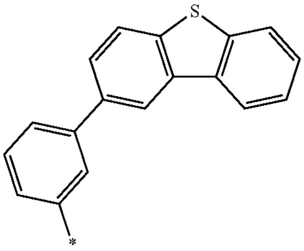 [SMILES: *c1cccc(-c2ccc3sc4ccccc4c3c2)c1] | 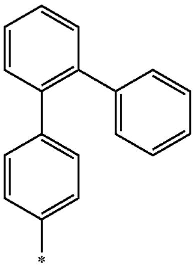 [SMILES: *c1ccc(-c2ccccc2-c2ccccc2)cc1] |
| H5 | 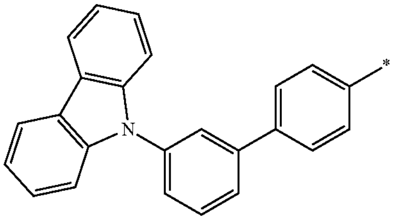 [SMILES: *c1ccc(-c2cccc(-n3c4ccccc4c4ccccc43)c2)cc1] | 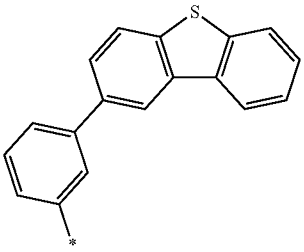 [SMILES: *c1cccc(-c2ccc3sc4ccccc4c3c2)c1] | 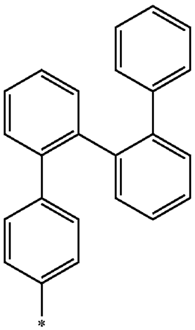 [SMILES: *c1ccc(-c2ccccc2-c2ccccc2-c2ccccc2)cc1] |

-continued
| Compound Group 1 | | | |
|---|---|---|---|
| Formula 1 | $Ar_1$ | $Ar_2$ | $Ar_3$ |
| H6 | 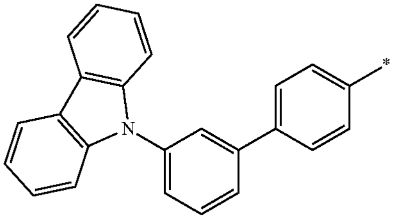 [SMILES: *c1ccc(-c2cccc(-n3c4ccccc4c4ccccc43)c2)cc1] | 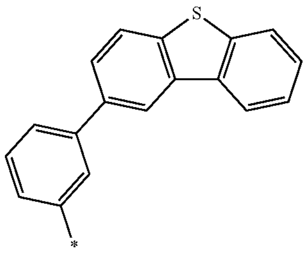 [SMILES: *c1cccc(-c2ccc3sc4ccccc4c3c2)c1] | 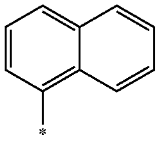 [SMILES: *c1cccc2ccccc12] |
| H7 | 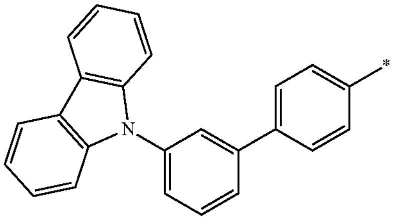 [SMILES: *c1ccc(-c2cccc(-n3c4ccccc4c4ccccc43)c2)cc1] | 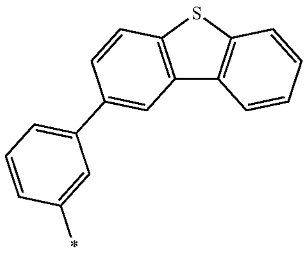 [SMILES: *c1cccc(-c2ccc3sc4ccccc4c3c2)c1] | 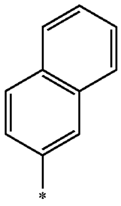 |
| H8 | 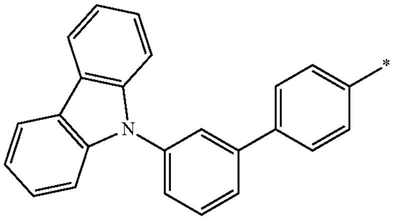 [SMILES: *c1ccc(-c2cccc(-n3c4ccccc4c4ccccc43)c2)cc1] | 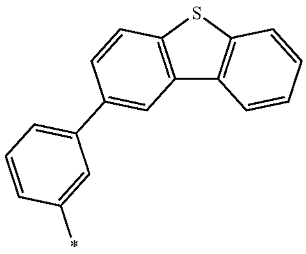 [SMILES: *c1cccc(-c2ccc3sc4ccccc4c3c2)c1] | 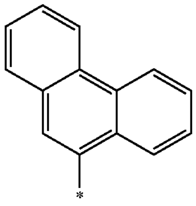 [SMILES: *c1cc2ccccc2c2ccccc12] |
| H10 | 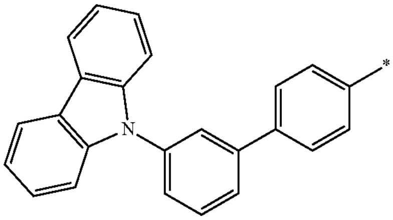 [SMILES: *c1ccc(-c2cccc(-n3c4ccccc4c4ccccc43)c2)cc1] | 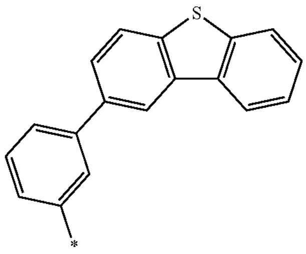 [SMILES: *c1cccc(-c2ccc3sc4ccccc4c3c2)c1] | 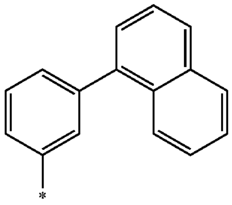 [SMILES: *c1cccc(-c2cccc3ccccc23)c1] |
| H11 | 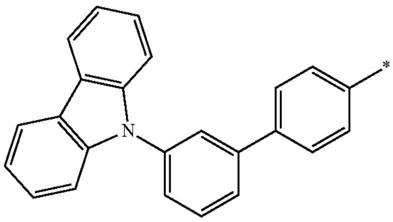 [SMILES: *c1ccc(-c2cccc(-n3c4ccccc4c4ccccc43)c2)cc1] | 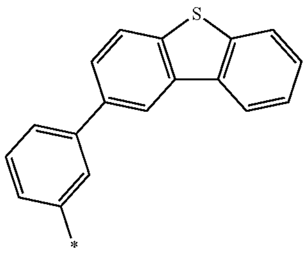 [SMILES: *c1cccc(-c2ccc3sc4ccccc4c3c2)c1] | 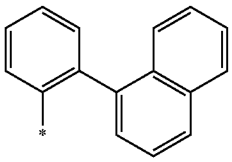 [SMILES: *c1ccccc1-c1cccc2ccccc12] |

-continued
| Compound Group 1 | | | |
|---|---|---|---|
| Formula 1 | $Ar_1$ | $Ar_2$ | $Ar_3$ |
| H13 | 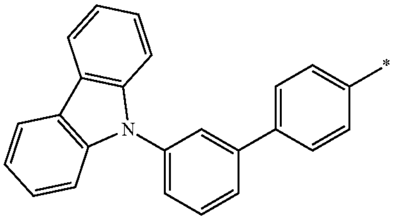 [SMILES: *c1ccc(-c2cccc(-n3c4ccccc4c4ccccc43)c2)cc1] | 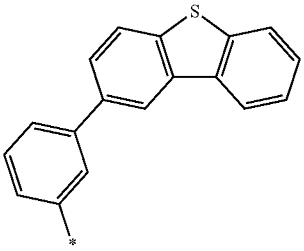 [SMILES: *c1cccc(-c2ccc3sc4ccccc4c3c2)c1] | 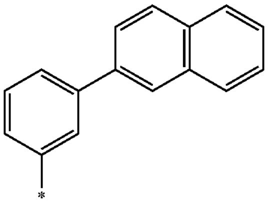 [SMILES: *c1cccc(-c2ccc3ccccc3c2)c1] |
| H14 | 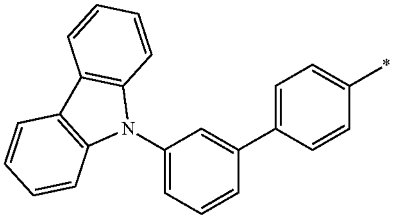 [SMILES: *c1ccc(-c2cccc(-n3c4ccccc4c4ccccc43)c2)cc1] | 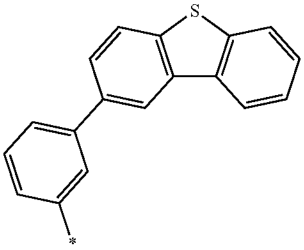 [SMILES: *c1cccc(-c2ccc3sc4ccccc4c3c2)c1] | 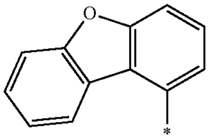 |
| H15 | 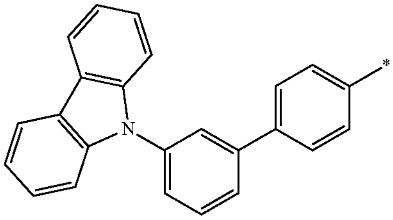 [SMILES: *c1ccc(-c2cccc(-n3c4ccccc4c4ccccc43)c2)cc1] | 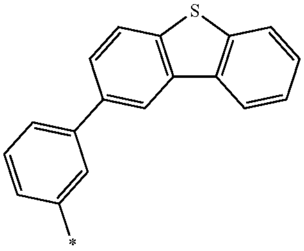 [SMILES: *c1cccc(-c2ccc3sc4ccccc4c3c2)c1] | 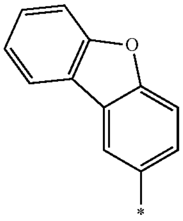 |
| H16 | 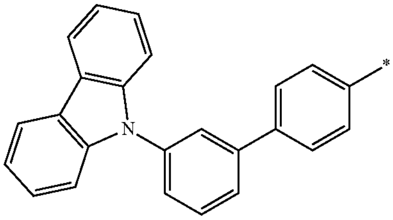 [SMILES: *c1ccc(-c2cccc(-n3c4ccccc4c4ccccc43)c2)cc1] | 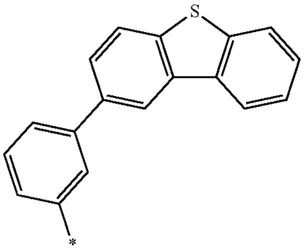 [SMILES: *c1cccc(-c2ccc3sc4ccccc4c3c2)c1] | 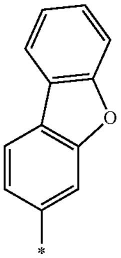 [SMILES: *c1ccc2c(c1)oc1ccccc12] |
| H17 | 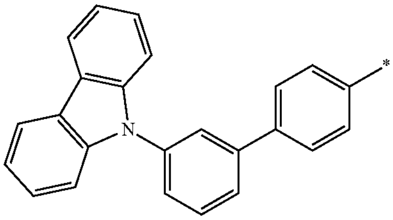 [SMILES: *c1ccc(-c2cccc(-n3c4ccccc4c4ccccc43)c2)cc1] | 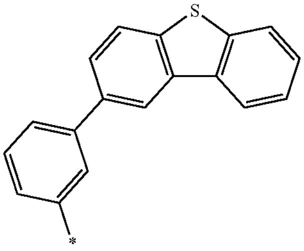 [SMILES: *c1cccc(-c2ccc3sc4ccccc4c3c2)c1] | 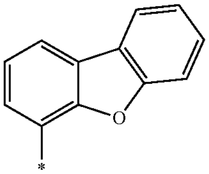 |

-continued
| Compound Group 1 | | | |
|---|---|---|---|
| Formula 1 | $Ar_1$ | $Ar_2$ | $Ar_3$ |
| H18 | 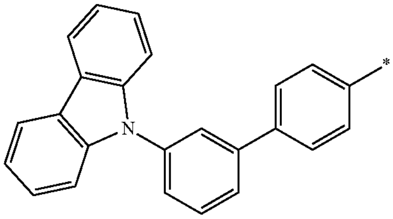 [SMILES: *c1ccc(-c2cccc(-n3c4ccccc4c4ccccc43)c2)cc1] | 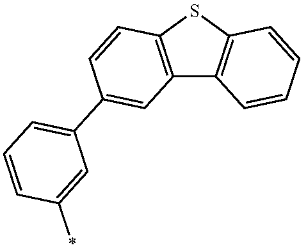 [SMILES: *c1cccc(-c2ccc3sc4ccccc4c3c2)c1] | 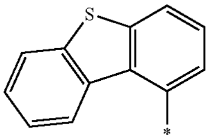 |
| H19 | 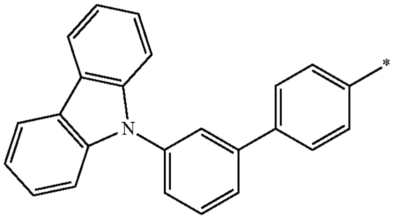 [SMILES: *c1ccc(-c2cccc(-n3c4ccccc4c4ccccc43)c2)cc1] | 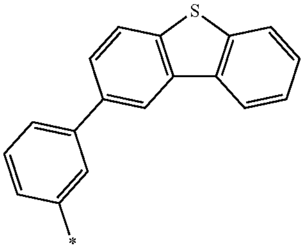 [SMILES: *c1cccc(-c2ccc3sc4ccccc4c3c2)c1] | 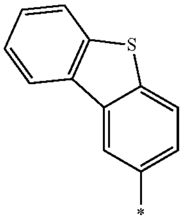 |
| H20 | 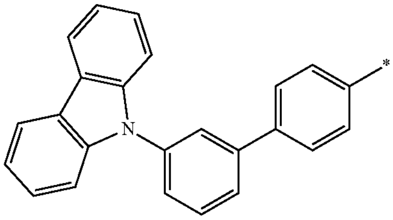 [SMILES: *c1ccc(-c2cccc(-n3c4ccccc4c4ccccc43)c2)cc1] | 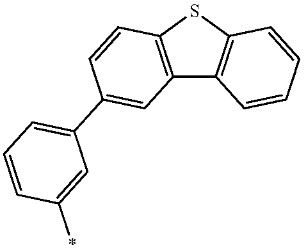 [SMILES: *c1cccc(-c2ccc3sc4ccccc4c3c2)c1] | 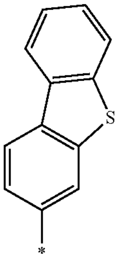 [SMILES: *c1ccc2c(c1)sc1ccccc12] |
| H21 | 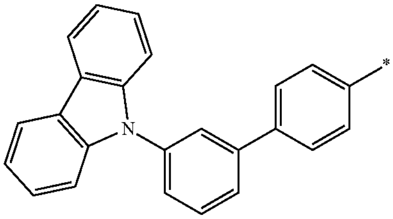 [SMILES: *c1ccc(-c2cccc(-n3c4ccccc4c4ccccc43)c2)cc1] | 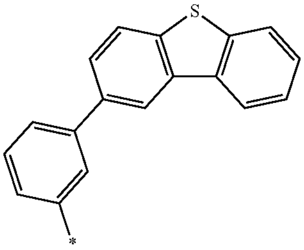 [SMILES: *c1cccc(-c2ccc3sc4ccccc4c3c2)c1] | 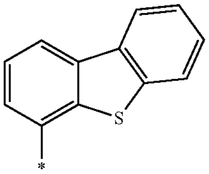 |
| H22 | 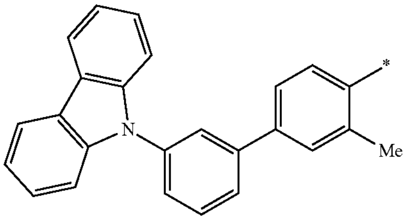 [SMILES: *c1ccc(-c2cccc(-n3c4ccccc4c4ccccc43)c2)cc1C] | 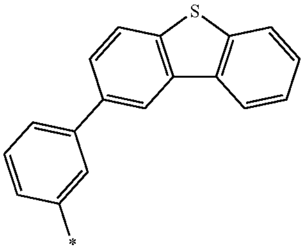 [SMILES: *c1cccc(-c2ccc3sc4ccccc4c3c2)c1] | 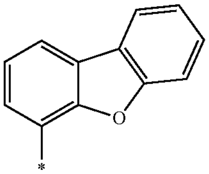 |

-continued
Compound Group 1
| Formula 1 | $Ar_1$ | $Ar_2$ | $Ar_3$ |
|---|---|---|---|
| H23 | 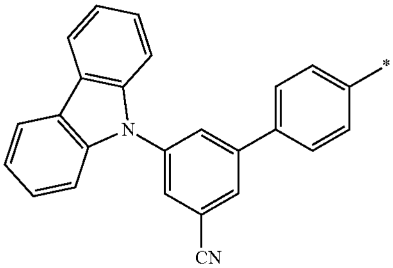 [SMILES: *c1ccc(-c2cc(C#N)cc(-n3c4ccccc4c4ccccc43)c2)cc1] | 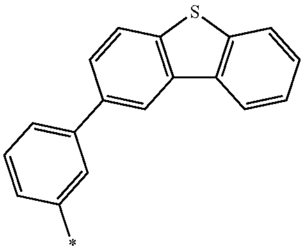 [SMILES: *c1cccc(-c2ccc3sc4ccccc4c3c2)c1] | 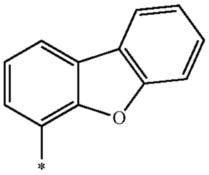 |
| I1 | 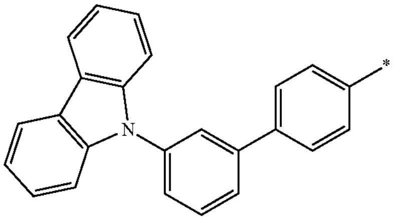 [SMILES: *c1ccc(-c2cccc(-n3c4ccccc4c4ccccc43)c2)cc1] | 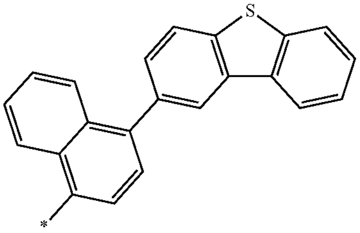 [SMILES: *c1ccc(-c2ccc3sc4ccccc4c3c2)c2ccccc12] | 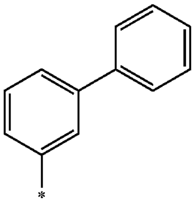 [SMILES: *c1cccc(-c2ccccc2)c1] |
| I2 | 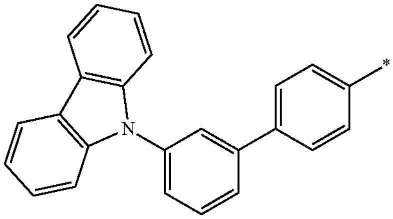 [SMILES: *c1ccc(-c2cccc(-n3c4ccccc4c4ccccc43)c2)cc1] | 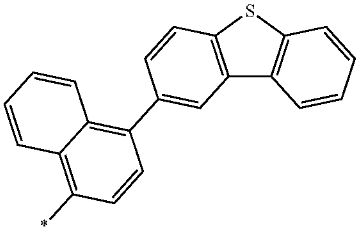 [SMILES: *c1ccc(-c2ccc3sc4ccccc4c3c2)c2ccccc12] | 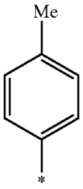 |
| I3 | 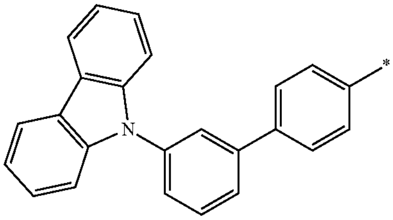 [SMILES: *c1ccc(-c2cccc(-n3c4ccccc4c4ccccc43)c2)cc1] | 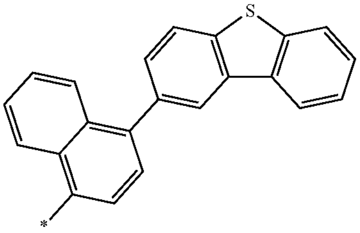 [SMILES: *c1ccc(-c2ccc3sc4ccccc4c3c2)c2ccccc12] | 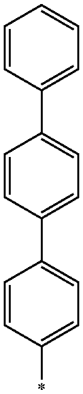 |
| I4 | 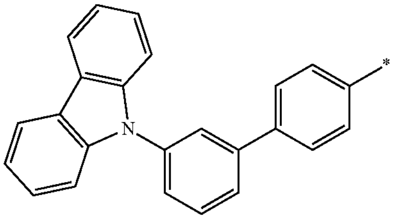 [SMILES: *c1ccc(-c2cccc(-n3c4ccccc4c4ccccc43)c2)cc1] | 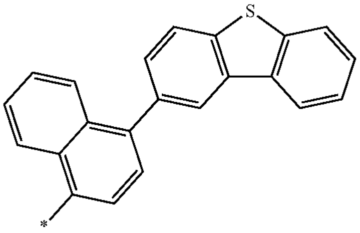 [SMILES: *c1ccc(-c2ccc3sc4ccccc4c3c2)c2ccccc12] | 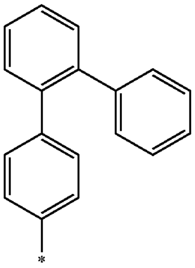 [SMILES: *c1ccc(-c2ccccc2-c2ccccc2)cc1] |

-continued
Compound Group 1
| Formula 1 | $Ar_1$ | $Ar_2$ | $Ar_3$ |
|---|---|---|---|
| I5 | 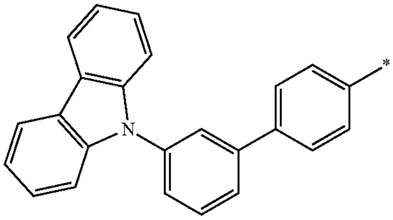 [SMILES: *c1ccc(-c2cccc(-n3c4ccccc4c4ccccc43)c2)cc1] | 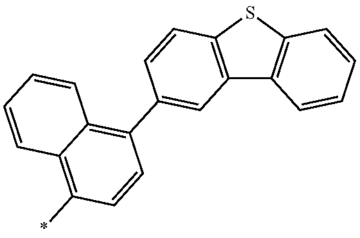 [SMILES: *c1ccc(-c2ccc3sc4ccccc4c3c2)c2ccccc12] | 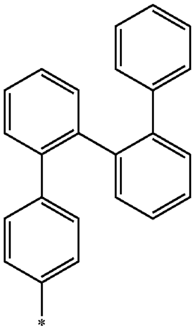 [SMILES: *c1ccc(-c2ccccc2-c2ccccc2-c2ccccc2)cc1] |
| I6 | 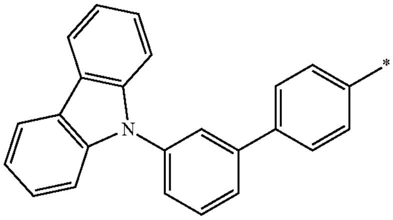 [SMILES: *c1ccc(-c2cccc(-n3c4ccccc4c4ccccc43)c2)cc1] | 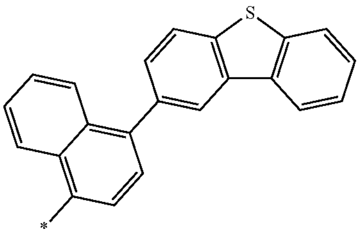 [SMILES: *c1ccc(-c2ccc3sc4ccccc4c3c2)c2ccccc12] | 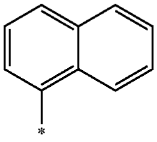 [SMILES: *c1cccc2ccccc12] |
| I7 | 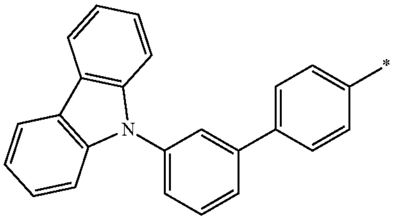 [SMILES: *c1ccc(-c2cccc(-n3c4ccccc4c4ccccc43)c2)cc1] | 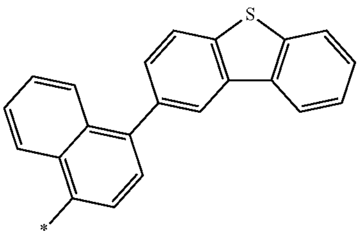 [SMILES: *c1ccc(-c2ccc3sc4ccccc4c3c2)c2ccccc12] | 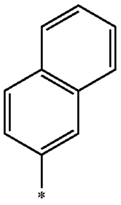 |
| I8 | 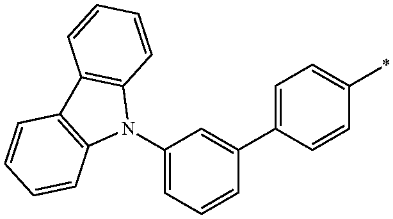 [SMILES: *c1ccc(-c2cccc(-n3c4ccccc4c4ccccc43)c2)cc1] | 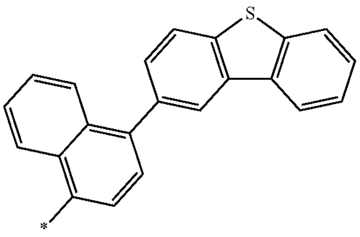 [SMILES: *c1ccc(-c2ccc3sc4ccccc4c3c2)c2ccccc12] | 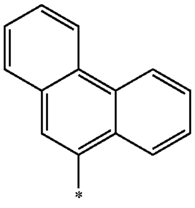 [SMILES: *c1cc2ccccc2c2ccccc12] |
| I9 | 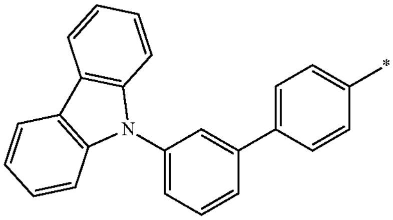 [SMILES: *c1ccc(-c2cccc(-n3c4ccccc4c4ccccc43)c2)cc1] | 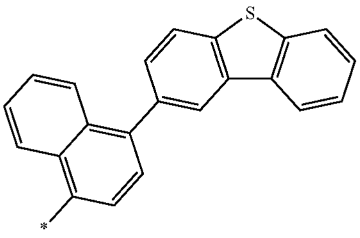 [SMILES: *c1ccc(-c2ccc3sc4ccccc4c3c2)c2ccccc12] | 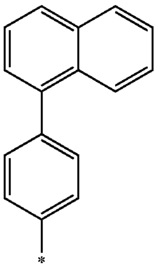 [SMILES: *c1ccc(-c2cccc3ccccc23)cc1] |

-continued
Compound Group 1
| Formula 1 | $Ar_1$ | $Ar_2$ | $Ar_3$ |
| --- | --- | --- | --- |
| I10 | 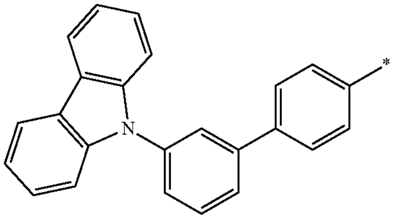 [SMILES: *c1ccc(-c2cccc(-n3c4ccccc4c4ccccc43)c2)cc1] | 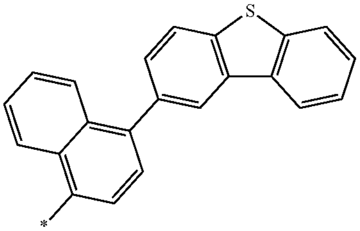 [SMILES: *c1ccc(-c2ccc3sc4ccccc4c3c2)c2ccccc12] | 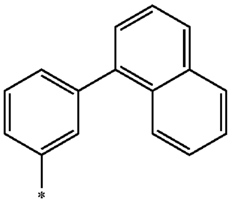 [SMILES: *c1cccc(-c2cccc3ccccc23)c1] |
| I11 | 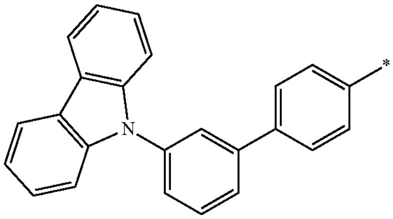 [SMILES: *c1ccc(-c2cccc(-n3c4ccccc4c4ccccc43)c2)cc1] | 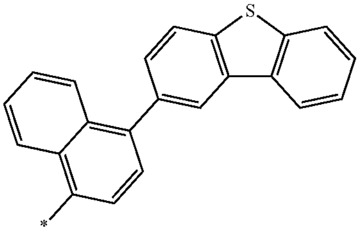 [SMILES: *c1ccc(-c2ccc3sc4ccccc4c3c2)c2ccccc12] | 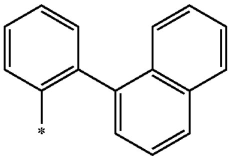 [SMILES: *c1ccccc1-c1cccc2ccccc12] |
| I12 | 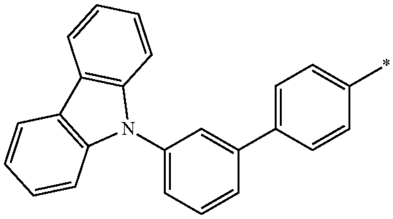 [SMILES: *c1ccc(-c2cccc(-n3c4ccccc4c4ccccc43)c2)cc1] | 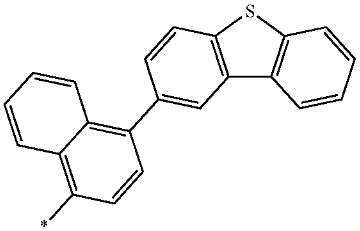 [SMILES: *c1ccc(-c2ccc3sc4ccccc4c3c2)c2ccccc12] | 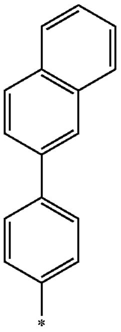 |
| I13 | 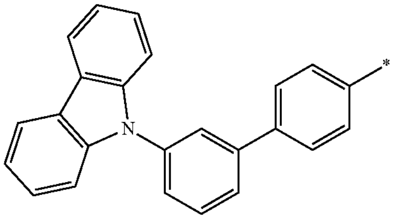 [SMILES: *c1ccc(-c2cccc(-n3c4ccccc4c4ccccc43)c2)cc1] | 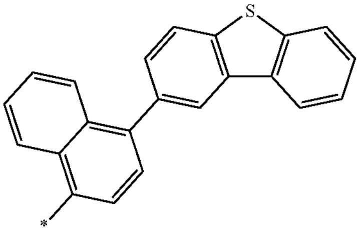 [SMILES: *c1ccc(-c2ccc3sc4ccccc4c3c2)c2ccccc12] | 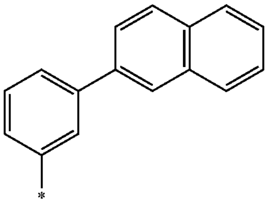 [SMILES: *c1cccc(-c2ccc3ccccc3c2)c1] |
| I14 | 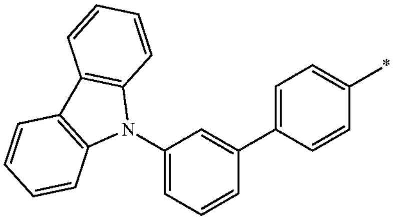 [SMILES: *c1ccc(-c2cccc(-n3c4ccccc4c4ccccc43)c2)cc1] | 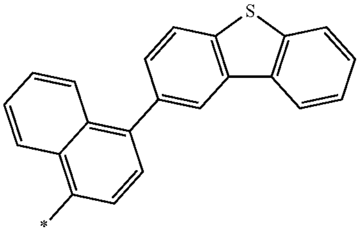 [SMILES: *c1ccc(-c2ccc3sc4ccccc4c3c2)c2ccccc12] | 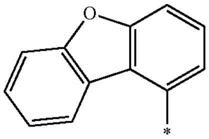 |

-continued
| Compound Group 1 | | | |
|---|---|---|---|
| Formula 1 | $Ar_1$ | $Ar_2$ | $Ar_3$ |
| I15 | 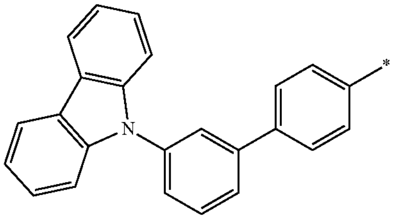 [SMILES: *c1ccc(-c2cccc(-n3c4ccccc4c4ccccc43)c2)cc1] | 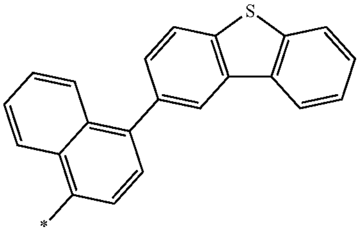 [SMILES: *c1ccc(-c2ccc3sc4ccccc4c3c2)c2ccccc12] | 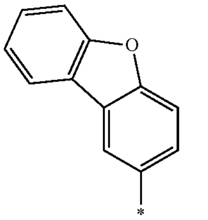 |
| I16 | 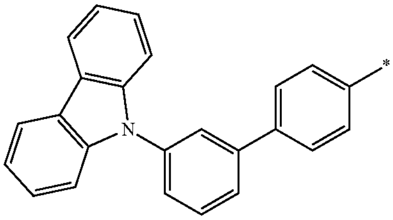 [SMILES: *c1ccc(-c2cccc(-n3c4ccccc4c4ccccc43)c2)cc1] | 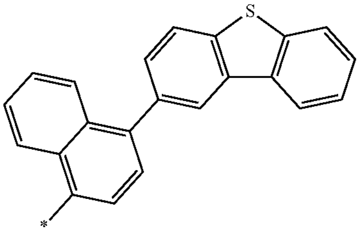 [SMILES: *c1ccc(-c2ccc3sc4ccccc4c3c2)c2ccccc12] | 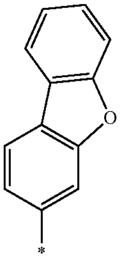 [SMILES: *c1ccc2c(c1)oc1ccccc12] |
| I17 | 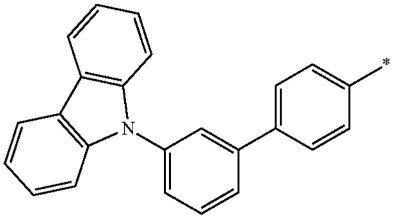 [SMILES: *c1ccc(-c2cccc(-n3c4ccccc4c4ccccc43)c2)cc1] | 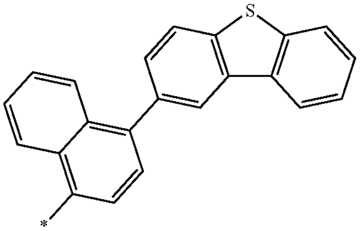 [SMILES: *c1ccc(-c2ccc3sc4ccccc4c3c2)c2ccccc12] | 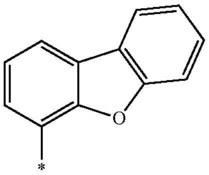 |
| I18 | 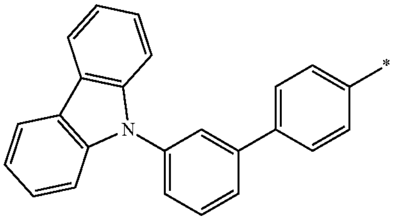 [SMILES: *c1ccc(-c2cccc(-n3c4ccccc4c4ccccc43)c2)cc1] | 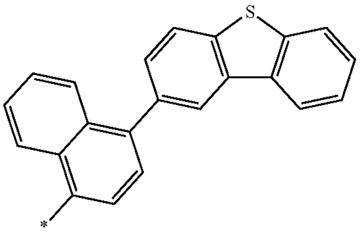 [SMILES: *c1ccc(-c2ccc3sc4ccccc4c3c2)c2ccccc12] | 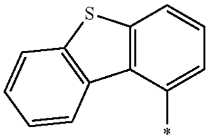 |
| I19 | 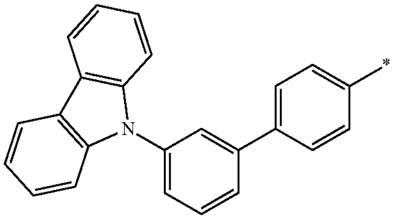 [SMILES: *c1ccc(-c2cccc(-n3c4ccccc4c4ccccc43)c2)cc1] | 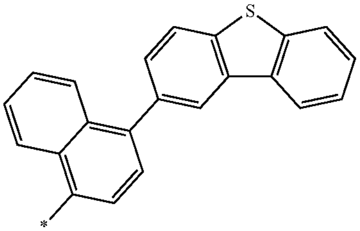 [SMILES: *c1ccc(-c2ccc3sc4ccccc4c3c2)c2ccccc12] | 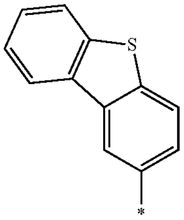 |
| I20 | 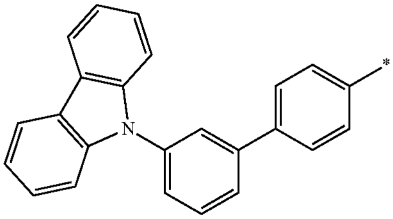 [SMILES: *c1ccc(-c2cccc(-n3c4ccccc4c4ccccc43)c2)cc1] | 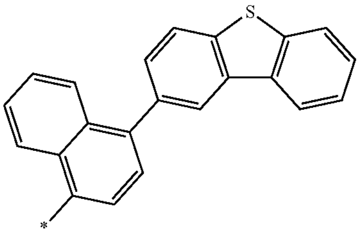 [SMILES: *c1ccc(-c2ccc3sc4ccccc4c3c2)c2ccccc12] | 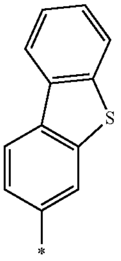 [SMILES: *c1ccc2c(c1)sc1ccccc12] |

-continued
| Compound Group 1 | | | |
|---|---|---|---|
| Formula 1 | $Ar_1$ | $Ar_2$ | $Ar_3$ |
| I21 | 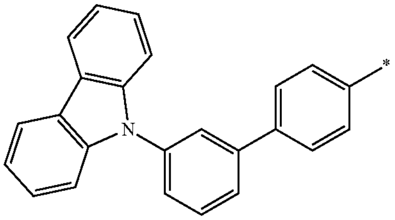 [SMILES: *c1ccc(-c2cccc(-n3c4ccccc4c4ccccc43)c2)cc1] | 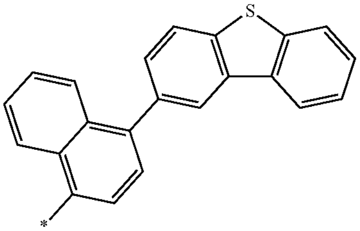 [SMILES: *c1ccc(-c2ccc3sc4ccccc4c3c2)c2ccccc12] | 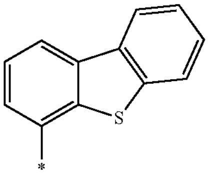 |
| I22 | 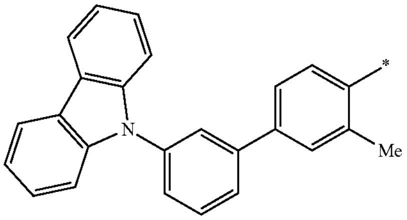 [SMILES: *c1ccc(-c2cccc(-n3c4ccccc4c4ccccc43)c2)cc1C] | 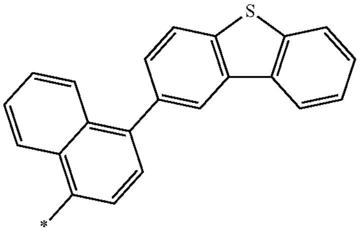 [SMILES: *c1ccc(-c2ccc3sc4ccccc4c3c2)c2ccccc12] | 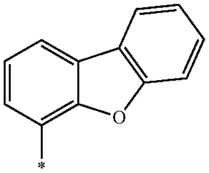 |
| I23 | 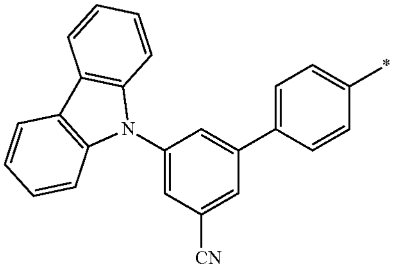 [SMILES: *c1ccc(-c2cc(C#N)cc(-n3c4ccccc4c4ccccc43)c2)cc1] | 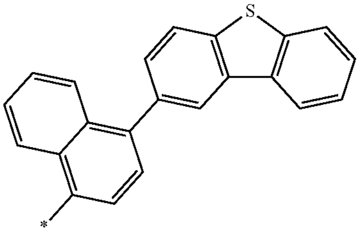 [SMILES: *c1ccc(-c2ccc3sc4ccccc4c3c2)c2ccccc12] | 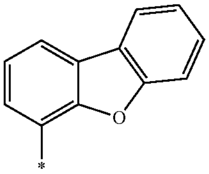 |
| J1 | 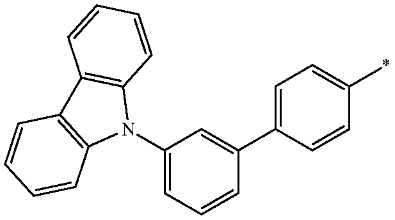 [SMILES: *c1ccc(-c2cccc(-n3c4ccccc4c4ccccc43)c2)cc1] | 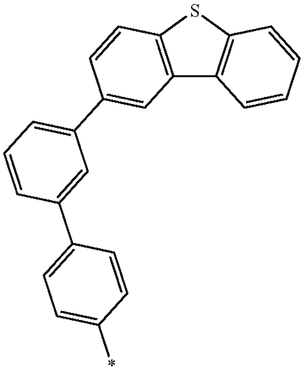 [SMILES: *c1ccc(-c2cccc(-c3ccc4sc5ccccc5c4c3)c2)cc1] | 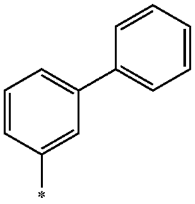 [SMILES: *c1cccc(-c2ccccc2)c1] |
| J2 | 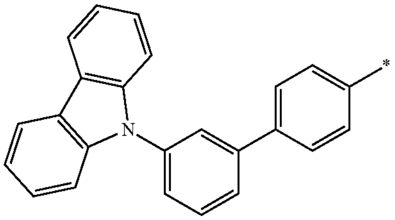 [SMILES: *c1ccc(-c2cccc(-n3c4ccccc4c4ccccc43)c2)cc1] | 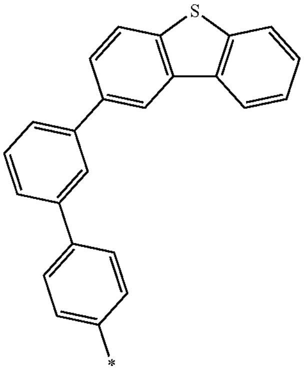 [SMILES: *c1ccc(-c2cccc(-c3ccc4sc5ccccc5c4c3)c2)cc1] | 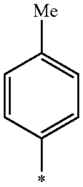 |

-continued
| Compound Group 1 | | | |
|---|---|---|---|
| Formula 1 | $Ar_1$ | $Ar_2$ | $Ar_3$ |
| J3 | 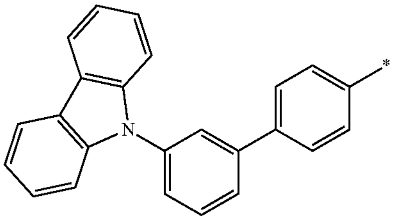 [SMILES: *c1ccc(-c2cccc(-n3c4ccccc4c4ccccc43)c2)cc1] | 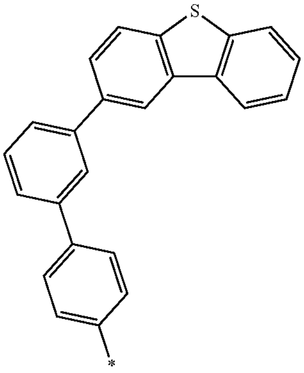 [SMILES: *c1ccc(-c2cccc(-c3ccc4sc5ccccc5c4c3)c2)cc1] | 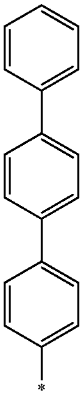 |
| J4 | 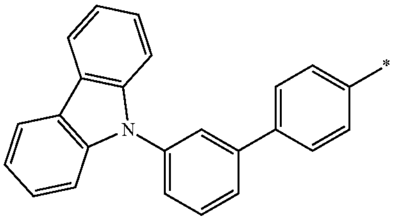 [SMILES: *c1ccc(-c2cccc(-n3c4ccccc4c4ccccc43)c2)cc1] | 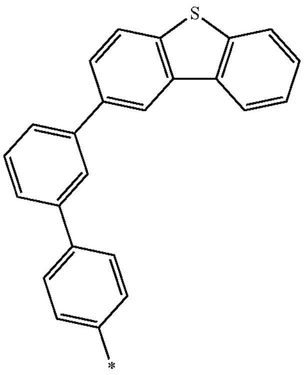 [SMILES: *c1ccc(-c2cccc(-c3ccc4sc5ccccc5c4c3)c2)cc1] | 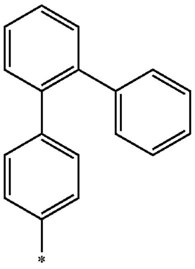 [SMILES: *c1ccc(-c2ccccc2-c2ccccc2)cc1] |
| J5 | 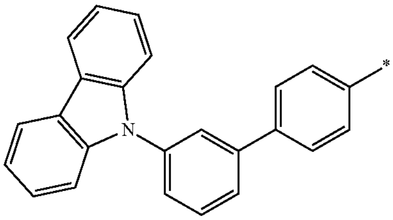 [SMILES: *c1ccc(-c2cccc(-n3c4ccccc4c4ccccc43)c2)cc1] | 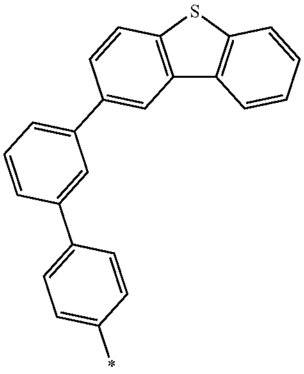 [SMILES: *c1ccc(-c2cccc(-c3ccc4sc5ccccc5c4c3)c2)cc1] | 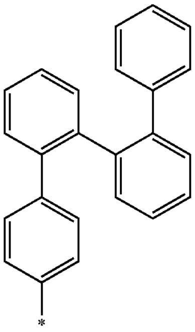 [SMILES: *c1ccc(-c2ccccc2-c2ccccc2-c2ccccc2)cc1] |
| J6 | 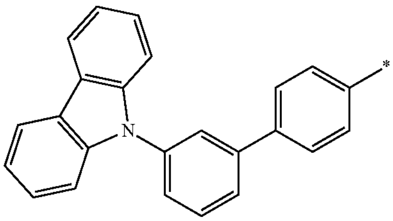 [SMILES: *c1ccc(-c2cccc(-n3c4ccccc4c4ccccc43)c2)cc1] | 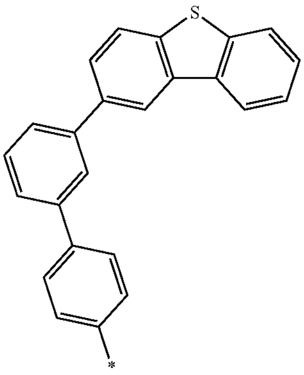 [SMILES: *c1ccc(-c2cccc(-c3ccc4sc5ccccc5c4c3)c2)cc1] | 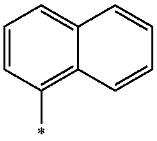 [SMILES: *c1cccc2ccccc12] |

-continued
| Compound Group 1 | | | |
|---|---|---|---|
| Formula 1 | $Ar_1$ | $Ar_2$ | $Ar_3$ |
| J7 | 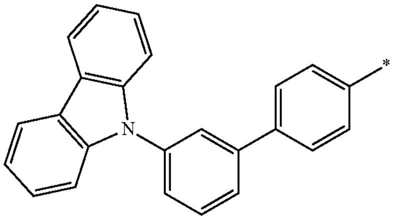 [SMILES: *c1ccc(-c2cccc(-n3c4ccccc4c4ccccc43)c2)cc1] | 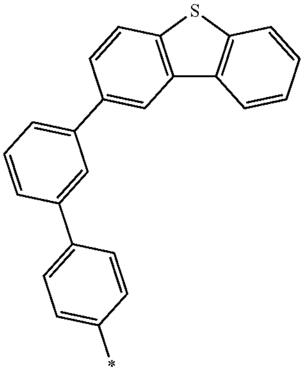 [SMILES: *c1ccc(-c2cccc(-c3ccc4sc5ccccc5c4c3)c2)cc1] | 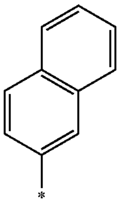 |
| J8 | 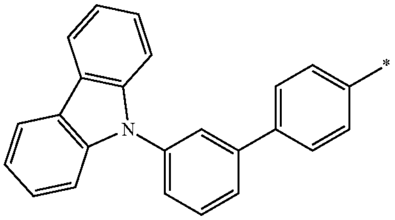 [SMILES: *c1ccc(-c2cccc(-n3c4ccccc4c4ccccc43)c2)cc1] | 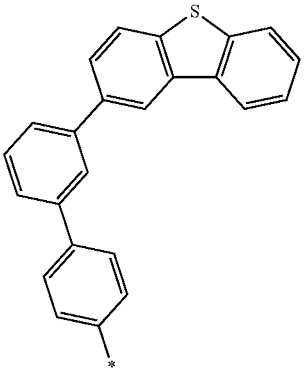 [SMILES: *c1ccc(-c2cccc(-c3ccc4sc5ccccc5c4c3)c2)cc1] | 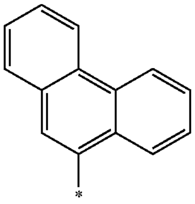 [SMILES: *c1cc2ccccc2c2ccccc12] |
| J9 | 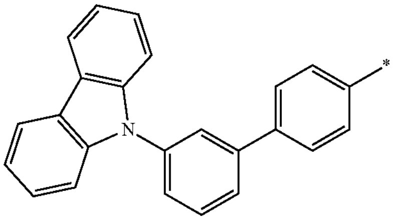 [SMILES: *c1ccc(-c2cccc(-n3c4ccccc4c4ccccc43)c2)cc1] | 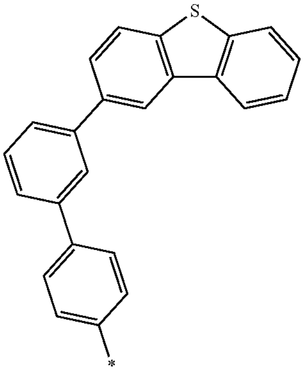 [SMILES: *c1ccc(-c2cccc(-c3ccc4sc5ccccc5c4c3)c2)cc1] | 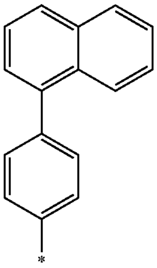 [SMILES: *c1ccc(-c2cccc3ccccc23)cc1] |
| J10 | 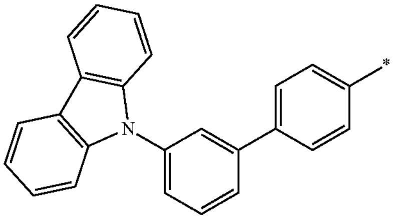 [SMILES: *c1ccc(-c2cccc(-n3c4ccccc4c4ccccc43)c2)cc1] | 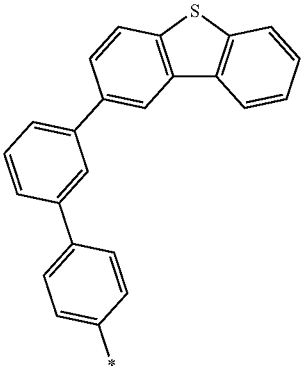 [SMILES: *c1ccc(-c2cccc(-c3ccc4sc5ccccc5c4c3)c2)cc1] | 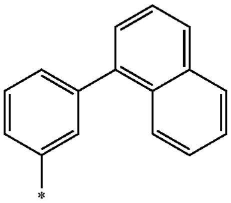 [SMILES: *c1cccc(-c2cccc3ccccc23)c1] |

-continued
| Compound Group 1 | | | |
|---|---|---|---|
| Formula 1 | $Ar_1$ | $Ar_2$ | $Ar_3$ |
| J11 | 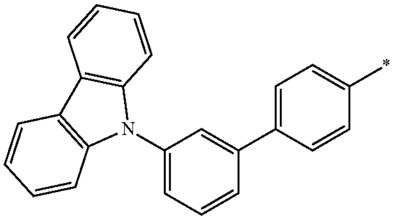 [SMILES: *c1ccc(-c2cccc(-n3c4ccccc4c4ccccc43)c2)cc1] | 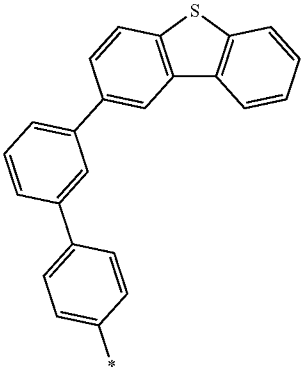 [SMILES: *c1ccc(-c2cccc(-c3ccc4sc5ccccc5c4c3)c2)cc1] | 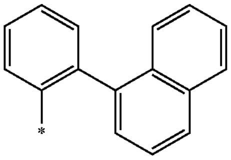 [SMILES: *c1ccccc1-c1cccc2ccccc12] |
| J12 | 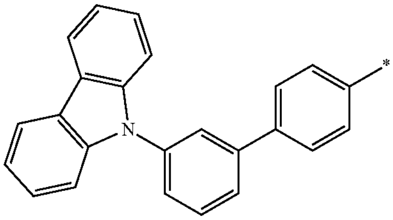 [SMILES: *c1ccc(-c2cccc(-n3c4ccccc4c4ccccc43)c2)cc1] | 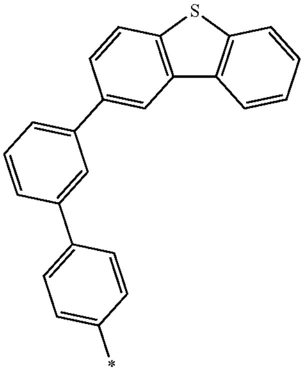 [SMILES: *c1ccc(-c2cccc(-c3ccc4sc5ccccc5c4c3)c2)cc1] | 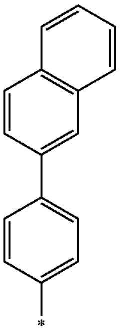 |
| J13 | 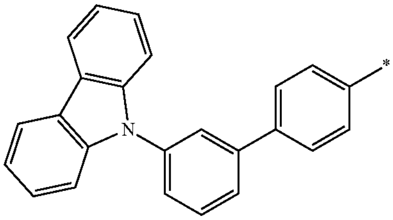 [SMILES: *c1ccc(-c2cccc(-n3c4ccccc4c4ccccc43)c2)cc1] | 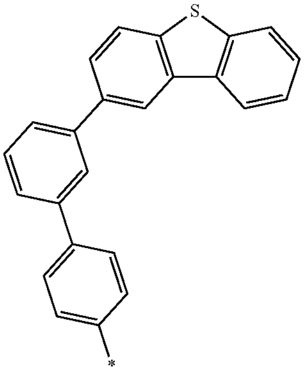 [SMILES: *c1ccc(-c2cccc(-c3ccc4sc5ccccc5c4c3)c2)cc1] | 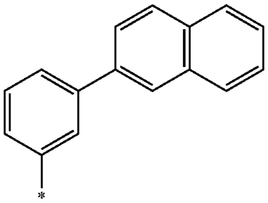 [SMILES: *c1cccc(-c2ccc3ccccc3c2)c1] |
| J14 | 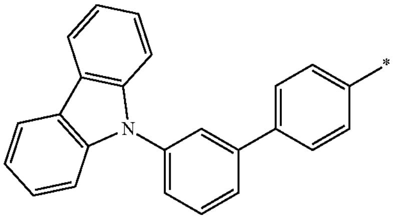 [SMILES: *c1ccc(-c2cccc(-n3c4ccccc4c4ccccc43)c2)cc1] | 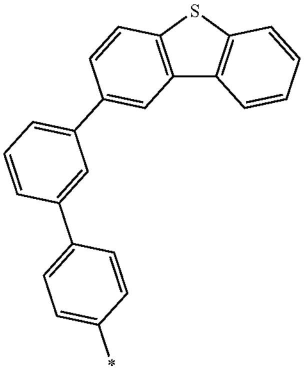 [SMILES: *c1ccc(-c2cccc(-c3ccc4sc5ccccc5c4c3)c2)cc1] | 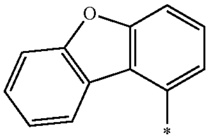 |

-continued
| Compound Group 1 | | | |
|---|---|---|---|
| Formula 1 | Ar1 | Ar2 | Ar3 |
| J15 | 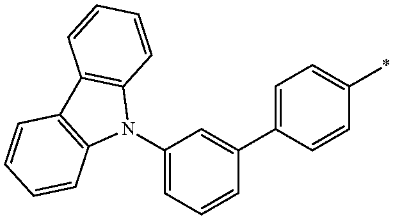 [SMILES: *c1ccc(-c2cccc(-n3c4ccccc4c4ccccc43)c2)cc1] | 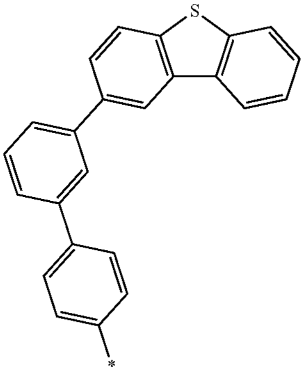 [SMILES: *c1ccc(-c2cccc(-c3ccc4sc5ccccc5c4c3)c2)cc1] | 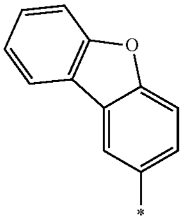 [SMILES: *c1ccc2oc3ccccc3c2c1] |
| J16 | 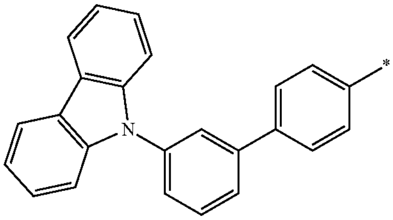 [SMILES: *c1ccc(-c2cccc(-n3c4ccccc4c4ccccc43)c2)cc1] | 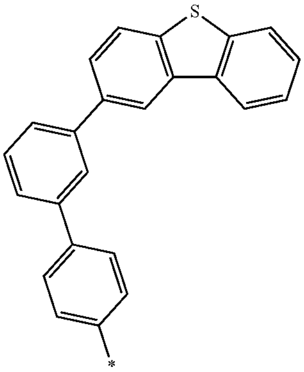 [SMILES: *c1ccc(-c2cccc(-c3ccc4sc5ccccc5c4c3)c2)cc1] | 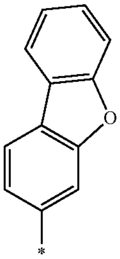 [SMILES: *c1ccc2c(c1)oc1ccccc12] |
| J17 | 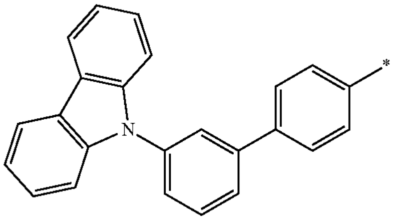 [SMILES: *c1ccc(-c2cccc(-n3c4ccccc4c4ccccc43)c2)cc1] | 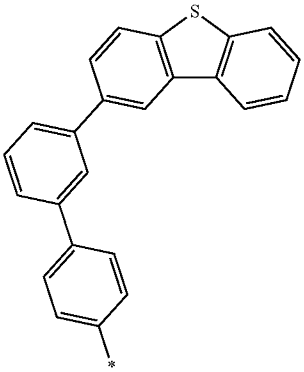 [SMILES: *c1ccc(-c2cccc(-c3ccc4sc5ccccc5c4c3)c2)cc1] | 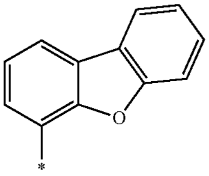 |
| J18 | 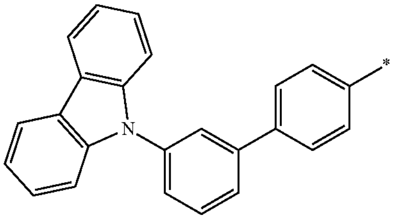 [SMILES: *c1ccc(-c2cccc(-n3c4ccccc4c4ccccc43)c2)cc1] | 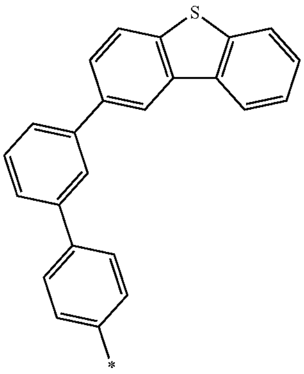 [SMILES: *c1ccc(-c2cccc(-c3ccc4sc5ccccc5c4c3)c2)cc1] | 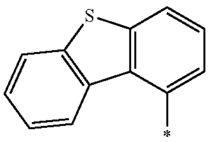 |

-continued
| Compound Group 1 | | | |
|---|---|---|---|
| Formula 1 | $Ar_1$ | $Ar_2$ | $Ar_3$ |
| J19 | 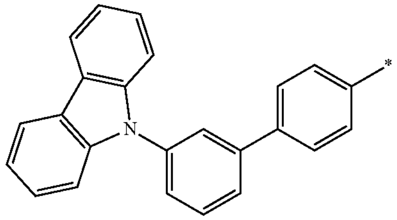 [SMILES: *c1ccc(-c2cccc(-n3c4ccccc4c4ccccc43)c2)cc1] | 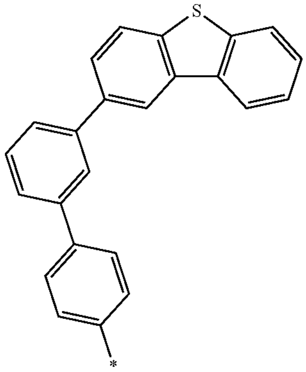 [SMILES: *c1ccc(-c2cccc(-c3ccc4sc5ccccc5c4c3)c2)cc1] | 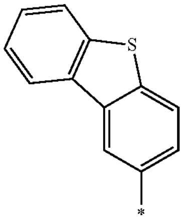 |
| J20 | 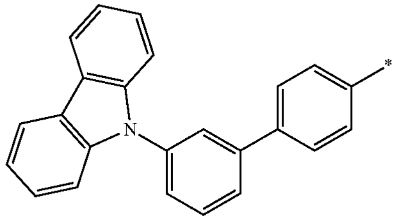 [SMILES: *c1ccc(-c2cccc(-n3c4ccccc4c4ccccc43)c2)cc1] | 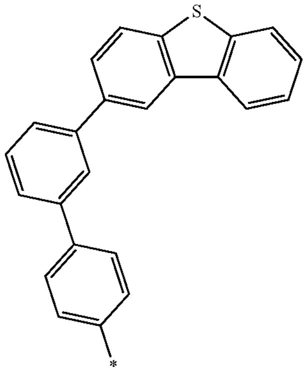 [SMILES: *c1ccc(-c2cccc(-c3ccc4sc5ccccc5c4c3)c2)cc1] | 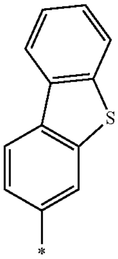 [SMILES: *c1ccc2c(c1)sc1ccccc12] |
| J21 | 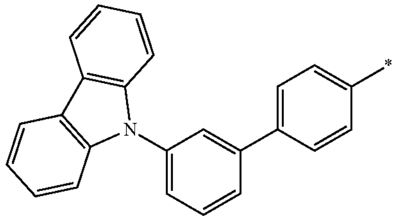 [SMILES: *c1ccc(-c2cccc(-n3c4ccccc4c4ccccc43)c2)cc1] | 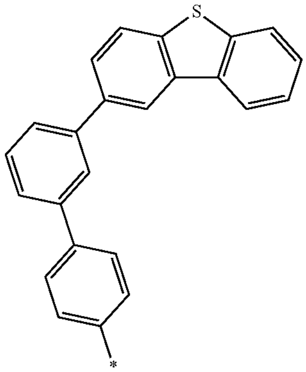 [SMILES: *c1ccc(-c2cccc(-c3ccc4sc5ccccc5c4c3)c2)cc1] | 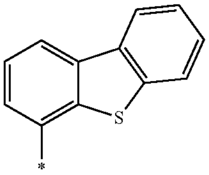 |
| J22 | 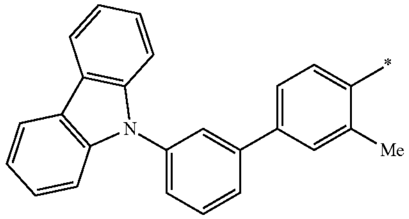 [SMILES: *c1ccc(-c2cccc(-n3c4ccccc4c4ccccc43)c2)cc1C] | 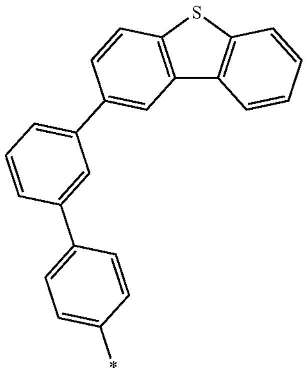 [SMILES: *c1ccc(-c2cccc(-c3ccc4sc5ccccc5c4c3)c2)cc1] | 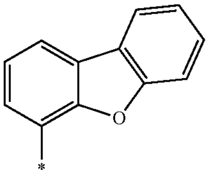 |

-continued
| Compound Group 1 | | | |
|---|---|---|---|
| Formula 1 | $Ar_1$ | $Ar_2$ | $Ar_3$ |
| J23 | 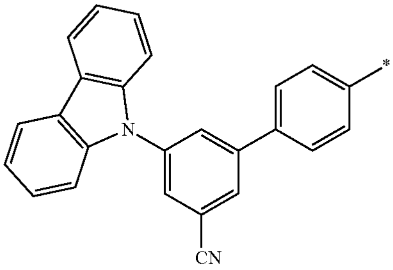 [SMILES: *c1ccc(-c2cc(C#N)cc(-n3c4ccccc4c4ccccc43)c2)cc1] | 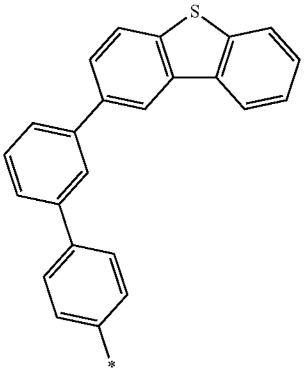 [SMILES: *c1ccc(-c2cccc(-c3ccc4sc5ccccc5c4c3)c2)cc1] | 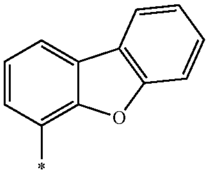 |
| K1 | 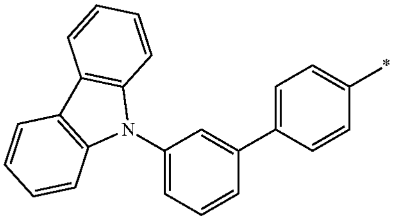 [SMILES: *c1ccc(-c2cccc(-n3c4ccccc4c4ccccc43)c2)cc1] | 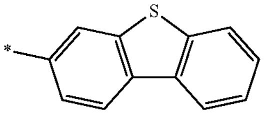 [SMILES: *c1ccc2c(c1)sc1ccccc12] | 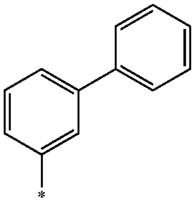 [SMILES: *c1cccc(-c2ccccc2)c1] |
| K2 | 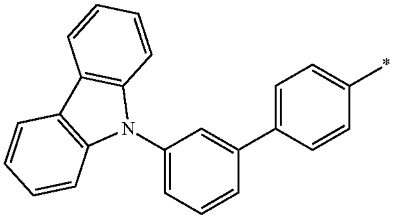 [SMILES: *c1ccc(-c2cccc(-n3c4ccccc4c4ccccc43)c2)cc1] | 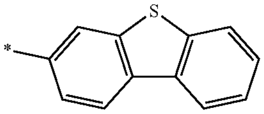 | 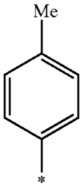 |
| K3 | 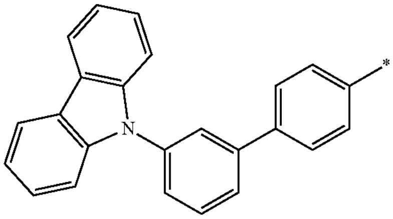 [SMILES: *c1ccc(-c2cccc(-n3c4ccccc4c4ccccc43)c2)cc1] | 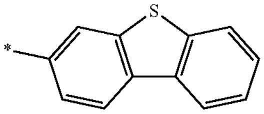 [SMILES: *c1ccc2c(c1)sc1ccccc12] | 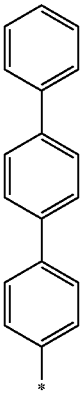 |
| K4 | 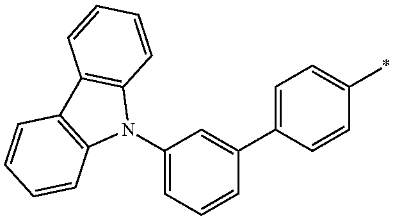 [SMILES: *c1ccc(-c2cccc(-n3c4ccccc4c4ccccc43)c2)cc1] | 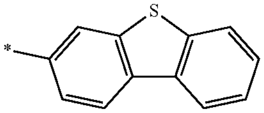 [SMILES: *c1ccc2c(c1)sc1ccccc12] | 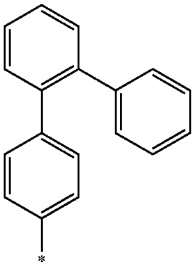 [SMILES: *c1ccc(-c2ccccc2-c2ccccc2)cc1] |

-continued
| Compound Group 1 | | | |
|---|---|---|---|
| Formula 1 | $Ar_1$ | $Ar_2$ | $Ar_3$ |
| K5 | 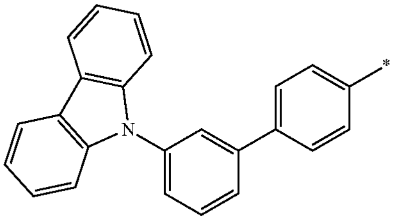 [SMILES: *c1ccc(-c2cccc(-n3c4ccccc4c4ccccc43)c2)cc1] | 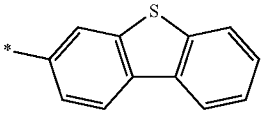 [SMILES: *c1ccc2c(c1)sc1ccccc12] | 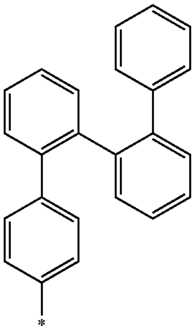 [SMILES: *c1ccc(-c2ccccc2-c2ccccc2-c2ccccc2)cc1] |
| K6 | 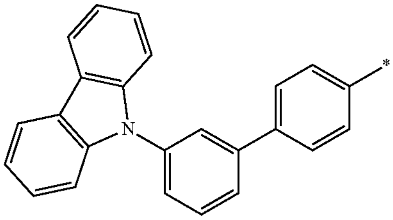 [SMILES: *c1ccc(-c2cccc(-n3c4ccccc4c4ccccc43)c2)cc1] | 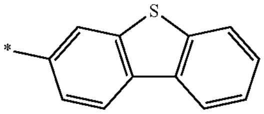 | 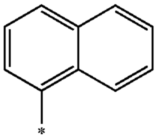 [SMILES: *c1cccc2ccccc12] |
| K7 | 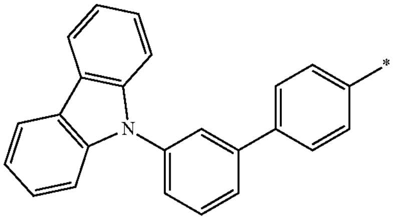 [SMILES: *c1ccc(-c2cccc(-n3c4ccccc4c4ccccc43)c2)cc1] | 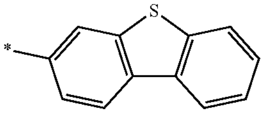 [SMILES: *c1ccc2c(c1)sc1ccccc12] | 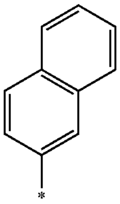 |
| K8 | 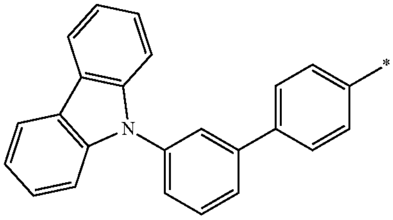 [SMILES: *c1ccc(-c2cccc(-n3c4ccccc4c4ccccc43)c2)cc1] | 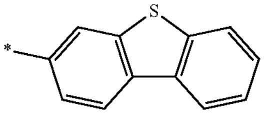 [SMILES: *c1ccc2c(c1)sc1ccccc12] | 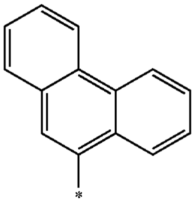 [SMILES: *c1cc2ccccc2c2ccccc12] |
| K9 | 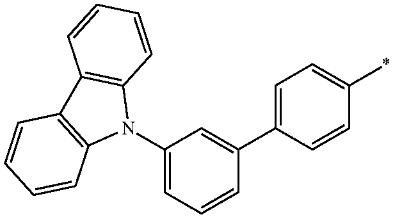 [SMILES: *c1ccc(-c2cccc(-n3c4ccccc4c4ccccc43)c2)cc1] | 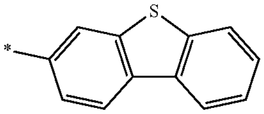 [SMILES: *c1ccc2c(c1)sc1ccccc12] | 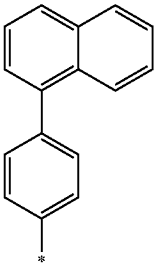 [SMILES: *c1ccc(-c2cccc3ccccc23)cc1] |

-continued
| Compound Group 1 | | | |
|---|---|---|---|
| Formula 1 | $Ar_1$ | $Ar_2$ | $Ar_3$ |
| K10 | 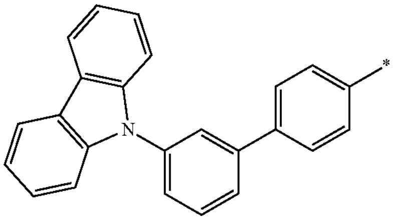 [SMILES: *c1ccc(-c2cccc(-n3c4ccccc4c4ccccc43)c2)cc1] | 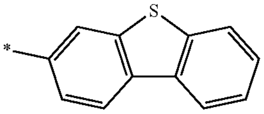 [SMILES: *c1ccc2c(c1)sc1ccccc12] | 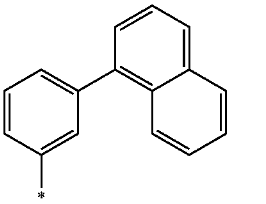 [SMILES: *c1cccc(-c2cccc3ccccc23)c1] |
| K11 | 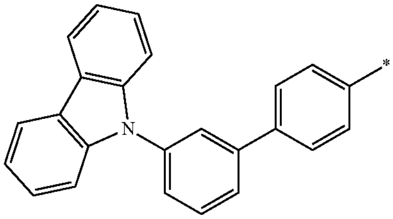 [SMILES: *c1ccc(-c2cccc(-n3c4ccccc4c4ccccc43)c2)cc1] | 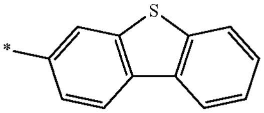 [SMILES: *c1ccc2c(c1)sc1ccccc12] | 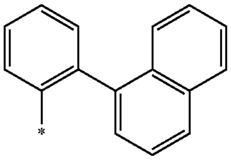 [SMILES: *c1ccccc1-c1cccc2ccccc12] |
| K12 | 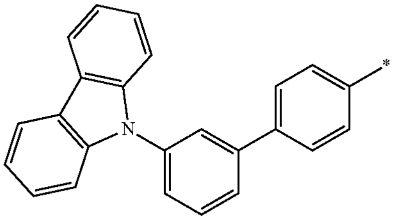 [SMILES: *c1ccc(-c2cccc(-n3c4ccccc4c4ccccc43)c2)cc1] | 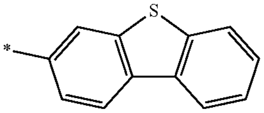 [SMILES: *c1ccc2c(c1)sc1ccccc12] | 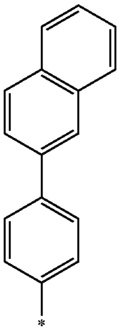 |
| K13 | 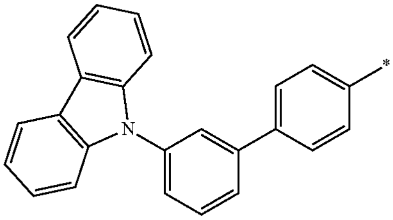 [SMILES: *c1ccc(-c2cccc(-n3c4ccccc4c4ccccc43)c2)cc1] | 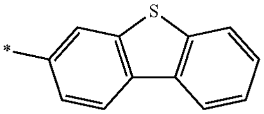 [SMILES: *c1ccc2c(c1)sc1ccccc12] | 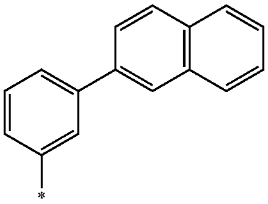 [SMILES: *c1cccc(-c2ccc3ccccc3c2)c1] |
| K14 | 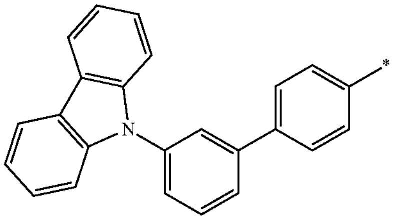 [SMILES: *c1ccc(-c2cccc(-n3c4ccccc4c4ccccc43)c2)cc1] | 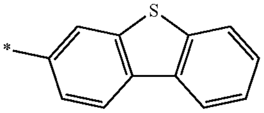 [SMILES: *c1ccc2c(c1)sc1ccccc12] | 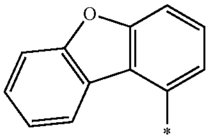 |
| K15 | 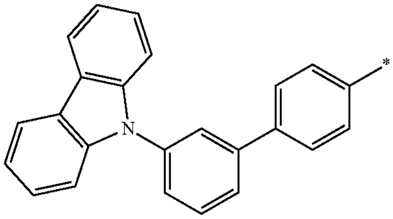 [SMILES: *c1ccc(-c2cccc(-n3c4ccccc4c4ccccc43)c2)cc1] | 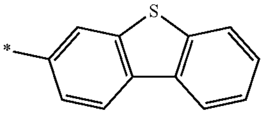 [SMILES: *c1ccc2c(c1)sc1ccccc12] | 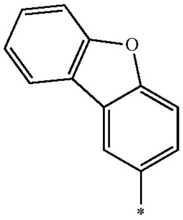 |

-continued
| Compound Group 1 | | | |
|---|---|---|---|
| Formula 1 | $Ar_1$ | $Ar_2$ | $Ar_3$ |
| K16 | 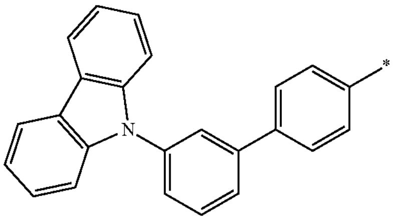 [SMILES: *c1ccc(-c2cccc(-n3c4ccccc4c4ccccc43)c2)cc1] | 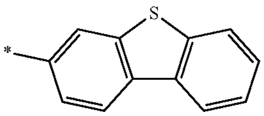 [SMILES: *c1ccc2c(c1)sc1ccccc12] | 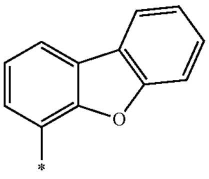 |
| K17 | 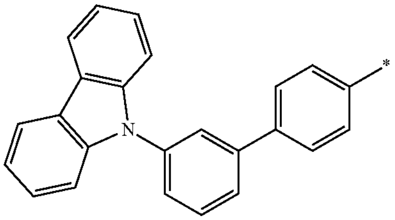 [SMILES: *c1ccc(-c2cccc(-n3c4ccccc4c4ccccc43)c2)cc1] | 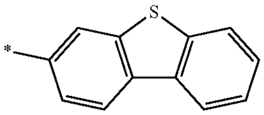 [SMILES: *c1ccc2c(c1)sc1ccccc12] | 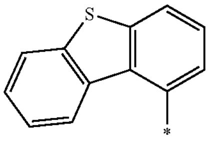 |
| K18 | 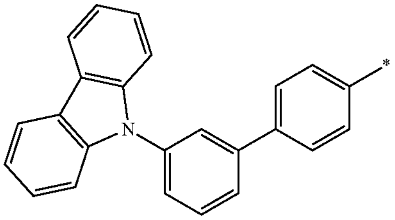 [SMILES: *c1ccc(-c2cccc(-n3c4ccccc4c4ccccc43)c2)cc1] | 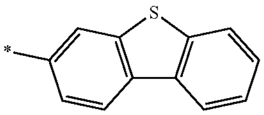 [SMILES: *c1ccc2c(c1)sc1ccccc12] | 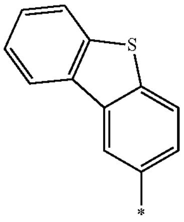 |
| K19 | 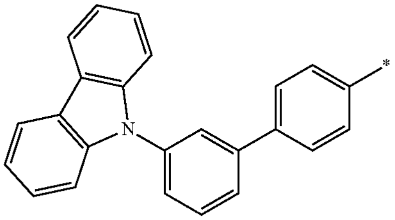 [SMILES: *c1ccc(-c2cccc(-n3c4ccccc4c4ccccc43)c2)cc1] | 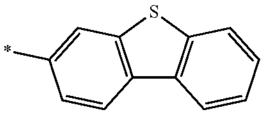 [SMILES: *c1ccc2c(c1)sc1ccccc12] | 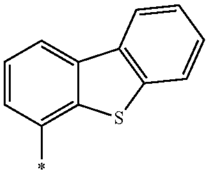 |
| K20 | 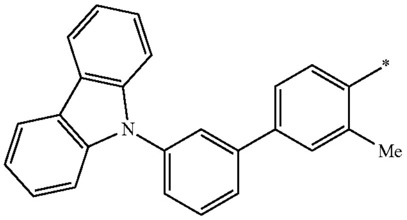 [SMILES: *c1ccc(-c2cccc(-n3c4ccccc4c4ccccc43)c2)cc1C] | 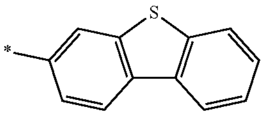 [SMILES: *c1ccc2c(c1)sc1ccccc12] | 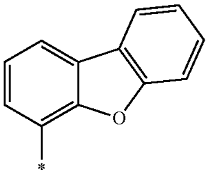 |
| K21 | 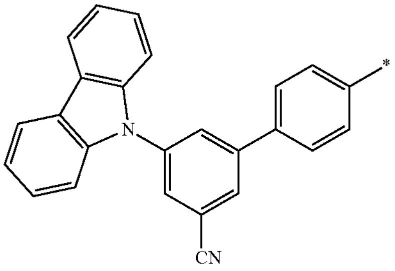 [SMILES: *c1ccc(-c2cc(C#N)cc(-n3c4ccccc4c4ccccc43)c2)cc1] | 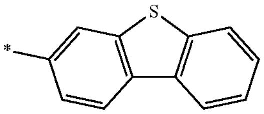 [SMILES: *c1ccc2c(c1)sc1ccccc12] | 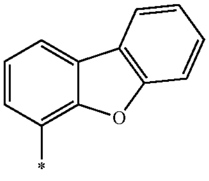 |

-continued
| Compound Group 1 | | | |
|---|---|---|---|
| Formula 1 | $Ar_1$ | $Ar_2$ | $Ar_3$ |
| M1 | 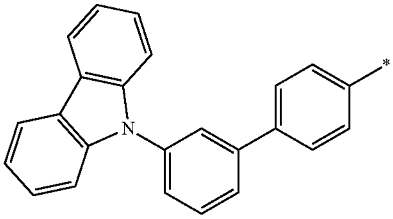 [SMILES: *c1ccc(-c2cccc(-n3c4ccccc4c4ccccc43)c2)cc1] | 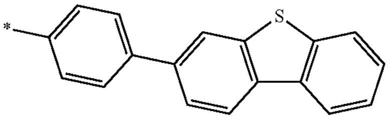 [SMILES: *c1ccc(-c2ccc3c(c2)sc2ccccc23)cc1] | 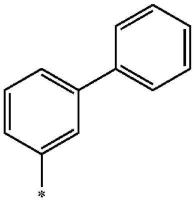 [SMILES: *c1cccc(-c2ccccc2)c1] |
| M2 | 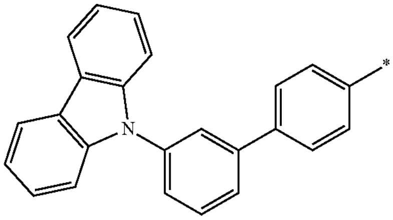 [SMILES: *c1ccc(-c2cccc(-n3c4ccccc4c4ccccc43)c2)cc1] | 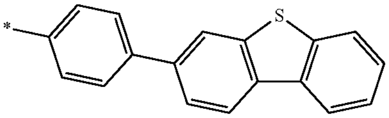 [SMILES: *c1ccc(-c2ccc3c(c2)sc2ccccc23)cc1] | 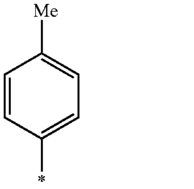 |
| M4 | 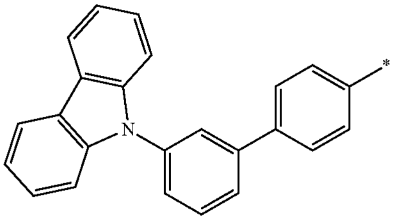 [SMILES: *c1ccc(-c2cccc(-n3c4ccccc4c4ccccc43)c2)cc1] | 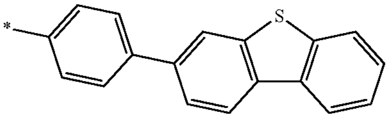 [SMILES: *c1ccc(-c2ccc3c(c2)sc2ccccc23)cc1] | 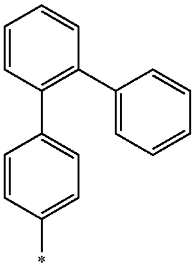 [SMILES: *c1ccc(-c2ccccc2-c2ccccc2)cc1] |
| M5 | 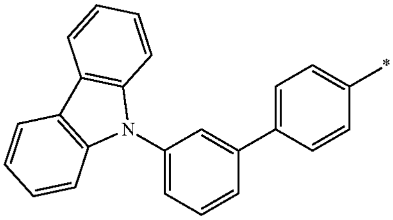 [SMILES: *c1ccc(-c2cccc(-n3c4ccccc4c4ccccc43)c2)cc1] | 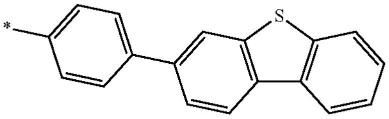 [SMILES: *c1ccc(-c2ccc3c(c2)sc2ccccc23)cc1] | 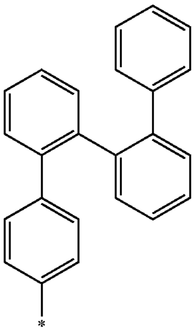 [SMILES: *c1ccc(-c2ccccc2-c2ccccc2-c2ccccc2)cc1] |
| M6 | 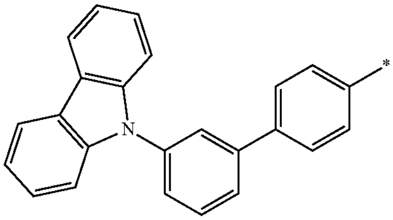 [SMILES: *c1ccc(-c2cccc(-n3c4ccccc4c4ccccc43)c2)cc1] | 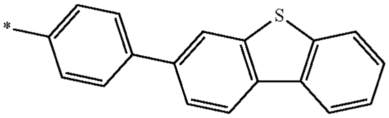 [SMILES: *c1ccc(-c2ccc3c(c2)sc2ccccc23)cc1] | 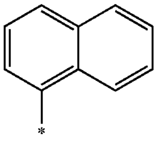 [SMILES: *c1cccc2ccccc12] |

-continued
| Compound Group 1 | | | |
|---|---|---|---|
| Formula 1 | $Ar_1$ | $Ar_2$ | $Ar_3$ |
| M7 | 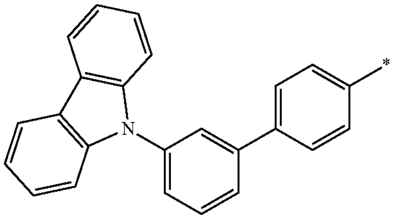 [SMILES: *c1ccc(-c2cccc(-n3c4ccccc4c4ccccc43)c2)cc1] | 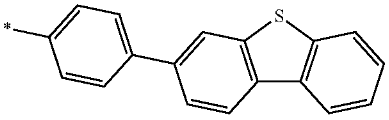 [SMILES: *c1ccc(-c2ccc3c(c2)sc2ccccc23)cc1] | 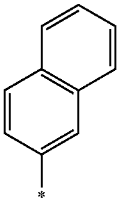 |
| M8 | 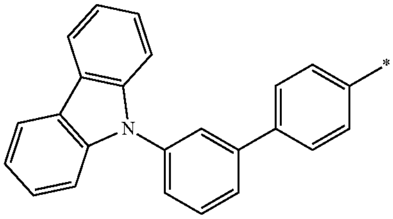 [SMILES: *c1ccc(-c2cccc(-n3c4ccccc4c4ccccc43)c2)cc1] | 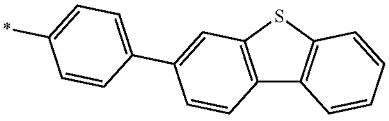 [SMILES: *c1ccc(-c2ccc3c(c2)sc2ccccc23)cc1] | 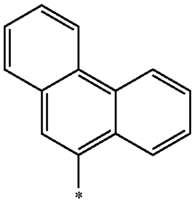 [SMILES: *c1cc2ccccc2c2ccccc12] |
| M10 | 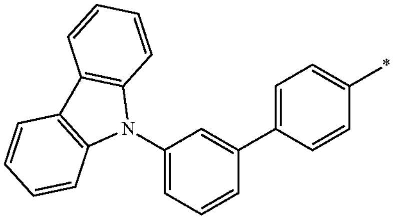 [SMILES: *c1ccc(-c2cccc(-n3c4ccccc4c4ccccc43)c2)cc1] | 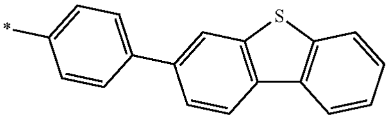 [SMILES: *c1ccc(-c2ccc3c(c2)sc2ccccc23)cc1] | 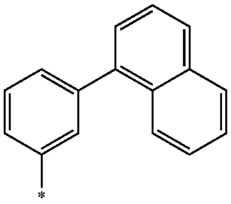 [SMILES: *c1cccc(-c2cccc3ccccc23)c1] |
| M11 | 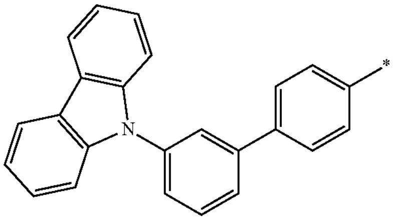 [SMILES: *c1ccc(-c2cccc(-n3c4ccccc4c4ccccc43)c2)cc1] | 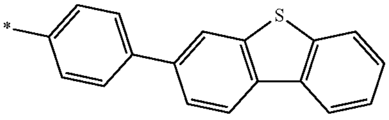 [SMILES: *c1ccc(-c2ccc3c(c2)sc2ccccc23)cc1] | 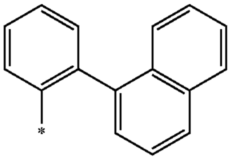 [SMILES: *c1ccccc1-c1cccc2ccccc12] |
| M13 | 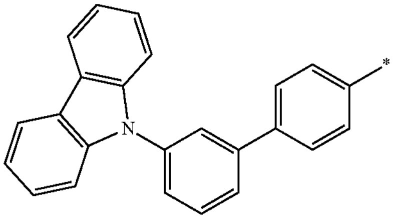 [SMILES: *c1ccc(-c2cccc(-n3c4ccccc4c4ccccc43)c2)cc1] | 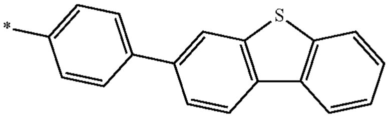 [SMILES: *c1ccc(-c2ccc3c(c2)sc2ccccc23)cc1] | 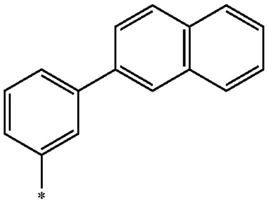 [SMILES: *c1cccc(-c2ccc3ccccc3c2)c1] |
| M14 | 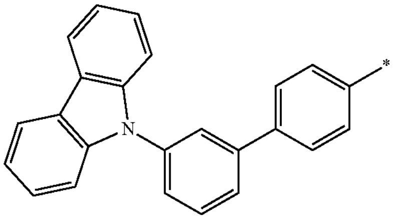 [SMILES: *c1ccc(-c2cccc(-n3c4ccccc4c4ccccc43)c2)cc1] | 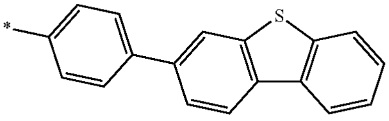 [SMILES: *c1ccc(-c2ccc3c(c2)sc2ccccc23)cc1] | 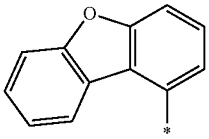 |

-continued
Compound Group 1
| Formula 1 | $Ar_1$ | $Ar_2$ | $Ar_3$ |
|---|---|---|---|
| M15 | 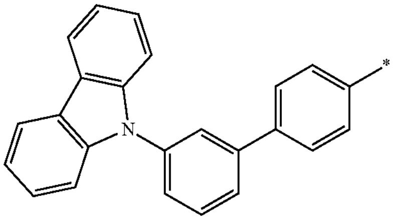 [SMILES: *c1ccc(-c2cccc(-n3c4ccccc4c4ccccc43)c2)cc1] | 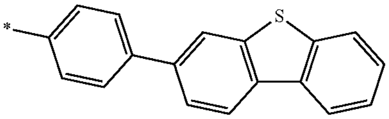 [SMILES: *c1ccc(-c2ccc3c(c2)sc2ccccc23)cc1] | 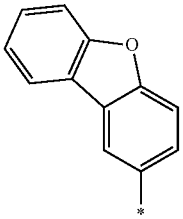 [SMILES: *c1ccc2oc3ccccc3c2c1] |
| M16 | 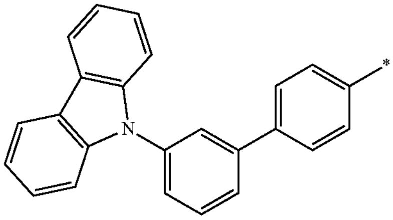 [SMILES: *c1ccc(-c2cccc(-n3c4ccccc4c4ccccc43)c2)cc1] | 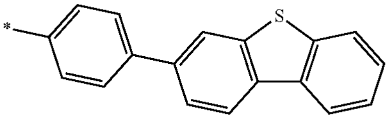 [SMILES: *c1ccc(-c2ccc3c(c2)sc2ccccc23)cc1] | 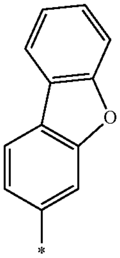 [SMILES: *c1ccc2c(c1)oc1ccccc12] |
| M17 | 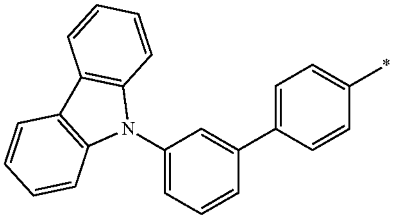 [SMILES: *c1ccc(-c2cccc(-n3c4ccccc4c4ccccc43)c2)cc1] | 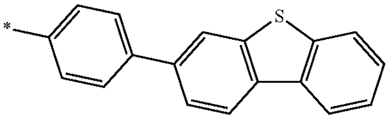 [SMILES: *c1ccc(-c2ccc3c(c2)sc2ccccc23)cc1] | 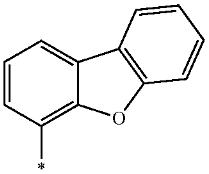 |
| M18 | 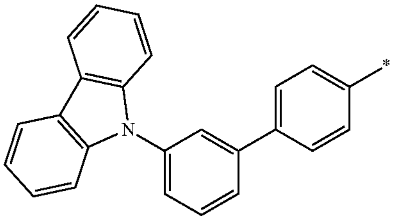 [SMILES: *c1ccc(-c2cccc(-n3c4ccccc4c4ccccc43)c2)cc1] | 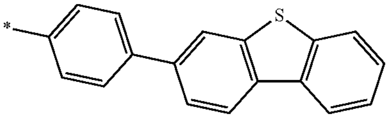 [SMILES: *c1ccc(-c2ccc3c(c2)sc2ccccc23)cc1] | 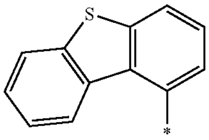 |
| M19 | 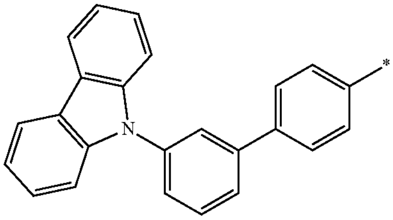 [SMILES: *c1ccc(-c2cccc(-n3c4ccccc4c4ccccc43)c2)cc1] | 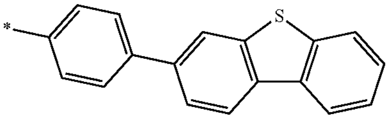 [SMILES: *c1ccc(-c2ccc3c(c2)sc2ccccc23)cc1] | 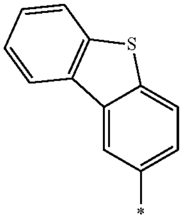 |
| M20 | 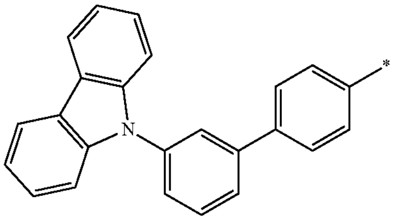 [SMILES: *c1ccc(-c2cccc(-n3c4ccccc4c4ccccc43)c2)cc1] | 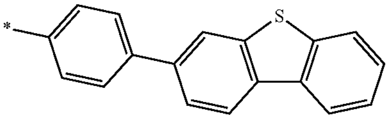 [SMILES: *c1ccc(-c2ccc3c(c2)sc2ccccc23)cc1] | 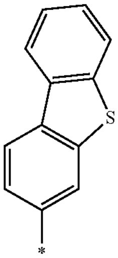 [SMILES: *c1ccc2c(c1)sc1ccccc12] |

-continued
Compound Group 1
| Formula 1 | $Ar_1$ | $Ar_2$ | $Ar_3$ |
|---|---|---|---|
| M21 | 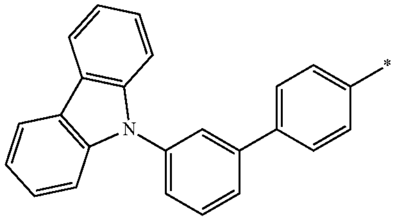 [SMILES: *c1ccc(-c2cccc(-n3c4ccccc4c4ccccc43)c2)cc1] | 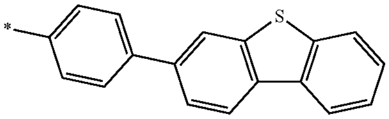 [SMILES: *c1ccc(-c2ccc3c(c2)sc2ccccc23)cc1] | 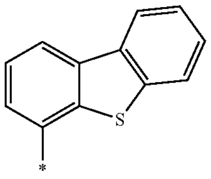 |
| M22 | 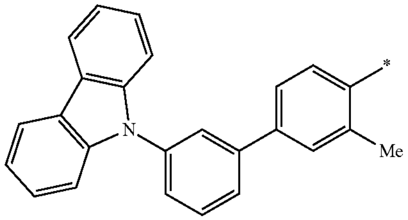 [SMILES: *c1ccc(-c2cccc(-n3c4ccccc4c4ccccc43)c2)cc1C] | 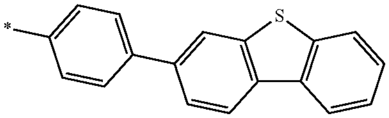 [SMILES: *c1ccc(-c2ccc3c(c2)sc2ccccc23)cc1] | 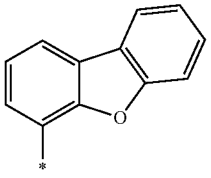 |
| M23 | 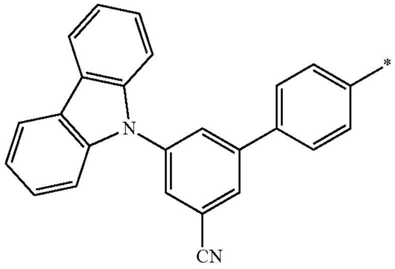 [SMILES: *c1ccc(-c2cc(C#N)cc(-n3c4ccccc4c4ccccc43)c2)cc1] | 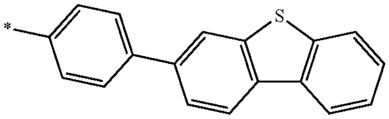 [SMILES: *c1ccc(-c2ccc3c(c2)sc2ccccc23)cc1] | 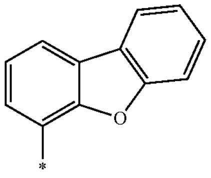 |
| N1 | 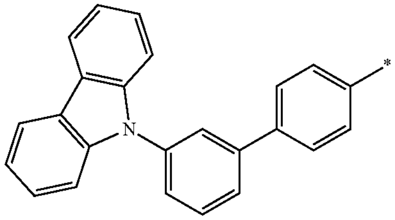 [SMILES: *c1ccc(-c2cccc(-n3c4ccccc4c4ccccc43)c2)cc1] | 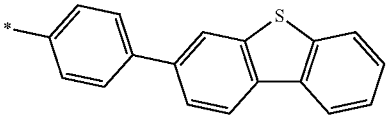 [SMILES: *c1ccc(-c2ccc3c(c2)sc2ccccc23)cc1] | 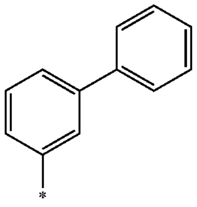 [SMILES: *c1cccc(-c2ccccc2)c1] |
| N2 | 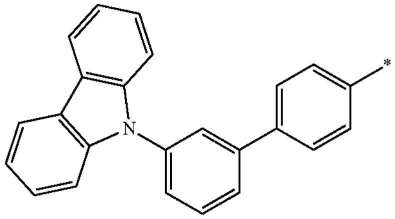 [SMILES: *c1ccc(-c2cccc(-n3c4ccccc4c4ccccc43)c2)cc1] | 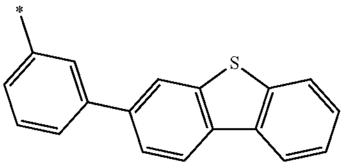 [SMILES: *c1cccc(-c2ccc3c(c2)sc2ccccc23)c1] | 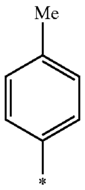 |
| N4 | 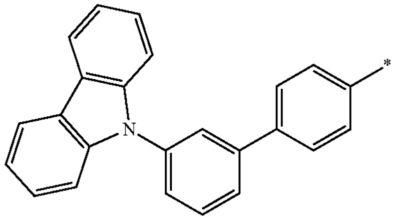 [SMILES: *c1ccc(-c2cccc(-n3c4ccccc4c4ccccc43)c2)cc1] | 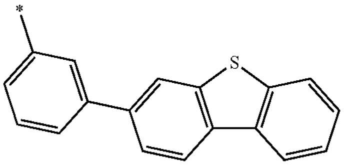 [SMILES: *c1cccc(-c2ccc3c(c2)sc2ccccc23)c1] | 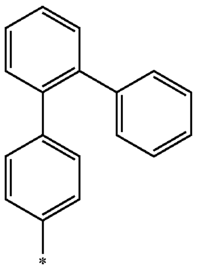 [SMILES: *c1ccc(-c2ccccc2-c2ccccc2)cc1] |

-continued
| Compound Group 1 | | | |
|---|---|---|---|
| Formula 1 | $Ar_1$ | $Ar_2$ | $Ar_3$ |
| N5 | 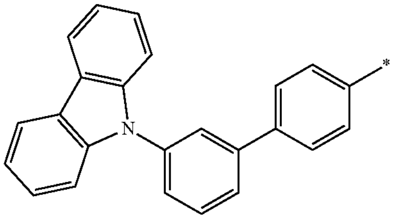 [SMILES: *c1ccc(-c2cccc(-n3c4ccccc4c4ccccc43)c2)cc1] | 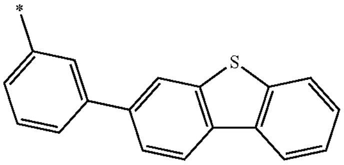 | 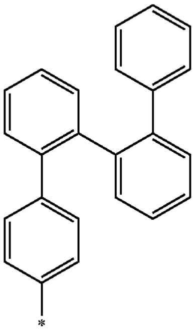 [SMILES: *c1ccc(-c2ccccc2-c2ccccc2-c2ccccc2)cc1] |
| N6 | 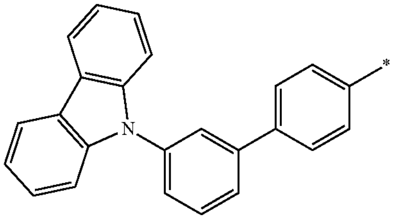 [SMILES: *c1ccc(-c2cccc(-n3c4ccccc4c4ccccc43)c2)cc1] | 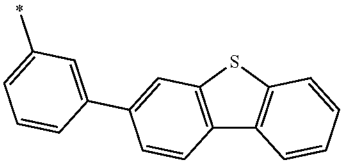 [SMILES: *c1cccc(-c2ccc3c(c2)sc2ccccc23)c1] | 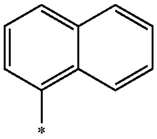 [SMILES: *c1cccc2ccccc12] |
| N7 | 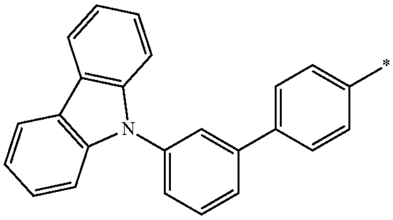 [SMILES: *c1ccc(-c2cccc(-n3c4ccccc4c4ccccc43)c2)cc1] | 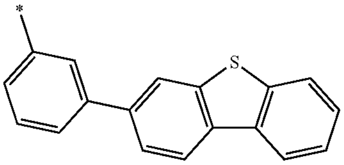 [SMILES: *c1cccc(-c2ccc3c(c2)sc2ccccc23)c1] | 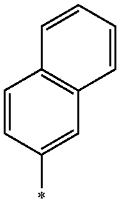 |
| N8 | 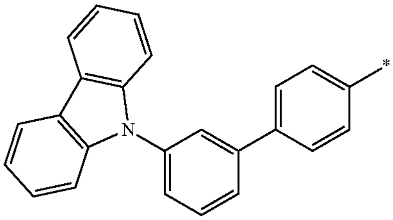 [SMILES: *c1ccc(-c2cccc(-n3c4ccccc4c4ccccc43)c2)cc1] | 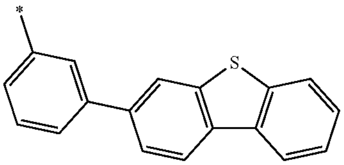 [SMILES: *c1cccc(-c2ccc3c(c2)sc2ccccc23)c1] | 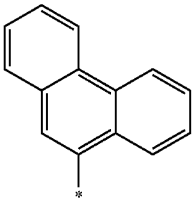 [SMILES: *c1cc2ccccc2c2ccccc12] |
| N10 | 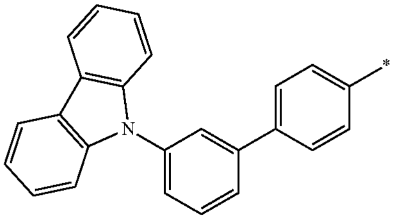 [SMILES: *c1ccc(-c2cccc(-n3c4ccccc4c4ccccc43)c2)cc1] | 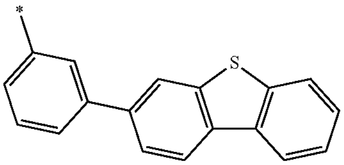 [SMILES: *c1cccc(-c2ccc3c(c2)sc2ccccc23)c1] | 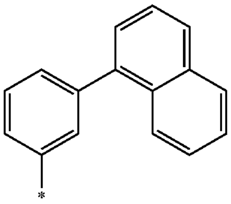 [SMILES: *c1cccc(-c2cccc3ccccc23)c1] |
| N11 | 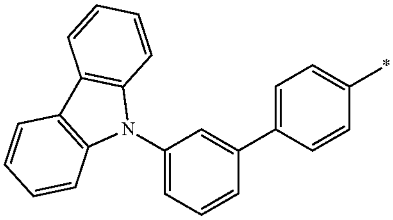 [SMILES: *c1ccc(-c2cccc(-n3c4ccccc4c4ccccc43)c2)cc1] | 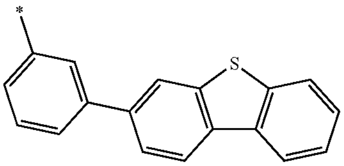 [SMILES: *c1cccc(-c2ccc3c(c2)sc2ccccc23)c1] | 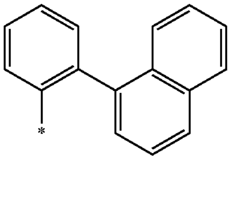 [SMILES: *c1ccccc1-c1cccc2ccccc12] |

-continued
Compound Group 1
| Formula 1 | $Ar_1$ | $Ar_2$ | $Ar_3$ |
| --- | --- | --- | --- |
| N13 | 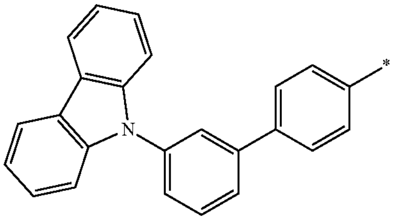 [SMILES: *c1ccc(-c2cccc(-n3c4ccccc4c4ccccc43)c2)cc1] | 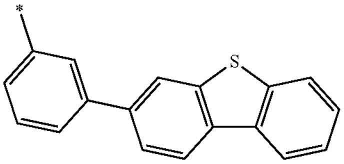 [SMILES: *c1cccc(-c2ccc3c(c2)sc2ccccc23)c1] | 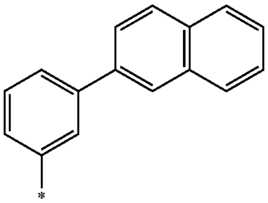 [SMILES: *c1cccc(-c2ccc3ccccc3c2)c1] |
| N14 | 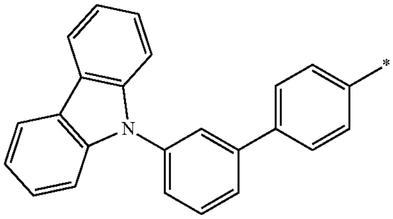 [SMILES: *c1ccc(-c2cccc(-n3c4ccccc4c4ccccc43)c2)cc1] | 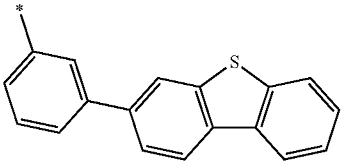 [SMILES: *c1cccc(-c2ccc3c(c2)sc2ccccc23)c1] | 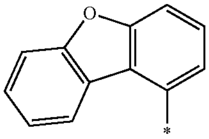 |
| N15 | 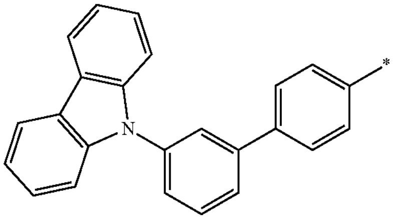 [SMILES: *c1ccc(-c2cccc(-n3c4ccccc4c4ccccc43)c2)cc1] | 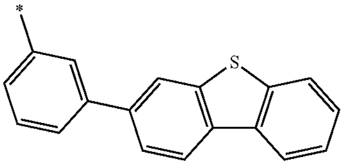 [SMILES: *c1cccc(-c2ccc3c(c2)sc2ccccc23)c1] | 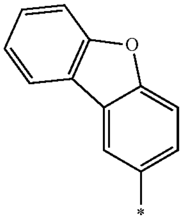 |
| N16 | 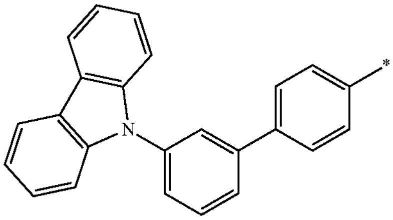 [SMILES: *c1ccc(-c2cccc(-n3c4ccccc4c4ccccc43)c2)cc1] | 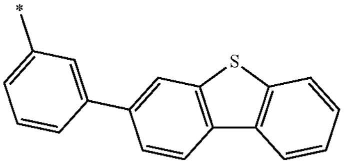 [SMILES: *c1cccc(-c2ccc3c(c2)sc2ccccc23)c1] | 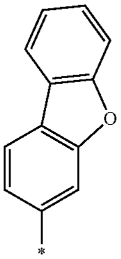 [SMILES: *c1ccc2c(c1)oc1ccccc12] |
| N17 | 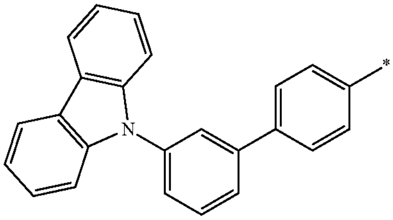 [SMILES: *c1ccc(-c2cccc(-n3c4ccccc4c4ccccc43)c2)cc1] | 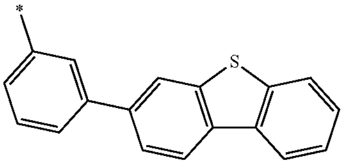 [SMILES: *c1cccc(-c2ccc3c(c2)sc2ccccc23)c1] | 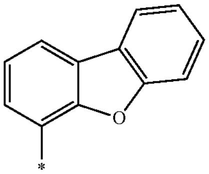 |
| N18 | 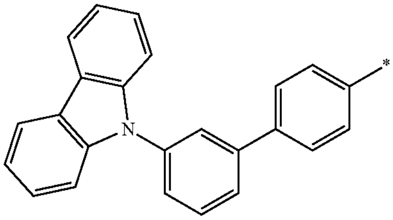 [SMILES: *c1ccc(-c2cccc(-n3c4ccccc4c4ccccc43)c2)cc1] | 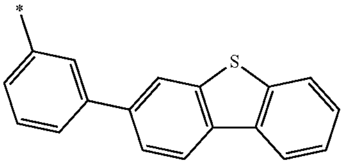 [SMILES: *c1cccc(-c2ccc3c(c2)sc2ccccc23)c1] | 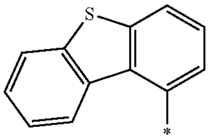 |

-continued
| Compound Group 1 | | | |
|---|---|---|---|
| Formula 1 | $Ar_1$ | $Ar_2$ | $Ar_3$ |
| N19 | 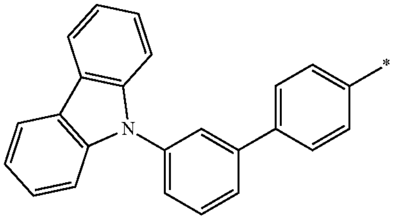 [SMILES: *c1ccc(-c2cccc(-n3c4ccccc4c4ccccc43)c2)cc1] | 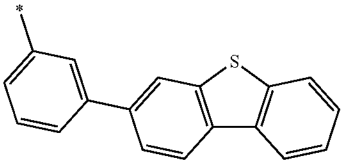 | 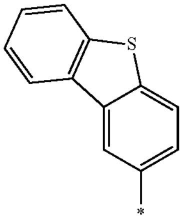 |
| N20 | 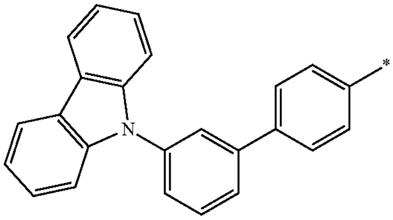 [SMILES: *c1ccc(-c2cccc(-n3c4ccccc4c4ccccc43)c2)cc1] | 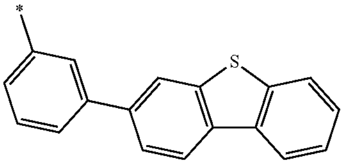 [SMILES: *c1cccc(-c2ccc3c(c2)sc2ccccc23)c1] | 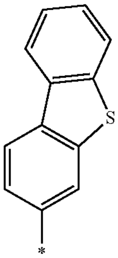 [SMILES: *c1ccc2c(c1)sc1ccccc12] |
| N21 | 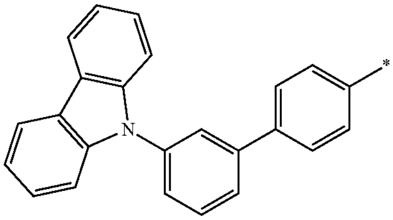 [SMILES: *c1ccc(-c2cccc(-n3c4ccccc4c4ccccc43)c2)cc1] | 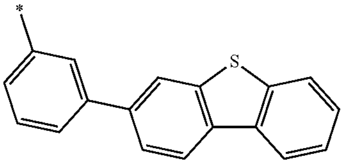 [SMILES: *c1cccc(-c2ccc3c(c2)sc2ccccc23)c1] | 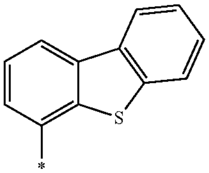 |
| N22 | 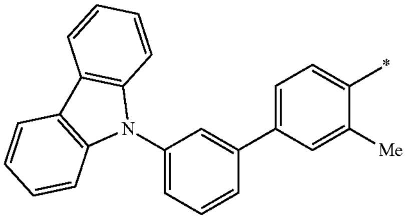 [SMILES: *c1ccc(-c2cccc(-n3c4ccccc4c4ccccc43)c2)cc1C] | 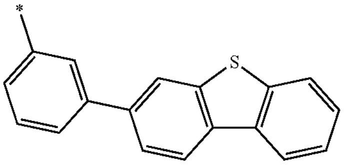 [SMILES: *c1cccc(-c2ccc3c(c2)sc2ccccc23)c1] | 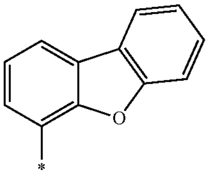 |
| N23 | 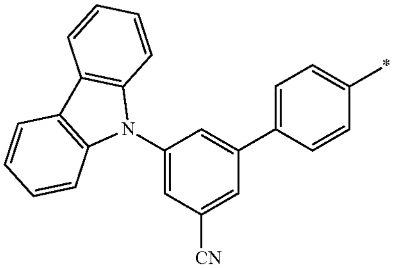 [SMILES: *c1ccc(-c2cc(C#N)cc(-n3c4ccccc4c4ccccc43)c2)cc1] | 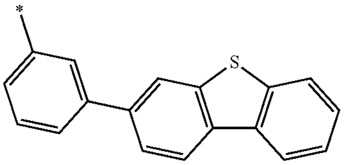 [SMILES: *c1cccc(-c2ccc3c(c2)sc2ccccc23)c1] | 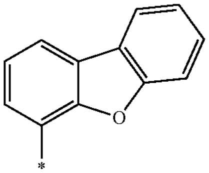 |
| O1 | 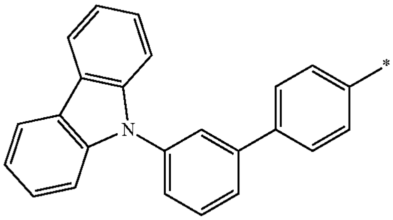 [SMILES: *c1ccc(-c2cccc(-n3c4ccccc4c4ccccc43)c2)cc1] | 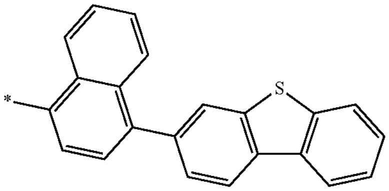 [SMILES: *c1ccc(-c2ccc3c(c2)sc2ccccc23)c2ccccc12] | 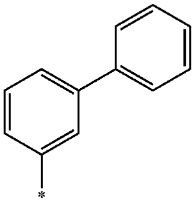 [SMILES: *c1cccc(-c2ccccc2)c1] |

-continued
| Compound Group 1 | | | |
|---|---|---|---|
| Formula 1 | $Ar_1$ | $Ar_2$ | $Ar_3$ |
| O2 | 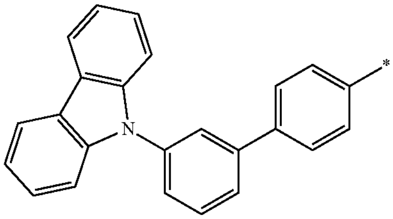 [SMILES: *c1ccc(-c2cccc(-n3c4ccccc4c4ccccc43)c2)cc1] | 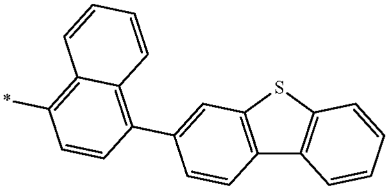 [SMILES: *c1ccc(-c2ccc3c(c2)sc2ccccc23)c2ccccc12] | 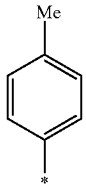 |
| O3 | 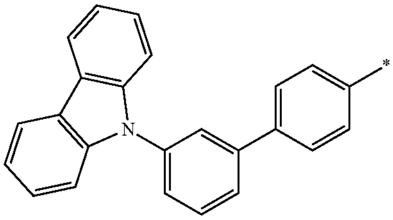 [SMILES: *c1ccc(-c2cccc(-n3c4ccccc4c4ccccc43)c2)cc1] | 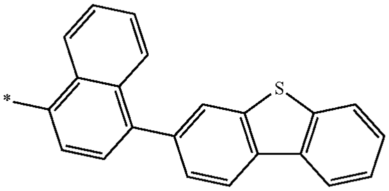 [SMILES: *c1ccc(-c2ccc3c(c2)sc2ccccc23)c2ccccc12] | 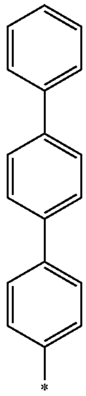 |
| O4 | 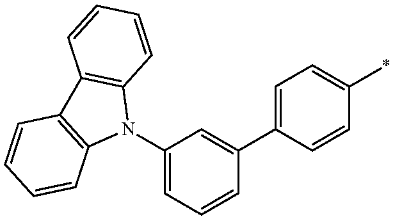 [SMILES: *c1ccc(-c2cccc(-n3c4ccccc4c4ccccc43)c2)cc1] | 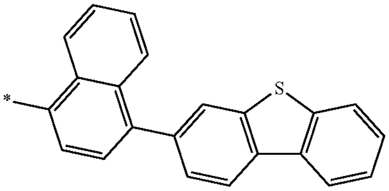 [SMILES: *c1ccc(-c2ccc3c(c2)sc2ccccc23)c2ccccc12] | 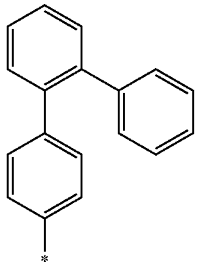 [SMILES: *c1ccc(-c2ccccc2-c2ccccc2)cc1] |
| O5 | 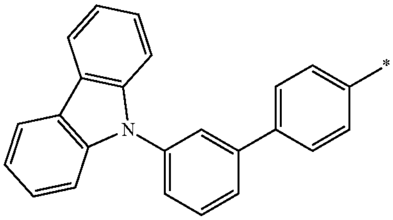 [SMILES: *c1ccc(-c2cccc(-n3c4ccccc4c4ccccc43)c2)cc1] | 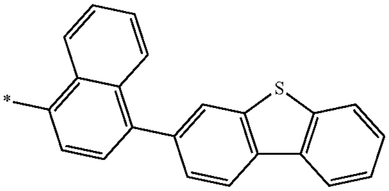 [SMILES: *c1ccc(-c2ccc3c(c2)sc2ccccc23)c2ccccc12] | 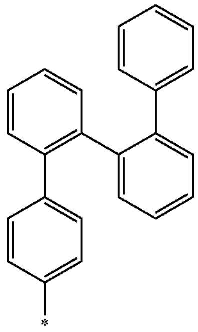 [SMILES: *c1ccc(-c2ccccc2-c2ccccc2-c2ccccc2)cc1] |
| O6 | 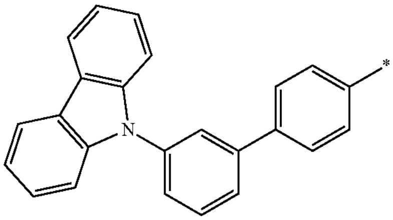 [SMILES: *c1ccc(-c2cccc(-n3c4ccccc4c4ccccc43)c2)cc1] | 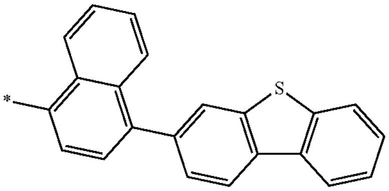 [SMILES: *c1ccc(-c2ccc3c(c2)sc2ccccc23)c2ccccc12] | 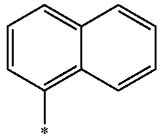 [SMILES: *c1cccc2ccccc12] |

-continued
| Compound Group 1 | | | |
| --- | --- | --- | --- |
| Formula 1 | $Ar_1$ | $Ar_2$ | $Ar_3$ |
| O7 | 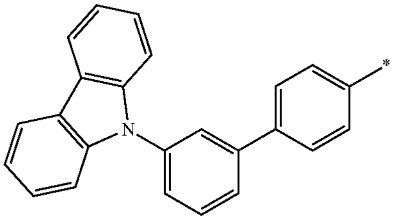 [SMILES: *c1ccc(-c2cccc(-n3c4ccccc4c4ccccc43)c2)cc1] | 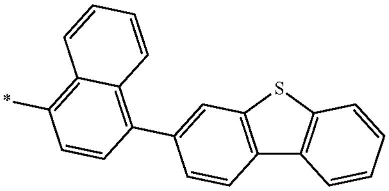 [SMILES: *c1ccc(-c2ccc3c(c2)sc2ccccc23)c2ccccc12] | 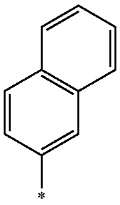 |
| O8 | 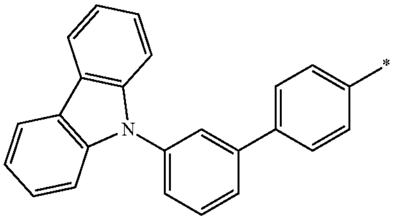 [SMILES: *c1ccc(-c2cccc(-n3c4ccccc4c4ccccc43)c2)cc1] | 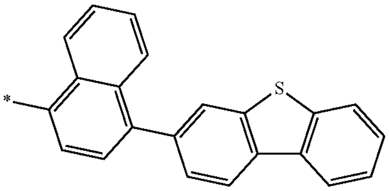 [SMILES: *c1ccc(-c2ccc3c(c2)sc2ccccc23)c2ccccc12] | 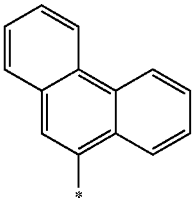 [SMILES: *c1cc2ccccc2c2ccccc12] |
| O9 | 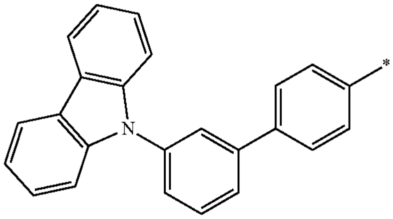 [SMILES: *c1ccc(-c2cccc(-n3c4ccccc4c4ccccc43)c2)cc1] | 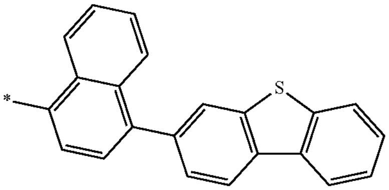 [SMILES: *c1ccc(-c2ccc3c(c2)sc2ccccc23)c2ccccc12] | 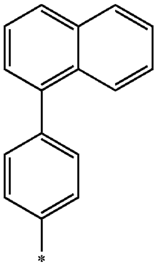 [SMILES: *c1ccc(-c2cccc3ccccc23)cc1] |
| O10 | 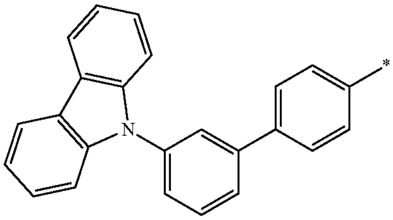 [SMILES: *c1ccc(-c2cccc(-n3c4ccccc4c4ccccc43)c2)cc1] | 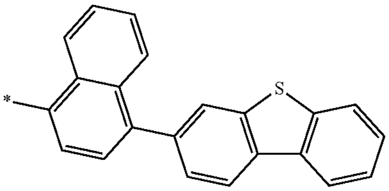 [SMILES: *c1ccc(-c2ccc3c(c2)sc2ccccc23)c2ccccc12] | 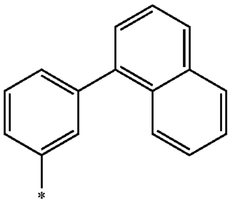 [SMILES: *c1cccc(-c2cccc3ccccc23)c1] |
| O11 | 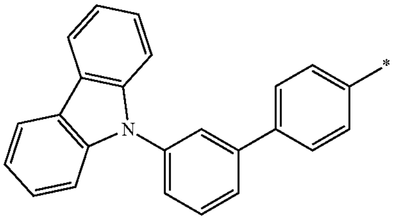 [SMILES: *c1ccc(-c2cccc(-n3c4ccccc4c4ccccc43)c2)cc1] | 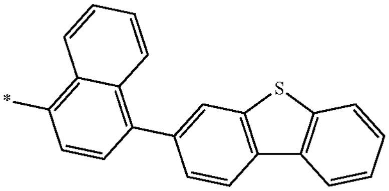 [SMILES: *c1ccc(-c2ccc3c(c2)sc2ccccc23)c2ccccc12] | 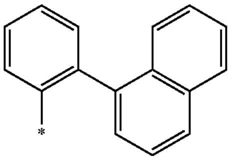 [SMILES: *c1ccccc1-c1cccc2ccccc12] |

-continued
| Compound Group 1 | | | |
| --- | --- | --- | --- |
| Formula 1 | $Ar_1$ | $Ar_2$ | $Ar_3$ |
| O12 | 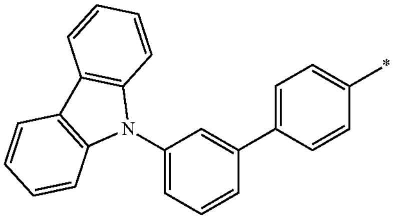 [SMILES: *c1ccc(-c2cccc(-n3c4ccccc4c4ccccc43)c2)cc1] | 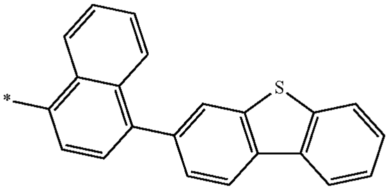 [SMILES: *c1ccc(-c2ccc3c(c2)sc2ccccc23)c2ccccc12] | 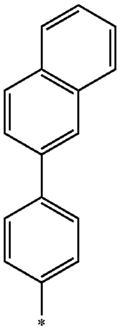 |
| O13 | 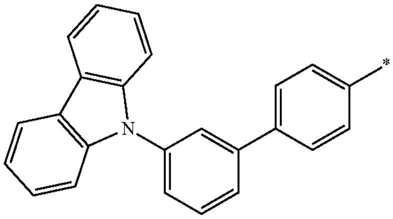 [SMILES: *c1ccc(-c2cccc(-n3c4ccccc4c4ccccc43)c2)cc1] | 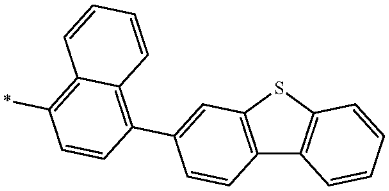 [SMILES: *c1ccc(-c2ccc3c(c2)sc2ccccc23)c2ccccc12] | 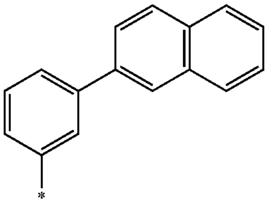 [SMILES: *c1cccc(-c2ccc3ccccc3c2)c1] |
| O14 | 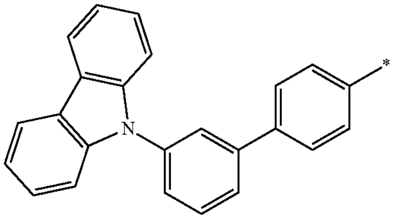 [SMILES: *c1ccc(-c2cccc(-n3c4ccccc4c4ccccc43)c2)cc1] | 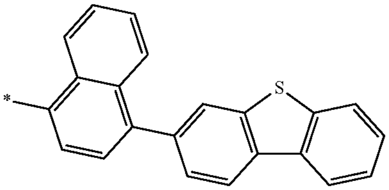 [SMILES: *c1ccc(-c2ccc3c(c2)sc2ccccc23)c2ccccc12] | 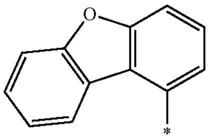 |
| O15 | 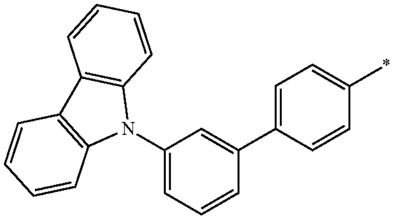 [SMILES: *c1ccc(-c2cccc(-n3c4ccccc4c4ccccc43)c2)cc1] | 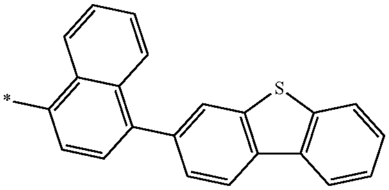 [SMILES: *c1ccc(-c2ccc3c(c2)sc2ccccc23)c2ccccc12] | 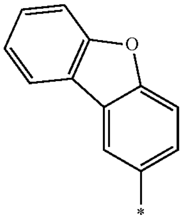 |
| O16 | 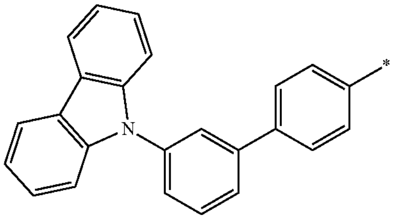 [SMILES: *c1ccc(-c2cccc(-n3c4ccccc4c4ccccc43)c2)cc1] | 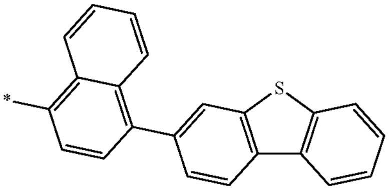 [SMILES: *c1ccc(-c2ccc3c(c2)sc2ccccc23)c2ccccc12] | 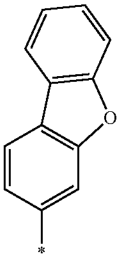 [SMILES: *c1ccc2c(c1)oc1ccccc12] |
| O17 | 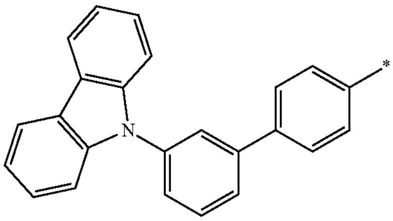 [SMILES: *c1ccc(-c2cccc(-n3c4ccccc4c4ccccc43)c2)cc1] | 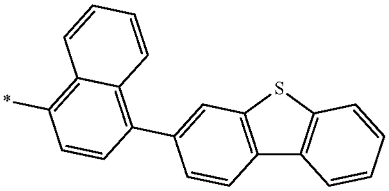 [SMILES: *c1ccc(-c2ccc3c(c2)sc2ccccc23)c2ccccc12] | 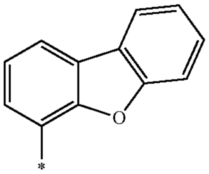 |

-continued
| Compound Group 1 | | | |
|---|---|---|---|
| Formula 1 | $Ar_1$ | $Ar_2$ | $Ar_3$ |
| O18 | 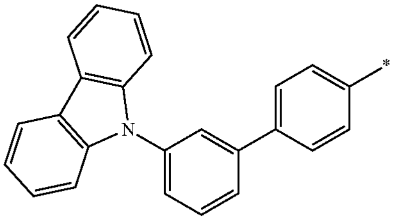 [SMILES: *c1ccc(-c2cccc(-n3c4ccccc4c4ccccc43)c2)cc1] | 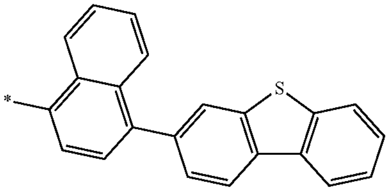 [SMILES: *c1ccc(-c2ccc3c(c2)sc2ccccc23)c2ccccc12] | 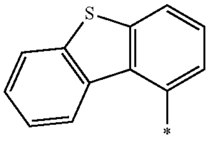 |
| O19 | 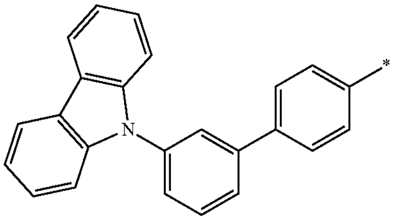 [SMILES: *c1ccc(-c2cccc(-n3c4ccccc4c4ccccc43)c2)cc1] | 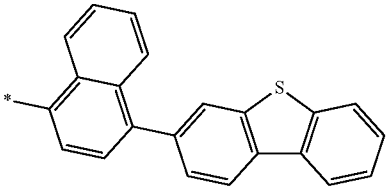 [SMILES: *c1ccc(-c2ccc3c(c2)sc2ccccc23)c2ccccc12] | 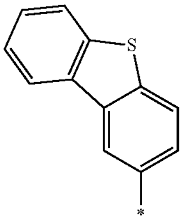 |
| O20 | 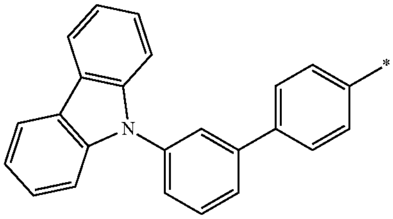 [SMILES: *c1ccc(-c2cccc(-n3c4ccccc4c4ccccc43)c2)cc1] | 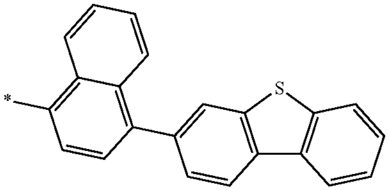 [SMILES: *c1ccc(-c2ccc3c(c2)sc2ccccc23)c2ccccc12] | 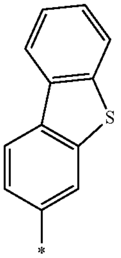 [SMILES: *c1ccc2c(c1)sc1ccccc12] |
| O21 | 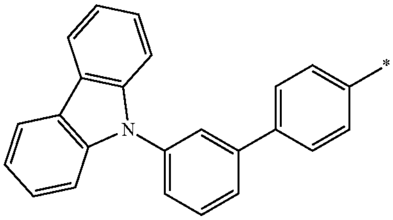 [SMILES: *c1ccc(-c2cccc(-n3c4ccccc4c4ccccc43)c2)cc1] | 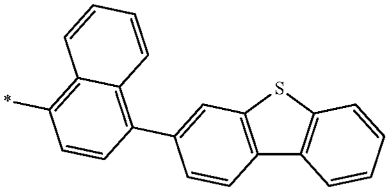 [SMILES: *c1ccc(-c2ccc3c(c2)sc2ccccc23)c2ccccc12] | 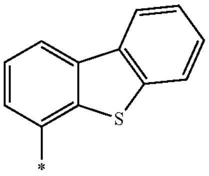 |
| O22 | 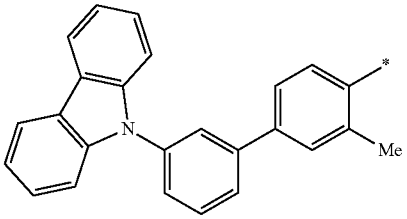 [SMILES: *c1ccc(-c2cccc(-n3c4ccccc4c4ccccc43)c2)cc1C] | 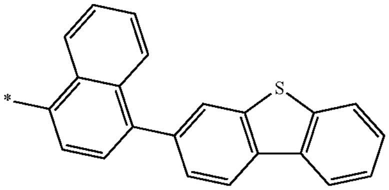 [SMILES: *c1ccc(-c2ccc3c(c2)sc2ccccc23)c2ccccc12] | 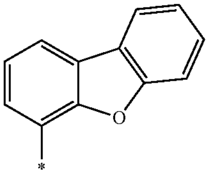 |
| O23 | 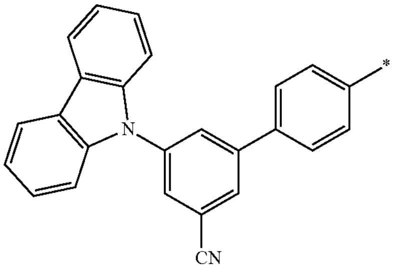 [SMILES: *c1ccc(-c2cc(C#N)cc(-n3c4ccccc4c4ccccc43)c2)cc1] | 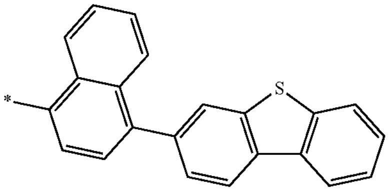 [SMILES: *c1ccc(-c2ccc3c(c2)sc2ccccc23)c2ccccc12] | 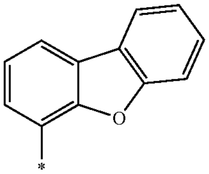 |

-continued
| Compound Group 1 | | | |
|---|---|---|---|
| Formula 1 | $Ar_1$ | $Ar_2$ | $Ar_3$ |
| P1 | 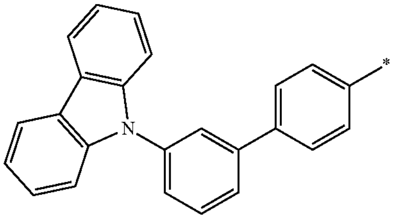 [SMILES: *c1ccc(-c2cccc(-n3c4ccccc4c4ccccc43)c2)cc1] | 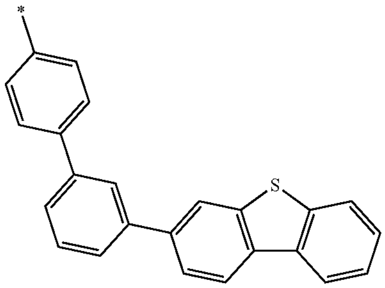 [SMILES: *c1ccc(-c2cccc(-c3ccc4c(c3)sc3ccccc34)c2)cc1] | 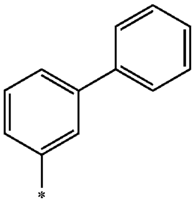 [SMILES: *c1cccc(-c2ccccc2)c1] |
| P2 | 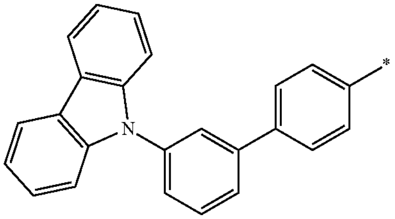 [SMILES: *c1ccc(-c2cccc(-n3c4ccccc4c4ccccc43)c2)cc1] | 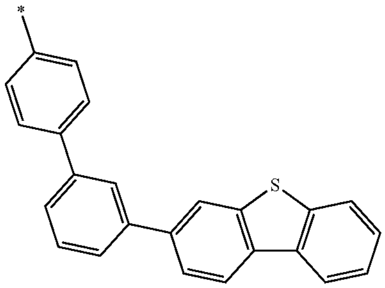 [SMILES: *c1ccc(-c2cccc(-c3ccc4c(c3)sc3ccccc34)c2)cc1] | 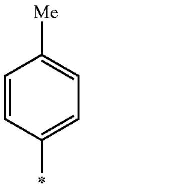 |
| P3 | 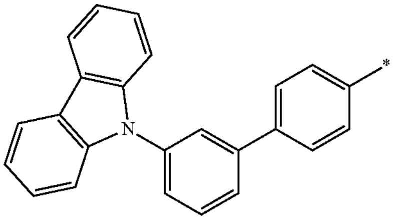 [SMILES: *c1ccc(-c2cccc(-n3c4ccccc4c4ccccc43)c2)cc1] | 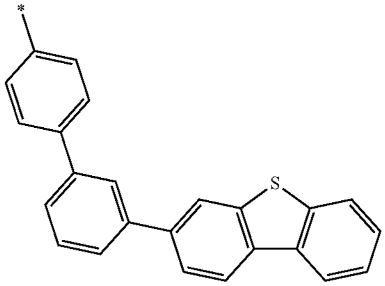 [SMILES: *c1ccc(-c2cccc(-c3ccc4c(c3)sc3ccccc34)c2)cc1] | 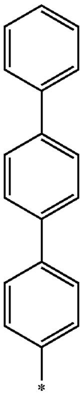 |
| P4 | 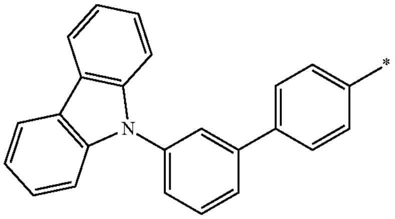 [SMILES: *c1ccc(-c2cccc(-n3c4ccccc4c4ccccc43)c2)cc1] | 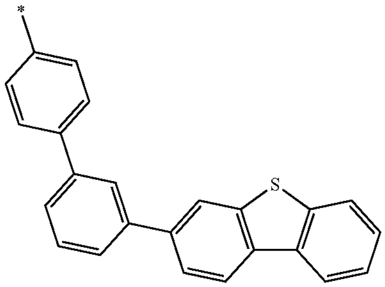 [SMILES: *c1ccc(-c2cccc(-c3ccc4c(c3)sc3ccccc34)c2)cc1] | 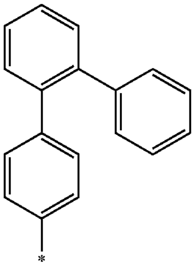 [SMILES: *c1ccc(-c2ccccc2-c2ccccc2)cc1] |

-continued
| Compound Group 1 | | | |
|---|---|---|---|
| Formula 1 | $Ar_1$ | $Ar_2$ | $Ar_3$ |
| P5 | 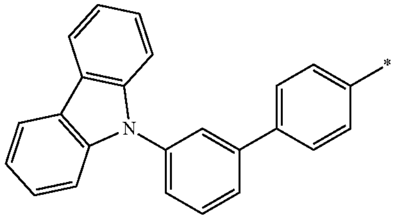 [SMILES: *c1ccc(-c2cccc(-n3c4ccccc4c4ccccc43)c2)cc1] | 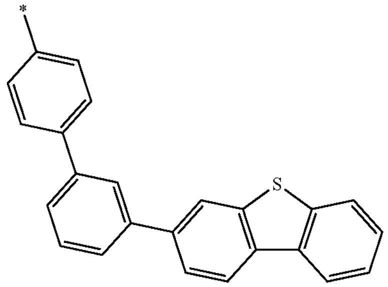 [SMILES: *c1ccc(-c2cccc(-c3ccc4c(c3)sc3ccccc34)c2)cc1] | 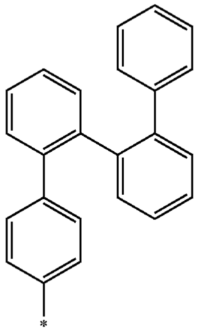 [SMILES: *c1ccc(-c2ccccc2-c2ccccc2-c2ccccc2)cc1] |
| P6 | 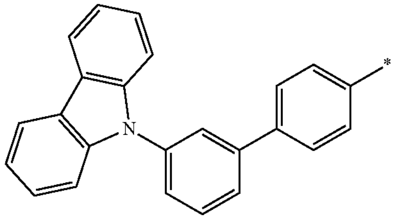 [SMILES: *c1ccc(-c2cccc(-n3c4ccccc4c4ccccc43)c2)cc1] | 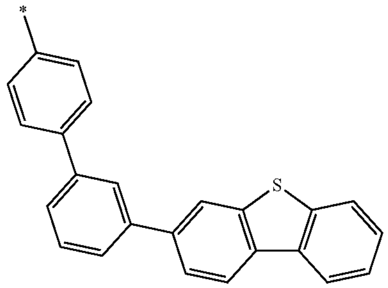 [SMILES: *c1ccc(-c2cccc(-c3ccc4c(c3)sc3ccccc34)c2)cc1] | 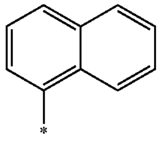 [SMILES: *c1cccc2ccccc12] |
| P7 | 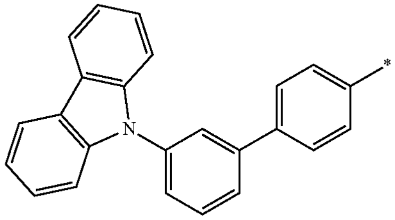 [SMILES: *c1ccc(-c2cccc(-n3c4ccccc4c4ccccc43)c2)cc1] | 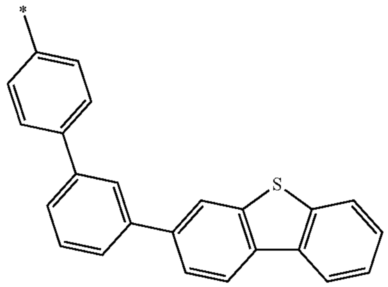 [SMILES: *c1ccc(-c2cccc(-c3ccc4c(c3)sc3ccccc34)c2)cc1] | 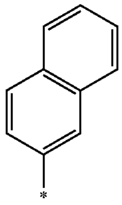 |
| P8 | 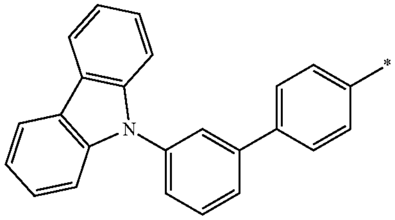 [SMILES: *c1ccc(-c2cccc(-n3c4ccccc4c4ccccc43)c2)cc1] | 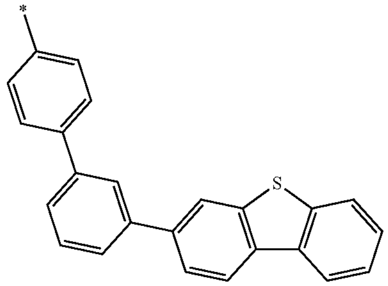 [SMILES: *c1ccc(-c2cccc(-c3ccc4c(c3)sc3ccccc34)c2)cc1] | 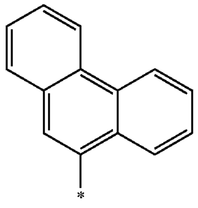 [SMILES: *c1cc2ccccc2c2ccccc12] |
| P9 | 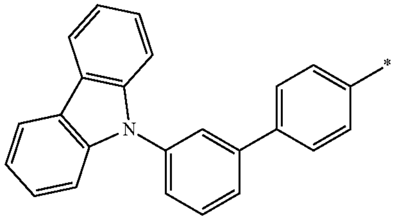 [SMILES: *c1ccc(-c2cccc(-n3c4ccccc4c4ccccc43)c2)cc1] | 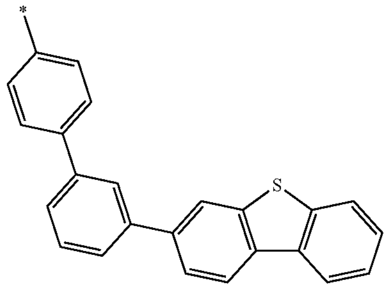 [SMILES: *c1ccc(-c2cccc(-c3ccc4c(c3)sc3ccccc34)c2)cc1] | 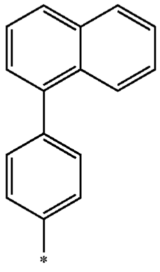 [SMILES: *c1ccc(-c2cccc3ccccc23)cc1] |

-continued
| Compound Group 1 | | | |
|---|---|---|---|
| Formula 1 | $Ar_1$ | $Ar_2$ | $Ar_3$ |
| P10 | 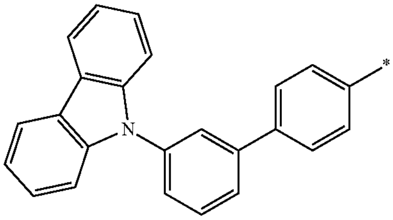 [SMILES: *c1ccc(-c2cccc(-n3c4ccccc4c4ccccc43)c2)cc1] | 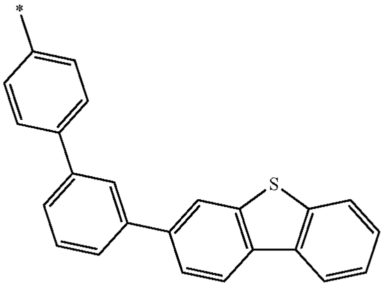 [SMILES: *c1ccc(-c2cccc(-c3ccc4c(c3)sc3ccccc34)c2)cc1] | 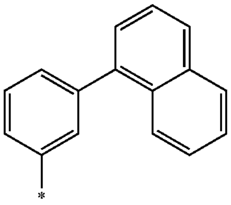 [SMILES: *c1cccc(-c2cccc3ccccc23)c1] |
| P11 | 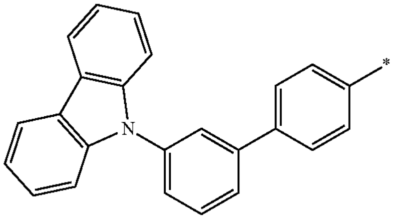 [SMILES: *c1ccc(-c2cccc(-n3c4ccccc4c4ccccc43)c2)cc1] | 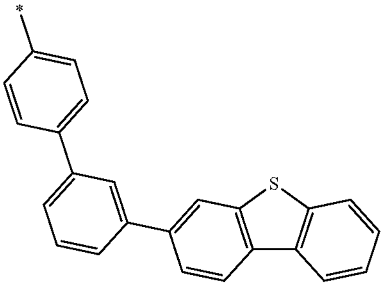 [SMILES: *c1ccc(-c2cccc(-c3ccc4c(c3)sc3ccccc34)c2)cc1] | 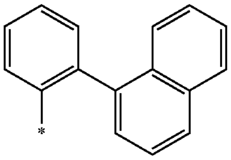 [SMILES: *c1ccccc1-c1cccc2ccccc12] |
| P12 | 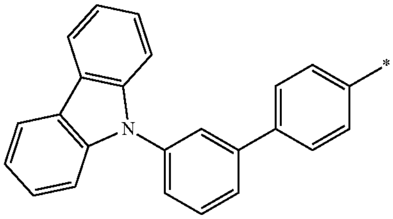 [SMILES: *c1ccc(-c2cccc(-n3c4ccccc4c4ccccc43)c2)cc1] | 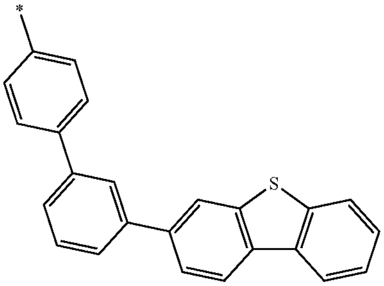 [SMILES: *c1ccc(-c2cccc(-c3ccc4c(c3)sc3ccccc34)c2)cc1] | 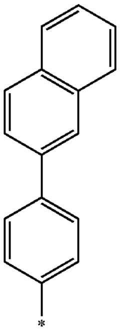 |
| P13 | 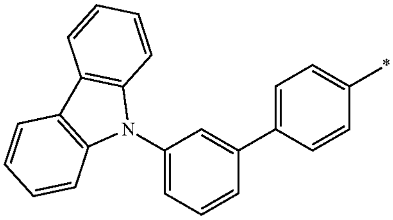 [SMILES: *c1ccc(-c2cccc(-n3c4ccccc4c4ccccc43)c2)cc1] | 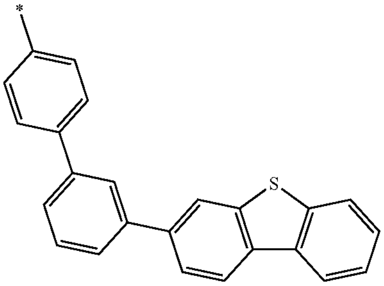 [SMILES: *c1ccc(-c2cccc(-c3ccc4c(c3)sc3ccccc34)c2)cc1] | 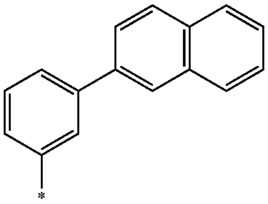 [SMILES: *c1cccc(-c2ccc3ccccc3c2)c1] |
| P14 | 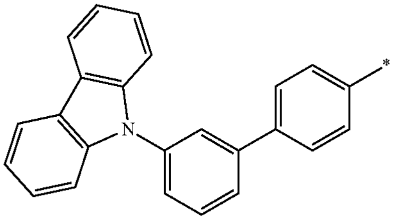 [SMILES: *c1ccc(-c2cccc(-n3c4ccccc4c4ccccc43)c2)cc1] | 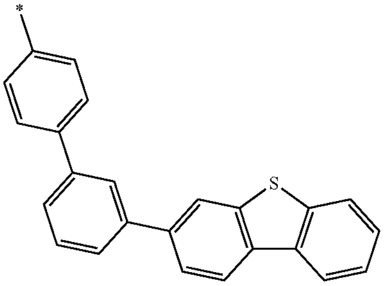 [SMILES: *c1ccc(-c2cccc(-c3ccc4c(c3)sc3ccccc34)c2)cc1] | 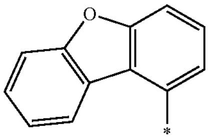 |

-continued
| Compound Group 1 | | | |
|---|---|---|---|
| Formula 1 | Ar$_1$ | Ar$_2$ | Ar$_3$ |
| P15 | 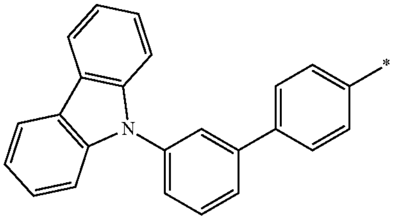 [SMILES: *c1ccc(-c2cccc(-n3c4ccccc4c4ccccc43)c2)cc1] | 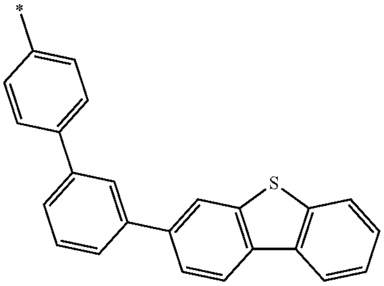 [SMILES: *c1ccc(-c2cccc(-c3ccc4c(c3)sc3ccccc34)c2)cc1] | 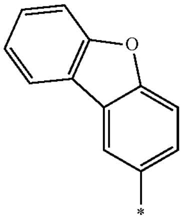 |
| P16 | 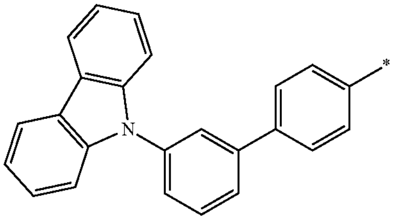 [SMILES: *c1ccc(-c2cccc(-n3c4ccccc4c4ccccc43)c2)cc1] | 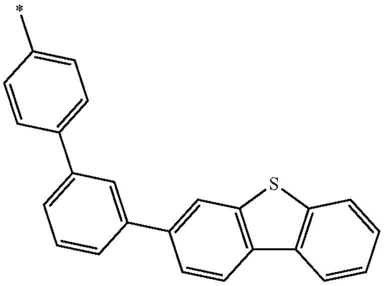 [SMILES: *c1ccc(-c2cccc(-c3ccc4c(c3)sc3ccccc34)c2)cc1] | 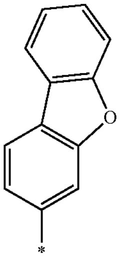 [SMILES: *c1ccc2c(c1)oc1ccccc12] |
| P17 | 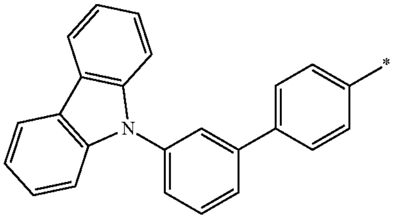 [SMILES: *c1ccc(-c2cccc(-n3c4ccccc4c4ccccc43)c2)cc1] | 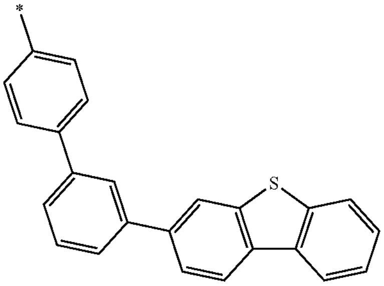 [SMILES: *c1ccc(-c2cccc(-c3ccc4c(c3)sc3ccccc34)c2)cc1] | 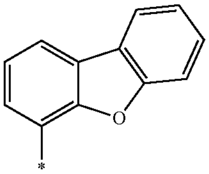 |
| P18 | 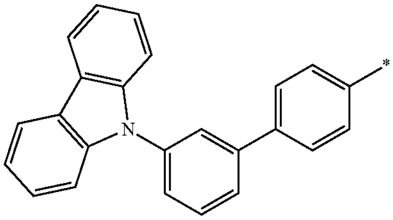 [SMILES: *c1ccc(-c2cccc(-n3c4ccccc4c4ccccc43)c2)cc1] | 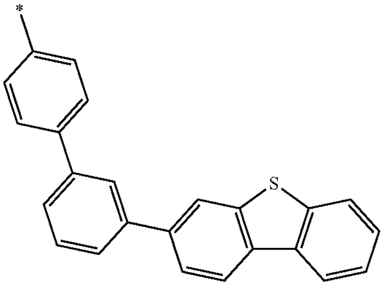 [SMILES: *c1ccc(-c2cccc(-c3ccc4c(c3)sc3ccccc34)c2)cc1] | 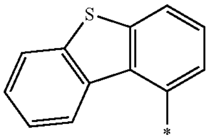 |
| P19 | 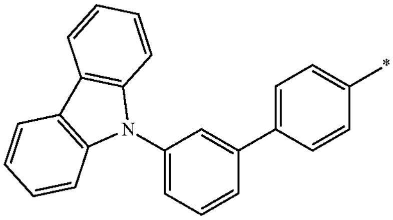 [SMILES: *c1ccc(-c2cccc(-n3c4ccccc4c4ccccc43)c2)cc1] | 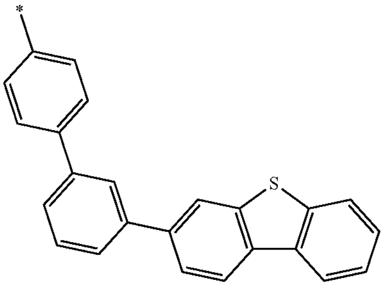 [SMILES: *c1ccc(-c2cccc(-c3ccc4c(c3)sc3ccccc34)c2)cc1] | 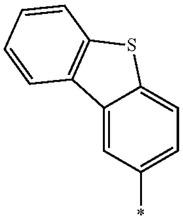 [SMILES: *c1ccc2sc3ccccc3c2c1] |

-continued
Compound Group 1
| Formula 1 | $Ar_1$ | $Ar_2$ | $Ar_3$ |
| --- | --- | --- | --- |
| P20 | 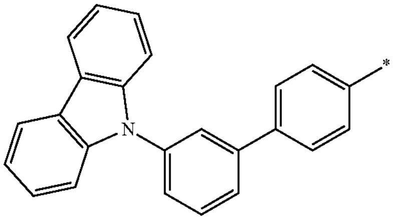 [SMILES: *c1ccc(-c2cccc(-n3c4ccccc4c4ccccc43)c2)cc1] | 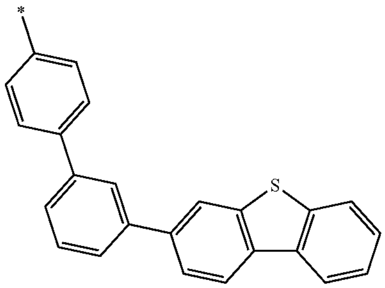 [SMILES: *c1ccc(-c2cccc(-c3ccc4c(c3)sc3ccccc34)c2)cc1] | 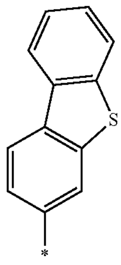 [SMILES: *c1ccc2c(c1)sc1ccccc12] |
| P21 | 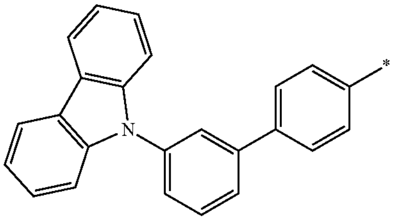 [SMILES: *c1ccc(-c2cccc(-n3c4ccccc4c4ccccc43)c2)cc1] | 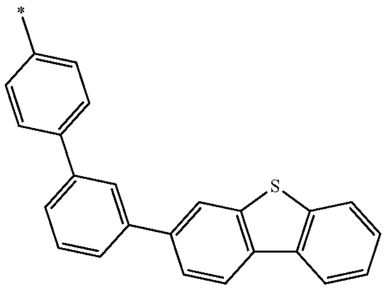 [SMILES: *c1ccc(-c2cccc(-c3ccc4c(c3)sc3ccccc34)c2)cc1] | 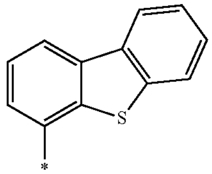 |
| P22 | 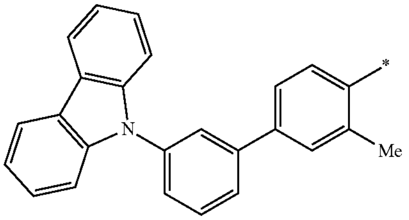 [SMILES: *c1ccc(-c2cccc(-n3c4ccccc4c4ccccc43)c2)cc1C] | 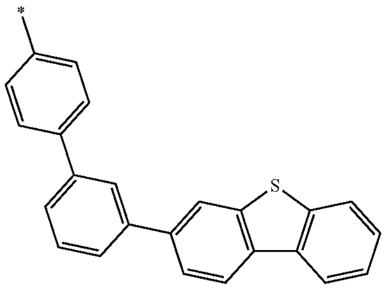 [SMILES: *c1ccc(-c2cccc(-c3ccc4c(c3)sc3ccccc34)c2)cc1] | 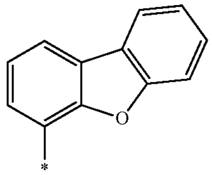 |
| P23 | 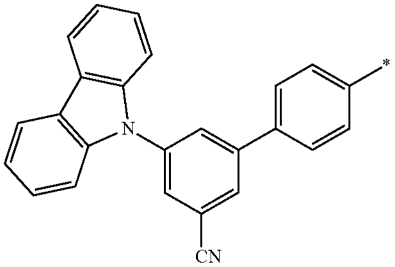 [SMILES: *c1ccc(-c2cc(C#N)cc(-n3c4ccccc4c4ccccc43)c2)cc1] | 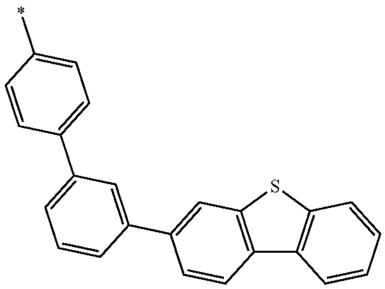 [SMILES: *c1ccc(-c2cccc(-c3ccc4c(c3)sc3ccccc34)c2)cc1] | 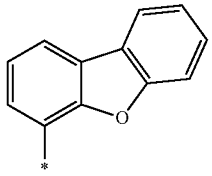 |
| Q1 | 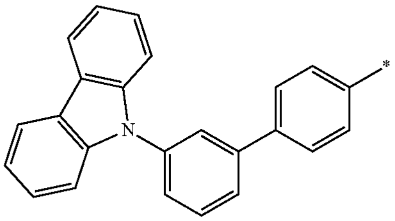 [SMILES: *c1ccc(-c2cccc(-n3c4ccccc4c4ccccc43)c2)cc1] | 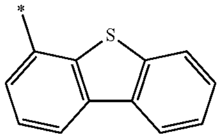 [SMILES: *c1cccc2c1sc1ccccc12] | 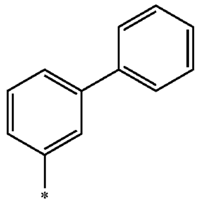 [SMILES: *c1cccc(-c2ccccc2)c1] |

-continued
Compound Group 1
| Formula 1 | $Ar_1$ | $Ar_2$ | $Ar_3$ |
|---|---|---|---|
| Q2 | 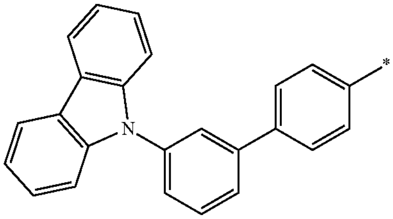 [SMILES: *c1ccc(-c2cccc(-n3c4ccccc4c4ccccc43)c2)cc1] | 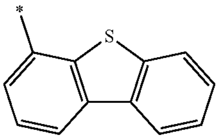 [SMILES: *c1cccc2c1sc1ccccc12] | 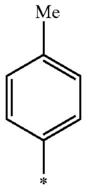 |
| Q3 | 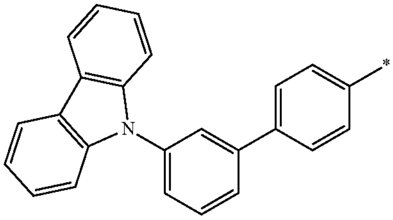 [SMILES: *c1ccc(-c2cccc(-n3c4ccccc4c4ccccc43)c2)cc1] | 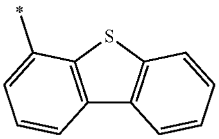 [SMILES: *c1cccc2c1sc1ccccc12] | 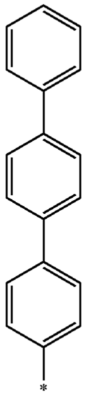 |
| Q4 | 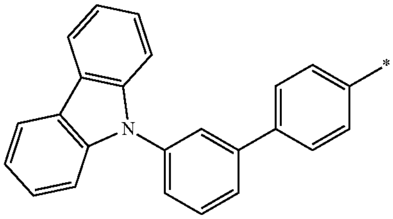 [SMILES: *c1ccc(-c2cccc(-n3c4ccccc4c4ccccc43)c2)cc1] | 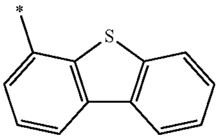 [SMILES: *c1cccc2c1sc1ccccc12] | 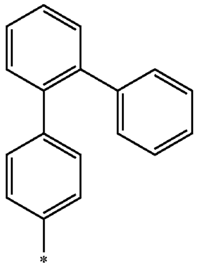 [SMILES: *c1ccc(-c2ccccc2-c2ccccc2)cc1] |
| Q5 | 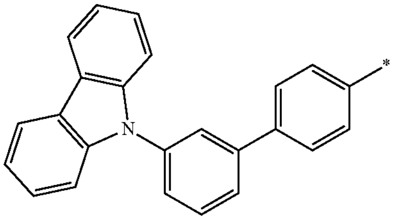 [SMILES: *c1ccc(-c2cccc(-n3c4ccccc4c4ccccc43)c2)cc1] | 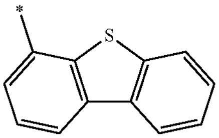 [SMILES: *c1cccc2c1sc1ccccc12] | 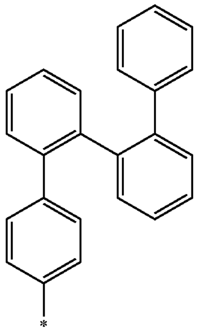 [SMILES: *c1ccc(-c2ccccc2-c2ccccc2-c2ccccc2)cc1] |
| Q6 | 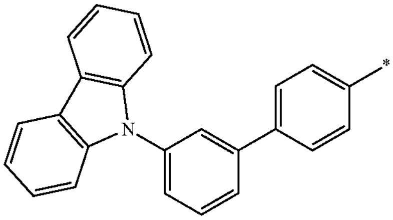 [SMILES: *c1ccc(-c2cccc(-n3c4ccccc4c4ccccc43)c2)cc1] | 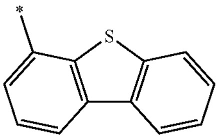 [SMILES: *c1cccc2c1sc1ccccc12] | 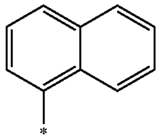 [SMILES: *c1cccc2ccccc12] |

-continued
| Compound Group 1 | | | |
|---|---|---|---|
| Formula 1 | $Ar_1$ | $Ar_2$ | $Ar_3$ |
| Q7 | 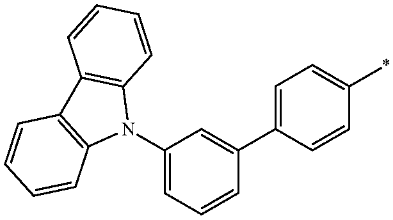 [SMILES: *c1ccc(-c2cccc(-n3c4ccccc4c4ccccc43)c2)cc1] | 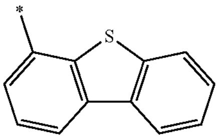 [SMILES: *c1cccc2c1sc1ccccc12] | 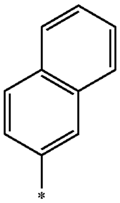 |
| Q8 | 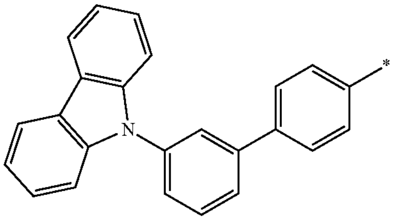 [SMILES: *c1ccc(-c2cccc(-n3c4ccccc4c4ccccc43)c2)cc1] | 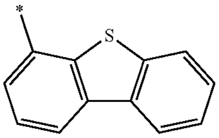 [SMILES: *c1cccc2c1sc1ccccc12] | 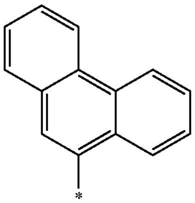 [SMILES: *c1cc2ccccc2c2ccccc12] |
| Q9 | 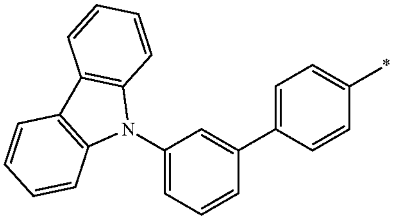 [SMILES: *c1ccc(-c2cccc(-n3c4ccccc4c4ccccc43)c2)cc1] | 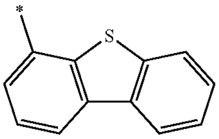 | 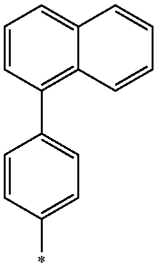 [SMILES: *c1ccc(-c2cccc3ccccc23)cc1] |
| Q10 | 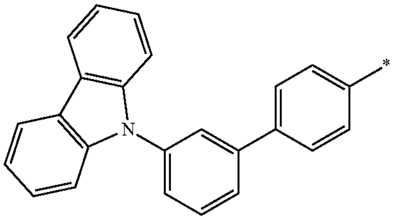 [SMILES: *c1ccc(-c2cccc(-n3c4ccccc4c4ccccc43)c2)cc1] | 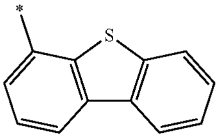 [SMILES: *c1cccc2c1sc1ccccc12] | 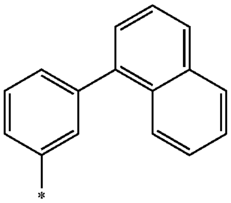 [SMILES: *c1cccc(-c2cccc3ccccc23)c1] |
| Q11 | 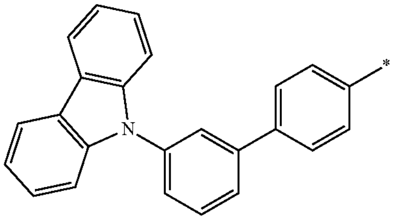 [SMILES: *c1ccc(-c2cccc(-n3c4ccccc4c4ccccc43)c2)cc1] | 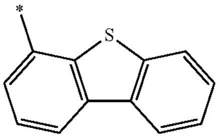 [SMILES: *c1cccc2c1sc1ccccc12] | 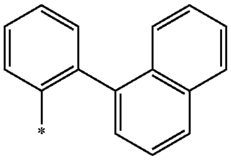 [SMILES: *c1ccccc1-c1cccc2ccccc12] |

-continued
Compound Group 1
| Formula 1 | $Ar_1$ | $Ar_2$ | $Ar_3$ |
|---|---|---|---|
| Q12 | 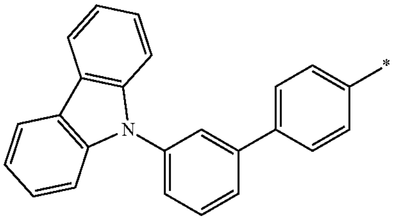 [SMILES: *c1ccc(-c2cccc(-n3c4ccccc4c4ccccc43)c2)cc1] | 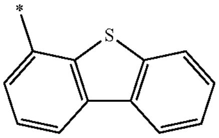 [SMILES: *c1cccc2c1sc1ccccc12] | 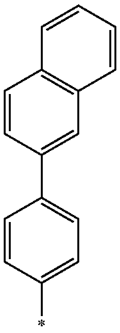 |
| Q13 | 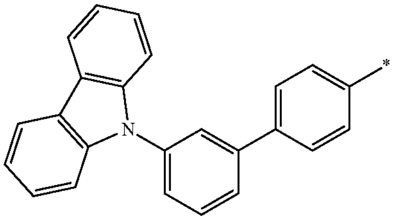 [SMILES: *c1ccc(-c2cccc(-n3c4ccccc4c4ccccc43)c2)cc1] | 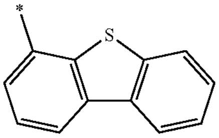 | 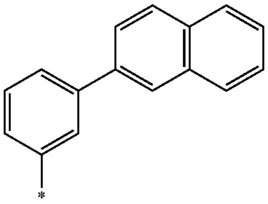 [SMILES: *c1cccc(-c2ccc3ccccc3c2)c1] |
| Q14 | 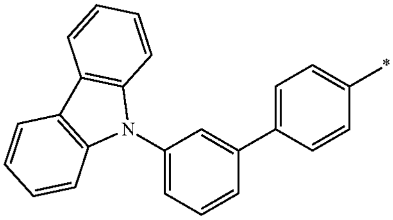 [SMILES: *c1ccc(-c2cccc(-n3c4ccccc4c4ccccc43)c2)cc1] | 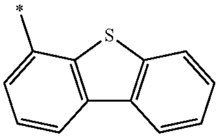 [SMILES: *c1cccc2c1sc1ccccc12] | 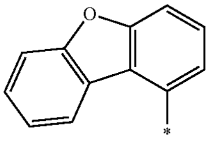 |
| Q15 | 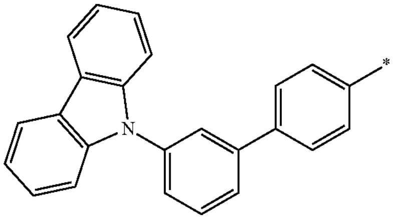 [SMILES: *c1ccc(-c2cccc(-n3c4ccccc4c4ccccc43)c2)cc1] | 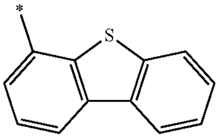 [SMILES: *c1cccc2c1sc1ccccc12] | 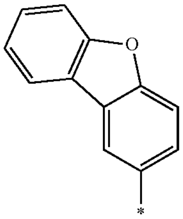 |
| Q16 | 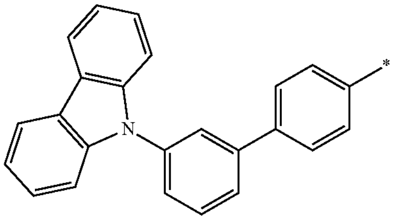 [SMILES: *c1ccc(-c2cccc(-n3c4ccccc4c4ccccc43)c2)cc1] | 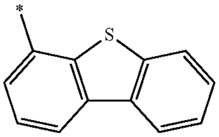 [SMILES: *c1cccc2c1sc1ccccc12] | 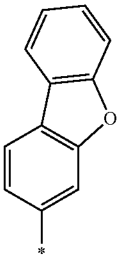 [SMILES: *c1ccc2c(c1)oc1ccccc12] |
| Q17 | 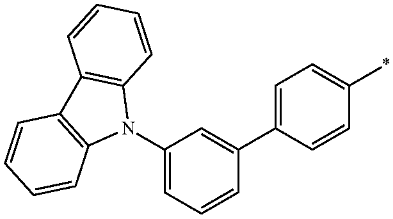 [SMILES: *c1ccc(-c2cccc(-n3c4ccccc4c4ccccc43)c2)cc1] | 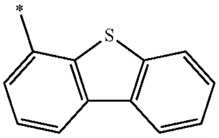 [SMILES: *c1cccc2c1sc1ccccc12] | 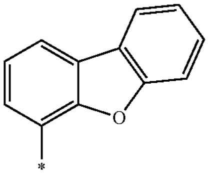 |

-continued
Compound Group 1
| Formula 1 | $Ar_1$ | $Ar_2$ | $Ar_3$ |
|---|---|---|---|
| Q18 | 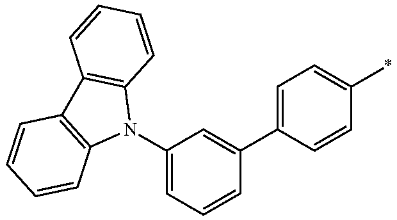 [SMILES: *c1ccc(-c2cccc(-n3c4ccccc4c4ccccc43)c2)cc1] | 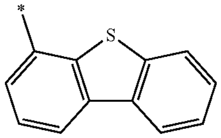 [SMILES: *c1cccc2c1sc1ccccc12] | 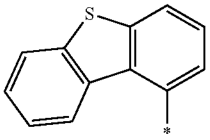 |
| Q19 | 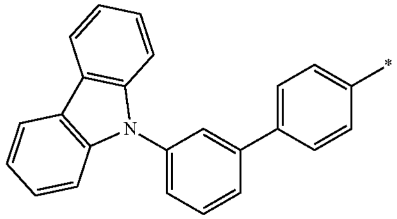 [SMILES: *c1ccc(-c2cccc(-n3c4ccccc4c4ccccc43)c2)cc1] | 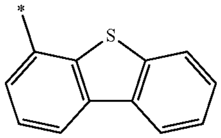 [SMILES: *c1cccc2c1sc1ccccc12] | 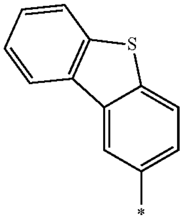 |
| Q20 | 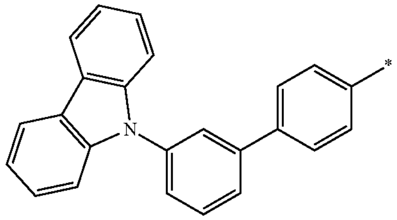 [SMILES: *c1ccc(-c2cccc(-n3c4ccccc4c4ccccc43)c2)cc1] | 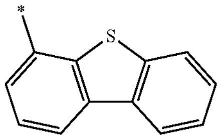 [SMILES: *c1cccc2c1sc1ccccc12] | 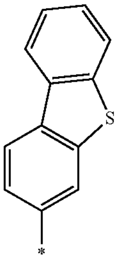 [SMILES: *c1ccc2c(c1)sc1ccccc12] |
| Q21 | 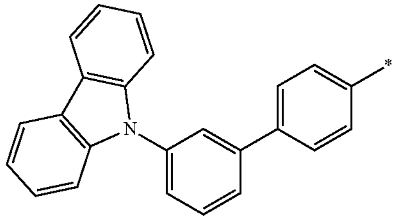 [SMILES: *c1ccc(-c2cccc(-n3c4ccccc4c4ccccc43)c2)cc1] | 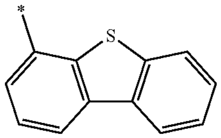 [SMILES: *c1cccc2c1sc1ccccc12] | 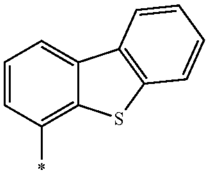 |
| Q22 | 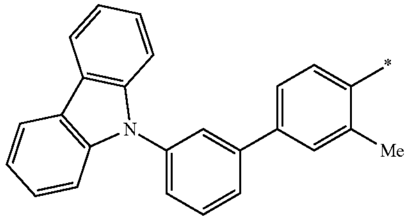 [SMILES: *c1ccc(-c2cccc(-n3c4ccccc4c4ccccc43)c2)cc1C] | 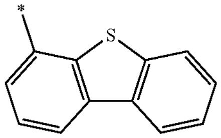 [SMILES: *c1cccc2c1sc1ccccc12] | 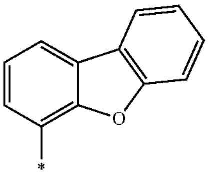 |
| Q23 | 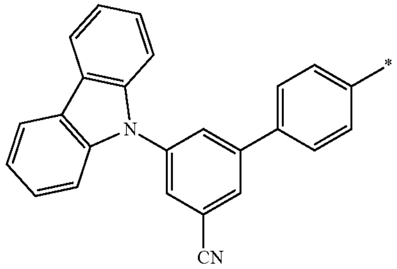 [SMILES: *c1ccc(-c2cc(C#N)cc(-n3c4ccccc4c4ccccc43)c2)cc1] | 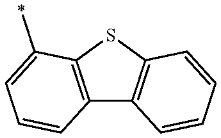 [SMILES: *c1cccc2c1sc1ccccc12] | 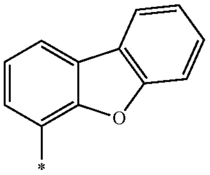 |

-continued
| Compound Group 1 | | | |
|---|---|---|---|
| Formula 1 | $Ar_1$ | $Ar_2$ | $Ar_3$ |
| Q24 | 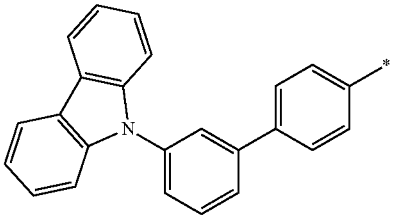 [SMILES: *c1ccc(-c2cccc(-n3c4ccccc4c4ccccc43)c2)cc1] | 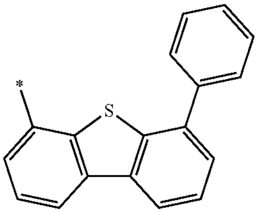 [SMILES: *c1cccc2c1sc1c(-c3ccccc3)cccc12] | 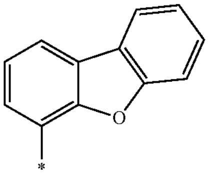 |
| Q25 | 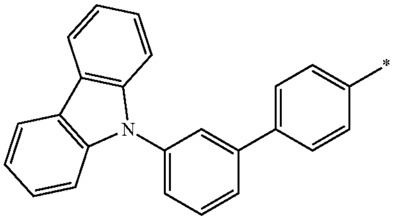 [SMILES: *c1ccc(-c2cccc(-n3c4ccccc4c4ccccc43)c2)cc1] | 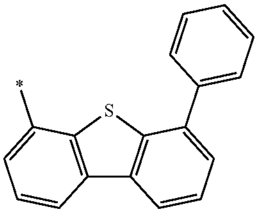 [SMILES: *c1cccc2c1sc1c(-c3ccccc3)cccc12] | 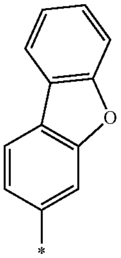 [SMILES: *c1ccc2c(c1)oc1ccccc12] |
| Q26 | 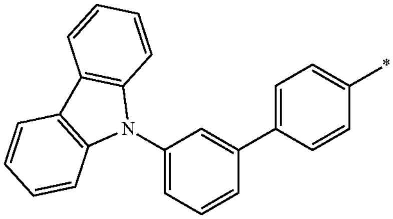 [SMILES: *c1ccc(-c2cccc(-n3c4ccccc4c4ccccc43)c2)cc1] | 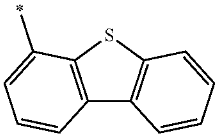 [SMILES: *c1cccc2c1sc1ccccc12] | 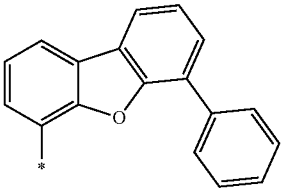 [SMILES: *c1cccc2c1oc1c(-c3ccccc3)cccc12] |
| Q27 | 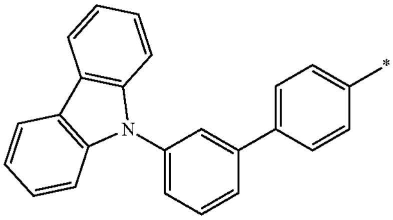 [SMILES: *c1ccc(-c2cccc(-n3c4ccccc4c4ccccc43)c2)cc1] | 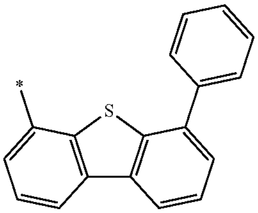 [SMILES: *c1cccc2c1sc1c(-c3ccccc3)cccc12] | 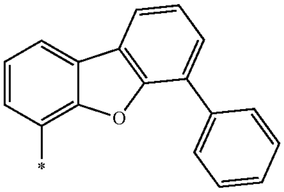 [SMILES: *c1cccc2c1oc1c(-c3ccccc3)cccc12] |
| S1 | 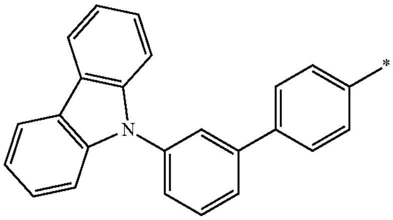 [SMILES: *c1ccc(-c2cccc(-n3c4ccccc4c4ccccc43)c2)cc1] | 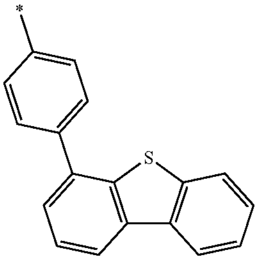 [SMILES: *c1ccc(-c2cccc3c2sc2ccccc23)cc1] | 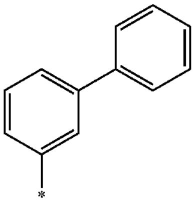 [SMILES: *c1cccc(-c2ccccc2)c1] |
| S2 | 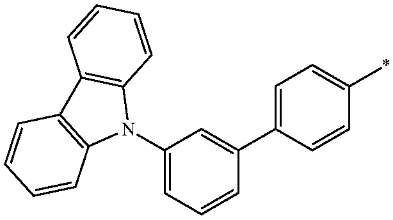 [SMILES: *c1ccc(-c2cccc(-n3c4ccccc4c4ccccc43)c2)cc1] | 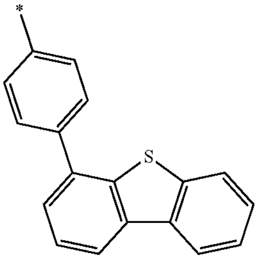 [SMILES: *c1ccc(-c2cccc3c2sc2ccccc23)cc1] | 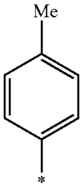 |

-continued
Compound Group 1
| Formula 1 | $Ar_1$ | $Ar_2$ | $Ar_3$ |
| --- | --- | --- | --- |
| S4 | 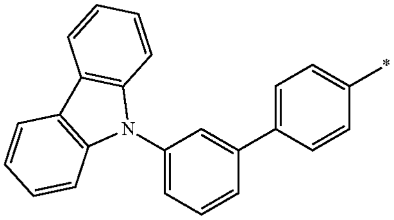 [SMILES: *c1ccc(-c2cccc(-n3c4ccccc4c4ccccc43)c2)cc1] | 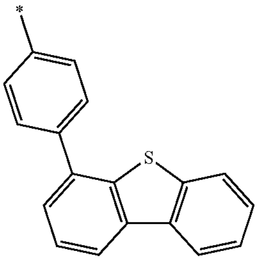 [SMILES: *c1ccc(-c2cccc3c2sc2ccccc23)cc1] | 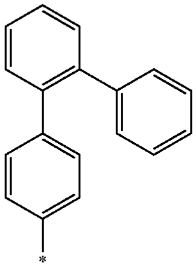 [SMILES: *c1ccc(-c2ccccc2-c2ccccc2)cc1] |
| S5 | 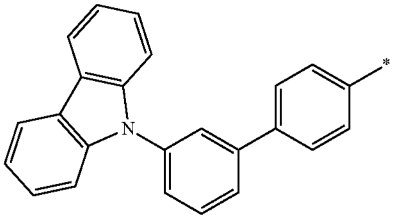 [SMILES: *c1ccc(-c2cccc(-n3c4ccccc4c4ccccc43)c2)cc1] | 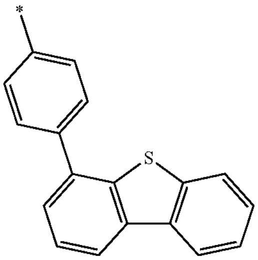 [SMILES: *c1ccc(-c2cccc3c2sc2ccccc23)cc1] | 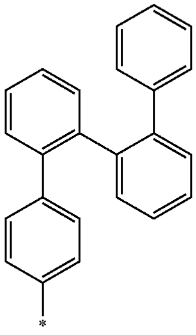 [SMILES: *c1ccc(-c2ccccc2-c2ccccc2-c2ccccc2)cc1] |
| S6 | 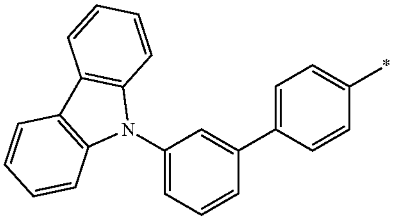 [SMILES: *c1ccc(-c2cccc(-n3c4ccccc4c4ccccc43)c2)cc1] | 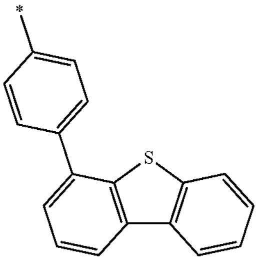 [SMILES: *c1ccc(-c2cccc3c2sc2ccccc23)cc1] | 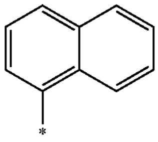 [SMILES: *c1cccc2ccccc12] |
| S7 | 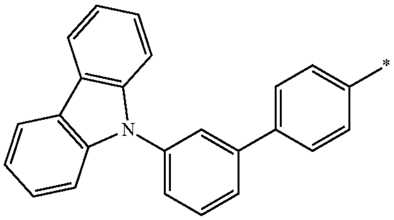 [SMILES: *c1ccc(-c2cccc(-n3c4ccccc4c4ccccc43)c2)cc1] | 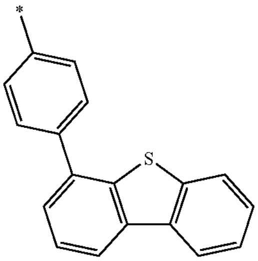 [SMILES: *c1ccc(-c2cccc3c2sc2ccccc23)cc1] | 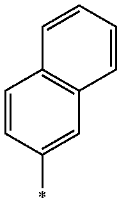 |
| S8 | 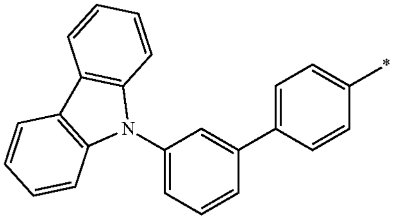 [SMILES: *c1ccc(-c2cccc(-n3c4ccccc4c4ccccc43)c2)cc1] | 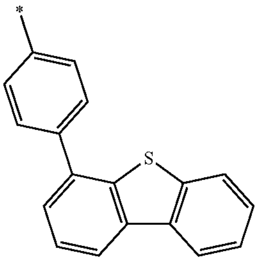 [SMILES: *c1ccc(-c2cccc3c2sc2ccccc23)cc1] | 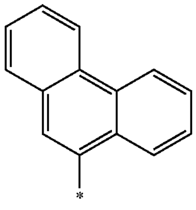 [SMILES: *c1cc2ccccc2c2ccccc12] |

-continued
| Compound Group 1 | | | |
|---|---|---|---|
| Formula 1 | $Ar_1$ | $Ar_2$ | $Ar_3$ |
| S10 | 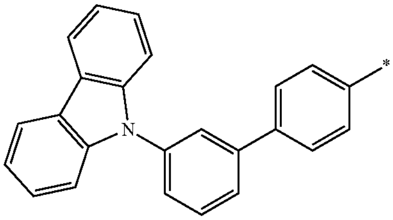 [SMILES: *c1ccc(-c2cccc(-n3c4ccccc4c4ccccc43)c2)cc1] | 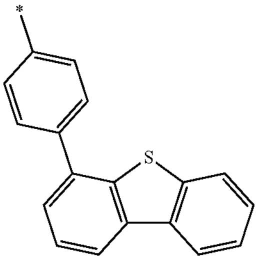 [SMILES: *c1ccc(-c2cccc3c2sc2ccccc23)cc1] | 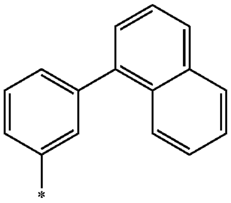 [SMILES: *c1cccc(-c2cccc3ccccc23)c1] |
| S11 | 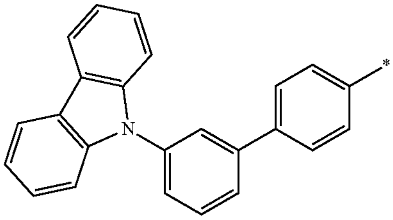 [SMILES: *c1ccc(-c2cccc(-n3c4ccccc4c4ccccc43)c2)cc1] | 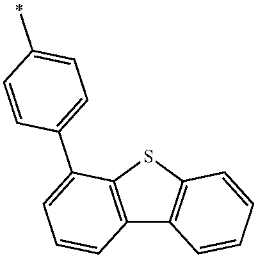 [SMILES: *c1ccc(-c2cccc3c2sc2ccccc23)cc1] | 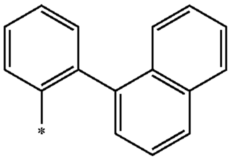 [SMILES: *c1ccccc1-c1cccc2ccccc12] |
| S13 | 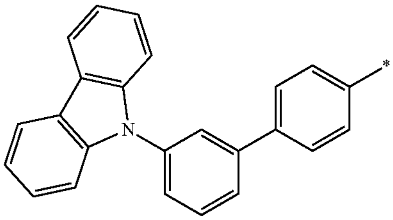 [SMILES: *c1ccc(-c2cccc(-n3c4ccccc4c4ccccc43)c2)cc1] | 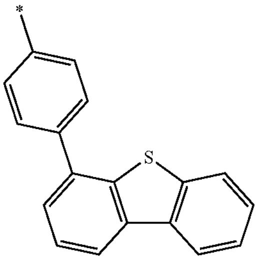 [SMILES: *c1ccc(-c2cccc3c2sc2ccccc23)cc1] | 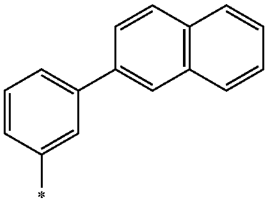 [SMILES: *c1cccc(-c2ccc3ccccc3c2)c1] |
| S14 | 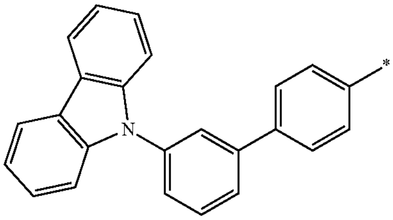 [SMILES: *c1ccc(-c2cccc(-n3c4ccccc4c4ccccc43)c2)cc1] | 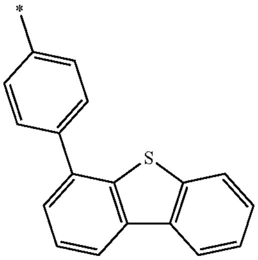 [SMILES: *c1ccc(-c2cccc3c2sc2ccccc23)cc1] | 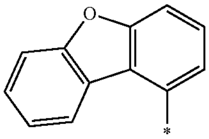 |
| S15 | 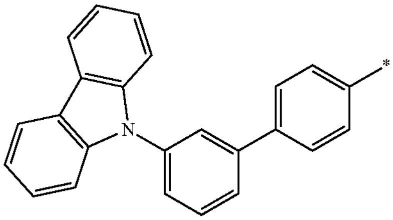 [SMILES: *c1ccc(-c2cccc(-n3c4ccccc4c4ccccc43)c2)cc1] | 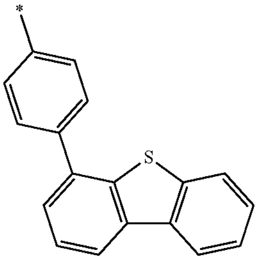 [SMILES: *c1ccc(-c2cccc3c2sc2ccccc23)cc1] | 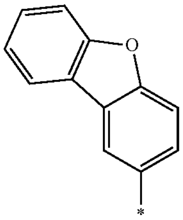 [SMILES: *c1ccc2oc3ccccc3c2c1] |

-continued
| Compound Group 1 | | | |
|---|---|---|---|
| Formula 1 | $Ar_1$ | $Ar_2$ | $Ar_3$ |
| S16 | 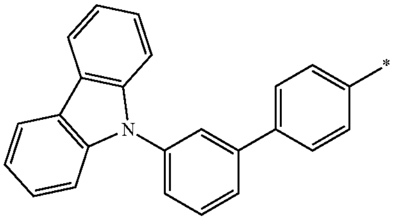 [SMILES: *c1ccc(-c2cccc(-n3c4ccccc4c4ccccc43)c2)cc1] | 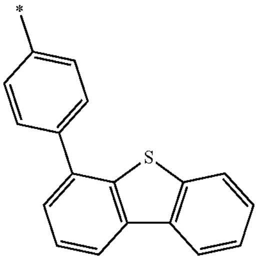 [SMILES: *c1ccc(-c2cccc3c2sc2ccccc23)cc1] | 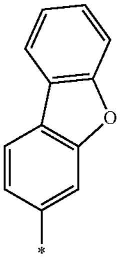 [SMILES: *c1ccc2c(c1)oc1ccccc12] |
| S17 | 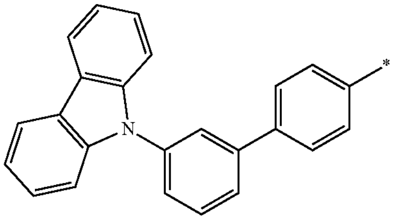 [SMILES: *c1ccc(-c2cccc(-n3c4ccccc4c4ccccc43)c2)cc1] | 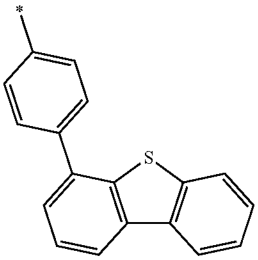 [SMILES: *c1ccc(-c2cccc3c2sc2ccccc23)cc1] | 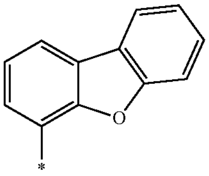 |
| S18 | 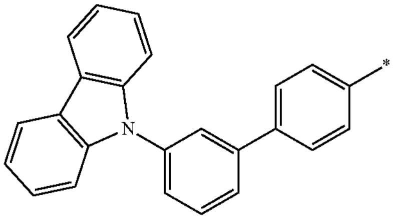 [SMILES: *c1ccc(-c2cccc(-n3c4ccccc4c4ccccc43)c2)cc1] | 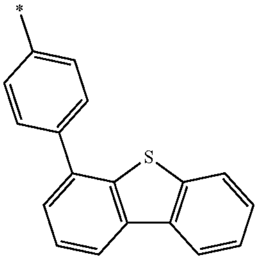 [SMILES: *c1ccc(-c2cccc3c2sc2ccccc23)cc1] | 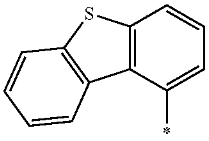 |
| S19 | 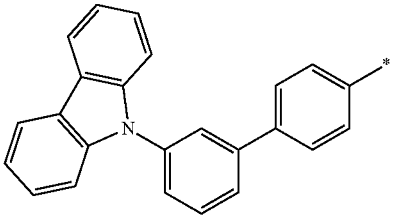 [SMILES: *c1ccc(-c2cccc(-n3c4ccccc4c4ccccc43)c2)cc1] | 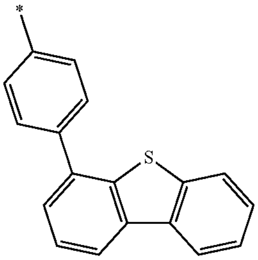 [SMILES: *c1ccc(-c2cccc3c2sc2ccccc23)cc1] | 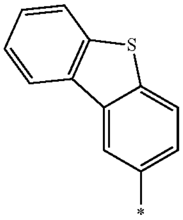 |
| S20 | 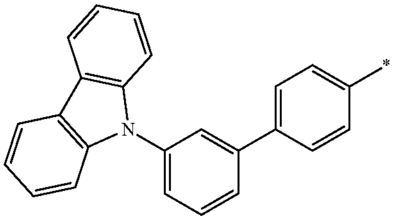 [SMILES: *c1ccc(-c2cccc(-n3c4ccccc4c4ccccc43)c2)cc1] | 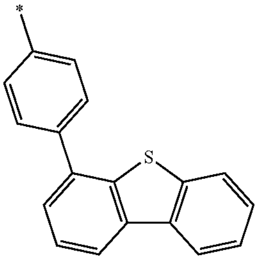 [SMILES: *c1ccc(-c2cccc3c2sc2ccccc23)cc1] | 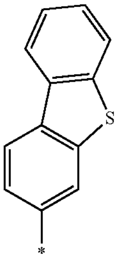 [SMILES: *c1ccc2c(c1)sc1ccccc12] |

-continued
| Compound Group 1 | | | |
|---|---|---|---|
| Formula 1 | $Ar_1$ | $Ar_2$ | $Ar_3$ |
| S21 | 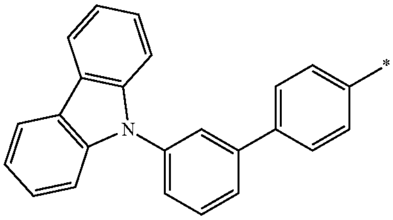 [SMILES: *c1ccc(-c2cccc(-n3c4ccccc4c4ccccc43)c2)cc1] | 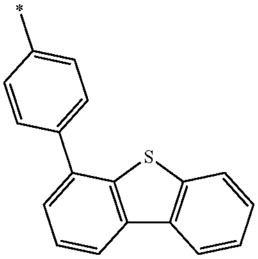 [SMILES: *c1ccc(-c2cccc3c2sc2ccccc23)cc1] | 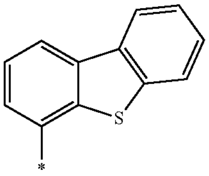 |
| S22 | 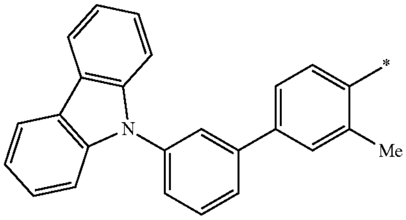 [SMILES: *c1ccc(-c2cccc(-n3c4ccccc4c4ccccc43)c2)cc1C] | 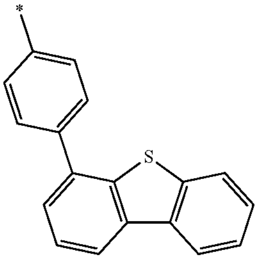 [SMILES: *c1ccc(-c2cccc3c2sc2ccccc23)cc1] | 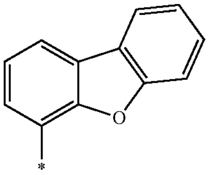 |
| S23 | 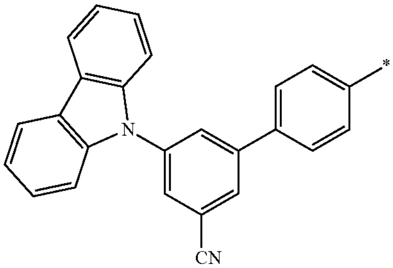 [SMILES: *c1ccc(-c2cc(C#N)cc(-n3c4ccccc4c4ccccc43)c2)cc1] | 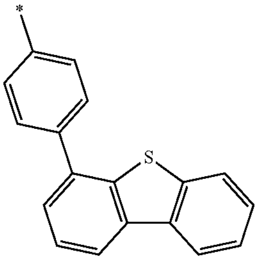 [SMILES: *c1ccc(-c2cccc3c2sc2ccccc23)cc1] | 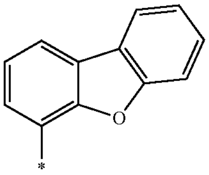 |
| T1 | 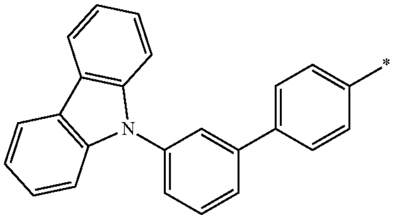 [SMILES: *c1ccc(-c2cccc(-n3c4ccccc4c4ccccc43)c2)cc1] | 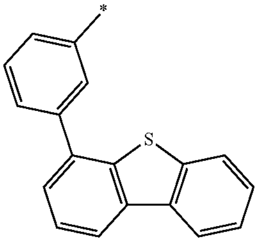 [SMILES: *c1cccc(-c2cccc3c2sc2ccccc23)c1] | 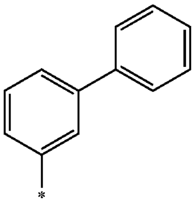 [SMILES: *c1cccc(-c2ccccc2)c1] |
| T2 | 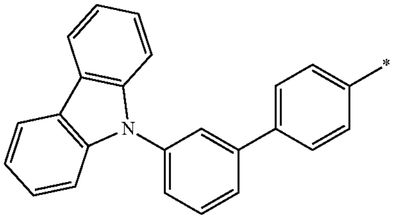 [SMILES: *c1ccc(-c2cccc(-n3c4ccccc4c4ccccc43)c2)cc1] | 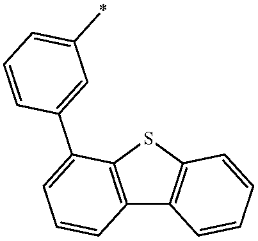 [SMILES: *c1cccc(-c2cccc3c2sc2ccccc23)c1] | 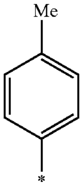 |

-continued
| Compound Group 1 | | | |
|---|---|---|---|
| Formula 1 | $Ar_1$ | $Ar_2$ | $Ar_3$ |
| T4 | 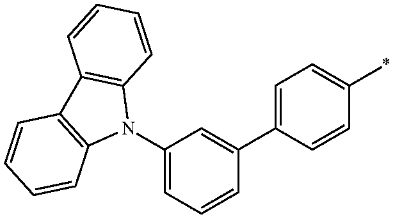 [SMILES: *c1ccc(-c2cccc(-n3c4ccccc4c4ccccc43)c2)cc1] | 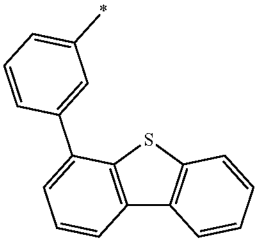 [SMILES: *c1cccc(-c2cccc3c2sc2ccccc23)c1] | 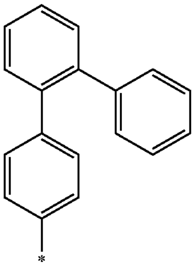 [SMILES: *c1ccc(-c2ccccc2-c2ccccc2)cc1] |
| T5 | 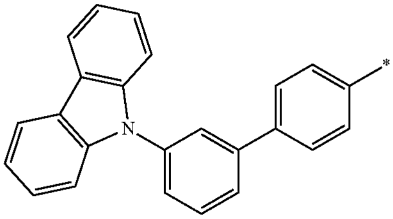 [SMILES: *c1ccc(-c2cccc(-n3c4ccccc4c4ccccc43)c2)cc1] | 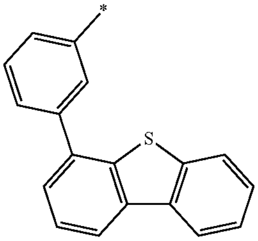 [SMILES: *c1cccc(-c2cccc3c2sc2ccccc23)c1] | 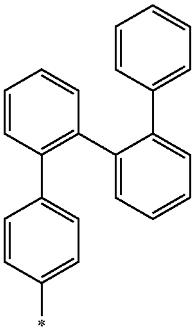 [SMILES: *c1ccc(-c2ccccc2-c2ccccc2-c2ccccc2)cc1] |
| T6 | 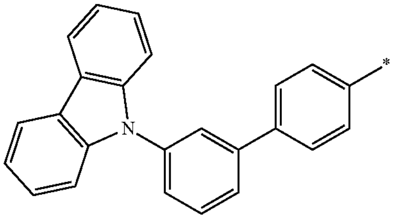 [SMILES: *c1ccc(-c2cccc(-n3c4ccccc4c4ccccc43)c2)cc1] | 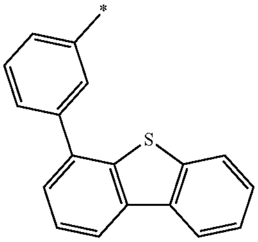 [SMILES: *c1cccc(-c2cccc3c2sc2ccccc23)c1] | 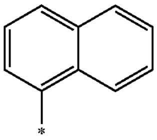 [SMILES: *c1cccc2ccccc12] |
| T7 | 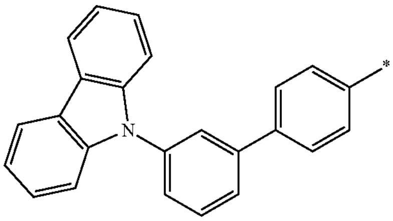 [SMILES: *c1ccc(-c2cccc(-n3c4ccccc4c4ccccc43)c2)cc1] | 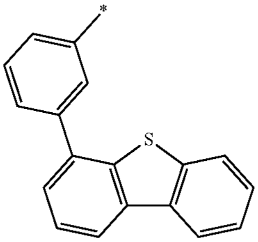 [SMILES: *c1cccc(-c2cccc3c2sc2ccccc23)c1] | 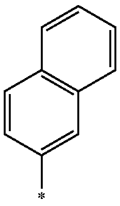 |
| T8 | 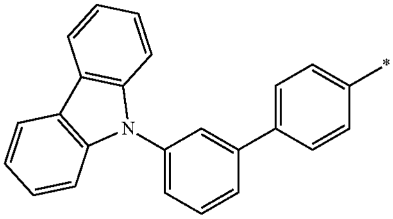 [SMILES: *c1ccc(-c2cccc(-n3c4ccccc4c4ccccc43)c2)cc1] | 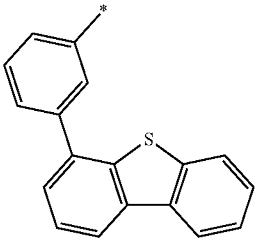 [SMILES: *c1cccc(-c2cccc3c2sc2ccccc23)c1] | 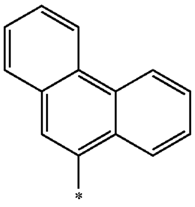 [SMILES: *c1cc2ccccc2c2ccccc12] |

-continued
| Compound Group 1 | | | |
|---|---|---|---|
| Formula 1 | $Ar_1$ | $Ar_2$ | $Ar_3$ |
| T10 | 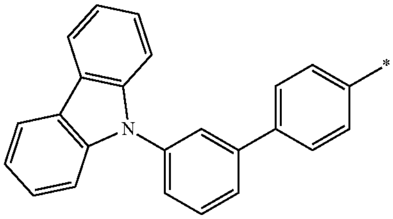 [SMILES: *c1ccc(-c2cccc(-n3c4ccccc4c4ccccc43)c2)cc1] | 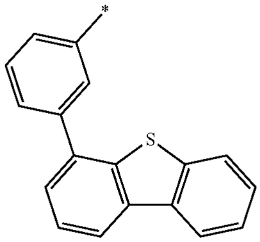 [SMILES: *c1cccc(-c2cccc3c2sc2ccccc23)c1] | 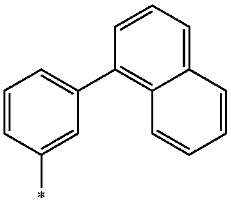 [SMILES: *c1cccc(-c2cccc3ccccc23)c1] |
| T11 | 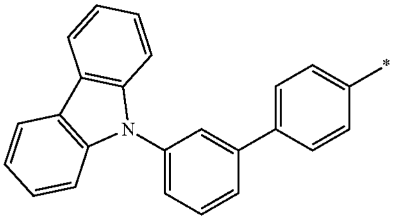 [SMILES: *c1ccc(-c2cccc(-n3c4ccccc4c4ccccc43)c2)cc1] | 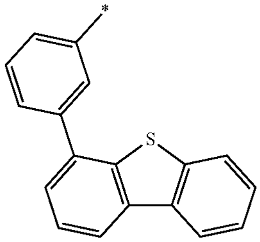 [SMILES: *c1cccc(-c2cccc3c2sc2ccccc23)c1] | 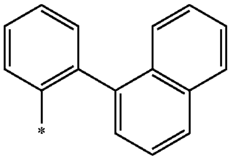 [SMILES: *c1ccccc1-c1cccc2ccccc12] |
| T13 | 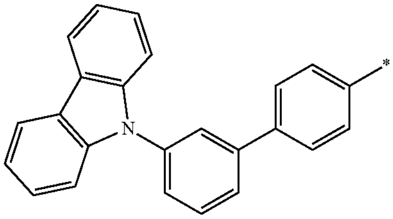 [SMILES: *c1ccc(-c2cccc(-n3c4ccccc4c4ccccc43)c2)cc1] | 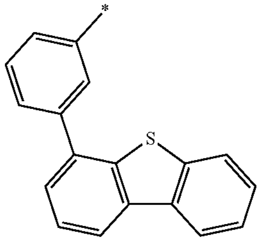 [SMILES: *c1cccc(-c2cccc3c2sc2ccccc23)c1] | 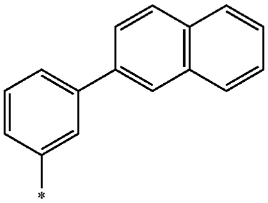 [SMILES: *c1cccc(-c2ccc3ccccc3c2)c1] |
| T14 | 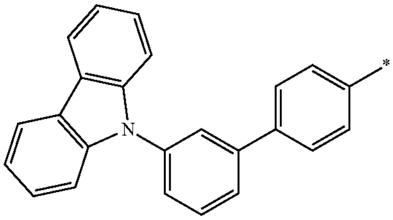 [SMILES: *c1ccc(-c2cccc(-n3c4ccccc4c4ccccc43)c2)cc1] | 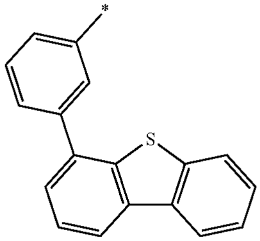 [SMILES: *c1cccc(-c2cccc3c2sc2ccccc23)c1] | 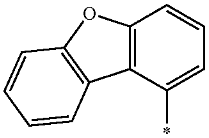 |
| T15 | 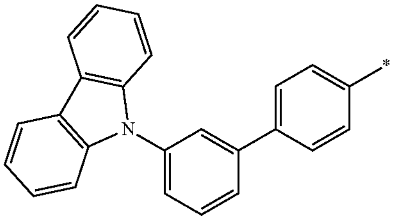 [SMILES: *c1ccc(-c2cccc(-n3c4ccccc4c4ccccc43)c2)cc1] | 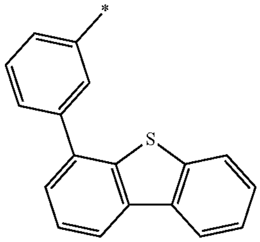 [SMILES: *c1cccc(-c2cccc3c2sc2ccccc23)c1] | 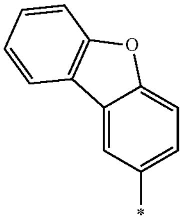 [SMILES: *c1ccc2oc3ccccc3c2c1] |
| T16 | 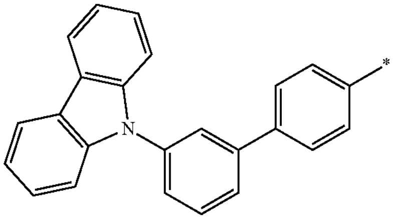 [SMILES: *c1ccc(-c2cccc(-n3c4ccccc4c4ccccc43)c2)cc1] | 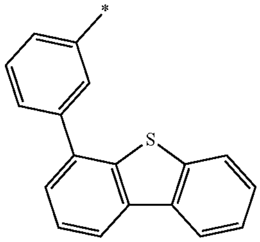 [SMILES: *c1cccc(-c2cccc3c2sc2ccccc23)c1] | 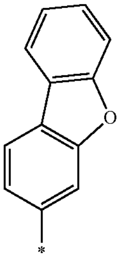 [SMILES: *c1ccc2c(c1)oc1ccccc12] |

-continued
Compound Group 1
| Formula 1 | $Ar_1$ | $Ar_2$ | $Ar_3$ |
|---|---|---|---|
| T17 | 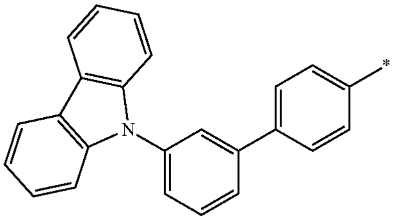 [SMILES: *c1ccc(-c2cccc(-n3c4ccccc4c4ccccc43)c2)cc1] | 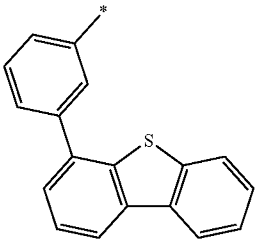 [SMILES: *c1cccc(-c2cccc3c2sc2ccccc23)c1] | 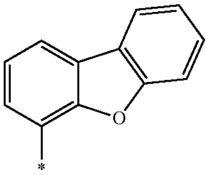 |
| T18 | 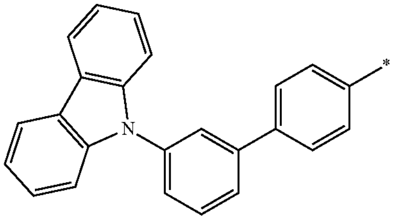 [SMILES: *c1ccc(-c2cccc(-n3c4ccccc4c4ccccc43)c2)cc1] | 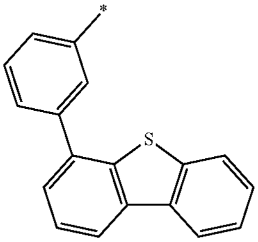 [SMILES: *c1cccc(-c2cccc3c2sc2ccccc23)c1] | 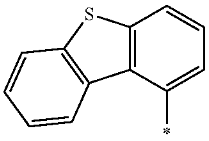 |
| T19 | 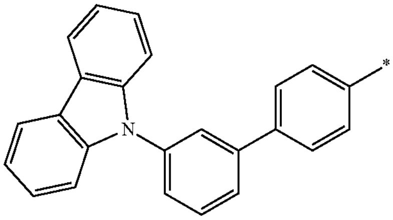 [SMILES: *c1ccc(-c2cccc(-n3c4ccccc4c4ccccc43)c2)cc1] | 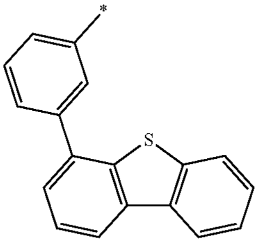 [SMILES: *c1cccc(-c2cccc3c2sc2ccccc23)c1] | 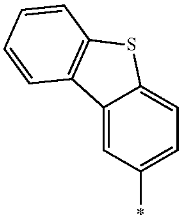 |
| T20 | 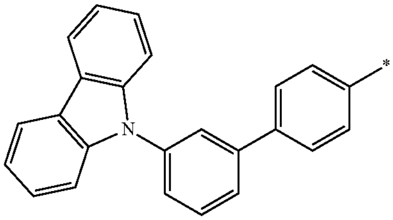 [SMILES: *c1ccc(-c2cccc(-n3c4ccccc4c4ccccc43)c2)cc1] | 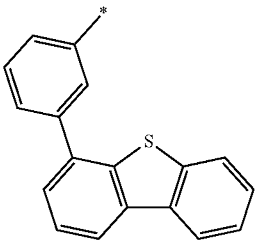 [SMILES: *c1cccc(-c2cccc3c2sc2ccccc23)c1] | 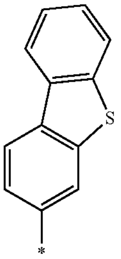 [SMILES: *c1ccc2c(c1)sc1ccccc12] |
| T21 | 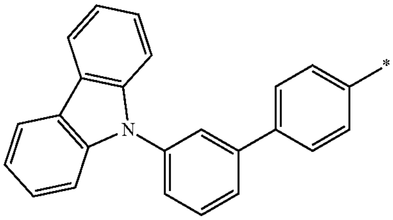 [SMILES: *c1ccc(-c2cccc(-n3c4ccccc4c4ccccc43)c2)cc1] | 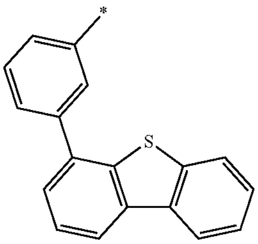 [SMILES: *c1cccc(-c2cccc3c2sc2ccccc23)c1] | 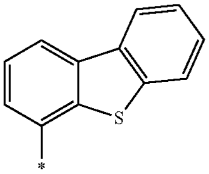 |

-continued
| Compound Group 1 | | | |
|---|---|---|---|
| Formula 1 | Ar₁ | Ar₂ | Ar₃ |
| T22 | 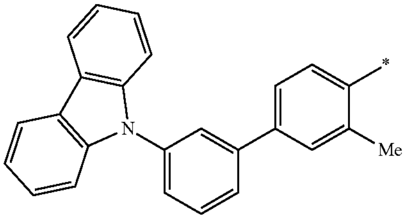 [SMILES: *c1ccc(-c2cccc(-n3c4ccccc4c4ccccc43)c2)cc1C] | 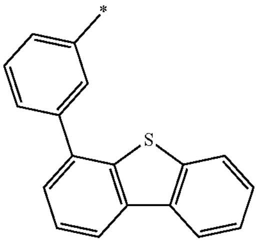 [SMILES: *c1cccc(-c2cccc3c2sc2ccccc23)c1] | 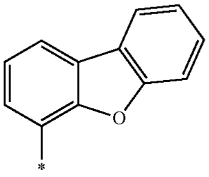 |
| T23 | 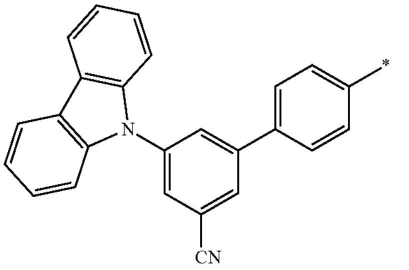 [SMILES: *c1ccc(-c2cc(C#N)cc(-n3c4ccccc4c4ccccc43)c2)cc1] | 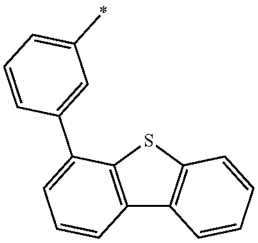 [SMILES: *c1cccc(-c2cccc3c2sc2ccccc23)c1] | 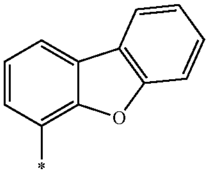 |
| U1 | 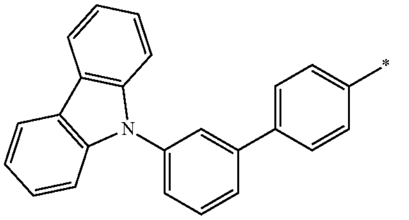 [SMILES: *c1ccc(-c2cccc(-n3c4ccccc4c4ccccc43)c2)cc1] | 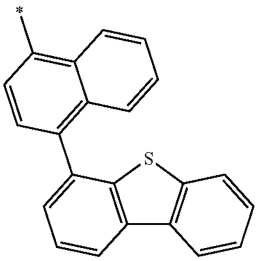 [SMILES: *c1ccc(-c2cccc3c2sc2ccccc23)c2ccccc12] | 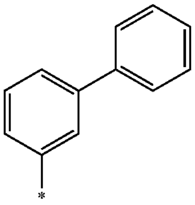 [SMILES: *c1cccc(-c2ccccc2)c1] |
| U2 | 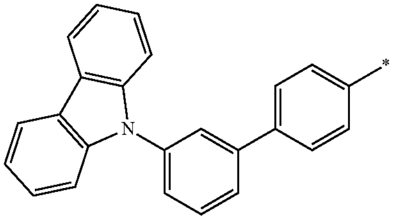 [SMILES: *c1ccc(-c2cccc(-n3c4ccccc4c4ccccc43)c2)cc1] | 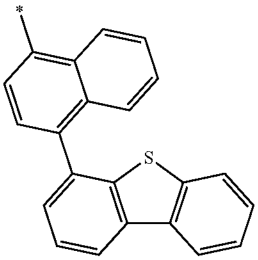 [SMILES: *c1ccc(-c2cccc3c2sc2ccccc23)c2ccccc12] | 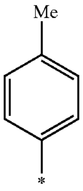 |
| U3 | 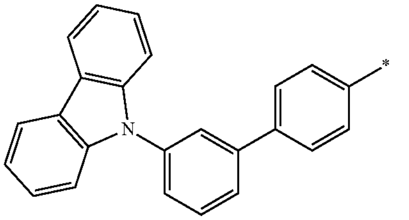 [SMILES: *c1ccc(-c2cccc(-n3c4ccccc4c4ccccc43)c2)cc1] | 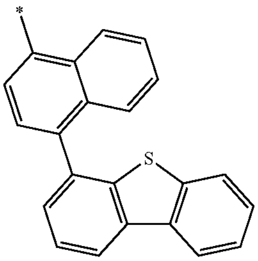 [SMILES: *c1ccc(-c2cccc3c2sc2ccccc23)c2ccccc12] | 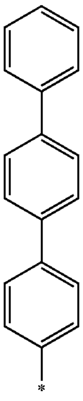 |

-continued
Compound Group 1
| Formula 1 | $Ar_1$ | $Ar_2$ | $Ar_3$ |
|---|---|---|---|
| U4 | 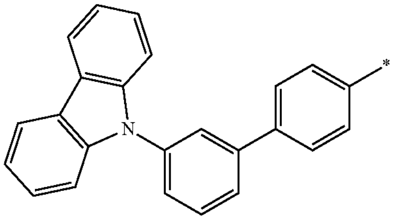 [SMILES: *c1ccc(-c2cccc(-n3c4ccccc4c4ccccc43)c2)cc1] | 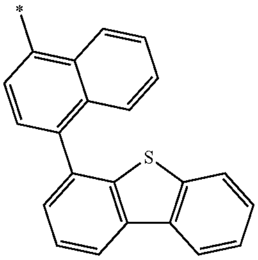 [SMILES: *c1ccc(-c2cccc3c2sc2ccccc23)c2ccccc12] | 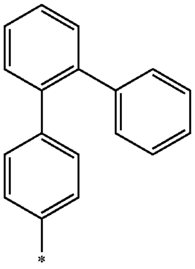 [SMILES: *c1ccc(-c2ccccc2-c2ccccc2)cc1] |
| U5 | 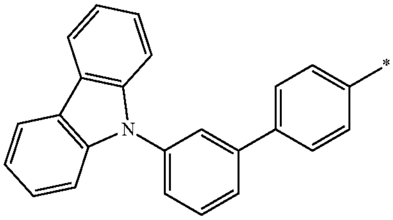 [SMILES: *c1ccc(-c2cccc(-n3c4ccccc4c4ccccc43)c2)cc1] | 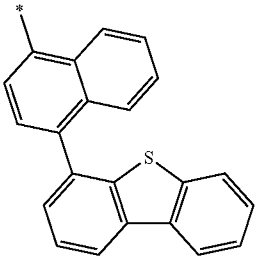 [SMILES: *c1ccc(-c2cccc3c2sc2ccccc23)c2ccccc12] | 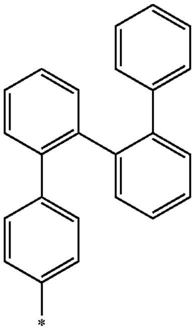 [SMILES: *c1ccc(-c2ccccc2-c2ccccc2-c2ccccc2)cc1] |
| U6 | 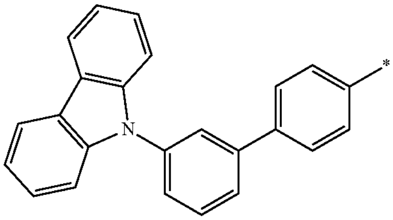 [SMILES: *c1ccc(-c2cccc(-n3c4ccccc4c4ccccc43)c2)cc1] | 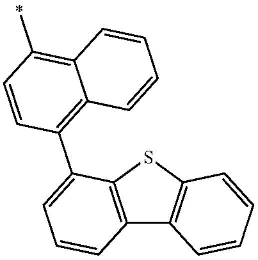 [SMILES: *c1ccc(-c2cccc3c2sc2ccccc23)c2ccccc12] | 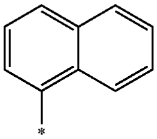 [SMILES: *c1cccc2ccccc12] |
| U7 | 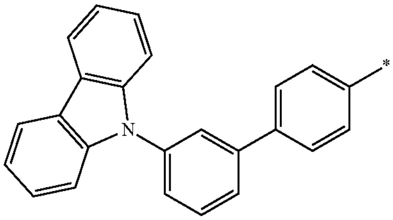 [SMILES: *c1ccc(-c2cccc(-n3c4ccccc4c4ccccc43)c2)cc1] | 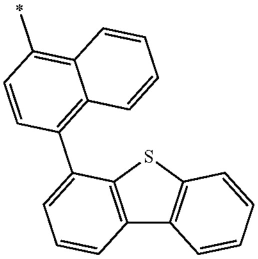 [SMILES: *c1ccc(-c2cccc3c2sc2ccccc23)c2ccccc12] | 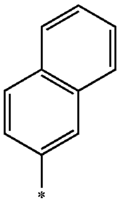 |
| U8 | 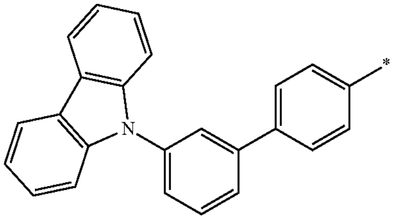 [SMILES: *c1ccc(-c2cccc(-n3c4ccccc4c4ccccc43)c2)cc1] | 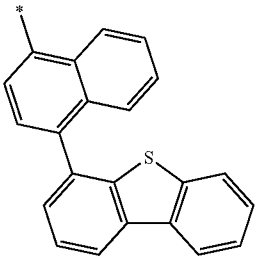 [SMILES: *c1ccc(-c2cccc3c2sc2ccccc23)c2ccccc12] | 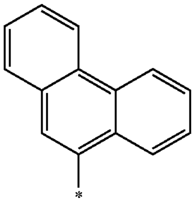 [SMILES: *c1cc2ccccc2c2ccccc12] |

-continued
Compound Group 1
| Formula 1 | $Ar_1$ | $Ar_2$ | $Ar_3$ |
| --- | --- | --- | --- |
| U9 | 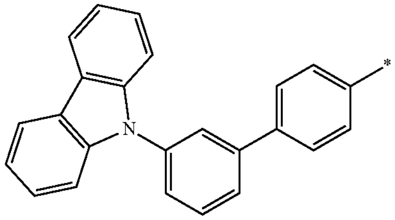 [SMILES: *c1ccc(-c2cccc(-n3c4ccccc4c4ccccc43)c2)cc1] | 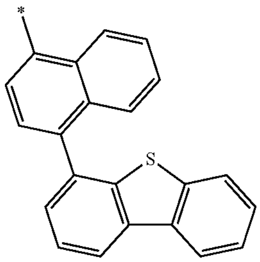 [SMILES: *c1ccc(-c2cccc3c2sc2ccccc23)c2ccccc12] | 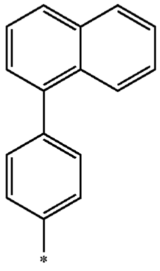 [SMILES: *c1ccc(-c2cccc3ccccc23)cc1] |
| U10 | 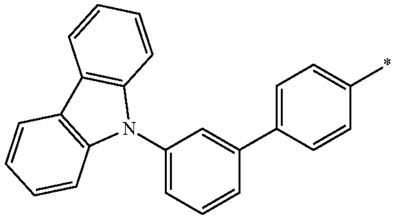 [SMILES: *c1ccc(-c2cccc(-n3c4ccccc4c4ccccc43)c2)cc1] | 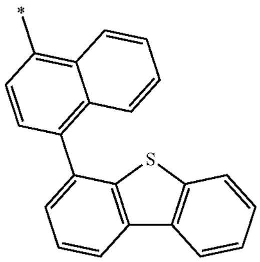 [SMILES: *c1ccc(-c2cccc3c2sc2ccccc23)c2ccccc12] | 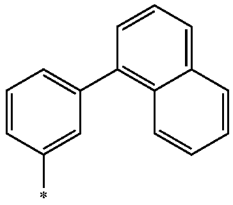 [SMILES: *c1cccc(-c2cccc3ccccc23)c1] |
| U11 | 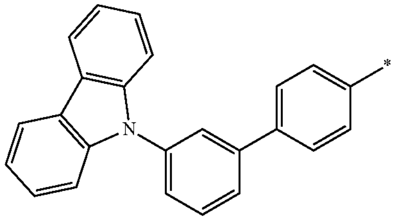 [SMILES: *c1ccc(-c2cccc(-n3c4ccccc4c4ccccc43)c2)cc1] | 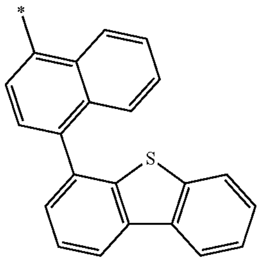 [SMILES: *c1ccc(-c2cccc3c2sc2ccccc23)c2ccccc12] | 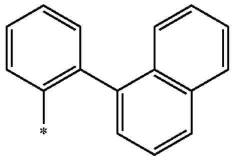 [SMILES: *c1ccccc1-c1cccc2ccccc12] |
| U12 | 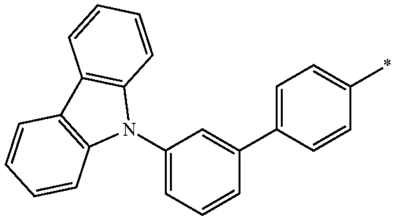 [SMILES: *c1ccc(-c2cccc(-n3c4ccccc4c4ccccc43)c2)cc1] | 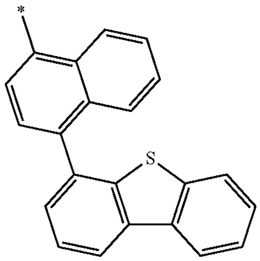 [SMILES: *c1ccc(-c2cccc3c2sc2ccccc23)c2ccccc12] | 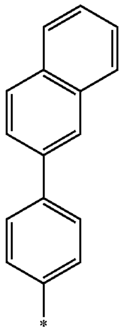 |
| U13 | 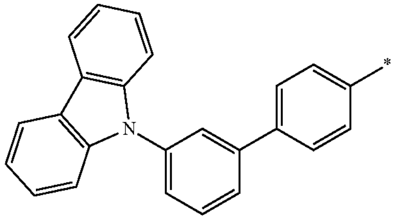 [SMILES: *c1ccc(-c2cccc(-n3c4ccccc4c4ccccc43)c2)cc1] | 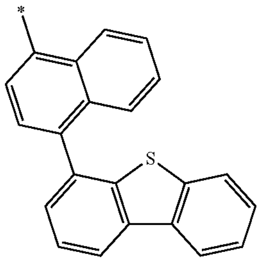 [SMILES: *c1ccc(-c2cccc3c2sc2ccccc23)c2ccccc12] | 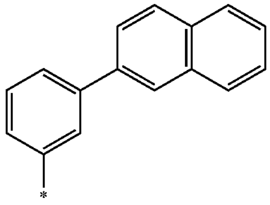 [SMILES: *c1cccc(-c2ccc3ccccc3c2)c1] |

-continued
Compound Group 1
| Formula 1 | $Ar_1$ | $Ar_2$ | $Ar_3$ |
| --- | --- | --- | --- |
| U14 | 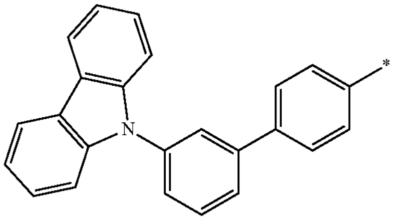 [SMILES: *c1ccc(-c2cccc(-n3c4ccccc4c4ccccc43)c2)cc1] | 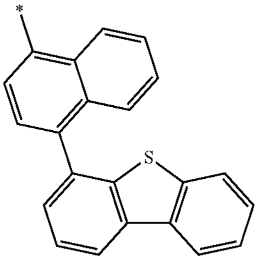 [SMILES: *c1ccc(-c2cccc3c2sc2ccccc23)c2ccccc12] | 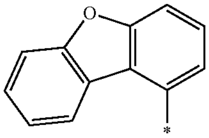 |
| U15 | 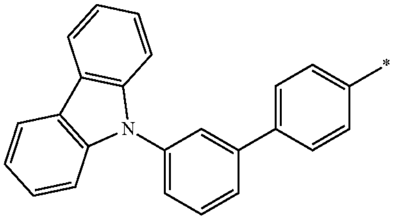 [SMILES: *c1ccc(-c2cccc(-n3c4ccccc4c4ccccc43)c2)cc1] | 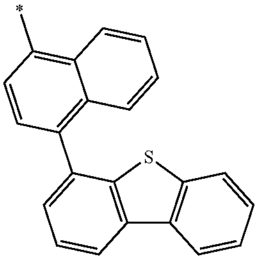 [SMILES: *c1ccc(-c2cccc3c2sc2ccccc23)c2ccccc12] | 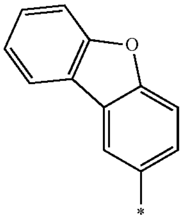 |
| U16 | 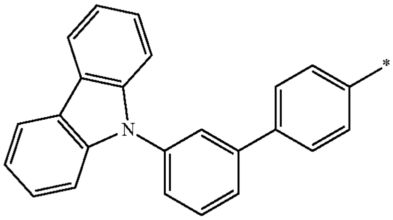 [SMILES: *c1ccc(-c2cccc(-n3c4ccccc4c4ccccc43)c2)cc1] | 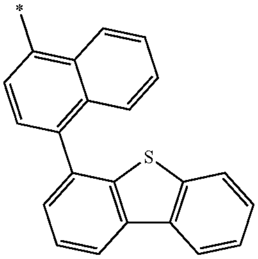 [SMILES: *c1ccc(-c2cccc3c2sc2ccccc23)c2ccccc12] | 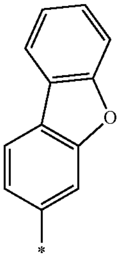 [SMILES: *c1ccc2c(c1)oc1ccccc12] |
| U17 | 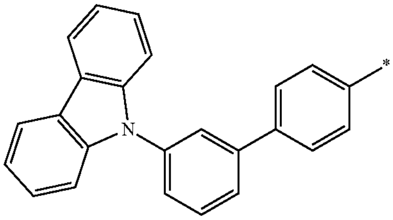 [SMILES: *c1ccc(-c2cccc(-n3c4ccccc4c4ccccc43)c2)cc1] | 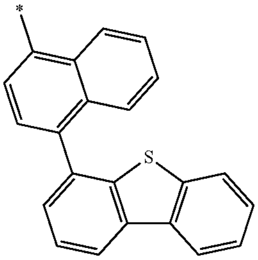 [SMILES: *c1ccc(-c2cccc3c2sc2ccccc23)c2ccccc12] | 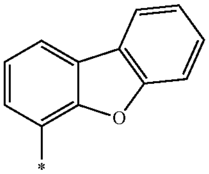 |
| U18 | 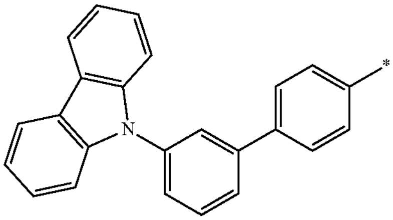 [SMILES: *c1ccc(-c2cccc(-n3c4ccccc4c4ccccc43)c2)cc1] | 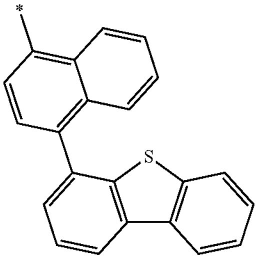 [SMILES: *c1ccc(-c2cccc3c2sc2ccccc23)c2ccccc12] | 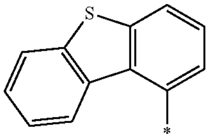 |

-continued
| Compound Group 1 | | | |
|---|---|---|---|
| Formula 1 | $Ar_1$ | $Ar_2$ | $Ar_3$ |
| U19 | 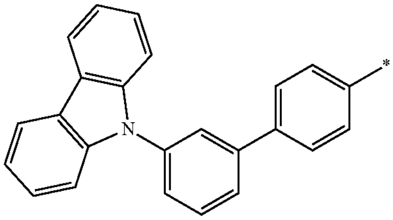 [SMILES: *c1ccc(-c2cccc(-n3c4ccccc4c4ccccc43)c2)cc1] | 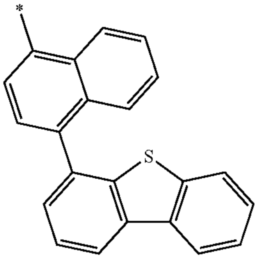 [SMILES: *c1ccc(-c2cccc3c2sc2ccccc23)c2ccccc12] | 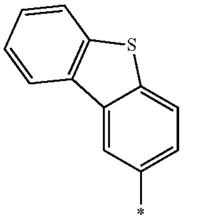 |
| U20 | 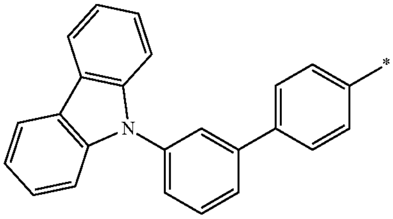 [SMILES: *c1ccc(-c2cccc(-n3c4ccccc4c4ccccc43)c2)cc1] | 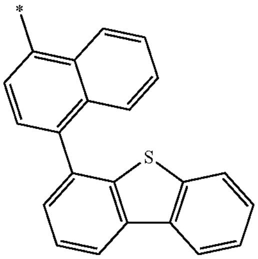 [SMILES: *c1ccc(-c2cccc3c2sc2ccccc23)c2ccccc12] | 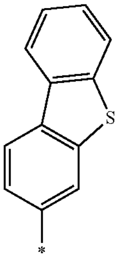 [SMILES: *c1ccc2c(c1)sc1ccccc12] |
| U21 | 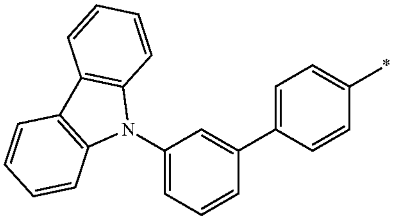 [SMILES: *c1ccc(-c2cccc(-n3c4ccccc4c4ccccc43)c2)cc1] | 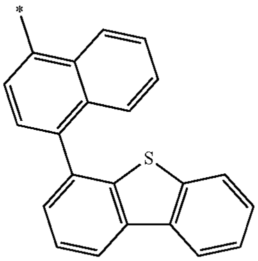 [SMILES: *c1ccc(-c2cccc3c2sc2ccccc23)c2ccccc12] | 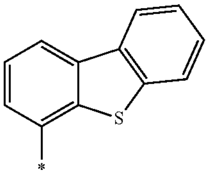 |
| U22 | 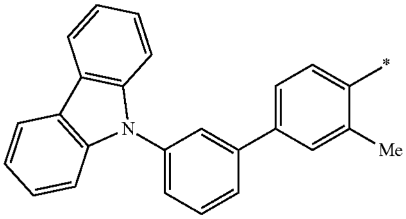 [SMILES: *c1ccc(-c2cccc(-n3c4ccccc4c4ccccc43)c2)cc1C] | 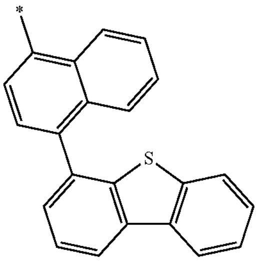 [SMILES: *c1ccc(-c2cccc3c2sc2ccccc23)c2ccccc12] | 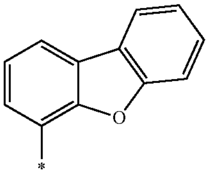 |
| U23 | 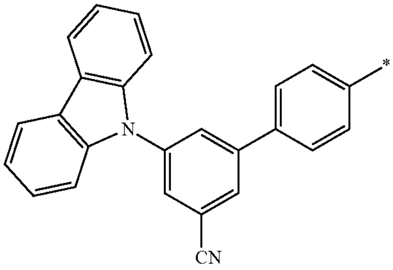 [SMILES: *c1ccc(-c2cc(C#N)cc(-n3c4ccccc4c4ccccc43)c2)cc1] | 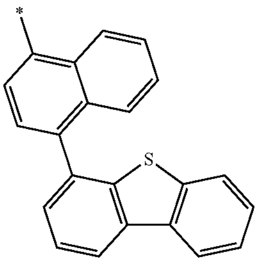 [SMILES: *c1ccc(-c2cccc3c2sc2ccccc23)c2ccccc12] | 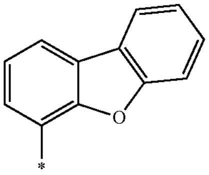 |

-continued
| Compound Group 1 | | | |
|---|---|---|---|
| Formula 1 | $Ar_1$ | $Ar_2$ | $Ar_3$ |
| V1 | 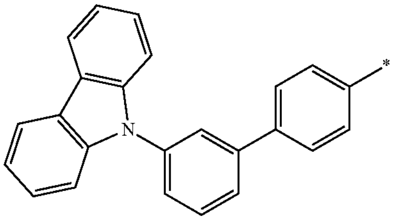 [SMILES: *c1ccc(-c2cccc(-n3c4ccccc4c4ccccc43)c2)cc1] | 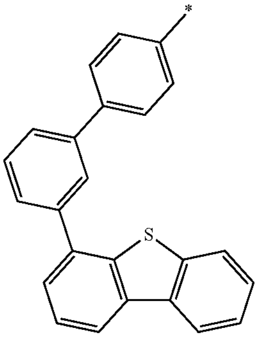 [SMILES: *c1ccc(-c2cccc(-c3cccc4c3sc3ccccc34)c2)cc1] | 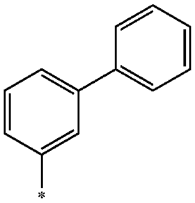 [SMILES: *c1cccc(-c2ccccc2)c1] |
| V2 | 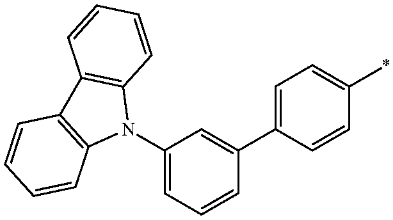 [SMILES: *c1ccc(-c2cccc(-n3c4ccccc4c4ccccc43)c2)cc1] | 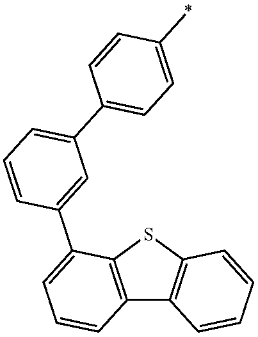 [SMILES: *c1ccc(-c2cccc(-c3cccc4c3sc3ccccc34)c2)cc1] | 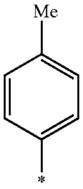 |
| V3 | 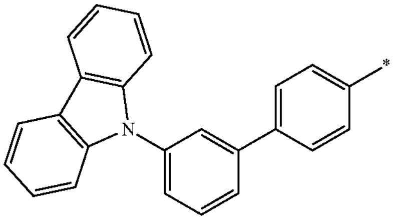 [SMILES: *c1ccc(-c2cccc(-n3c4ccccc4c4ccccc43)c2)cc1] | 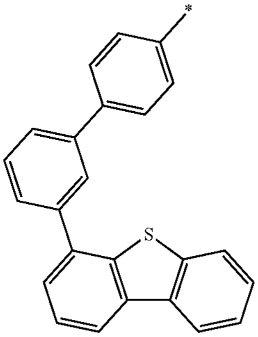 [SMILES: *c1ccc(-c2cccc(-c3cccc4c3sc3ccccc34)c2)cc1] | 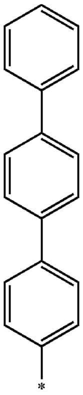 |
| V4 | 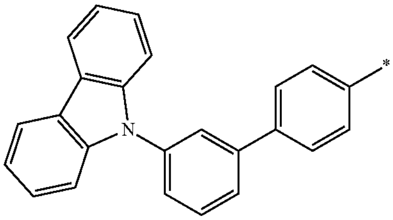 [SMILES: *c1ccc(-c2cccc(-n3c4ccccc4c4ccccc43)c2)cc1] | 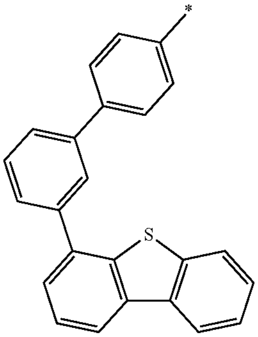 [SMILES: *c1ccc(-c2cccc(-c3cccc4c3sc3ccccc34)c2)cc1] | 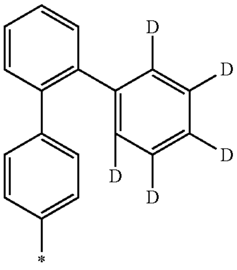 [SMILES: *c1ccc(-c2ccccc2-c2c([2H])c([2H])c([2H])c([2H])c2[2H])cc1] |

-continued
| Compound Group 1 | | | |
|---|---|---|---|
| Formula 1 | $Ar_1$ | $Ar_2$ | $Ar_3$ |
| V5 | 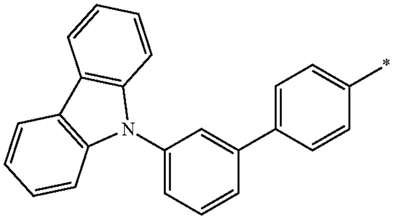 [SMILES: *c1ccc(-c2cccc(-n3c4ccccc4c4ccccc43)c2)cc1] | 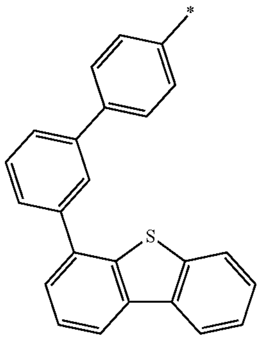 [SMILES: *c1ccc(-c2cccc(-c3cccc4c3sc3ccccc34)c2)cc1] | 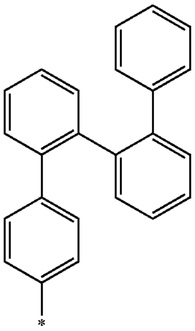 [SMILES: *c1ccc(-c2ccccc2-c2ccccc2-c2ccccc2)cc1] |
| V6 | 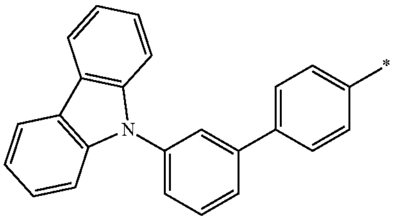 [SMILES: *c1ccc(-c2cccc(-n3c4ccccc4c4ccccc43)c2)cc1] | 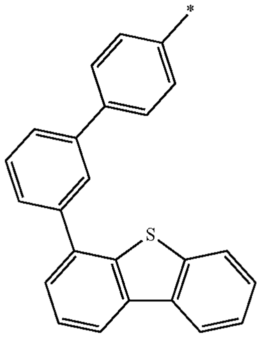 [SMILES: *c1ccc(-c2cccc(-c3cccc4c3sc3ccccc34)c2)cc1] | 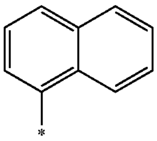 [SMILES: *c1cccc2ccccc12] |
| V7 | 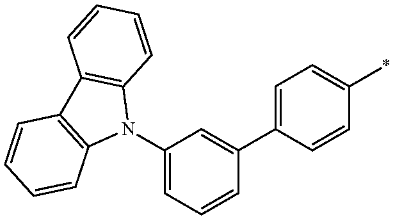 [SMILES: *c1ccc(-c2cccc(-n3c4ccccc4c4ccccc43)c2)cc1] | 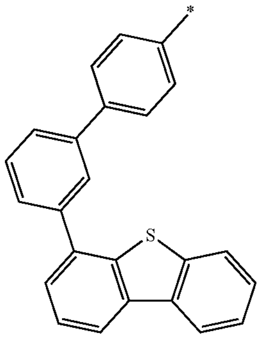 [SMILES: *c1ccc(-c2cccc(-c3cccc4c3sc3ccccc34)c2)cc1] | 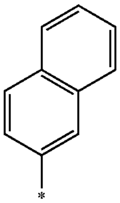 |
| V8 | 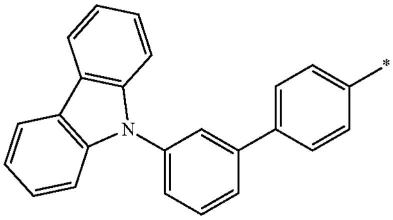 [SMILES: *c1ccc(-c2cccc(-n3c4ccccc4c4ccccc43)c2)cc1] | 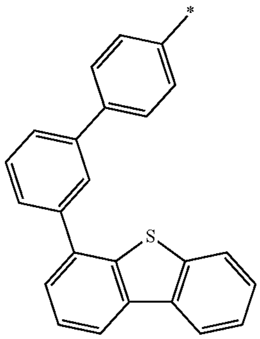 [SMILES: *c1ccc(-c2cccc(-c3cccc4c3sc3ccccc34)c2)cc1] | 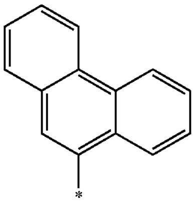 [SMILES: *c1cc2ccccc2c2ccccc12] |

-continued
| Compound Group 1 | | | |
|---|---|---|---|
| Formula 1 | Ar1 | Ar2 | Ar3 |
| V9 | 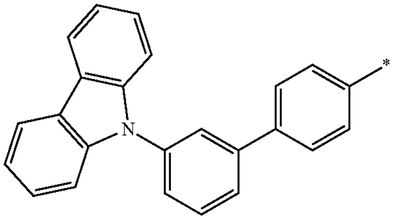 [SMILES: *c1ccc(-c2cccc(-n3c4ccccc4c4ccccc43)c2)cc1] | 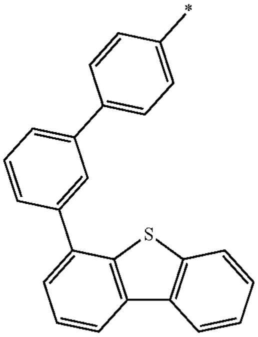 [SMILES: *c1ccc(-c2cccc(-c3cccc4c3sc3ccccc34)c2)cc1] | 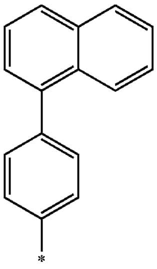 [SMILES: *c1ccc(-c2cccc3ccccc23)cc1] |
| V10 | 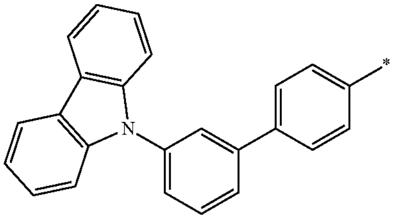 [SMILES: *c1ccc(-c2cccc(-n3c4ccccc4c4ccccc43)c2)cc1] | 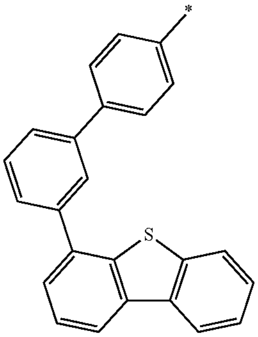 [SMILES: *c1ccc(-c2cccc(-c3cccc4c3sc3ccccc34)c2)cc1] | 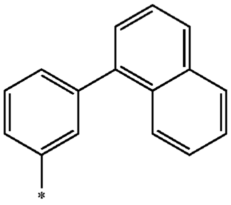 [SMILES: *c1cccc(-c2cccc3ccccc23)c1] |
| V11 | 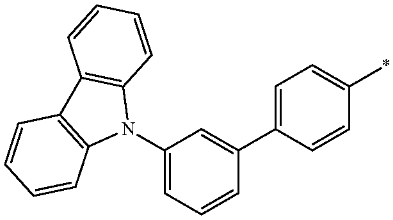 [SMILES: *c1ccc(-c2cccc(-n3c4ccccc4c4ccccc43)c2)cc1] | 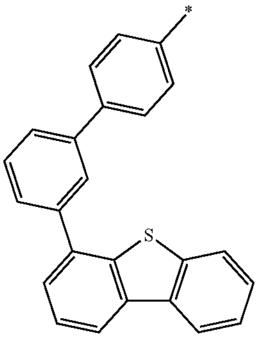 [SMILES: *c1ccc(-c2cccc(-c3cccc4c3sc3ccccc34)c2)cc1] | 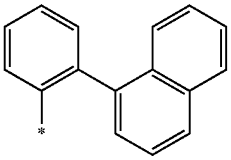 [SMILES: *c1ccccc1-c1cccc2ccccc12] |
| V12 | 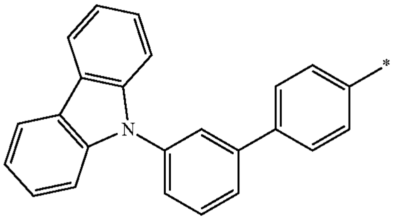 [SMILES: *c1ccc(-c2cccc(-n3c4ccccc4c4ccccc43)c2)cc1] | 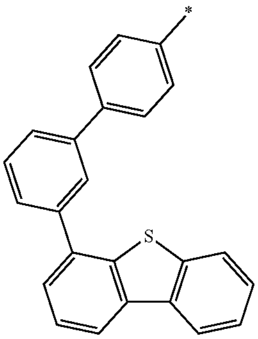 [SMILES: *c1ccc(-c2cccc(-c3cccc4c3sc3ccccc34)c2)cc1] | 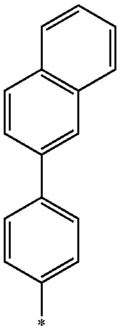 |

-continued
Compound Group 1
| Formula 1 | $Ar_1$ | $Ar_2$ | $Ar_3$ |
|---|---|---|---|
| V13 | 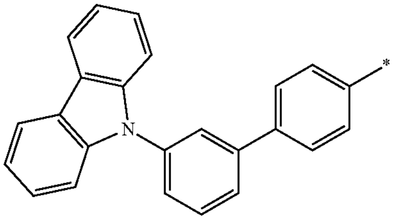 [SMILES: *c1ccc(-c2cccc(-n3c4ccccc4c4ccccc43)c2)cc1] | 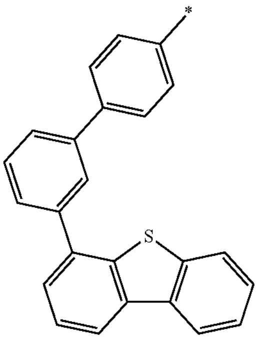 [SMILES: *c1ccc(-c2cccc(-c3cccc4c3sc3ccccc34)c2)cc1] | 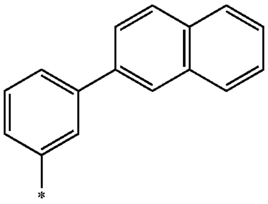 [SMILES: *c1cccc(-c2ccc3ccccc3c2)c1] |
| V14 | 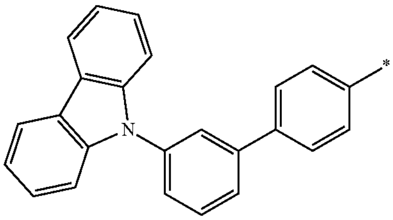 [SMILES: *c1ccc(-c2cccc(-n3c4ccccc4c4ccccc43)c2)cc1] | 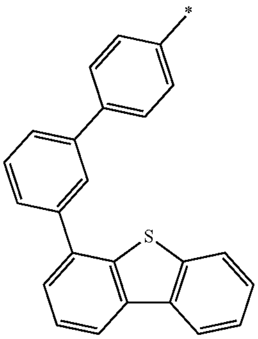 [SMILES: *c1ccc(-c2cccc(-c3cccc4c3sc3ccccc34)c2)cc1] | 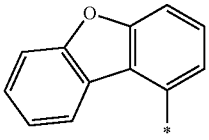 |
| V15 | 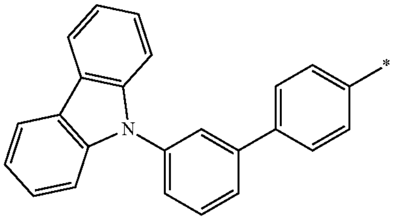 [SMILES: *c1ccc(-c2cccc(-n3c4ccccc4c4ccccc43)c2)cc1] | 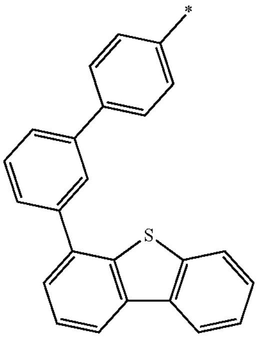 [SMILES: *c1ccc(-c2cccc(-c3cccc4c3sc3ccccc34)c2)cc1] | 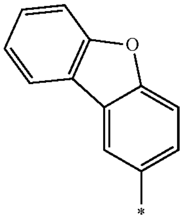 |
| V16 | 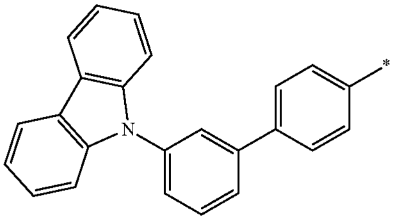 [SMILES: *c1ccc(-c2cccc(-n3c4ccccc4c4ccccc43)c2)cc1] | 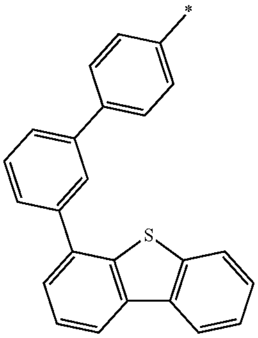 [SMILES: *c1ccc(-c2cccc(-c3cccc4c3sc3ccccc34)c2)cc1] | 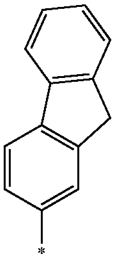 [SMILES: *c1ccc2c(c1)Cc1ccccc1-2] |

-continued
Compound Group 1
| Formula 1 | $Ar_1$ | $Ar_2$ | $Ar_3$ |
| --- | --- | --- | --- |
| V17 | 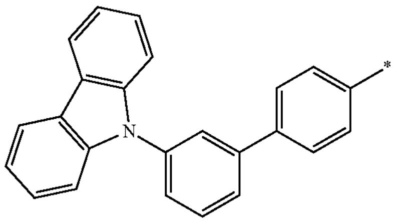 [SMILES: *c1ccc(-c2cccc(-n3c4ccccc4c4ccccc43)c2)cc1] | 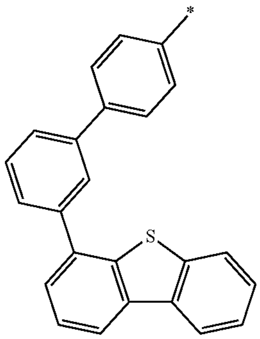 [SMILES: *c1ccc(-c2cccc(-c3cccc4c3sc3ccccc34)c2)cc1] | 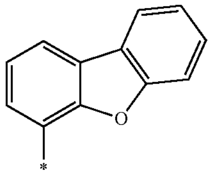 |
| V18 | 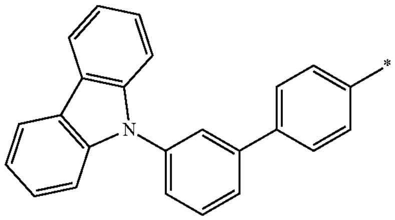 [SMILES: *c1ccc(-c2cccc(-n3c4ccccc4c4ccccc43)c2)cc1] | 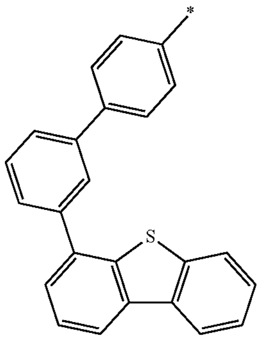 [SMILES: *c1ccc(-c2cccc(-c3cccc4c3sc3ccccc34)c2)cc1] | 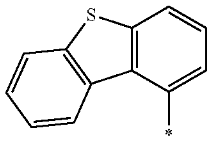 |
| V19 | 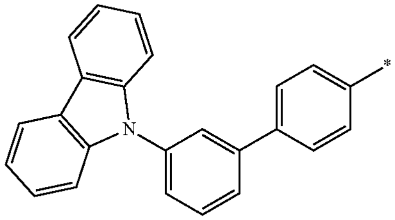 [SMILES: *c1ccc(-c2cccc(-n3c4ccccc4c4ccccc43)c2)cc1] | 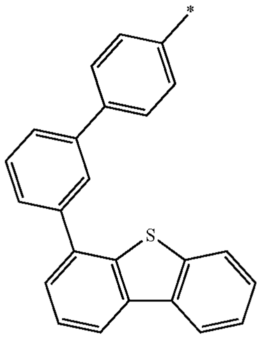 [SMILES: *c1ccc(-c2cccc(-c3cccc4c3sc3ccccc34)c2)cc1] | 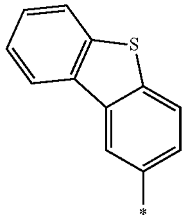 |
| V20 | 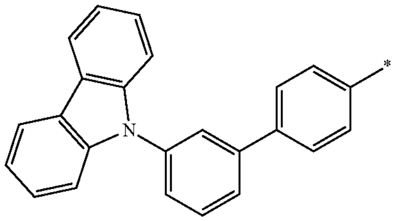 [SMILES: *c1ccc(-c2cccc(-n3c4ccccc4c4ccccc43)c2)cc1] | 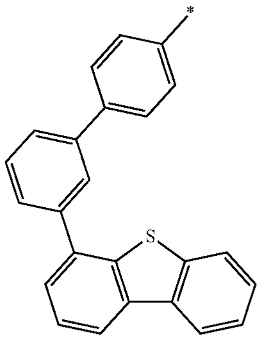 [SMILES: *c1ccc(-c2cccc(-c3cccc4c3sc3ccccc34)c2)cc1] | 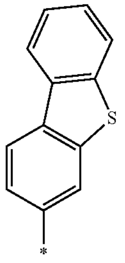 [SMILES: *c1ccc2c(c1)sc1ccccc12] |

-continued
| Compound Group 1 | | | |
|---|---|---|---|
| Formula 1 | $Ar_1$ | $Ar_2$ | $Ar_3$ |
| V21 | 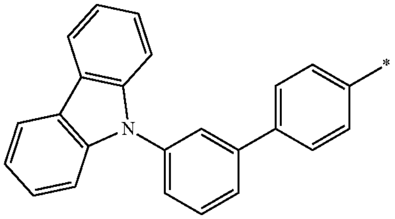 [SMILES: *c1ccc(-c2cccc(-n3c4ccccc4c4ccccc43)c2)cc1] | 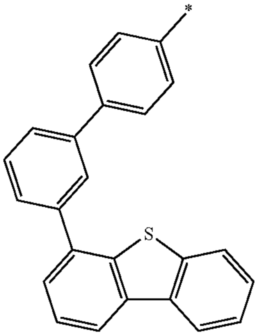 [SMILES: *c1ccc(-c2cccc(-c3cccc4c3sc3ccccc34)c2)cc1] | 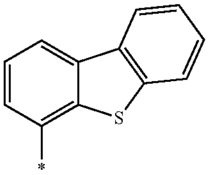 |
| V22 | 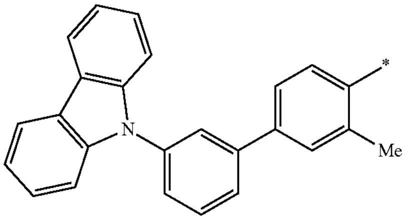 [SMILES: *c1ccc(-c2cccc(-n3c4ccccc4c4ccccc43)c2)cc1C] | 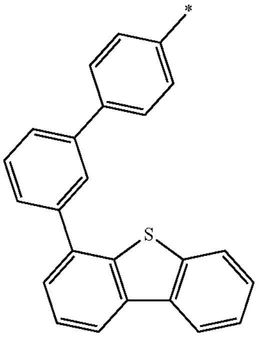 [SMILES: *c1ccc(-c2cccc(-c3cccc4c3sc3ccccc34)c2)cc1] | 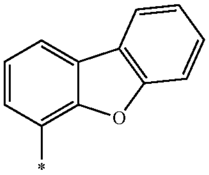 |
| V23 | 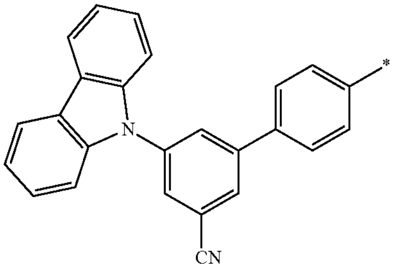 [SMILES: *c1ccc(-c2cc(C#N)cc(-n3c4ccccc4c4ccccc43)c2)cc1] | 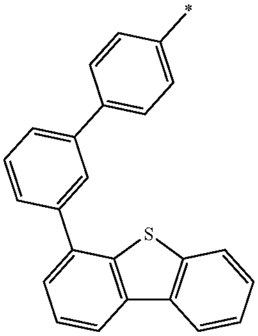 [SMILES: *c1ccc(-c2cccc(-c3cccc4c3sc3ccccc34)c2)cc1] | 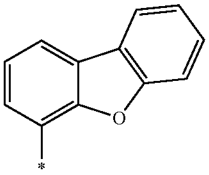 . |

13. An amine compound represented by Formula 1:

Formula 1

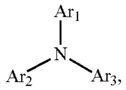

wherein in Formula 1, $Ar_1$ is represented by Formula 2-1, $Ar_2$ is represented by Formula 2-2, and $Ar_3$ is represented by Formula 2-3:

Formula 2-1

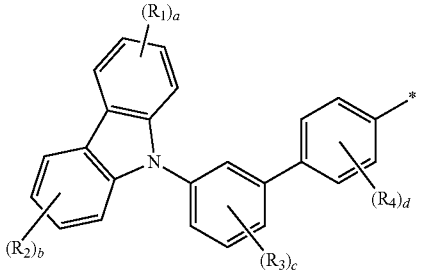

Formula 2-2

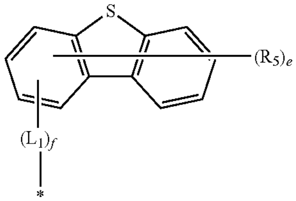

Formula 2-3

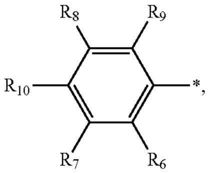

and wherein in Formula 2-1 to Formula 2-3, $R_1$ and $R_2$ are each independently a hydrogen atom, a deuterium atom, a chlorine atom, a bromine atom, an iodine atom, a cyano group, a substituted or unsubstituted alkyl group of 1 to 20 carbon atoms, a substituted or unsubstituted oxy group, a substituted or unsubstituted thiol group, a substituted or unsubstituted silyl group, a substituted or unsubstituted aryl group of 6 to 30 ring-forming carbon atoms, or a substituted or unsubstituted heteroaryl group of 2 to 30 ring-forming carbon atoms, $R_3$ to $R_5$ are each independently a hydrogen atom, a deuterium atom, a halogen atom, a cyano group, a substituted or unsubstituted alkyl group of 1 to 20 carbon atoms, a substituted or unsubstituted oxy group, a substituted or unsubstituted thiol group, a substituted or unsubstituted silyl group, a substituted or unsubstituted aryl group of 6 to 30 ring-forming carbon atoms, or a substituted or unsubstituted heteroaryl group of 2 to 30 ring-forming carbon atoms, $L_1$ is a direct linkage, a substituted or unsubstituted arylene group of 6 to 30 ring-forming carbon atoms, or a substituted or unsubstituted heteroarylene group of 2 to 30 ring-forming carbon atoms, $R_6$ to $R_9$ are each independently a hydrogen atom, a deuterium atom, a halogen atom, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, and/or combined with an adjacent group to form a ring, where a fluorenyl group is excluded, $R_{10}$ is a hydrogen atom, a deuterium atom, a halogen atom, a substituted or unsubstituted alkyl group of 1 to 20 carbon atoms, a substituted or unsubstituted alkenyl group of 2 to 20 carbon atoms, a substituted phenyl group, a substituted or unsubstituted aryl group of 7 to 30 ring-forming carbon atoms, or a substituted or unsubstituted heteroaryl group of 2 to 30 ring-forming carbon atoms, and/or combined with an adjacent group to form a ring, where a fluorenyl group is excluded, $R_6$ to $R_{10}$ are not all hydrogen atoms, a to d are each independently an integer of 0 to 4, e is an integer of 0 to 7, f is an integer of 0 to 2, when f is 1 and $L_1$ is a phenylene group, then $R_{10}$ is not an unsubstituted heteroaryl group, an unsubstituted naphthalene group, an unsubstituted p-biphenyl group, a substituted or unsubstituted phenanthryl group, or a phenyl group para-substituted by an unsubstituted naphthalene group, and $R_6$ to $R_9$ are not a substituted or unsubstituted phenanthryl group, when $L_1$ is a direct linkage, one selected from $R_6$ to $R_9$ is an unsubstituted phenyl group and the rest selected from $R_6$ to $R_9$ and $R_{10}$ are each a hydrogen atom, and all $R_1$ to $R_3$ groups are each a hydrogen atom, then all $R_5$ groups are each a hydrogen atom, when $L_1$ is a direct linkage, and $R_1$ to $R_5$ are each a hydrogen atom, then $Ar_3$ is not a naphthyl group, and when $L_1$ is a direct linkage and the carbon at position 3 of the dibenzothiophene group of Formula 2-2 is combined with N of Formula 1, then $R_{10}$ is not combined with an adjacent group to form a 3-dibenzothiophene group and a 3-dibenzofuran group.

14. The amine compound of claim 13, wherein Formula 1 is represented by any one among Formula 3-1 to Formula 3-4:

Formula 3-1

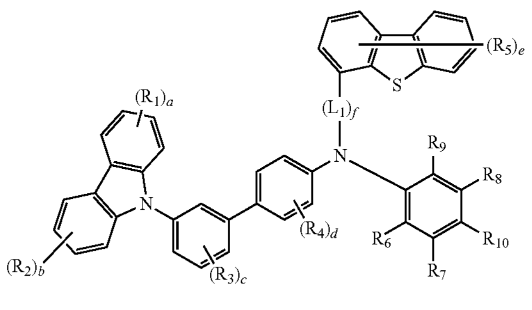

-continued

Formula 3-2

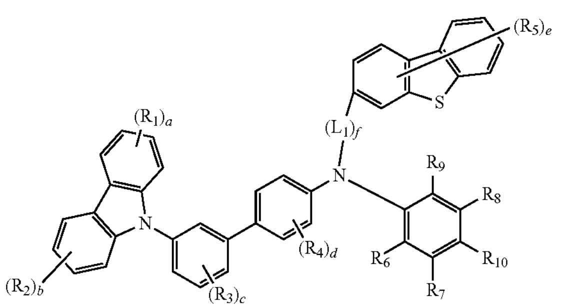

Formula 3-3

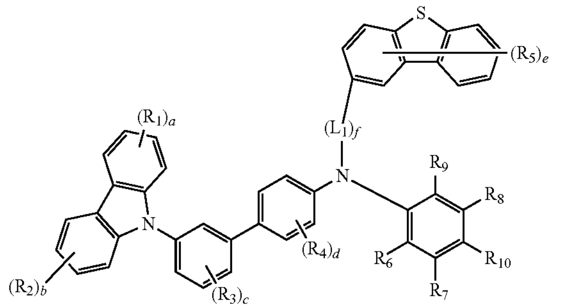

Formula 3-4

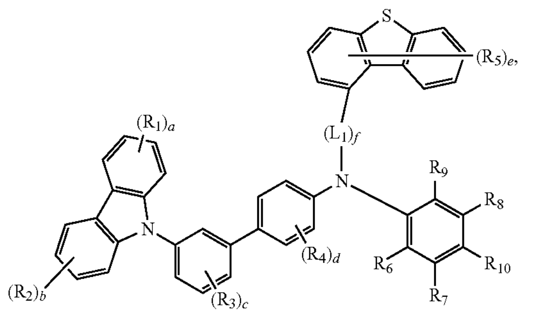

and wherein in Formula 3-1 to Formula 3-4, $R_1$ to $R_{10}$, a to f, and $L_1$ are each independently the same as defined in Formula 1 and Formula 2.

15. The amine compound of claim 13, wherein $L_1$ is a direct linkage, a substituted or unsubstituted phenylene group, a substituted or unsubstituted naphthylene group, or a substituted or unsubstituted biphenylene group.

16. The amine compound of claim 13, wherein $L_1$ is a direct linkage or represented by any one among L-1 to L-4:

L-1

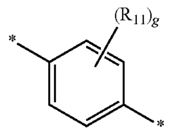

L-2

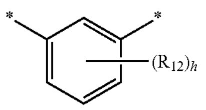

-continued

L-3

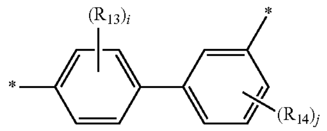

L-4

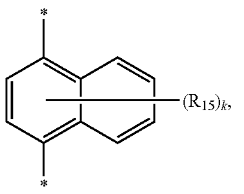

and wherein in L-1 to L-4, $R_{11}$ to $R_{15}$ are each independently a hydrogen atom, a deuterium atom, a halogen atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, g to j are each independently an integer of 0 to 4, and k is an integer of 0 to 6.

17. The amine compound of claim 13, wherein $Ar_3$ is represented by any one among Formula 4-1 to Formula 4-4:

Formula 4-1

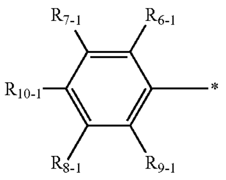

Formula 4-2

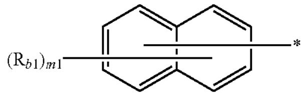

Formula 4-3

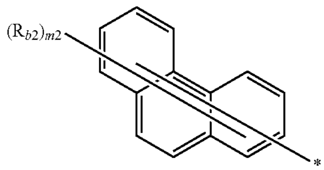

Formula 4-4

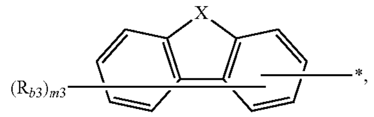

and wherein in Formula 4-1 to Formula 4-4, $R_{6-1}$ to $R_{9-1}$ are each independently a hydrogen atom, a deuterium atom, or a substituted or unsubstituted aryl group of 6 to 20 ring-forming carbon atoms, $R_{10-1}$ is a hydrogen atom, a deuterium atom, a substituted or unsubstituted alkyl group of 1 to 10 carbon atoms, or a substituted or unsubstituted aryl group of 7 to 20 ring-forming carbon atoms, where $R_{6-1}$ to $R_{10-1}$ are not all hydrogen atoms, $R_{b1}$ to $R_{b3}$ are each independently a hydrogen atom, a deuterium atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, X is O or S, m1 and m3 are each independently an integer of 0 to 7, m2 is an integer of 0 to 9, when $L_1$ is a direct linkage and the carbon at position 3 of the dibenzothiophene group of Formula 2-2 is combined with N of Formula 1, then Formula 4-4 is not a 3-dibenzofuran group or a 3-dibenzothiophene group, and when f is 1 and $L_1$ is a phenylene group, then $Ar_3$ is any one among Formula 4-1 to Formula 4-3 and is not Formula 4-4, and in Formula 4-1, $R_{10-1}$ is not an unsubstituted naphthalene group, an unsubstituted p-biphenyl group, or a substituted or unsubstituted phenanthryl group, and $R_{6-1}$ to $R_{9-1}$ are not a substituted or unsubstituted phenanthryl group.

18. The amine compound of claim 17, wherein $Ar_3$ represented by Formula 4-1 is represented by any one among Formula 5-1 to Formula 5-3:

Formula 5-1

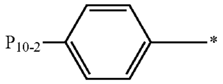

Formula 5-2

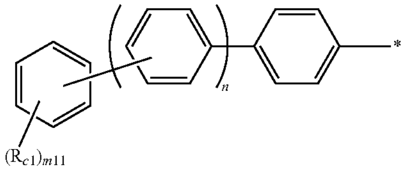

-continued

Formula 5-3

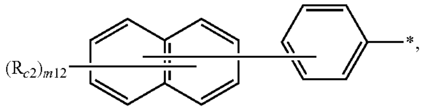

and wherein in Formula 5-1 to Formula 5-3, $P_{10-2}$ is a substituted or unsubstituted alkyl group of 1 to 10 carbon atoms, $R_{c1}$ and $R_{c2}$ are each independently a hydrogen atom, a deuterium atom, a halogen atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, n is 1 or 2, m11 is an integer of 0 to 5, and m12 is an integer of 0 to 7, and wherein when f is 1, $L_1$ is a phenylene group, $Ar_3$ is represented by Formula 5-2, and n of Formula 5-2 is 1, then m11 is 1 to 5 and at least one $R_{c1}$ is not hydrogen, and when f is 1, $L_1$ is a phenylene group, and $Ar_3$ is represented by Formula 5-3, then m12 is 1 to 7 and at least one $R_{c2}$ of Formula 5-3 is not hydrogen.

19. The amine compound of claim 13, wherein $R_3$ and $R_4$ are each independently a hydrogen atom, a deuterium atom, a halogen atom, a cyano group, or a substituted or unsubstituted alkyl group of 1 to 10 carbon atoms.

20. An amine compound, wherein the amine compound is any one among combinations represented in Compound Group 1:

Compound Group 1

| Formula 1 | $Ar_1$ | $Ar_2$ | $Ar_3$ |
|---|---|---|---|
| A1 | 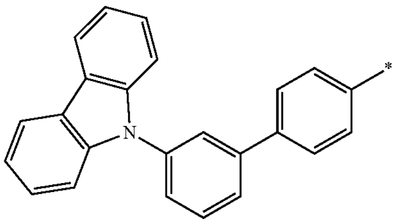 [SMILES: *c1ccc(-c2cccc(-n3c4ccccc4c4ccccc43)c2)cc1] | 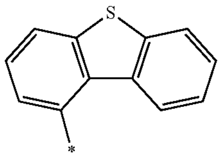 [SMILES: *c1cccc2sc3ccccc3c12] | 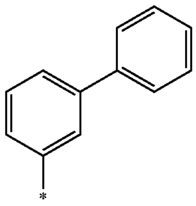 [SMILES: *c1cccc(-c2ccccc2)c1] |
| A2 | 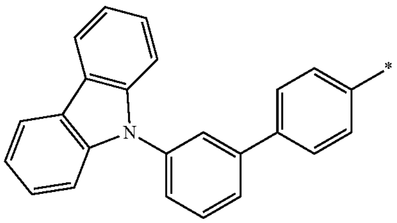 [SMILES: *c1ccc(-c2cccc(-n3c4ccccc4c4ccccc43)c2)cc1] | 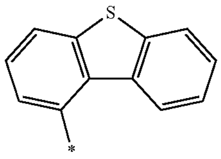 [SMILES: *c1cccc2sc3ccccc3c12] | 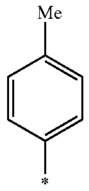 [SMILES: *c1ccc(C)cc1] |

-continued
| Compound Group 1 | | | |
|---|---|---|---|
| Formula 1 | $Ar_1$ | $Ar_2$ | $Ar_3$ |
| A3 | 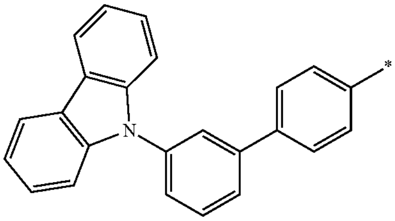 [SMILES: *c1ccc(-c2cccc(-n3c4ccccc4c4ccccc43)c2)cc1] | 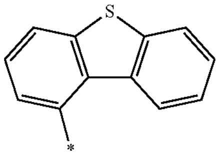 [SMILES: *c1cccc2sc3ccccc3c12] | 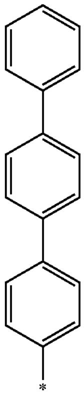 [SMILES: *c1ccc(-c2ccc(-c3ccccc3)cc2)cc1] |
| A4 | 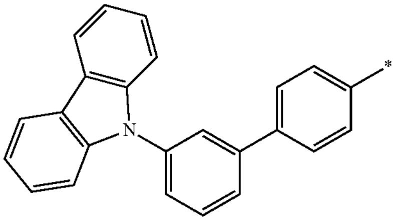 [SMILES: *c1ccc(-c2cccc(-n3c4ccccc4c4ccccc43)c2)cc1] | 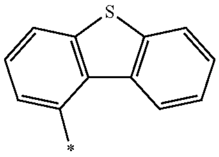 [SMILES: *c1cccc2sc3ccccc3c12] | 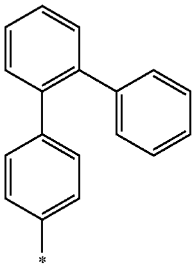 [SMILES: *c1ccc(-c2ccccc2-c2ccccc2)cc1] |
| A5 | 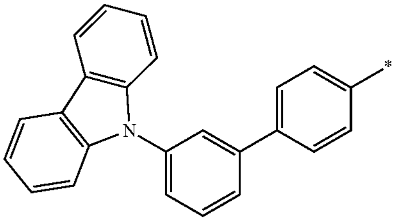 [SMILES: *c1ccc(-c2cccc(-n3c4ccccc4c4ccccc43)c2)cc1] | 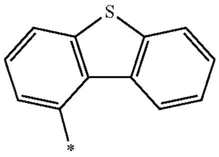 [SMILES: *c1cccc2sc3ccccc3c12] | 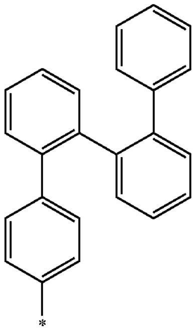 [SMILES: *c1ccc(-c2ccccc2-c2ccccc2-c2ccccc2)cc1] |
| A6 | 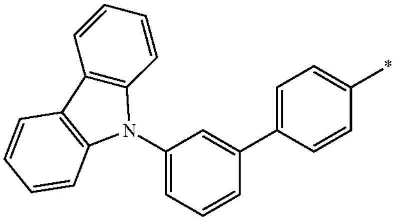 [SMILES: *c1ccc(-c2cccc(-n3c4ccccc4c4ccccc43)c2)cc1] | 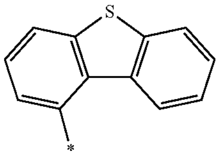 [SMILES: *c1cccc2sc3ccccc3c12] | 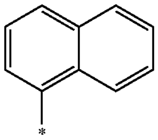 [SMILES: *c1cccc2ccccc12] |
| A7 | 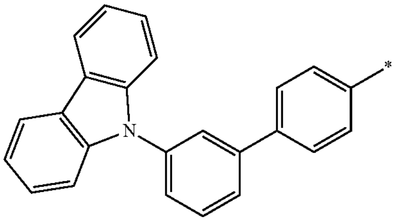 [SMILES: *c1ccc(-c2cccc(-n3c4ccccc4c4ccccc43)c2)cc1] | 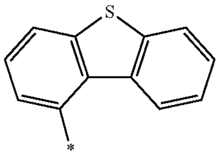 [SMILES: *c1cccc2sc3ccccc3c12] | 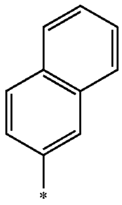 [SMILES: *c1ccc2ccccc2c1] |

-continued
| Compound Group 1 | | | |
|---|---|---|---|
| For-mu-la 1 | $Ar_1$ | $Ar_2$ | $Ar_3$ |
| A8 | 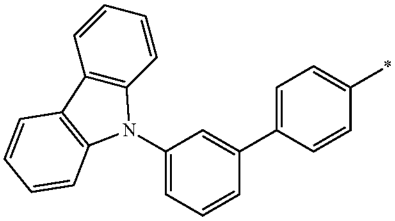 [SMILES: *c1ccc(-c2cccc(-n3c4ccccc4c4ccccc43)c2)cc1] | 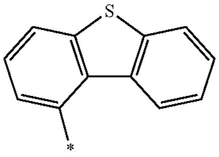 [SMILES: *c1cccc2sc3ccccc3c12] | 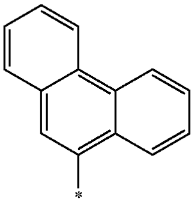 [SMILES: *c1cc2ccccc2c2ccccc12] |
| A9 | 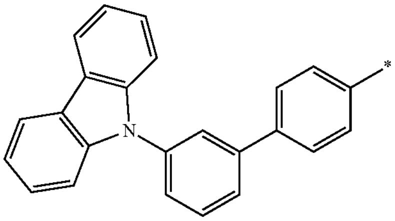 [SMILES: *c1ccc(-c2cccc(-n3c4ccccc4c4ccccc43)c2)cc1] | 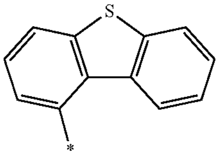 [SMILES: *c1cccc2sc3ccccc3c12] | 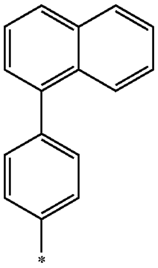 [SMILES: *c1ccc(-c2cccc3ccccc23)cc1] |
| A10 | 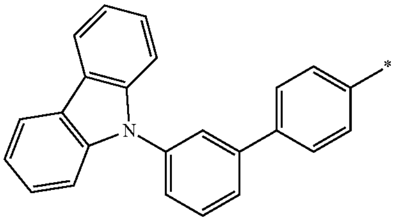 [SMILES: *c1ccc(-c2cccc(-n3c4ccccc4c4ccccc43)c2)cc1] | 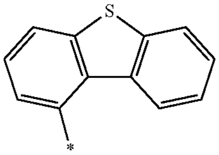 [SMILES: *c1cccc2sc3ccccc3c12] | 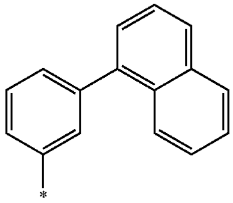 [SMILES: *c1cccc(-c2cccc3ccccc23)c1] |
| A11 | 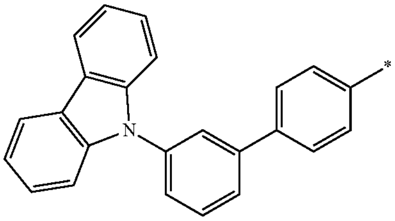 [SMILES: *c1ccc(-c2cccc(-n3c4ccccc4c4ccccc43)c2)cc1] | 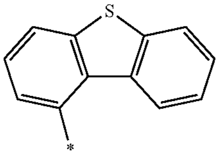 [SMILES: *c1cccc2sc3ccccc3c12] | 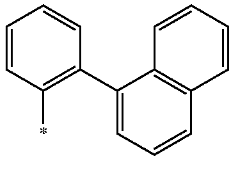 [SMILES: *c1ccccc1-c1cccc2ccccc12] |
| A12 | 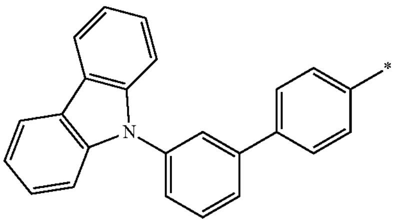 [SMILES: *c1ccc(-c2cccc(-n3c4ccccc4c4ccccc43)c2)cc1] | 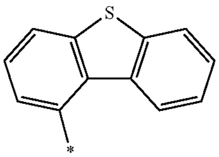 [SMILES: *c1cccc2sc3ccccc3c12] | 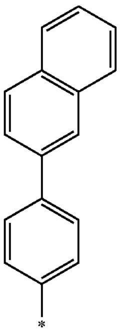 [SMILES: *c1ccc(-c2ccc3ccccc3c2)cc1] |

-continued
Compound Group 1
| Formula 1 | $Ar_1$ | $Ar_2$ | $Ar_3$ |
|---|---|---|---|
| A13 | 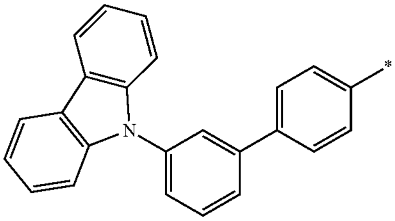 [SMILES: *c1ccc(-c2cccc(-n3c4ccccc4c4ccccc43)c2)cc1] | 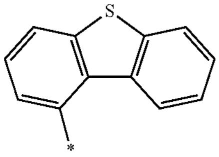 [SMILES: *c1cccc2sc3ccccc3c12] | 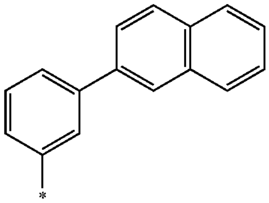 [SMILES: *c1cccc(-c2ccc3ccccc3c2)c1] |
| A14 | 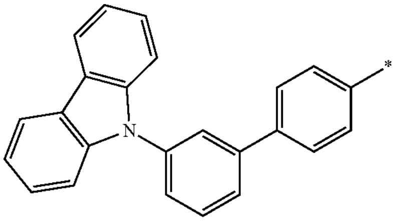 [SMILES: *c1ccc(-c2cccc(-n3c4ccccc4c4ccccc43)c2)cc1] | 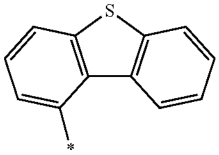 [SMILES: *c1cccc2sc3ccccc3c12] | 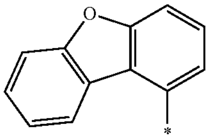 |
| A15 | 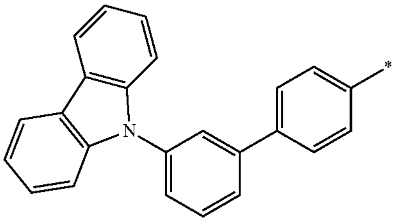 [SMILES: *c1ccc(-c2cccc(-n3c4ccccc4c4ccccc43)c2)cc1] | 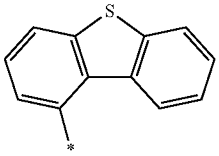 [SMILES: *c1cccc2sc3ccccc3c12] | 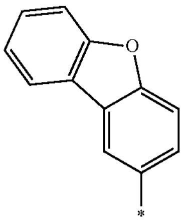 |
| A16 | 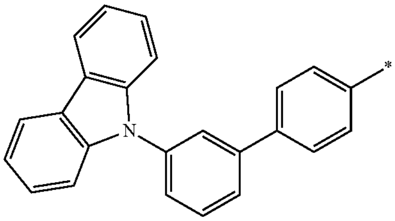 [SMILES: *c1ccc(-c2cccc(-n3c4ccccc4c4ccccc43)c2)cc1] | 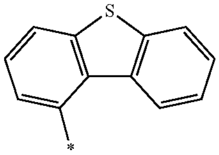 [SMILES: *c1cccc2sc3ccccc3c12] | 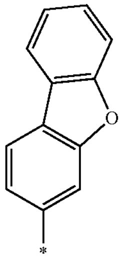 [SMILES: *c1ccc2c(c1)oc1ccccc12] |
| A17 | 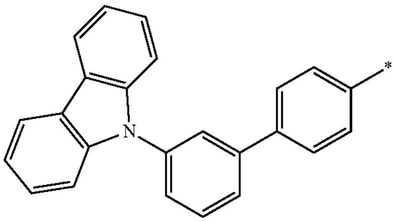 [SMILES: *c1ccc(-c2cccc(-n3c4ccccc4c4ccccc43)c2)cc1] | 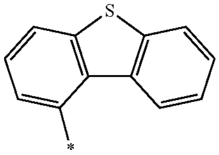 [SMILES: *c1cccc2sc3ccccc3c12] | 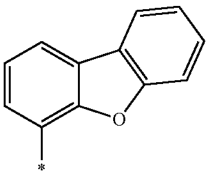 |
| A18 | 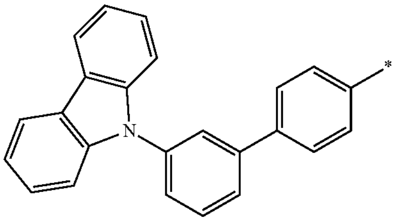 [SMILES: *c1ccc(-c2cccc(-n3c4ccccc4c4ccccc43)c2)cc1] | 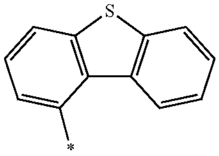 [SMILES: *c1cccc2sc3ccccc3c12] | 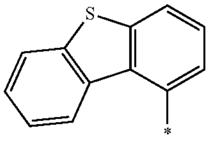 |

-continued
Compound Group 1
| Formula 1 | $Ar_1$ | $Ar_2$ | $Ar_3$ |
|---|---|---|---|
| A19 | 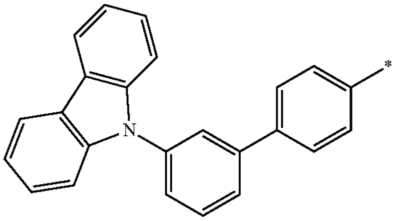 [SMILES: *c1ccc(-c2cccc(-n3c4ccccc4c4ccccc43)c2)cc1] | 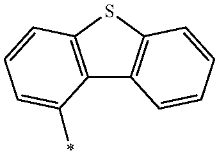 | 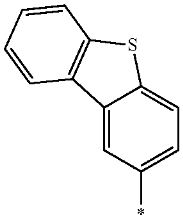 |
| A20 | 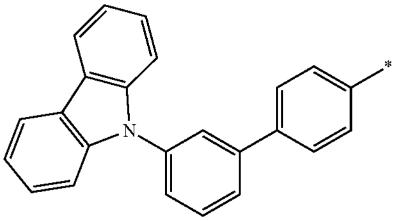 [SMILES: *c1ccc(-c2cccc(-n3c4ccccc4c4ccccc43)c2)cc1] | 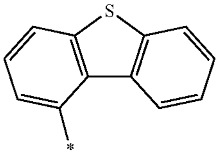 [SMILES: *c1cccc2sc3ccccc3c12] | 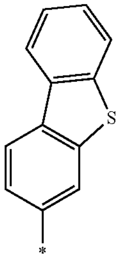 [SMILES: *c1ccc2c(c1)sc1ccccc12] |
| A21 | 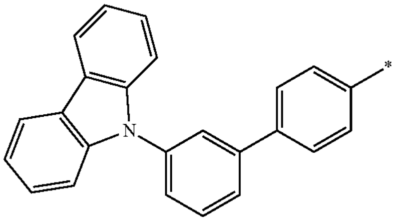 [SMILES: *c1ccc(-c2cccc(-n3c4ccccc4c4ccccc43)c2)cc1] | 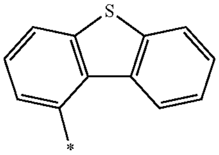 [SMILES: *c1cccc2sc3ccccc3c12] | 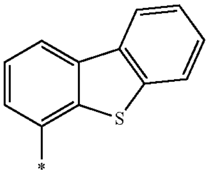 |
| A22 | 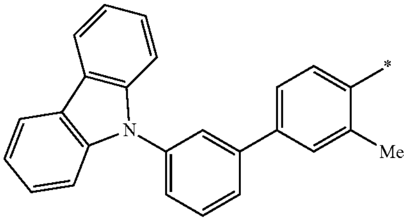 [SMILES: *c1ccc(-c2cccc(-n3c4ccccc4c4ccccc43)c2)cc1C] | 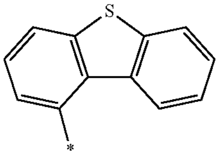 [SMILES: *c1cccc2sc3ccccc3c12] | 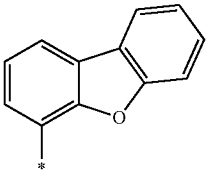 |
| A23 | 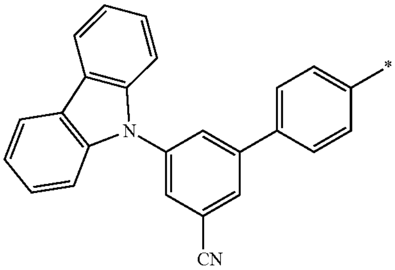 [SMILES: *c1ccc(-c2cc(C#N)cc(-n3c4ccccc4c4ccccc43)c2)cc1] | 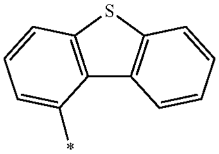 [SMILES: *c1cccc2sc3ccccc3c12] | 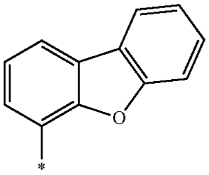 |
| B1 | 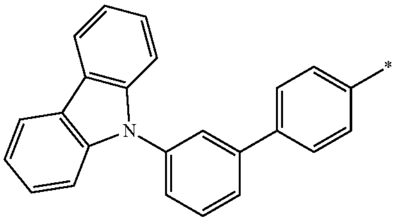 [SMILES: *c1ccc(-c2cccc(-n3c4ccccc4c4ccccc43)c2)cc1] | 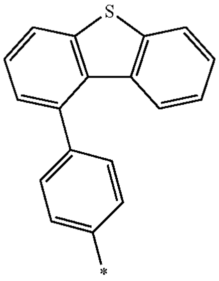 [SMILES: *c1ccc(-c2cccc3sc4ccccc4c23)cc1] | 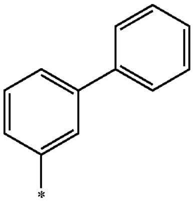 [SMILES: *c1cccc(-c2ccccc2)c1] |

-continued
| Compound Group 1 | | | |
|---|---|---|---|
| Formula 1 | $Ar_1$ | $Ar_2$ | $Ar_3$ |
| B2 | 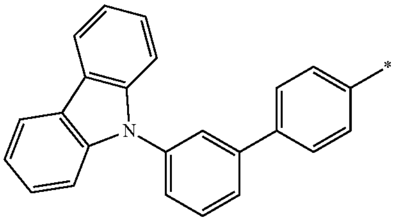 [SMILES: *c1ccc(-c2cccc(-n3c4ccccc4c4ccccc43)c2)cc1] | 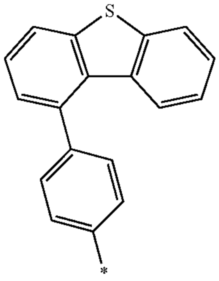 [SMILES: *c1ccc(-c2cccc3sc4ccccc4c23)cc1] | 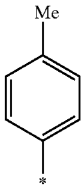 [SMILES: *c1ccc(C)cc1] |
| B3 | 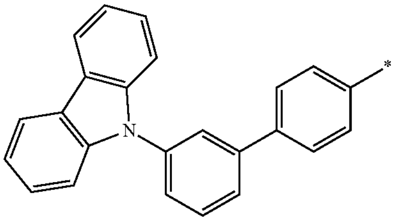 [SMILES: *c1ccc(-c2cccc(-n3c4ccccc4c4ccccc43)c2)cc1] | 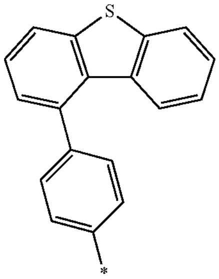 [SMILES: *c1ccc(-c2cccc3sc4ccccc4c23)cc1] | 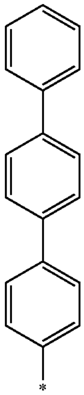 [SMILES: *c1ccc(-c2ccc(-c3ccccc3)cc2)cc1] |
| B4 | 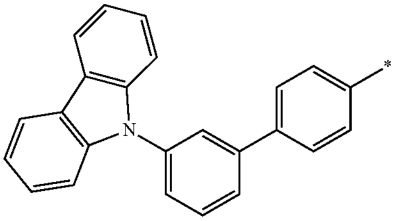 [SMILES: *c1ccc(-c2cccc(-n3c4ccccc4c4ccccc43)c2)cc1] | 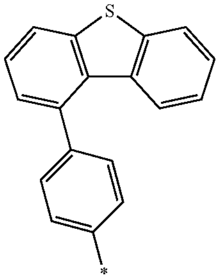 [SMILES: *c1ccc(-c2cccc3sc4ccccc4c23)cc1] | 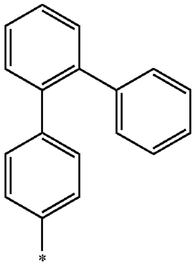 [SMILES: *c1ccc(-c2ccccc2-c2ccccc2)cc1] |
| B5 | 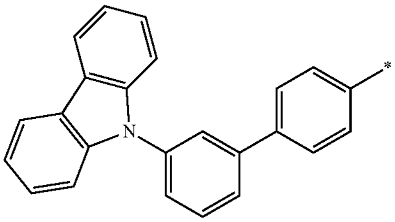 [SMILES: *c1ccc(-c2cccc(-n3c4ccccc4c4ccccc43)c2)cc1] | 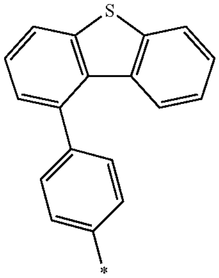 [SMILES: *c1ccc(-c2cccc3sc4ccccc4c23)cc1] | 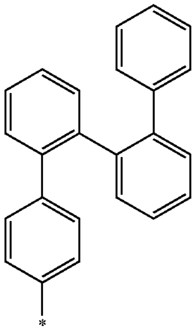 [SMILES: *c1ccc(-c2ccccc2-c2ccccc2-c2ccccc2)cc1] |

-continued
| Compound Group 1 | | | |
|---|---|---|---|
| Formula 1 | $Ar_1$ | $Ar_2$ | $Ar_3$ |
| B6 | 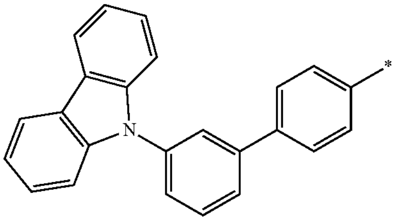 [SMILES: *c1ccc(-c2cccc(-n3c4ccccc4c4ccccc43)c2)cc1] | 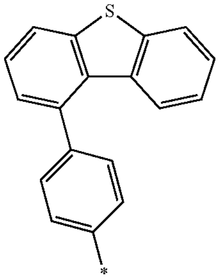 [SMILES: *c1ccc(-c2cccc3sc4ccccc4c23)cc1] | 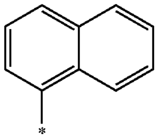 [SMILES: *c1cccc2ccccc12] |
| B7 | 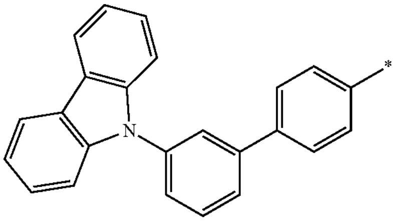 [SMILES: *c1ccc(-c2cccc(-n3c4ccccc4c4ccccc43)c2)cc1] | 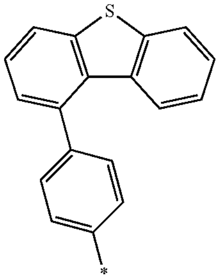 [SMILES: *c1ccc(-c2cccc3sc4ccccc4c23)cc1] | 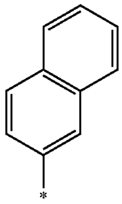 [SMILES: *c1ccc2ccccc2c1] |
| B8 | 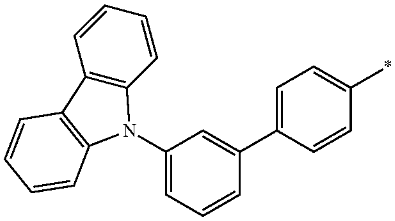 [SMILES: *c1ccc(-c2cccc(-n3c4ccccc4c4ccccc43)c2)cc1] | 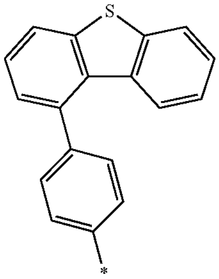 [SMILES: *c1ccc(-c2cccc3sc4ccccc4c23)cc1] | 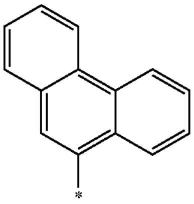 [SMILES: *c1cc2ccccc2c2ccccc12] |
| B9 | 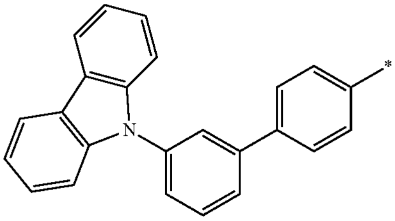 [SMILES: *c1ccc(-c2cccc(-n3c4ccccc4c4ccccc43)c2)cc1] | 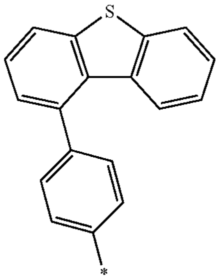 [SMILES: *c1ccc(-c2cccc3sc4ccccc4c23)cc1] | 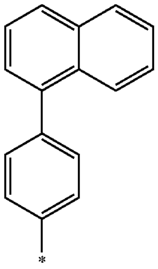 [SMILES: *c1ccc(-c2cccc3ccccc23)cc1] |
| B10 | 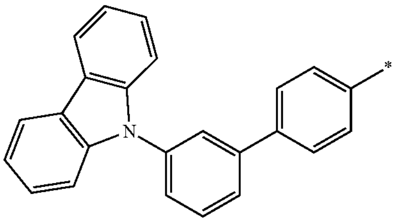 [SMILES: *c1ccc(-c2cccc(-n3c4ccccc4c4ccccc43)c2)cc1] | 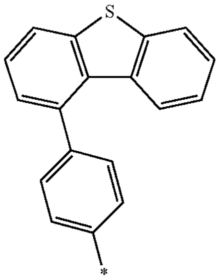 [SMILES: *c1ccc(-c2cccc3sc4ccccc4c23)cc1] | 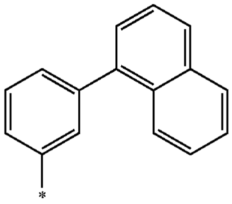 [SMILES: *c1cccc(-c2cccc3ccccc23)c1] |

-continued
| Compound Group 1 | | | |
|---|---|---|---|
| Formula 1 | $Ar_1$ | $Ar_2$ | $Ar_3$ |
| B11 | 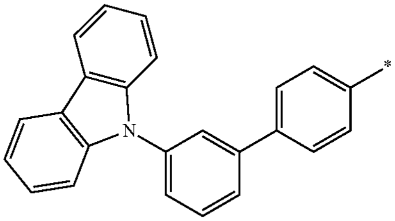 [SMILES: *c1ccc(-c2cccc(-n3c4ccccc4c4ccccc43)c2)cc1] | 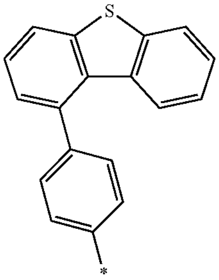 [SMILES: *c1ccc(-c2cccc3sc4ccccc4c23)cc1] | 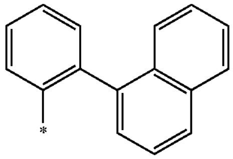 [SMILES: *c1ccccc1-c1cccc2ccccc12] |
| B12 | 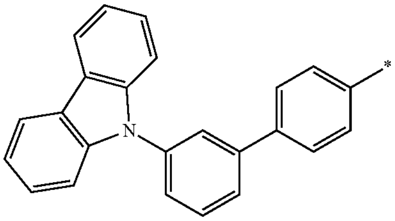 [SMILES: *c1ccc(-c2cccc(-n3c4ccccc4c4ccccc43)c2)cc1] | 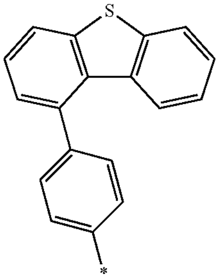 [SMILES: *c1ccc(-c2cccc3sc4ccccc4c23)cc1] | 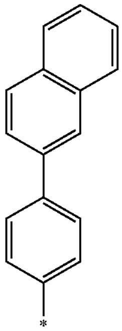 [SMILES: *c1ccc(-c2ccc3ccccc3c2)cc1] |
| B13 | 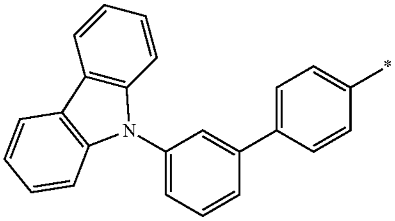 [SMILES: *c1ccc(-c2cccc(-n3c4ccccc4c4ccccc43)c2)cc1] | 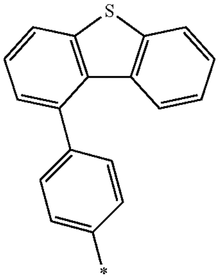 [SMILES: *c1ccc(-c2cccc3sc4ccccc4c23)cc1] | 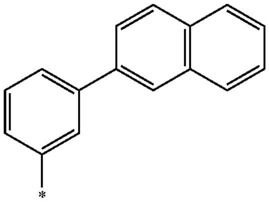 [SMILES: *c1cccc(-c2ccc3ccccc3c2)c1] |
| B14 | 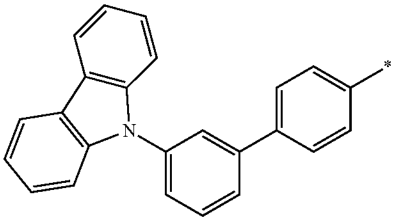 [SMILES: *c1ccc(-c2cccc(-n3c4ccccc4c4ccccc43)c2)cc1] | 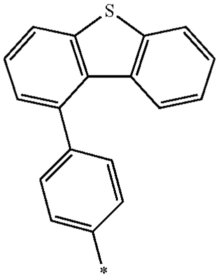 [SMILES: *c1ccc(-c2cccc3sc4ccccc4c23)cc1] | 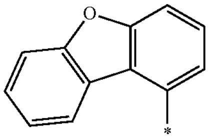 |
| B15 | 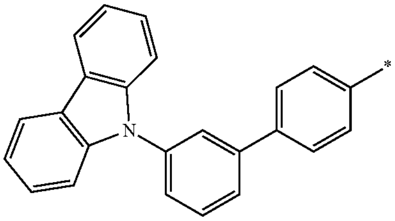 [SMILES: *c1ccc(-c2cccc(-n3c4ccccc4c4ccccc43)c2)cc1] | 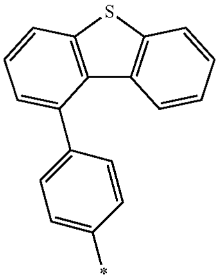 [SMILES: *c1ccc(-c2cccc3sc4ccccc4c23)cc1] | 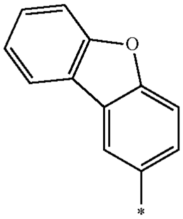 |

-continued
Compound Group 1
| Formula 1 | $Ar_1$ | $Ar_2$ | $Ar_3$ |
|---|---|---|---|
| B16 | 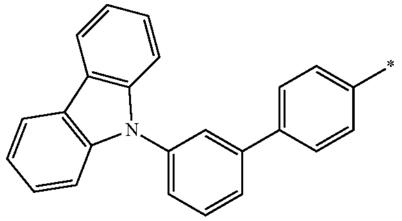 [SMILES: *c1ccc(-c2cccc(-n3c4ccccc4c4ccccc43)c2)cc1] | 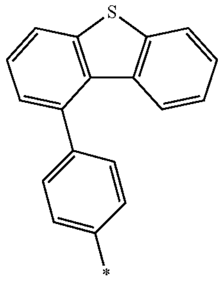 [SMILES: *c1ccc(-c2cccc3sc4ccccc4c23)cc1] | 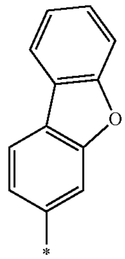 [SMILES: *c1ccc2c(c1)oc1ccccc12] |
| B17 | 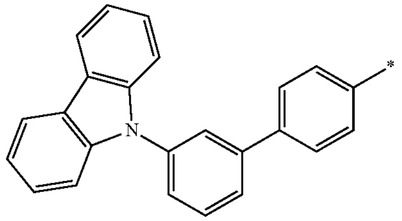 [SMILES: *c1ccc(-c2cccc(-n3c4ccccc4c4ccccc43)c2)cc1] | 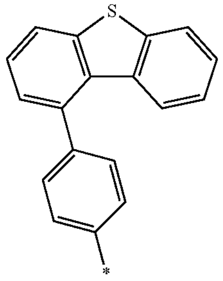 [SMILES: *c1ccc(-c2cccc3sc4ccccc4c23)cc1] | 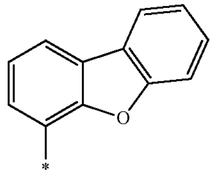 |
| B18 | 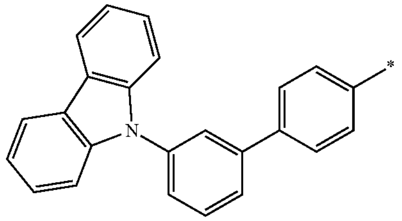 [SMILES: *c1ccc(-c2cccc(-n3c4ccccc4c4ccccc43)c2)cc1] | 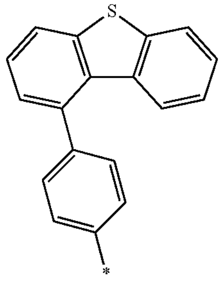 [SMILES: *c1ccc(-c2cccc3sc4ccccc4c23)cc1] | 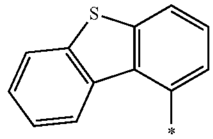 |
| B19 | 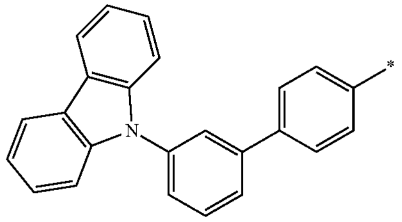 [SMILES: *c1ccc(-c2cccc(-n3c4ccccc4c4ccccc43)c2)cc1] | 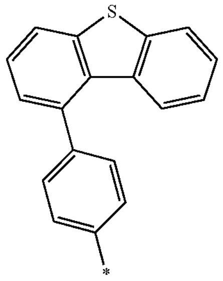 [SMILES: *c1ccc(-c2cccc3sc4ccccc4c23)cc1] | 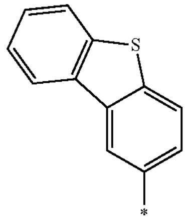 |
| B20 | 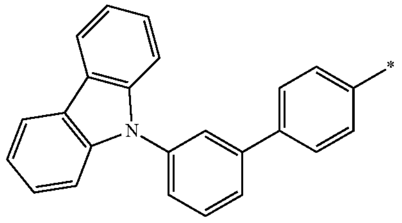 [SMILES: *c1ccc(-c2cccc(-n3c4ccccc4c4ccccc43)c2)cc1] | 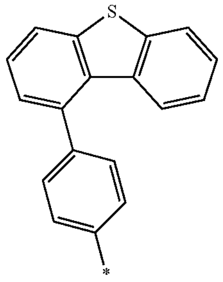 [SMILES: *c1ccc(-c2cccc3sc4ccccc4c23)cc1] | 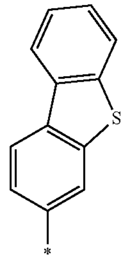 [SMILES: *c1ccc2c(c1)sc1ccccc12] |

-continued
Compound Group 1
| Formula 1 | $Ar_1$ | $Ar_2$ | $Ar_3$ |
|---|---|---|---|
| B21 | 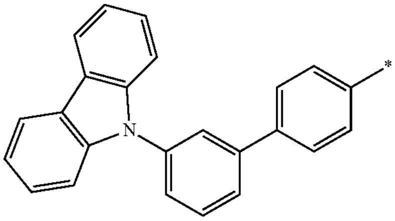 [SMILES: *c1ccc(-c2cccc(-n3c4ccccc4c4ccccc43)c2)cc1] | 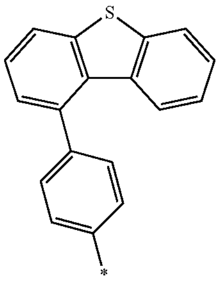 [SMILES: *c1ccc(-c2cccc3sc4ccccc4c23)cc1] | 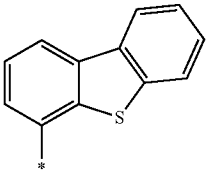 |
| B22 | 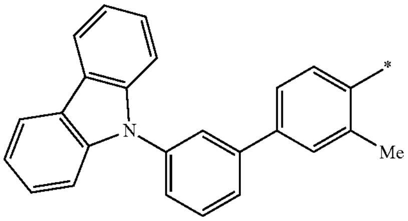 [SMILES: *c1ccc(-c2cccc(-n3c4ccccc4c4ccccc43)c2)cc1C] | 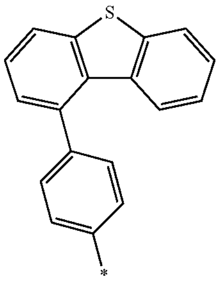 [SMILES: *c1ccc(-c2cccc3sc4ccccc4c23)cc1] | 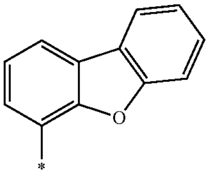 |
| B23 | 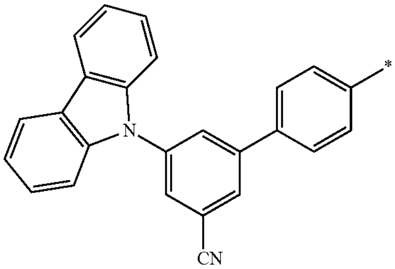 [SMILES: *c1ccc(-c2cc(C#N)cc(-n3c4ccccc4c4ccccc43)c2)cc1] | 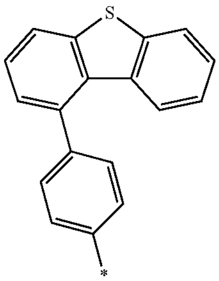 [SMILES: *c1ccc(-c2cccc3sc4ccccc4c23)cc1] | 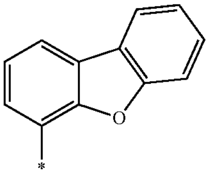 |
| C1 | 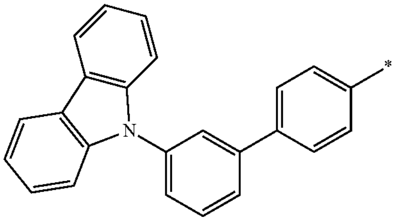 [SMILES: *c1ccc(-c2cccc(-n3c4ccccc4c4ccccc43)c2)cc1] | 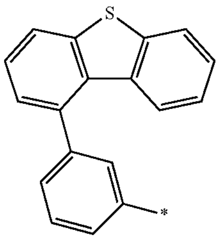 [SMILES: *c1cccc(-c2cccc3sc4ccccc4c23)c1] | 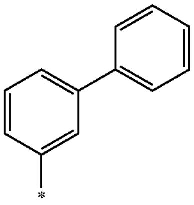 [SMILES: *c1cccc(-c2ccccc2)c1] |
| C2 | 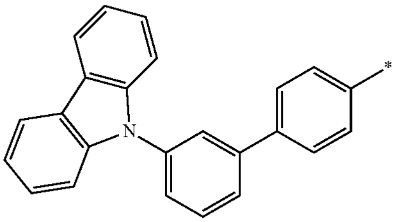 [SMILES: *c1ccc(-c2cccc(-n3c4ccccc4c4ccccc43)c2)cc1] | 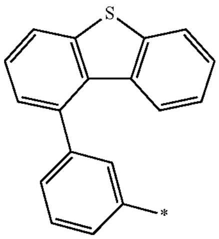 [SMILES: *c1cccc(-c2cccc3sc4ccccc4c23)c1] | 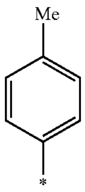 [SMILES: *c1ccc(C)cc1] |

-continued
| Compound Group 1 | | | |
|---|---|---|---|
| Formula 1 | $Ar_1$ | $Ar_2$ | $Ar_3$ |
| C3 | 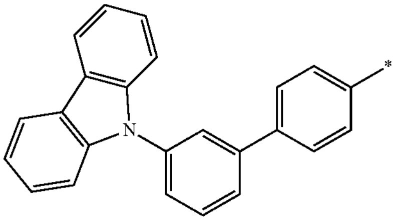 [SMILES: *c1ccc(-c2cccc(-n3c4ccccc4c4ccccc43)c2)cc1] | 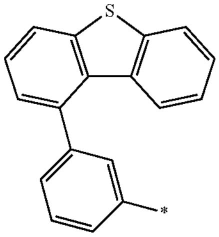 [SMILES: *c1cccc(-c2cccc3sc4ccccc4c23)c1] | 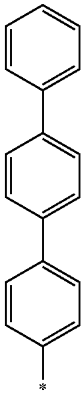 [SMILES: *c1ccc(-c2ccc(-c3ccccc3)cc2)cc1] |
| C4 | 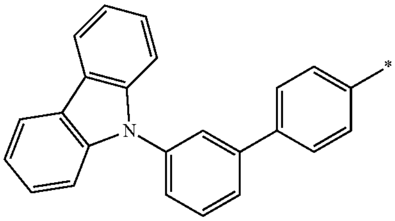 [SMILES: *c1ccc(-c2cccc(-n3c4ccccc4c4ccccc43)c2)cc1] | 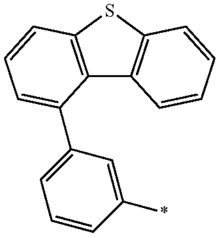 [SMILES: *c1cccc(-c2cccc3sc4ccccc4c23)c1] | 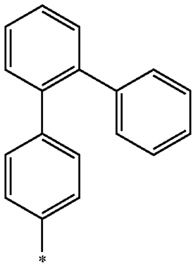 [SMILES: *c1ccc(-c2ccccc2-c2ccccc2)cc1] |
| C5 | 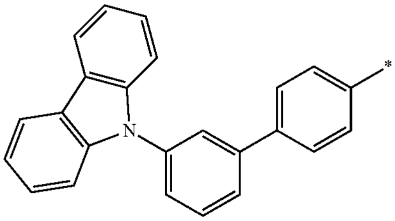 [SMILES: *c1ccc(-c2cccc(-n3c4ccccc4c4ccccc43)c2)cc1] | 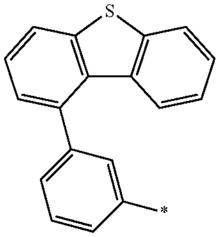 [SMILES: *c1cccc(-c2cccc3sc4ccccc4c23)c1] | 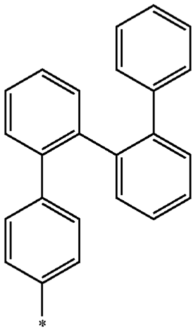 [SMILES: *c1ccc(-c2ccccc2-c2ccccc2-c2ccccc2)cc1] |
| C6 | 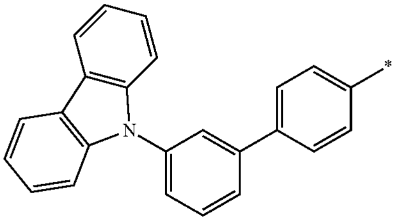 [SMILES: *c1ccc(-c2cccc(-n3c4ccccc4c4ccccc43)c2)cc1] | 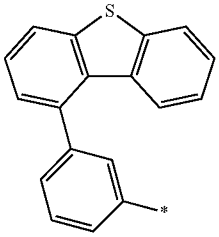 [SMILES: *c1cccc(-c2cccc3sc4ccccc4c23)c1] | 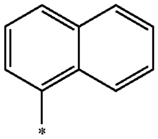 [SMILES: *c1cccc2ccccc12] |
| C7 | 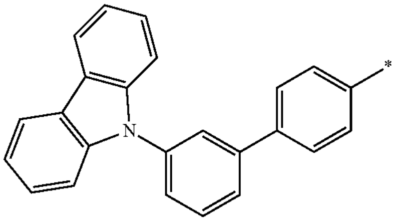 [SMILES: *c1ccc(-c2cccc(-n3c4ccccc4c4ccccc43)c2)cc1] | 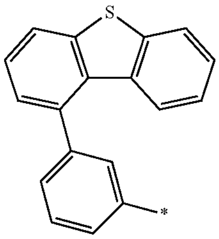 [SMILES: *c1cccc(-c2cccc3sc4ccccc4c23)c1] | 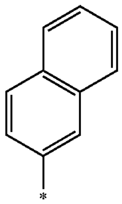 [SMILES: *c1ccc2ccccc2c1] |

-continued
Compound Group 1
| Formula 1 | $Ar_1$ | $Ar_2$ | $Ar_3$ |
| --- | --- | --- | --- |
| C8 | 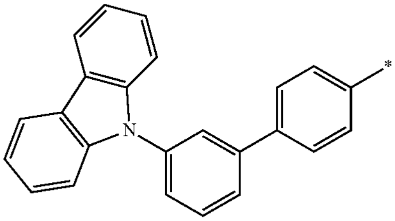 [SMILES: *c1ccc(-c2cccc(-n3c4ccccc4c4ccccc43)c2)cc1] | 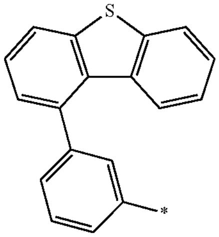 [SMILES: *c1cccc(-c2cccc3sc4ccccc4c23)c1] | 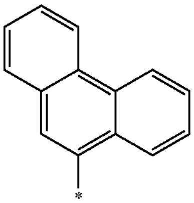 [SMILES: *c1cc2ccccc2c2ccccc12] |
| C9 | 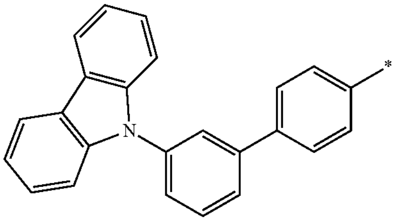 [SMILES: *c1ccc(-c2cccc(-n3c4ccccc4c4ccccc43)c2)cc1] | 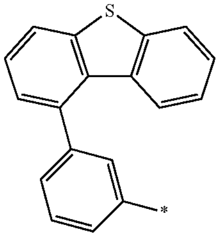 [SMILES: *c1cccc(-c2cccc3sc4ccccc4c23)c1] | 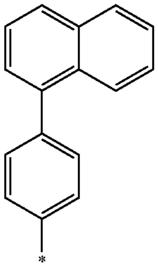 [SMILES: *c1ccc(-c2cccc3ccccc23)cc1] |
| C10 | 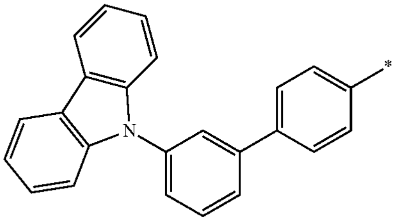 [SMILES: *c1ccc(-c2cccc(-n3c4ccccc4c4ccccc43)c2)cc1] | 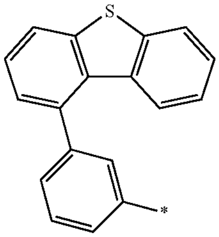 [SMILES: *c1cccc(-c2cccc3sc4ccccc4c23)c1] | 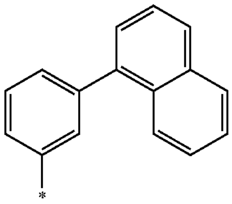 [SMILES: *c1cccc(-c2cccc3ccccc23)c1] |
| C11 | 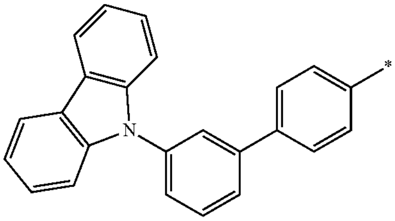 [SMILES: *c1ccc(-c2cccc(-n3c4ccccc4c4ccccc43)c2)cc1] | 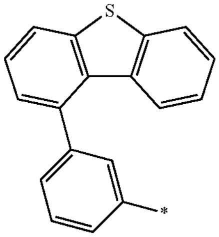 [SMILES: *c1cccc(-c2cccc3sc4ccccc4c23)c1] | 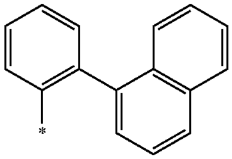 [SMILES: *c1ccccc1-c1cccc2ccccc12] |
| C12 | 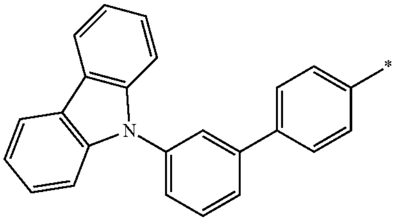 [SMILES: *c1ccc(-c2cccc(-n3c4ccccc4c4ccccc43)c2)cc1] | 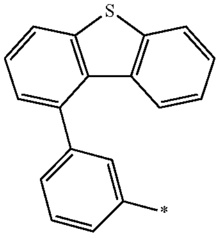 [SMILES: *c1cccc(-c2cccc3sc4ccccc4c23)c1] | 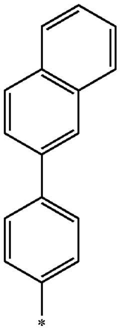 [SMILES: *c1ccc(-c2ccc3ccccc3c2)cc1] |

-continued
| Compound Group 1 | | | |
|---|---|---|---|
| Formula 1 | $Ar_1$ | $Ar_2$ | $Ar_3$ |
| C13 | 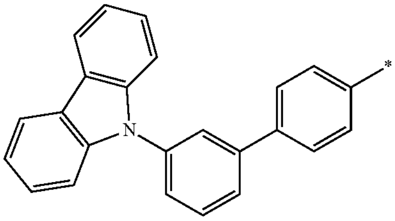 [SMILES: *c1ccc(-c2cccc(-n3c4ccccc4c4ccccc43)c2)cc1] | 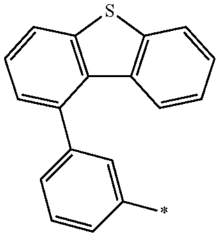 [SMILES: *c1cccc(-c2cccc3sc4ccccc4c23)c1] | 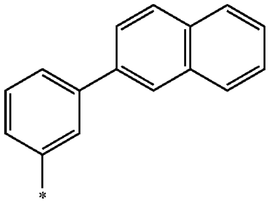 [SMILES: *c1cccc(-c2ccc3ccccc3c2)c1] |
| C14 | 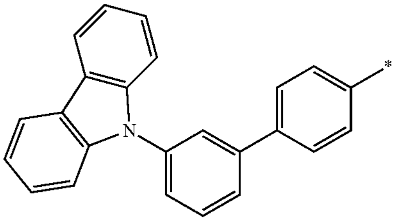 [SMILES: *c1ccc(-c2cccc(-n3c4ccccc4c4ccccc43)c2)cc1] | 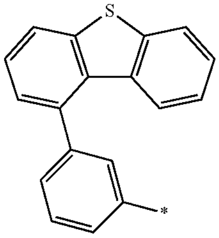 [SMILES: *c1cccc(-c2cccc3sc4ccccc4c23)c1] | 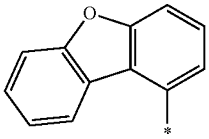 |
| C15 | 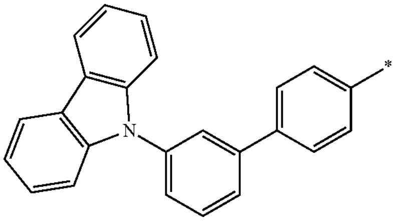 [SMILES: *c1ccc(-c2cccc(-n3c4ccccc4c4ccccc43)c2)cc1] | 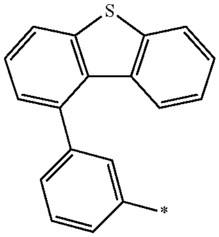 [SMILES: *c1cccc(-c2cccc3sc4ccccc4c23)c1] | 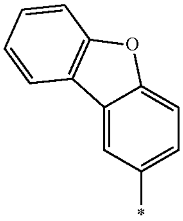 |
| C16 | 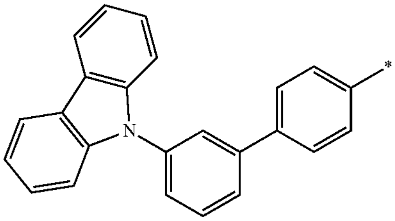 [SMILES: *c1ccc(-c2cccc(-n3c4ccccc4c4ccccc43)c2)cc1] | 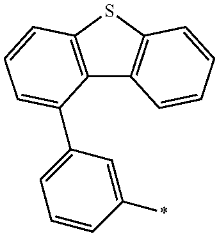 [SMILES: *c1cccc(-c2cccc3sc4ccccc4c23)c1] | 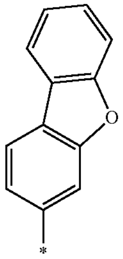 [SMILES: *c1ccc2c(c1)oc1ccccc12] |
| C17 | 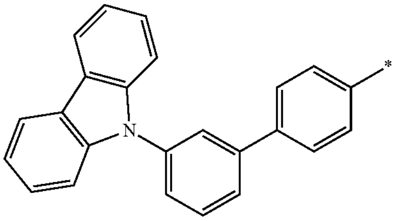 [SMILES: *c1ccc(-c2cccc(-n3c4ccccc4c4ccccc43)c2)cc1] | 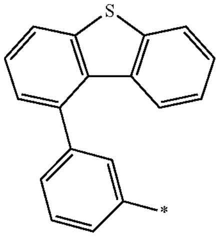 [SMILES: *c1cccc(-c2cccc3sc4ccccc4c23)c1] | 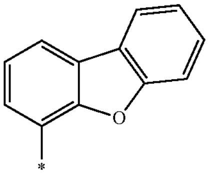 |
| C18 | 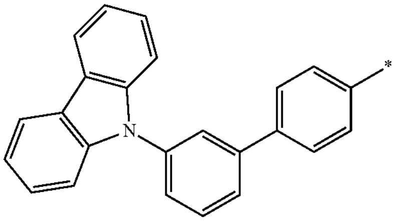 [SMILES: *c1ccc(-c2cccc(-n3c4ccccc4c4ccccc43)c2)cc1] | 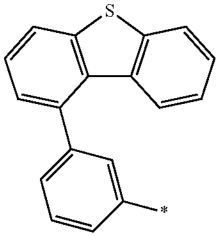 [SMILES: *c1cccc(-c2cccc3sc4ccccc4c23)c1] | 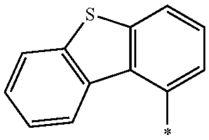 |

-continued
| Compound Group 1 | | | |
|---|---|---|---|
| Formula 1 | $Ar_1$ | $Ar_2$ | $Ar_3$ |
| C19 | 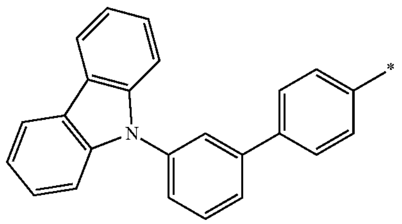 [SMILES: *c1ccc(-c2cccc(-n3c4ccccc4c4ccccc43)c2)cc1] | 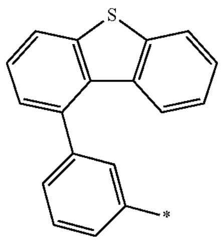 [SMILES: *c1cccc(-c2cccc3sc4ccccc4c23)c1] | 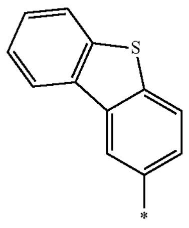 |
| C20 | 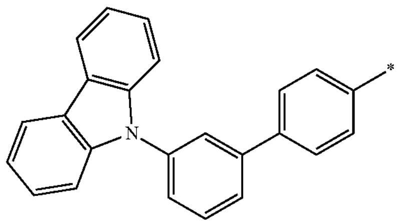 [SMILES: *c1ccc(-c2cccc(-n3c4ccccc4c4ccccc43)c2)cc1] | 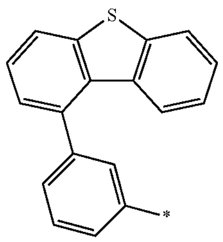 [SMILES: *c1cccc(-c2cccc3sc4ccccc4c23)c1] | 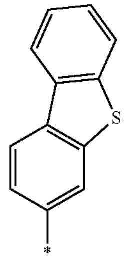 |
| C21 | 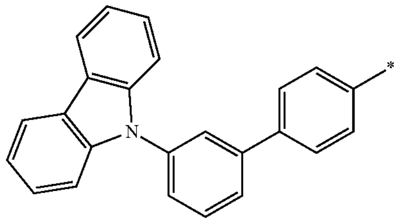 [SMILES: *c1ccc(-c2cccc(-n3c4ccccc4c4ccccc43)c2)cc1] | 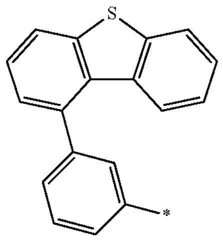 [SMILES: *c1cccc(-c2cccc3sc4ccccc4c23)c1] | 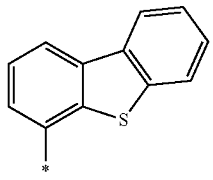 |
| C22 | 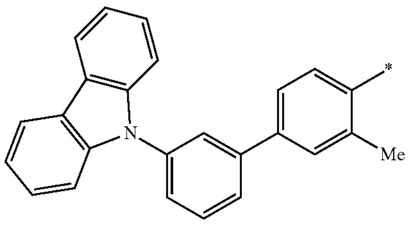 [SMILES: *c1ccc(-c2cccc(-n3c4ccccc4c4ccccc43)c2)cc1C] | 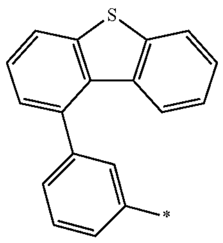 [SMILES: *c1cccc(-c2cccc3sc4ccccc4c23)c1] | 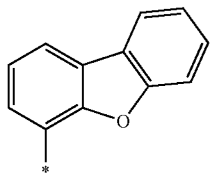 |
| C23 | 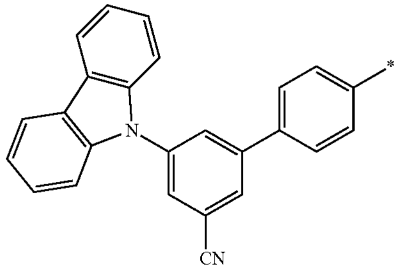 [SMILES: *c1ccc(-c2cc(C#N)cc(-n3c4ccccc4c4ccccc43)c2)cc1] | 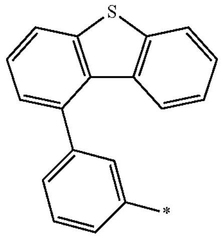 [SMILES: *c1cccc(-c2cccc3sc4ccccc4c23)c1] | 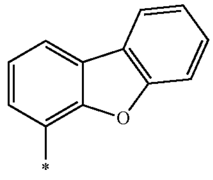 |

-continued
| Compound Group 1 | | | |
|---|---|---|---|
| Formula 1 | $Ar_1$ | $Ar_2$ | $Ar_3$ |
| D1 | 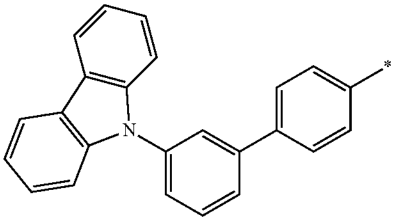 [SMILES: *c1ccc(-c2cccc(-n3c4ccccc4c4ccccc43)c2)cc1] | 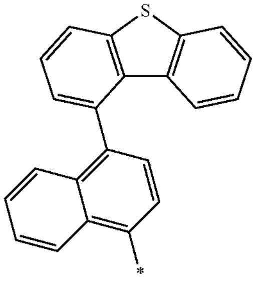 [SMILES: *c1ccc(-c2cccc3sc4ccccc4c23)c2ccccc12] | 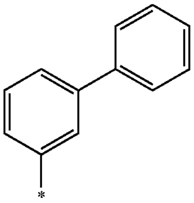 [SMILES: *c1cccc(-c2ccccc2)c1] |
| D2 | 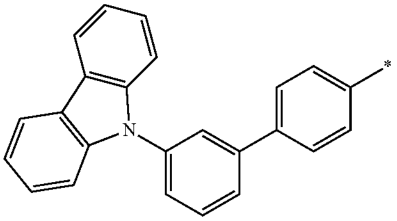 [SMILES: *c1ccc(-c2cccc(-n3c4ccccc4c4ccccc43)c2)cc1] | 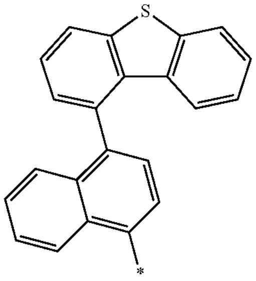 [SMILES: *c1ccc(-c2cccc3sc4ccccc4c23)c2ccccc12] | 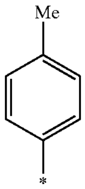 [SMILES: *c1ccc(C)cc1] |
| D3 | 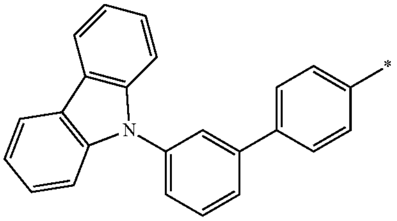 [SMILES: *c1ccc(-c2cccc(-n3c4ccccc4c4ccccc43)c2)cc1] | 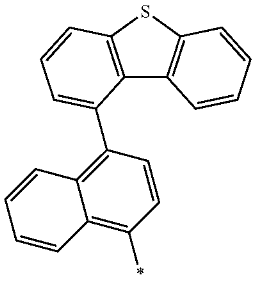 [SMILES: *c1ccc(-c2cccc3sc4ccccc4c23)c2ccccc12] | 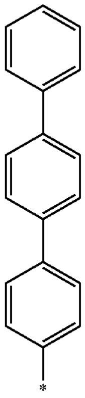 [SMILES: *c1ccc(-c2ccc(-c3ccccc3)cc2)cc1] |
| D4 | 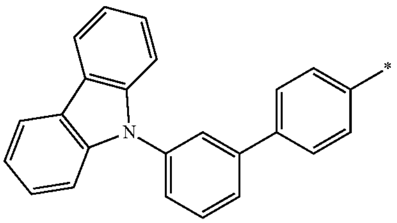 [SMILES: *c1ccc(-c2cccc(-n3c4ccccc4c4ccccc43)c2)cc1] | 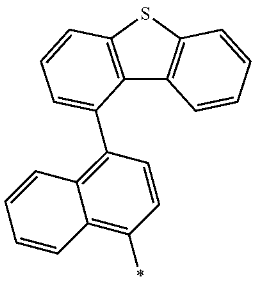 [SMILES: *c1ccc(-c2cccc3sc4ccccc4c23)c2ccccc12] | 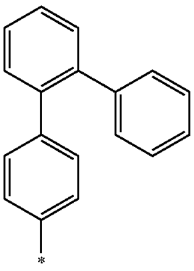 [SMILES: *c1ccc(-c2ccccc2-c2ccccc2)cc1] |

-continued
| Compound Group 1 | | | |
|---|---|---|---|
| Formula 1 | $Ar_1$ | $Ar_2$ | $Ar_3$ |
| D5 | 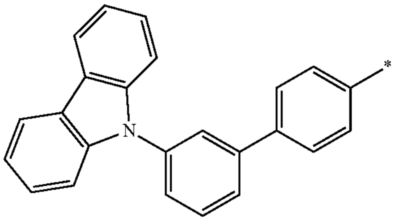 [SMILES: *c1ccc(-c2cccc(-n3c4ccccc4c4ccccc43)c2)cc1] | 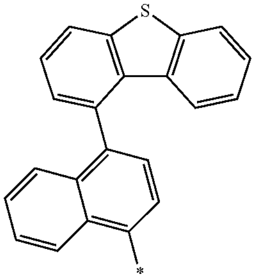 [SMILES: *c1ccc(-c2cccc3sc4ccccc4c23)c2ccccc12] | 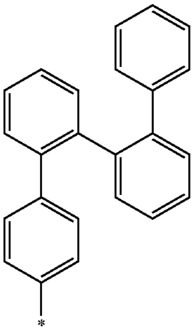 [SMILES: *c1ccc(-c2ccccc2-c2ccccc2-c2ccccc2)cc1] |
| D6 | 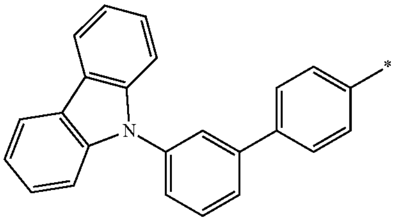 [SMILES: *c1ccc(-c2cccc(-n3c4ccccc4c4ccccc43)c2)cc1] | 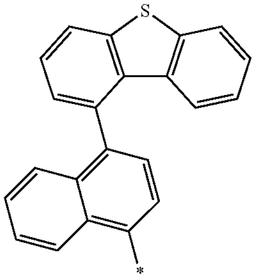 [SMILES: *c1ccc(-c2cccc3sc4ccccc4c23)c2ccccc12] | 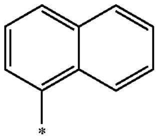 [SMILES: *c1cccc2ccccc12] |
| D7 | 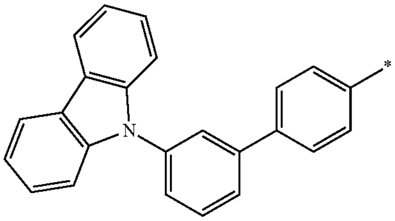 [SMILES: *c1ccc(-c2cccc(-n3c4ccccc4c4ccccc43)c2)cc1] | 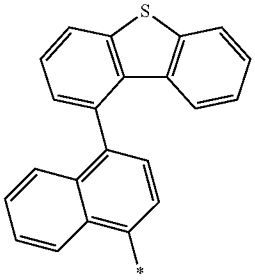 [SMILES: *c1ccc(-c2cccc3sc4ccccc4c23)c2ccccc12] | 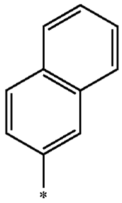 [SMILES: *c1ccc2ccccc2c1] |
| D8 | 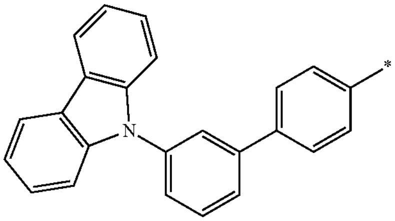 [SMILES: *c1ccc(-c2cccc(-n3c4ccccc4c4ccccc43)c2)cc1] | 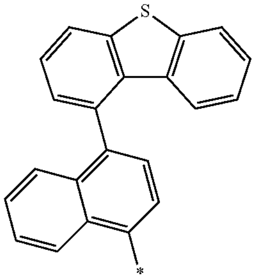 [SMILES: *c1ccc(-c2cccc3sc4ccccc4c23)c2ccccc12] | 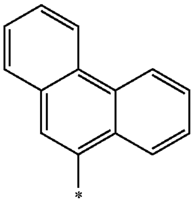 [SMILES: *c1cc2ccccc2c2ccccc12] |
| D9 | 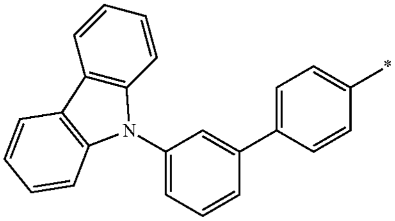 [SMILES: *c1ccc(-c2cccc(-n3c4ccccc4c4ccccc43)c2)cc1] | 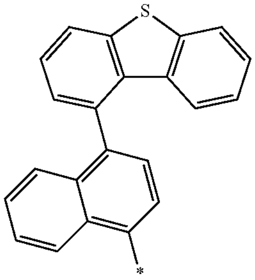 [SMILES: *c1ccc(-c2cccc3sc4ccccc4c23)c2ccccc12] | 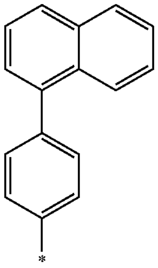 [SMILES: *c1ccc(-c2cccc3ccccc23)cc1] |

-continued
| Compound Group 1 | | | |
|---|---|---|---|
| Formula 1 | $Ar_1$ | $Ar_2$ | $Ar_3$ |
| D10 | 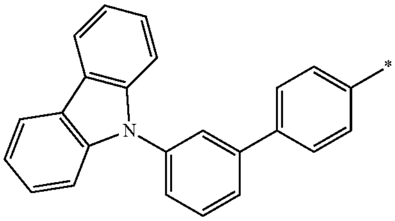 [SMILES: *c1ccc(-c2cccc(-n3c4ccccc4c4ccccc43)c2)cc1] | 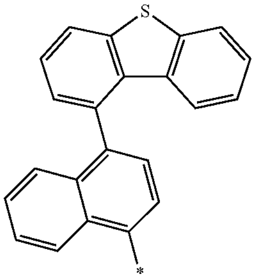 [SMILES: *c1ccc(-c2cccc3sc4ccccc4c23)c2ccccc12] | 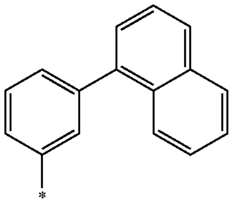 [SMILES: *c1cccc(-c2cccc3ccccc23)c1] |
| D11 | 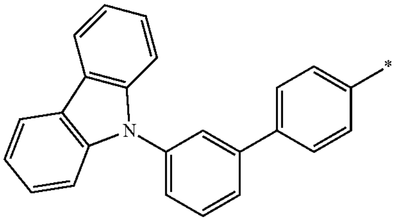 [SMILES: *c1ccc(-c2cccc(-n3c4ccccc4c4ccccc43)c2)cc1] | 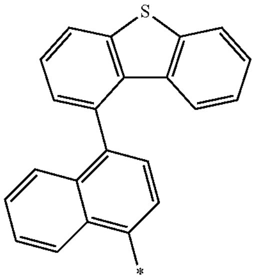 [SMILES: *c1ccc(-c2cccc3sc4ccccc4c23)c2ccccc12] | 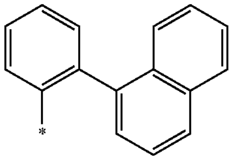 [SMILES: *c1ccccc1-c1cccc2ccccc12] |
| D12 | 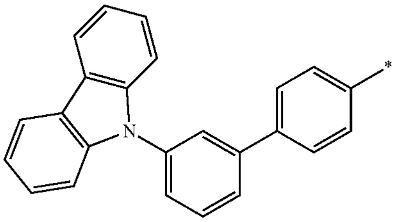 [SMILES: *c1ccc(-c2cccc(-n3c4ccccc4c4ccccc43)c2)cc1] | 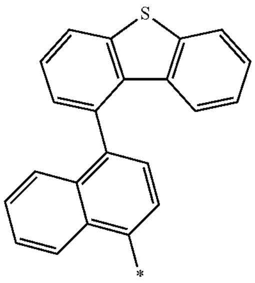 [SMILES: *c1ccc(-c2cccc3sc4ccccc4c23)c2ccccc12] | 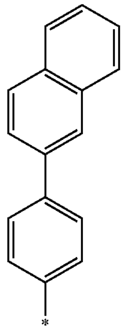 [SMILES: *c1ccc(-c2ccc3ccccc3c2)cc1] |
| D13 | 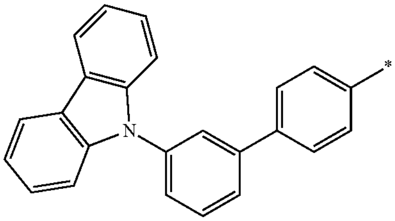 [SMILES: *c1ccc(-c2cccc(-n3c4ccccc4c4ccccc43)c2)cc1] | 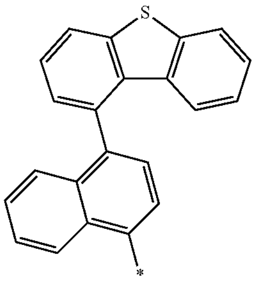 [SMILES: *c1ccc(-c2cccc3sc4ccccc4c23)c2ccccc12] | 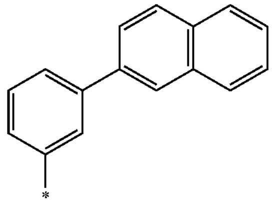 [SMILES: *c1cccc(-c2ccc3ccccc3c2)c1] |
| D14 | 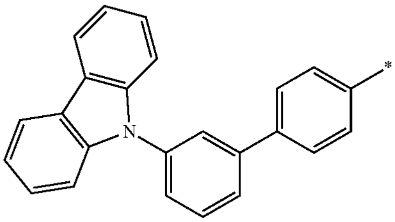 [SMILES: *c1ccc(-c2cccc(-n3c4ccccc4c4ccccc43)c2)cc1] | 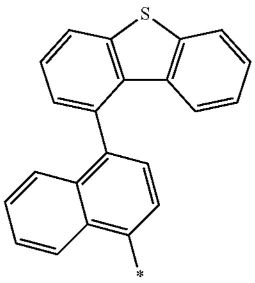 [SMILES: *c1ccc(-c2cccc3sc4ccccc4c23)c2ccccc12] | 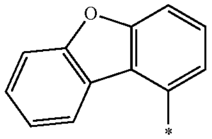 [SMILES: *c1cccc2oc3ccccc3c12] |

-continued
| Compound Group 1 | | | |
|---|---|---|---|
| Formula 1 | $Ar_1$ | $Ar_2$ | $Ar_3$ |
| D15 | 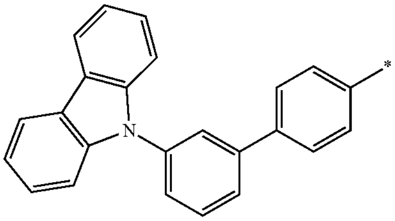 [SMILES: *c1ccc(-c2cccc(-n3c4ccccc4c4ccccc43)c2)cc1] | 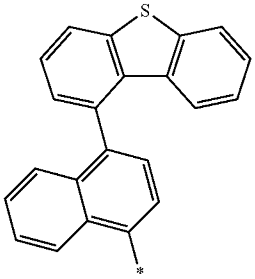 [SMILES: *c1ccc(-c2cccc3sc4ccccc4c23)c2ccccc12] | 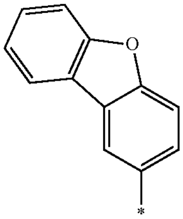 [SMILES: *c1ccc2oc3ccccc3c2c1] |
| D16 | 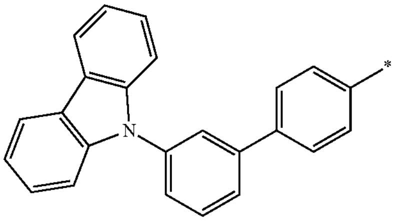 [SMILES: *c1ccc(-c2cccc(-n3c4ccccc4c4ccccc43)c2)cc1] | 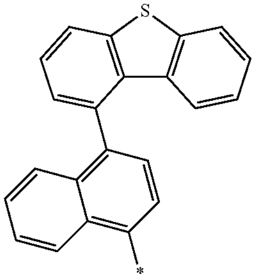 [SMILES: *c1ccc(-c2cccc3sc4ccccc4c23)c2ccccc12] | 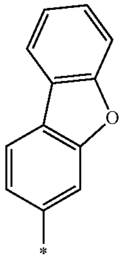 [SMILES: *c1ccc2c(c1)oc1ccccc12] |
| D17 | 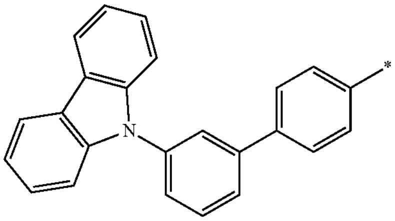 [SMILES: *c1ccc(-c2cccc(-n3c4ccccc4c4ccccc43)c2)cc1] | 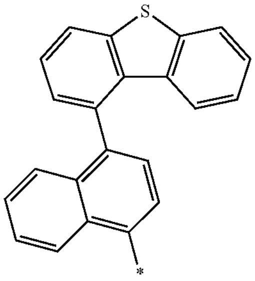 [SMILES: *c1ccc(-c2cccc3sc4ccccc4c23)c2ccccc12] | 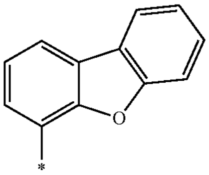 |
| D18 | 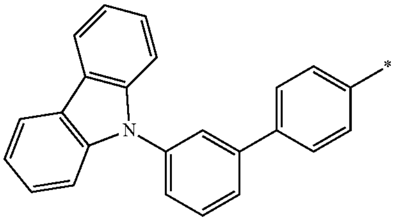 [SMILES: *c1ccc(-c2cccc(-n3c4ccccc4c4ccccc43)c2)cc1] | 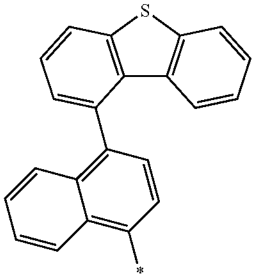 [SMILES: *c1ccc(-c2cccc3sc4ccccc4c23)c2ccccc12] | 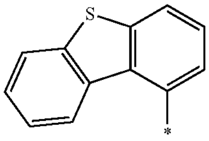 |
| D19 | 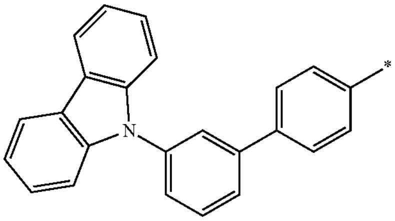 [SMILES: *c1ccc(-c2cccc(-n3c4ccccc4c4ccccc43)c2)cc1] | 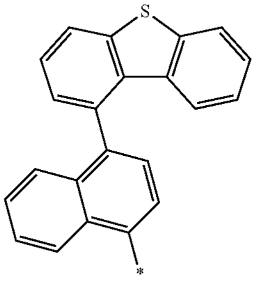 [SMILES: *c1ccc(-c2cccc3sc4ccccc4c23)c2ccccc12] | 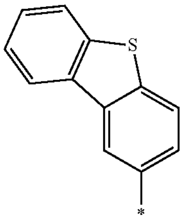 |

-continued
| Compound Group 1 | | | |
|---|---|---|---|
| Formula 1 | $Ar_1$ | $Ar_2$ | $Ar_3$ |
| D20 | 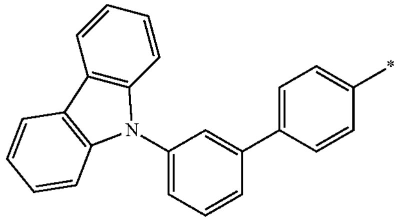 [SMILES: *c1ccc(-c2cccc(-n3c4ccccc4c4ccccc43)c2)cc1] | 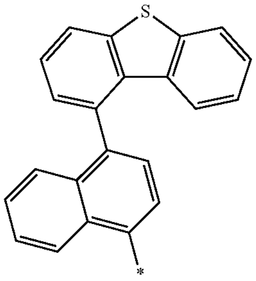 [SMILES: *c1ccc(-c2cccc3sc4ccccc4c23)c2ccccc12] | 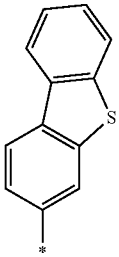 [SMILES: *c1ccc2c(c1)sc1ccccc12] |
| D21 | 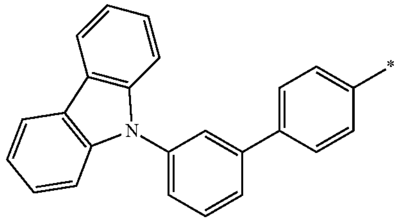 [SMILES: *c1ccc(-c2cccc(-n3c4ccccc4c4ccccc43)c2)cc1] | 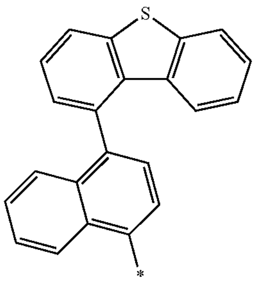 [SMILES: *c1ccc(-c2cccc3sc4ccccc4c23)c2ccccc12] | 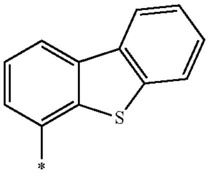 |
| D22 | 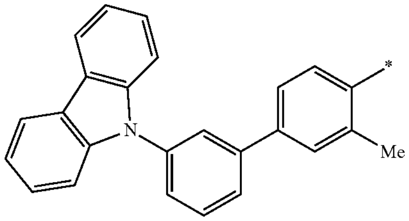 [SMILES: *c1ccc(-c2cccc(-n3c4ccccc4c4ccccc43)c2)cc1C] | 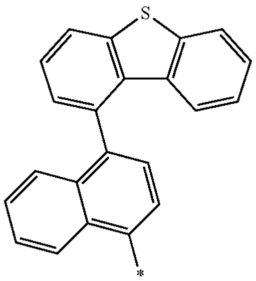 [SMILES: *c1ccc(-c2cccc3sc4ccccc4c23)c2ccccc12] | 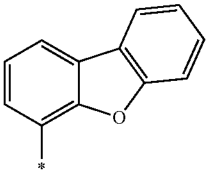 |
| D23 | 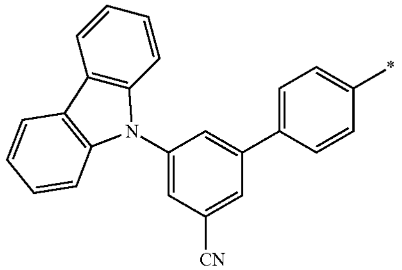 [SMILES: *c1ccc(-c2cc(C#N)cc(-n3c4ccccc4c4ccccc43)c2)cc1] | 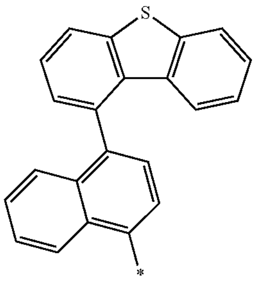 [SMILES: *c1ccc(-c2cccc3sc4ccccc4c23)c2ccccc12] | 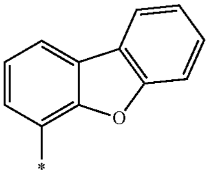 |
| E1 | 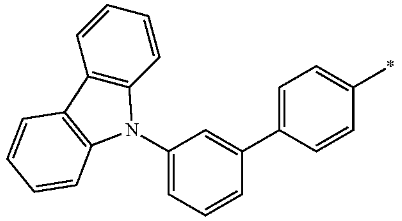 [SMILES: *c1ccc(-c2cccc(-n3c4ccccc4c4ccccc43)c2)cc1] | 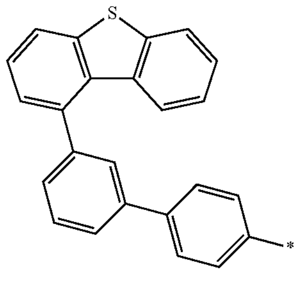 [SMILES: *c1ccc(-c2cccc(-c3cccc4sc5ccccc5c34)c2)cc1] | 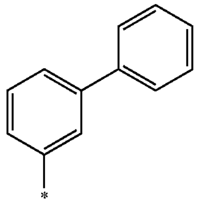 [SMILES: *c1cccc(-c2ccccc2)c1] |

-continued
| Compound Group 1 | | | |
|---|---|---|---|
| Formula 1 | $Ar_1$ | $Ar_2$ | $Ar_3$ |
| E2 | 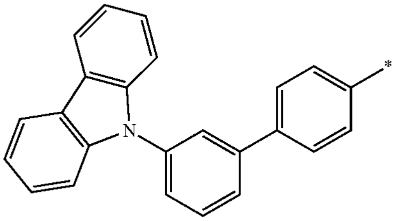 [SMILES: *c1ccc(-c2cccc(-n3c4ccccc4c4ccccc43)c2)cc1] | 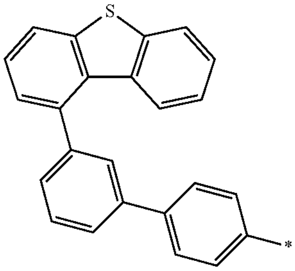 [SMILES: *c1ccc(-c2cccc(-c3cccc4sc5ccccc5c34)c2)cc1] | 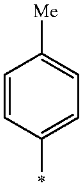 [SMILES: *c1ccc(C)cc1] |
| E3 | 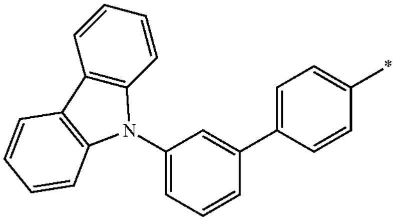 [SMILES: *c1ccc(-c2cccc(-n3c4ccccc4c4ccccc43)c2)cc1] | 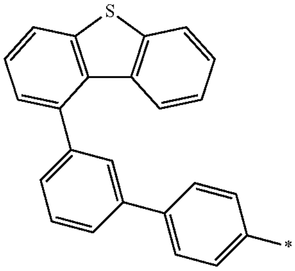 [SMILES: *c1ccc(-c2cccc(-c3cccc4sc5ccccc5c34)c2)cc1] | 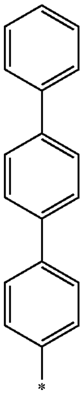 [SMILES: *c1ccc(-c2ccc(-c3ccccc3)cc2)cc1] |
| E4 | 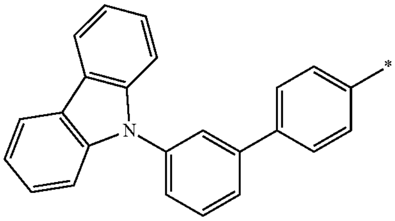 [SMILES: *c1ccc(-c2cccc(-n3c4ccccc4c4ccccc43)c2)cc1] | 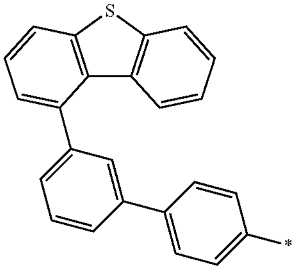 [SMILES: *c1ccc(-c2cccc(-c3cccc4sc5ccccc5c34)c2)cc1] | 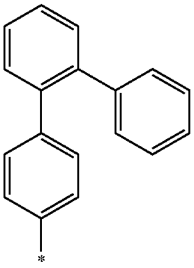 [SMILES: *c1ccc(-c2ccccc2-c2ccccc2)cc1] |
| E5 | 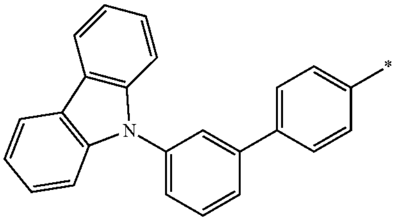 [SMILES: *c1ccc(-c2cccc(-n3c4ccccc4c4ccccc43)c2)cc1] | 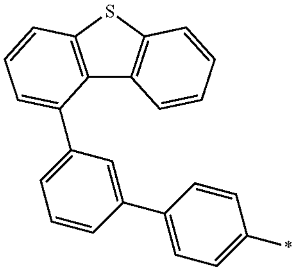 [SMILES: *c1ccc(-c2cccc(-c3cccc4sc5ccccc5c34)c2)cc1] | 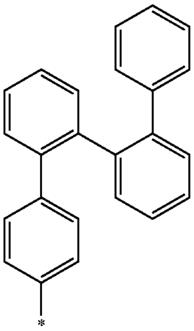 [SMILES: *c1ccc(-c2ccccc2-c2ccccc2-c2ccccc2)cc1] |

-continued
| Compound Group 1 | | | |
|---|---|---|---|
| Formula 1 | $Ar_1$ | $Ar_2$ | $Ar_3$ |
| E6 | 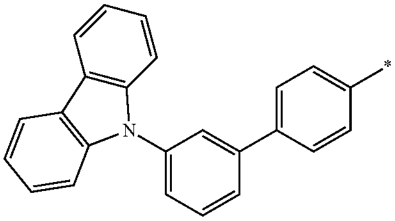 [SMILES: *c1ccc(-c2cccc(-n3c4ccccc4c4ccccc43)c2)cc1] | 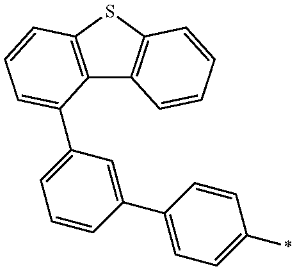 [SMILES: *c1ccc(-c2cccc(-c3cccc4sc5ccccc5c34)c2)cc1] | 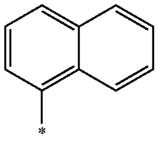 [SMILES: *c1cccc2ccccc12] |
| E7 | 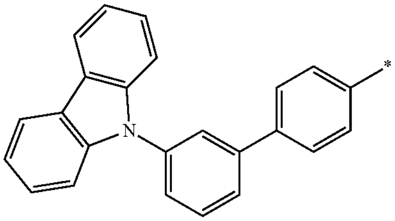 [SMILES: *c1ccc(-c2cccc(-n3c4ccccc4c4ccccc43)c2)cc1] | 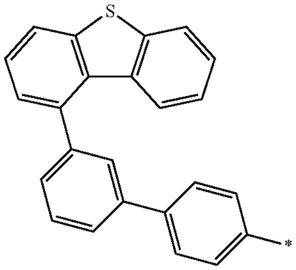 [SMILES: *c1ccc(-c2cccc(-c3cccc4sc5ccccc5c34)c2)cc1] | 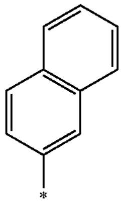 [SMILES: *c1ccc2ccccc2c1] |
| E8 | 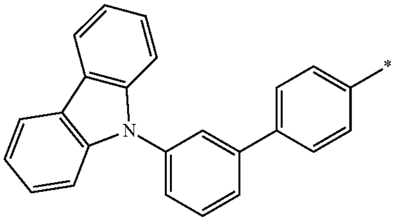 [SMILES: *c1ccc(-c2cccc(-n3c4ccccc4c4ccccc43)c2)cc1] | 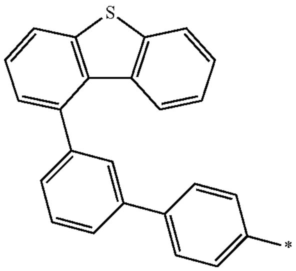 [SMILES: *c1ccc(-c2cccc(-c3cccc4sc5ccccc5c34)c2)cc1] | 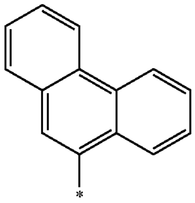 [SMILES: *c1cc2ccccc2c2ccccc12] |
| E9 | 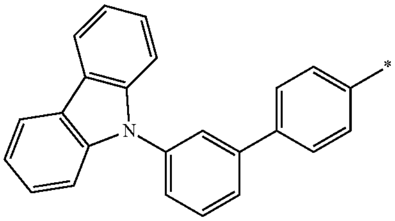 [SMILES: *c1ccc(-c2cccc(-n3c4ccccc4c4ccccc43)c2)cc1] | 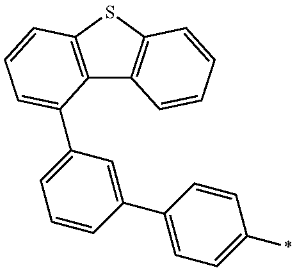 [SMILES: *c1ccc(-c2cccc(-c3cccc4sc5ccccc5c34)c2)cc1] | 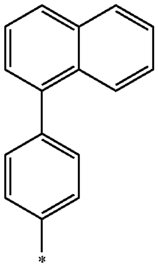 [SMILES: *c1ccc(-c2cccc3ccccc23)cc1] |
| E10 | 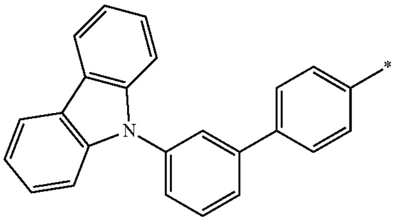 [SMILES: *c1ccc(-c2cccc(-n3c4ccccc4c4ccccc43)c2)cc1] | 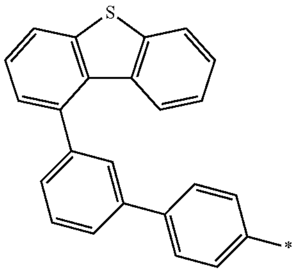 [SMILES: *c1ccc(-c2cccc(-c3cccc4sc5ccccc5c34)c2)cc1] | 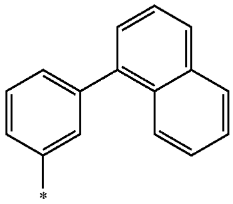 [SMILES: *c1cccc(-c2cccc3ccccc23)c1] |

-continued
| Compound Group 1 | | | |
|---|---|---|---|
| Formula 1 | $Ar_1$ | $Ar_2$ | $Ar_3$ |
| E11 | 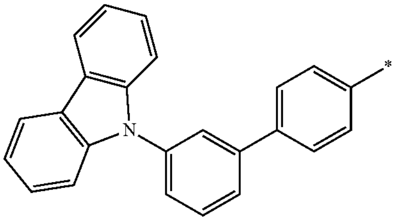 [SMILES: *c1ccc(-c2cccc(-n3c4ccccc4c4ccccc43)c2)cc1] | 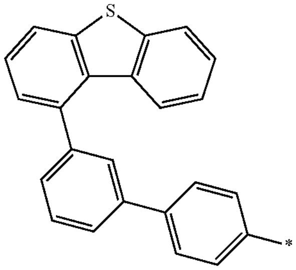 [SMILES: *c1ccc(-c2cccc(-c3cccc4sc5ccccc5c34)c2)cc1] | 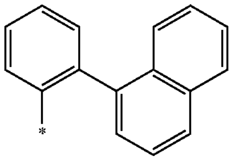 [SMILES: *c1ccccc1-c1cccc2ccccc12] |
| E12 | 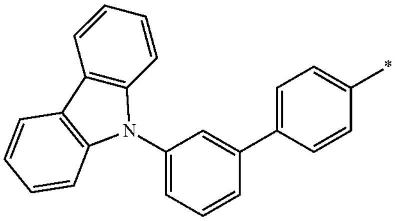 [SMILES: *c1ccc(-c2cccc(-n3c4ccccc4c4ccccc43)c2)cc1] | 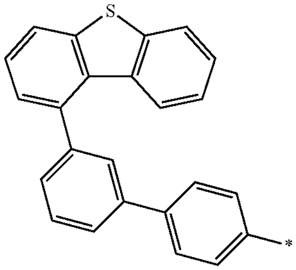 [SMILES: *c1ccc(-c2cccc(-c3cccc4sc5ccccc5c34)c2)cc1] | 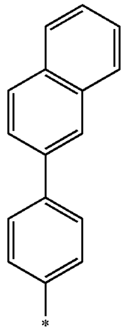 [SMILES: *c1ccc(-c2ccc3ccccc3c2)cc1] |
| E13 | 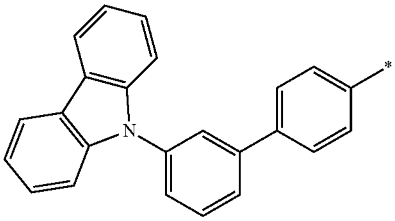 [SMILES: *c1ccc(-c2cccc(-n3c4ccccc4c4ccccc43)c2)cc1] | 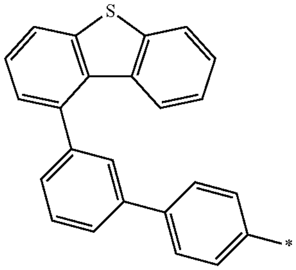 [SMILES: *c1ccc(-c2cccc(-c3cccc4sc5ccccc5c34)c2)cc1] | 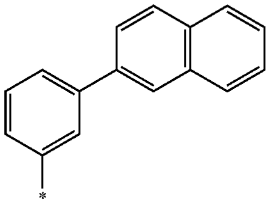 [SMILES: *c1cccc(-c2ccc3ccccc3c2)c1] |
| E14 | 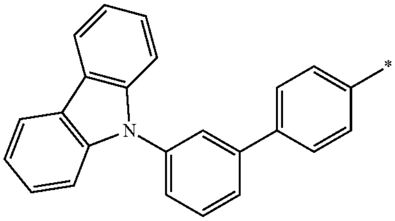 [SMILES: *c1ccc(-c2cccc(-n3c4ccccc4c4ccccc43)c2)cc1] | 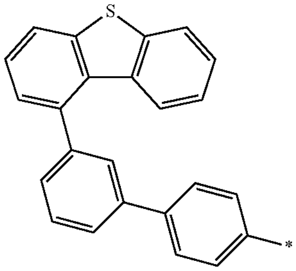 [SMILES: *c1ccc(-c2cccc(-c3cccc4sc5ccccc5c34)c2)cc1] | 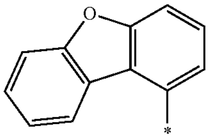 |
| E15 | 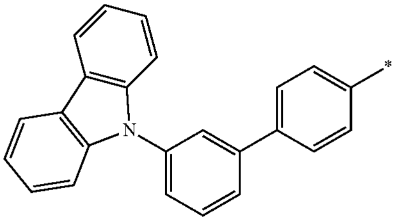 [SMILES: *c1ccc(-c2cccc(-n3c4ccccc4c4ccccc43)c2)cc1] | 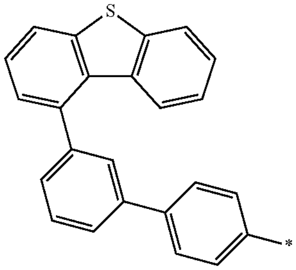 [SMILES: *c1ccc(-c2cccc(-c3cccc4sc5ccccc5c34)c2)cc1] | 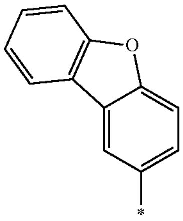 |

-continued
Compound Group 1
| Formula 1 | $Ar_1$ | $Ar_2$ | $Ar_3$ |
|---|---|---|---|
| E16 | 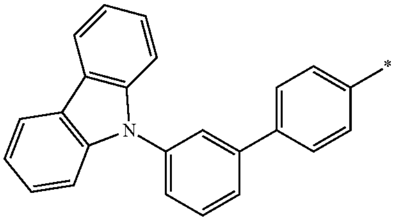 [SMILES: *c1ccc(-c2cccc(-n3c4ccccc4c4ccccc43)c2)cc1] | 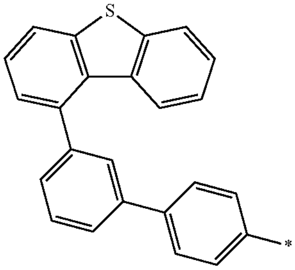 [SMILES: *c1ccc(-c2cccc(-c3cccc4sc5ccccc5c34)c2)cc1] | 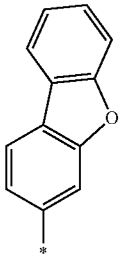 [SMILES: *c1ccc2c(c1)oc1ccccc12] |
| E17 | 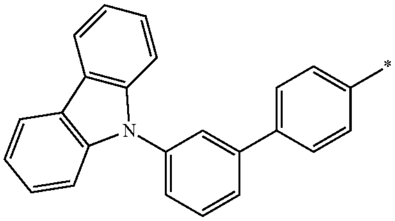 [SMILES: *c1ccc(-c2cccc(-n3c4ccccc4c4ccccc43)c2)cc1] | 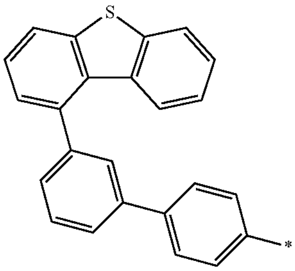 [SMILES: *c1ccc(-c2cccc(-c3cccc4sc5ccccc5c34)c2)cc1] | 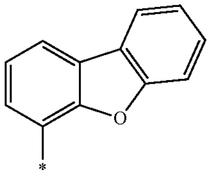 |
| E18 | 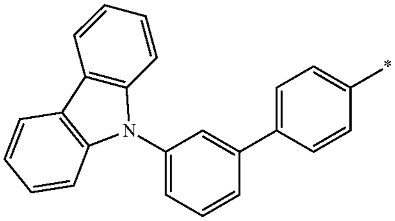 [SMILES: *c1ccc(-c2cccc(-n3c4ccccc4c4ccccc43)c2)cc1] | 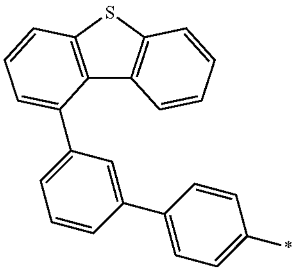 [SMILES: *c1ccc(-c2cccc(-c3cccc4sc5ccccc5c34)c2)cc1] | 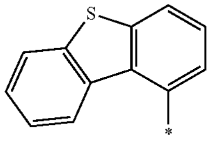 |
| E19 | 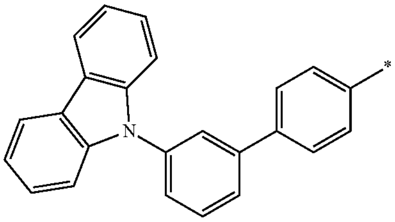 [SMILES: *c1ccc(-c2cccc(-n3c4ccccc4c4ccccc43)c2)cc1] | 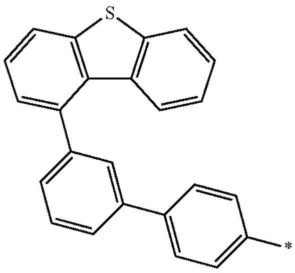 [SMILES: *c1ccc(-c2cccc(-c3cccc4sc5ccccc5c34)c2)cc1] | 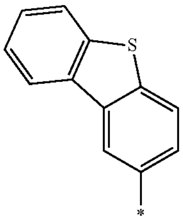 |
| E20 | 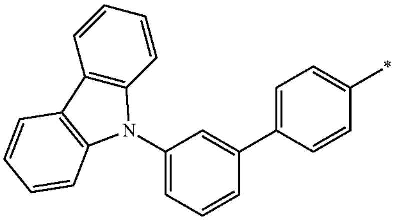 [SMILES: *c1ccc(-c2cccc(-n3c4ccccc4c4ccccc43)c2)cc1] | 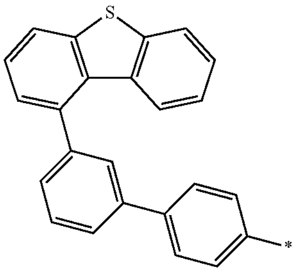 [SMILES: *c1ccc(-c2cccc(-c3cccc4sc5ccccc5c34)c2)cc1] | 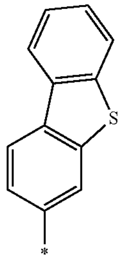 [SMILES: *c1ccc2c(c1)sc1ccccc12] |

-continued
| Compound Group 1 | | | |
|---|---|---|---|
| Formula 1 | $Ar_1$ | $Ar_2$ | $Ar_3$ |
| E21 | 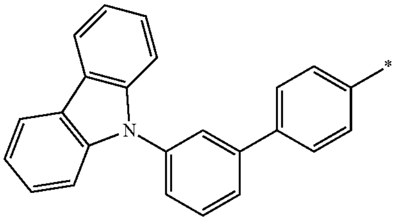 [SMILES: *c1ccc(-c2cccc(-n3c4ccccc4c4ccccc43)c2)cc1] | 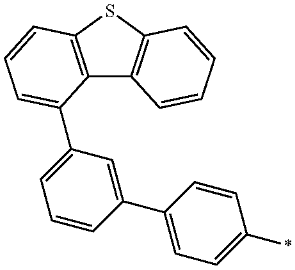 [SMILES: *c1ccc(-c2cccc(-c3cccc4sc5ccccc5c34)c2)cc1] | 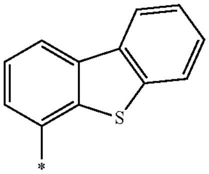 |
| E22 | 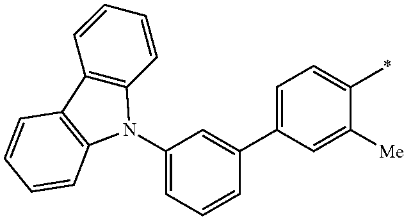 [SMILES: *c1ccc(-c2cccc(-n3c4ccccc4c4ccccc43)c2)cc1C] | 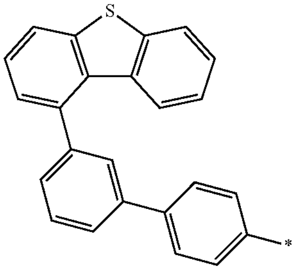 [SMILES: *c1ccc(-c2cccc(-c3cccc4sc5ccccc5c34)c2)cc1] | 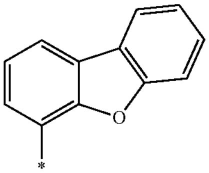 |
| E23 | 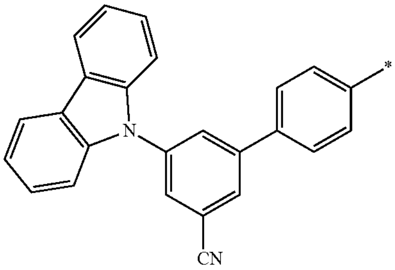 [SMILES: *c1ccc(-c2cc(C#N)cc(-n3c4ccccc4c4ccccc43)c2)cc1] | 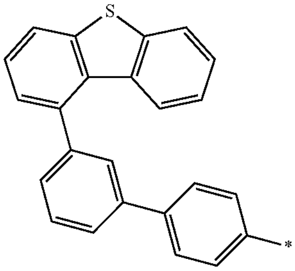 [SMILES: *c1ccc(-c2cccc(-c3cccc4sc5ccccc5c34)c2)cc1] | 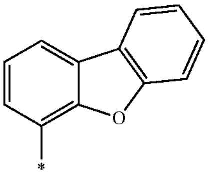 |
| F1 | 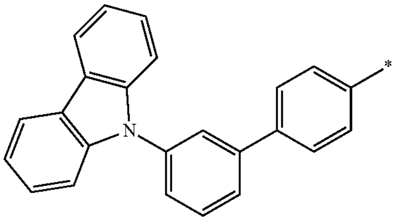 [SMILES: *c1ccc(-c2cccc(-n3c4ccccc4c4ccccc43)c2)cc1] | 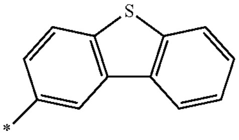 [SMILES: *c1ccc2sc3ccccc3c2c1] | 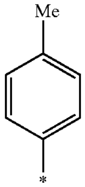 [SMILES: *c1ccc(C)cc1] |
| F2 | 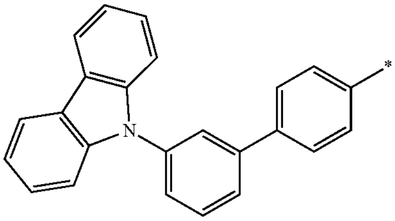 [SMILES: *c1ccc(-c2cccc(-n3c4ccccc4c4ccccc43)c2)cc1] | 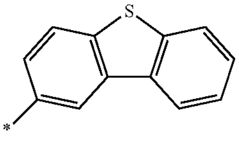 | 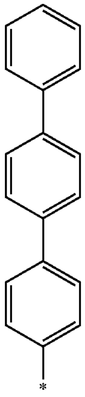 [SMILES: *c1ccc(-c2ccc(-c3ccccc3)cc2)cc1] |

-continued
Compound Group 1
| Formula 1 | $Ar_1$ | $Ar_2$ | $Ar_3$ |
| --- | --- | --- | --- |
| F3 | 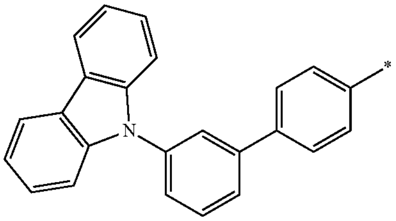 [SMILES: *c1ccc(-c2cccc(-n3c4ccccc4c4ccccc43)c2)cc1] | 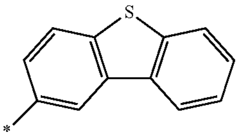 [SMILES: *c1ccc2sc3ccccc3c2c1] | 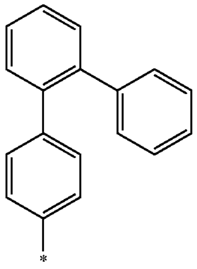 [SMILES: *c1ccc(-c2ccccc2-c2ccccc2)cc1] |
| F4 | 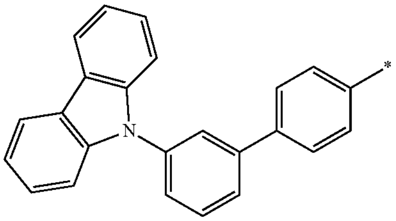 [SMILES: *c1ccc(-c2cccc(-n3c4ccccc4c4ccccc43)c2)cc1] | 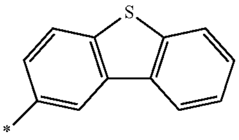 | 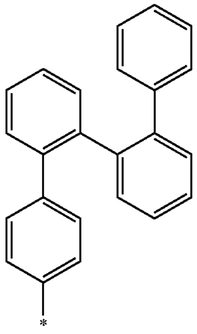 [SMILES: *c1ccc(-c2ccccc2-c2ccccc2-c2ccccc2)cc1] |
| F5 | 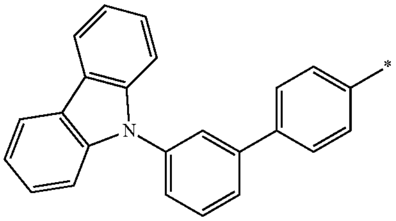 [SMILES: *c1ccc(-c2cccc(-n3c4ccccc4c4ccccc43)c2)cc1] | 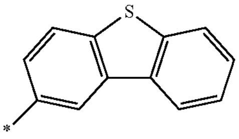 [SMILES: *c1ccc2sc3ccccc3c2c1] | 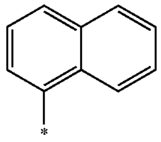 [SMILES: *c1cccc2ccccc12] |
| F6 | 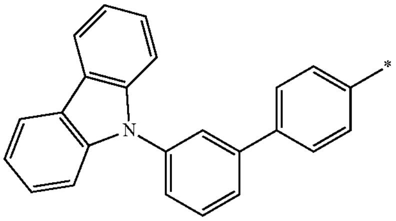 [SMILES: *c1ccc(-c2cccc(-n3c4ccccc4c4ccccc43)c2)cc1] | 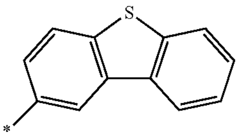 | 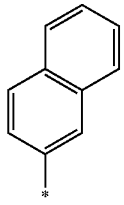 [SMILES: *c1ccc2ccccc2c1] |
| F7 | 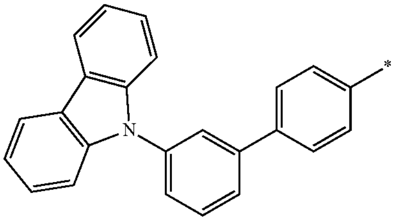 [SMILES: *c1ccc(-c2cccc(-n3c4ccccc4c4ccccc43)c2)cc1] | 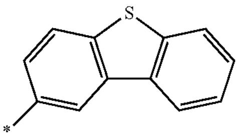 | 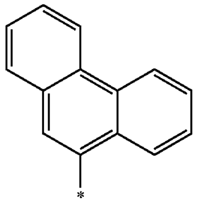 [SMILES: *c1cc2ccccc2c2ccccc12] |

-continued
Compound Group 1
| Formula 1 | $Ar_1$ | $Ar_2$ | $Ar_3$ |
| --- | --- | --- | --- |
| F8 | 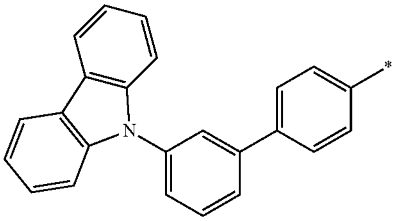 [SMILES: *c1ccc(-c2cccc(-n3c4ccccc4c4ccccc43)c2)cc1] | 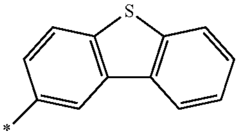 [SMILES: *c1ccc2sc3ccccc3c2c1] | 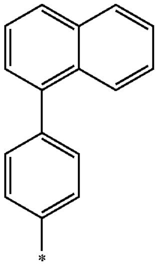 [SMILES: *c1ccc(-c2cccc3ccccc23)cc1] |
| F9 | 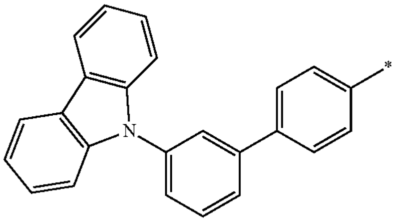 [SMILES: *c1ccc(-c2cccc(-n3c4ccccc4c4ccccc43)c2)cc1] | 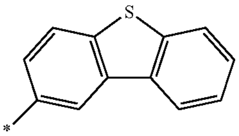 [SMILES: *c1ccc2sc3ccccc3c2c1] | 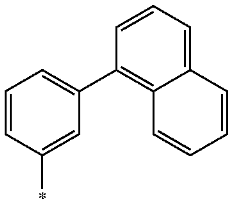 [SMILES: *c1cccc(-c2cccc3ccccc23)c1] |
| F10 | 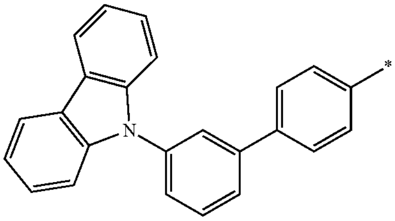 [SMILES: *c1ccc(-c2cccc(-n3c4ccccc4c4ccccc43)c2)cc1] | 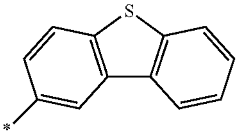 | 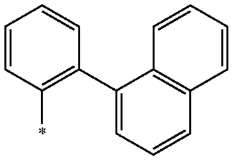 [SMILES: *c1ccccc1-c1cccc2ccccc12] |
| F11 | 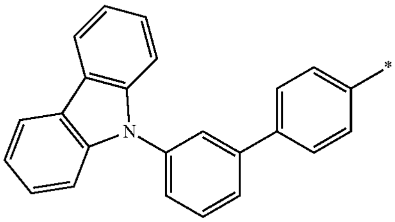 [SMILES: *c1ccc(-c2cccc(-n3c4ccccc4c4ccccc43)c2)cc1] | 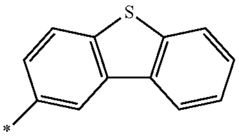 [SMILES: *c1ccc2sc3ccccc3c2c1] | 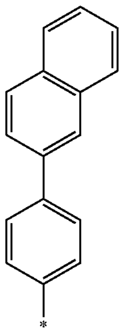 [SMILES: *c1ccc(-c2ccc3ccccc3c2)cc1] |
| F12 | 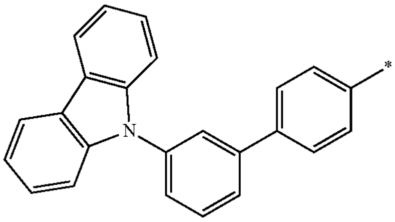 [SMILES: *c1ccc(-c2cccc(-n3c4ccccc4c4ccccc43)c2)cc1] | 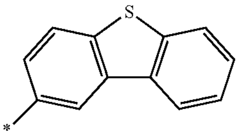 | 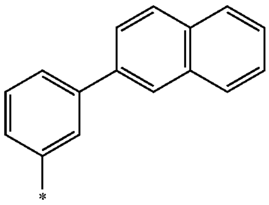 [SMILES: *c1cccc(-c2ccc3ccccc3c2)c1] |

-continued
| Compound Group 1 | | | |
|---|---|---|---|
| Formula 1 | $Ar_1$ | $Ar_2$ | $Ar_3$ |
| F13 | 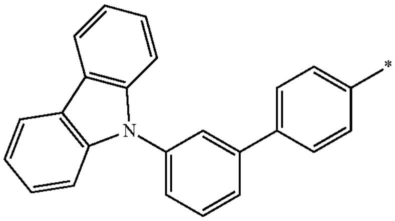 [SMILES: *c1ccc(-c2cccc(-n3c4ccccc4c4ccccc43)c2)cc1] | 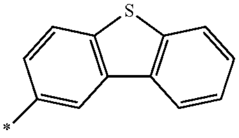 [SMILES: *c1ccc2sc3ccccc3c2c1] | 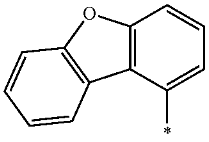 |
| F14 | 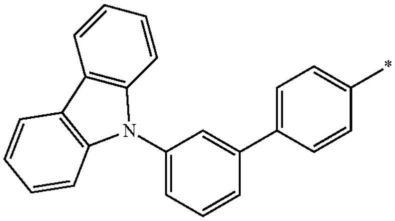 [SMILES: *c1ccc(-c2cccc(-n3c4ccccc4c4ccccc43)c2)cc1] | 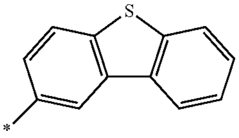 [SMILES: *c1ccc2sc3ccccc3c2c1] | 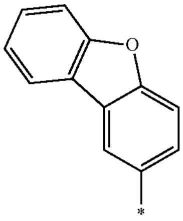 |
| F15 | 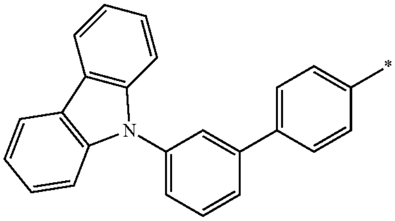 [SMILES: *c1ccc(-c2cccc(-n3c4ccccc4c4ccccc43)c2)cc1] | 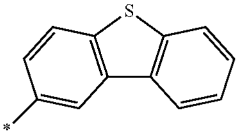 | 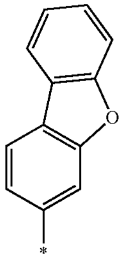 [SMILES: *c1ccc2c(c1)oc1ccccc12] |
| F16 | 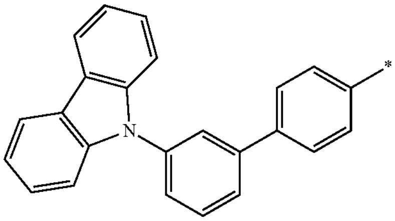 [SMILES: *c1ccc(-c2cccc(-n3c4ccccc4c4ccccc43)c2)cc1] | 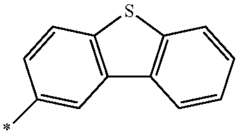 | 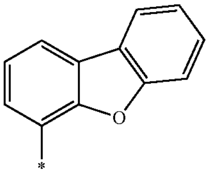 |
| F17 | 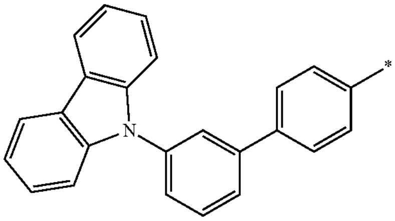 [SMILES: *c1ccc(-c2cccc(-n3c4ccccc4c4ccccc43)c2)cc1] | 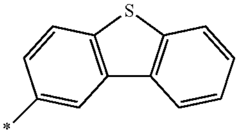 [SMILES: *c1ccc2sc3ccccc3c2c1] | 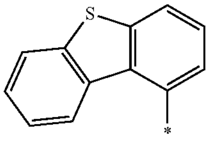 |
| F18 | 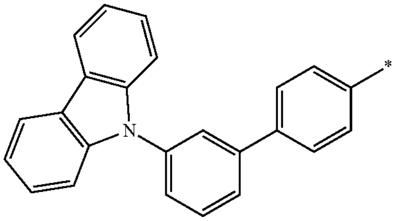 [SMILES: *c1ccc(-c2cccc(-n3c4ccccc4c4ccccc43)c2)cc1] | 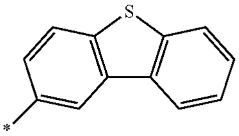 [SMILES: *c1ccc2sc3ccccc3c2c1] | 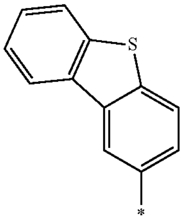 |

-continued
| Compound Group 1 | | | |
|---|---|---|---|
| Formula 1 | $Ar_1$ | $Ar_2$ | $Ar_3$ |
| F19 | 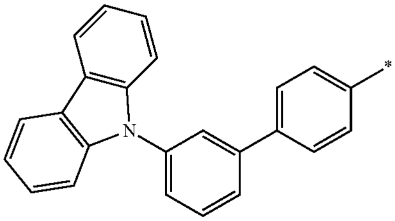 [SMILES: *c1ccc(-c2cccc(-n3c4ccccc4c4ccccc43)c2)cc1] | 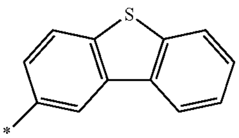 [SMILES: *c1ccc2sc3ccccc3c2c1] | 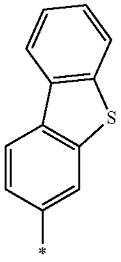 [SMILES: *c1ccc2c(c1)sc1ccccc12] |
| F20 | 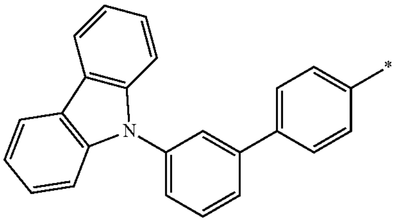 [SMILES: *c1ccc(-c2cccc(-n3c4ccccc4c4ccccc43)c2)cc1] | 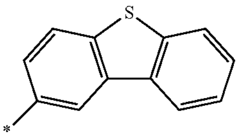 [SMILES: *c1ccc2sc3ccccc3c2c1] | 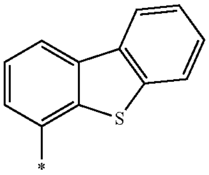 |
| F21 | 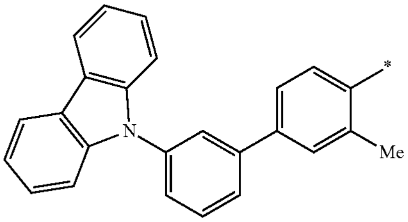 [SMILES: *c1ccc(-c2cccc(-n3c4ccccc4c4ccccc43)c2)cc1C] | 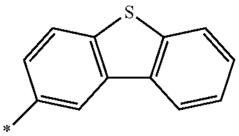 [SMILES: *c1ccc2sc3ccccc3c2c1] | 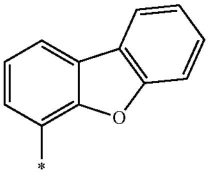 |
| F22 | 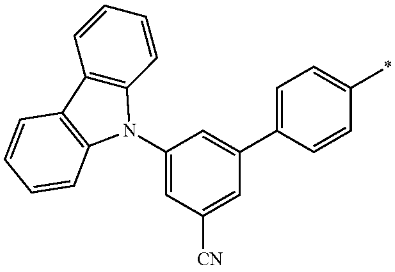 [SMILES: *c1ccc(-c2cc(C#N)cc(-n3c4ccccc4c4ccccc43)c2)cc1] | 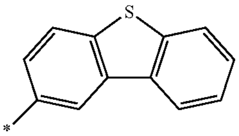 [SMILES: *c1ccc2sc3ccccc3c2c1] | 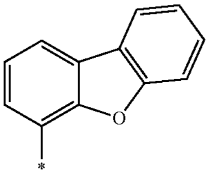 |
| G1 | 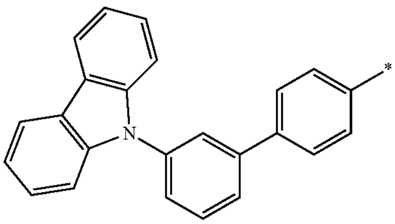 [SMILES: *c1ccc(-c2cccc(-n3c4ccccc4c4ccccc43)c2)cc1] | 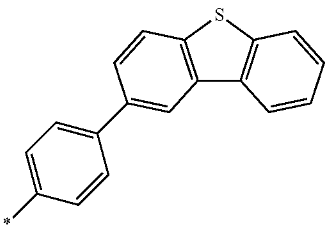 [SMILES: *c1ccc(-c2ccc3sc4ccccc4c3c2)cc1] | 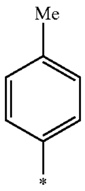 [SMILES: *c1ccc(C)cc1] |

-continued
| Compound Group 1 | | | |
|---|---|---|---|
| Formula 1 | $Ar_1$ | $Ar_2$ | $Ar_3$ |
| G2 | 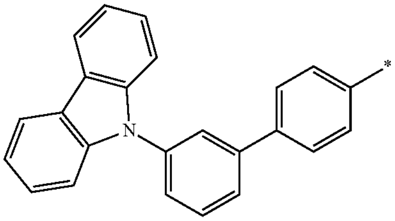 [SMILES: *c1ccc(-c2cccc(-n3c4ccccc4c4ccccc43)c2)cc1] | 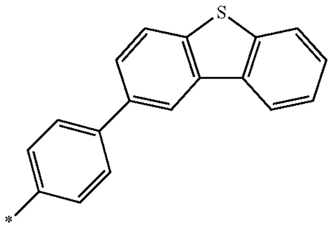 [SMILES: *c1ccc(-c2ccc3sc4ccccc4c3c2)cc1] | 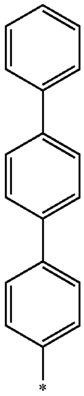 [SMILES: *c1ccc(-c2ccc(-c3ccccc3)cc2)cc1] |
| G3 | 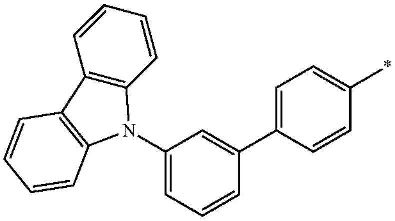 [SMILES: *c1ccc(-c2cccc(-n3c4ccccc4c4ccccc43)c2)cc1] | 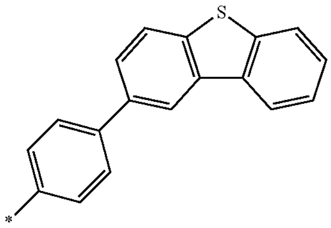 [SMILES: *c1ccc(-c2ccc3sc4ccccc4c3c2)cc1] | 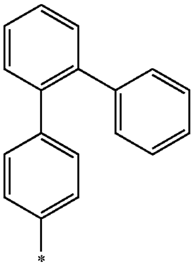 [SMILES: *c1ccc(-c2ccccc2-c2ccccc2)cc1] |
| G4 | 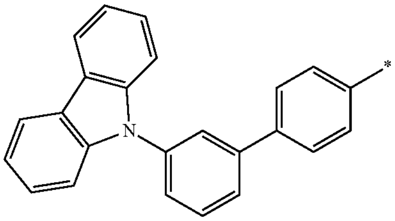 [SMILES: *c1ccc(-c2cccc(-n3c4ccccc4c4ccccc43)c2)cc1] | 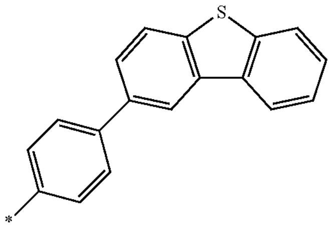 [SMILES: *c1ccc(-c2ccc3sc4ccccc4c3c2)cc1] | 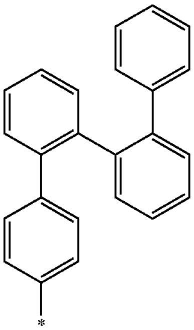 [SMILES: *c1ccc(-c2ccccc2-c2ccccc2-c2ccccc2)cc1] |
| G5 | 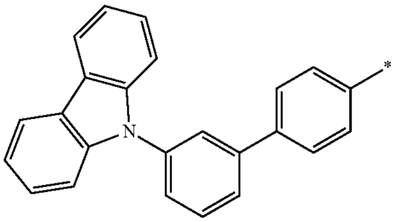 [SMILES: *c1ccc(-c2cccc(-n3c4ccccc4c4ccccc43)c2)cc1] | 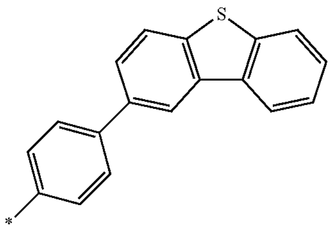 [SMILES: *c1ccc(-c2ccc3sc4ccccc4c3c2)cc1] | 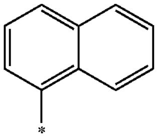 [SMILES: *c1cccc2ccccc12] |
| G6 | 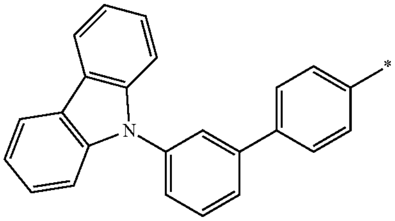 [SMILES: *c1ccc(-c2cccc(-n3c4ccccc4c4ccccc43)c2)cc1] | 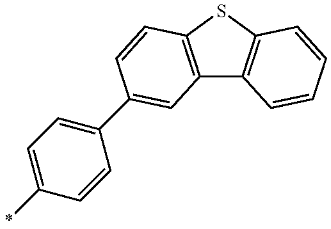 [SMILES: *c1ccc(-c2ccc3sc4ccccc4c3c2)cc1] | 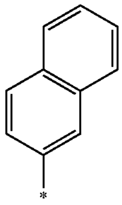 [SMILES: *c1ccc2ccccc2c1] |

-continued
| Compound Group 1 | | | |
|---|---|---|---|
| Formula 1 | $Ar_1$ | $Ar_2$ | $Ar_3$ |
| G7 | 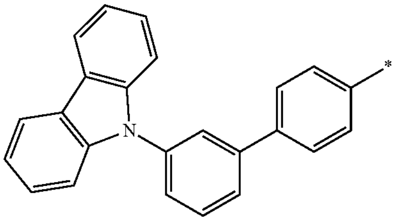 [SMILES: *c1ccc(-c2cccc(-n3c4ccccc4c4ccccc43)c2)cc1] | 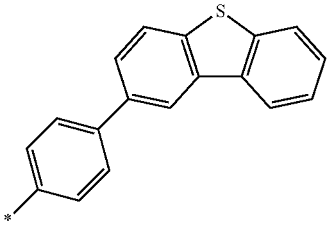 [SMILES: *c1ccc(-c2ccc3sc4ccccc4c3c2)cc1] | 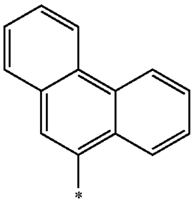 [SMILES: *c1cc2ccccc2c2ccccc12] |
| G8 | 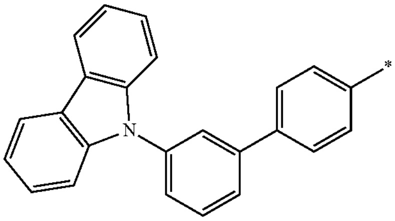 [SMILES: *c1ccc(-c2cccc(-n3c4ccccc4c4ccccc43)c2)cc1] | 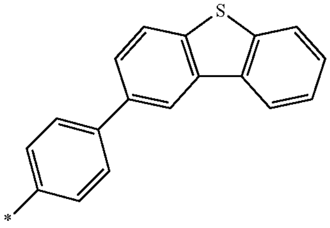 [SMILES: *c1ccc(-c2ccc3sc4ccccc4c3c2)cc1] | 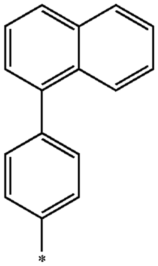 [SMILES: *c1ccc(-c2cccc3ccccc23)cc1] |
| G9 | 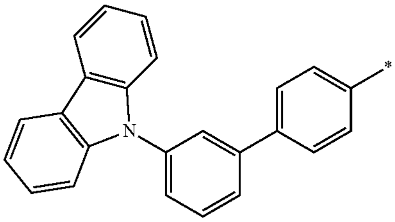 [SMILES: *c1ccc(-c2cccc(-n3c4ccccc4c4ccccc43)c2)cc1] | 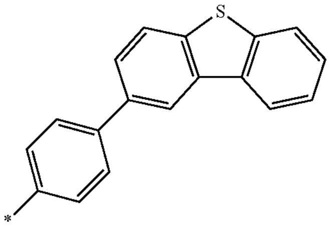 [SMILES: *c1ccc(-c2ccc3sc4ccccc4c3c2)cc1] | 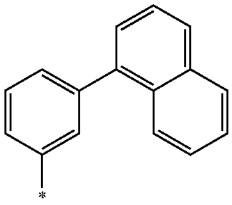 [SMILES: *c1cccc(-c2cccc3ccccc23)c1] |
| G10 | 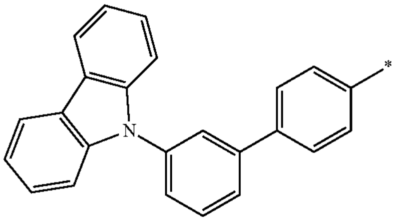 [SMILES: *c1ccc(-c2cccc(-n3c4ccccc4c4ccccc43)c2)cc1] | 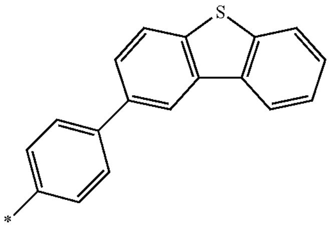 [SMILES: *c1ccc(-c2ccc3sc4ccccc4c3c2)cc1] | 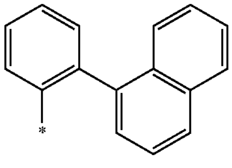 [SMILES: *c1ccccc1-c1cccc2ccccc12] |
| G11 | 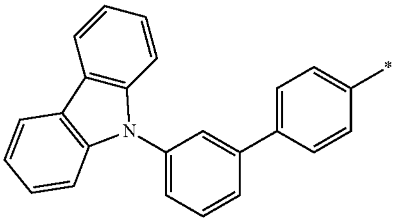 [SMILES: *c1ccc(-c2cccc(-n3c4ccccc4c4ccccc43)c2)cc1] | 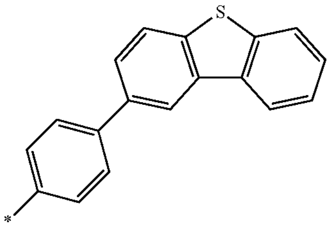 [SMILES: *c1ccc(-c2ccc3sc4ccccc4c3c2)cc1] | 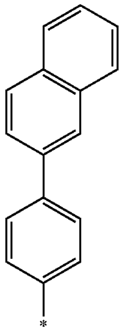 [SMILES: *c1ccc(-c2ccc3ccccc3c2)cc1] |

-continued
| Compound Group 1 | | | |
|---|---|---|---|
| Formula 1 | $Ar_1$ | $Ar_2$ | $Ar_3$ |
| G12 | 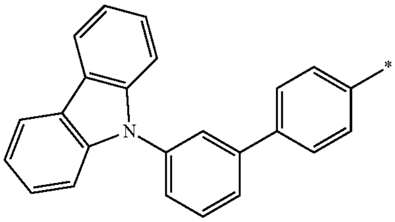 [SMILES: *c1ccc(-c2cccc(-n3c4ccccc4c4ccccc43)c2)cc1] | 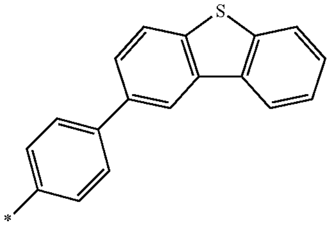 [SMILES: *c1ccc(-c2ccc3sc4ccccc4c3c2)cc1] | 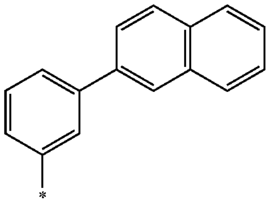 [SMILES: *c1cccc(-c2ccc3ccccc3c2)c1] |
| G13 | 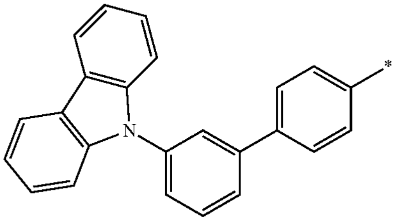 [SMILES: *c1ccc(-c2cccc(-n3c4ccccc4c4ccccc43)c2)cc1] | 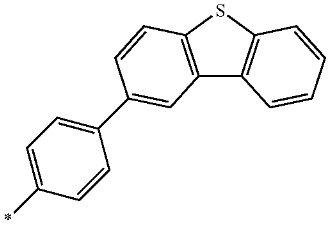 [SMILES: *c1ccc(-c2ccc3sc4ccccc4c3c2)cc1] | 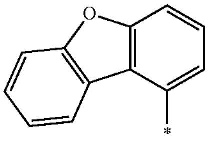 |
| G14 | 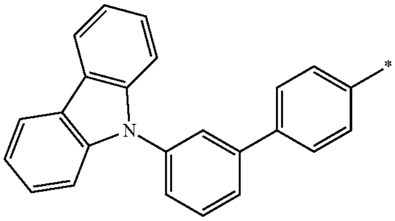 [SMILES: *c1ccc(-c2cccc(-n3c4ccccc4c4ccccc43)c2)cc1] | 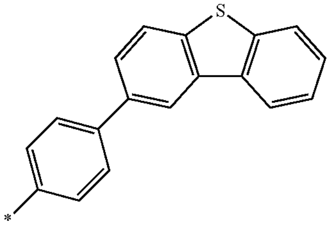 [SMILES: *c1ccc(-c2ccc3sc4ccccc4c3c2)cc1] | 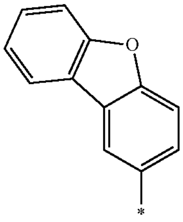 |
| G15 | 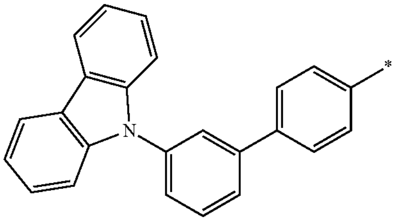 [SMILES: *c1ccc(-c2cccc(-n3c4ccccc4c4ccccc43)c2)cc1] | 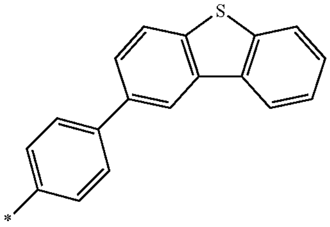 [SMILES: *c1ccc(-c2ccc3sc4ccccc4c3c2)cc1] | 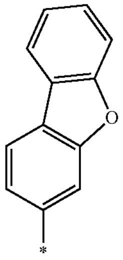 [SMILES: *c1ccc2c(c1)oc1ccccc12] |
| G16 | 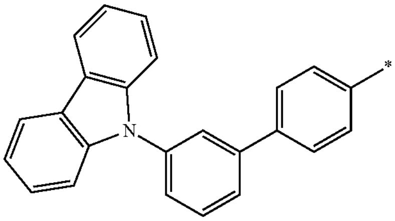 [SMILES: *c1ccc(-c2cccc(-n3c4ccccc4c4ccccc43)c2)cc1] | 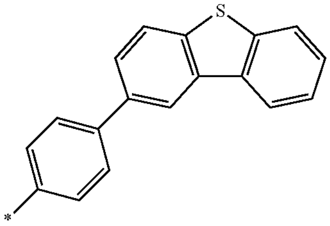 [SMILES: *c1ccc(-c2ccc3sc4ccccc4c3c2)cc1] | 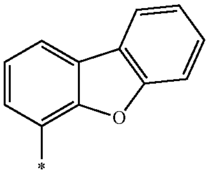 |
| G17 | 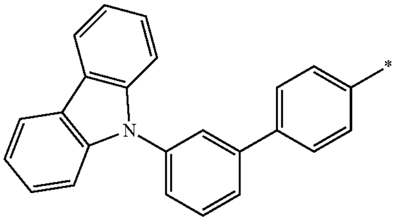 [SMILES: *c1ccc(-c2cccc(-n3c4ccccc4c4ccccc43)c2)cc1] | 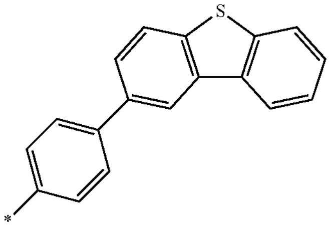 [SMILES: *c1ccc(-c2ccc3sc4ccccc4c3c2)cc1] | 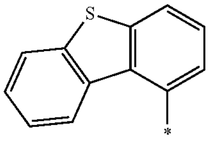 |

-continued
| Compound Group 1 | | | |
| --- | --- | --- | --- |
| Formula 1 | $Ar_1$ | $Ar_2$ | $Ar_3$ |
| G18 | 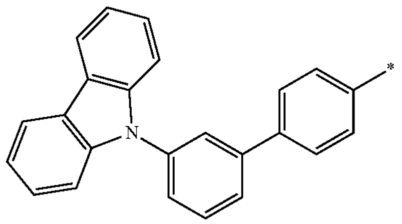 [SMILES: *c1ccc(-c2cccc(-n3c4ccccc4c4ccccc43)c2)cc1] | 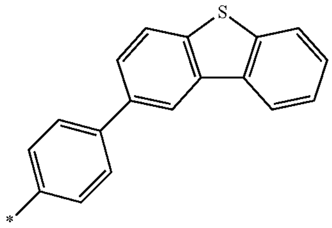 [SMILES: *c1ccc(-c2ccc3sc4ccccc4c3c2)cc1] | 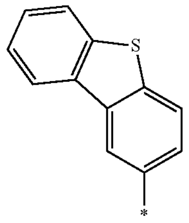 |
| G19 | 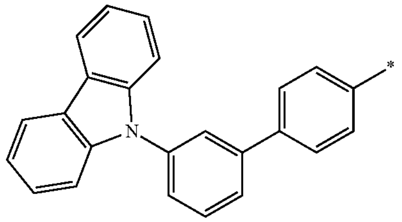 [SMILES: *c1ccc(-c2cccc(-n3c4ccccc4c4ccccc43)c2)cc1] | 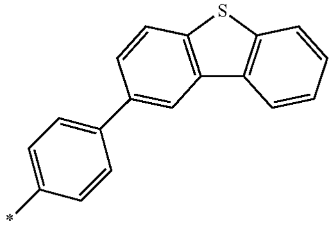 [SMILES: *c1ccc(-c2ccc3sc4ccccc4c3c2)cc1] | 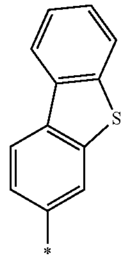 |
| G20 | 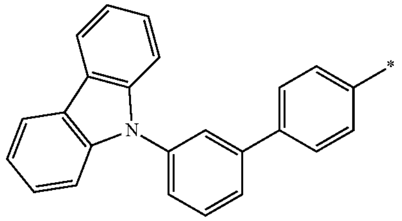 [SMILES: *c1ccc(-c2cccc(-n3c4ccccc4c4ccccc43)c2)cc1] | 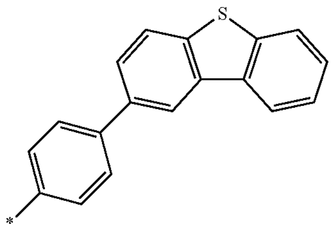 [SMILES: *c1ccc(-c2ccc3sc4ccccc4c3c2)cc1] | 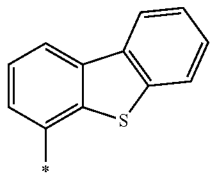 |
| G21 | 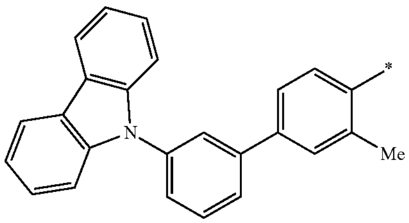 [SMILES: *c1ccc(-c2cccc(-n3c4ccccc4c4ccccc43)c2)cc1C] | 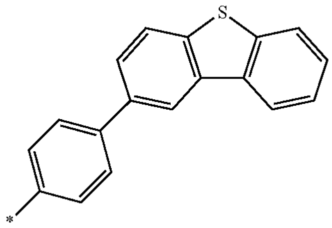 [SMILES: *c1ccc(-c2ccc3sc4ccccc4c3c2)cc1] | 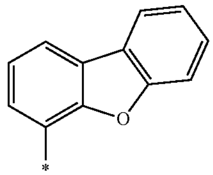 |
| G22 | 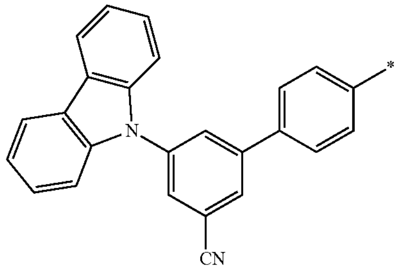 [SMILES: *c1ccc(-c2cc(C#N)cc(-n3c4ccccc4c4ccccc43)c2)cc1] | 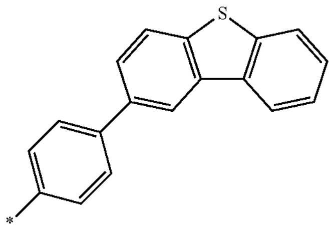 [SMILES: *c1ccc(-c2ccc3sc4ccccc4c3c2)cc1] | 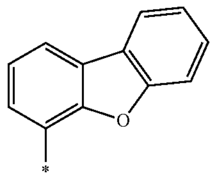 |
| H1 | 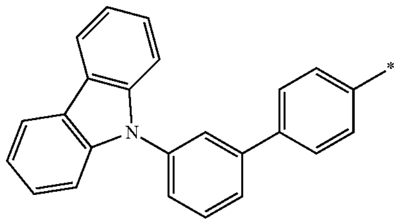 [SMILES: *c1ccc(-c2cccc(-n3c4ccccc4c4ccccc43)c2)cc1] | 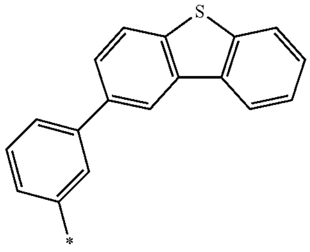 [SMILES: *c1cccc(-c2ccc3sc4ccccc4c3c2)c1] | 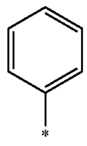 [SMILES: *c1ccccc1] |

-continued
| Compound Group 1 | | | |
|---|---|---|---|
| Formula 1 | $Ar_1$ | $Ar_2$ | $Ar_3$ |
| H2 | 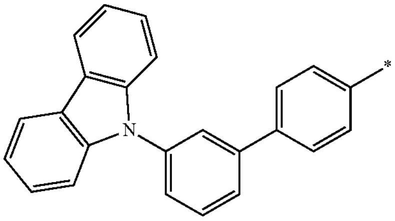 [SMILES: *c1ccc(-c2cccc(-n3c4ccccc4c4ccccc43)c2)cc1] | 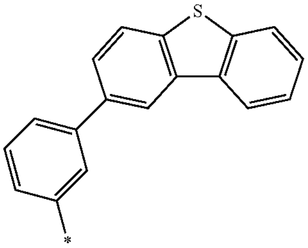 [SMILES: *c1cccc(-c2ccc3sc4ccccc4c3c2)c1] | 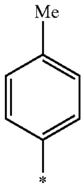 [SMILES: *c1ccc(C)cc1] |
| H3 | 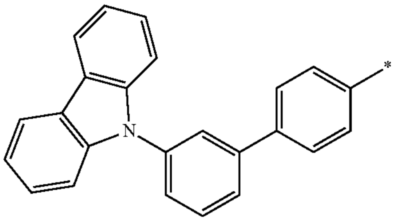 [SMILES: *c1ccc(-c2cccc(-n3c4ccccc4c4ccccc43)c2)cc1] | 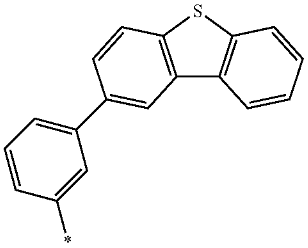 [SMILES: *c1cccc(-c2ccc3sc4ccccc4c3c2)c1] | 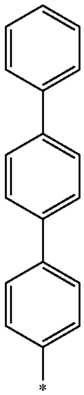 [SMILES: *c1ccc(-c2ccc(-c3ccccc3)cc2)cc1] |
| H4 | 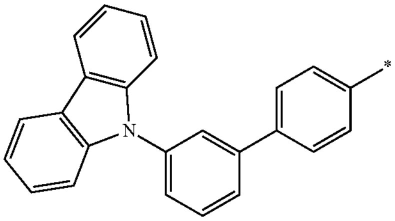 [SMILES: *c1ccc(-c2cccc(-n3c4ccccc4c4ccccc43)c2)cc1] | 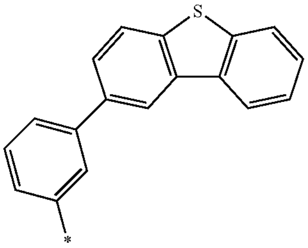 [SMILES: *c1cccc(-c2ccc3sc4ccccc4c3c2)c1] | 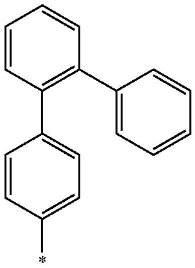 [SMILES: *c1ccc(-c2ccccc2-c2ccccc2)cc1] |
| H5 | 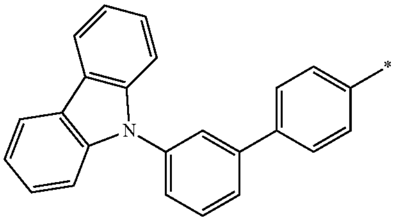 [SMILES: *c1ccc(-c2cccc(-n3c4ccccc4c4ccccc43)c2)cc1] | 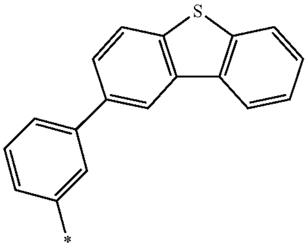 [SMILES: *c1cccc(-c2ccc3sc4ccccc4c3c2)c1] | 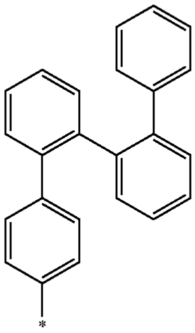 [SMILES: *c1ccc(-c2ccccc2-c2ccccc2-c2ccccc2)cc1] |
| H6 | 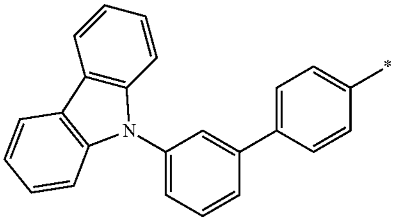 [SMILES: *c1ccc(-c2cccc(-n3c4ccccc4c4ccccc43)c2)cc1] | 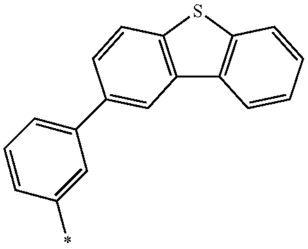 [SMILES: *c1cccc(-c2ccc3sc4ccccc4c3c2)c1] | 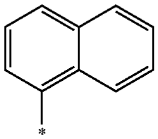 [SMILES: *c1cccc2ccccc12] |

-continued
| Compound Group 1 | | | |
|---|---|---|---|
| Formula 1 | $Ar_1$ | $Ar_2$ | $Ar_3$ |
| H7 | 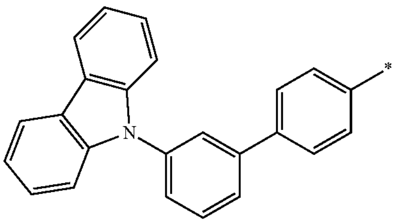 [SMILES: *c1ccc(-c2cccc(-n3c4ccccc4c4ccccc43)c2)cc1] | 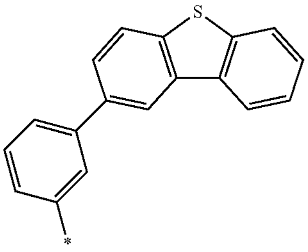 [SMILES: *c1cccc(-c2ccc3sc4ccccc4c3c2)c1] | 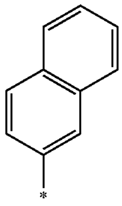 [SMILES: *c1ccc2ccccc2c1] |
| H8 | 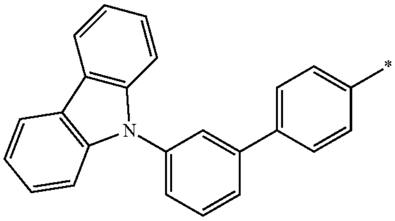 [SMILES: *c1ccc(-c2cccc(-n3c4ccccc4c4ccccc43)c2)cc1] | 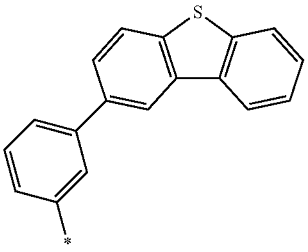 [SMILES: *c1cccc(-c2ccc3sc4ccccc4c3c2)c1] | 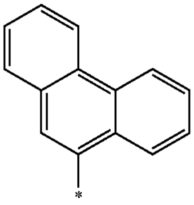 [SMILES: *c1cc2ccccc2c2ccccc12] |
| H9 | 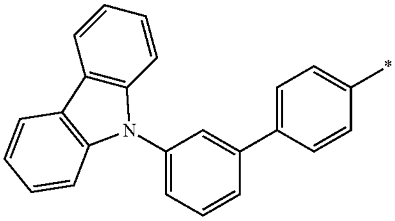 [SMILES: *c1ccc(-c2cccc(-n3c4ccccc4c4ccccc43)c2)cc1] | 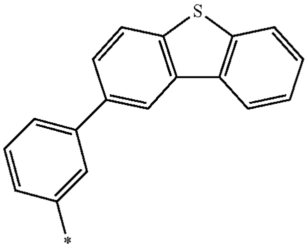 [SMILES: *c1cccc(-c2ccc3sc4ccccc4c3c2)c1] | 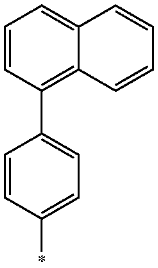 [SMILES: *c1ccc(-c2cccc3ccccc23)cc1] |
| H10 | 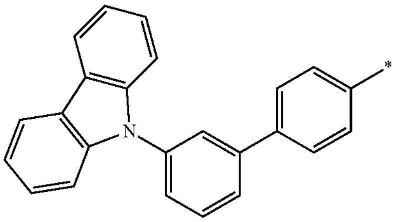 [SMILES: *c1ccc(-c2cccc(-n3c4ccccc4c4ccccc43)c2)cc1] | 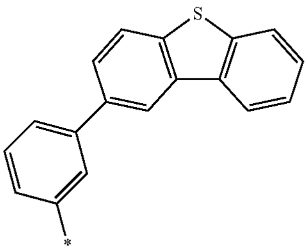 [SMILES: *c1cccc(-c2ccc3sc4ccccc4c3c2)c1] | 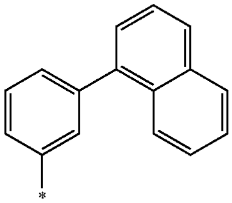 [SMILES: *c1cccc(-c2cccc3ccccc23)c1] |
| H11 | 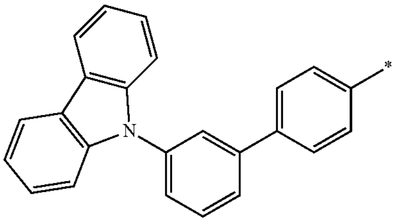 [SMILES: *c1ccc(-c2cccc(-n3c4ccccc4c4ccccc43)c2)cc1] | 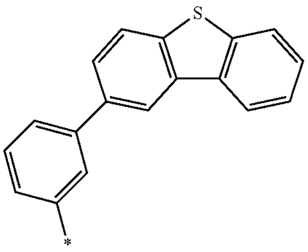 [SMILES: *c1cccc(-c2ccc3sc4ccccc4c3c2)c1] | 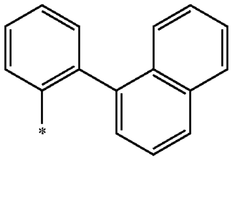 [SMILES: *c1ccccc1-c1cccc2ccccc12] |

-continued
| Compound Group 1 | | | |
|---|---|---|---|
| Formula 1 | $Ar_1$ | $Ar_2$ | $Ar_3$ |
| H12 | 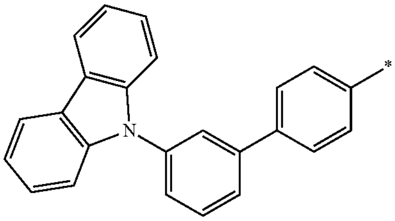 [SMILES: *c1ccc(-c2cccc(-n3c4ccccc4c4ccccc43)c2)cc1] | 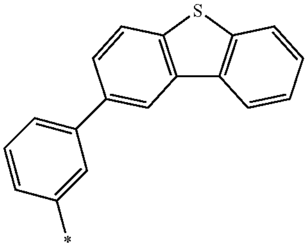 [SMILES: *c1cccc(-c2ccc3sc4ccccc4c3c2)c1] | 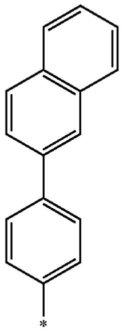 [SMILES: *c1ccc(-c2ccc3ccccc3c2)cc1] |
| H13 | 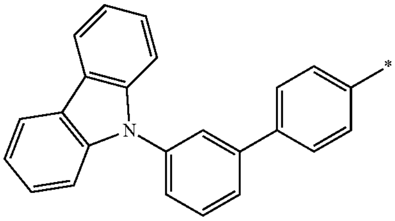 [SMILES: *c1ccc(-c2cccc(-n3c4ccccc4c4ccccc43)c2)cc1] | 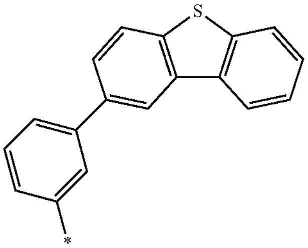 [SMILES: *c1cccc(-c2ccc3sc4ccccc4c3c2)c1] | 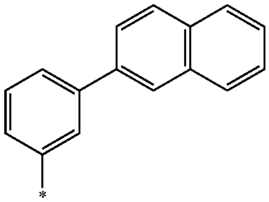 [SMILES: *c1cccc(-c2ccc3ccccc3c2)c1] |
| H14 | 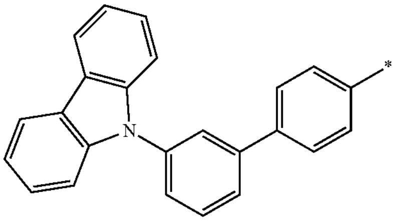 [SMILES: *c1ccc(-c2cccc(-n3c4ccccc4c4ccccc43)c2)cc1] | 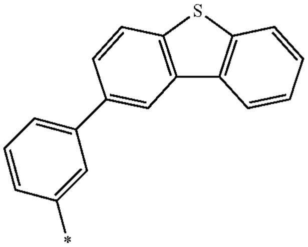 [SMILES: *c1cccc(-c2ccc3sc4ccccc4c3c2)c1] | 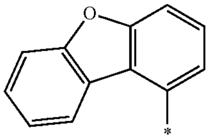 |
| H15 | 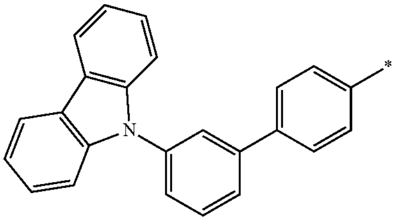 [SMILES: *c1ccc(-c2cccc(-n3c4ccccc4c4ccccc43)c2)cc1] | 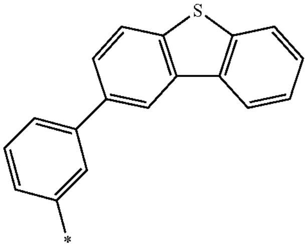 [SMILES: *c1cccc(-c2ccc3sc4ccccc4c3c2)c1] | 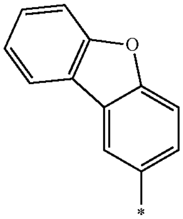 |
| H16 | 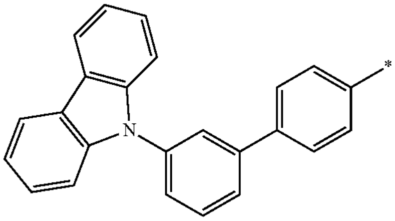 [SMILES: *c1ccc(-c2cccc(-n3c4ccccc4c4ccccc43)c2)cc1] | 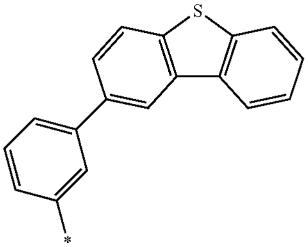 [SMILES: *c1cccc(-c2ccc3sc4ccccc4c3c2)c1] | 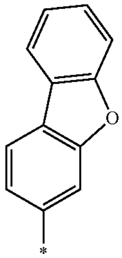 [SMILES: *c1ccc2c(c1)oc1ccccc12] |

-continued
Compound Group 1
| Formula 1 | $Ar_1$ | $Ar_2$ | $Ar_3$ |
|---|---|---|---|
| H17 | 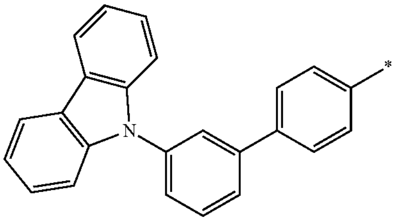 [SMILES: *c1ccc(-c2cccc(-n3c4ccccc4c4ccccc43)c2)cc1] | 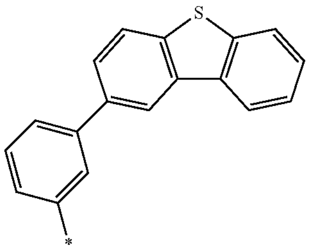 [SMILES: *c1cccc(-c2ccc3sc4ccccc4c3c2)c1] | 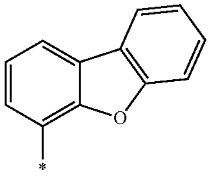 |
| H18 | 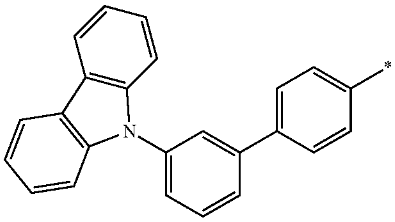 [SMILES: *c1ccc(-c2cccc(-n3c4ccccc4c4ccccc43)c2)cc1] | 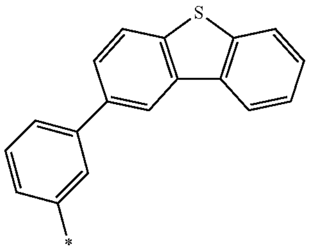 [SMILES: *c1cccc(-c2ccc3sc4ccccc4c3c2)c1] | 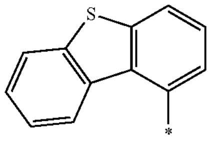 |
| H19 | 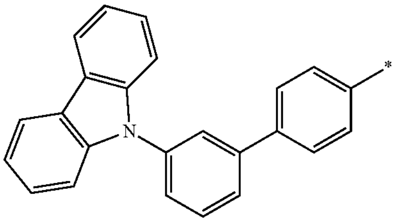 [SMILES: *c1ccc(-c2cccc(-n3c4ccccc4c4ccccc43)c2)cc1] | 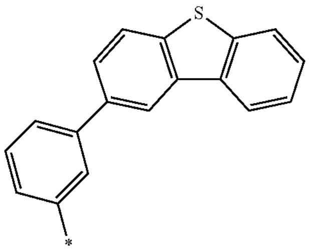 [SMILES: *c1cccc(-c2ccc3sc4ccccc4c3c2)c1] | 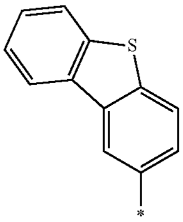 |
| H20 | 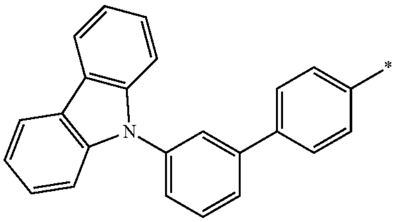 [SMILES: *c1ccc(-c2cccc(-n3c4ccccc4c4ccccc43)c2)cc1] | 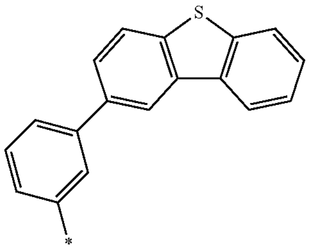 [SMILES: *c1cccc(-c2ccc3sc4ccccc4c3c2)c1] | 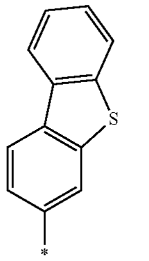 [SMILES: *c1ccc2c(c1)sc1ccccc12] |
| H21 | 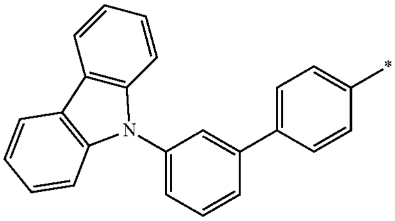 [SMILES: *c1ccc(-c2cccc(-n3c4ccccc4c4ccccc43)c2)cc1] | 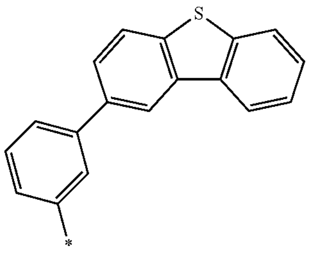 [SMILES: *c1cccc(-c2ccc3sc4ccccc4c3c2)c1] | 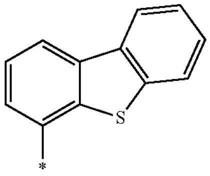 |

-continued
| Compound Group 1 | | | |
|---|---|---|---|
| Formula 1 | $Ar_1$ | $Ar_2$ | $Ar_3$ |
| H22 | 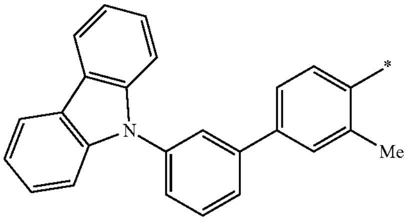 [SMILES: *c1ccc(-c2cccc(-n3c4ccccc4c4ccccc43)c2)cc1C] | 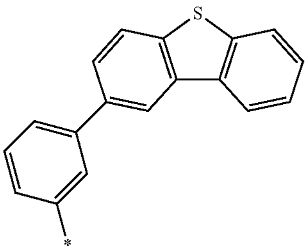 [SMILES: *c1cccc(-c2ccc3sc4ccccc4c3c2)c1] | 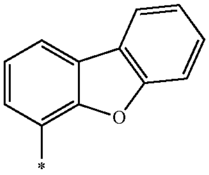 |
| H23 | 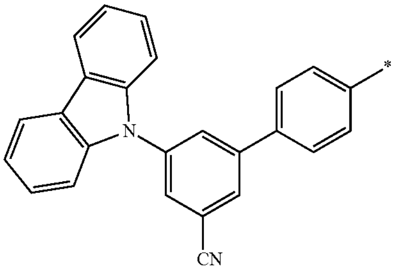 [SMILES: *c1ccc(-c2cc(C#N)cc(-n3c4ccccc4c4ccccc43)c2)cc1] | 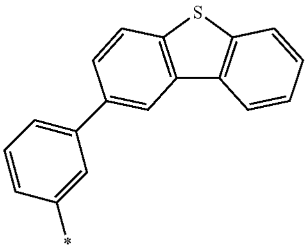 [SMILES: *c1cccc(-c2ccc3sc4ccccc4c3c2)c1] | 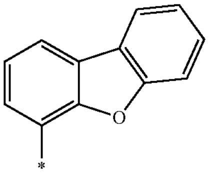 |
| I1 | 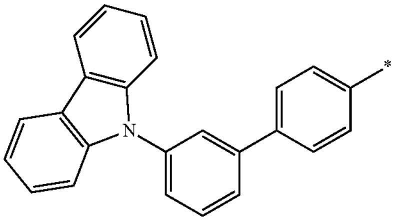 [SMILES: *c1ccc(-c2cccc(-n3c4ccccc4c4ccccc43)c2)cc1] | 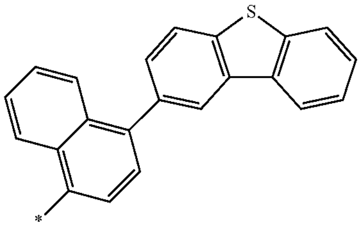 [SMILES: *c1ccc(-c2ccc3sc4ccccc4c3c2)c2ccccc12] | 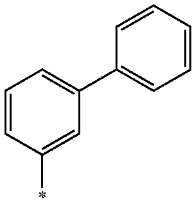 [SMILES: *c1cccc(-c2ccccc2)c1] |
| I2 | 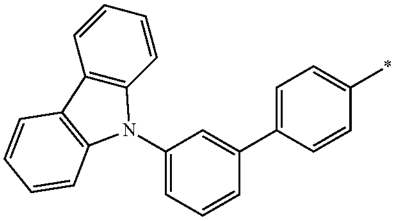 [SMILES: *c1ccc(-c2cccc(-n3c4ccccc4c4ccccc43)c2)cc1] | 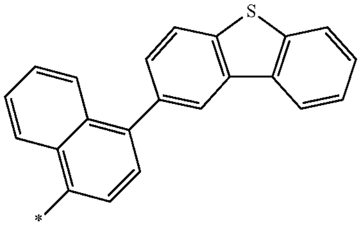 [SMILES: *c1ccc(-c2ccc3sc4ccccc4c3c2)c2ccccc12] | 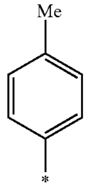 [SMILES: *c1ccc(C)cc1] |
| I3 | 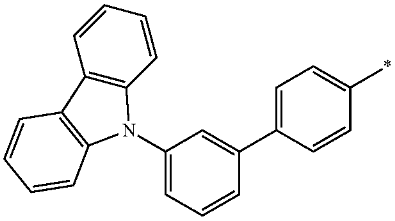 [SMILES: *c1ccc(-c2cccc(-n3c4ccccc4c4ccccc43)c2)cc1] | 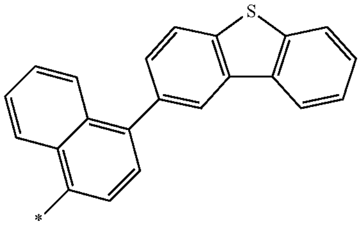 [SMILES: *c1ccc(-c2ccc3sc4ccccc4c3c2)c2ccccc12] | 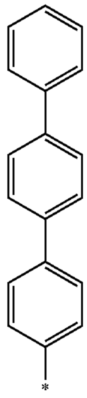 [SMILES: *c1ccc(-c2ccc(-c3ccccc3)cc2)cc1] |

-continued
| Compound Group 1 | | | |
|---|---|---|---|
| Formula 1 | $Ar_1$ | $Ar_2$ | $Ar_3$ |
| I4 | 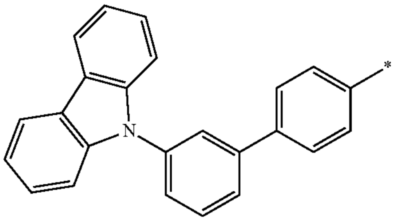 [SMILES: *c1ccc(-c2cccc(-n3c4ccccc4c4ccccc43)c2)cc1] | 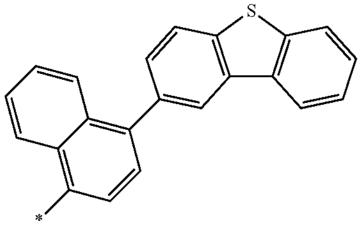 [SMILES: *c1ccc(-c2ccc3sc4ccccc4c3c2)c2ccccc12] | 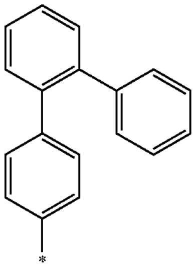 [SMILES: *c1ccc(-c2ccccc2-c2ccccc2)cc1] |
| I5 | 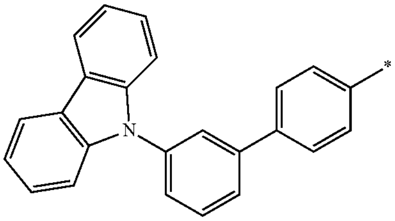 [SMILES: *c1ccc(-c2cccc(-n3c4ccccc4c4ccccc43)c2)cc1] | 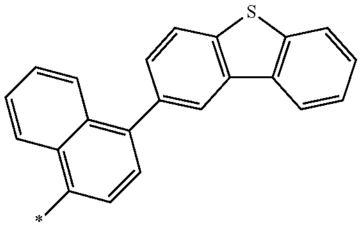 [SMILES: *c1ccc(-c2ccc3sc4ccccc4c3c2)c2ccccc12] | 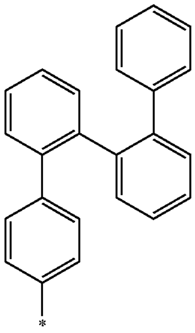 [SMILES: *c1ccc(-c2ccccc2-c2ccccc2-c2ccccc2)cc1] |
| I6 | 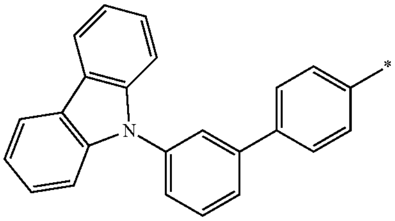 [SMILES: *c1ccc(-c2cccc(-n3c4ccccc4c4ccccc43)c2)cc1] | 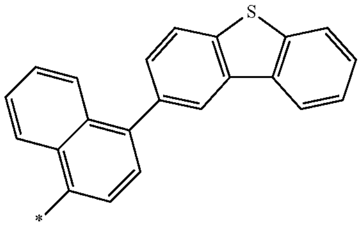 [SMILES: *c1ccc(-c2ccc3sc4ccccc4c3c2)c2ccccc12] | 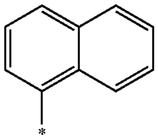 [SMILES: *c1cccc2ccccc12] |
| I7 | 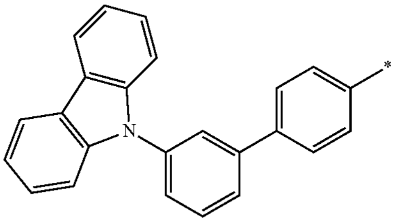 [SMILES: *c1ccc(-c2cccc(-n3c4ccccc4c4ccccc43)c2)cc1] | 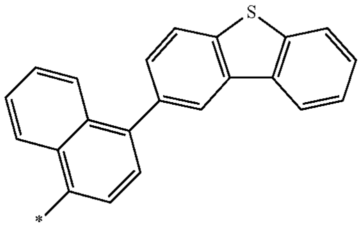 [SMILES: *c1ccc(-c2ccc3sc4ccccc4c3c2)c2ccccc12] | 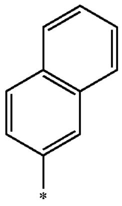 [SMILES: *c1ccc2ccccc2c1] |
| I8 | 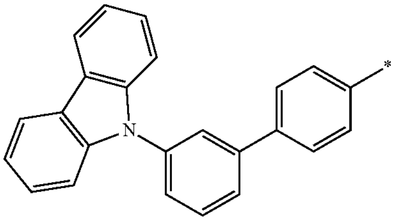 [SMILES: *c1ccc(-c2cccc(-n3c4ccccc4c4ccccc43)c2)cc1] | 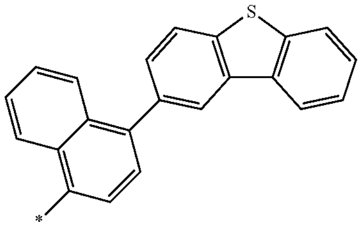 [SMILES: *c1ccc(-c2ccc3sc4ccccc4c3c2)c2ccccc12] | 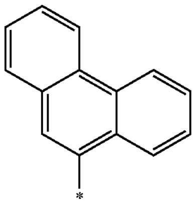 [SMILES: *c1cc2ccccc2c2ccccc12] |

-continued
| Compound Group 1 | | | |
|---|---|---|---|
| Formula 1 | $Ar_1$ | $Ar_2$ | $Ar_3$ |
| I9 | 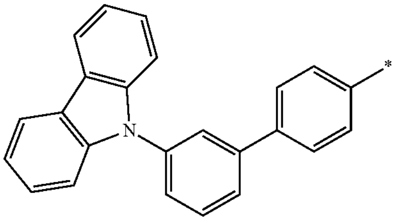 [SMILES: *c1ccc(-c2cccc(-n3c4ccccc4c4ccccc43)c2)cc1] | 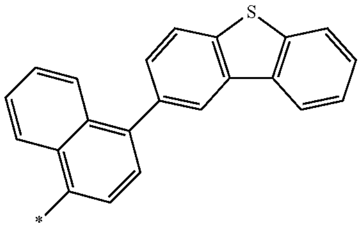 [SMILES: *c1ccc(-c2ccc3sc4ccccc4c3c2)c2ccccc12] | 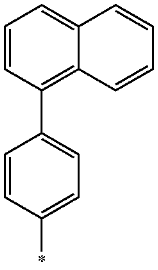 [SMILES: *c1ccc(-c2cccc3ccccc23)cc1] |
| I10 | 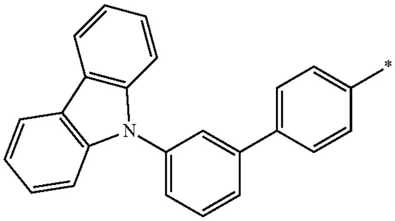 [SMILES: *c1ccc(-c2cccc(-n3c4ccccc4c4ccccc43)c2)cc1] | 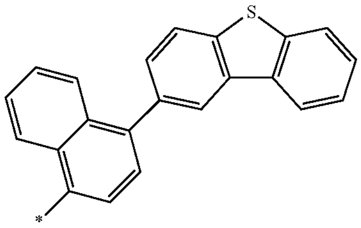 [SMILES: *c1ccc(-c2ccc3sc4ccccc4c3c2)c2ccccc12] | 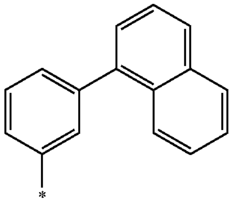 [SMILES: *c1cccc(-c2cccc3ccccc23)c1] |
| I11 | 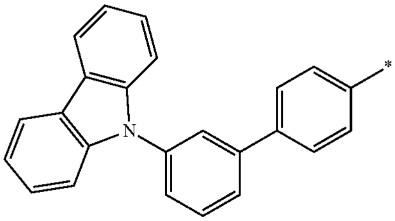 [SMILES: *c1ccc(-c2cccc(-n3c4ccccc4c4ccccc43)c2)cc1] | 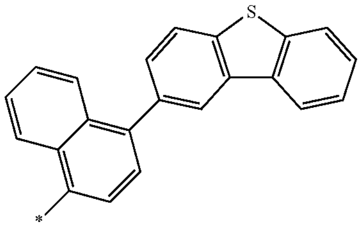 [SMILES: *c1ccc(-c2ccc3sc4ccccc4c3c2)c2ccccc12] | 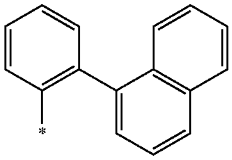 [SMILES: *c1ccccc1-c1cccc2ccccc12] |
| I12 | 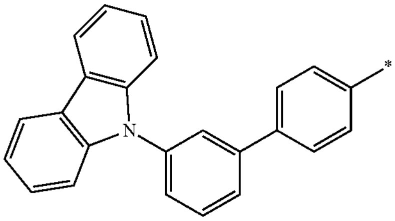 [SMILES: *c1ccc(-c2cccc(-n3c4ccccc4c4ccccc43)c2)cc1] | 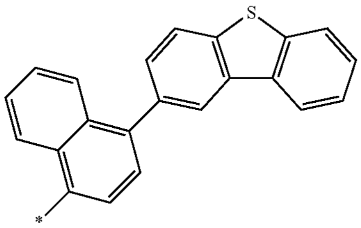 [SMILES: *c1ccc(-c2ccc3sc4ccccc4c3c2)c2ccccc12] | 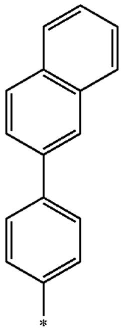 [SMILES: *c1ccc(-c2ccc3ccccc3c2)cc1] |
| I13 | 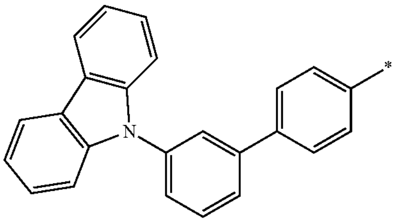 [SMILES: *c1ccc(-c2cccc(-n3c4ccccc4c4ccccc43)c2)cc1] | 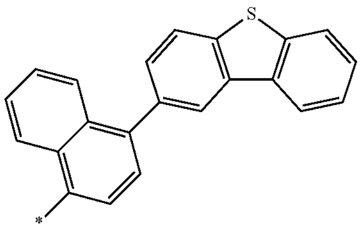 [SMILES: *c1ccc(-c2ccc3sc4ccccc4c3c2)c2ccccc12] | 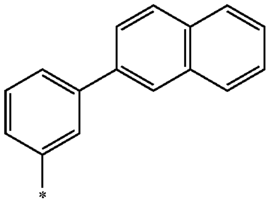 [SMILES: *c1cccc(-c2ccc3ccccc3c2)c1] |

-continued
| Compound Group 1 | | | |
|---|---|---|---|
| Formula 1 | $Ar_1$ | $Ar_2$ | $Ar_3$ |
| I14 | 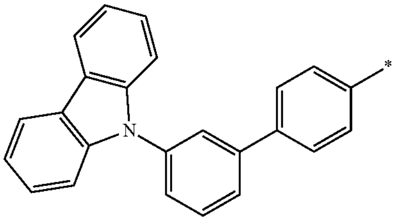 [SMILES: *c1ccc(-c2cccc(-n3c4ccccc4c4ccccc43)c2)cc1] | 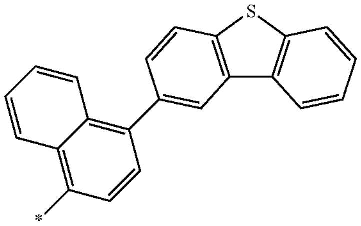 [SMILES: *c1ccc(-c2ccc3sc4ccccc4c3c2)c2ccccc12] | 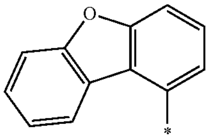 |
| I15 | 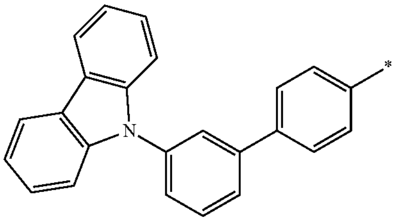 [SMILES: *c1ccc(-c2cccc(-n3c4ccccc4c4ccccc43)c2)cc1] | 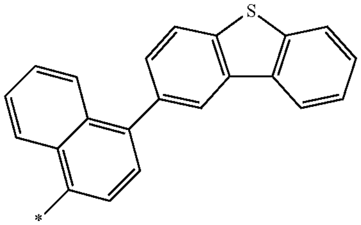 [SMILES: *c1ccc(-c2ccc3sc4ccccc4c3c2)c2ccccc12] | 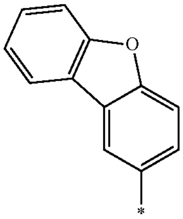 |
| I16 | 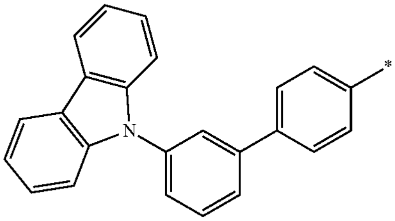 [SMILES: *c1ccc(-c2cccc(-n3c4ccccc4c4ccccc43)c2)cc1] | 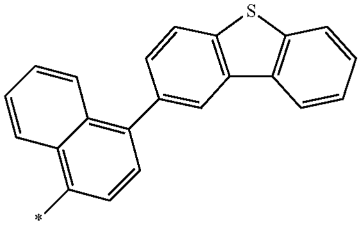 [SMILES: *c1ccc(-c2ccc3sc4ccccc4c3c2)c2ccccc12] | 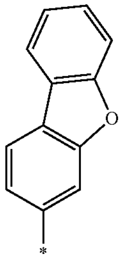 [SMILES: *c1ccc2c(c1)oc1ccccc12] |
| I17 | 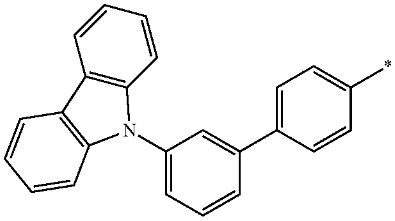 [SMILES: *c1ccc(-c2cccc(-n3c4ccccc4c4ccccc43)c2)cc1] | 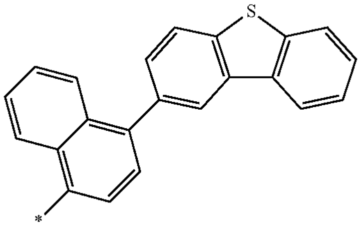 [SMILES: *c1ccc(-c2ccc3sc4ccccc4c3c2)c2ccccc12] | 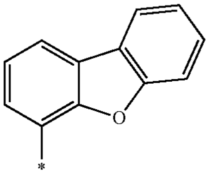 |
| I18 | 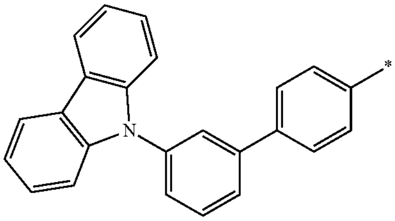 [SMILES: *c1ccc(-c2cccc(-n3c4ccccc4c4ccccc43)c2)cc1] | 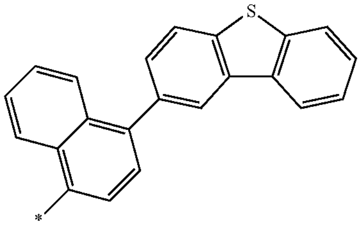 [SMILES: *c1ccc(-c2ccc3sc4ccccc4c3c2)c2ccccc12] | 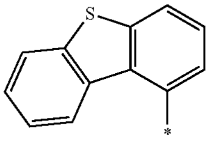 |
| I19 | 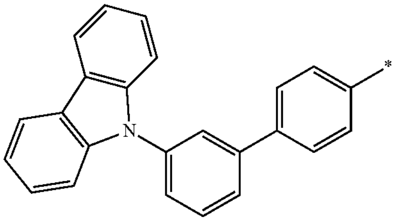 [SMILES: *c1ccc(-c2cccc(-n3c4ccccc4c4ccccc43)c2)cc1] | 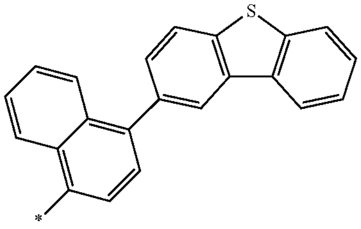 [SMILES: *c1ccc(-c2ccc3sc4ccccc4c3c2)c2ccccc12] | 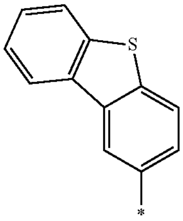 |

-continued
| Compound Group 1 | | | |
|---|---|---|---|
| Formula 1 | $Ar_1$ | $Ar_2$ | $Ar_3$ |
| I20 | 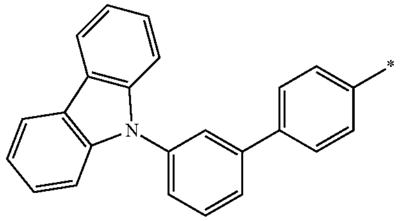 [SMILES: *c1ccc(-c2cccc(-n3c4ccccc4c4ccccc43)c2)cc1] | 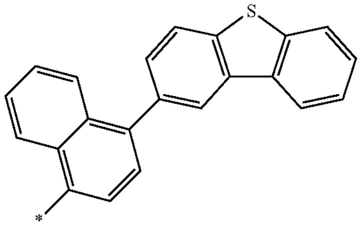 [SMILES: *c1ccc(-c2ccc3sc4ccccc4c3c2)c2ccccc12] | 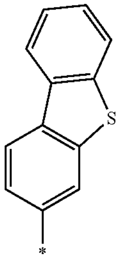 [SMILES: *c1ccc2c(c1)sc1ccccc12] |
| I21 | 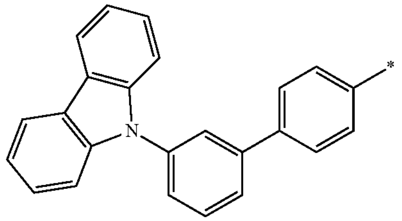 [SMILES: *c1ccc(-c2cccc(-n3c4ccccc4c4ccccc43)c2)cc1] | 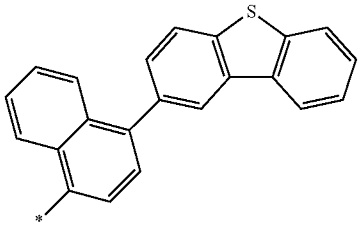 [SMILES: *c1ccc(-c2ccc3sc4ccccc4c3c2)c2ccccc12] | 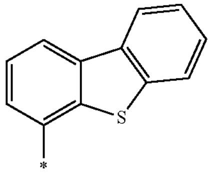 |
| I22 | 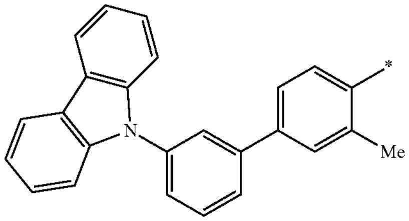 [SMILES: *c1ccc(-c2cccc(-n3c4ccccc4c4ccccc43)c2)cc1C] | 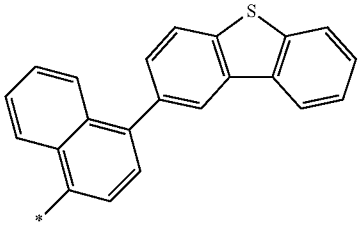 [SMILES: *c1ccc(-c2ccc3sc4ccccc4c3c2)c2ccccc12] | 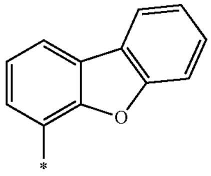 |
| I23 | 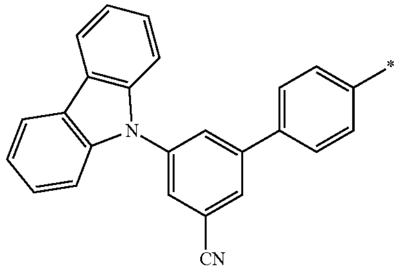 [SMILES: *c1ccc(-c2cc(C#N)cc(-n3c4ccccc4c4ccccc43)c2)cc1] | 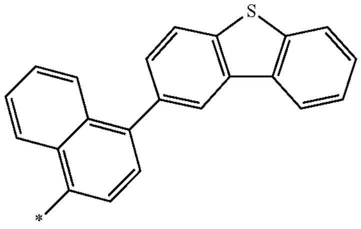 [SMILES: *c1ccc(-c2ccc3sc4ccccc4c3c2)c2ccccc12] | 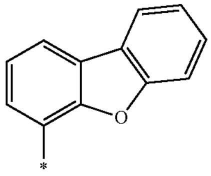 |
| J1 | 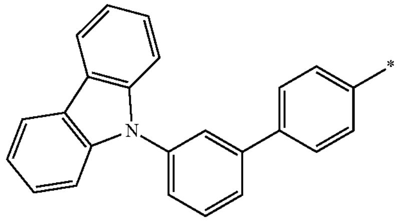 [SMILES: *c1ccc(-c2cccc(-n3c4ccccc4c4ccccc43)c2)cc1] | 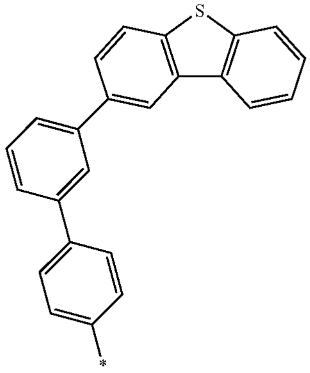 [SMILES: *c1ccc(-c2cccc(-c3ccc4sc5ccccc5c4c3)c2)cc1] | 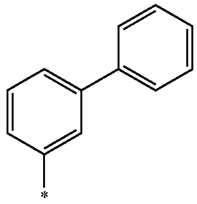 [SMILES: *c1cccc(-c2ccccc2)c1] |

-continued
| Compound Group 1 | | | |
|---|---|---|---|
| Formula 1 | $Ar_1$ | $Ar_2$ | $Ar_3$ |
| J2 | 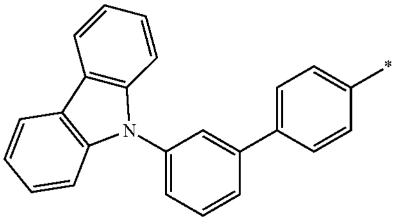 [SMILES: *c1ccc(-c2cccc(-n3c4ccccc4c4ccccc43)c2)cc1] | 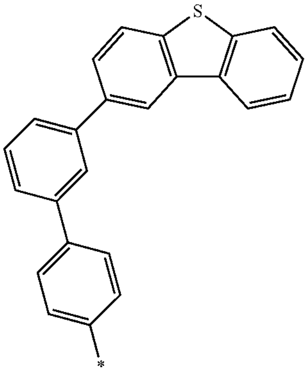 [SMILES: *c1ccc(-c2cccc(-c3ccc4sc5ccccc5c4c3)c2)cc1] | 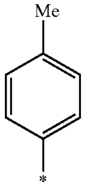 [SMILES: *c1ccc(C)cc1] |
| J3 | 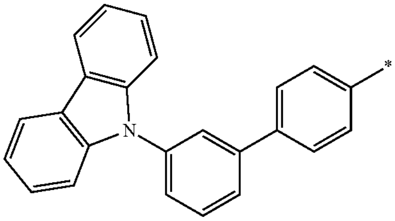 [SMILES: *c1ccc(-c2cccc(-n3c4ccccc4c4ccccc43)c2)cc1] | 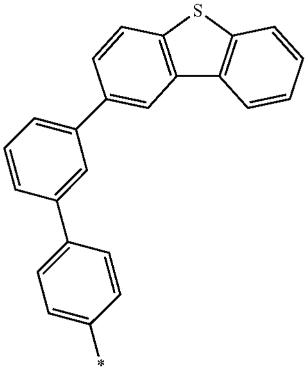 [SMILES: *c1ccc(-c2cccc(-c3ccc4sc5ccccc5c4c3)c2)cc1] | 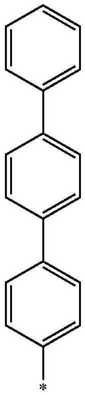 [SMILES: *c1ccc(-c2ccc(-c3ccccc3)cc2)cc1] |
| J4 | 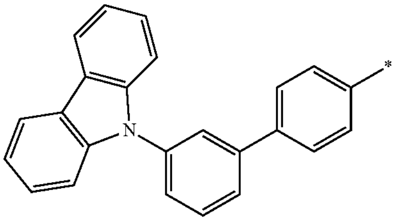 [SMILES: *c1ccc(-c2cccc(-n3c4ccccc4c4ccccc43)c2)cc1] | 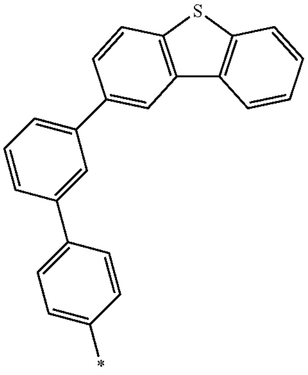 [SMILES: *c1ccc(-c2cccc(-c3ccc4sc5ccccc5c4c3)c2)cc1] | 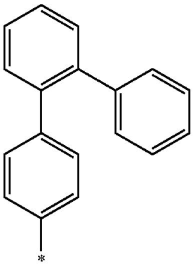 [SMILES: *c1ccc(-c2ccccc2-c2ccccc2)cc1] |
| J5 | 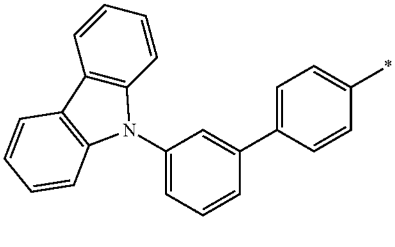 [SMILES: *c1ccc(-c2cccc(-n3c4ccccc4c4ccccc43)c2)cc1] | 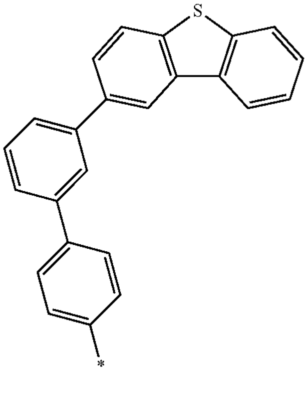 [SMILES: *c1ccc(-c2cccc(-c3ccc4sc5ccccc5c4c3)c2)cc1] | 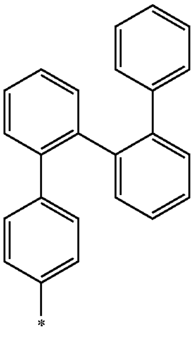 [SMILES: *c1ccc(-c2ccccc2-c2ccccc2-c2ccccc2)cc1] |

-continued
| Compound Group 1 | | | |
|---|---|---|---|
| Formula 1 | $Ar_1$ | $Ar_2$ | $Ar_3$ |
| J6 | 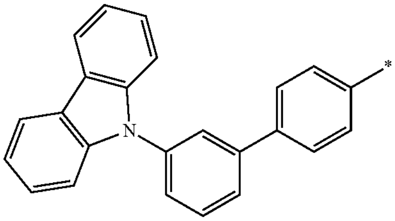 [SMILES: *c1ccc(-c2cccc(-n3c4ccccc4c4ccccc43)c2)cc1] | 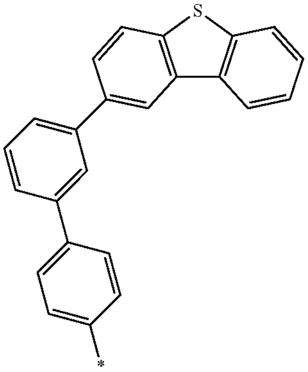 [SMILES: *c1ccc(-c2cccc(-c3ccc4sc5ccccc5c4c3)c2)cc1] | 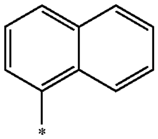 [SMILES: *c1cccc2ccccc12] |
| J7 | 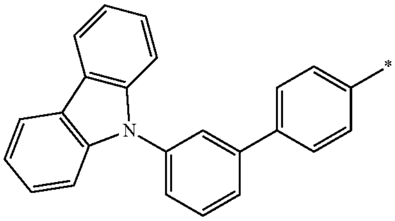 [SMILES: *c1ccc(-c2cccc(-n3c4ccccc4c4ccccc43)c2)cc1] | 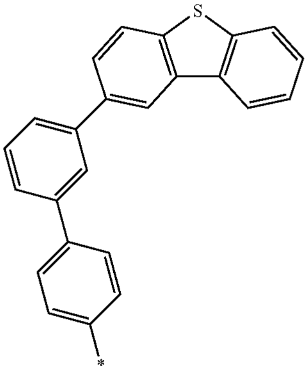 [SMILES: *c1ccc(-c2cccc(-c3ccc4sc5ccccc5c4c3)c2)cc1] | 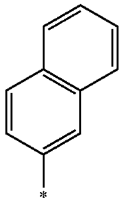 [SMILES: *c1ccc2ccccc2c1] |
| J8 | 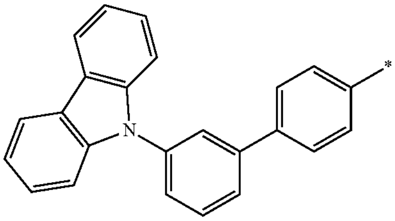 [SMILES: *c1ccc(-c2cccc(-n3c4ccccc4c4ccccc43)c2)cc1] | 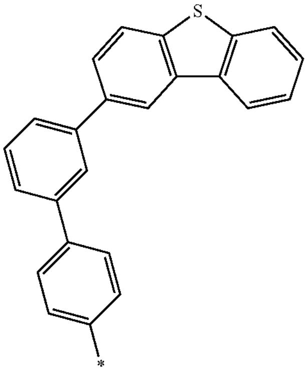 [SMILES: *c1ccc(-c2cccc(-c3ccc4sc5ccccc5c4c3)c2)cc1] | 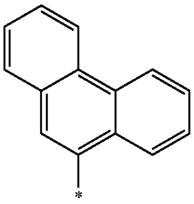 [SMILES: *c1cc2ccccc2c2ccccc12] |
| J9 | 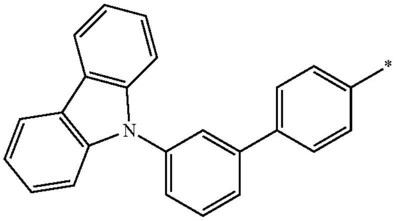 [SMILES: *c1ccc(-c2cccc(-n3c4ccccc4c4ccccc43)c2)cc1] | 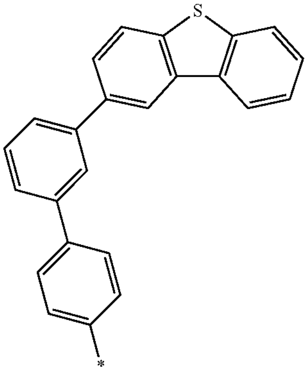 [SMILES: *c1ccc(-c2cccc(-c3ccc4sc5ccccc5c4c3)c2)cc1] | 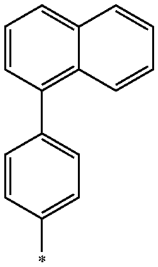 [SMILES: *c1ccc(-c2cccc3ccccc23)cc1] |

-continued
| Compound Group 1 | | | |
|---|---|---|---|
| Formula 1 | $Ar_1$ | $Ar_2$ | $Ar_3$ |
| J10 | 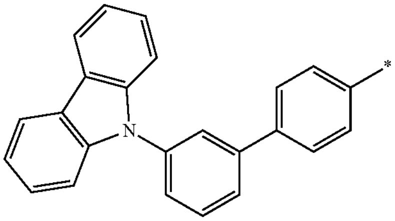 [SMILES: *c1ccc(-c2cccc(-n3c4ccccc4c4ccccc43)c2)cc1] | 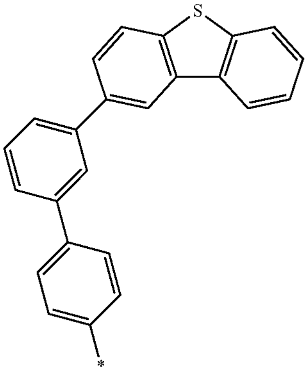 [SMILES: *c1ccc(-c2cccc(-c3ccc4sc5ccccc5c4c3)c2)cc1] | 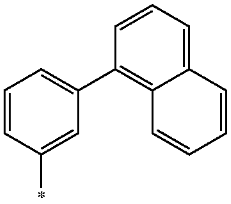 [SMILES: *c1cccc(-c2cccc3ccccc23)c1] |
| J11 | 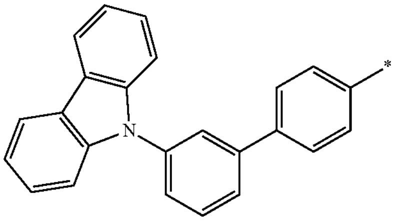 [SMILES: *c1ccc(-c2cccc(-n3c4ccccc4c4ccccc43)c2)cc1] | 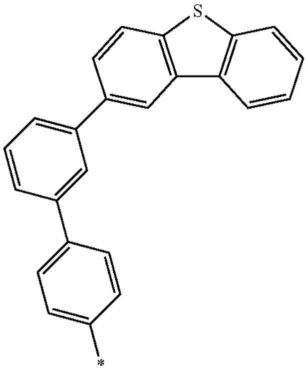 [SMILES: *c1ccc(-c2cccc(-c3ccc4sc5ccccc5c4c3)c2)cc1] | 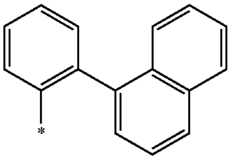 [SMILES: *c1ccccc1-c1cccc2ccccc12] |
| J12 | 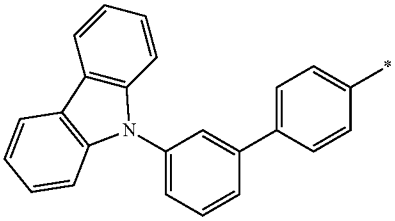 [SMILES: *c1ccc(-c2cccc(-n3c4ccccc4c4ccccc43)c2)cc1] | 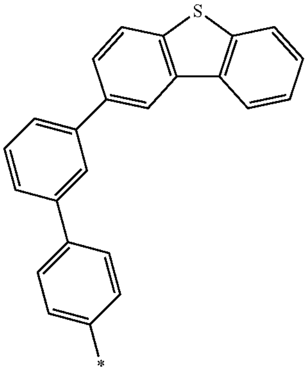 [SMILES: *c1ccc(-c2cccc(-c3ccc4sc5ccccc5c4c3)c2)cc1] | 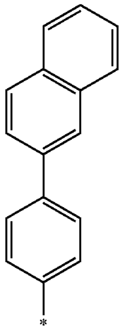 [SMILES: *c1ccc(-c2ccc3ccccc3c2)cc1] |
| J13 | 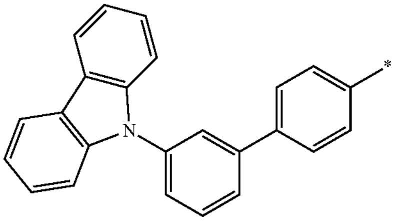 [SMILES: *c1ccc(-c2cccc(-n3c4ccccc4c4ccccc43)c2)cc1] | 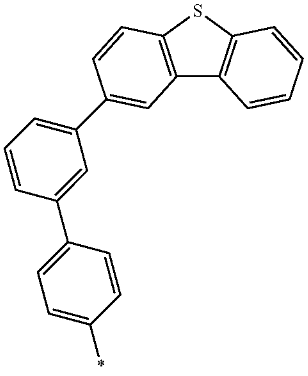 [SMILES: *c1ccc(-c2cccc(-c3ccc4sc5ccccc5c4c3)c2)cc1] | 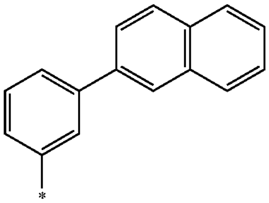 [SMILES: *c1cccc(-c2ccc3ccccc3c2)c1] |

-continued
| Compound Group 1 | | | |
| --- | --- | --- | --- |
| Formula 1 | $Ar_1$ | $Ar_2$ | $Ar_3$ |
| J14 | 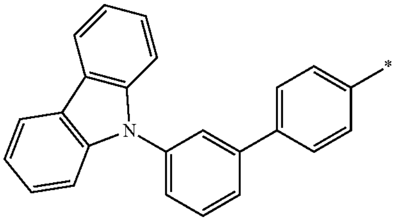 [SMILES: *c1ccc(-c2cccc(-n3c4ccccc4c4ccccc43)c2)cc1] | 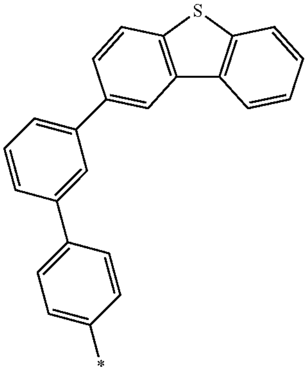 [SMILES: *c1ccc(-c2cccc(-c3ccc4sc5ccccc5c4c3)c2)cc1] | 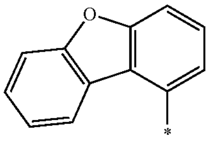 |
| J15 | 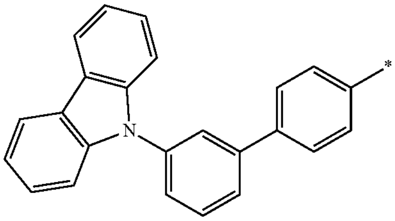 [SMILES: *c1ccc(-c2cccc(-n3c4ccccc4c4ccccc43)c2)cc1] | 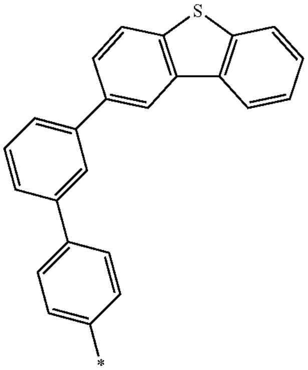 [SMILES: *c1ccc(-c2cccc(-c3ccc4sc5ccccc5c4c3)c2)cc1] | 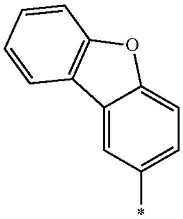 |
| J16 | 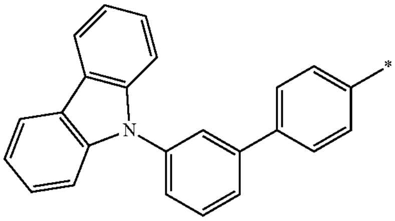 [SMILES: *c1ccc(-c2cccc(-n3c4ccccc4c4ccccc43)c2)cc1] | 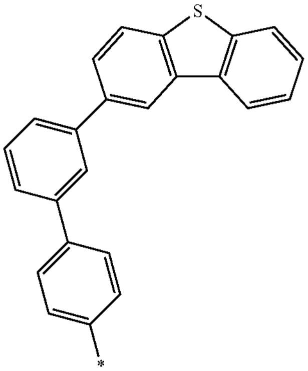 [SMILES: *c1ccc(-c2cccc(-c3ccc4sc5ccccc5c4c3)c2)cc1] | 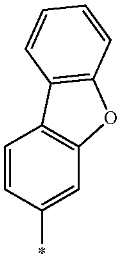 [SMILES: *c1ccc2c(c1)oc1ccccc12] |
| J17 | 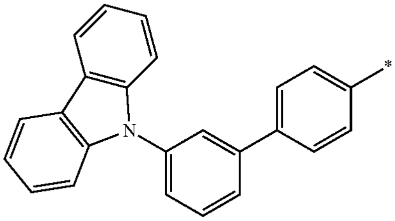 [SMILES: *c1ccc(-c2cccc(-n3c4ccccc4c4ccccc43)c2)cc1] | 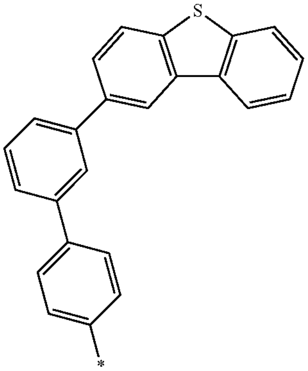 [SMILES: *c1ccc(-c2cccc(-c3ccc4sc5ccccc5c4c3)c2)cc1] | 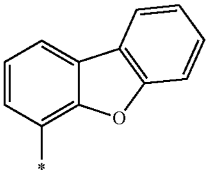 |

-continued
| Compound Group 1 | | | |
|---|---|---|---|
| Formula 1 | $Ar_1$ | $Ar_2$ | $Ar_3$ |
| J18 | 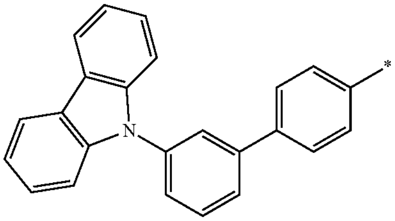 [SMILES: *c1ccc(-c2cccc(-n3c4ccccc4c4ccccc43)c2)cc1] | 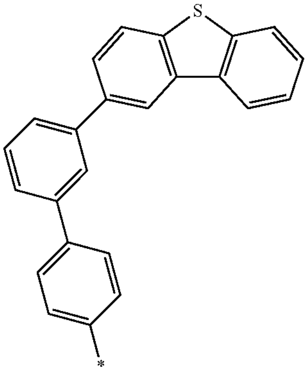 [SMILES: *c1ccc(-c2cccc(-c3ccc4sc5ccccc5c4c3)c2)cc1] | 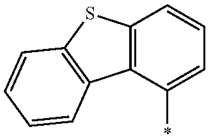 |
| J19 | 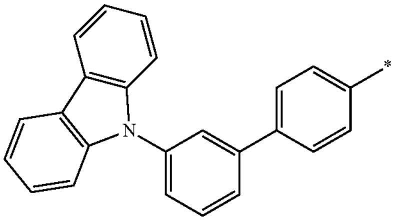 [SMILES: *c1ccc(-c2cccc(-n3c4ccccc4c4ccccc43)c2)cc1] | 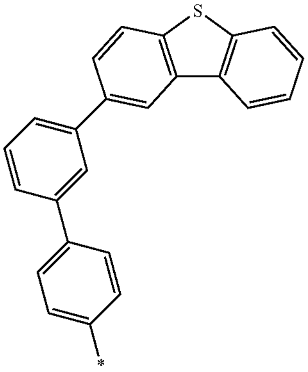 [SMILES: *c1ccc(-c2cccc(-c3ccc4sc5ccccc5c4c3)c2)cc1] | 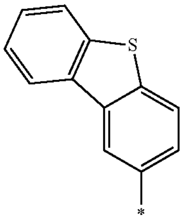 |
| J20 | 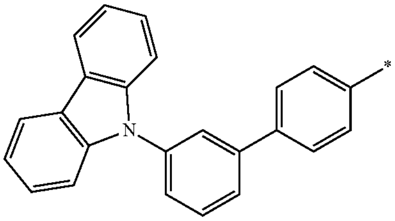 [SMILES: *c1ccc(-c2cccc(-n3c4ccccc4c4ccccc43)c2)cc1] | 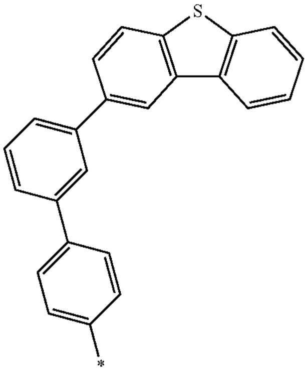 [SMILES: *c1ccc(-c2cccc(-c3ccc4sc5ccccc5c4c3)c2)cc1] | 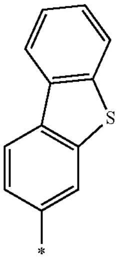 [SMILES: *c1ccc2c(c1)sc1ccccc12] |
| J21 | 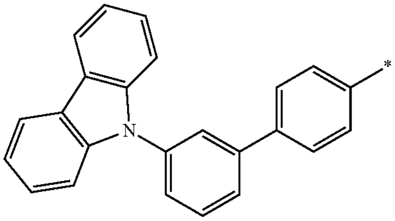 [SMILES: *c1ccc(-c2cccc(-n3c4ccccc4c4ccccc43)c2)cc1] | 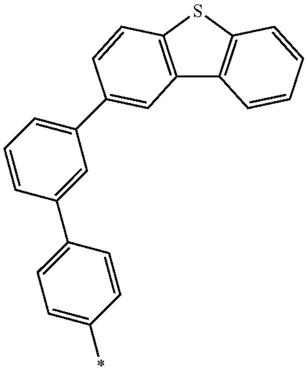 [SMILES: *c1ccc(-c2cccc(-c3ccc4sc5ccccc5c4c3)c2)cc1] | 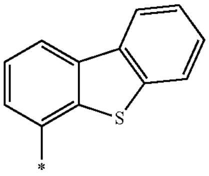 |

-continued
| Compound Group 1 | | | |
|---|---|---|---|
| Formula 1 | $Ar_1$ | $Ar_2$ | $Ar_3$ |
| J22 | 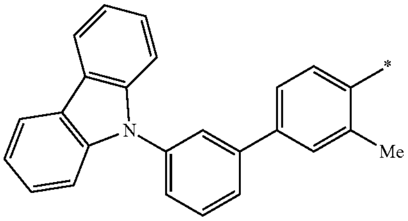 [SMILES: *c1ccc(-c2cccc(-n3c4ccccc4c4ccccc43)c2)cc1C] | 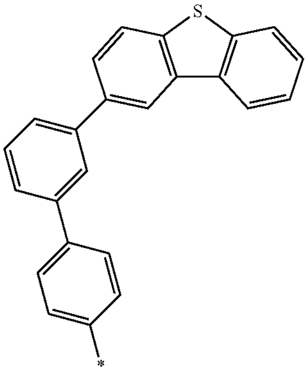 [SMILES: *c1ccc(-c2cccc(-c3ccc4sc5ccccc5c4c3)c2)cc1] | 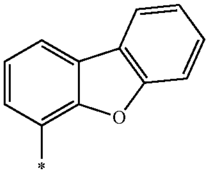 |
| J23 | 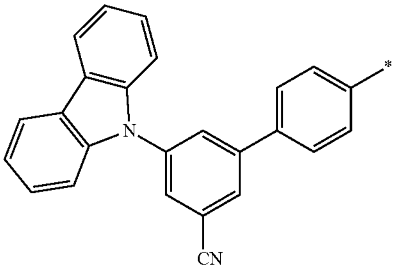 [SMILES: *c1ccc(-c2cc(C#N)cc(-n3c4ccccc4c4ccccc43)c2)cc1] | 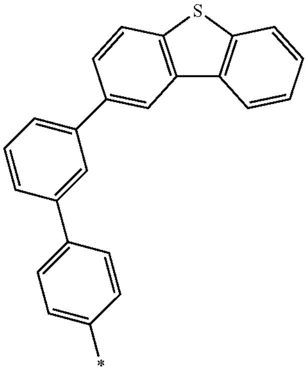 [SMILES: *c1ccc(-c2cccc(-c3ccc4sc5ccccc5c4c3)c2)cc1] | 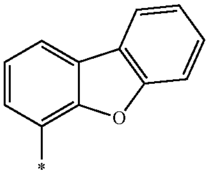 |
| K1 | 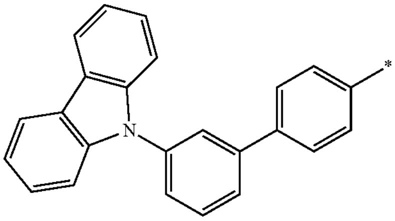 [SMILES: *c1ccc(-c2cccc(-n3c4ccccc4c4ccccc43)c2)cc1] | 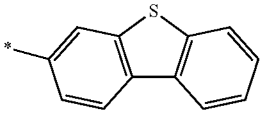 | 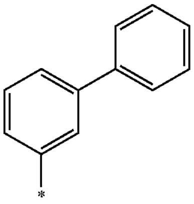 [SMILES: *c1cccc(-c2ccccc2)c1] |
| K2 | 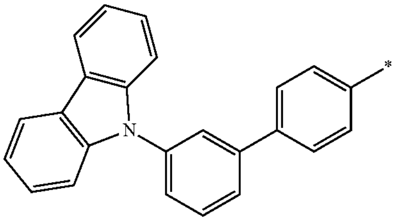 [SMILES: *c1ccc(-c2cccc(-n3c4ccccc4c4ccccc43)c2)cc1] | 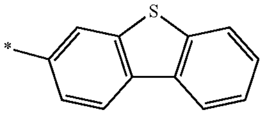 [SMILES: *c1ccc2c(c1)sc1ccccc12] | 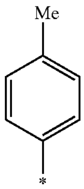 [SMILES: *c1ccc(C)cc1] |

-continued
Compound Group 1
| Formula 1 | $Ar_1$ | $Ar_2$ | $Ar_3$ |
|---|---|---|---|
| K3 | 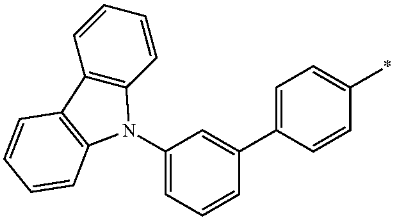 [SMILES: *c1ccc(-c2cccc(-n3c4ccccc4c4ccccc43)c2)cc1] | 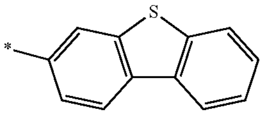 | 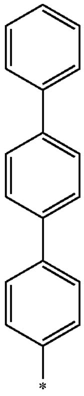 [SMILES: *c1ccc(-c2ccc(-c3ccccc3)cc2)cc1] |
| K4 | 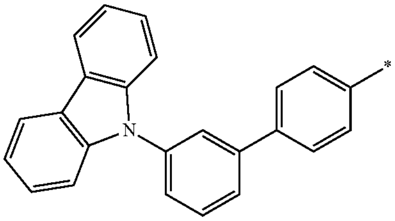 [SMILES: *c1ccc(-c2cccc(-n3c4ccccc4c4ccccc43)c2)cc1] | 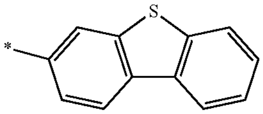 [SMILES: *c1ccc2c(c1)sc1ccccc12] | 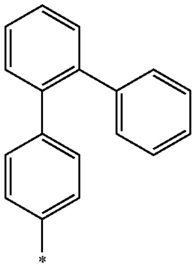 [SMILES: *c1ccc(-c2ccccc2-c2ccccc2)cc1] |
| K5 | 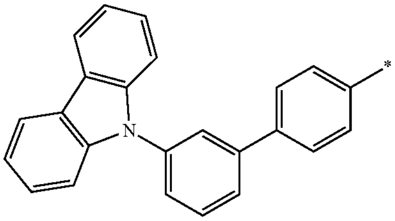 [SMILES: *c1ccc(-c2cccc(-n3c4ccccc4c4ccccc43)c2)cc1] | 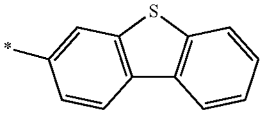 [SMILES: *c1ccc2c(c1)sc1ccccc12] | 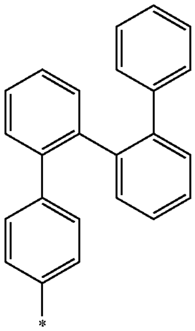 [SMILES: *c1ccc(-c2ccccc2-c2ccccc2-c2ccccc2)cc1] |
| K6 | 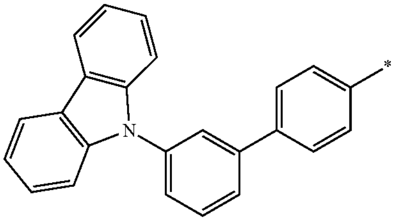 [SMILES: *c1ccc(-c2cccc(-n3c4ccccc4c4ccccc43)c2)cc1] | 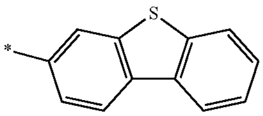 | 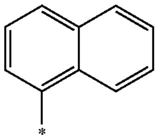 [SMILES: *c1cccc2ccccc12] |
| K7 | 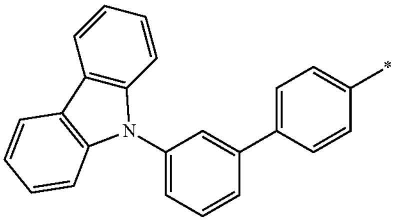 [SMILES: *c1ccc(-c2cccc(-n3c4ccccc4c4ccccc43)c2)cc1] | 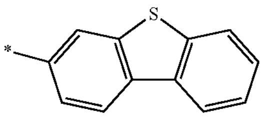 | 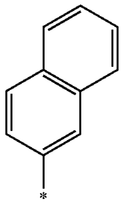 [SMILES: *c1ccc2ccccc2c1] |

-continued
Compound Group 1
| Formula 1 | $Ar_1$ | $Ar_2$ | $Ar_3$ |
|---|---|---|---|
| K8 | 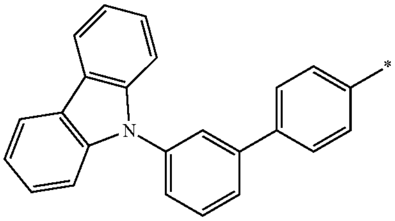 [SMILES: *c1ccc(-c2cccc(-n3c4ccccc4c4ccccc43)c2)cc1] | 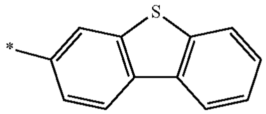 [SMILES: *c1ccc2c(c1)sc1ccccc12] | 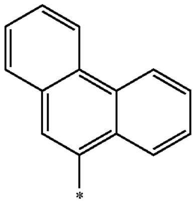 [SMILES: *c1cc2ccccc2c2ccccc12] |
| K9 | 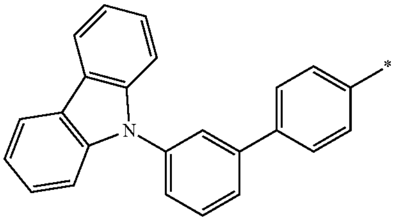 [SMILES: *c1ccc(-c2cccc(-n3c4ccccc4c4ccccc43)c2)cc1] | 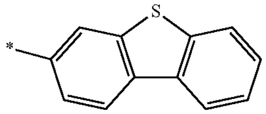 [SMILES: *c1ccc2c(c1)sc1ccccc12] | 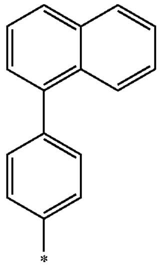 [SMILES: *c1ccc(-c2cccc3ccccc23)cc1] |
| K10 | 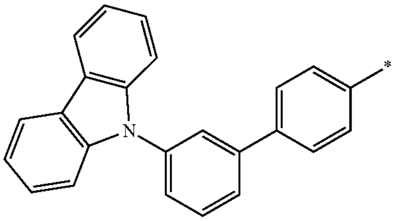 [SMILES: *c1ccc(-c2cccc(-n3c4ccccc4c4ccccc43)c2)cc1] | 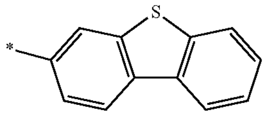 | 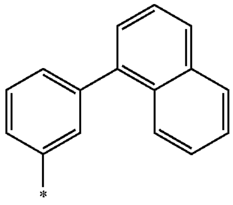 [SMILES: *c1cccc(-c2cccc3ccccc23)c1] |
| K11 | 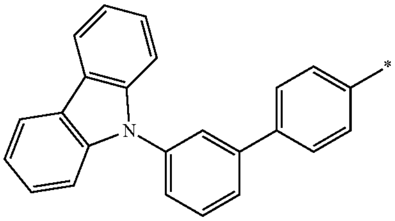 [SMILES: *c1ccc(-c2cccc(-n3c4ccccc4c4ccccc43)c2)cc1] | 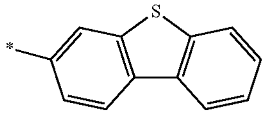 | 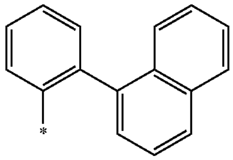 [SMILES: *c1ccccc1-c1cccc2ccccc12] |
| K12 | 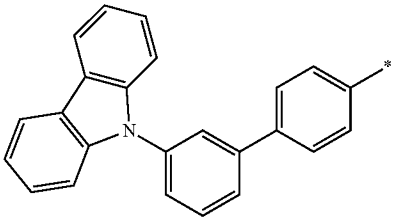 [SMILES: *c1ccc(-c2cccc(-n3c4ccccc4c4ccccc43)c2)cc1] | 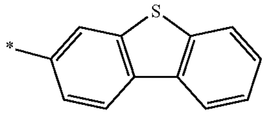 | 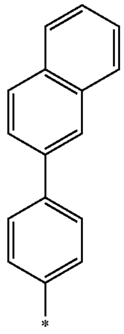 [SMILES: *c1ccc(-c2ccc3ccccc3c2)cc1] |
| K13 | 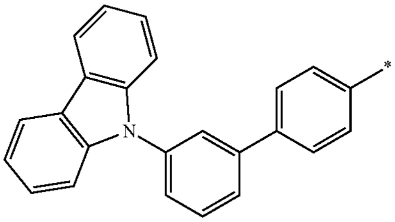 [SMILES: *c1ccc(-c2cccc(-n3c4ccccc4c4ccccc43)c2)cc1] | 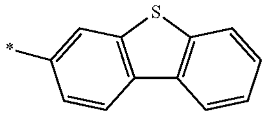 | 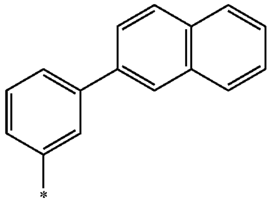 [SMILES: *c1cccc(-c2ccc3ccccc3c2)c1] |

-continued
| Compound Group 1 | | | |
|---|---|---|---|
| Formula 1 | $Ar_1$ | $Ar_2$ | $Ar_3$ |
| K14 | 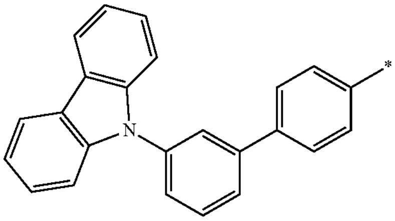 [SMILES: *c1ccc(-c2cccc(-n3c4ccccc4c4ccccc43)c2)cc1] | 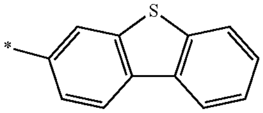 [SMILES: *c1ccc2c(c1)sc1ccccc12] | 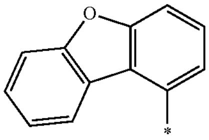 |
| K15 | 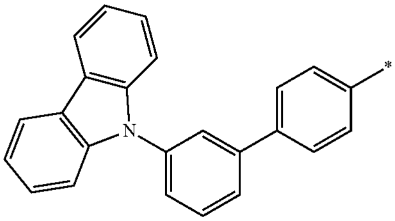 [SMILES: *c1ccc(-c2cccc(-n3c4ccccc4c4ccccc43)c2)cc1] | 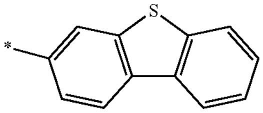 [SMILES: *c1ccc2c(c1)sc1ccccc12] | 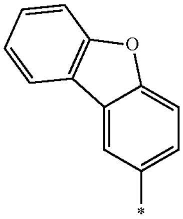 |
| K16 | 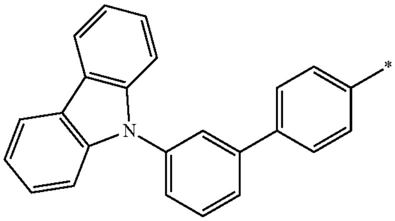 [SMILES: *c1ccc(-c2cccc(-n3c4ccccc4c4ccccc43)c2)cc1] | 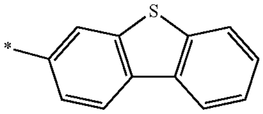 | 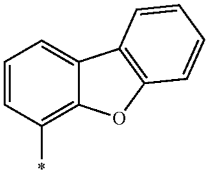 |
| K17 | 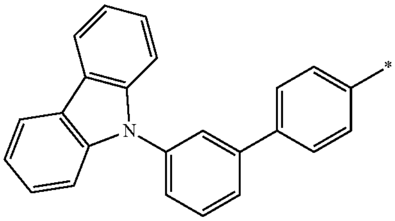 [SMILES: *c1ccc(-c2cccc(-n3c4ccccc4c4ccccc43)c2)cc1] | 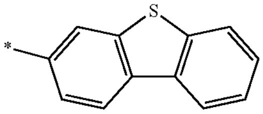 [SMILES: *c1ccc2c(c1)sc1ccccc12] | 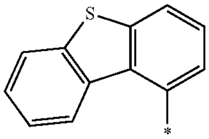 |
| K18 | 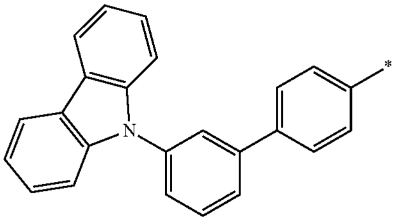 [SMILES: *c1ccc(-c2cccc(-n3c4ccccc4c4ccccc43)c2)cc1] | 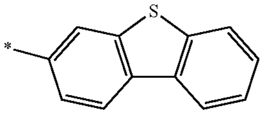 | 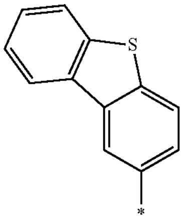 |
| K19 | 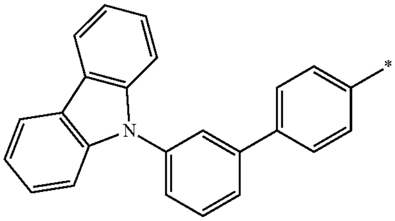 [SMILES: *c1ccc(-c2cccc(-n3c4ccccc4c4ccccc43)c2)cc1] | 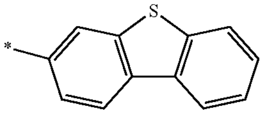 | 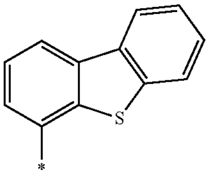 |

-continued
| Compound Group 1 | | | |
|---|---|---|---|
| Formula 1 | $Ar_1$ | $Ar_2$ | $Ar_3$ |
| K20 | 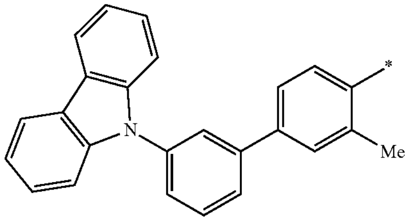 [SMILES: *c1ccc(-c2cccc(-n3c4ccccc4c4ccccc43)c2)cc1C] | 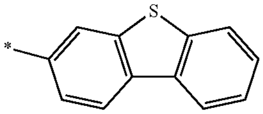 | 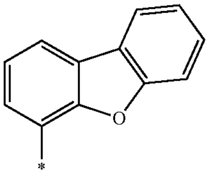 |
| K21 | 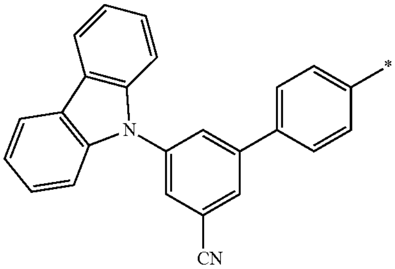 [SMILES: *c1ccc(-c2cc(C#N)cc(-n3c4ccccc4c4ccccc43)c2)cc1] | 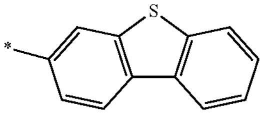 | 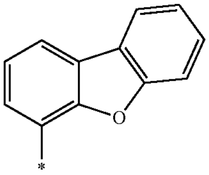 |
| M1 | 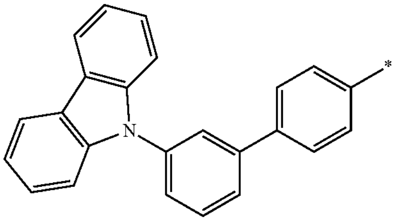 [SMILES: *c1ccc(-c2cccc(-n3c4ccccc4c4ccccc43)c2)cc1] | 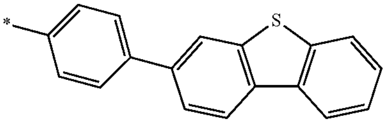 [SMILES: *c1ccc(-c2ccc3c(c2)sc2ccccc23)cc1] | 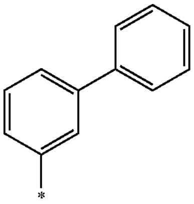 [SMILES: *c1cccc(-c2ccccc2)c1] |
| M2 | 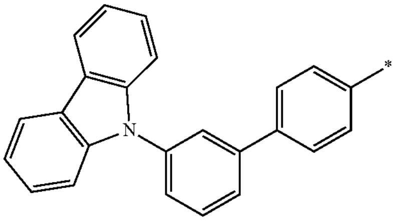 [SMILES: *c1ccc(-c2cccc(-n3c4ccccc4c4ccccc43)c2)cc1] | 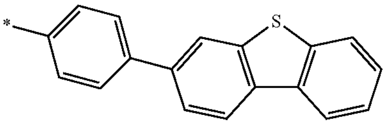 [SMILES: *c1ccc(-c2ccc3c(c2)sc2ccccc23)cc1] | 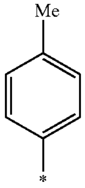 [SMILES: *c1ccc(C)cc1] |
| M3 | 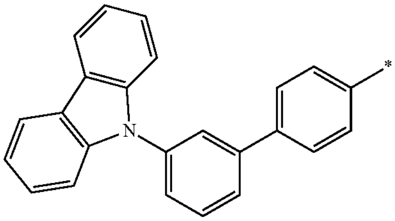 [SMILES: *c1ccc(-c2cccc(-n3c4ccccc4c4ccccc43)c2)cc1] | 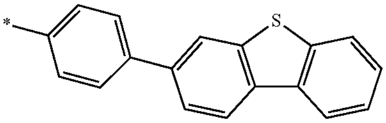 [SMILES: *c1ccc(-c2ccc3c(c2)sc2ccccc23)cc1] | 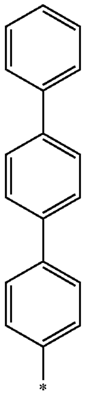 [SMILES: *c1ccc(-c2ccc(-c3ccccc3)cc2)cc1] |

-continued
Compound Group 1
| Formula 1 | $Ar_1$ | $Ar_2$ | $Ar_3$ |
|---|---|---|---|
| M4 | 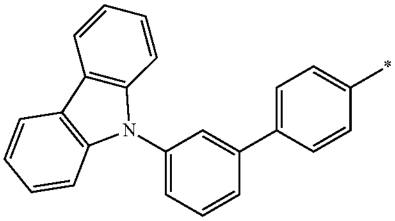 [SMILES: *c1ccc(-c2cccc(-n3c4ccccc4c4ccccc43)c2)cc1] | 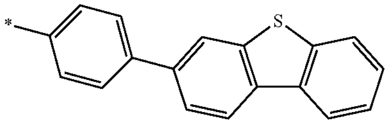 [SMILES: *c1ccc(-c2ccc3c(c2)sc2ccccc23)cc1] | 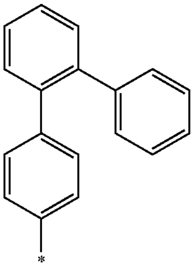 [SMILES: *c1ccc(-c2ccccc2-c2ccccc2)cc1] |
| M5 | 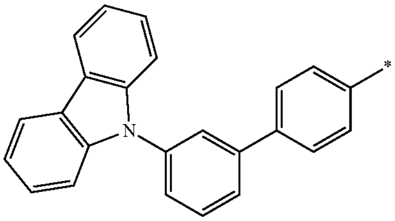 [SMILES: *c1ccc(-c2cccc(-n3c4ccccc4c4ccccc43)c2)cc1] | 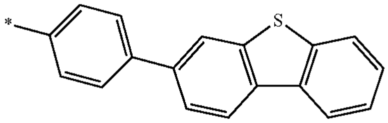 [SMILES: *c1ccc(-c2ccc3c(c2)sc2ccccc23)cc1] | 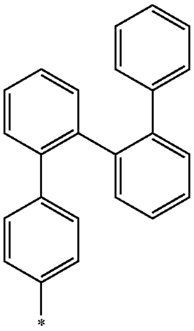 [SMILES: *c1ccc(-c2ccccc2-c2ccccc2-c2ccccc2)cc1] |
| M6 | 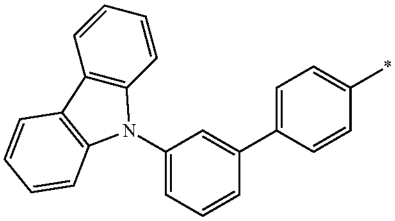 [SMILES: *c1ccc(-c2cccc(-n3c4ccccc4c4ccccc43)c2)cc1] | 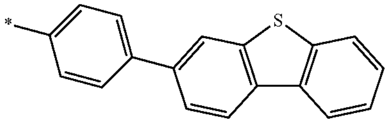 [SMILES: *c1ccc(-c2ccc3c(c2)sc2ccccc23)cc1] | 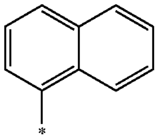 [SMILES: *c1cccc2ccccc12] |
| M7 | 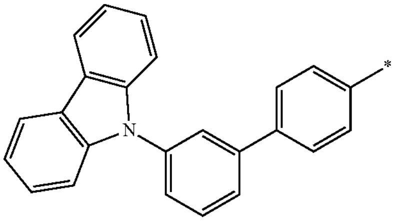 [SMILES: *c1ccc(-c2cccc(-n3c4ccccc4c4ccccc43)c2)cc1] | 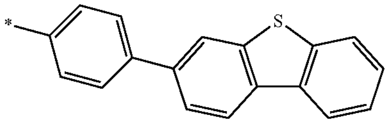 [SMILES: *c1ccc(-c2ccc3c(c2)sc2ccccc23)cc1] | 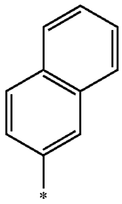 [SMILES: *c1ccc2ccccc2c1] |
| M8 | 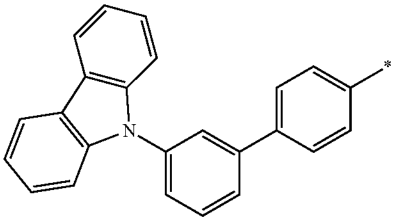 [SMILES: *c1ccc(-c2cccc(-n3c4ccccc4c4ccccc43)c2)cc1] | 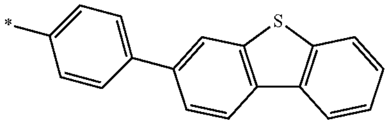 [SMILES: *c1ccc(-c2ccc3c(c2)sc2ccccc23)cc1] | 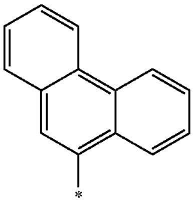 [SMILES: *c1cc2ccccc2c2ccccc12] |

-continued
Compound Group 1
| Formula 1 | $Ar_1$ | $Ar_2$ | $Ar_3$ |
|---|---|---|---|
| M9 | 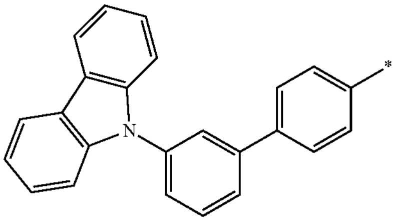 [SMILES: *c1ccc(-c2cccc(-n3c4ccccc4c4ccccc43)c2)cc1] | 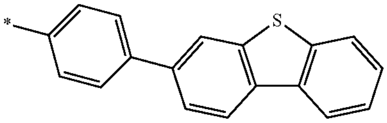 [SMILES: *c1ccc(-c2ccc3c(c2)sc2ccccc23)cc1] | 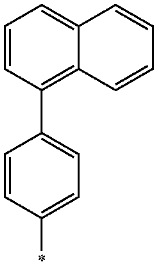 [SMILES: *c1ccc(-c2cccc3ccccc23)cc1] |
| M10 | 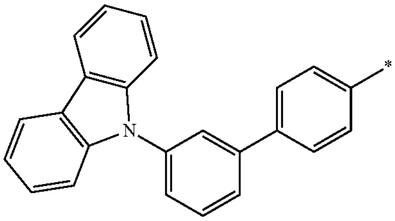 [SMILES: *c1ccc(-c2cccc(-n3c4ccccc4c4ccccc43)c2)cc1] | 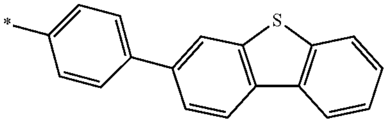 [SMILES: *c1ccc(-c2ccc3c(c2)sc2ccccc23)cc1] | 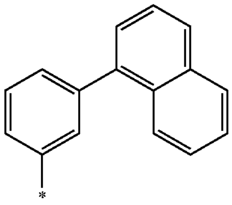 [SMILES: *c1cccc(-c2cccc3ccccc23)c1] |
| M11 | 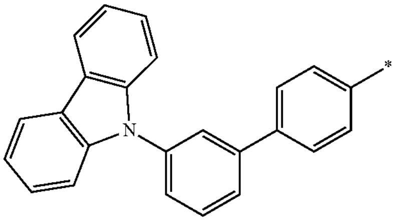 [SMILES: *c1ccc(-c2cccc(-n3c4ccccc4c4ccccc43)c2)cc1] | 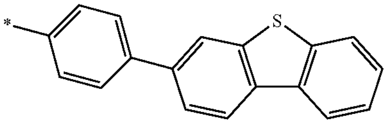 [SMILES: *c1ccc(-c2ccc3c(c2)sc2ccccc23)cc1] | 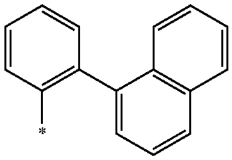 [SMILES: *c1ccccc1-c1cccc2ccccc12] |
| M12 | 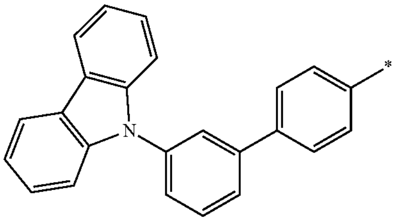 [SMILES: *c1ccc(-c2cccc(-n3c4ccccc4c4ccccc43)c2)cc1] | 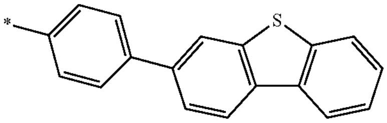 [SMILES: *c1ccc(-c2ccc3c(c2)sc2ccccc23)cc1] | 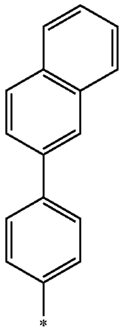 [SMILES: *c1ccc(-c2ccc3ccccc3c2)cc1] |
| M13 | 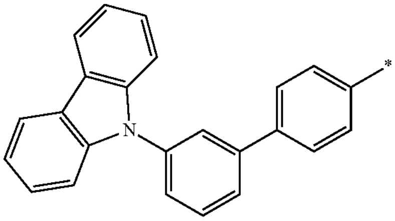 [SMILES: *c1ccc(-c2cccc(-n3c4ccccc4c4ccccc43)c2)cc1] | 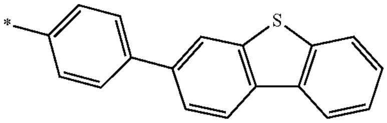 [SMILES: *c1ccc(-c2ccc3c(c2)sc2ccccc23)cc1] | 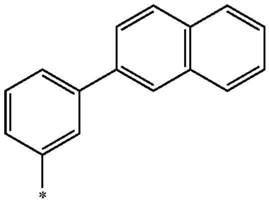 [SMILES: *c1cccc(-c2ccc3ccccc3c2)c1] |

-continued
| Compound Group 1 | | | |
|---|---|---|---|
| Formula 1 | $Ar_1$ | $Ar_2$ | $Ar_3$ |
| M14 | 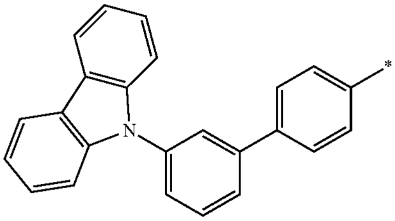 [SMILES: *c1ccc(-c2cccc(-n3c4ccccc4c4ccccc43)c2)cc1] | 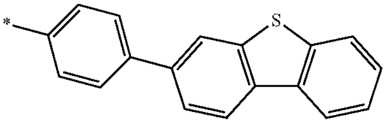 [SMILES: *c1ccc(-c2ccc3c(c2)sc2ccccc23)cc1] | 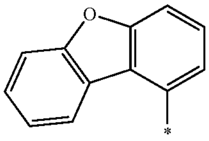 |
| M15 | 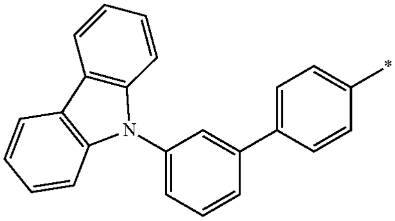 [SMILES: *c1ccc(-c2cccc(-n3c4ccccc4c4ccccc43)c2)cc1] | 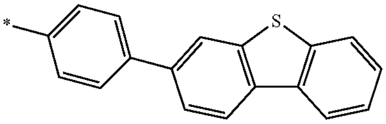 [SMILES: *c1ccc(-c2ccc3c(c2)sc2ccccc23)cc1] | 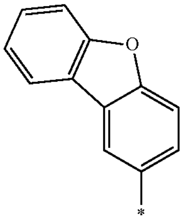 [SMILES: *c1ccc2oc3ccccc3c2c1] |
| M16 | 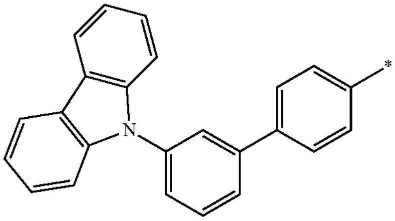 [SMILES: *c1ccc(-c2cccc(-n3c4ccccc4c4ccccc43)c2)cc1] | 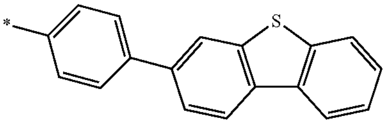 [SMILES: *c1ccc(-c2ccc3c(c2)sc2ccccc23)cc1] | 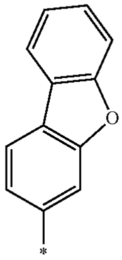 [SMILES: *c1ccc2c(c1)oc1ccccc12] |
| M17 | 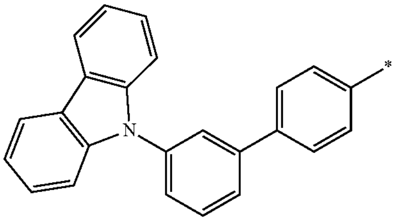 [SMILES: *c1ccc(-c2cccc(-n3c4ccccc4c4ccccc43)c2)cc1] | 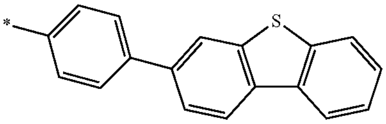 [SMILES: *c1ccc(-c2ccc3c(c2)sc2ccccc23)cc1] | 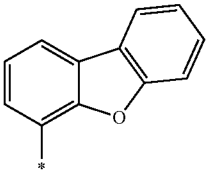 |
| M18 | 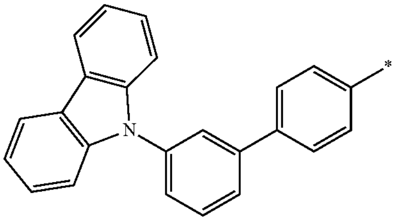 [SMILES: *c1ccc(-c2cccc(-n3c4ccccc4c4ccccc43)c2)cc1] | 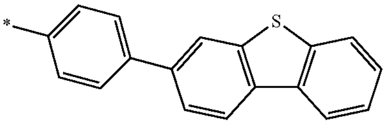 [SMILES: *c1ccc(-c2ccc3c(c2)sc2ccccc23)cc1] | 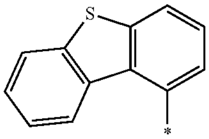 |
| M19 | 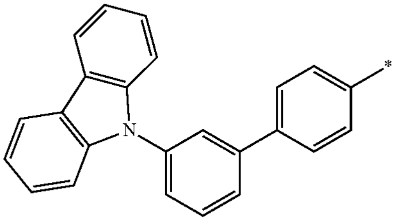 [SMILES: *c1ccc(-c2cccc(-n3c4ccccc4c4ccccc43)c2)cc1] | 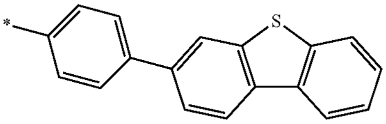 [SMILES: *c1ccc(-c2ccc3c(c2)sc2ccccc23)cc1] | 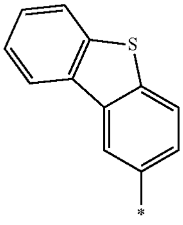 |

-continued
| Compound Group 1 | | | |
|---|---|---|---|
| Formula 1 | $Ar_1$ | $Ar_2$ | $Ar_3$ |
| M20 | 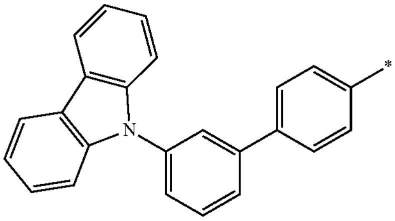 [SMILES: *c1ccc(-c2cccc(-n3c4ccccc4c4ccccc43)c2)cc1] | 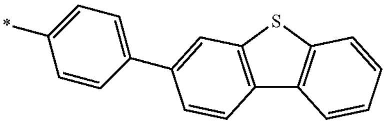 [SMILES: *c1ccc(-c2ccc3c(c2)sc2ccccc23)cc1] | 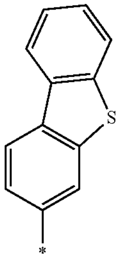 |
| M21 | 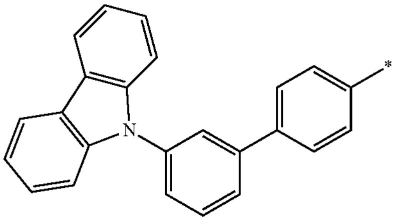 [SMILES: *c1ccc(-c2cccc(-n3c4ccccc4c4ccccc43)c2)cc1] | 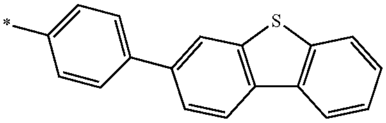 [SMILES: *c1ccc(-c2ccc3c(c2)sc2ccccc23)cc1] | 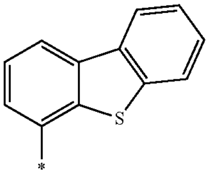 |
| M22 | 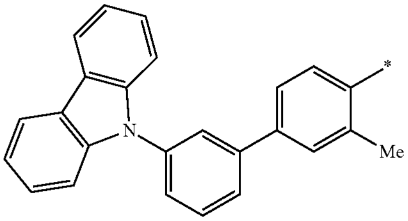 [SMILES: *c1ccc(-c2cccc(-n3c4ccccc4c4ccccc43)c2)cc1C] | 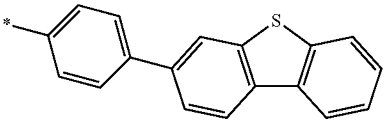 [SMILES: *c1ccc(-c2ccc3c(c2)sc2ccccc23)cc1] | 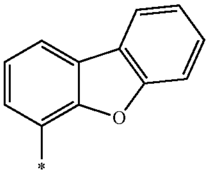 |
| M23 | 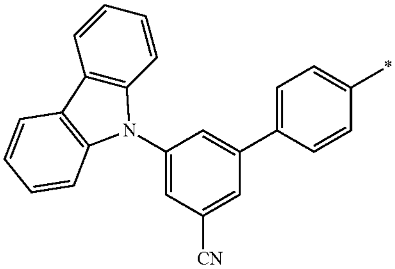 [SMILES: *c1ccc(-c2cc(C#N)cc(-n3c4ccccc4c4ccccc43)c2)cc1] | 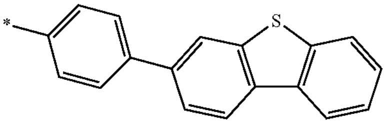 [SMILES: *c1ccc(-c2ccc3c(c2)sc2ccccc23)cc1] | 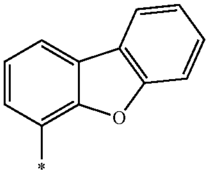 |
| N1 | 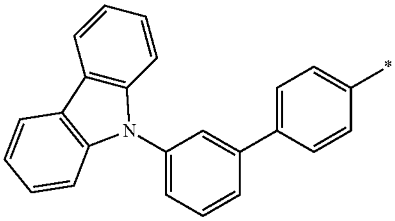 [SMILES: *c1ccc(-c2cccc(-n3c4ccccc4c4ccccc43)c2)cc1] | 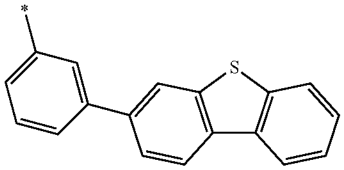 [SMILES: *c1cccc(-c2ccc3c(c2)sc2ccccc23)c1] | 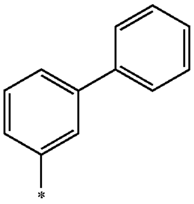 [SMILES: *c1cccc(-c2ccccc2)c1] |
| N2 | 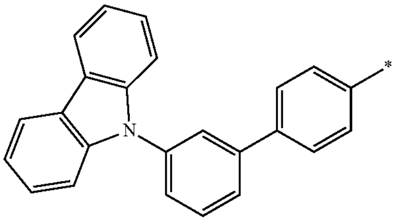 [SMILES: *c1ccc(-c2cccc(-n3c4ccccc4c4ccccc43)c2)cc1] | 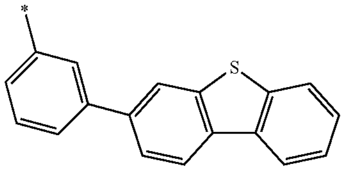 [SMILES: *c1cccc(-c2ccc3c(c2)sc2ccccc23)c1] | 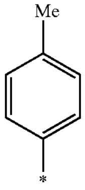 [SMILES: *c1ccc(C)cc1] |

-continued
Compound Group 1
| Formula 1 | $Ar_1$ | $Ar_2$ | $Ar_3$ |
|---|---|---|---|
| N3 | 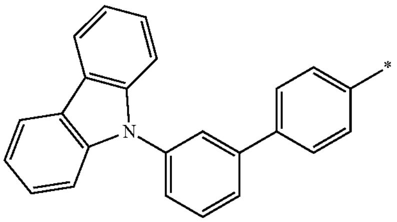 [SMILES: *c1ccc(-c2cccc(-n3c4ccccc4c4ccccc43)c2)cc1] | 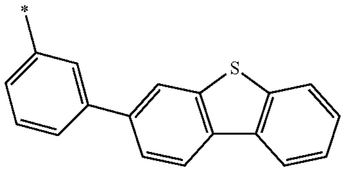 [SMILES: *c1cccc(-c2ccc3c(c2)sc2ccccc23)c1] | 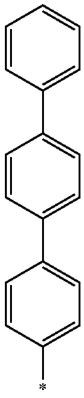 [SMILES: *c1ccc(-c2ccc(-c3ccccc3)cc2)cc1] |
| N4 | 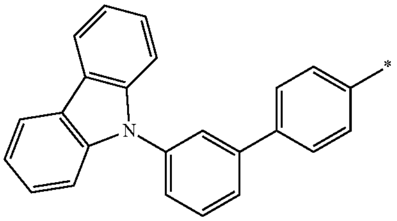 [SMILES: *c1ccc(-c2cccc(-n3c4ccccc4c4ccccc43)c2)cc1] | 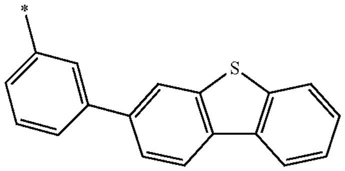 [SMILES: *c1cccc(-c2ccc3c(c2)sc2ccccc23)c1] | 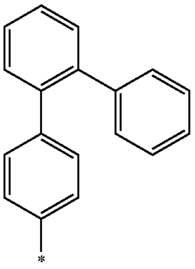 [SMILES: *c1ccc(-c2ccccc2-c2ccccc2)cc1] |
| N5 | 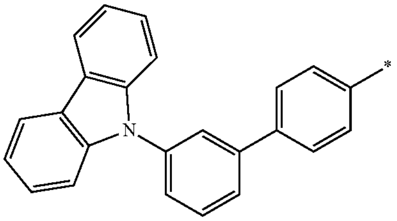 [SMILES: *c1ccc(-c2cccc(-n3c4ccccc4c4ccccc43)c2)cc1] | 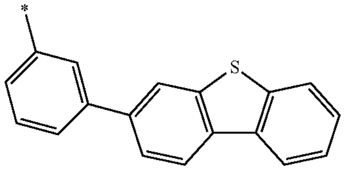 [SMILES: *c1cccc(-c2ccc3c(c2)sc2ccccc23)c1] | 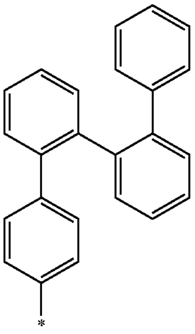 [SMILES: *c1ccc(-c2ccccc2-c2ccccc2-c2ccccc2)cc1] |
| N6 | 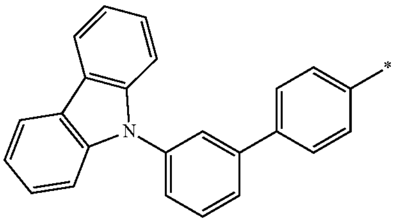 [SMILES: *c1ccc(-c2cccc(-n3c4ccccc4c4ccccc43)c2)cc1] | 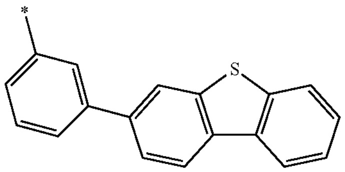 [SMILES: *c1cccc(-c2ccc3c(c2)sc2ccccc23)c1] | 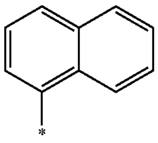 [SMILES: *c1cccc2ccccc12] |
| N7 | 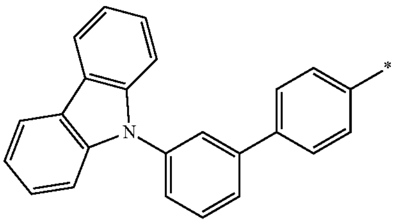 [SMILES: *c1ccc(-c2cccc(-n3c4ccccc4c4ccccc43)c2)cc1] | 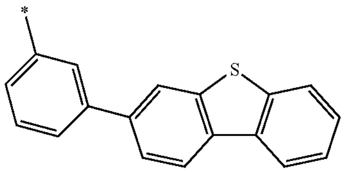 [SMILES: *c1cccc(-c2ccc3c(c2)sc2ccccc23)c1] | 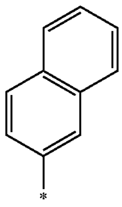 [SMILES: *c1ccc2ccccc2c1] |

-continued
Compound Group 1
| Formula 1 | $Ar_1$ | $Ar_2$ | $Ar_3$ |
|---|---|---|---|
| N8 | 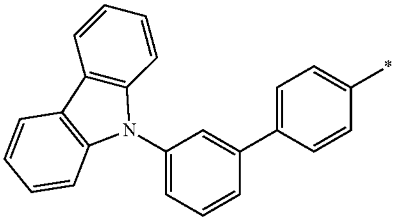 [SMILES: *c1ccc(-c2cccc(-n3c4ccccc4c4ccccc43)c2)cc1] | 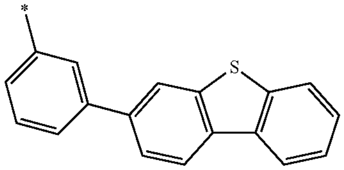 [SMILES: *c1cccc(-c2ccc3c(c2)sc2ccccc23)c1] | 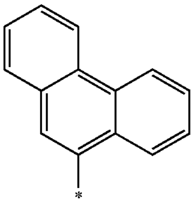 [SMILES: *c1cc2ccccc2c2ccccc12] |
| N9 | 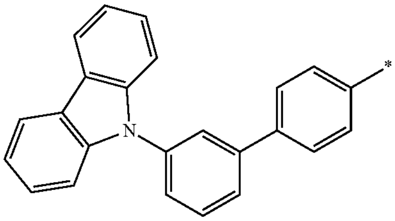 [SMILES: *c1ccc(-c2cccc(-n3c4ccccc4c4ccccc43)c2)cc1] | 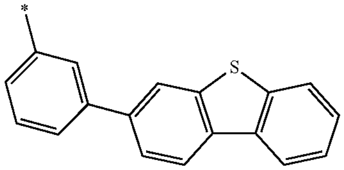 [SMILES: *c1cccc(-c2ccc3c(c2)sc2ccccc23)c1] | 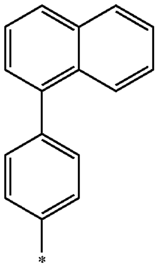 [SMILES: *c1ccc(-c2cccc3ccccc23)cc1] |
| N10 | 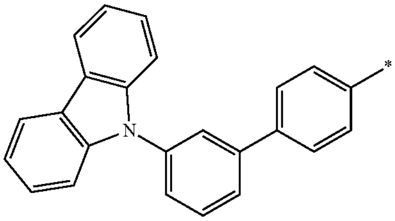 [SMILES: *c1ccc(-c2cccc(-n3c4ccccc4c4ccccc43)c2)cc1] | 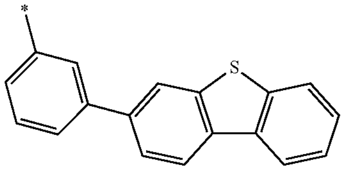 [SMILES: *c1cccc(-c2ccc3c(c2)sc2ccccc23)c1] | 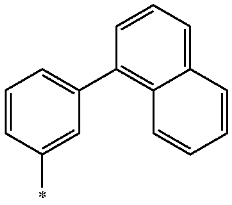 [SMILES: *c1cccc(-c2cccc3ccccc23)c1] |
| N11 | 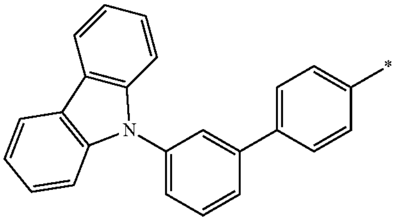 [SMILES: *c1ccc(-c2cccc(-n3c4ccccc4c4ccccc43)c2)cc1] | 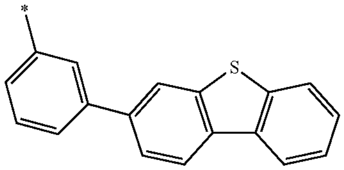 [SMILES: *c1cccc(-c2ccc3c(c2)sc2ccccc23)c1] | 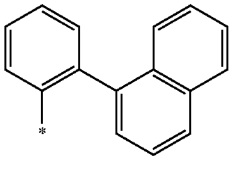 [SMILES: *c1ccccc1-c1cccc2ccccc12] |
| N12 | 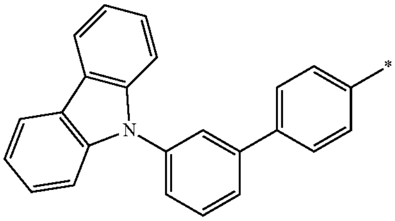 [SMILES: *c1ccc(-c2cccc(-n3c4ccccc4c4ccccc43)c2)cc1] | 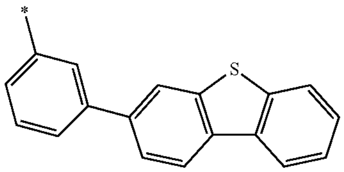 [SMILES: *c1cccc(-c2ccc3c(c2)sc2ccccc23)c1] | 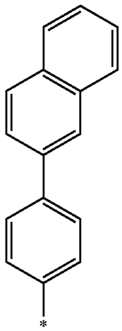 [SMILES: *c1ccc(-c2ccc3ccccc3c2)cc1] |

-continued
Compound Group 1
| Formula 1 | $Ar_1$ | $Ar_2$ | $Ar_3$ |
| --- | --- | --- | --- |
| N13 | 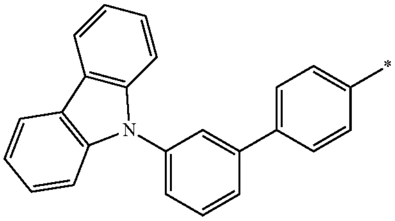 [SMILES: *c1ccc(-c2cccc(-n3c4ccccc4c4ccccc43)c2)cc1] | 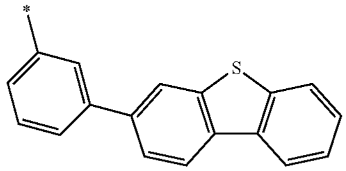 [SMILES: *c1cccc(-c2ccc3c(c2)sc2ccccc23)c1] | 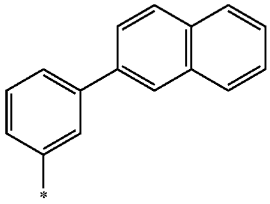 [SMILES: *c1cccc(-c2ccc3ccccc3c2)c1] |
| N14 | 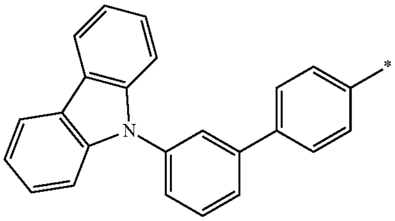 [SMILES: *c1ccc(-c2cccc(-n3c4ccccc4c4ccccc43)c2)cc1] | 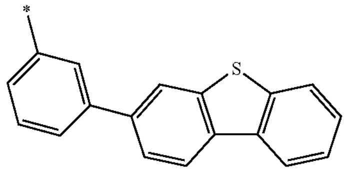 [SMILES: *c1cccc(-c2ccc3c(c2)sc2ccccc23)c1] | 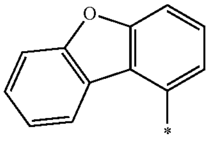 |
| N15 | 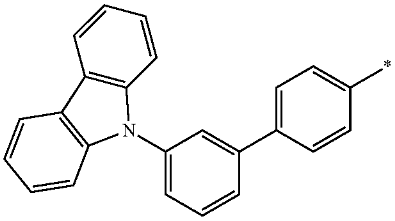 [SMILES: *c1ccc(-c2cccc(-n3c4ccccc4c4ccccc43)c2)cc1] | 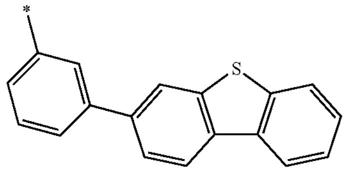 [SMILES: *c1cccc(-c2ccc3c(c2)sc2ccccc23)c1] | 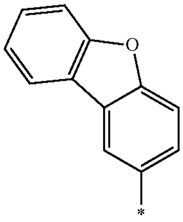 |
| N16 | 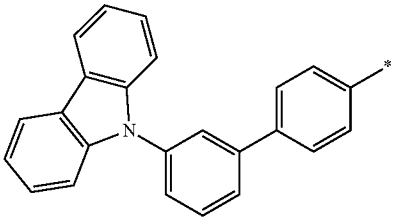 [SMILES: *c1ccc(-c2cccc(-n3c4ccccc4c4ccccc43)c2)cc1] | 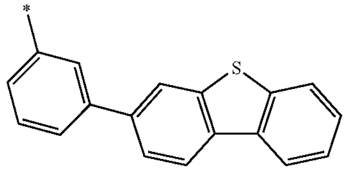 [SMILES: *c1cccc(-c2ccc3c(c2)sc2ccccc23)c1] | 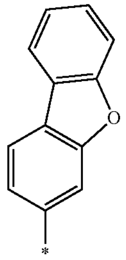 [SMILES: *c1ccc2c(c1)oc1ccccc12] |
| N17 | 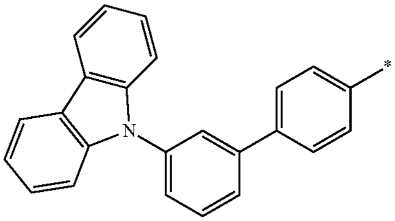 [SMILES: *c1ccc(-c2cccc(-n3c4ccccc4c4ccccc43)c2)cc1] | 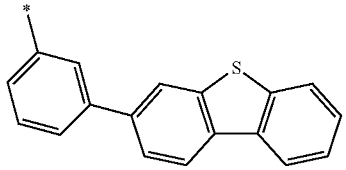 [SMILES: *c1cccc(-c2ccc3c(c2)sc2ccccc23)c1] | 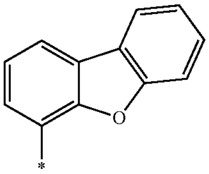 |
| N18 | 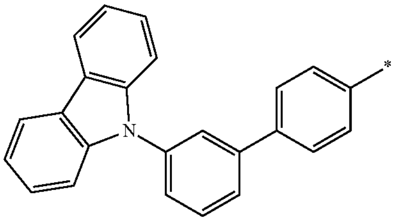 [SMILES: *c1ccc(-c2cccc(-n3c4ccccc4c4ccccc43)c2)cc1] | 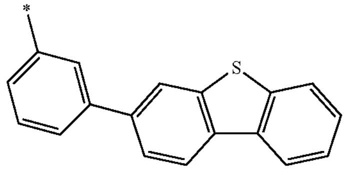 [SMILES: *c1cccc(-c2ccc3c(c2)sc2ccccc23)c1] | 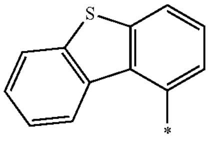 |

-continued
| Compound Group 1 | | | |
|---|---|---|---|
| Formula 1 | $Ar_1$ | $Ar_2$ | $Ar_3$ |
| N19 | 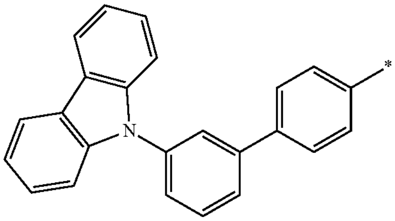 [SMILES: *c1ccc(-c2cccc(-n3c4ccccc4c4ccccc43)c2)cc1] | 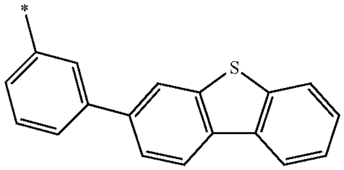 [SMILES: *c1cccc(-c2ccc3c(c2)sc2ccccc23)c1] | 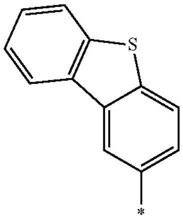 |
| N20 | 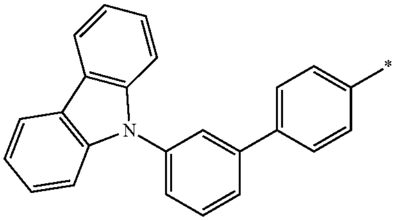 [SMILES: *c1ccc(-c2cccc(-n3c4ccccc4c4ccccc43)c2)cc1] | 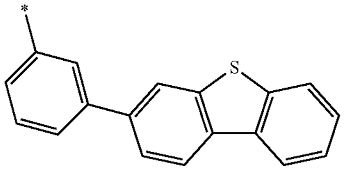 [SMILES: *c1cccc(-c2ccc3c(c2)sc2ccccc23)c1] | 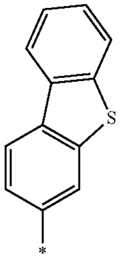 [SMILES: *c1ccc2c(c1)sc1ccccc12] |
| N21 | 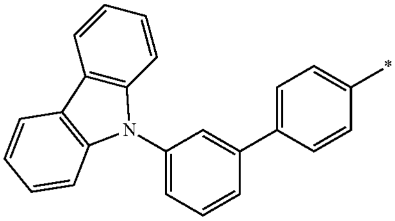 [SMILES: *c1ccc(-c2cccc(-n3c4ccccc4c4ccccc43)c2)cc1] | 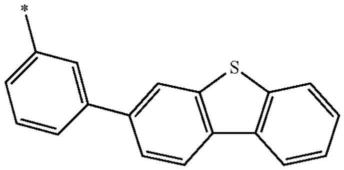 [SMILES: *c1cccc(-c2ccc3c(c2)sc2ccccc23)c1] | 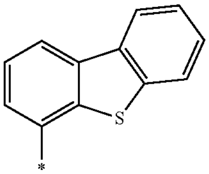 |
| N22 | 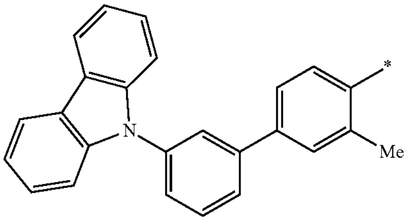 [SMILES: *c1ccc(-c2cccc(-n3c4ccccc4c4ccccc43)c2)cc1C] | 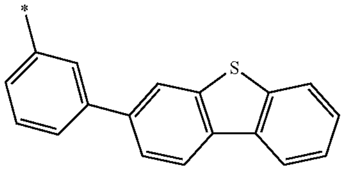 [SMILES: *c1cccc(-c2ccc3c(c2)sc2ccccc23)c1] | 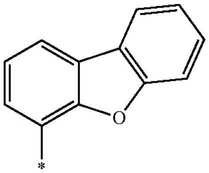 |
| N23 | 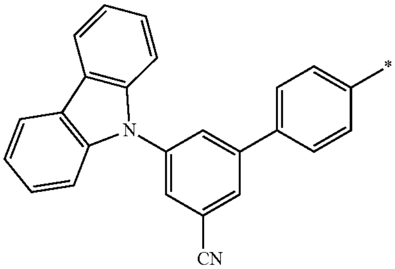 [SMILES: *c1ccc(-c2cc(C#N)cc(-n3c4ccccc4c4ccccc43)c2)cc1] | 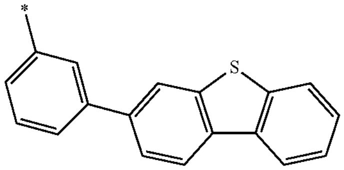 [SMILES: *c1cccc(-c2ccc3c(c2)sc2ccccc23)c1] | 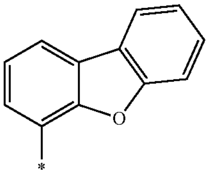 |
| O1 | 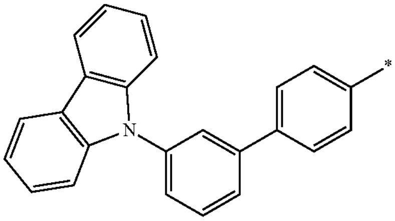 [SMILES: *c1ccc(-c2cccc(-n3c4ccccc4c4ccccc43)c2)cc1] | 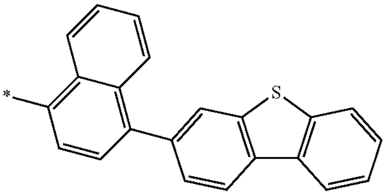 [SMILES: *c1ccc(-c2ccc3c(c2)sc2ccccc23)c2ccccc12] | 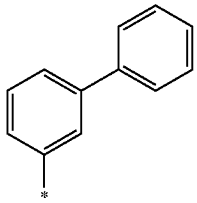 [SMILES: *c1cccc(-c2ccccc2)c1] |

-continued
| Compound Group 1 | | | |
|---|---|---|---|
| Formula 1 | $Ar_1$ | $Ar_2$ | $Ar_3$ |
| O2 | 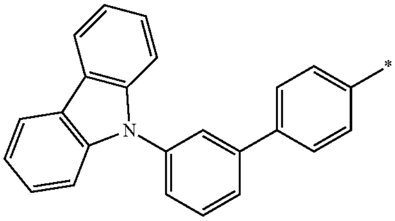 [SMILES: *c1ccc(-c2cccc(-n3c4ccccc4c4ccccc43)c2)cc1] | 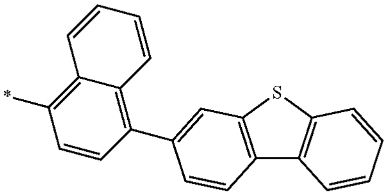 [SMILES: *c1ccc(-c2ccc3c(c2)sc2ccccc23)c2ccccc12] | 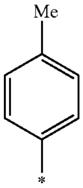 [SMILES: *c1ccc(C)cc1] |
| O3 | 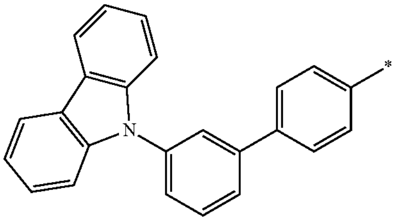 [SMILES: *c1ccc(-c2cccc(-n3c4ccccc4c4ccccc43)c2)cc1] | 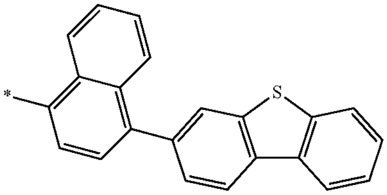 [SMILES: *c1ccc(-c2ccc3c(c2)sc2ccccc23)c2ccccc12] | 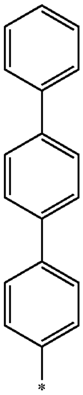 [SMILES: *c1ccc(-c2ccc(-c3ccccc3)cc2)cc1] |
| O4 | 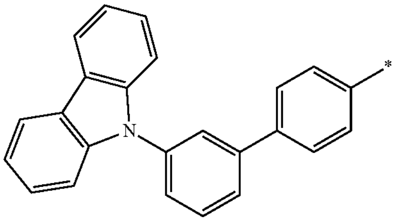 [SMILES: *c1ccc(-c2cccc(-n3c4ccccc4c4ccccc43)c2)cc1] | 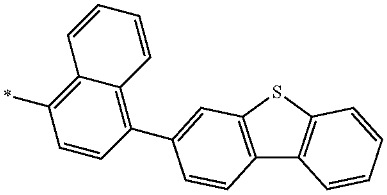 [SMILES: *c1ccc(-c2ccc3c(c2)sc2ccccc23)c2ccccc12] | 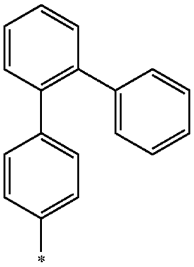 [SMILES: *c1ccc(-c2ccccc2-c2ccccc2)cc1] |
| O5 | 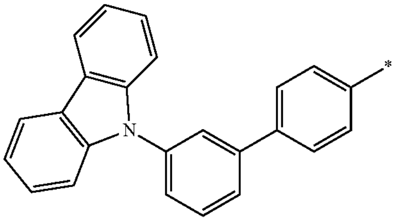 [SMILES: *c1ccc(-c2cccc(-n3c4ccccc4c4ccccc43)c2)cc1] | 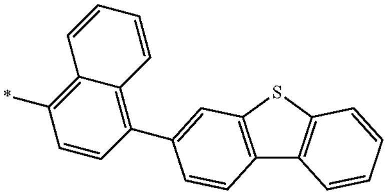 [SMILES: *c1ccc(-c2ccc3c(c2)sc2ccccc23)c2ccccc12] | 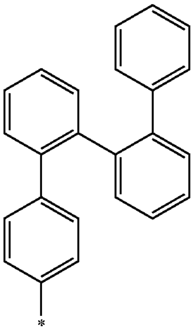 [SMILES: *c1ccc(-c2ccccc2-c2ccccc2-c2ccccc2)cc1] |
| O6 | 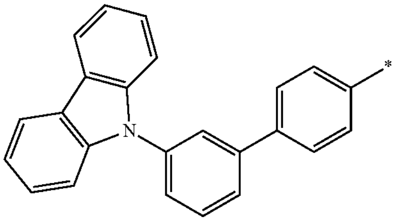 [SMILES: *c1ccc(-c2cccc(-n3c4ccccc4c4ccccc43)c2)cc1] | 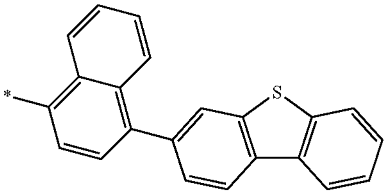 [SMILES: *c1ccc(-c2ccc3c(c2)sc2ccccc23)c2ccccc12] | 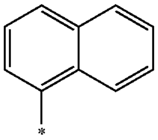 [SMILES: *c1cccc2ccccc12] |

-continued
Compound Group 1
| Formula 1 | $Ar_1$ | $Ar_2$ | $Ar_3$ |
|---|---|---|---|
| O7 | 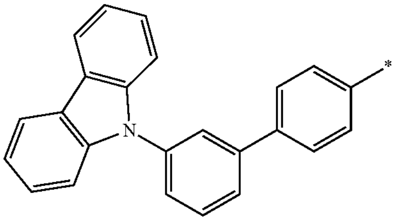 [SMILES: *c1ccc(-c2cccc(-n3c4ccccc4c4ccccc43)c2)cc1] | 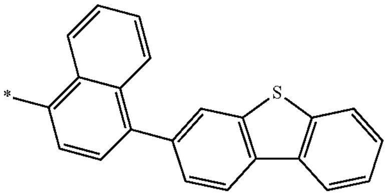 [SMILES: *c1ccc(-c2ccc3c(c2)sc2ccccc23)c2ccccc12] | 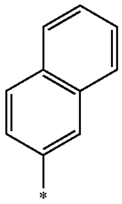 [SMILES: *c1ccc2ccccc2c1] |
| O8 | 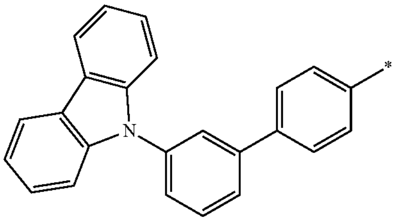 [SMILES: *c1ccc(-c2cccc(-n3c4ccccc4c4ccccc43)c2)cc1] | 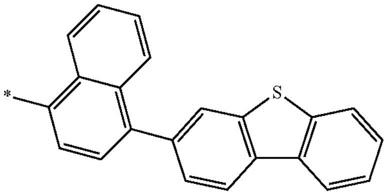 [SMILES: *c1ccc(-c2ccc3c(c2)sc2ccccc23)c2ccccc12] | 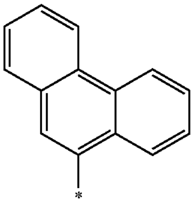 [SMILES: *c1cc2ccccc2c2ccccc12] |
| O9 | 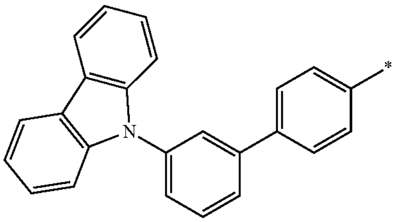 [SMILES: *c1ccc(-c2cccc(-n3c4ccccc4c4ccccc43)c2)cc1] | 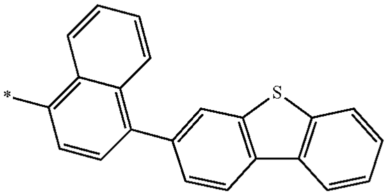 [SMILES: *c1ccc(-c2ccc3c(c2)sc2ccccc23)c2ccccc12] | 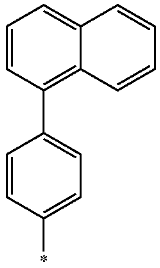 [SMILES: *c1ccc(-c2cccc3ccccc23)cc1] |
| O10 | 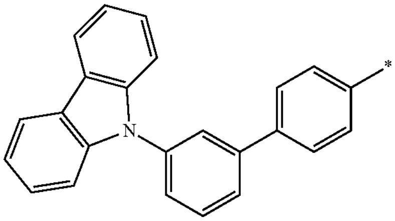 [SMILES: *c1ccc(-c2cccc(-n3c4ccccc4c4ccccc43)c2)cc1] | 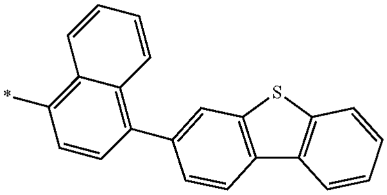 [SMILES: *c1ccc(-c2ccc3c(c2)sc2ccccc23)c2ccccc12] | 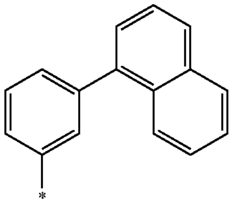 [SMILES: *c1cccc(-c2cccc3ccccc23)c1] |
| O11 | 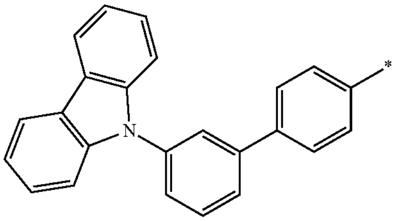 [SMILES: *c1ccc(-c2cccc(-n3c4ccccc4c4ccccc43)c2)cc1] | 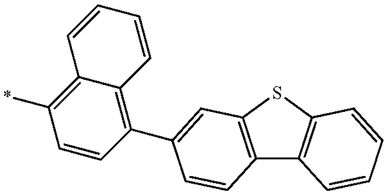 [SMILES: *c1ccc(-c2ccc3c(c2)sc2ccccc23)c2ccccc12] | 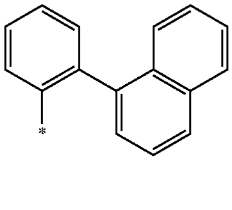 [SMILES: *c1ccccc1-c1cccc2ccccc12] |

-continued
Compound Group 1
| Formula 1 | $Ar_1$ | $Ar_2$ | $Ar_3$ |
| --- | --- | --- | --- |
| O12 | 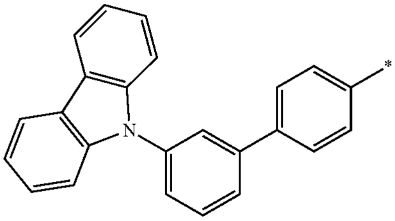 [SMILES: *c1ccc(-c2cccc(-n3c4ccccc4c4ccccc43)c2)cc1] | 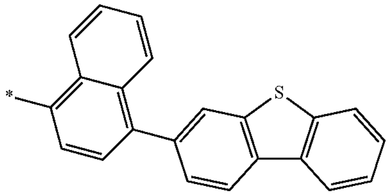 [SMILES: *c1ccc(-c2ccc3c(c2)sc2ccccc23)c2ccccc12] | 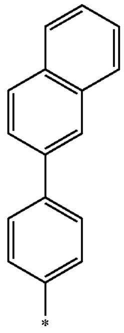 [SMILES: *c1ccc(-c2ccc3ccccc3c2)cc1] |
| O13 | 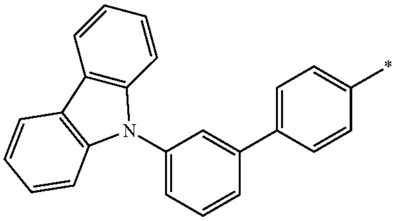 [SMILES: *c1ccc(-c2cccc(-n3c4ccccc4c4ccccc43)c2)cc1] | 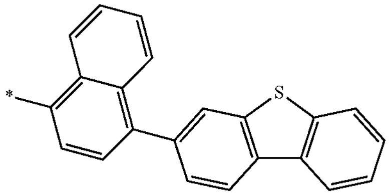 [SMILES: *c1ccc(-c2ccc3c(c2)sc2ccccc23)c2ccccc12] | 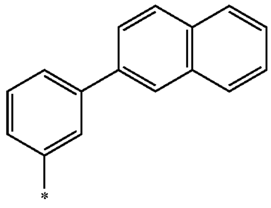 [SMILES: *c1cccc(-c2ccc3ccccc3c2)c1] |
| O14 | 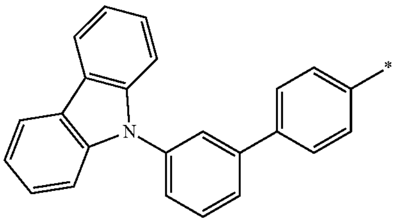 [SMILES: *c1ccc(-c2cccc(-n3c4ccccc4c4ccccc43)c2)cc1] | 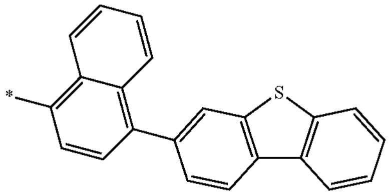 [SMILES: *c1ccc(-c2ccc3c(c2)sc2ccccc23)c2ccccc12] | 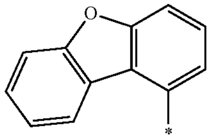 |
| O15 | 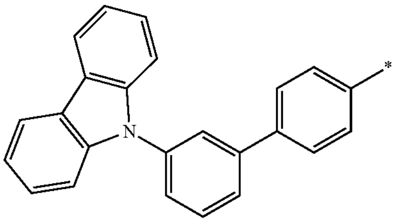 [SMILES: *c1ccc(-c2cccc(-n3c4ccccc4c4ccccc43)c2)cc1] | 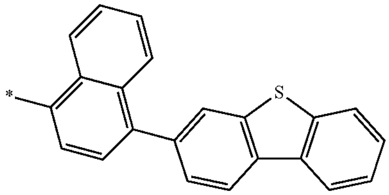 [SMILES: *c1ccc(-c2ccc3c(c2)sc2ccccc23)c2ccccc12] | 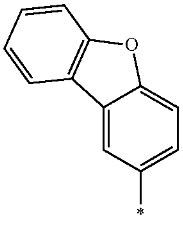 [SMILES: *c1ccc2oc3ccccc3c2c1] |
| O16 | 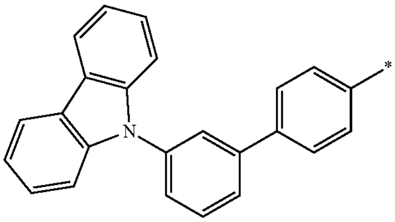 [SMILES: *c1ccc(-c2cccc(-n3c4ccccc4c4ccccc43)c2)cc1] | 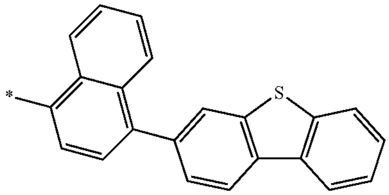 [SMILES: *c1ccc(-c2ccc3c(c2)sc2ccccc23)c2ccccc12] | 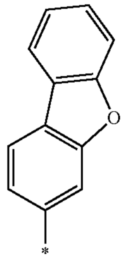 [SMILES: *c1ccc2c(c1)oc1ccccc12] |

-continued
Compound Group 1
| Formula 1 | $Ar_1$ | $Ar_2$ | $Ar_3$ |
|---|---|---|---|
| O17 | 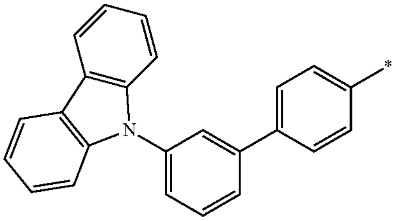 [SMILES: *c1ccc(-c2cccc(-n3c4ccccc4c4ccccc43)c2)cc1] | 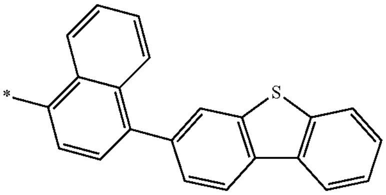 [SMILES: *c1ccc(-c2ccc3c(c2)sc2ccccc23)c2ccccc12] | 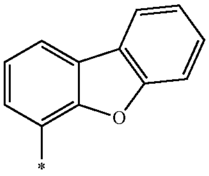 |
| O18 | 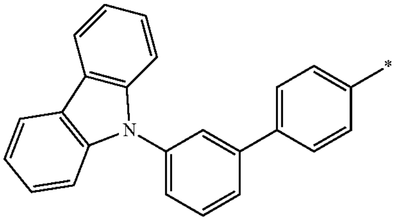 [SMILES: *c1ccc(-c2cccc(-n3c4ccccc4c4ccccc43)c2)cc1] | 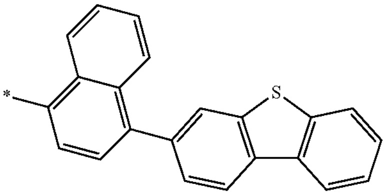 [SMILES: *c1ccc(-c2ccc3c(c2)sc2ccccc23)c2ccccc12] | 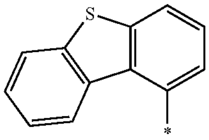 |
| O19 | 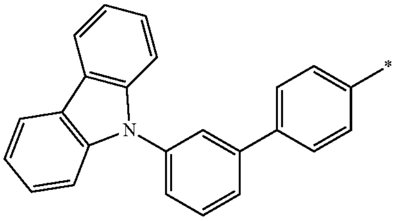 [SMILES: *c1ccc(-c2cccc(-n3c4ccccc4c4ccccc43)c2)cc1] | 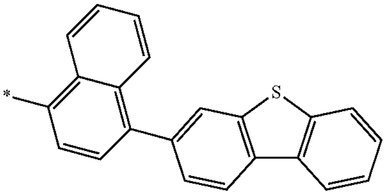 [SMILES: *c1ccc(-c2ccc3c(c2)sc2ccccc23)c2ccccc12] | 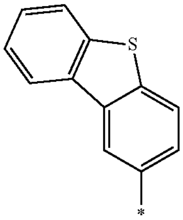 |
| O20 | 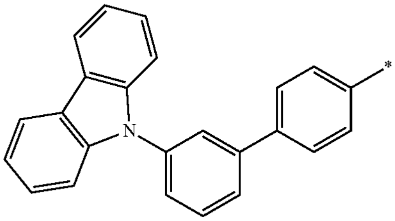 [SMILES: *c1ccc(-c2cccc(-n3c4ccccc4c4ccccc43)c2)cc1] | 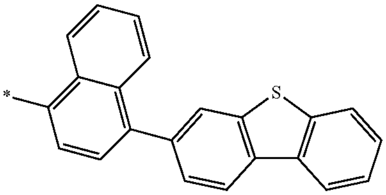 [SMILES: *c1ccc(-c2ccc3c(c2)sc2ccccc23)c2ccccc12] | 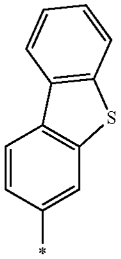 [SMILES: *c1ccc2c(c1)sc1ccccc12] |
| O21 | 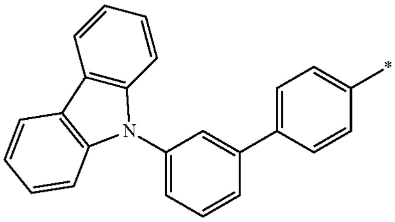 [SMILES: *c1ccc(-c2cccc(-n3c4ccccc4c4ccccc43)c2)cc1] | 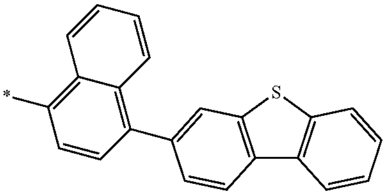 [SMILES: *c1ccc(-c2ccc3c(c2)sc2ccccc23)c2ccccc12] | 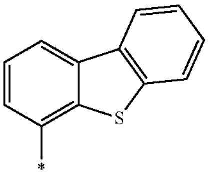 |
| O22 | 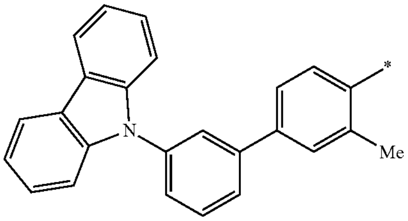 [SMILES: *c1ccc(-c2cccc(-n3c4ccccc4c4ccccc43)c2)cc1C] | 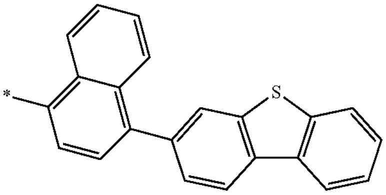 [SMILES: *c1ccc(-c2ccc3c(c2)sc2ccccc23)c2ccccc12] | 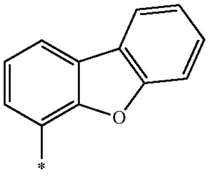 |

-continued
| Compound Group 1 | | | |
|---|---|---|---|
| Formula 1 | $Ar_1$ | $Ar_2$ | $Ar_3$ |
| O23 | 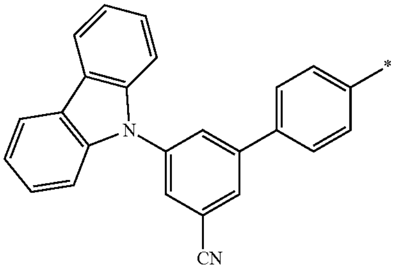 [SMILES: *c1ccc(-c2cc(C#N)cc(-n3c4ccccc4c4ccccc43)c2)cc1] | 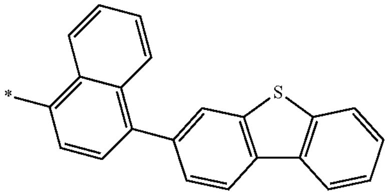 [SMILES: *c1ccc(-c2ccc3c(c2)sc2ccccc23)c2ccccc12] | 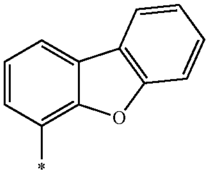 |
| P1 | 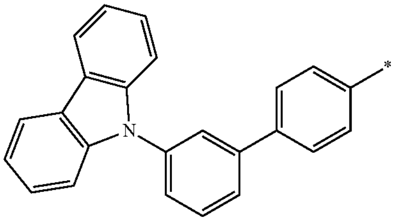 [SMILES: *c1ccc(-c2cccc(-n3c4ccccc4c4ccccc43)c2)cc1] | 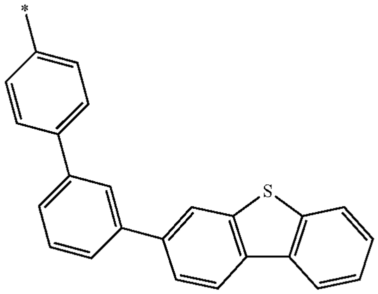 [SMILES: *c1ccc(-c2cccc(-c3ccc4c(c3)sc3ccccc34)c2)cc1] | 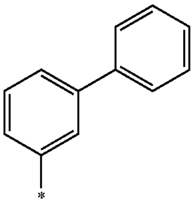 [SMILES: *c1cccc(-c2ccccc2)c1] |
| P2 | 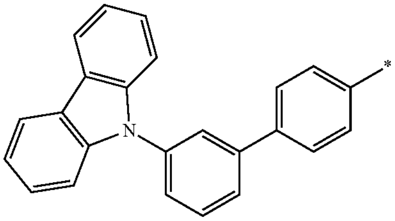 [SMILES: *c1ccc(-c2cccc(-n3c4ccccc4c4ccccc43)c2)cc1] | 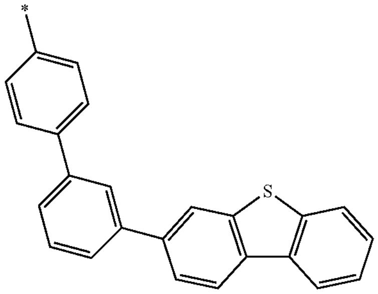 [SMILES: *c1ccc(-c2cccc(-c3ccc4c(c3)sc3ccccc34)c2)cc1] | 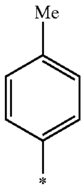 [SMILES: *c1ccc(C)cc1] |
| P3 | 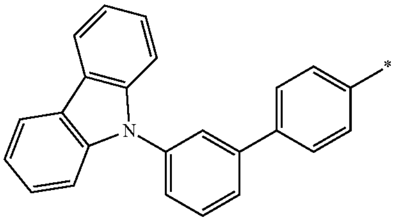 [SMILES: *c1ccc(-c2cccc(-n3c4ccccc4c4ccccc43)c2)cc1] | 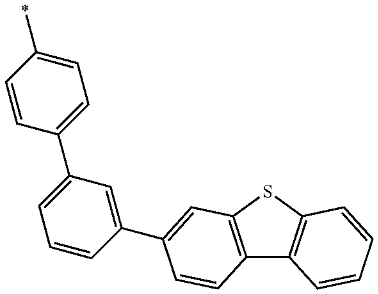 [SMILES: *c1ccc(-c2cccc(-c3ccc4c(c3)sc3ccccc34)c2)cc1] | 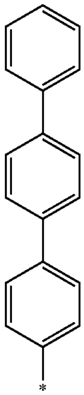 [SMILES: *c1ccc(-c2ccc(-c3ccccc3)cc2)cc1] |

-continued
| Compound Group 1 | | | |
|---|---|---|---|
| Formula 1 | $Ar_1$ | $Ar_2$ | $Ar_3$ |
| P4 | 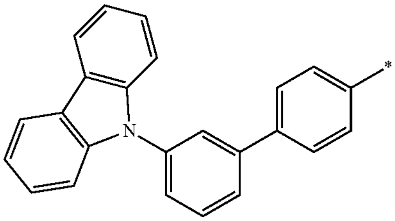 [SMILES: *c1ccc(-c2cccc(-n3c4ccccc4c4ccccc43)c2)cc1] | 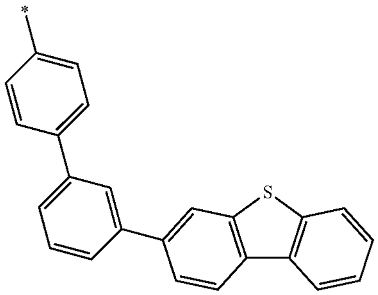 [SMILES: *c1ccc(-c2cccc(-c3ccc4c(c3)sc3ccccc34)c2)cc1] | 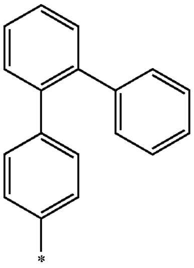 [SMILES: *c1ccc(-c2ccccc2-c2ccccc2)cc1] |
| P5 | 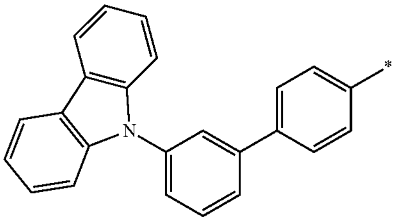 [SMILES: *c1ccc(-c2cccc(-n3c4ccccc4c4ccccc43)c2)cc1] | 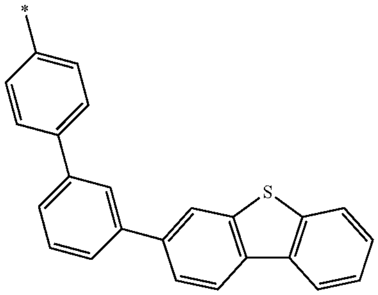 [SMILES: *c1ccc(-c2cccc(-c3ccc4c(c3)sc3ccccc34)c2)cc1] | 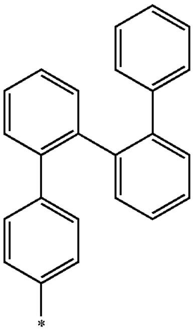 [SMILES: *c1ccc(-c2ccccc2-c2ccccc2-c2ccccc2)cc1] |
| P6 | 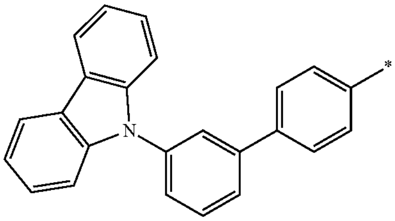 [SMILES: *c1ccc(-c2cccc(-n3c4ccccc4c4ccccc43)c2)cc1] | 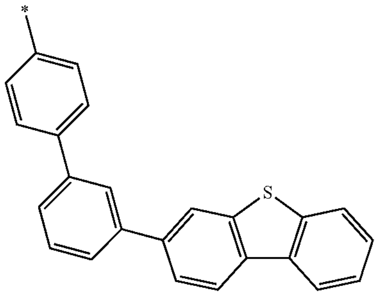 [SMILES: *c1ccc(-c2cccc(-c3ccc4c(c3)sc3ccccc34)c2)cc1] | 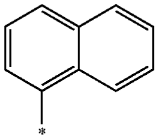 [SMILES: *c1cccc2ccccc12] |
| P7 | 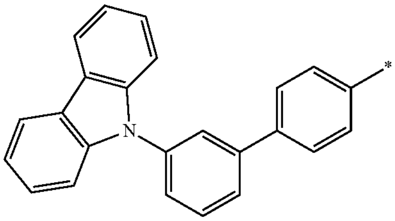 [SMILES: *c1ccc(-c2cccc(-n3c4ccccc4c4ccccc43)c2)cc1] | 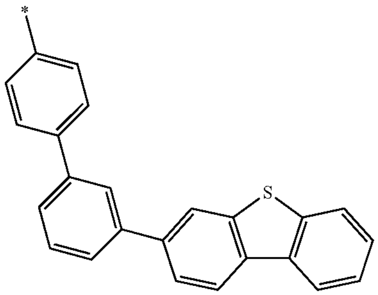 [SMILES: *c1ccc(-c2cccc(-c3ccc4c(c3)sc3ccccc34)c2)cc1] | 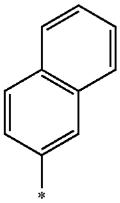 [SMILES: *c1ccc2ccccc2c1] |

-continued
| Compound Group 1 | | | |
|---|---|---|---|
| Formula 1 | $Ar_1$ | $Ar_2$ | $Ar_3$ |
| P8 | 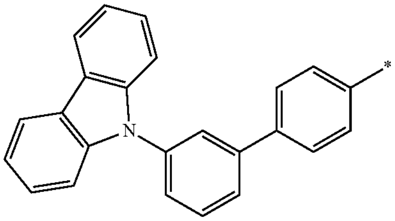 [SMILES: *c1ccc(-c2cccc(-n3c4ccccc4c4ccccc43)c2)cc1] | 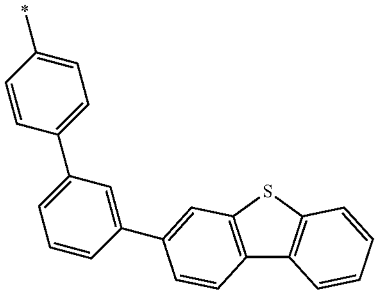 [SMILES: *c1ccc(-c2cccc(-c3ccc4c(c3)sc3ccccc34)c2)cc1] | 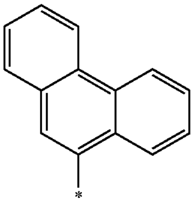 [SMILES: *c1cc2ccccc2c2ccccc12] |
| P9 | 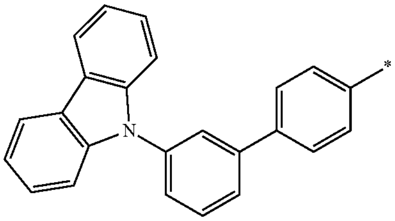 [SMILES: *c1ccc(-c2cccc(-n3c4ccccc4c4ccccc43)c2)cc1] | 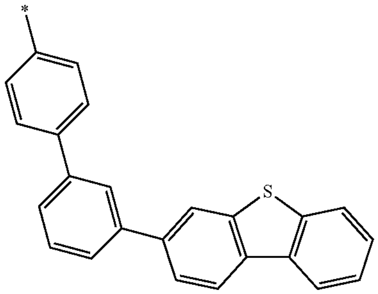 [SMILES: *c1ccc(-c2cccc(-c3ccc4c(c3)sc3ccccc34)c2)cc1] | 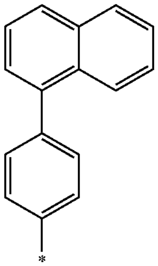 [SMILES: *c1ccc(-c2cccc3ccccc23)cc1] |
| P10 | 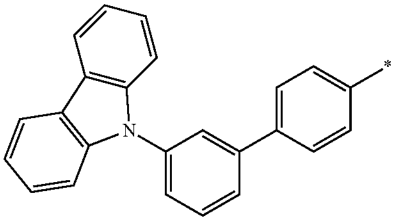 [SMILES: *c1ccc(-c2cccc(-n3c4ccccc4c4ccccc43)c2)cc1] | 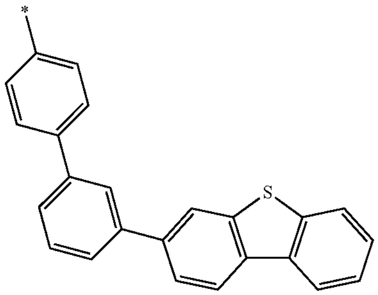 [SMILES: *c1ccc(-c2cccc(-c3ccc4c(c3)sc3ccccc34)c2)cc1] | 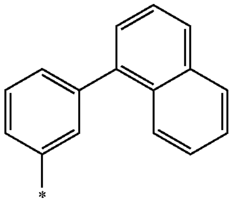 [SMILES: *c1cccc(-c2cccc3ccccc23)c1] |
| P11 | 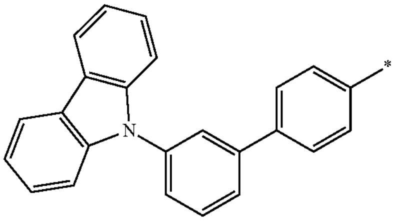 [SMILES: *c1ccc(-c2cccc(-n3c4ccccc4c4ccccc43)c2)cc1] | 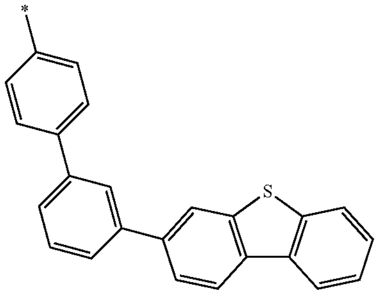 [SMILES: *c1ccc(-c2cccc(-c3ccc4c(c3)sc3ccccc34)c2)cc1] | 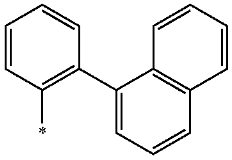 [SMILES: *c1ccccc1-c1cccc2ccccc12] |

-continued
| Compound Group 1 | | | |
|---|---|---|---|
| Formula 1 | $Ar_1$ | $Ar_2$ | $Ar_3$ |
| P12 | 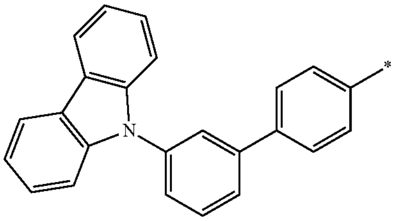 [SMILES: *c1ccc(-c2cccc(-n3c4ccccc4c4ccccc43)c2)cc1] | 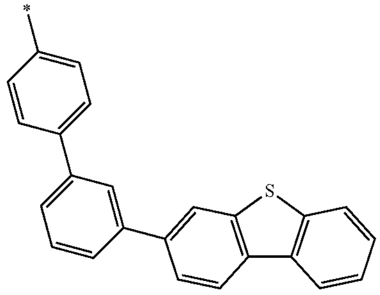 [SMILES: *c1ccc(-c2cccc(-c3ccc4c(c3)sc3ccccc34)c2)cc1] | 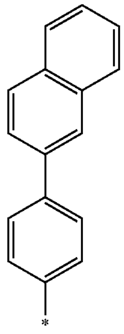 [SMILES: *c1ccc(-c2ccc3ccccc3c2)cc1] |
| P13 | 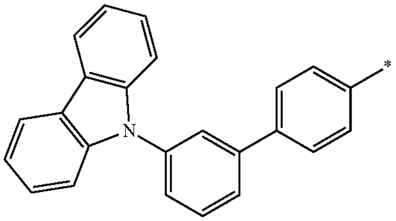 [SMILES: *c1ccc(-c2cccc(-n3c4ccccc4c4ccccc43)c2)cc1] | 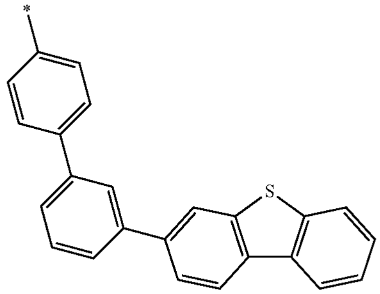 [SMILES: *c1ccc(-c2cccc(-c3ccc4c(c3)sc3ccccc34)c2)cc1] | 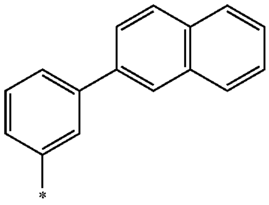 [SMILES: *c1cccc(-c2ccc3ccccc3c2)c1] |
| P14 | 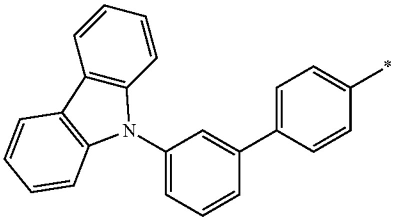 [SMILES: *c1ccc(-c2cccc(-n3c4ccccc4c4ccccc43)c2)cc1] | 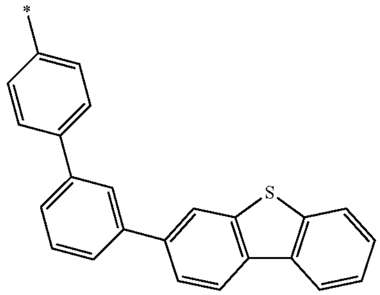 [SMILES: *c1ccc(-c2cccc(-c3ccc4c(c3)sc3ccccc34)c2)cc1] | 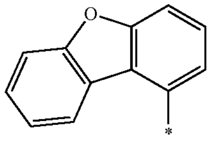 |
| P15 | 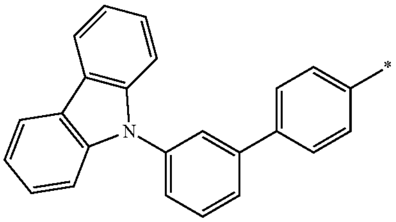 [SMILES: *c1ccc(-c2cccc(-n3c4ccccc4c4ccccc43)c2)cc1] | 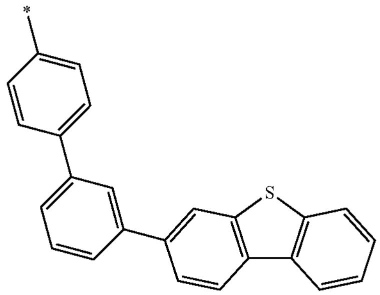 [SMILES: *c1ccc(-c2cccc(-c3ccc4c(c3)sc3ccccc34)c2)cc1] | 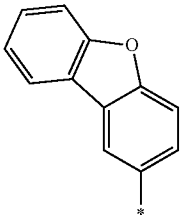 |

-continued
| Compound Group 1 | | | |
|---|---|---|---|
| Formula 1 | $Ar_1$ | $Ar_2$ | $Ar_3$ |
| P16 | 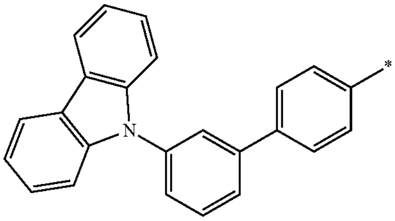 [SMILES: *c1ccc(-c2cccc(-n3c4ccccc4c4ccccc43)c2)cc1] | 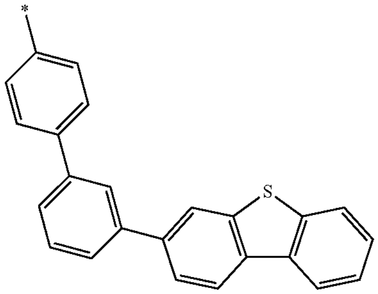 [SMILES: *c1ccc(-c2cccc(-c3ccc4c(c3)sc3ccccc34)c2)cc1] | 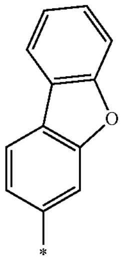 [SMILES: *c1ccc2c(c1)oc1ccccc12] |
| P17 | 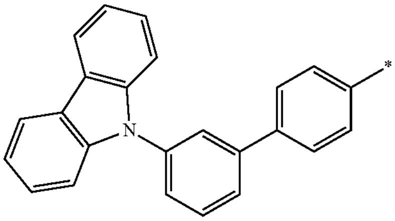 [SMILES: *c1ccc(-c2cccc(-n3c4ccccc4c4ccccc43)c2)cc1] | 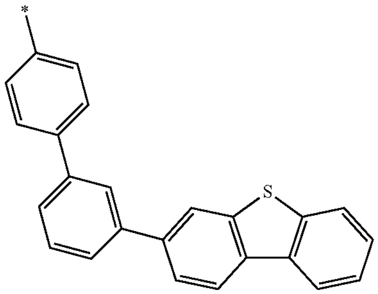 [SMILES: *c1ccc(-c2cccc(-c3ccc4c(c3)sc3ccccc34)c2)cc1] | 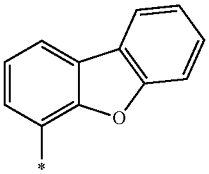 |
| P18 | 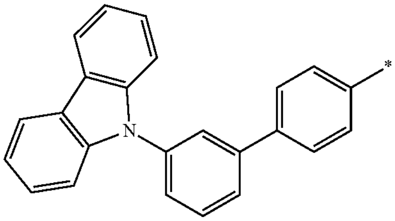 [SMILES: *c1ccc(-c2cccc(-n3c4ccccc4c4ccccc43)c2)cc1] | 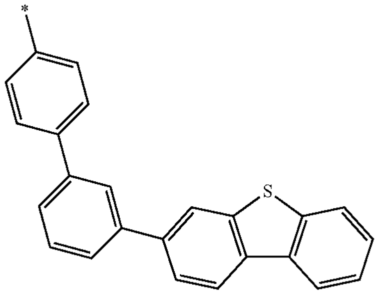 [SMILES: *c1ccc(-c2cccc(-c3ccc4c(c3)sc3ccccc34)c2)cc1] | 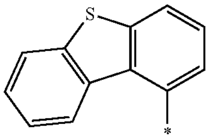 |
| P19 | 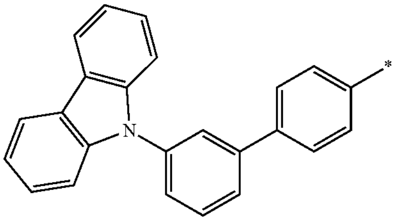 [SMILES: *c1ccc(-c2cccc(-n3c4ccccc4c4ccccc43)c2)cc1] | 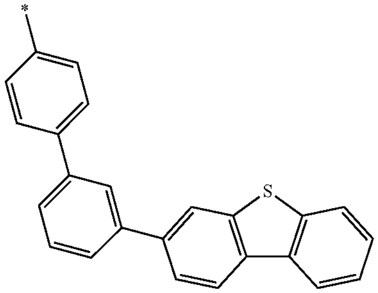 [SMILES: *c1ccc(-c2cccc(-c3ccc4c(c3)sc3ccccc34)c2)cc1] | 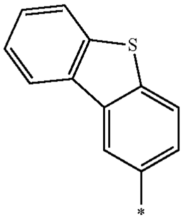 |
| P20 | 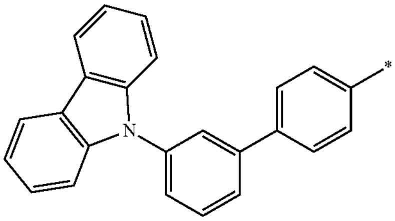 [SMILES: *c1ccc(-c2cccc(-n3c4ccccc4c4ccccc43)c2)cc1] | 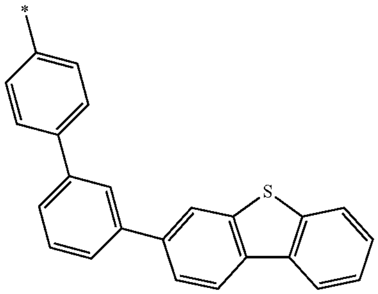 [SMILES: *c1ccc(-c2cccc(-c3ccc4c(c3)sc3ccccc34)c2)cc1] | 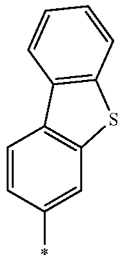 [SMILES: *c1ccc2c(c1)sc1ccccc12] |

-continued
Compound Group 1
| Formula 1 | $Ar_1$ | $Ar_2$ | $Ar_3$ |
|---|---|---|---|
| P21 | 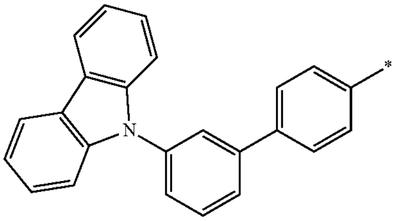 [SMILES: *c1ccc(-c2cccc(-n3c4ccccc4c4ccccc43)c2)cc1] | 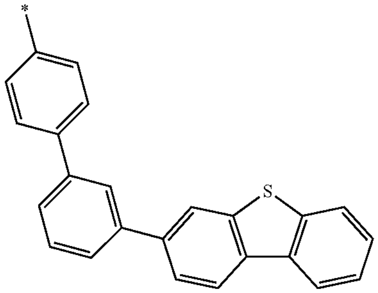 [SMILES: *c1ccc(-c2cccc(-c3ccc4c(c3)sc3ccccc34)c2)cc1] | 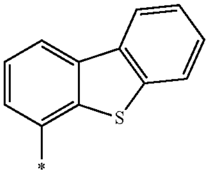 |
| P22 | 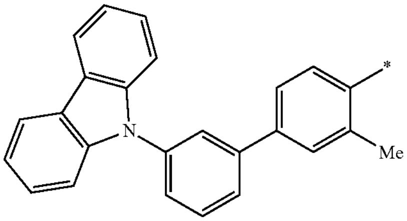 [SMILES: *c1ccc(-c2cccc(-n3c4ccccc4c4ccccc43)c2)cc1C] | 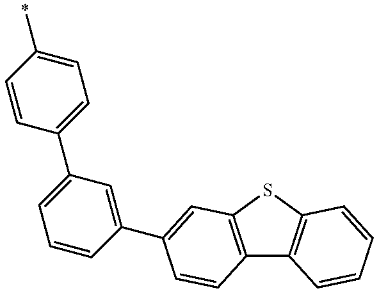 [SMILES: *c1ccc(-c2cccc(-c3ccc4c(c3)sc3ccccc34)c2)cc1] | 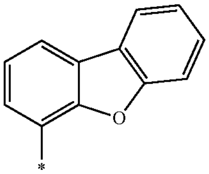 |
| P23 | 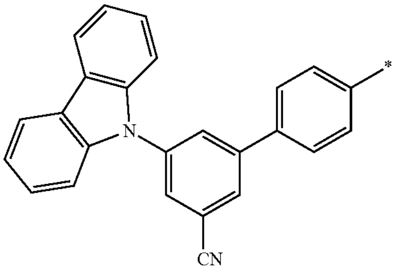 [SMILES: *c1ccc(-c2cc(C#N)cc(-n3c4ccccc4c4ccccc43)c2)cc1] | 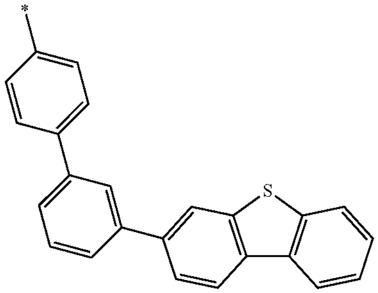 [SMILES: *c1ccc(-c2cccc(-c3ccc4c(c3)sc3ccccc34)c2)cc1] | 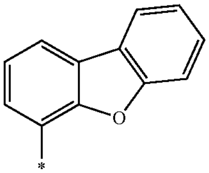 |
| Q1 | 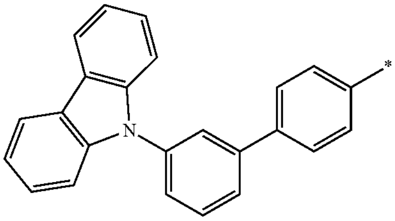 [SMILES: *c1ccc(-c2cccc(-n3c4ccccc4c4ccccc43)c2)cc1] | 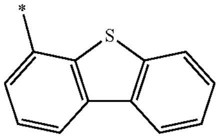 [SMILES: *c1cccc2c1sc1ccccc12] | 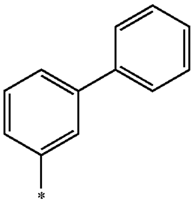 [SMILES: *c1cccc(-c2ccccc2)c1] |
| Q2 | 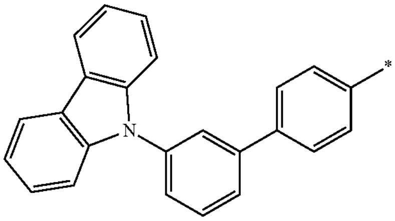 [SMILES: *c1ccc(-c2cccc(-n3c4ccccc4c4ccccc43)c2)cc1] | 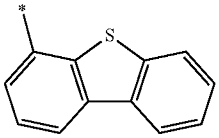 [SMILES: *c1cccc2c1sc1ccccc12] | 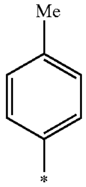 [SMILES: *c1ccc(C)cc1] |

-continued
| Compound Group 1 | | | |
|---|---|---|---|
| Formula 1 | Ar$_1$ | Ar$_2$ | Ar$_3$ |
| Q3 | 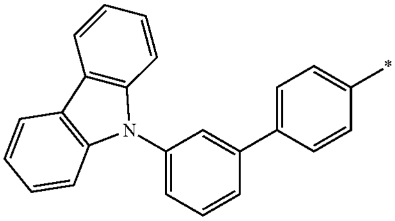 [SMILES: *c1ccc(-c2cccc(-n3c4ccccc4c4ccccc43)c2)cc1] | 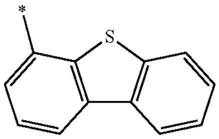 [SMILES: *c1cccc2c1sc1ccccc12] | 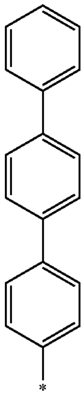 [SMILES: *c1ccc(-c2ccc(-c3ccccc3)cc2)cc1] |
| Q4 | 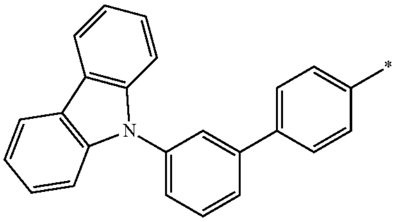 [SMILES: *c1ccc(-c2cccc(-n3c4ccccc4c4ccccc43)c2)cc1] | 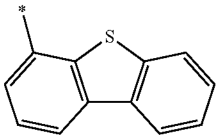 [SMILES: *c1cccc2c1sc1ccccc12] | 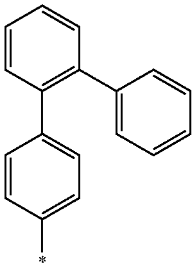 [SMILES: *c1ccc(-c2ccccc2-c2ccccc2)cc1] |
| Q5 | 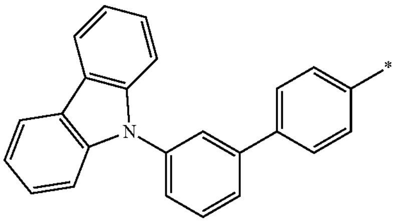 [SMILES: *c1ccc(-c2cccc(-n3c4ccccc4c4ccccc43)c2)cc1] | 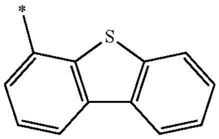 [SMILES: *c1cccc2c1sc1ccccc12] | 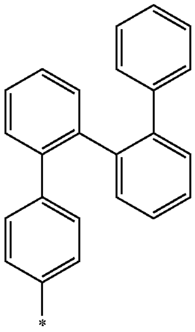 [SMILES: *c1ccc(-c2ccccc2-c2ccccc2-c2ccccc2)cc1] |
| Q6 | 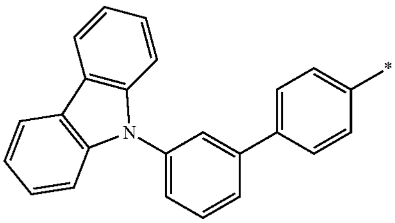 [SMILES: *c1ccc(-c2cccc(-n3c4ccccc4c4ccccc43)c2)cc1] | 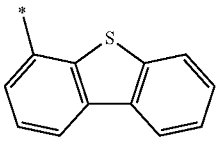 [SMILES: *c1cccc2c1sc1ccccc12] | 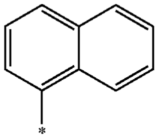 [SMILES: *c1cccc2ccccc12] |
| Q7 | 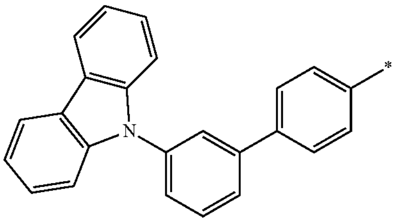 [SMILES: *c1ccc(-c2cccc(-n3c4ccccc4c4ccccc43)c2)cc1] | 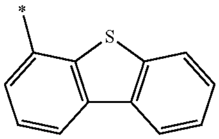 [SMILES: *c1cccc2c1sc1ccccc12] | 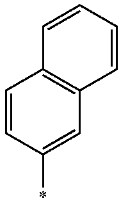 [SMILES: *c1ccc2ccccc2c1] |

-continued
Compound Group 1
| Formula 1 | $Ar_1$ | $Ar_2$ | $Ar_3$ |
|---|---|---|---|
| Q8 | 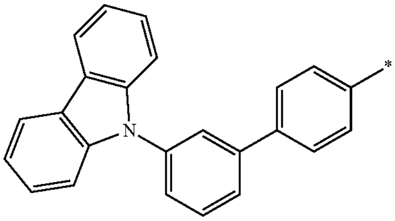 [SMILES: *c1ccc(-c2cccc(-n3c4ccccc4c4ccccc43)c2)cc1] | 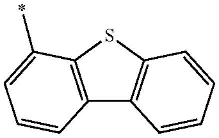 [SMILES: *c1cccc2c1sc1ccccc12] | 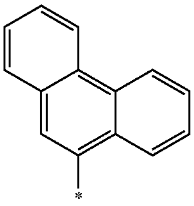 [SMILES: *c1cc2ccccc2c2ccccc12] |
| Q9 | 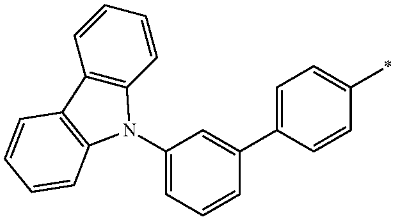 [SMILES: *c1ccc(-c2cccc(-n3c4ccccc4c4ccccc43)c2)cc1] | 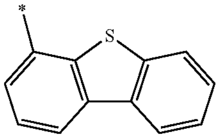 [SMILES: *c1cccc2c1sc1ccccc12] | 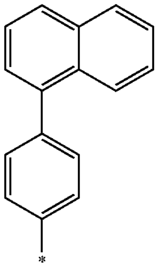 [SMILES: *c1ccc(-c2cccc3ccccc23)cc1] |
| Q10 | 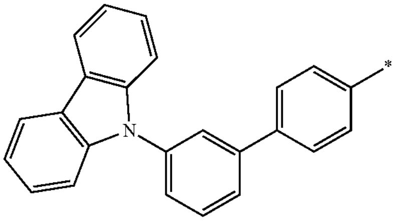 [SMILES: *c1ccc(-c2cccc(-n3c4ccccc4c4ccccc43)c2)cc1] | 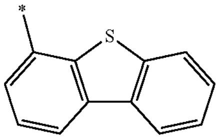 [SMILES: *c1cccc2c1sc1ccccc12] | 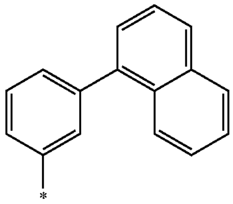 [SMILES: *c1cccc(-c2cccc3ccccc23)c1] |
| Q11 | 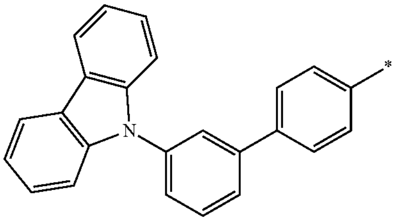 [SMILES: *c1ccc(-c2cccc(-n3c4ccccc4c4ccccc43)c2)cc1] | 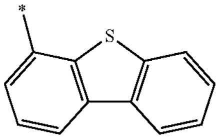 [SMILES: *c1cccc2c1sc1ccccc12] | 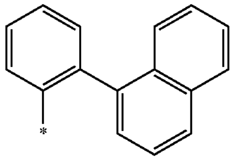 [SMILES: *c1ccccc1-c1cccc2ccccc12] |
| Q12 | 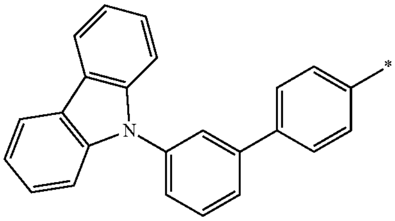 [SMILES: *c1ccc(-c2cccc(-n3c4ccccc4c4ccccc43)c2)cc1] | 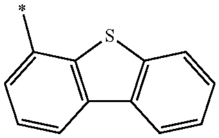 [SMILES: *c1cccc2c1sc1ccccc12] | 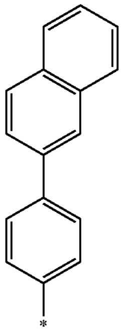 [SMILES: *c1ccc(-c2ccc3ccccc3c2)cc1] |
| Q13 | 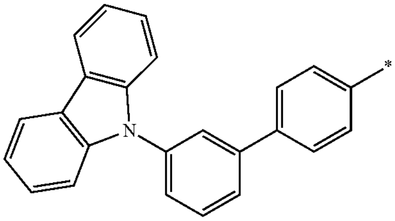 [SMILES: *c1ccc(-c2cccc(-n3c4ccccc4c4ccccc43)c2)cc1] | 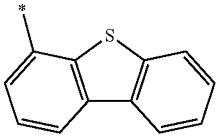 [SMILES: *c1cccc2c1sc1ccccc12] | 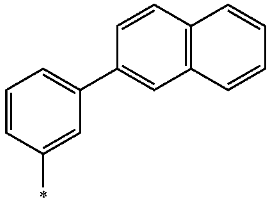 [SMILES: *c1cccc(-c2ccc3ccccc3c2)c1] |

-continued
| Compound Group 1 | | | |
|---|---|---|---|
| Formula 1 | $Ar_1$ | $Ar_2$ | $Ar_3$ |
| Q14 | 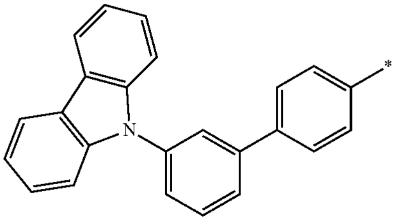 [SMILES: *c1ccc(-c2cccc(-n3c4ccccc4c4ccccc43)c2)cc1] | 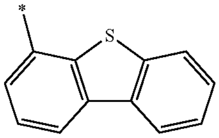 [SMILES: *c1cccc2c1sc1ccccc12] | 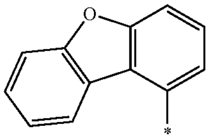 |
| Q15 | 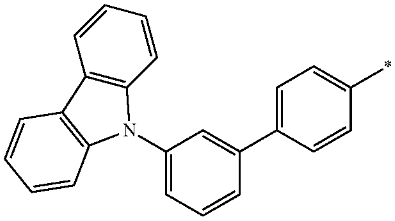 [SMILES: *c1ccc(-c2cccc(-n3c4ccccc4c4ccccc43)c2)cc1] | 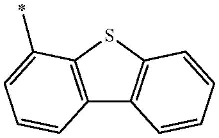 [SMILES: *c1cccc2c1sc1ccccc12] | 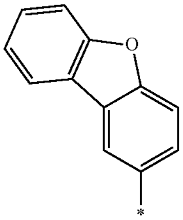 [SMILES: *c1ccc2oc3ccccc3c2c1] |
| Q16 | 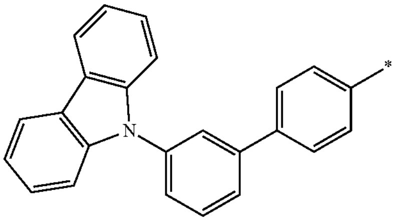 [SMILES: *c1ccc(-c2cccc(-n3c4ccccc4c4ccccc43)c2)cc1] | 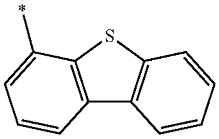 [SMILES: *c1cccc2c1sc1ccccc12] | 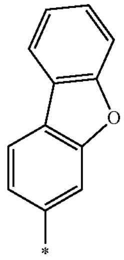 [SMILES: *c1ccc2c(c1)oc1ccccc12] |
| Q17 | 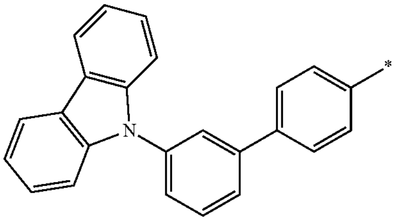 [SMILES: *c1ccc(-c2cccc(-n3c4ccccc4c4ccccc43)c2)cc1] | 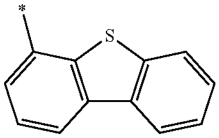 [SMILES: *c1cccc2c1sc1ccccc12] | 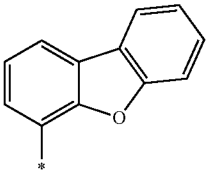 |
| Q18 | 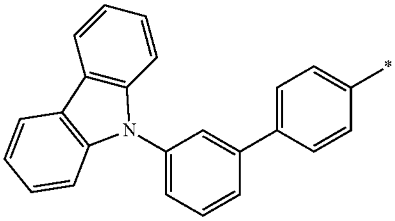 [SMILES: *c1ccc(-c2cccc(-n3c4ccccc4c4ccccc43)c2)cc1] | 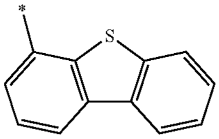 [SMILES: *c1cccc2c1sc1ccccc12] | 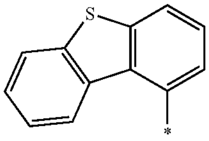 |
| Q19 | 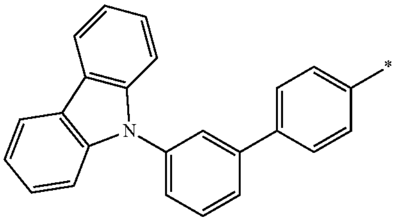 [SMILES: *c1ccc(-c2cccc(-n3c4ccccc4c4ccccc43)c2)cc1] | 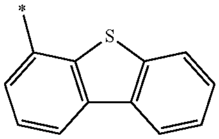 [SMILES: *c1cccc2c1sc1ccccc12] | 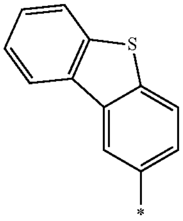 |

-continued
| Compound Group 1 | | | |
|---|---|---|---|
| Formula 1 | $Ar_1$ | $Ar_2$ | $Ar_3$ |
| Q20 | 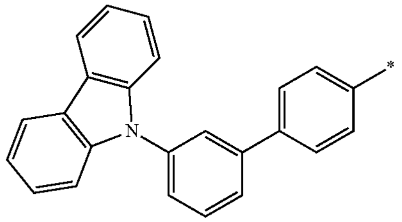 [SMILES: *c1ccc(-c2cccc(-n3c4ccccc4c4ccccc43)c2)cc1] | 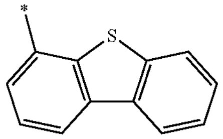 [SMILES: *c1cccc2c1sc1ccccc12] | 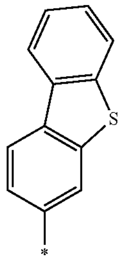 [SMILES: *c1ccc2c(c1)sc1ccccc12] |
| Q21 | 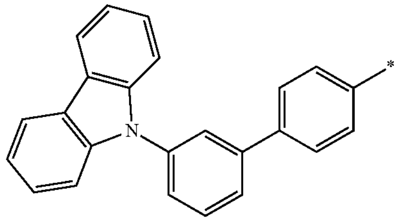 [SMILES: *c1ccc(-c2cccc(-n3c4ccccc4c4ccccc43)c2)cc1] | 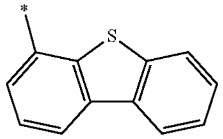 [SMILES: *c1cccc2c1sc1ccccc12] | 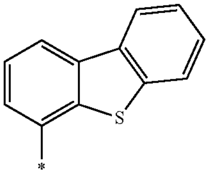 |
| Q22 | 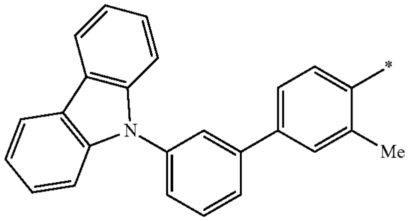 [SMILES: *c1ccc(-c2cccc(-n3c4ccccc4c4ccccc43)c2)cc1C] | 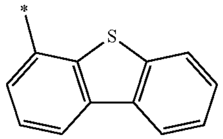 [SMILES: *c1cccc2c1sc1ccccc12] | 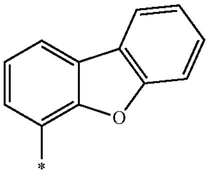 |
| Q23 | 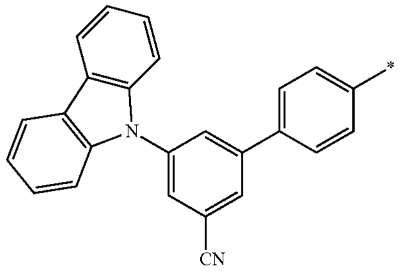 [SMILES: *c1ccc(-c2cc(C#N)cc(-n3c4ccccc4c4ccccc43)c2)cc1] | 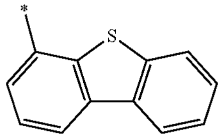 [SMILES: *c1cccc2c1sc1ccccc12] | 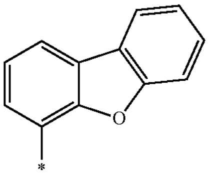 |
| Q24 | 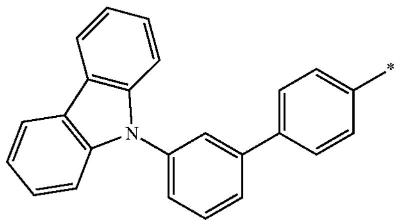 [SMILES: *c1ccc(-c2cccc(-n3c4ccccc4c4ccccc43)c2)cc1] | 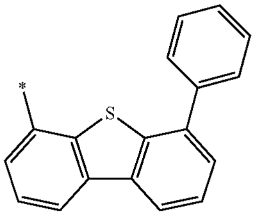 [SMILES: *c1cccc2c1sc1c(-c3ccccc3)cccc12] | 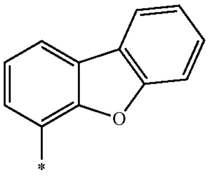 |
| Q25 | 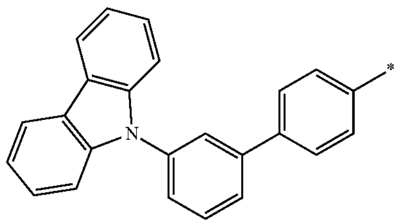 [SMILES: *c1ccc(-c2cccc(-n3c4ccccc4c4ccccc43)c2)cc1] | 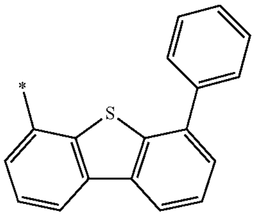 [SMILES: *c1cccc2c1sc1c(-c3ccccc3)cccc12] | 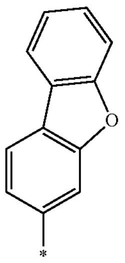 [SMILES: *c1ccc2c(c1)oc1ccccc12] |

-continued
| Compound Group 1 | | | |
|---|---|---|---|
| Formula 1 | $Ar_1$ | $Ar_2$ | $Ar_3$ |
| Q26 | 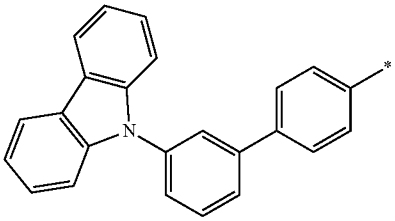 [SMILES: *c1ccc(-c2cccc(-n3c4ccccc4c4ccccc43)c2)cc1] | 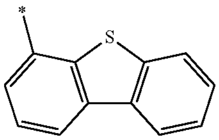 [SMILES: *c1cccc2c1sc1ccccc12] | 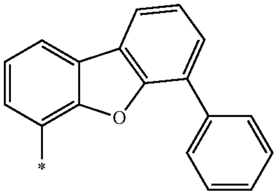 [SMILES: *c1cccc2c1oc1c(-c3ccccc3)cccc12] |
| Q27 | 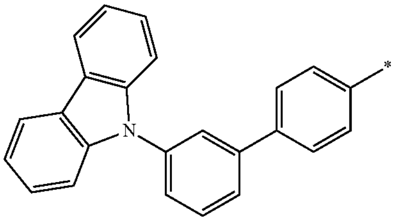 [SMILES: *c1ccc(-c2cccc(-n3c4ccccc4c4ccccc43)c2)cc1] | 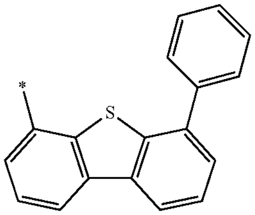 [SMILES: *c1cccc2c1sc1c(-c3ccccc3)cccc12] | 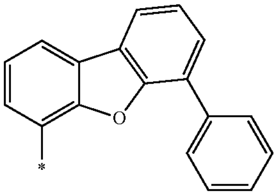 [SMILES: *c1cccc2c1oc1c(-c3ccccc3)cccc12] |
| S1 | 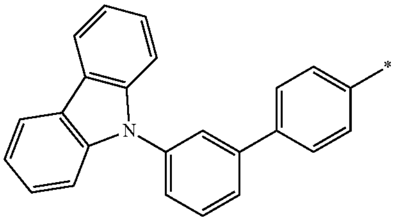 [SMILES: *c1ccc(-c2cccc(-n3c4ccccc4c4ccccc43)c2)cc1] | 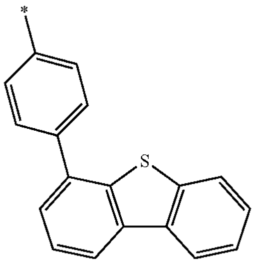 [SMILES: *c1ccc(-c2cccc3c2sc2ccccc23)cc1] | 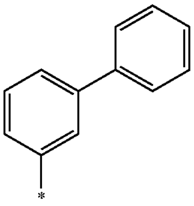 [SMILES: *c1cccc(-c2ccccc2)c1] |
| S2 | 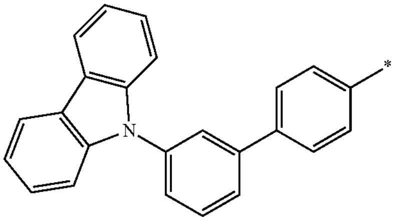 [SMILES: *c1ccc(-c2cccc(-n3c4ccccc4c4ccccc43)c2)cc1] | 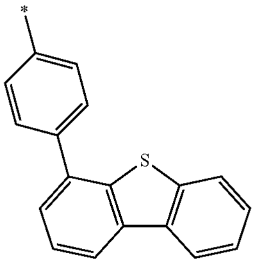 [SMILES: *c1ccc(-c2cccc3c2sc2ccccc23)cc1] | 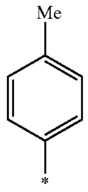 [SMILES: *c1ccc(C)cc1] |
| S3 | 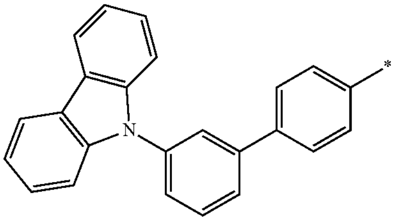 [SMILES: *c1ccc(-c2cccc(-n3c4ccccc4c4ccccc43)c2)cc1] | 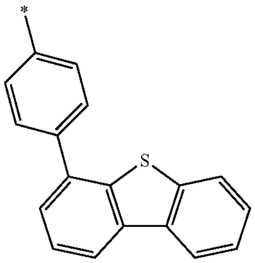 [SMILES: *c1ccc(-c2cccc3c2sc2ccccc23)cc1] | 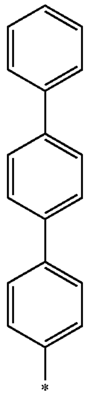 [SMILES: *c1ccc(-c2ccc(-c3ccccc3)cc2)cc1] |

-continued
Compound Group 1
| Formula 1 | $Ar_1$ | $Ar_2$ | $Ar_3$ |
|---|---|---|---|
| S4 | 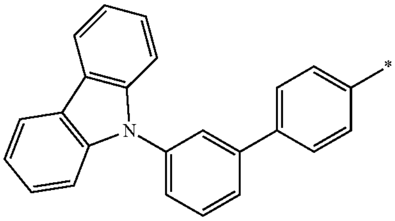 [SMILES: *c1ccc(-c2cccc(-n3c4ccccc4c4ccccc43)c2)cc1] | 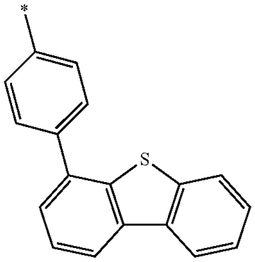 [SMILES: *c1ccc(-c2cccc3c2sc2ccccc23)cc1] | 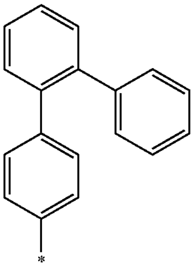 [SMILES: *c1ccc(-c2ccccc2-c2ccccc2)cc1] |
| S5 | 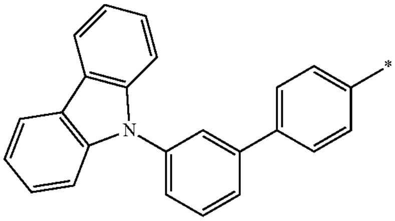 [SMILES: *c1ccc(-c2cccc(-n3c4ccccc4c4ccccc43)c2)cc1] | 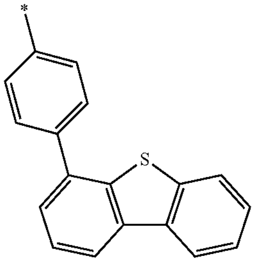 [SMILES: *c1ccc(-c2cccc3c2sc2ccccc23)cc1] | 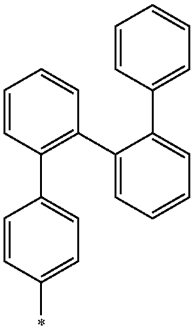 [SMILES: *c1ccc(-c2ccccc2-c2ccccc2-c2ccccc2)cc1] |
| S6 | 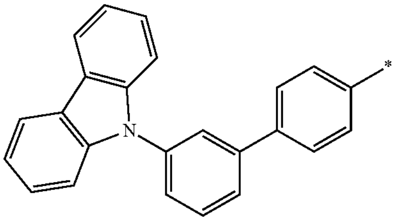 [SMILES: *c1ccc(-c2cccc(-n3c4ccccc4c4ccccc43)c2)cc1] | 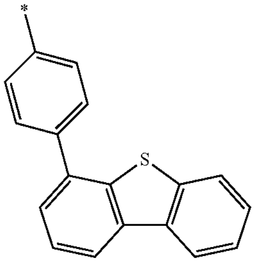 [SMILES: *c1ccc(-c2cccc3c2sc2ccccc23)cc1] | 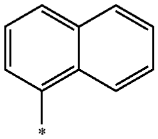 [SMILES: *c1cccc2ccccc12] |
| S7 | 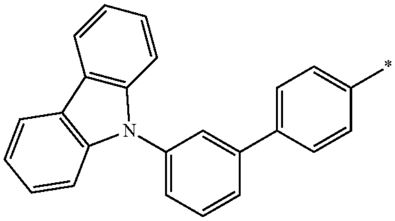 [SMILES: *c1ccc(-c2cccc(-n3c4ccccc4c4ccccc43)c2)cc1] | 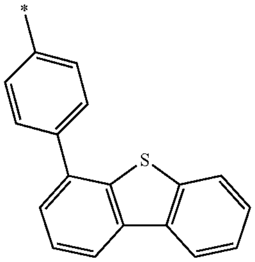 [SMILES: *c1ccc(-c2cccc3c2sc2ccccc23)cc1] | 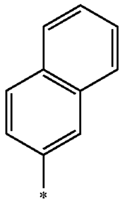 [SMILES: *c1ccc2ccccc2c1] |
| S8 | 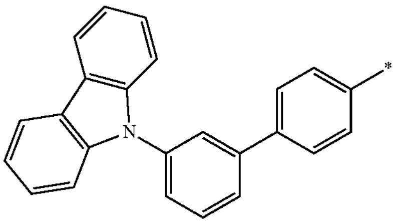 [SMILES: *c1ccc(-c2cccc(-n3c4ccccc4c4ccccc43)c2)cc1] | 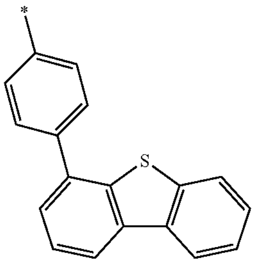 [SMILES: *c1ccc(-c2cccc3c2sc2ccccc23)cc1] | 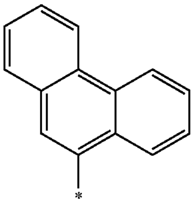 [SMILES: *c1cc2ccccc2c2ccccc12] |

-continued
| Compound Group 1 | | | |
|---|---|---|---|
| Formula 1 | $Ar_1$ | $Ar_2$ | $Ar_3$ |
| S9 | 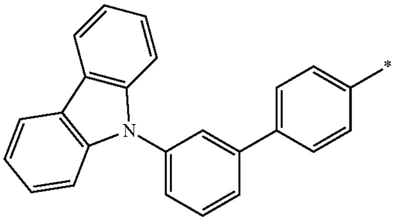 [SMILES: *c1ccc(-c2cccc(-n3c4ccccc4c4ccccc43)c2)cc1] | 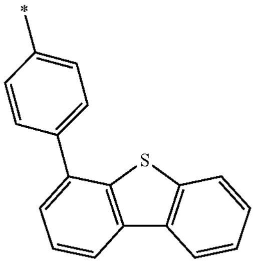 [SMILES: *c1ccc(-c2cccc3c2sc2ccccc23)cc1] | 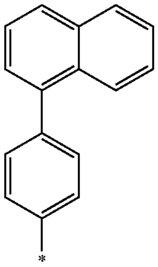 [SMILES: *c1ccc(-c2cccc3ccccc23)cc1] |
| S10 | 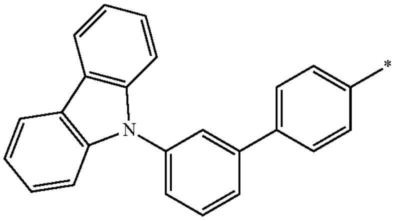 [SMILES: *c1ccc(-c2cccc(-n3c4ccccc4c4ccccc43)c2)cc1] | 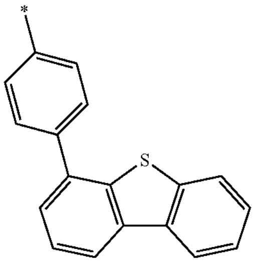 [SMILES: *c1ccc(-c2cccc3c2sc2ccccc23)cc1] | 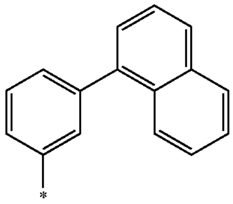 [SMILES: *c1cccc(-c2cccc3ccccc23)c1] |
| S11 | 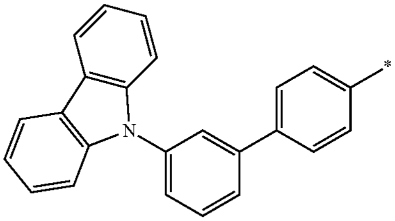 [SMILES: *c1ccc(-c2cccc(-n3c4ccccc4c4ccccc43)c2)cc1] | 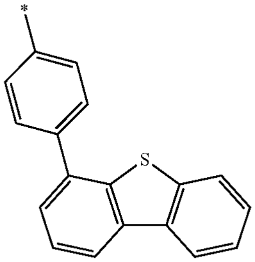 [SMILES: *c1ccc(-c2cccc3c2sc2ccccc23)cc1] | 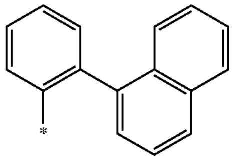 [SMILES: *c1ccccc1-c1cccc2ccccc12] |
| S12 | 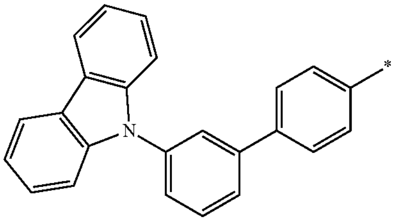 [SMILES: *c1ccc(-c2cccc(-n3c4ccccc4c4ccccc43)c2)cc1] | 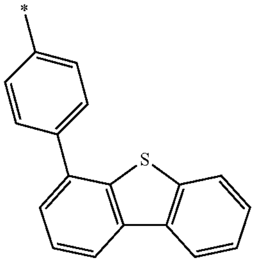 [SMILES: *c1ccc(-c2cccc3c2sc2ccccc23)cc1] | 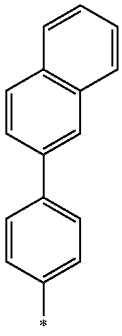 [SMILES: *c1ccc(-c2ccc3ccccc3c2)cc1] |
| S13 | 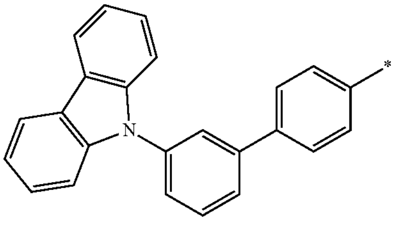 [SMILES: *c1ccc(-c2cccc(-n3c4ccccc4c4ccccc43)c2)cc1] | 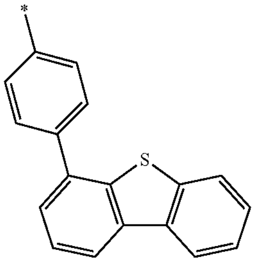 [SMILES: *c1ccc(-c2cccc3c2sc2ccccc23)cc1] | 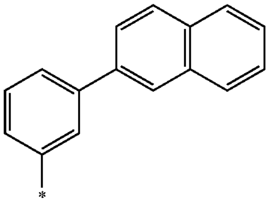 [SMILES: *c1cccc(-c2ccc3ccccc3c2)c1] |

-continued
| Compound Group 1 | | | |
|---|---|---|---|
| Formula 1 | $Ar_1$ | $Ar_2$ | $Ar_3$ |
| S14 | 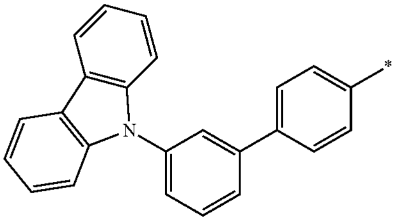 [SMILES: *c1ccc(-c2cccc(-n3c4ccccc4c4ccccc43)c2)cc1] | 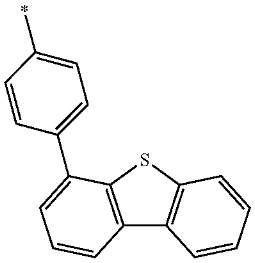 [SMILES: *c1ccc(-c2cccc3c2sc2ccccc23)cc1] | 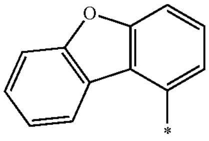 |
| S15 | 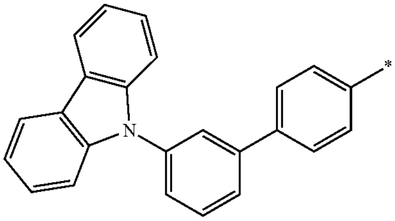 [SMILES: *c1ccc(-c2cccc(-n3c4ccccc4c4ccccc43)c2)cc1] | 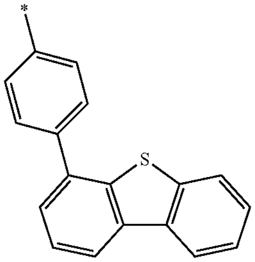 [SMILES: *c1ccc(-c2cccc3c2sc2ccccc23)cc1] | 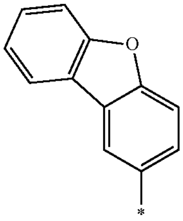 |
| S16 | 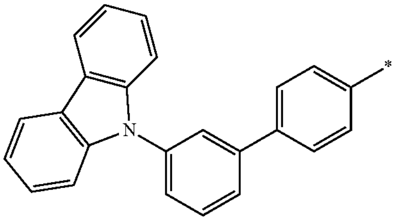 [SMILES: *c1ccc(-c2cccc(-n3c4ccccc4c4ccccc43)c2)cc1] | 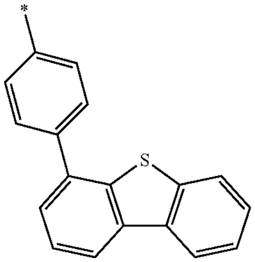 [SMILES: *c1ccc(-c2cccc3c2sc2ccccc23)cc1] | 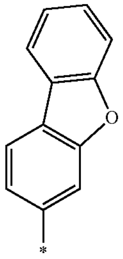 [SMILES: *c1ccc2c(c1)oc1ccccc12] |
| S17 | 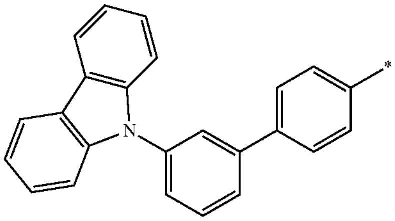 [SMILES: *c1ccc(-c2cccc(-n3c4ccccc4c4ccccc43)c2)cc1] | 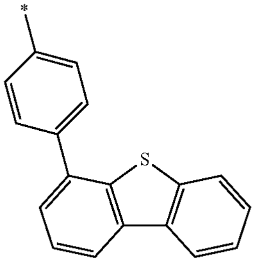 [SMILES: *c1ccc(-c2cccc3c2sc2ccccc23)cc1] | 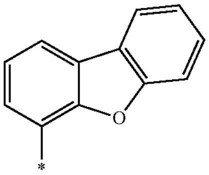 |
| S18 | 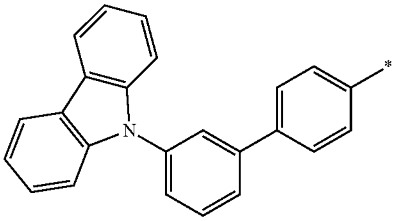 [SMILES: *c1ccc(-c2cccc(-n3c4ccccc4c4ccccc43)c2)cc1] | 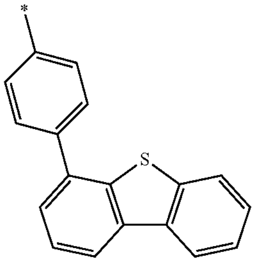 [SMILES: *c1ccc(-c2cccc3c2sc2ccccc23)cc1] | 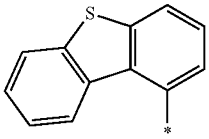 |

-continued
| Compound Group 1 | | | |
| --- | --- | --- | --- |
| Formula 1 | $Ar_1$ | $Ar_2$ | $Ar_3$ |
| S19 | 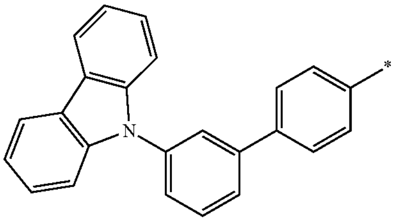 [SMILES: *c1ccc(-c2cccc(-n3c4ccccc4c4ccccc43)c2)cc1] | 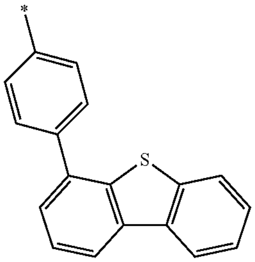 [SMILES: *c1ccc(-c2cccc3c2sc2ccccc23)cc1] | 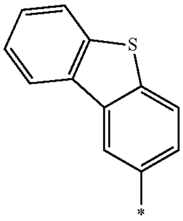 |
| S20 | 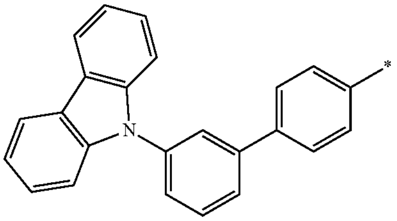 [SMILES: *c1ccc(-c2cccc(-n3c4ccccc4c4ccccc43)c2)cc1] | 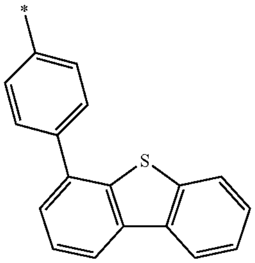 [SMILES: *c1ccc(-c2cccc3c2sc2ccccc23)cc1] | 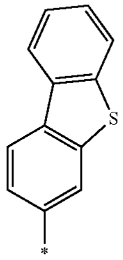 [SMILES: *c1ccc2c(c1)sc1ccccc12] |
| S21 | 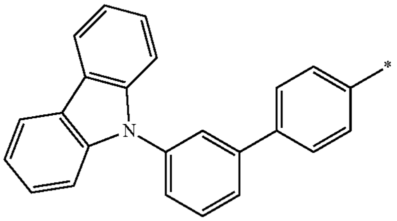 [SMILES: *c1ccc(-c2cccc(-n3c4ccccc4c4ccccc43)c2)cc1] | 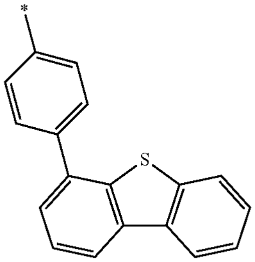 [SMILES: *c1ccc(-c2cccc3c2sc2ccccc23)cc1] | 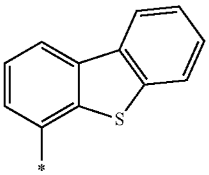 |
| S22 | 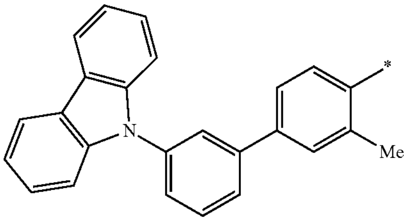 [SMILES: *c1ccc(-c2cccc(-n3c4ccccc4c4ccccc43)c2)cc1C] | 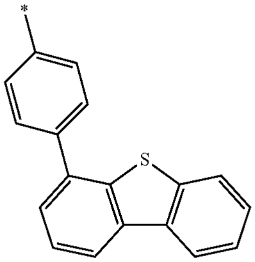 [SMILES: *c1ccc(-c2cccc3c2sc2ccccc23)cc1] | 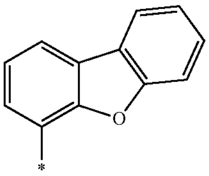 |
| S23 | 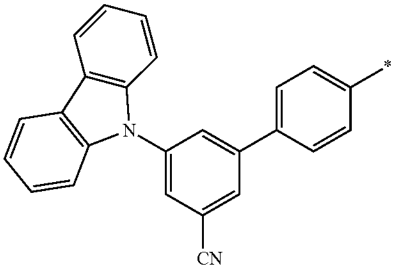 [SMILES: *c1ccc(-c2cc(C#N)cc(-n3c4ccccc4c4ccccc43)c2)cc1] | 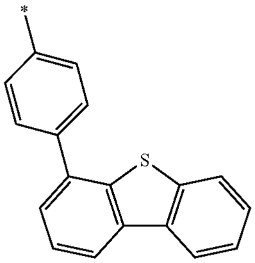 [SMILES: *c1ccc(-c2cccc3c2sc2ccccc23)cc1] | 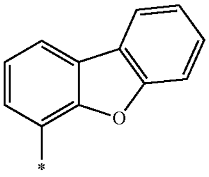 |

-continued
| Compound Group 1 | | | |
|---|---|---|---|
| Formula 1 | $Ar_1$ | $Ar_2$ | $Ar_3$ |
| T1 | 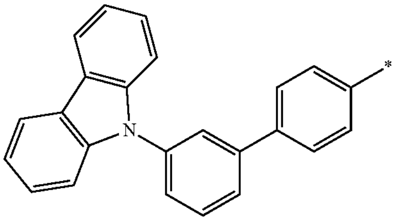 [SMILES: *c1ccc(-c2cccc(-n3c4ccccc4c4ccccc43)c2)cc1] | 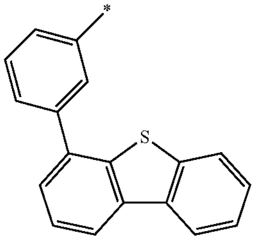 [SMILES: *c1cccc(-c2cccc3c2sc2ccccc23)c1] | 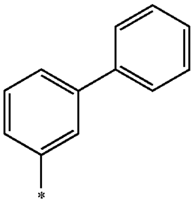 [SMILES: *c1cccc(-c2ccccc2)c1] |
| T2 | 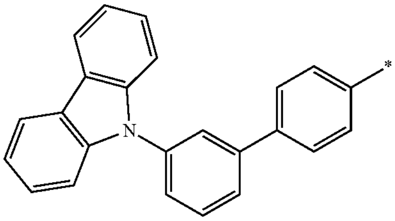 [SMILES: *c1ccc(-c2cccc(-n3c4ccccc4c4ccccc43)c2)cc1] | 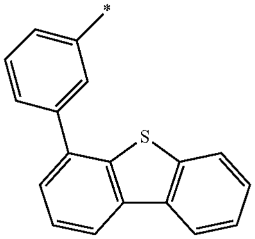 [SMILES: *c1cccc(-c2cccc3c2sc2ccccc23)c1] | 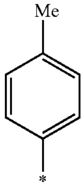 [SMILES: *c1ccc(C)cc1] |
| T3 | 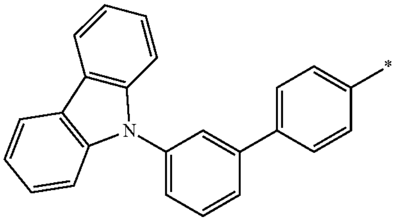 [SMILES: *c1ccc(-c2cccc(-n3c4ccccc4c4ccccc43)c2)cc1] | 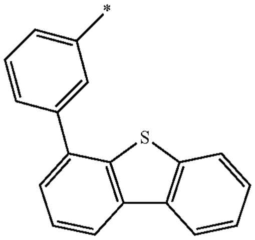 [SMILES: *c1cccc(-c2cccc3c2sc2ccccc23)c1] | 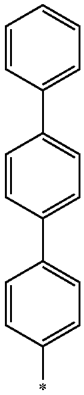 [SMILES: *c1ccc(-c2ccc(-c3ccccc3)cc2)cc1] |
| T4 | 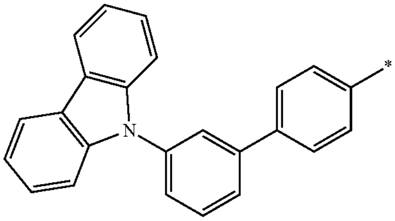 [SMILES: *c1ccc(-c2cccc(-n3c4ccccc4c4ccccc43)c2)cc1] | 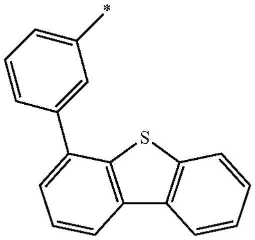 [SMILES: *c1cccc(-c2cccc3c2sc2ccccc23)c1] | 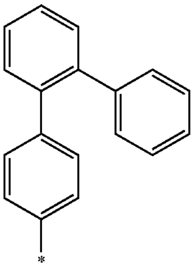 [SMILES: *c1ccc(-c2ccccc2-c2ccccc2)cc1] |
| T5 | 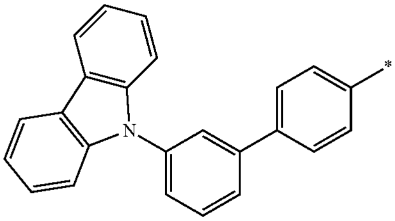 [SMILES: *c1ccc(-c2cccc(-n3c4ccccc4c4ccccc43)c2)cc1] | 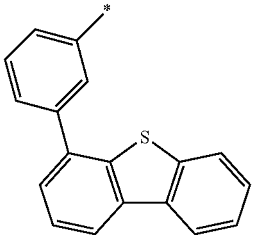 [SMILES: *c1cccc(-c2cccc3c2sc2ccccc23)c1] | 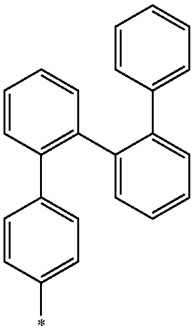 [SMILES: *c1ccc(-c2ccccc2-c2ccccc2-c2ccccc2)cc1] |

-continued
| Compound Group 1 | | | |
|---|---|---|---|
| Formula 1 | $Ar_1$ | $Ar_2$ | $Ar_3$ |
| T6 | 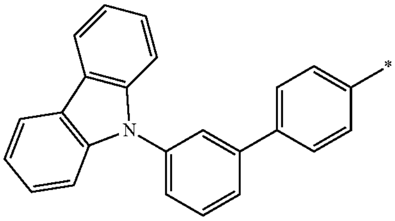 [SMILES: *c1ccc(-c2cccc(-n3c4ccccc4c4ccccc43)c2)cc1] | 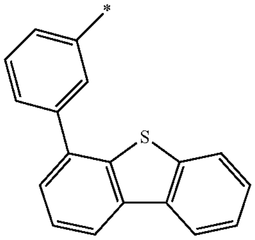 [SMILES: *c1cccc(-c2cccc3c2sc2ccccc23)c1] | 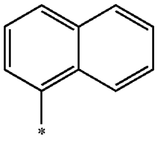 [SMILES: *c1cccc2ccccc12] |
| T7 | 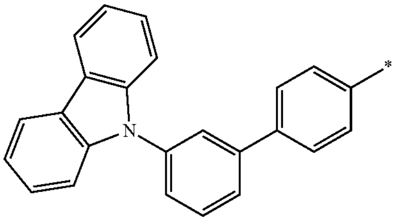 [SMILES: *c1ccc(-c2cccc(-n3c4ccccc4c4ccccc43)c2)cc1] | 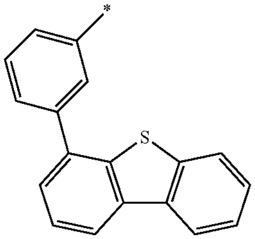 [SMILES: *c1cccc(-c2cccc3c2sc2ccccc23)c1] | 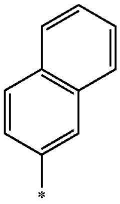 [SMILES: *c1ccc2ccccc2c1] |
| T8 | 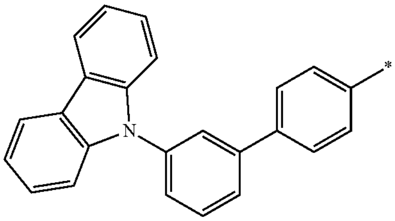 [SMILES: *c1ccc(-c2cccc(-n3c4ccccc4c4ccccc43)c2)cc1] | 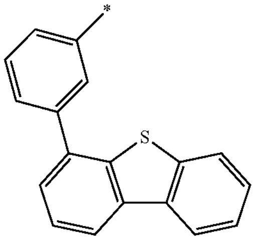 [SMILES: *c1cccc(-c2cccc3c2sc2ccccc23)c1] | 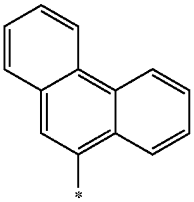 [SMILES: *c1cc2ccccc2c2ccccc12] |
| T9 | 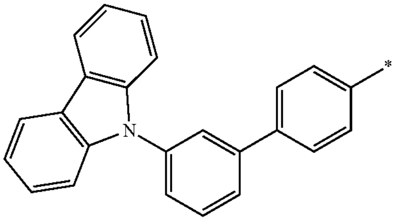 [SMILES: *c1ccc(-c2cccc(-n3c4ccccc4c4ccccc43)c2)cc1] | 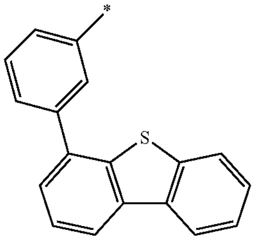 [SMILES: *c1cccc(-c2cccc3c2sc2ccccc23)c1] | 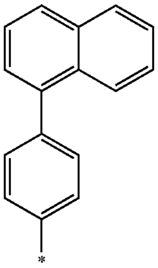 [SMILES: *c1ccc(-c2cccc3ccccc23)cc1] |
| T10 | 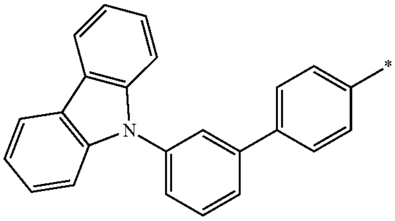 [SMILES: *c1ccc(-c2cccc(-n3c4ccccc4c4ccccc43)c2)cc1] | 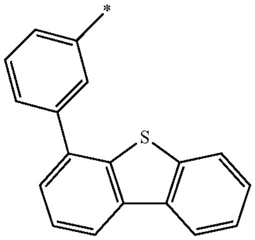 [SMILES: *c1cccc(-c2cccc3c2sc2ccccc23)c1] | 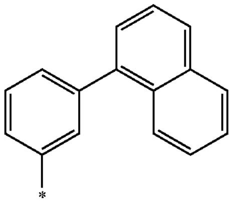 [SMILES: *c1cccc(-c2cccc3ccccc23)c1] |
| T11 | 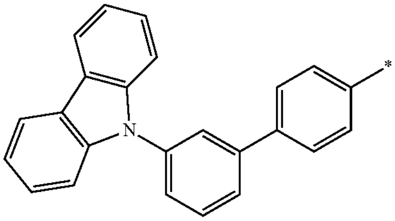 [SMILES: *c1ccc(-c2cccc(-n3c4ccccc4c4ccccc43)c2)cc1] | 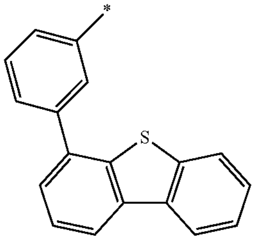 [SMILES: *c1cccc(-c2cccc3c2sc2ccccc23)c1] | 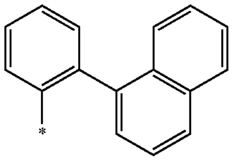 [SMILES: *c1ccccc1-c1cccc2ccccc12] |

-continued
Compound Group 1
| Formula 1 | $Ar_1$ | $Ar_2$ | $Ar_3$ |
|---|---|---|---|
| T12 | 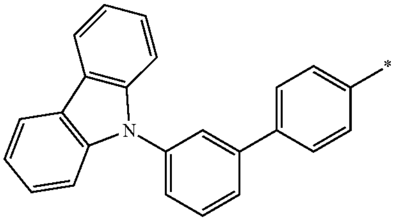 [SMILES: *c1ccc(-c2cccc(-n3c4ccccc4c4ccccc43)c2)cc1] | 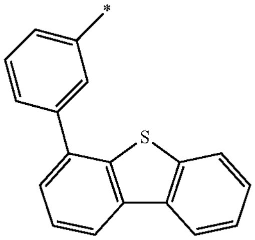 [SMILES: *c1cccc(-c2cccc3c2sc2ccccc23)c1] | 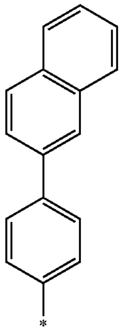 [SMILES: *c1ccc(-c2ccc3ccccc3c2)cc1] |
| T13 | 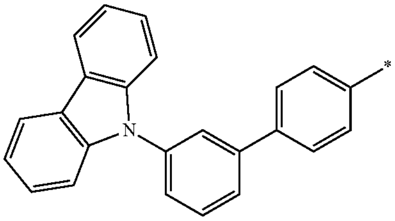 [SMILES: *c1ccc(-c2cccc(-n3c4ccccc4c4ccccc43)c2)cc1] | 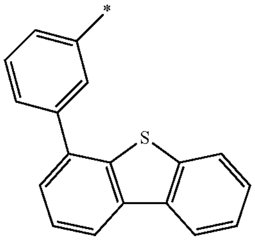 [SMILES: *c1cccc(-c2cccc3c2sc2ccccc23)c1] | 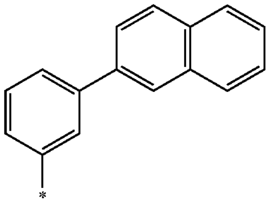 [SMILES: *c1cccc(-c2ccc3ccccc3c2)c1] |
| T14 | 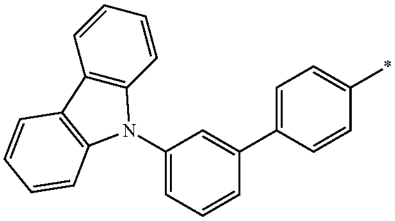 [SMILES: *c1ccc(-c2cccc(-n3c4ccccc4c4ccccc43)c2)cc1] | 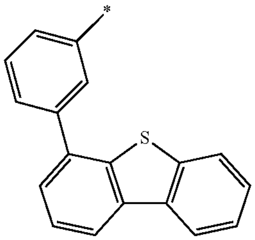 [SMILES: *c1cccc(-c2cccc3c2sc2ccccc23)c1] | 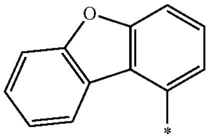 |
| T15 | 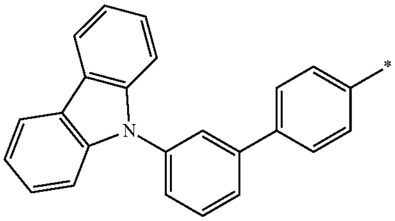 [SMILES: *c1ccc(-c2cccc(-n3c4ccccc4c4ccccc43)c2)cc1] | 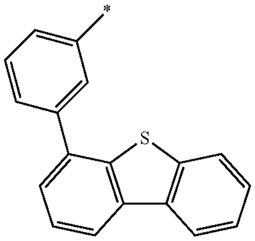 [SMILES: *c1cccc(-c2cccc3c2sc2ccccc23)c1] | 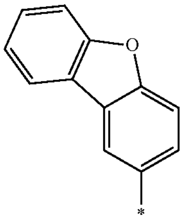 |
| T16 | 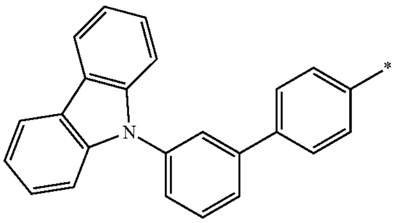 [SMILES: *c1ccc(-c2cccc(-n3c4ccccc4c4ccccc43)c2)cc1] | 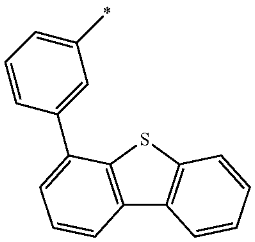 [SMILES: *c1cccc(-c2cccc3c2sc2ccccc23)c1] | 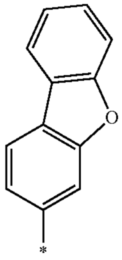 [SMILES: *c1ccc2c(c1)oc1ccccc12] |

-continued
| Compound Group 1 | | | |
|---|---|---|---|
| Formula 1 | $Ar_1$ | $Ar_2$ | $Ar_3$ |
| T17 | 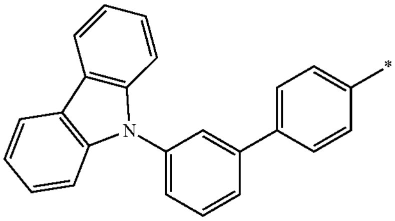 [SMILES: *c1ccc(-c2cccc(-n3c4ccccc4c4ccccc43)c2)cc1] | 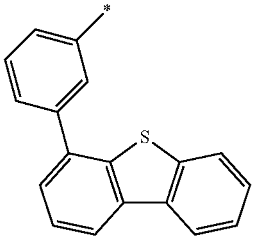 [SMILES: *c1cccc(-c2cccc3c2sc2ccccc23)c1] | 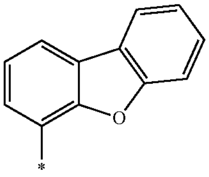 |
| T18 | 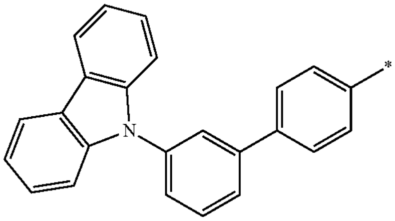 [SMILES: *c1ccc(-c2cccc(-n3c4ccccc4c4ccccc43)c2)cc1] | 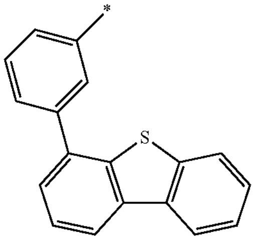 [SMILES: *c1cccc(-c2cccc3c2sc2ccccc23)c1] | 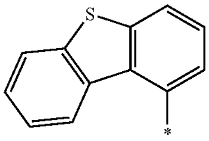 |
| T19 | 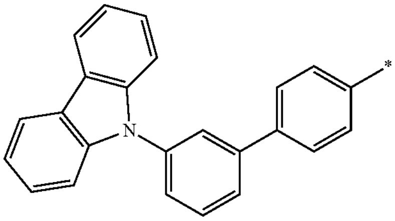 [SMILES: *c1ccc(-c2cccc(-n3c4ccccc4c4ccccc43)c2)cc1] | 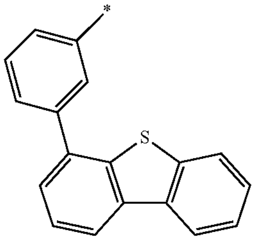 [SMILES: *c1cccc(-c2cccc3c2sc2ccccc23)c1] | 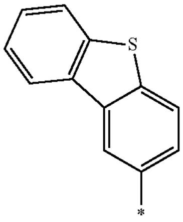 |
| T20 | 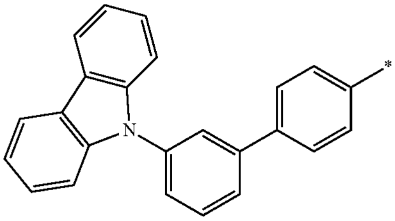 [SMILES: *c1ccc(-c2cccc(-n3c4ccccc4c4ccccc43)c2)cc1] | 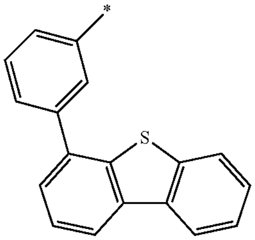 [SMILES: *c1cccc(-c2cccc3c2sc2ccccc23)c1] | 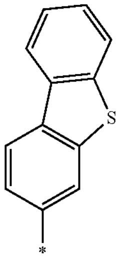 [SMILES: *c1ccc2c(c1)sc1ccccc12] |
| T21 | 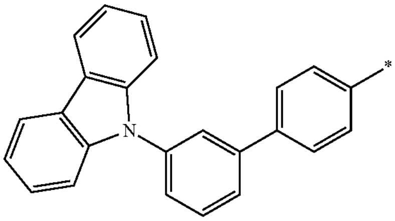 [SMILES: *c1ccc(-c2cccc(-n3c4ccccc4c4ccccc43)c2)cc1] | 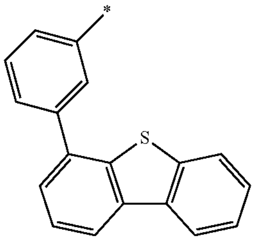 [SMILES: *c1cccc(-c2cccc3c2sc2ccccc23)c1] | 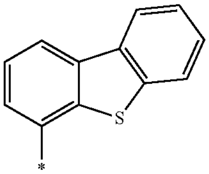 |
| T22 | 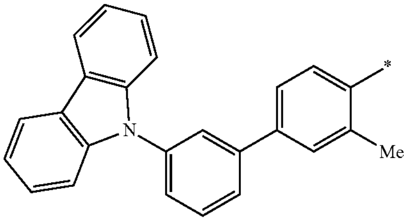 [SMILES: *c1ccc(-c2cccc(-n3c4ccccc4c4ccccc43)c2)cc1C] | 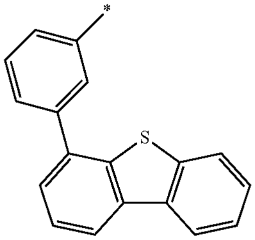 [SMILES: *c1cccc(-c2cccc3c2sc2ccccc23)c1] | 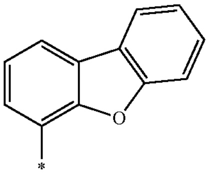 |

-continued
Compound Group 1
| Formula 1 | $Ar_1$ | $Ar_2$ | $Ar_3$ |
|---|---|---|---|
| T23 | 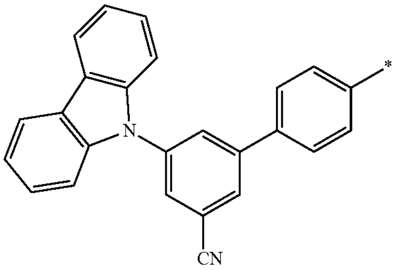 [SMILES: *c1ccc(-c2cc(C#N)cc(-n3c4ccccc4c4ccccc43)c2)cc1] | 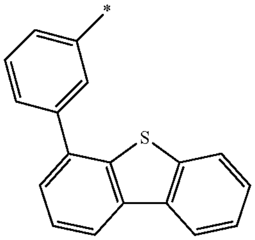 [SMILES: *c1cccc(-c2cccc3c2sc2ccccc23)c1] | 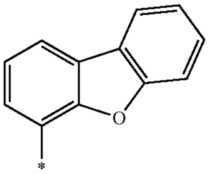 |
| U1 | 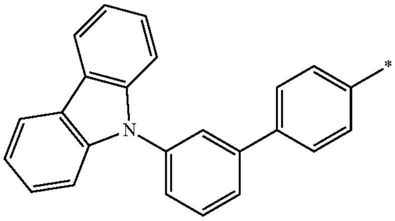 [SMILES: *c1ccc(-c2cccc(-n3c4ccccc4c4ccccc43)c2)cc1] | 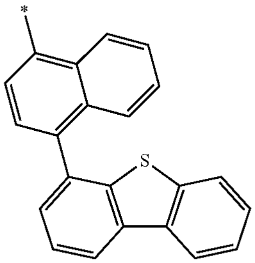 [SMILES: *c1ccc(-c2cccc3c2sc2ccccc23)c2ccccc12] | 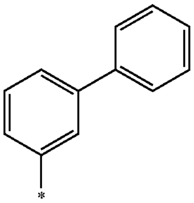 [SMILES: *c1cccc(-c2ccccc2)c1] |
| U2 | 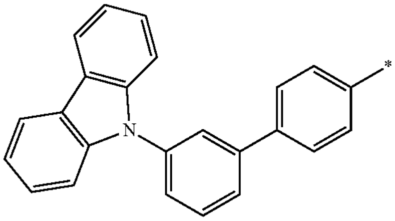 [SMILES: *c1ccc(-c2cccc(-n3c4ccccc4c4ccccc43)c2)cc1] | 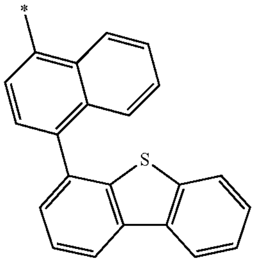 [SMILES: *c1ccc(-c2cccc3c2sc2ccccc23)c2ccccc12] | 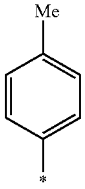 [SMILES: *c1ccc(C)cc1] |
| U3 | 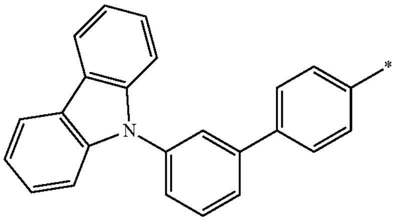 [SMILES: *c1ccc(-c2cccc(-n3c4ccccc4c4ccccc43)c2)cc1] | 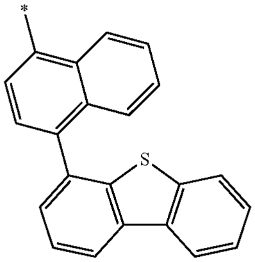 [SMILES: *c1ccc(-c2cccc3c2sc2ccccc23)c2ccccc12] | 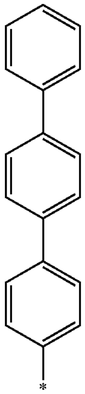 [SMILES: *c1ccc(-c2ccc(-c3ccccc3)cc2)cc1] |
| U4 | 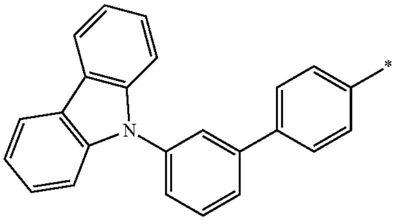 [SMILES: *c1ccc(-c2cccc(-n3c4ccccc4c4ccccc43)c2)cc1] | 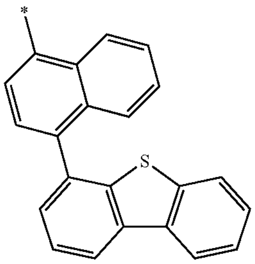 [SMILES: *c1ccc(-c2cccc3c2sc2ccccc23)c2ccccc12] | 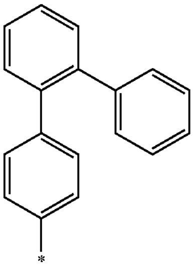 [SMILES: *c1ccc(-c2ccccc2-c2ccccc2)cc1] |

-continued
Compound Group 1
| Formula 1 | $Ar_1$ | $Ar_2$ | $Ar_3$ |
| --- | --- | --- | --- |
| U5 | 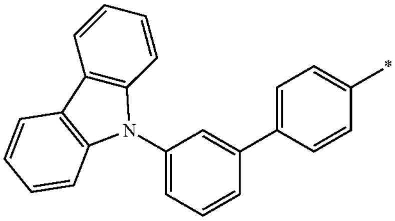 [SMILES: *c1ccc(-c2cccc(-n3c4ccccc4c4ccccc43)c2)cc1] | 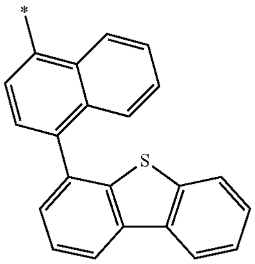 [SMILES: *c1ccc(-c2cccc3c2sc2ccccc23)c2ccccc12] | 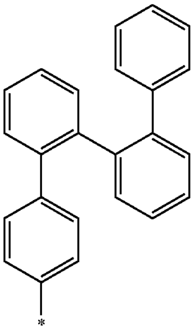 [SMILES: *c1ccc(-c2ccccc2-c2ccccc2-c2ccccc2)cc1] |
| U6 | 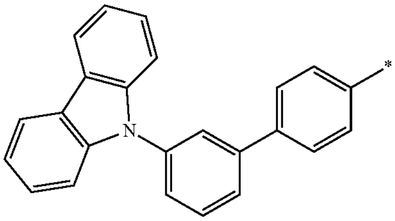 [SMILES: *c1ccc(-c2cccc(-n3c4ccccc4c4ccccc43)c2)cc1] | 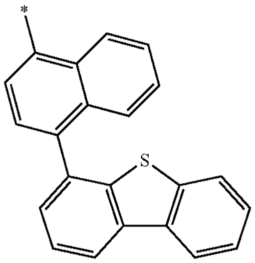 [SMILES: *c1ccc(-c2cccc3c2sc2ccccc23)c2ccccc12] | 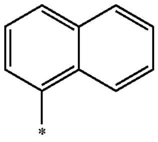 [SMILES: *c1cccc2ccccc12] |
| U7 | 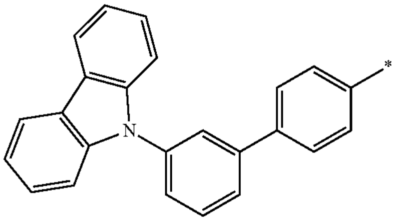 [SMILES: *c1ccc(-c2cccc(-n3c4ccccc4c4ccccc43)c2)cc1] | 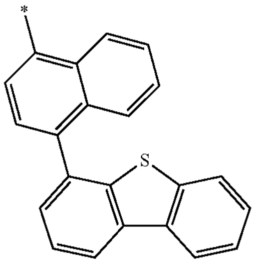 [SMILES: *c1ccc(-c2cccc3c2sc2ccccc23)c2ccccc12] | 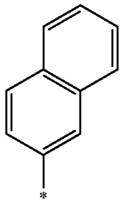 [SMILES: *c1ccc2ccccc2c1] |
| U8 | 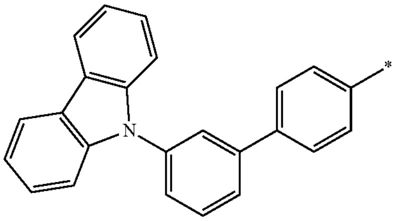 [SMILES: *c1ccc(-c2cccc(-n3c4ccccc4c4ccccc43)c2)cc1] | 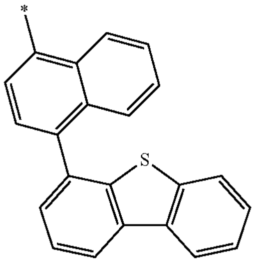 [SMILES: *c1ccc(-c2cccc3c2sc2ccccc23)c2ccccc12] | 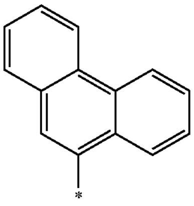 [SMILES: *c1cc2ccccc2c2ccccc12] |
| U9 | 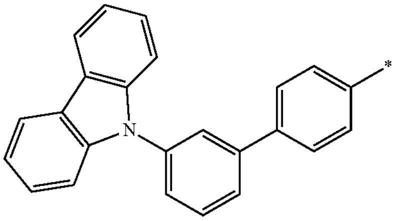 [SMILES: *c1ccc(-c2cccc(-n3c4ccccc4c4ccccc43)c2)cc1] | 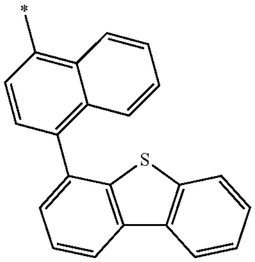 [SMILES: *c1ccc(-c2cccc3c2sc2ccccc23)c2ccccc12] | 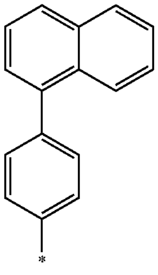 [SMILES: *c1ccc(-c2cccc3ccccc23)cc1] |

-continued
Compound Group 1
| Formula 1 | $Ar_1$ | $Ar_2$ | $Ar_3$ |
|---|---|---|---|
| U10 | 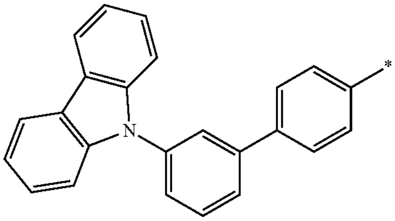 [SMILES: *c1ccc(-c2cccc(-n3c4ccccc4c4ccccc43)c2)cc1] | 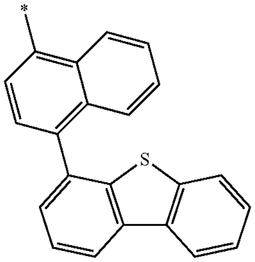 [SMILES: *c1ccc(-c2cccc3c2sc2ccccc23)c2ccccc12] | 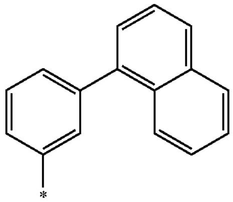 [SMILES: *c1cccc(-c2cccc3ccccc23)c1] |
| U11 | 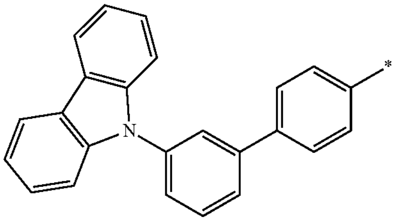 [SMILES: *c1ccc(-c2cccc(-n3c4ccccc4c4ccccc43)c2)cc1] | 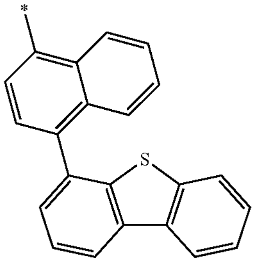 [SMILES: *c1ccc(-c2cccc3c2sc2ccccc23)c2ccccc12] | 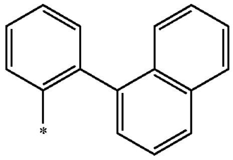 [SMILES: *c1ccccc1-c1cccc2ccccc12] |
| U12 | 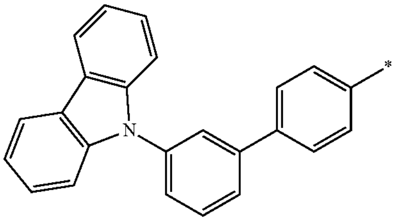 [SMILES: *c1ccc(-c2cccc(-n3c4ccccc4c4ccccc43)c2)cc1] | 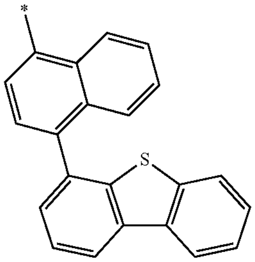 [SMILES: *c1ccc(-c2cccc3c2sc2ccccc23)c2ccccc12] | 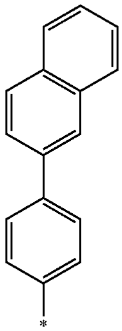 [SMILES: *c1ccc(-c2ccc3ccccc3c2)cc1] |
| U13 | 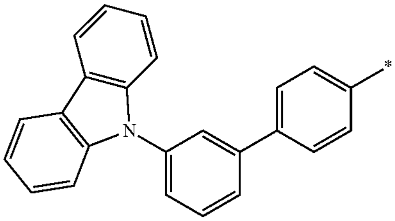 [SMILES: *c1ccc(-c2cccc(-n3c4ccccc4c4ccccc43)c2)cc1] | 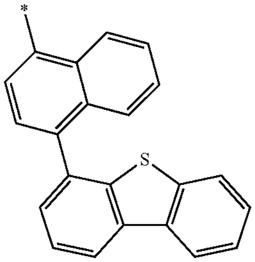 [SMILES: *c1ccc(-c2cccc3c2sc2ccccc23)c2ccccc12] | 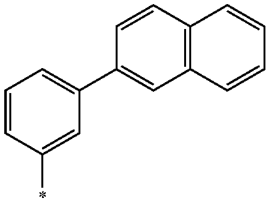 [SMILES: *c1cccc(-c2ccc3ccccc3c2)c1] |
| U14 | 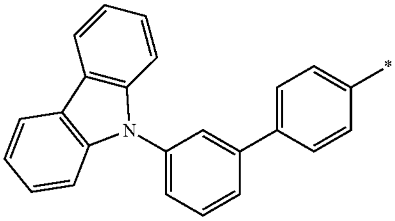 [SMILES: *c1ccc(-c2cccc(-n3c4ccccc4c4ccccc43)c2)cc1] | 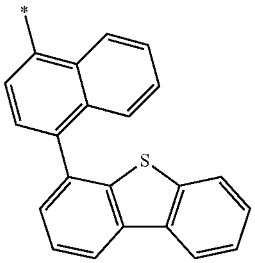 [SMILES: *c1ccc(-c2cccc3c2sc2ccccc23)c2ccccc12] | 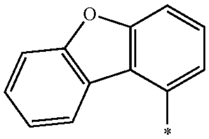 |

-continued
Compound Group 1
| Formula 1 | $Ar_1$ | $Ar_2$ | $Ar_3$ |
|---|---|---|---|
| U15 | 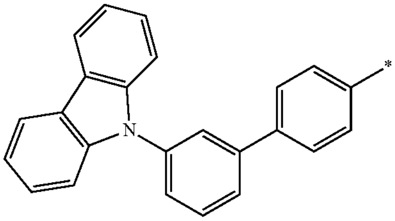 [SMILES: *c1ccc(-c2cccc(-n3c4ccccc4c4ccccc43)c2)cc1] | 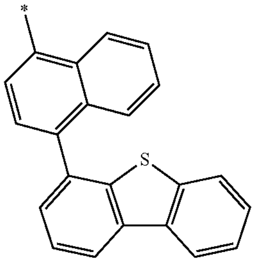 [SMILES: *c1ccc(-c2cccc3c2sc2ccccc23)c2ccccc12] | 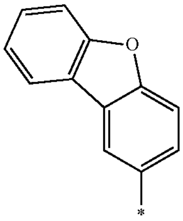 |
| U16 | 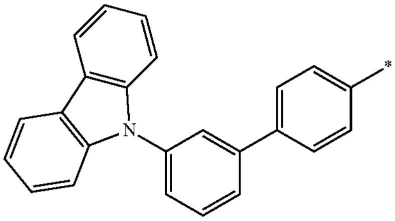 [SMILES: *c1ccc(-c2cccc(-n3c4ccccc4c4ccccc43)c2)cc1] | 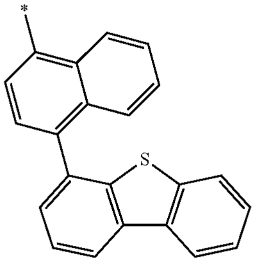 [SMILES: *c1ccc(-c2cccc3c2sc2ccccc23)c2ccccc12] | 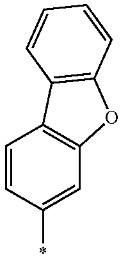 [SMILES: *c1ccc2c(c1)oc1ccccc12] |
| U17 | 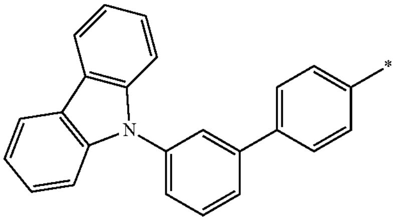 [SMILES: *c1ccc(-c2cccc(-n3c4ccccc4c4ccccc43)c2)cc1] | 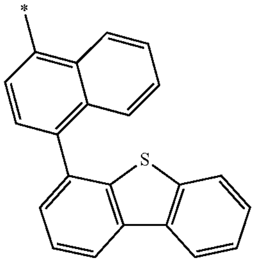 [SMILES: *c1ccc(-c2cccc3c2sc2ccccc23)c2ccccc12] | 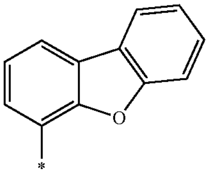 |
| U18 | 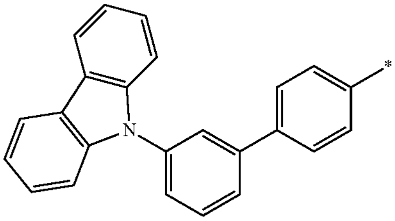 [SMILES: *c1ccc(-c2cccc(-n3c4ccccc4c4ccccc43)c2)cc1] | 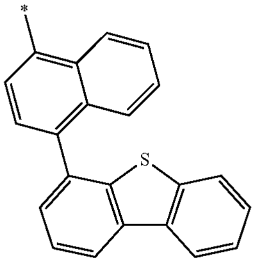 [SMILES: *c1ccc(-c2cccc3c2sc2ccccc23)c2ccccc12] | 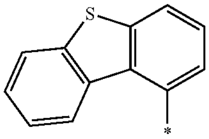 |
| U19 | 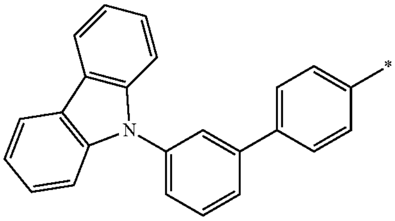 [SMILES: *c1ccc(-c2cccc(-n3c4ccccc4c4ccccc43)c2)cc1] | 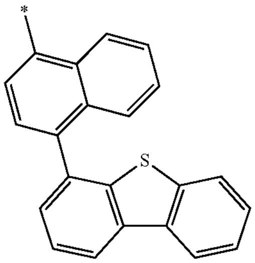 [SMILES: *c1ccc(-c2cccc3c2sc2ccccc23)c2ccccc12] | 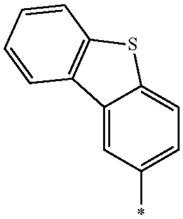 |

-continued
| Compound Group 1 | | | |
|---|---|---|---|
| Formula 1 | $Ar_1$ | $Ar_2$ | $Ar_3$ |
| U20 | 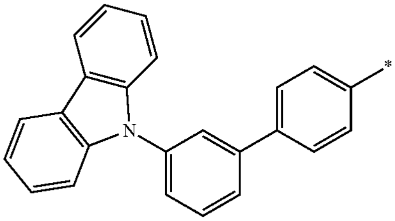 [SMILES: *c1ccc(-c2cccc(-n3c4ccccc4c4ccccc43)c2)cc1] | 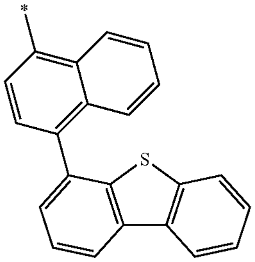 [SMILES: *c1ccc(-c2cccc3c2sc2ccccc23)c2ccccc12] | 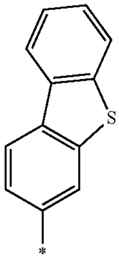 [SMILES: *c1ccc2c(c1)sc1ccccc12] |
| U21 | 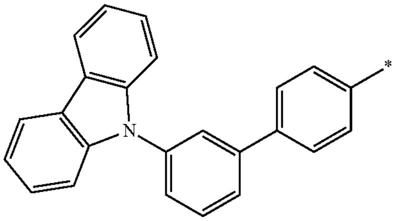 [SMILES: *c1ccc(-c2cccc(-n3c4ccccc4c4ccccc43)c2)cc1] | 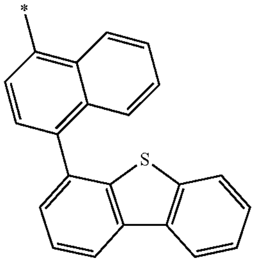 [SMILES: *c1ccc(-c2cccc3c2sc2ccccc23)c2ccccc12] | 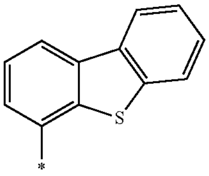 |
| U22 | 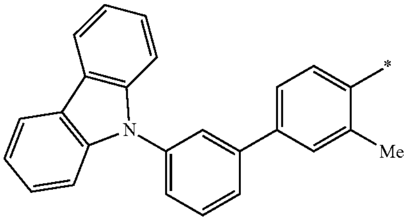 [SMILES: *c1ccc(-c2cccc(-n3c4ccccc4c4ccccc43)c2)cc1C] | 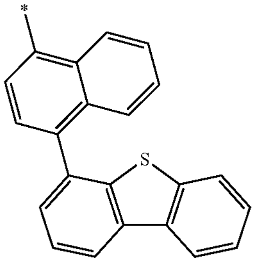 [SMILES: *c1ccc(-c2cccc3c2sc2ccccc23)c2ccccc12] | 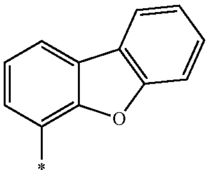 |
| U23 | 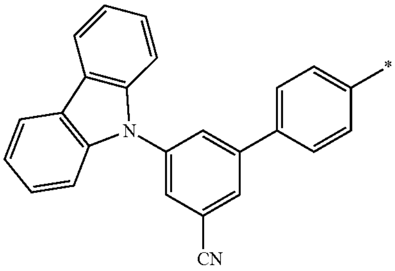 [SMILES: *c1ccc(-c2cc(C#N)cc(-n3c4ccccc4c4ccccc43)c2)cc1] | 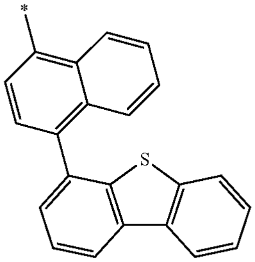 [SMILES: *c1ccc(-c2cccc3c2sc2ccccc23)c2ccccc12] | 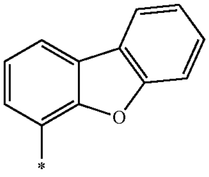 |
| V1 | 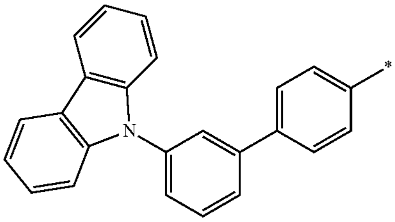 [SMILES: *c1ccc(-c2cccc(-n3c4ccccc4c4ccccc43)c2)cc1] | 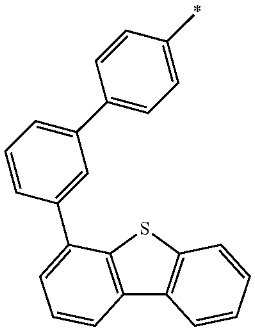 [SMILES: *c1ccc(-c2cccc(-c3cccc4c3sc3ccccc34)c2)cc1] | 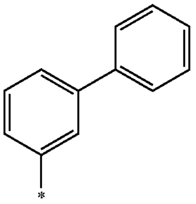 [SMILES: *c1cccc(-c2ccccc2)c1] |

-continued
| Compound Group 1 | | | |
|---|---|---|---|
| Formula 1 | $Ar_1$ | $Ar_2$ | $Ar_3$ |
| V2 | 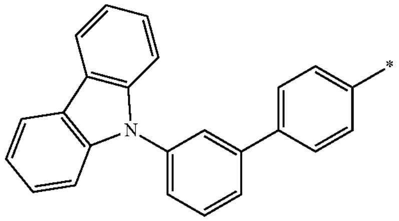 [SMILES: *c1ccc(-c2cccc(-n3c4ccccc4c4ccccc43)c2)cc1] | 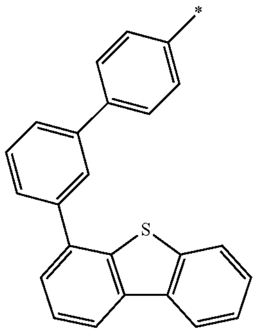 [SMILES: *c1ccc(-c2cccc(-c3cccc4c3sc3ccccc34)c2)cc1] | 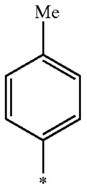 [SMILES: *c1ccc(C)cc1] |
| V3 | 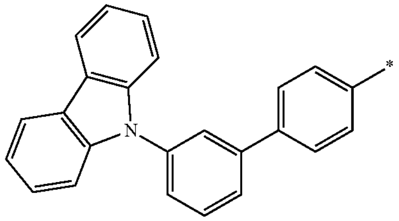 [SMILES: *c1ccc(-c2cccc(-n3c4ccccc4c4ccccc43)c2)cc1] | 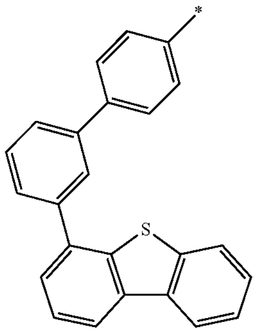 [SMILES: *c1ccc(-c2cccc(-c3cccc4c3sc3ccccc34)c2)cc1] | 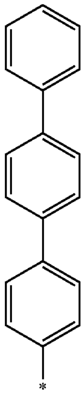 [SMILES: *c1ccc(-c2ccc(-c3ccccc3)cc2)cc1] |
| V4 | 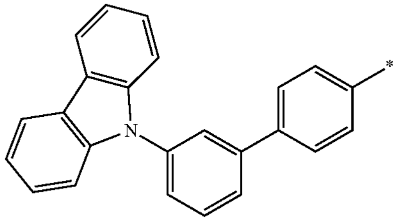 [SMILES: *c1ccc(-c2cccc(-n3c4ccccc4c4ccccc43)c2)cc1] | 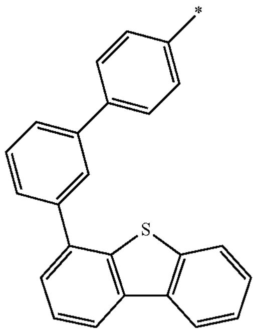 [SMILES: *c1ccc(-c2cccc(-c3cccc4c3sc3ccccc34)c2)cc1] | 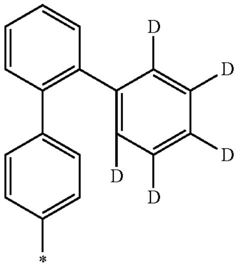 [SMILES: *c1ccc(-c2ccccc2-c2c([2H])c([2H])c([2H])c([2H])c2[2H])cc1] |
| V5 | 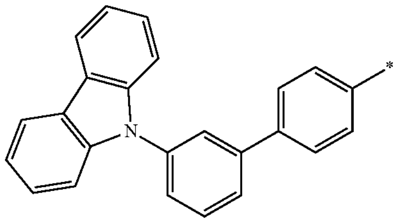 [SMILES: *c1ccc(-c2cccc(-n3c4ccccc4c4ccccc43)c2)cc1] | 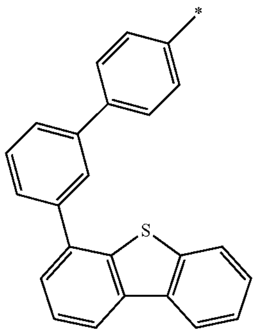 [SMILES: *c1ccc(-c2cccc(-c3cccc4c3sc3ccccc34)c2)cc1] | 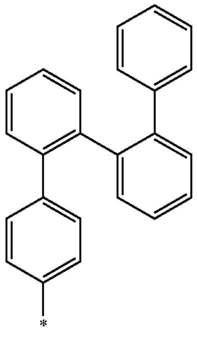 [SMILES: *c1ccc(-c2ccccc2-c2ccccc2-c2ccccc2)cc1] |

-continued
| Compound Group 1 | | | |
|---|---|---|---|
| Formula 1 | $Ar_1$ | $Ar_2$ | $Ar_3$ |
| V6 | 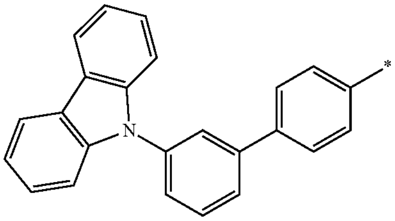 [SMILES: *c1ccc(-c2cccc(-n3c4ccccc4c4ccccc43)c2)cc1] | 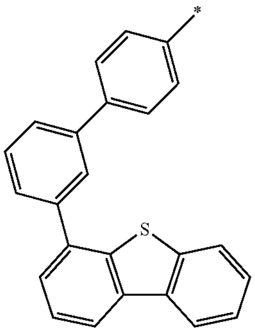 [SMILES: *c1ccc(-c2cccc(-c3cccc4c3sc3ccccc34)c2)cc1] | 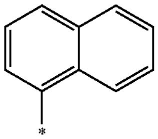 [SMILES: *c1cccc2ccccc12] |
| V7 | 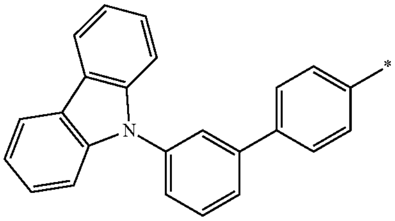 [SMILES: *c1ccc(-c2cccc(-n3c4ccccc4c4ccccc43)c2)cc1] | 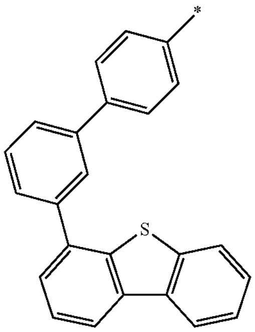 [SMILES: *c1ccc(-c2cccc(-c3cccc4c3sc3ccccc34)c2)cc1] | 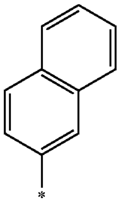 [SMILES: *c1ccc2ccccc2c1] |
| V8 | 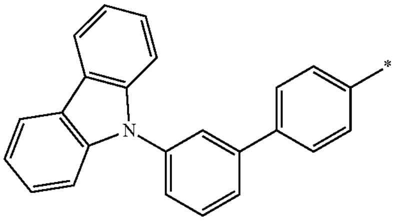 [SMILES: *c1ccc(-c2cccc(-n3c4ccccc4c4ccccc43)c2)cc1] | 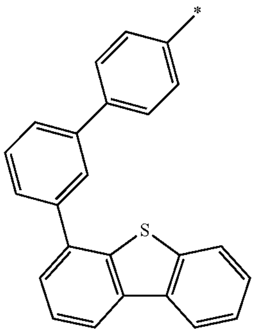 [SMILES: *c1ccc(-c2cccc(-c3cccc4c3sc3ccccc34)c2)cc1] | 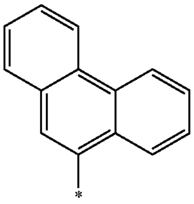 [SMILES: *c1cc2ccccc2c2ccccc12] |
| V9 | 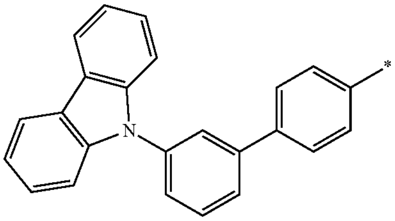 [SMILES: *c1ccc(-c2cccc(-n3c4ccccc4c4ccccc43)c2)cc1] | 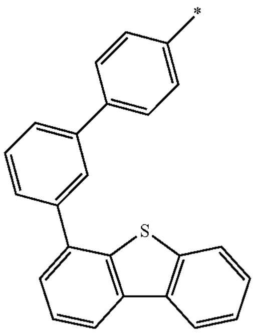 [SMILES: *c1ccc(-c2cccc(-c3cccc4c3sc3ccccc34)c2)cc1] | 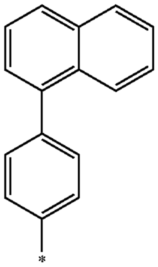 [SMILES: *c1ccc(-c2cccc3ccccc23)cc1] |

-continued
| Compound Group 1 | | | |
|---|---|---|---|
| Formula 1 | $Ar_1$ | $Ar_2$ | $Ar_3$ |
| V10 | 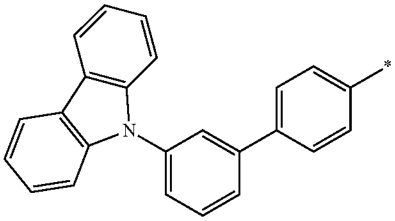 [SMILES: *c1ccc(-c2cccc(-n3c4ccccc4c4ccccc43)c2)cc1] | 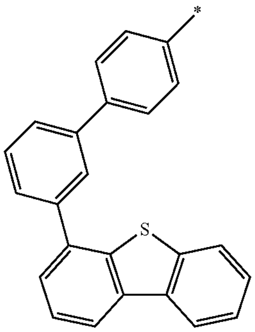 [SMILES: *c1ccc(-c2cccc(-c3cccc4c3sc3ccccc34)c2)cc1] | 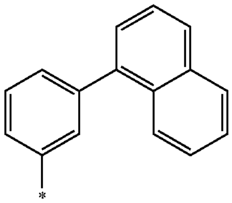 [SMILES: *c1cccc(-c2cccc3ccccc23)c1] |
| V11 | 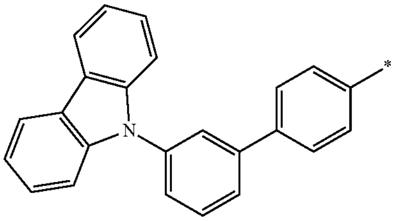 [SMILES: *c1ccc(-c2cccc(-n3c4ccccc4c4ccccc43)c2)cc1] | 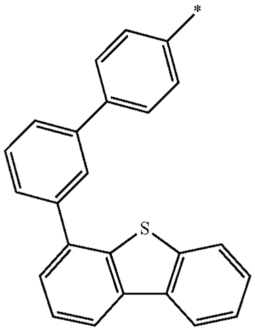 [SMILES: *c1ccc(-c2cccc(-c3cccc4c3sc3ccccc34)c2)cc1] | 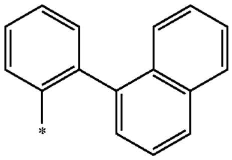 [SMILES: *c1ccccc1-c1cccc2ccccc12] |
| V12 | 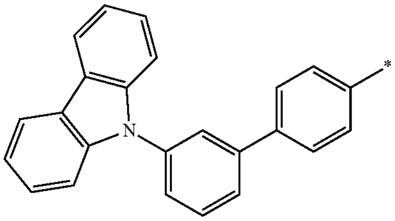 [SMILES: *c1ccc(-c2cccc(-n3c4ccccc4c4ccccc43)c2)cc1] | 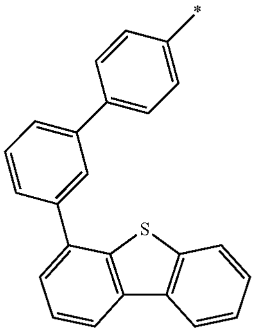 [SMILES: *c1ccc(-c2cccc(-c3cccc4c3sc3ccccc34)c2)cc1] | 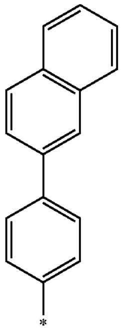 [SMILES: *c1ccc(-c2ccc3ccccc3c2)cc1] |
| V13 | 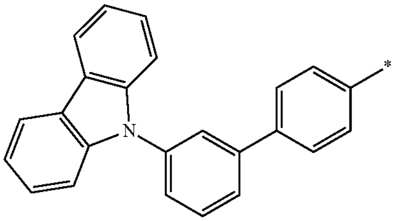 [SMILES: *c1ccc(-c2cccc(-n3c4ccccc4c4ccccc43)c2)cc1] | 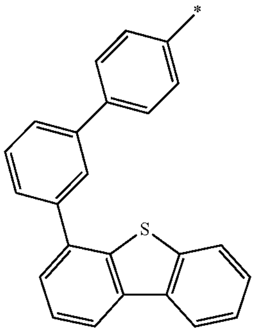 [SMILES: *c1ccc(-c2cccc(-c3cccc4c3sc3ccccc34)c2)cc1] | 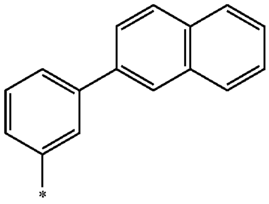 [SMILES: *c1cccc(-c2ccc3ccccc3c2)c1] |

-continued
| Compound Group 1 | | | |
|---|---|---|---|
| Formula 1 | $Ar_1$ | $Ar_2$ | $Ar_3$ |
| V14 | 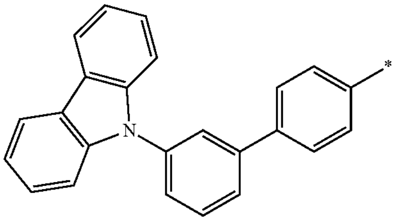 [SMILES: *c1ccc(-c2cccc(-n3c4ccccc4c4ccccc43)c2)cc1] | 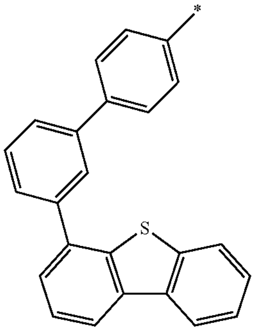 [SMILES: *c1ccc(-c2cccc(-c3cccc4c3sc3ccccc34)c2)cc1] | 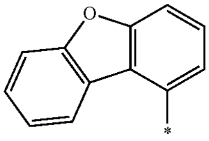 |
| V15 | 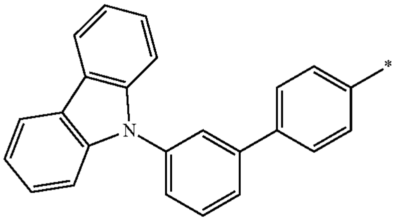 [SMILES: *c1ccc(-c2cccc(-n3c4ccccc4c4ccccc43)c2)cc1] | 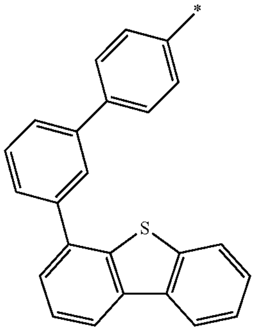 [SMILES: *c1ccc(-c2cccc(-c3cccc4c3sc3ccccc34)c2)cc1] | 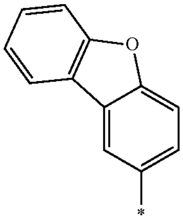 |
| V16 | 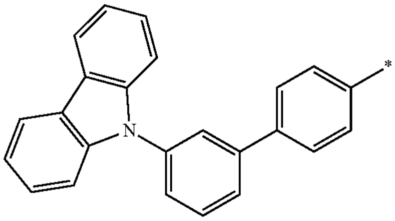 [SMILES: *c1ccc(-c2cccc(-n3c4ccccc4c4ccccc43)c2)cc1] | 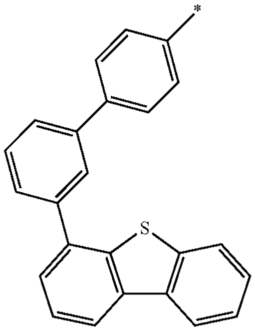 [SMILES: *c1ccc(-c2cccc(-c3cccc4c3sc3ccccc34)c2)cc1] | 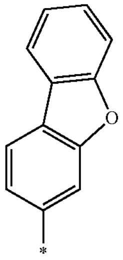 [SMILES: *c1ccc2c(c1)oc1ccccc12] |
| V17 | 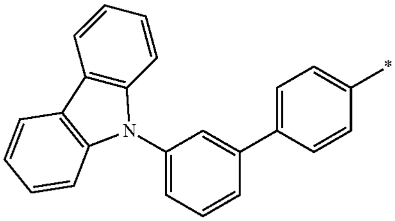 [SMILES: *c1ccc(-c2cccc(-n3c4ccccc4c4ccccc43)c2)cc1] | 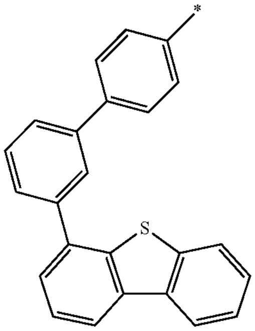 [SMILES: *c1ccc(-c2cccc(-c3cccc4c3sc3ccccc34)c2)cc1] | 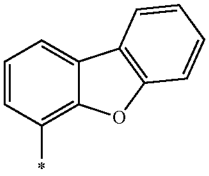 |

-continued
Compound Group 1
| Formula 1 | $Ar_1$ | $Ar_2$ | $Ar_3$ |
| --- | --- | --- | --- |
| V18 | 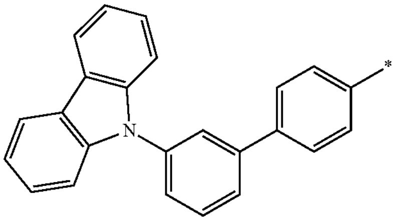 [SMILES: *c1ccc(-c2cccc(-n3c4ccccc4c4ccccc43)c2)cc1] | 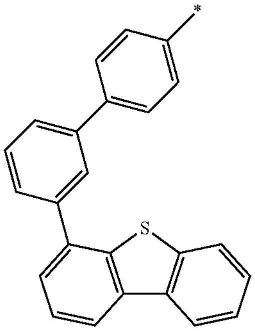 [SMILES: *c1ccc(-c2cccc(-c3cccc4c3sc3ccccc34)c2)cc1] | 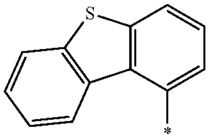 |
| V19 | 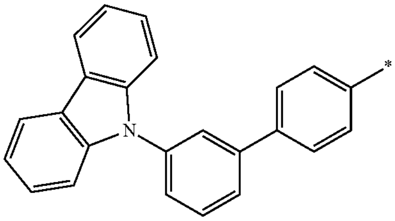 [SMILES: *c1ccc(-c2cccc(-n3c4ccccc4c4ccccc43)c2)cc1] | 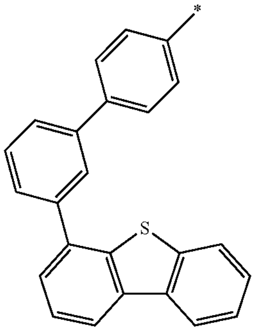 [SMILES: *c1ccc(-c2cccc(-c3cccc4c3sc3ccccc34)c2)cc1] | 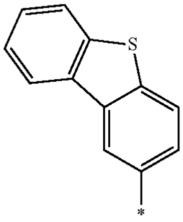 |
| V20 | 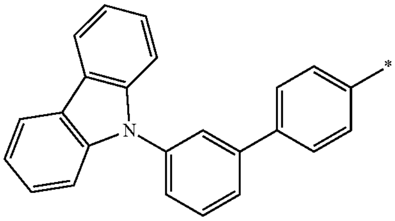 [SMILES: *c1ccc(-c2cccc(-n3c4ccccc4c4ccccc43)c2)cc1] | 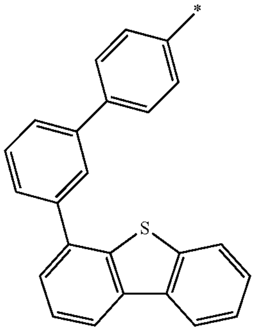 [SMILES: *c1ccc(-c2cccc(-c3cccc4c3sc3ccccc34)c2)cc1] | 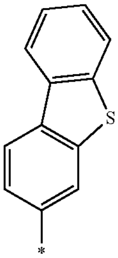 [SMILES: *c1ccc2c(c1)sc1ccccc12] |
| V21 | 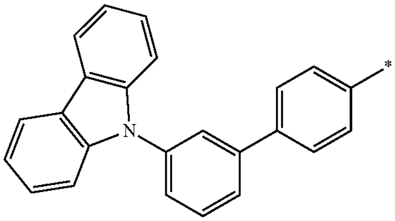 [SMILES: *c1ccc(-c2cccc(-n3c4ccccc4c4ccccc43)c2)cc1] | 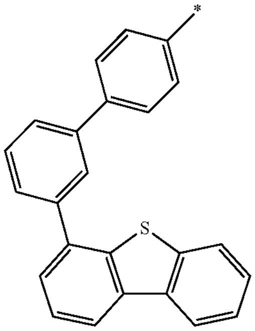 [SMILES: *c1ccc(-c2cccc(-c3cccc4c3sc3ccccc34)c2)cc1] | 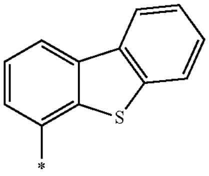 |

-continued

| Compound Group 1 | | | |
|---|---|---|---|
| Formula 1 | $Ar_1$ | $Ar_2$ | $Ar_3$ |
| V22 | 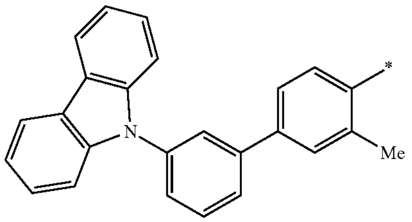 [SMILES: *c1ccc(-c2cccc(-n3c4ccccc4c4ccccc43)c2)cc1C] | 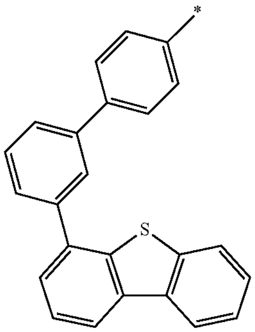 [SMILES: *c1ccc(-c2cccc(-c3cccc4c3sc3ccccc34)c2)cc1] | 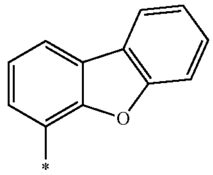 |
| V23 | 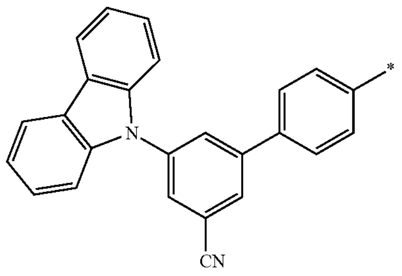 [SMILES: *c1ccc(-c2cc(C#N)cc(-n3c4ccccc4c4ccccc43)c2)cc1] | 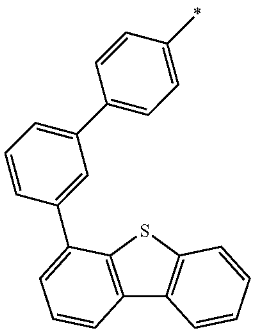 [SMILES: *c1ccc(-c2cccc(-c3cccc4c3sc3ccccc34)c2)cc1] | 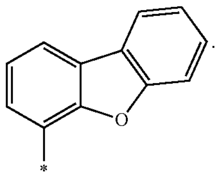 [SMILES: *c1cccc2c1oc1ccccc12] |

21. A display device including an organic electroluminescence device, wherein the organic electroluminescence device comprising:

a first electrode;

a hole transport region on the first electrode;

an emission layer on the hole transport region;

an electron transport region on the emission layer; and a second electrode on the electron transport region, wherein the hole transport region comprises a plurality of layers, one layer from the plurality of layers consisting of an amine compound represented by Formula 1 and the amine compound represented by Formula 1 is only in the one layer:

Formula 1

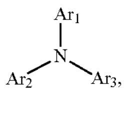

wherein in Formula 1, $Ar_1$ is represented by Formula 2-1, $Ar_2$ is represented by Formula 2-2, and $Ar_3$ is represented by Formula 2-3:

Formula 2-1

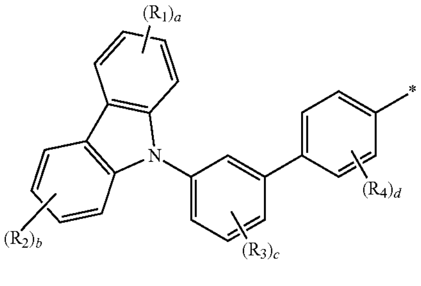

Formula 2-2

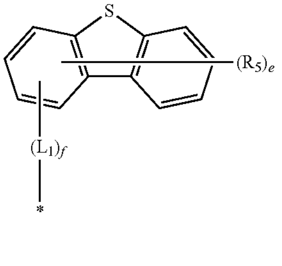

-continued

Formula 2-3

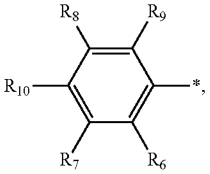

and wherein in Formula 2-1 to Formula 2-3, $R_1$ and $R_2$ are each independently a hydrogen atom, a deuterium atom, a chlorine atom, a bromine atom, an iodine atom, a cyano group, a substituted or unsubstituted alkyl group of 1 to 20 carbon atoms, a substituted or unsubstituted oxy group, a substituted or unsubstituted thiol group, a substituted or unsubstituted silyl group, a substituted or unsubstituted aryl group of 6 to 30 ring-forming carbon atoms, or a substituted or unsubstituted heteroaryl group of 2 to 30 ring-forming carbon atoms, $R_3$ to $R_5$ are each independently a hydrogen atom, a deuterium atom, a halogen atom, a cyano group, a substituted or unsubstituted alkyl group of 1 to 20 carbon atoms, a substituted or unsubstituted oxy group, a substituted or unsubstituted thiol group, a substituted or unsubstituted silyl group, a substituted or unsubstituted aryl group of 6 to 30 ring-forming carbon atoms, or a substituted or unsubstituted heteroaryl group of 2 to 30 ring-forming carbon atoms, $L_1$ is a direct linkage, a substituted or unsubstituted arylene group of 6 to 30 ring-forming carbon atoms, or a substituted or unsubstituted heteroarylene group of 2 to 30 ring-forming carbon atoms, $R_6$ to $R_9$ are each independently a hydrogen atom, a deuterium atom, a halogen atom, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, and/or combined with an adjacent group to form a ring, where a fluorenyl group is excluded, $R_{10}$ is a hydrogen atom, a deuterium atom, a halogen atom, a substituted or unsubstituted alkyl group of 1 to 20 carbon atoms, a substituted or unsubstituted alkenyl group of 2 to 20 carbon atoms, a substituted phenyl group, a substituted or unsubstituted aryl group of 7 to 30 ring-forming carbon atoms, or a substituted or unsubstituted heteroaryl group of 2 to 30 ring-forming carbon atoms, and/or combined with an adjacent group to form a ring, where a fluorenyl group is excluded, $R_6$ to $R_{10}$ are not all hydrogen atoms, a to d are each independently an integer of 0 to 4, e is an integer of 0 to 7, f is an integer of 0 to 2, when f is 1 and $L_1$ is a phenylene group, then $R_{10}$ is not an unsubstituted heteroaryl group, an unsubstituted naphthalene group, an unsubstituted p-biphenyl group, a substituted or unsubstituted phenanthryl group, or a phenyl group para-substituted by an unsubstituted naphthalene group, and $R_6$ to $R_9$ are not a substituted or unsubstituted phenanthryl group, when $L_1$ is a direct linkage, one selected from $R_6$ to $R_9$ is an unsubstituted phenyl group and the rest selected from $R_6$ to $R_9$ and $R_{10}$ are each a hydrogen atom, and all $R_1$ to $R_3$ groups are each a hydrogen atom, then all $R_5$ groups are each a hydrogen atom, and when $L_1$ is a direct linkage and the carbon at position 3 of the dibenzothiophene group of Formula 2-2 is combined with N of Formula 1, then $R_{10}$ is not combined with an adjacent group to form a 3-dibenzothiophene group, or a 3-dibenzofuran group.

* * * * *